US011984747B2

(12) United States Patent
Mitri et al.

(10) Patent No.: US 11,984,747 B2
(45) **Date of Patent: *May 14, 2024**

(54) ELECTRIC POWER STATION

(71) Applicant: Klepfer Holdings, LLC, Brenham, TX (US)

(72) Inventors: George Mitri, Brenham, TX (US); Don Klepfer, Brenham, TX (US)

(73) Assignee: Klepfer Holdings, LLC, Brenham, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/158,393

(22) Filed: Jan. 23, 2023

(65) Prior Publication Data

US 2023/0163614 A1 May 25, 2023

Related U.S. Application Data

(63) Continuation of application No. 17/328,853, filed on May 24, 2021, now Pat. No. 11,588,340, which is a (Continued)

(51) Int. Cl.
*H02J 7/00* (2006.01)
*G01R 1/20* (2006.01)
(Continued)

(52) U.S. Cl.
CPC ............ *H02J 7/0068* (2013.01); *G01R 1/203* (2013.01); *G01R 27/08* (2013.01); *G01R 31/36* (2013.01); *G01R 31/3648* (2013.01); *G01R 31/396* (2019.01); *H02J 3/32* (2013.01); *H02J 7/0013* (2013.01); *H02J 7/0047* (2013.01); *H02J 7/1415* (2013.01); *H02J 3/322* (2020.01); *H02J 7/0048* (2020.01); *H02J 7/35* (2013.01); *Y02T 10/70* (2013.01)

(58) Field of Classification Search
CPC .......... H02J 7/0068; H02J 3/32; H02J 7/0013; H02J 7/0047; H02J 7/1415; H02J 3/322; H02J 7/0048; H02J 7/35; G01R 27/08; G01R 31/36; G01R 31/396; G01R 1/203; G01R 31/3648; Y02T 10/70; G01N 27/416; Y10T 307/336
USPC ....... 700/287; 307/66, 23, 43; 324/429, 126, 324/426; 702/63, 62; 340/664; 320/136, 320/137, 134, 152, 116, 103, 127
See application file for complete search history.

(56) References Cited

U.S. PATENT DOCUMENTS

| | | | | |
|---|---|---|---|---|
| 11,050,283 B2 * | 6/2021 | Mitri | ..................... | H02J 7/0013 |
| 2011/0068746 A1 * | 3/2011 | Rocci | ................ | H02J 13/00016 320/136 |
| 2015/0197163 A1 * | 7/2015 | Loftus | .................. | H02J 7/0013 320/134 |

* cited by examiner

*Primary Examiner* — Arnold M Kinkead
(74) *Attorney, Agent, or Firm* — Park, Vaughan, Fleming & Dowler LLP; Shane Nelson

(57) ABSTRACT

The disclosed apparatus and method is a closed loop system that obtains, stores and transfers motive energy. Preferably, the majority of the electricity generated is utilized to service a load or supplied to the grid. A portion of the electric power produced is used to recharge the batteries for subsequent use of the electric motor. The system controls and manages the battery power by controlling the charging and discharging of the battery reservoir via a series of electrical and mechanical innovations controlled by electronic instruction using a series of devices to analyze, optimize and perform power production and charging functions in sequence to achieve its purpose.

11 Claims, 311 Drawing Sheets

Related U.S. Application Data continuation of application No. 16/686,829, filed on Nov. 18, 2019, now Pat. No. 11,050,283, which is a continuation of application No. 15/627,647, filed on Jun. 20, 2017, now Pat. No. 10,523,028, which is a continuation of application No. 14/224,405, filed on Mar. 25, 2014, now Pat. No. 9,768,632.

(51) Int. Cl.

| | |
|---|---|
| ***G01R 27/08*** | (2006.01) |
| ***G01R 31/36*** | (2020.01) |
| ***G01R 31/396*** | (2019.01) |
| ***H02J 3/32*** | (2006.01) |
| ***H02J 7/14*** | (2006.01) |
| ***H02J 7/35*** | (2006.01) |

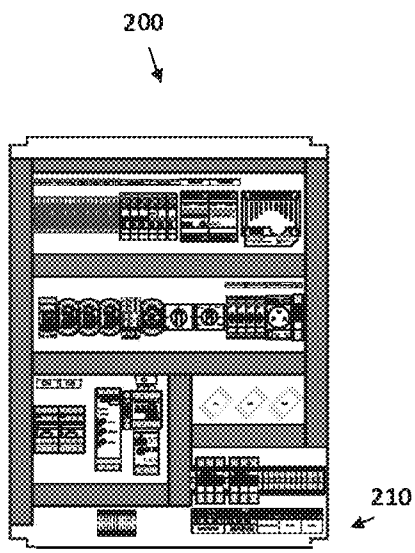
Fig. 2-A
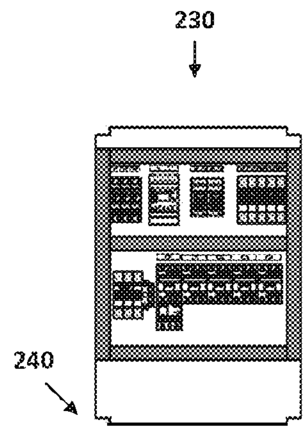
Fig. 2-B
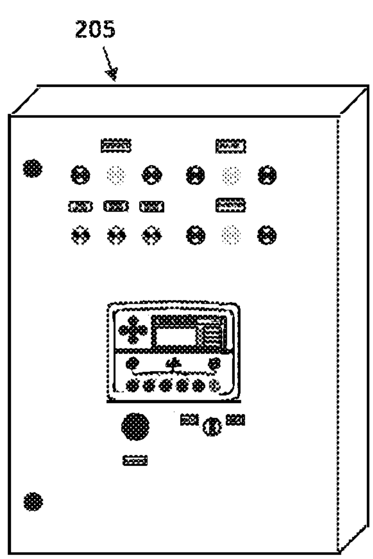
Fig. 2-C
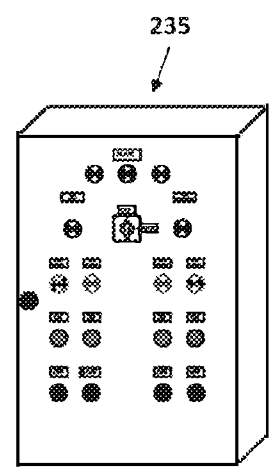
Fig. 2-D

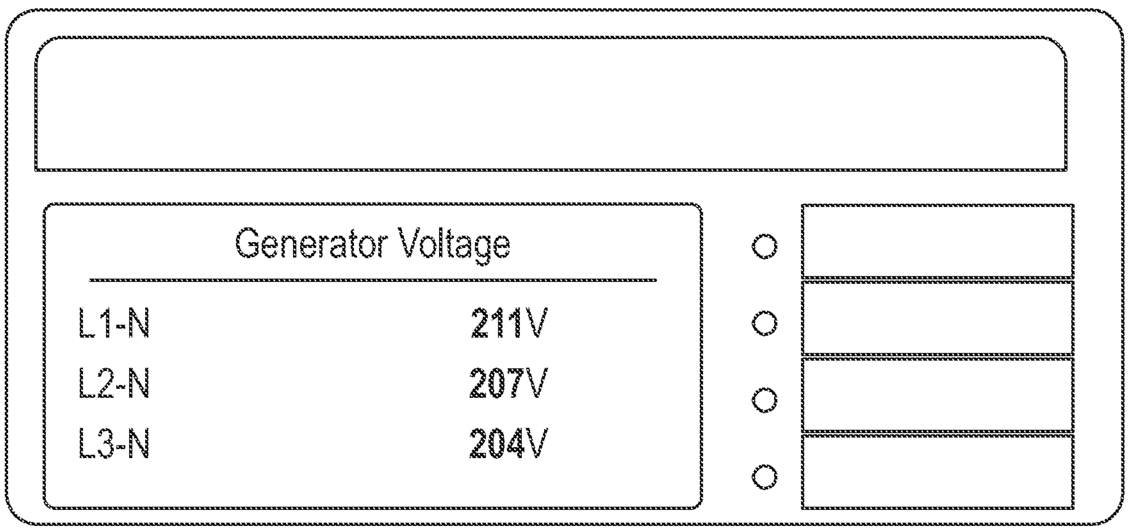
FIG. 3AAA

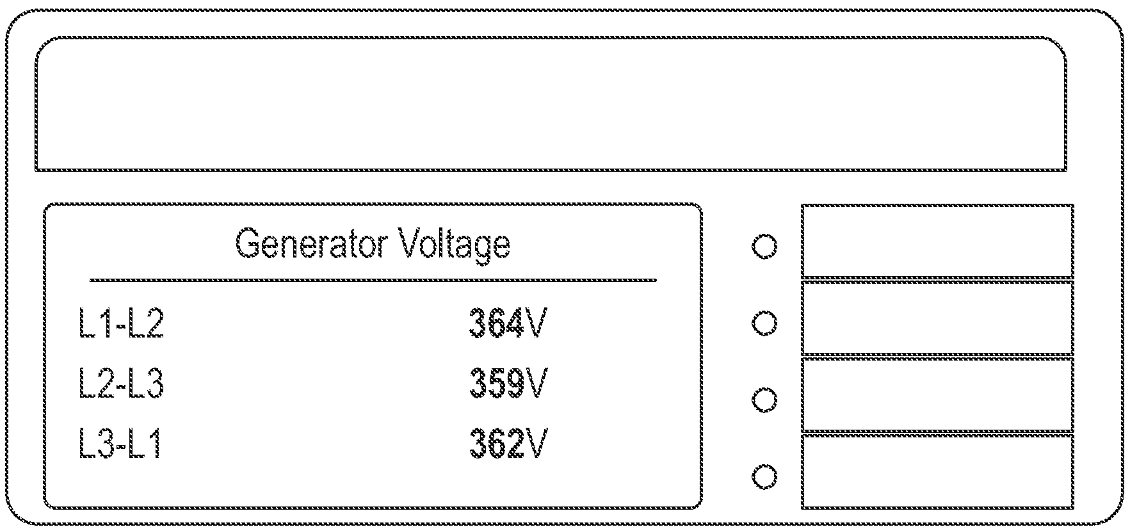
FIG. 3BBB

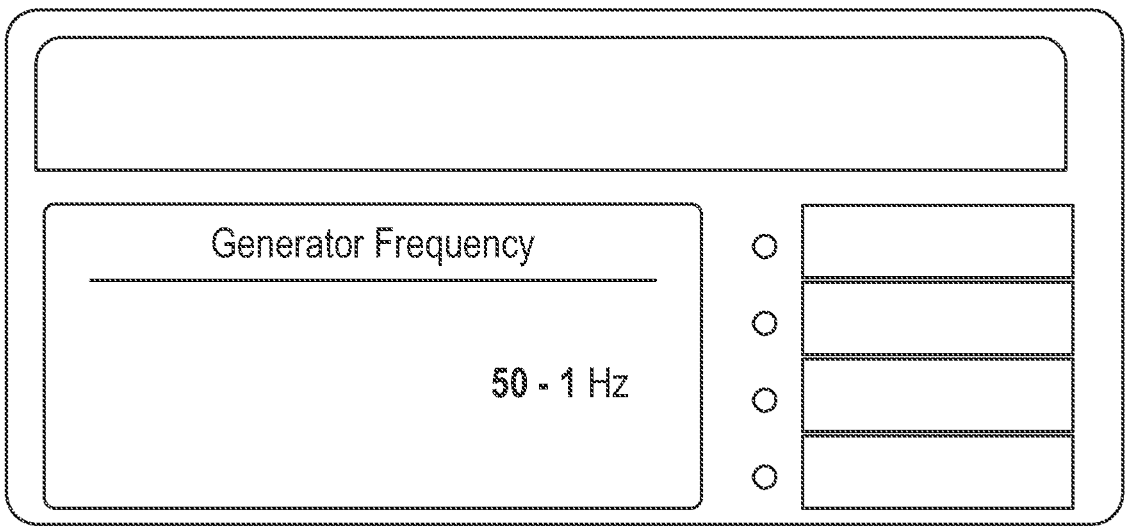
FIG. 3CCC

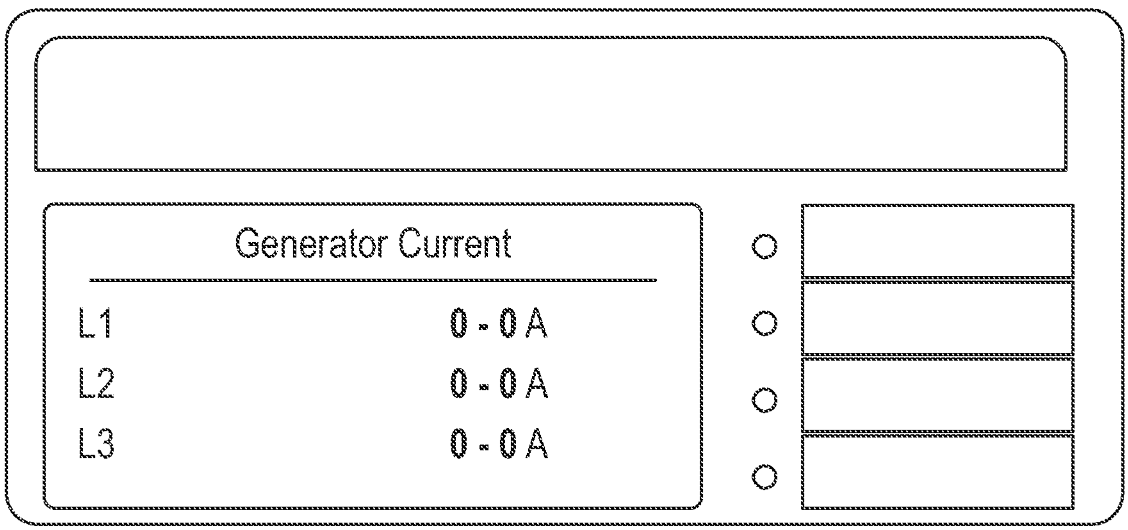
FIG. 3DDD

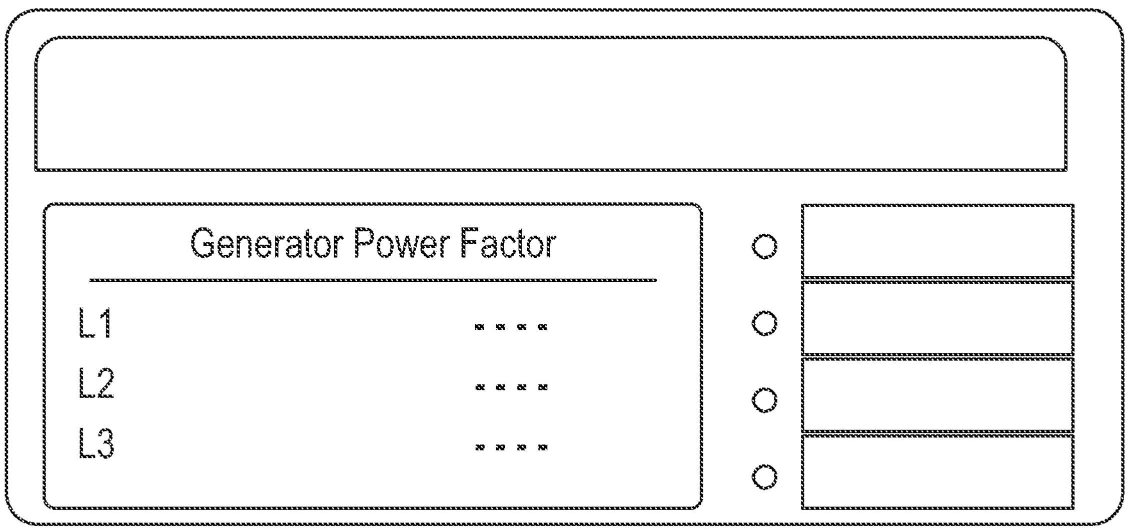
FIG. 3EEE

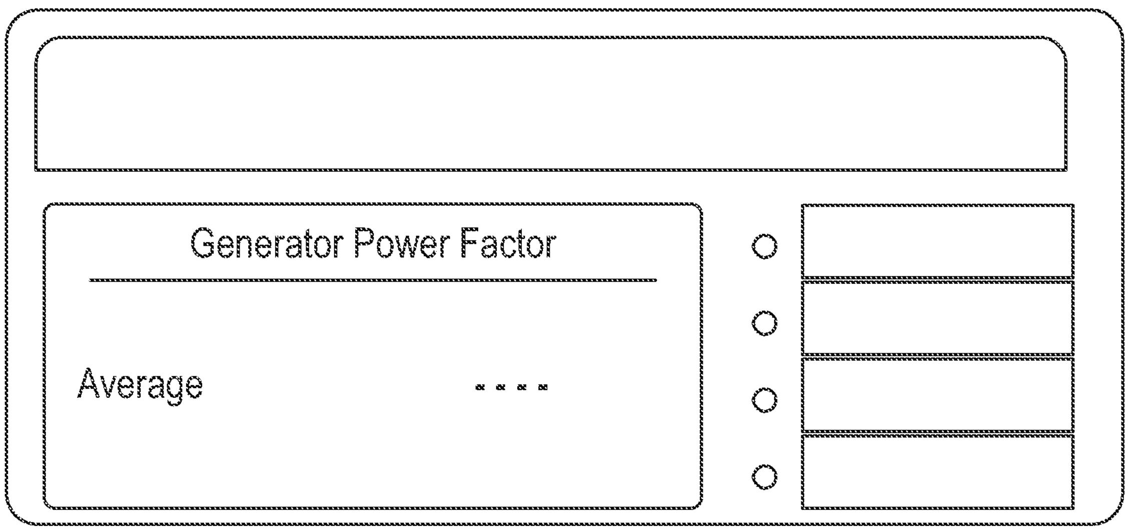
FIG. 3FFF

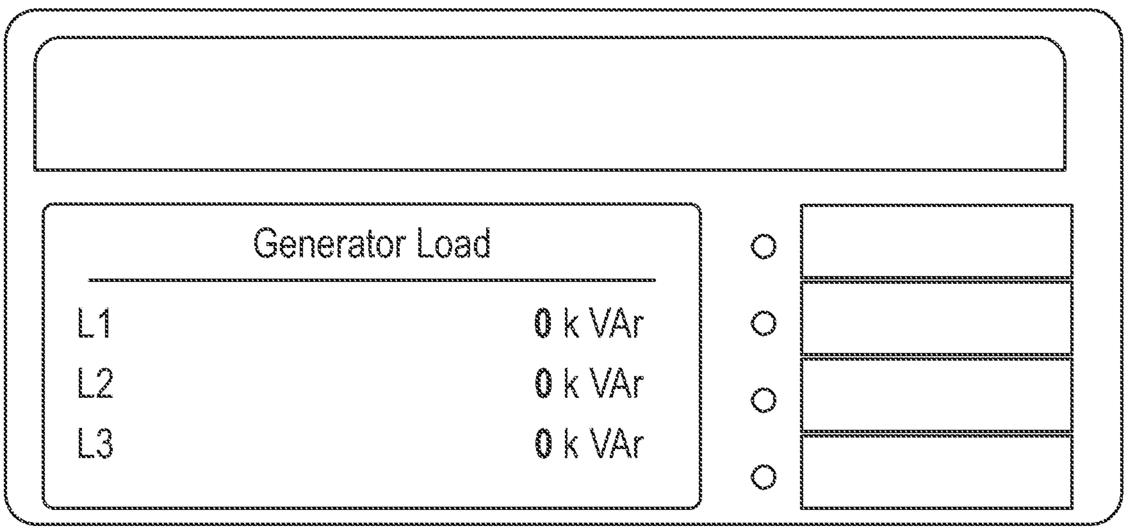
FIG. 3GGG

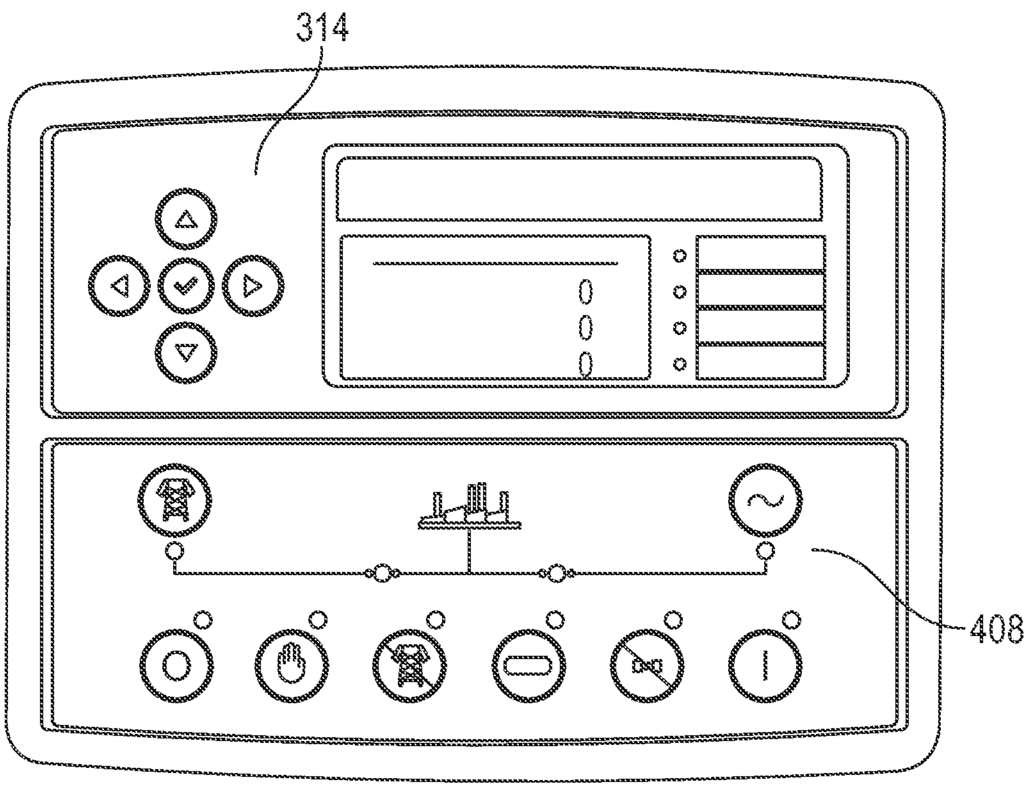
FIG. 3HHH

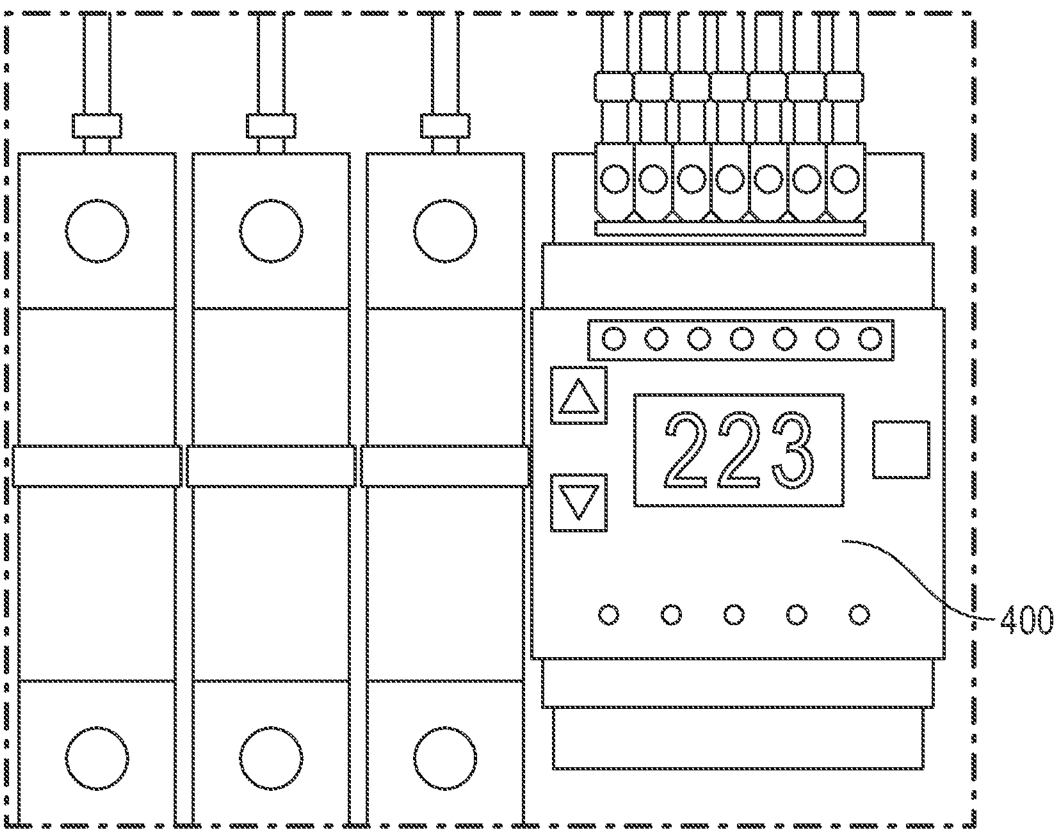
FIG. 3III

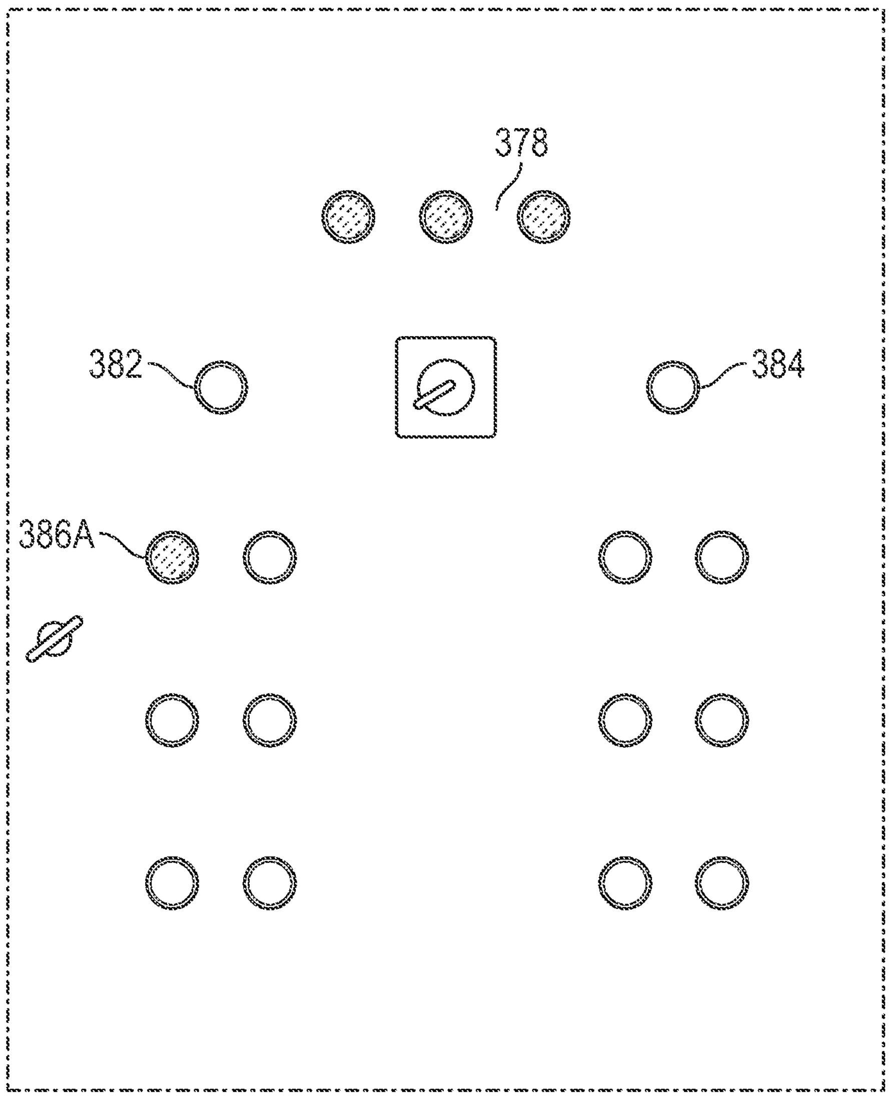
FIG. 3JJJ

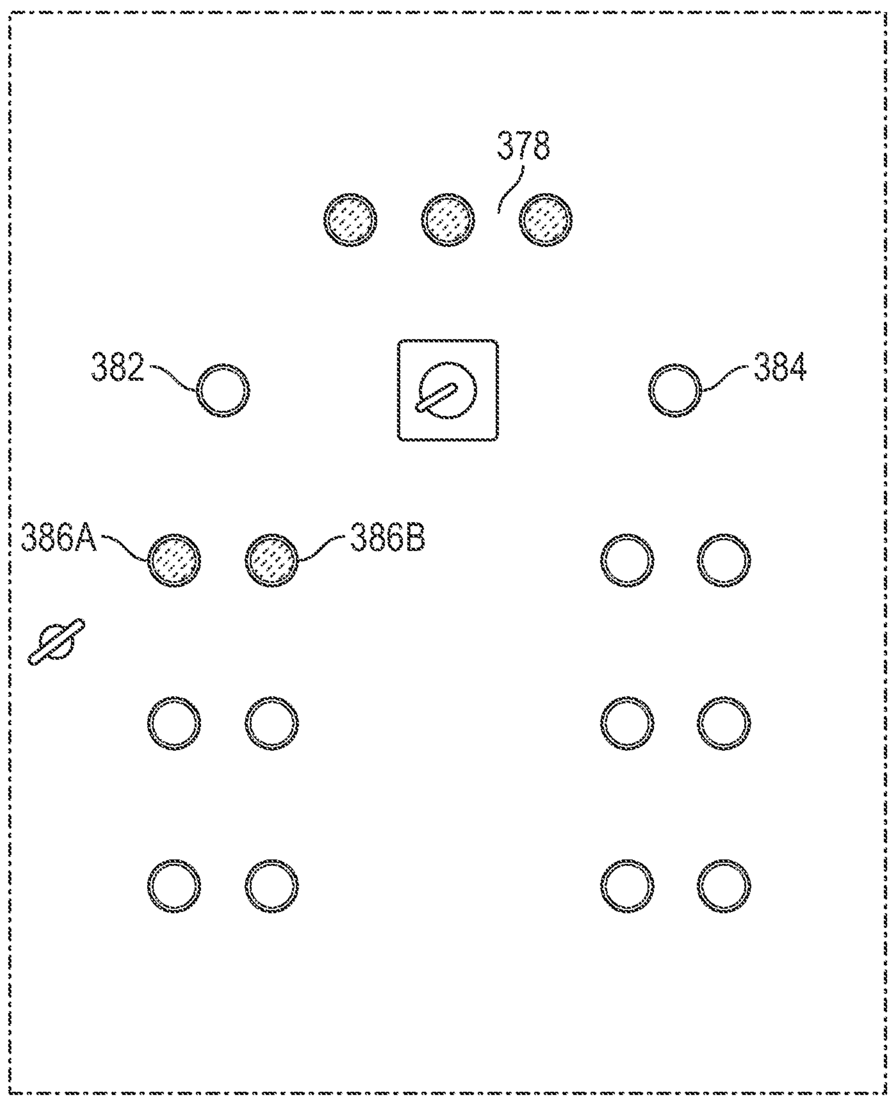
FIG. 3KKK

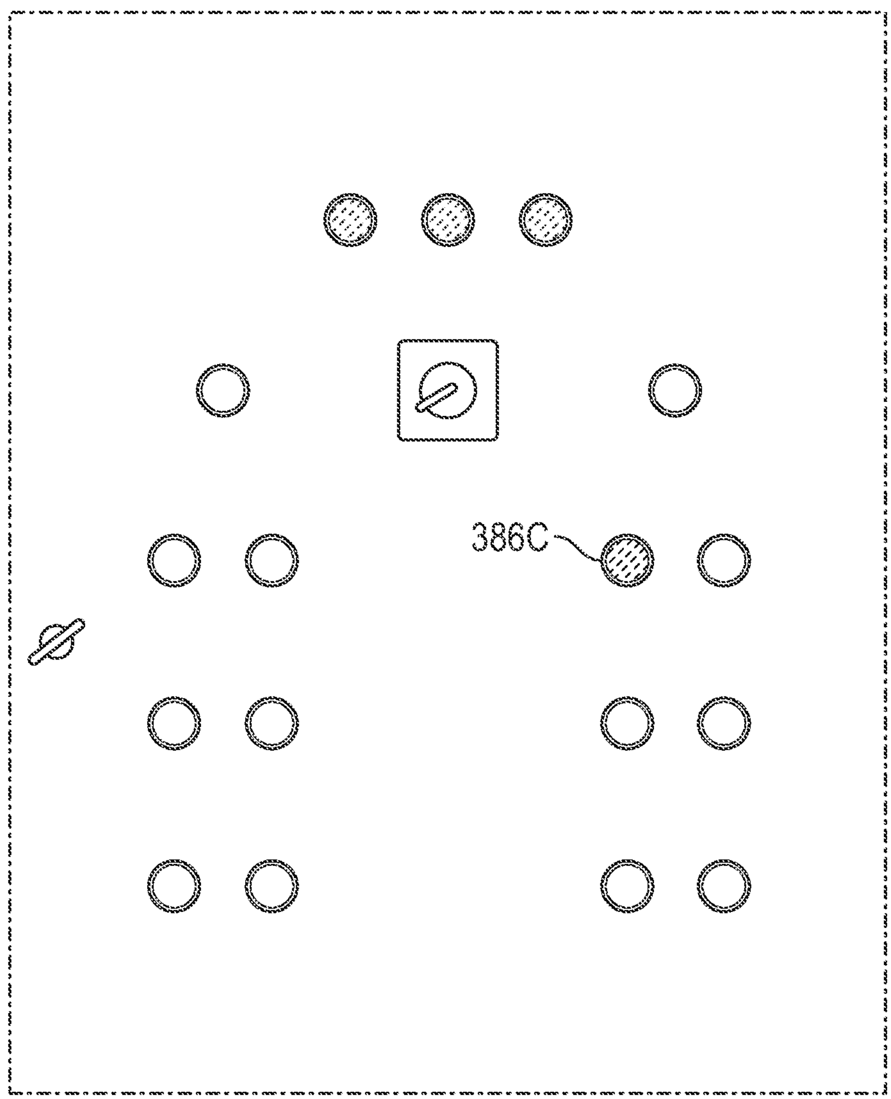
FIG. 3LLL

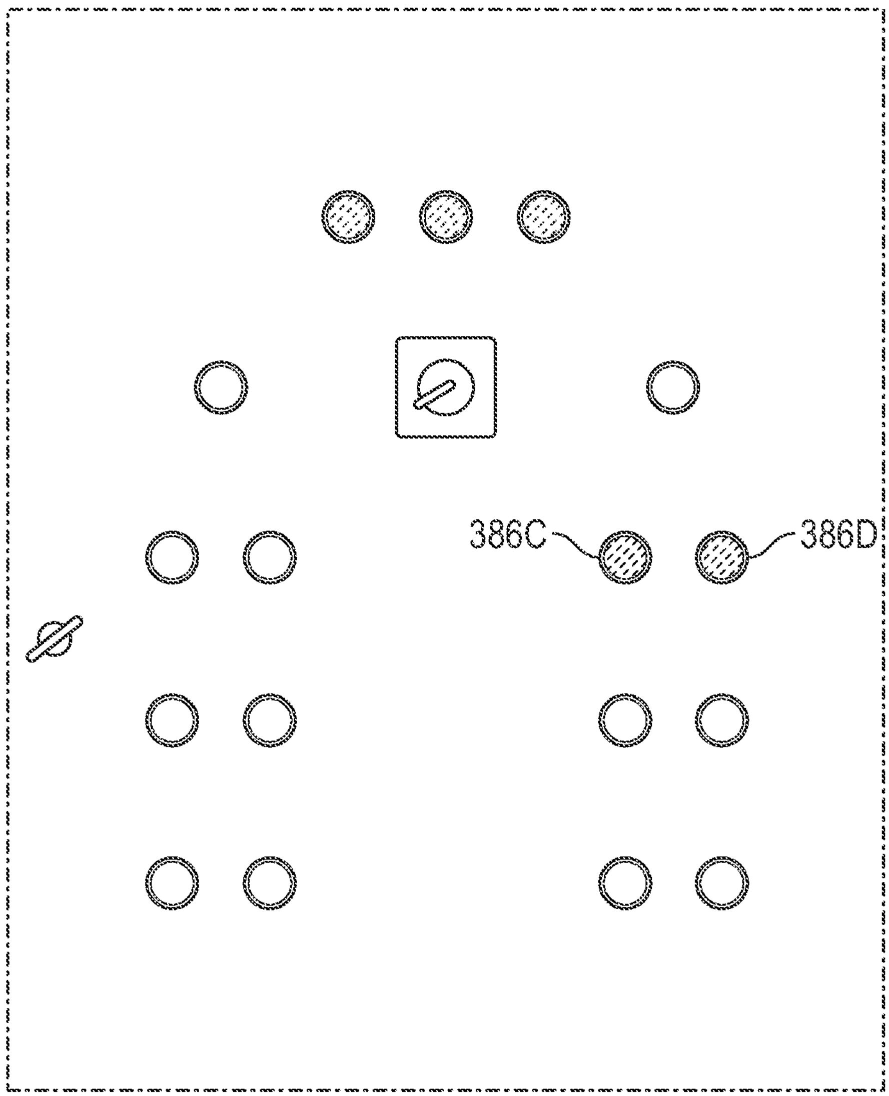
FIG. 3MMM

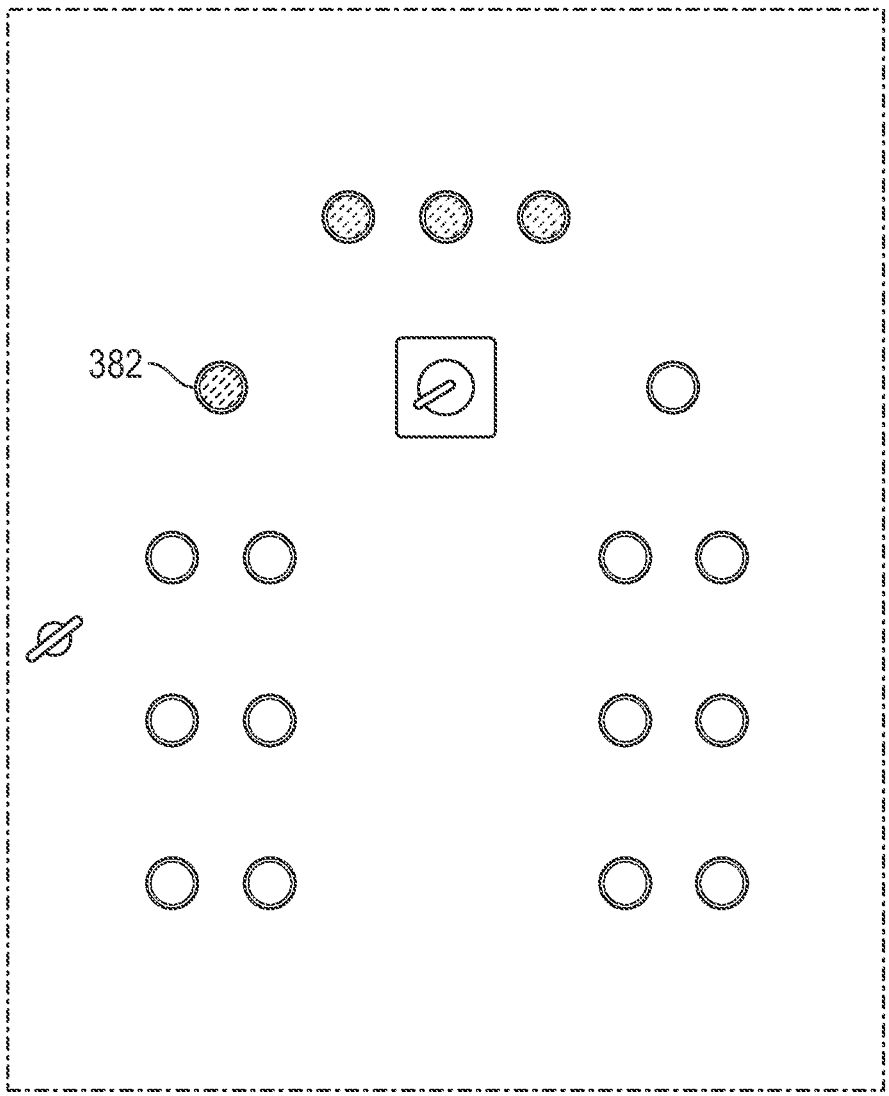
FIG. 3NNN

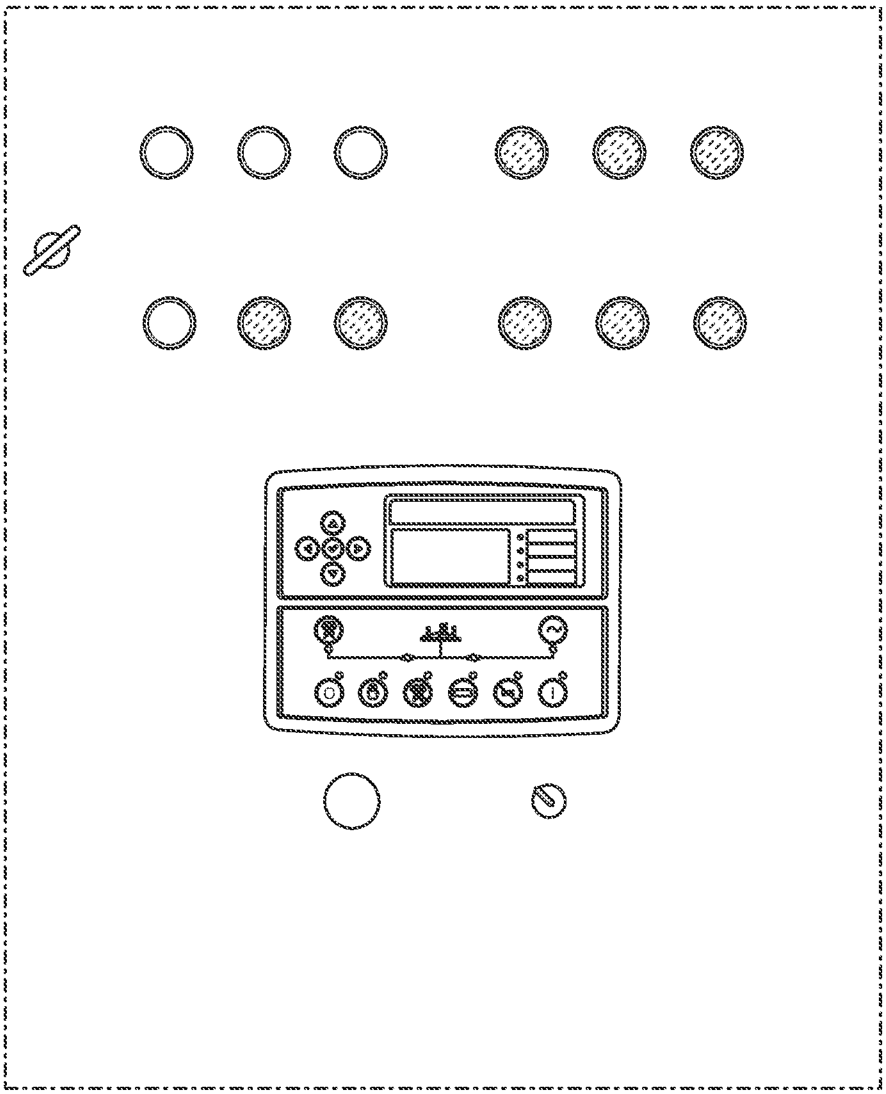
FIG. 3PPP

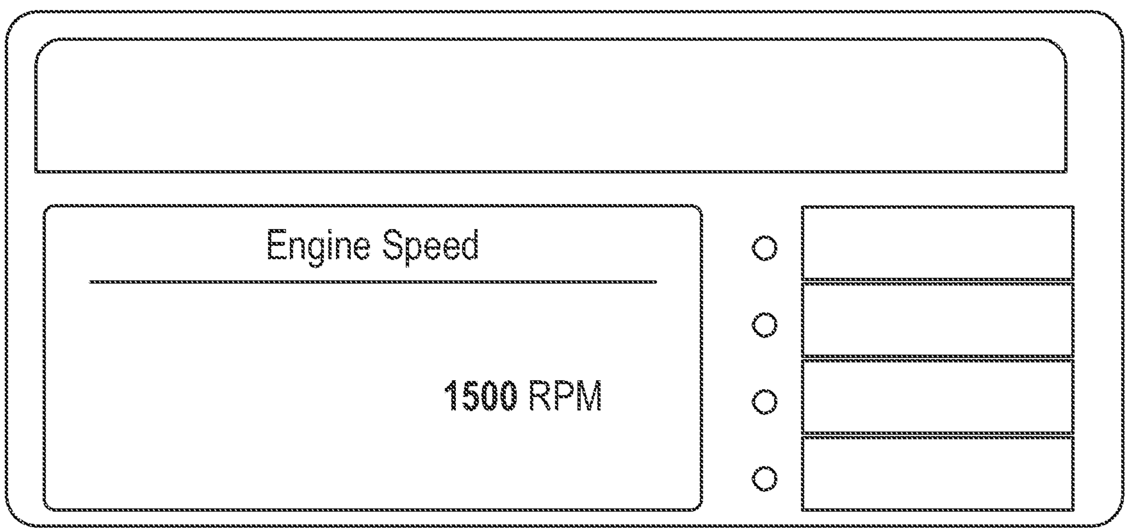
FIG. 3QQQ

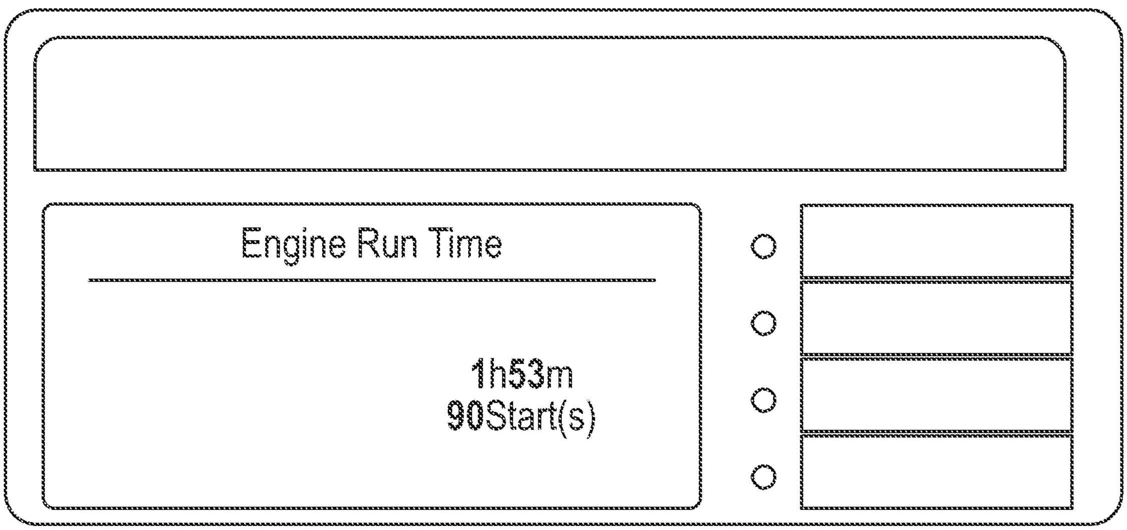
FIG. 3RRR

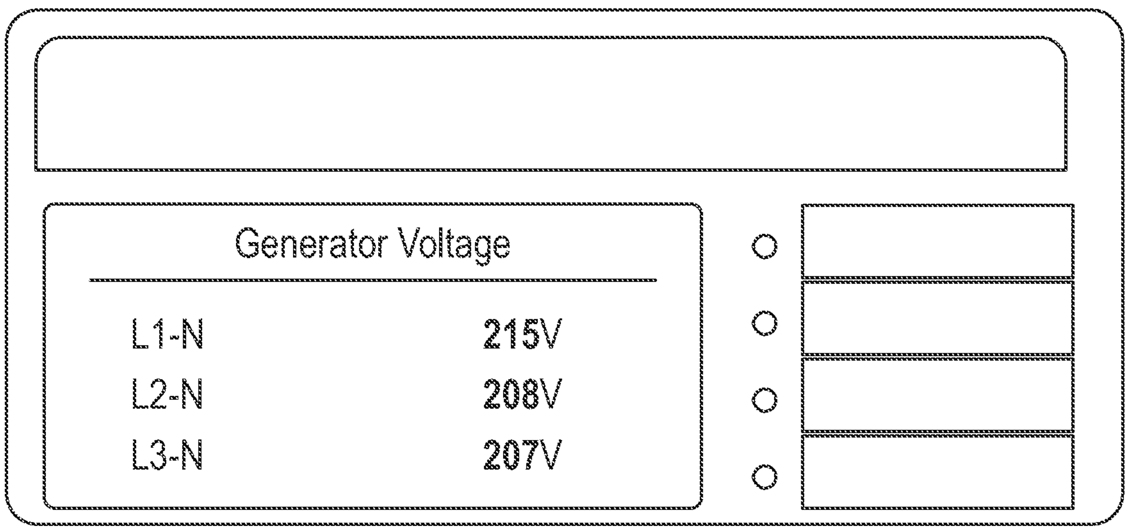
FIG. 3SSS

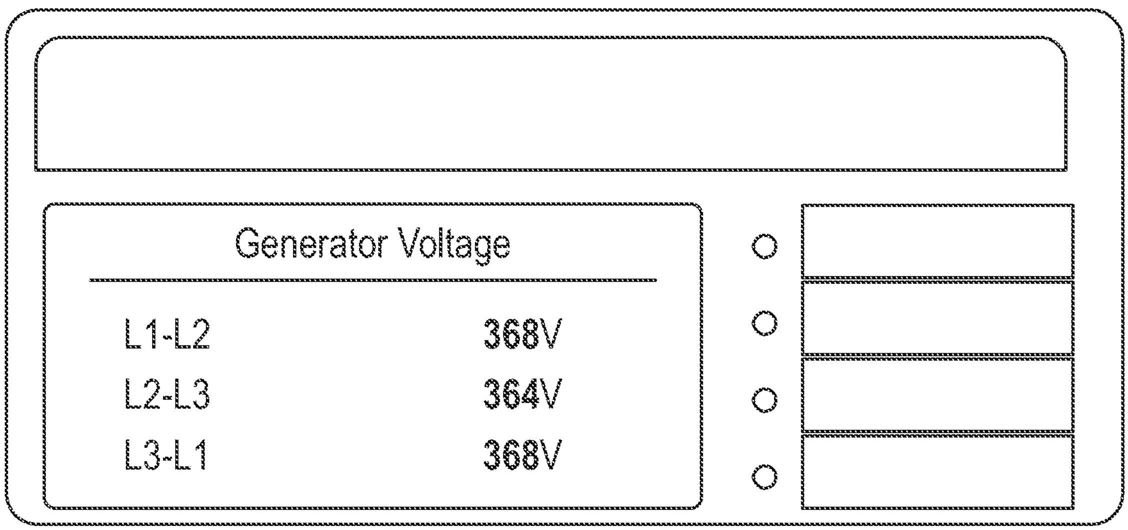
FIG. 3TTTT

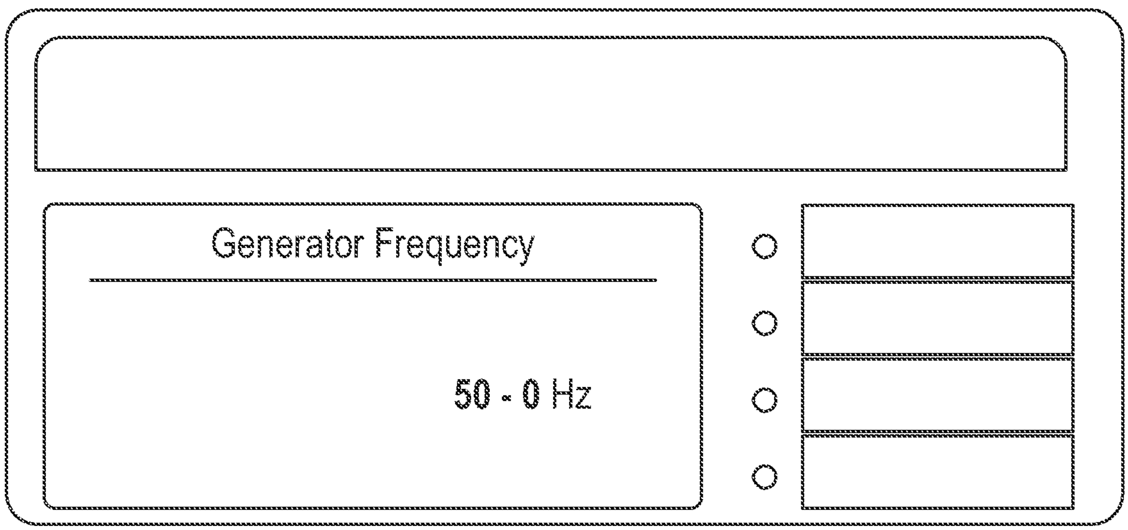
FIG. 3UUU

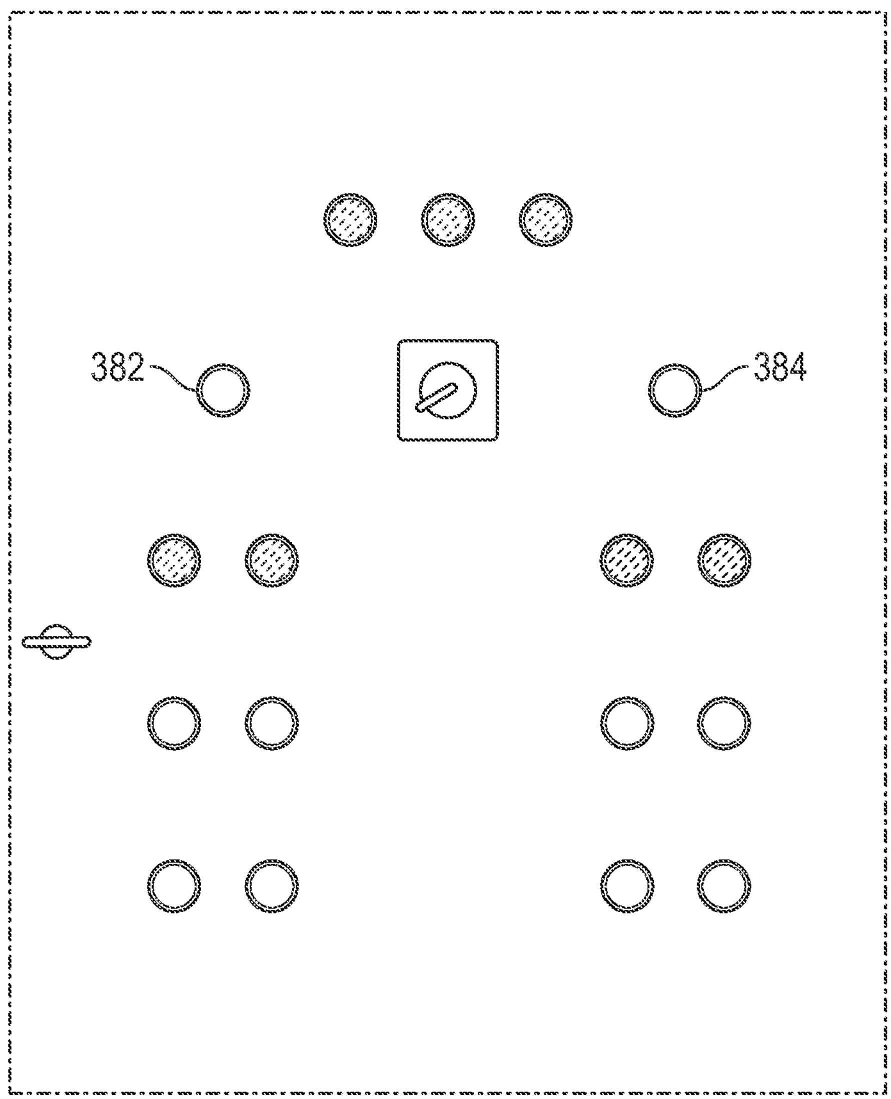
FIG. 3VVV

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1) | 1/2/2010 | 12:37:21 | PM | 202 | V | 218 | V | 50 | Hz | 0 | % | 100 | % | 30 | C |
| 2) | 1/2/2010 | 12:37:23 | PM | 205 | V | 220 | V | 50 | Hz | 0 | % | 100 | % | 30 | C |
| 3) | 1/2/2010 | 12:37:25 | PM | 206 | V | 220 | V | 50 | Hz | 0 | % | 100 | % | 30 | C |
| 4) | 1/2/2010 | 12:37:28 | PM | 206 | V | 220 | V | 50 | Hz | 0 | % | 100 | % | 30 | C |
| 5) | 1/2/2010 | 12:37:30 | PM | 207 | V | 221 | V | 50 | Hz | 0 | % | 100 | % | 30 | C |
| 6) | 1/2/2010 | 12:37:32 | PM | 207 | V | 221 | V | 50 | Hz | 0 | % | 100 | % | 30 | C |
| 7) | 1/2/2010 | 12:37:34 | PM | 207 | V | 220 | V | 50 | Hz | 0 | % | 100 | % | 30 | C |
| 8) | 1/2/2010 | 12:37:36 | PM | 208 | V | 220 | V | 50 | Hz | 0 | % | 100 | % | 30 | C |
| 9) | 1/2/2010 | 12:37:38 | PM | 208 | V | 220 | V | 50 | Hz | 0 | % | 100 | % | 30 | C |
| 10) | 1/2/2010 | 12:37:40 | PM | 205 | V | 220 | V | 50 | Hz | 0 | % | 100 | % | 30 | C |
| 11) | 1/2/2010 | 12:37:42 | PM | 206 | V | 220 | V | 50 | Hz | 0 | % | 100 | % | 30 | C |
| 12) | 1/2/2010 | 12:37:44 | PM | 204 | V | 220 | V | 50 | Hz | 0 | % | 100 | % | 30 | C |
| 13) | 1/2/2010 | 12:37:46 | PM | 203 | V | 218 | V | 50 | Hz | 0 | % | 100 | % | 30 | C |
| 14) | 1/2/2010 | 12:37:48 | PM | 204 | V | 220 | V | 50 | Hz | 0 | % | 100 | % | 30 | C |
| 15) | 1/2/2010 | 12:37:50 | PM | 204 | V | 220 | V | 50 | Hz | 0 | % | 100 | % | 30 | C |
| 16) | 1/2/2010 | 12:37:52 | PM | 204 | V | 221 | V | 50 | Hz | 0 | % | 100 | % | 30 | C |
| 17) | 1/2/2010 | 12:37:54 | PM | 204 | V | 221 | V | 50 | Hz | 0 | % | 100 | % | 30 | C |
| 18) | 1/2/2010 | 12:37:56 | PM | 206 | V | 221 | V | 50 | Hz | 0 | % | 100 | % | 30 | C |
| 19) | 1/2/2010 | 12:38:00 | PM | 204 | V | 220 | V | 50 | Hz | 0 | % | 100 | % | 30 | C |
| 20) | 1/2/2010 | 12:38:02 | PM | 205 | V | 220 | V | 50 | Hz | 0 | % | 100 | % | 30 | C |
| 21) | 1/2/2010 | 12:38:04 | PM | 205 | V | 220 | V | 50 | Hz | 0 | % | 100 | % | 30 | C |
| 22) | 1/2/2010 | 12:38:06 | PM | 204 | V | 219 | V | 50 | Hz | 0 | % | 100 | % | 30 | C |
| 23) | 1/2/2010 | 12:38:08 | PM | 204 | V | 220 | V | 50 | Hz | 0 | % | 100 | % | 30 | C |
| 24) | 1/2/2010 | 12:38:10 | PM | 205 | V | 220 | V | 50 | Hz | 0 | % | 100 | % | 30 | C |
| 25) | 1/2/2010 | 12:38:12 | PM | 204 | V | 220 | V | 50 | Hz | 0 | % | 100 | % | 30 | C |
| 26) | 1/2/2010 | 12:38:14 | PM | 204 | V | 220 | V | 50 | Hz | 0 | % | 100 | % | 30 | C |
| 27) | 1/2/2010 | 12:38:16 | PM | 204 | V | 220 | V | 50 | Hz | 0 | % | 100 | % | 30 | C |
| 28) | 1/2/2010 | 12:38:18 | PM | 203 | V | 220 | V | 50 | Hz | 0 | % | 100 | % | 30 | C |

FIG. 6 - 1

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 29) | 1/2/2010 | 12:38:20 | PM | 206 | V | 221 | V | 50 | Hz | 0 | % | 100 | % | 30 | C |
| 30) | 1/2/2010 | 12:38:22 | PM | 206 | V | 220 | V | 50 | Hz | 0 | % | 100 | % | 30 | C |
| 31) | 1/2/2010 | 12:38:24 | PM | 205 | V | 220 | V | 50 | Hz | 0 | % | 100 | % | 30 | C |
| 32) | 1/2/2010 | 12:38:26 | PM | 204 | V | 220 | V | 50 | Hz | 0 | % | 100 | % | 30 | C |
| 33) | 1/2/2010 | 12:38:28 | PM | 204 | V | 220 | V | 50 | Hz | 0 | % | 100 | % | 30 | C |
| 34) | 1/2/2010 | 12:38:31 | PM | 204 | V | 220 | V | 50 | Hz | 0 | % | 100 | % | 30 | C |
| 35) | 1/2/2010 | 12:38:33 | PM | 203 | V | 220 | V | 50 | Hz | 0 | % | 100 | % | 30 | C |
| 36) | 1/2/2010 | 12:38:35 | PM | 204 | V | 220 | V | 50 | Hz | 0 | % | 100 | % | 30 | C |
| 38) | 1/2/2010 | 12:38:39 | PM | 203 | V | 221 | V | 50 | Hz | 0 | % | 100 | % | 30 | C |
| 39) | 1/2/2010 | 12:38:41 | PM | 204 | V | 221 | V | 50 | Hz | 0 | % | 100 | % | 30 | C |
| 40) | 1/2/2010 | 12:38:43 | PM | 204 | V | 221 | V | 50 | Hz | 0 | % | 100 | % | 30 | C |
| 41) | 1/2/2010 | 12:38:45 | PM | 205 | V | 220 | V | 50 | Hz | 0 | % | 100 | % | 30 | C |
| 42) | 1/2/2010 | 12:38:47 | PM | 204 | V | 220 | V | 50 | Hz | 0 | % | 100 | % | 30 | C |
| 43) | 1/2/2010 | 12:38:49 | PM | 205 | V | 220 | V | 50 | Hz | 0 | % | 100 | % | 30 | C |
| 44) | 1/2/2010 | 12:38:53 | PM | 204 | V | 220 | V | 50 | Hz | 0 | % | 100 | % | 30 | C |
| 45) | 1/2/2010 | 12:38:55 | PM | 204 | V | 220 | V | 50 | Hz | 0 | % | 100 | % | 30 | C |
| 46) | 1/2/2010 | 12:38:57 | PM | 204 | V | 220 | V | 50 | Hz | 0 | % | 100 | % | 30 | C |
| 47) | 1/2/2010 | 12:38:59 | PM | 204 | V | 220 | V | 50 | Hz | 0 | % | 100 | % | 30 | C |
| 48) | 1/2/2010 | 12:39:02 | PM | 204 | V | 221 | V | 50 | Hz | 0 | % | 100 | % | 30 | C |
| 49) | 1/2/2010 | 12:39:04 | PM | 204 | V | 219 | V | 50 | Hz | 0 | % | 100 | % | 30 | C |
| 50) | 1/2/2010 | 12:39:06 | PM | 196 | V | 219 | V | 49 | Hz | 0 | % | 100 | % | 30 | C |
| 51) | 1/2/2010 | 12:39:08 | PM | 202 | V | 218 | V | 50 | Hz | 0 | % | 100 | % | 30 | C |
| 52) | 1/2/2010 | 12:39:10 | PM | 204 | V | 218 | V | 50 | Hz | 0 | % | 100 | % | 30 | C |
| 53) | 1/2/2010 | 12:39:12 | PM | 204 | V | 219 | V | 50 | Hz | 0 | % | 100 | % | 30 | C |
| 54) | 1/2/2010 | 12:39:14 | PM | 204 | V | 218 | V | 50 | Hz | 0 | % | 100 | % | 30 | C |
| 55) | 1/2/2010 | 12:39:16 | PM | 204 | V | 218 | V | 50 | Hz | 0 | % | 100 | % | 30 | C |
| 56) | 1/2/2010 | 12:39:18 | PM | 202 | V | 218 | V | 50 | Hz | 0 | % | 100 | % | 30 | C |
| 57) | 1/2/2010 | 12:39:20 | PM | 204 | V | 220 | V | 50 | Hz | 0 | % | 100 | % | 30 | C |

FIG. 6 - 2

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 58) | 1/2/2010 | 12:39:22 | PM | 204 | V | 220 | V | 50 | Hz | 0 | % | 100 | % | 30 | C |
| 59) | 1/2/2010 | 12:39:24 | PM | 204 | V | 219 | V | 50 | Hz | 0 | % | 100 | % | 30 | C |
| 60) | 1/2/2010 | 12:39:26 | PM | 204 | V | 219 | V | 50 | Hz | 0 | % | 100 | % | 30 | C |
| 61) | 1/2/2010 | 12:39:28 | PM | 204 | V | 219 | V | 50 | Hz | 0 | % | 100 | % | 30 | C |
| 62) | 1/2/2010 | 12:39:30 | PM | 204 | V | 218 | V | 50 | Hz | 0 | % | 100 | % | 30 | C |
| 63) | 1/2/2010 | 12:39:33 | PM | 205 | V | 220 | V | 50 | Hz | 0 | % | 100 | % | 30 | C |
| 64) | 1/2/2010 | 12:39:35 | PM | 205 | V | 218 | V | 50 | Hz | 0 | % | 100 | % | 30 | C |
| 65) | 1/2/2010 | 12:39:37 | PM | 204 | V | 220 | V | 50 | Hz | 0 | % | 100 | % | 30 | C |
| 66) | 1/2/2010 | 12:39:39 | PM | 204 | V | 218 | V | 50 | Hz | 0 | % | 100 | % | 30 | C |
| 67) | 1/2/2010 | 12:39:41 | PM | 203 | V | 220 | V | 50 | Hz | 0 | % | 100 | % | 30 | C |
| 68) | 1/2/2010 | 12:39:43 | PM | 204 | V | 218 | V | 50 | Hz | 0 | % | 100 | % | 30 | C |
| 69) | 1/2/2010 | 12:39:45 | PM | 204 | V | 218 | V | 50 | Hz | 0 | % | 100 | % | 30 | C |
| 70) | 1/2/2010 | 12:39:47 | PM | 204 | V | 220 | V | 50 | Hz | 0 | % | 100 | % | 30 | C |
| 71) | 1/2/2010 | 12:39:49 | PM | 204 | V | 219 | V | 50 | Hz | 0 | % | 100 | % | 30 | C |
| 72) | 1/2/2010 | 12:39:51 | PM | 205 | V | 220 | V | 50 | Hz | 0 | % | 100 | % | 30 | C |
| 73) | 1/2/2010 | 12:39:53 | PM | 205 | V | 218 | V | 50 | Hz | 0 | % | 100 | % | 30 | C |
| 74) | 1/2/2010 | 12:39:55 | PM | 205 | V | 219 | V | 50 | Hz | 0 | % | 100 | % | 30 | C |
| 75) | 1/2/2010 | 12:39:57 | PM | 205 | V | 218 | V | 50 | Hz | 0 | % | 100 | % | 30 | C |
| 76) | 1/2/2010 | 12:39:59 | PM | 204 | V | 218 | V | 50 | Hz | 0 | % | 100 | % | 30 | C |
| 78) | 1/2/2010 | 12:40:04 | PM | 204 | V | 220 | V | 50 | Hz | 0 | % | 100 | % | 30 | C |
| 79) | 1/2/2010 | 12:40:06 | PM | 204 | V | 219 | V | 50 | Hz | 0 | % | 100 | % | 30 | C |
| 80) | 1/2/2010 | 12:40:08 | PM | 204 | V | 219 | V | 50 | Hz | 0 | % | 100 | % | 30 | C |
| 81) | 1/2/2010 | 12:40:10 | PM | 204 | V | 219 | V | 50 | Hz | 0 | % | 100 | % | 30 | C |
| 82) | 1/2/2010 | 12:40:12 | PM | 204 | V | 219 | V | 50 | Hz | 0 | % | 100 | % | 30 | C |
| 83) | 1/2/2010 | 12:40:14 | PM | 204 | V | 219 | V | 50 | Hz | 0 | % | 100 | % | 30 | C |
| 84) | 1/2/2010 | 12:40:16 | PM | 205 | V | 219 | V | 50 | Hz | 0 | % | 100 | % | 30 | C |
| 85) | 1/2/2010 | 12:40:18 | PM | 205 | V | 220 | V | 50 | Hz | 0 | % | 100 | % | 30 | C |
| 86) | 1/2/2010 | 12:40:20 | PM | 205 | V | 218 | V | 50 | Hz | 0 | % | 100 | % | 30 | C |

FIG. 6 - 3

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 87) | 1/2/2010 | 12:40:22 | PM | 205 | V | 218 | V | 50 | Hz | 0 | % | 100 | % | 30 | C |
| 88) | 1/2/2010 | 12:40:24 | PM | 206 | V | 219 | V | 50 | Hz | 0 | % | 100 | % | 30 | C |
| 89) | 1/2/2010 | 12:40:26 | PM | 204 | V | 218 | V | 50 | Hz | 0 | % | 100 | % | 30 | C |
| 90) | 1/2/2010 | 12:40:28 | PM | 204 | V | 218 | V | 50 | Hz | 0 | % | 100 | % | 30 | C |
| 91) | 1/2/2010 | 12:40:30 | PM | 204 | V | 219 | V | 50 | Hz | 0 | % | 100 | % | 30 | C |
| 92) | 1/2/2010 | 12:40:32 | PM | 205 | V | 219 | V | 50 | Hz | 0 | % | 100 | % | 30 | C |
| 93) | 1/2/2010 | 12:40:35 | PM | 202 | V | 219 | V | 50 | Hz | 0 | % | 100 | % | 30 | C |
| 94) | 1/2/2010 | 12:40:37 | PM | 206 | V | 218 | V | 50 | Hz | 0 | % | 100 | % | 30 | C |
| 95) | 1/2/2010 | 12:40:39 | PM | 205 | V | 218 | V | 50 | Hz | 0 | % | 100 | % | 30 | C |
| 96) | 1/2/2010 | 12:40:41 | PM | 205 | V | 218 | V | 50 | Hz | 0 | % | 100 | % | 30 | C |
| 97) | 1/2/2010 | 12:40:43 | PM | 206 | V | 219 | V | 50 | Hz | 0 | % | 100 | % | 30 | C |
| 98) | 1/2/2010 | 12:40:45 | PM | 205 | V | 218 | V | 50 | Hz | 0 | % | 100 | % | 30 | C |
| 99) | 1/2/2010 | 12:40:47 | PM | 205 | V | 218 | V | 50 | Hz | 0 | % | 100 | % | 30 | C |
| 100) | 1/2/2010 | 12:40:49 | PM | 206 | V | 219 | V | 50 | Hz | 0 | % | 100 | % | 30 | C |
| 101) | 1/2/2010 | 12:40:51 | PM | 204 | V | 218 | V | 50 | Hz | 0 | % | 100 | % | 30 | C |
| 102) | 1/2/2010 | 12:40:53 | PM | 207 | V | 219 | V | 50 | Hz | 0 | % | 100 | % | 30 | C |
| 103) | 1/2/2010 | 12:40:55 | PM | 205 | V | 219 | V | 50 | Hz | 0 | % | 100 | % | 30 | C |
| 104) | 1/2/2010 | 12:40:57 | PM | 205 | V | 220 | V | 50 | Hz | 0 | % | 100 | % | 30 | C |
| 105) | 1/2/2010 | 12:40:59 | PM | 205 | V | 219 | V | 50 | Hz | 0 | % | 100 | % | 30 | C |
| 106) | 1/2/2010 | 12:41:01 | PM | 206 | V | 219 | V | 50 | Hz | 0 | % | 100 | % | 30 | C |
| 107) | 1/2/2010 | 12:41:03 | PM | 207 | V | 220 | V | 50 | Hz | 0 | % | 100 | % | 30 | C |
| 108) | 1/2/2010 | 12:41:06 | PM | 206 | V | 219 | V | 50 | Hz | 0 | % | 100 | % | 30 | C |
| 109) | 1/2/2010 | 12:41:08 | PM | 205 | V | 218 | V | 50 | Hz | 0 | % | 100 | % | 30 | C |
| 110) | 1/2/2010 | 12:41:10 | PM | 207 | V | 218 | V | 50 | Hz | 0 | % | 100 | % | 30 | C |
| 111) | 1/2/2010 | 12:41:12 | PM | 206 | V | 220 | V | 50 | Hz | 0 | % | 100 | % | 30 | C |
| 112) | 1/2/2010 | 12:41:14 | PM | 205 | V | 220 | V | 50 | Hz | 0 | % | 100 | % | 30 | C |
| 113) | 1/2/2010 | 12:41:16 | PM | 204 | V | 218 | V | 50 | Hz | 0 | % | 100 | % | 30 | C |
| 114) | 1/2/2010 | 12:41:18 | PM | 205 | V | 220 | V | 50 | Hz | 0 | % | 100 | % | 30 | C |

FIG. 6 - 4

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 115} | 1/2/2010 | 12:41:20 | PM | 205 | V | 219 | V | 50 | Hz | 0 | % | 100 | % | 30 | C |
| 116} | 1/2/2010 | 12:41:22 | PM | 206 | V | 219 | V | 50 | Hz | 0 | % | 100 | % | 30 | C |
| 118} | 1/2/2010 | 12:41:26 | PM | 206 | V | 219 | V | 50 | Hz | 0 | % | 100 | % | 30 | C |
| 119} | 1/2/2010 | 12:41:28 | PM | 206 | V | 218 | V | 50 | Hz | 0 | % | 100 | % | 30 | C |
| 120} | 1/2/2010 | 12:41:30 | PM | 204 | V | 220 | V | 50 | Hz | 0 | % | 100 | % | 30 | C |
| 121} | 1/2/2010 | 12:41:32 | PM | 205 | V | 219 | V | 50 | Hz | 0 | % | 100 | % | 30 | C |
| 122} | 1/2/2010 | 12:41:34 | PM | 204 | V | 218 | V | 50 | Hz | 0 | % | 100 | % | 30 | C |
| 123} | 1/2/2010 | 12:41:37 | PM | 204 | V | 219 | V | 50 | Hz | 0 | % | 100 | % | 30 | C |
| 124} | 1/2/2010 | 12:41:39 | PM | 204 | V | 221 | V | 50 | Hz | 0 | % | 100 | % | 30 | C |
| 125} | 1/2/2010 | 12:41:41 | PM | 202 | V | 221 | V | 50 | Hz | 0 | % | 100 | % | 30 | C |
| 126} | 1/2/2010 | 12:41:43 | PM | 204 | V | 220 | V | 50 | Hz | 0 | % | 100 | % | 30 | C |
| 127} | 1/2/2010 | 12:41:45 | PM | 205 | V | 219 | V | 50 | Hz | 0 | % | 100 | % | 30 | C |
| 128} | 1/2/2010 | 12:41:47 | PM | 198 | V | 218 | V | 50 | Hz | 0 | % | 100 | % | 30 | C |
| 129} | 1/2/2010 | 12:41:49 | PM | 202 | V | 220 | V | 50 | Hz | 0 | % | 100 | % | 30 | C |
| 130} | 1/2/2010 | 12:41:51 | PM | 205 | V | 218 | V | 50 | Hz | 0 | % | 100 | % | 30 | C |
| 131} | 1/2/2010 | 12:41:53 | PM | 203 | V | 219 | V | 50 | Hz | 0 | % | 100 | % | 30 | C |
| 132} | 1/2/2010 | 12:41:55 | PM | 204 | V | 218 | V | 50 | Hz | 0 | % | 100 | % | 30 | C |
| 133} | 1/2/2010 | 12:41:57 | PM | 204 | V | 220 | V | 50 | Hz | 0 | % | 100 | % | 30 | C |
| 134} | 1/2/2010 | 12:41:59 | PM | 204 | V | 218 | V | 50 | Hz | 0 | % | 100 | % | 30 | C |
| 135} | 1/2/2010 | 12:42:01 | PM | 204 | V | 218 | V | 50 | Hz | 0 | % | 100 | % | 30 | C |
| 136} | 1/2/2010 | 12:42:03 | PM | 204 | V | 219 | V | 50 | Hz | 0 | % | 100 | % | 30 | C |
| 137} | 1/2/2010 | 12:42:05 | PM | 205 | V | 219 | V | 50 | Hz | 0 | % | 100 | % | 30 | C |
| 138} | 1/2/2010 | 12:42:08 | PM | 205 | V | 220 | V | 50 | Hz | 0 | % | 100 | % | 30 | C |
| 139} | 1/2/2010 | 12:42:10 | PM | 204 | V | 220 | V | 50 | Hz | 0 | % | 100 | % | 30 | C |
| 140} | 1/2/2010 | 12:42:12 | PM | 205 | V | 218 | V | 50 | Hz | 0 | % | 100 | % | 30 | C |
| 141} | 1/2/2010 | 12:42:14 | PM | 204 | V | 218 | V | 50 | Hz | 0 | % | 100 | % | 30 | C |
| 142} | 1/2/2010 | 12:42:16 | PM | 205 | V | 218 | V | 50 | Hz | 0 | % | 100 | % | 30 | C |
| 143} | 1/2/2010 | 12:42:18 | PM | 204 | V | 220 | V | 50 | Hz | 0 | % | 100 | % | 30 | C |

FIG. 6 - 5

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 144) | 1/2/2010 | 12:42:20 | PM | 204 | V | 218 | V | 50 | Hz | 0 | % | 100 | % | 30 | C |
| 145) | 1/2/2010 | 12:42:22 | PM | 204 | V | 218 | V | 50 | Hz | 0 | % | 100 | % | 30 | C |
| 146) | 1/2/2010 | 12:42:24 | PM | 204 | V | 220 | V | 50 | Hz | 0 | % | 100 | % | 30 | C |
| 147) | 1/2/2010 | 12:42:26 | PM | 205 | V | 219 | V | 50 | Hz | 0 | % | 100 | % | 30 | C |
| 148) | 1/2/2010 | 12:42:28 | PM | 204 | V | 219 | V | 50 | Hz | 0 | % | 100 | % | 30 | C |
| 149) | 1/2/2010 | 12:42:30 | PM | 203 | V | 221 | V | 50 | Hz | 0 | % | 100 | % | 30 | C |
| 150) | 1/2/2010 | 12:42:32 | PM | 205 | V | 219 | V | 50 | Hz | 0 | % | 100 | % | 30 | C |
| 151) | 1/2/2010 | 12:42:34 | PM | 206 | V | 220 | V | 50 | Hz | 0 | % | 100 | % | 30 | C |
| 152) | 1/2/2010 | 12:42:36 | PM | 208 | V | 220 | V | 50 | Hz | 0 | % | 100 | % | 30 | C |
| 153) | 1/2/2010 | 12:42:39 | PM | 204 | V | 220 | V | 50 | Hz | 0 | % | 100 | % | 30 | C |
| 154) | 1/2/2010 | 12:42:41 | PM | 205 | V | 221 | V | 50 | Hz | 0 | % | 100 | % | 30 | C |
| 155) | 1/2/2010 | 12:42:43 | PM | 207 | V | 221 | V | 50 | Hz | 0 | % | 100 | % | 30 | C |
| 156) | 1/2/2010 | 12:42:45 | PM | 208 | V | 220 | V | 50 | Hz | 0 | % | 100 | % | 30 | C |
| 158) | 1/2/2010 | 12:42:49 | PM | 207 | V | 220 | V | 50 | Hz | 0 | % | 100 | % | 30 | C |
| 159) | 1/2/2010 | 12:42:51 | PM | 208 | V | 220 | V | 50 | Hz | 0 | % | 100 | % | 30 | C |
| 160) | 1/2/2010 | 12:42:53 | PM | 206 | V | 220 | V | 50 | Hz | 0 | % | 100 | % | 30 | C |
| 161) | 1/2/2010 | 12:42:55 | PM | 206 | V | 220 | V | 50 | Hz | 0 | % | 100 | % | 30 | C |
| 162) | 1/2/2010 | 12:42:57 | PM | 206 | V | 220 | V | 50 | Hz | 0 | % | 100 | % | 30 | C |
| 163) | 1/2/2010 | 12:42:59 | PM | 206 | V | 220 | V | 50 | Hz | 0 | % | 100 | % | 30 | C |
| 164) | 1/2/2010 | 12:43:01 | PM | 207 | V | 221 | V | 50 | Hz | 0 | % | 100 | % | 30 | C |
| 165) | 1/2/2010 | 12:43:03 | PM | 207 | V | 221 | V | 50 | Hz | 0 | % | 100 | % | 30 | C |
| 166) | 1/2/2010 | 12:43:05 | PM | 207 | V | 220 | V | 50 | Hz | 0 | % | 100 | % | 30 | C |
| 167) | 1/2/2010 | 12:43:07 | PM | 208 | V | 220 | V | 50 | Hz | 0 | % | 100 | % | 30 | C |
| 168) | 1/2/2010 | 12:43:10 | PM | 207 | V | 220 | V | 50 | Hz | 0 | % | 100 | % | 30 | C |
| 169) | 1/2/2010 | 12:43:12 | PM | 208 | V | 220 | V | 50 | Hz | 0 | % | 100 | % | 30 | C |
| 170) | 1/2/2010 | 12:43:14 | PM | 206 | V | 220 | V | 50 | Hz | 0 | % | 100 | % | 30 | C |
| 171) | 1/2/2010 | 12:43:16 | PM | 206 | V | 221 | V | 50 | Hz | 0 | % | 100 | % | 30 | C |
| 172) | 1/2/2010 | 12:43:18 | PM | 206 | V | 220 | V | 50 | Hz | 0 | % | 100 | % | 30 | C |

FIG. 6 - 6

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 173) | 1/2/2010 | 12:43:20 | PM | 206 | V | 220 | V | 50 | Hz | 0 | % | 100 | % | 30 | C |
| 174) | 1/2/2010 | 12:43:22 | PM | 206 | V | 221 | V | 50 | Hz | 0 | % | 100 | % | 30 | C |
| 175) | 1/2/2010 | 12:43:24 | PM | 207 | V | 221 | V | 50 | Hz | 0 | % | 100 | % | 30 | C |
| 176) | 1/2/2010 | 12:43:26 | PM | 207 | V | 220 | V | 50 | Hz | 0 | % | 100 | % | 30 | C |
| 177) | 1/2/2010 | 12:43:28 | PM | 208 | V | 220 | V | 50 | Hz | 0 | % | 100 | % | 30 | C |
| 178) | 1/2/2010 | 12:43:30 | PM | 208 | V | 220 | V | 50 | Hz | 0 | % | 100 | % | 30 | C |
| 179) | 1/2/2010 | 12:43:32 | PM | 206 | V | 220 | V | 50 | Hz | 0 | % | 100 | % | 30 | C |
| 180) | 1/2/2010 | 12:43:34 | PM | 207 | V | 220 | V | 49 | Hz | 0 | % | 100 | % | 30 | C |
| 181) | 1/2/2010 | 12:43:36 | PM | 208 | V | 220 | V | 50 | Hz | 0 | % | 100 | % | 30 | C |
| 182) | 1/2/2010 | 12:43:38 | PM | 206 | V | 220 | V | 50 | Hz | 0 | % | 100 | % | 30 | C |
| 183) | 1/2/2010 | 12:43:41 | PM | 204 | V | 220 | V | 50 | Hz | 0 | % | 100 | % | 30 | C |
| 184) | 1/2/2010 | 12:43:43 | PM | 204 | V | 220 | V | 49 | Hz | 0 | % | 100 | % | 30 | C |
| 185) | 1/2/2010 | 12:43:45 | PM | 205 | V | 221 | V | 50 | Hz | 0 | % | 100 | % | 30 | C |
| 186) | 1/2/2010 | 12:43:47 | PM | 208 | V | 220 | V | 50 | Hz | 0 | % | 100 | % | 30 | C |
| 187) | 1/2/2010 | 12:43:49 | PM | 208 | V | 220 | V | 50 | Hz | 0 | % | 100 | % | 30 | C |
| 188) | 1/2/2010 | 12:43:51 | PM | 207 | V | 220 | V | 50 | Hz | 0 | % | 100 | % | 30 | C |
| 189) | 1/2/2010 | 12:43:53 | PM | 208 | V | 220 | V | 50 | Hz | 0 | % | 100 | % | 30 | C |
| 190) | 1/2/2010 | 12:43:55 | PM | 207 | V | 220 | V | 50 | Hz | 0 | % | 100 | % | 30 | C |
| 191) | 1/2/2010 | 12:43:57 | PM | 207 | V | 220 | V | 50 | Hz | 0 | % | 100 | % | 30 | C |
| 192) | 1/2/2010 | 12:43:59 | PM | 206 | V | 220 | V | 50 | Hz | 0 | % | 100 | % | 30 | C |
| 193) | 1/2/2010 | 12:44:01 | PM | 206 | V | 220 | V | 50 | Hz | 0 | % | 100 | % | 30 | C |
| 194) | 1/2/2010 | 12:44:03 | PM | 206 | V | 220 | V | 50 | Hz | 0 | % | 100 | % | 30 | C |
| 195) | 1/2/2010 | 12:44:05 | PM | 206 | V | 220 | V | 50 | Hz | 0 | % | 100 | % | 30 | C |
| 196) | 1/2/2010 | 12:44:07 | PM | 206 | V | 221 | V | 50 | Hz | 0 | % | 100 | % | 30 | C |
| 198) | 1/2/2010 | 12:44:12 | PM | 208 | V | 221 | V | 50 | Hz | 0 | % | 100 | % | 30 | C |
| 199) | 1/2/2010 | 12:44:14 | PM | 208 | V | 221 | V | 50 | Hz | 0 | % | 100 | % | 30 | C |
| 200) | 1/2/2010 | 12:44:16 | PM | 206 | V | 220 | V | 50 | Hz | 0 | % | 100 | % | 30 | C |
| 201) | 1/2/2010 | 12:44:18 | PM | 207 | V | 220 | V | 50 | Hz | 0 | % | 100 | % | 30 | C |

FIG. 6 - 7

| | | | | Input | Volts | Output | Volts | Input | Hertz | Output | % | B.S. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 202) | 1/2/2010 | 12:44:20 | PM | 207 | V | 220 | V | 50 | Hz | 0 | % | 100 | % | 30 | C |
| 203) | 1/2/2010 | 12:44:22 | PM | 206 | V | 220 | V | 50 | Hz | 0 | % | 100 | % | 30 | C |
| 204) | 1/2/2010 | 12:44:24 | PM | 205 | V | 220 | V | 50 | Hz | 0 | % | 100 | % | 30 | C |
| 205) | 1/2/2010 | 12:44:26 | PM | 206 | V | 220 | V | 50 | Hz | 0 | % | 100 | % | 30 | C |
| 206) | 1/2/2010 | 12:44:28 | PM | 206 | V | 220 | V | 50 | Hz | 0 | % | 100 | % | 30 | C |
| 207) | 1/2/2010 | 12:44:30 | PM | 207 | V | 221 | V | 50 | Hz | 0 | % | 100 | % | 30 | C |
| 208) | 1/2/2010 | 12:44:32 | PM | 207 | V | 221 | V | 50 | Hz | 0 | % | 100 | % | 30 | C |
| 209) | 1/2/2010 | 12:44:34 | PM | 205 | V | 221 | V | 50 | Hz | 0 | % | 100 | % | 30 | C |
| 210) | 1/2/2010 | 12:44:36 | PM | 208 | V | 220 | V | 50 | Hz | 0 | % | 100 | % | 30 | C |
| 211) | 1/2/2010 | 12:44:38 | PM | 207 | V | 220 | V | 50 | Hz | 0 | % | 100 | % | 30 | C |
| 212) | 1/2/2010 | 12:44:40 | PM | 206 | V | 220 | V | 50 | Hz | 0 | % | 100 | % | 30 | C |
| 213) | 1/2/2010 | 12:44:43 | PM | 205 | V | 220 | V | 50 | Hz | 0 | % | 100 | % | 30 | C |
| 214) | 1/2/2010 | 12:44:45 | PM | 206 | V | 220 | V | 50 | Hz | 0 | % | 100 | % | 30 | C |
| 215) | 1/2/2010 | 12:44:47 | PM | 204 | V | 220 | V | 50 | Hz | 0 | % | 100 | % | 30 | C |
| 216) | 1/2/2010 | 12:44:49 | PM | 205 | V | 220 | V | 50 | Hz | 0 | % | 100 | % | 30 | C |
| 217) | 1/2/2010 | 12:44:51 | PM | 205 | V | 221 | V | 50 | Hz | 0 | % | 100 | % | 30 | C |
| 218) | 1/2/2010 | 12:44:53 | PM | 207 | V | 221 | V | 50 | Hz | 0 | % | 100 | % | 30 | C |
| 219) | 1/2/2010 | 12:44:55 | PM | 206 | V | 221 | V | 50 | Hz | 0 | % | 100 | % | 30 | C |
| 220) | 1/2/2010 | 12:44:57 | PM | 206 | V | 220 | V | 50 | Hz | 0 | % | 100 | % | 30 | C |
| 221) | 1/2/2010 | 12:44:59 | PM | 208 | V | 220 | V | 50 | Hz | 0 | % | 100 | % | 30 | C |
| 222) | 1/2/2010 | 12:45:01 | PM | 208 | V | 220 | V | 50 | Hz | 0 | % | 100 | % | 30 | C |
| 223) | 1/2/2010 | 12:45:03 | PM | 207 | V | 220 | V | 50 | Hz | 0 | % | 100 | % | 30 | C |
| 224) | 1/2/2010 | 12:45:05 | PM | 207 | V | 220 | V | 50 | Hz | 0 | % | 100 | % | 30 | C |
| 225) | 1/2/2010 | 12:45:07 | PM | 205 | V | 220 | V | 50 | Hz | 0 | % | 100 | % | 30 | C |
| 226) | 1/2/2010 | 12:45:09 | PM | 206 | V | 220 | V | 50 | Hz | 0 | % | 100 | % | 30 | C |
| 227) | 1/2/2010 | 12:45:11 | PM | 206 | V | 220 | V | 50 | Hz | 0 | % | 100 | % | 30 | C |
| 228) | 1/2/2010 | 12:45:14 | PM | 206 | V | 220 | V | 50 | Hz | 0 | % | 100 | % | 30 | C |
| 229) | 1/2/2010 | 12:45:16 | PM | 207 | V | 221 | V | 50 | Hz | 0 | % | 100 | % | 30 | C |

FIG. 6 - 8

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 230) | 1/2/2010 | 12:45:18 | PM | 207 | V | 221 | V | 50 | Hz | 0 | % | 100 | % | 30 | C |
| 231) | 1/2/2010 | 12:45:20 | PM | 208 | V | 220 | V | 50 | Hz | 0 | % | 100 | % | 30 | C |
| 232) | 1/2/2010 | 12:45:22 | PM | 208 | V | 220 | V | 50 | Hz | 0 | % | 100 | % | 30 | C |
| 233) | 1/2/2010 | 12:45:24 | PM | 208 | V | 220 | V | 49 | Hz | 0 | % | 100 | % | 30 | C |
| 234) | 1/2/2010 | 12:45:26 | PM | 208 | V | 220 | V | 50 | Hz | 0 | % | 100 | % | 30 | C |
| 235) | 1/2/2010 | 12:45:28 | PM | 208 | V | 220 | V | 50 | Hz | 0 | % | 100 | % | 30 | C |
| 236) | 1/2/2010 | 12:45:30 | PM | 206 | V | 220 | V | 50 | Hz | 0 | % | 100 | % | 30 | C |
| 238) | 1/2/2010 | 12:45:34 | PM | 206 | V | 220 | V | 50 | Hz | 0 | % | 100 | % | 30 | C |
| 239) | 1/2/2010 | 12:45:36 | PM | 208 | V | 221 | V | 50 | Hz | 0 | % | 100 | % | 30 | C |
| 240) | 1/2/2010 | 12:45:38 | PM | 207 | V | 221 | V | 50 | Hz | 0 | % | 100 | % | 30 | C |
| 241) | 1/2/2010 | 12:45:40 | PM | 207 | V | 221 | V | 50 | Hz | 0 | % | 100 | % | 30 | C |
| 242) | 1/2/2010 | 12:45:42 | PM | 207 | V | 221 | V | 50 | Hz | 0 | % | 100 | % | 30 | C |
| 243) | 1/2/2010 | 12:45:45 | PM | 208 | V | 221 | V | 50 | Hz | 0 | % | 100 | % | 30 | C |
| 244) | 1/2/2010 | 12:45:47 | PM | 208 | V | 220 | V | 50 | Hz | 0 | % | 100 | % | 30 | C |
| 245) | 1/2/2010 | 12:45:49 | PM | 208 | V | 220 | V | 50 | Hz | 0 | % | 100 | % | 30 | C |
| 246) | 1/2/2010 | 12:45:51 | PM | 208 | V | 220 | V | 50 | Hz | 0 | % | 100 | % | 30 | C |
| 247) | 1/2/2010 | 12:45:53 | PM | 206 | V | 220 | V | 50 | Hz | 0 | % | 100 | % | 30 | C |
| 248) | 1/2/2010 | 12:45:55 | PM | 206 | V | 220 | V | 50 | Hz | 0 | % | 100 | % | 30 | C |
| 249) | 1/2/2010 | 12:45:57 | PM | 206 | V | 220 | V | 50 | Hz | 0 | % | 100 | % | 30 | C |
| 250) | 1/2/2010 | 12:45:59 | PM | 207 | V | 220 | V | 50 | Hz | 0 | % | 100 | % | 30 | C |
| 251) | 1/2/2010 | 12:46:01 | PM | 207 | V | 221 | V | 50 | Hz | 0 | % | 100 | % | 30 | C |
| 252) | 1/2/2010 | 12:46:03 | PM | 208 | V | 220 | V | 50 | Hz | 0 | % | 100 | % | 30 | C |
| 253) | 1/2/2010 | 12:46:05 | PM | 208 | V | 220 | V | 50 | Hz | 0 | % | 100 | % | 30 | C |
| 254) | 1/2/2010 | 12:46:07 | PM | 208 | V | 220 | V | 50 | Hz | 0 | % | 100 | % | 30 | C |
| 255) | 1/2/2010 | 12:46:09 | PM | 208 | V | 219 | V | 50 | Hz | 0 | % | 100 | % | 30 | C |
| 256) | 1/2/2010 | 12:46:11 | PM | 206 | V | 218 | V | 50 | Hz | 0 | % | 100 | % | 30 | C |
| 257) | 1/2/2010 | 12:46:13 | PM | 208 | V | 220 | V | 50 | Hz | 0 | % | 100 | % | 30 | C |
| 258) | 1/2/2010 | 12:46:15 | PM | 206 | V | 220 | V | 50 | Hz | 0 | % | 100 | % | 30 | C |

FIG. 6 - 9

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 259) | 1/2/2010 | 12:46:18 | PM | 206 | V | 220 | V | 50 | Hz | 0 | % | 100 | % | 30 | C |
| 260) | 1/2/2010 | 12:46:20 | PM | 207 | V | 220 | V | 50 | Hz | 0 | % | 100 | % | 30 | C |
| 261) | 1/2/2010 | 12:46:22 | PM | 205 | V | 221 | V | 50 | Hz | 0 | % | 100 | % | 30 | C |
| 262) | 1/2/2010 | 12:46:24 | PM | 206 | V | 221 | V | 50 | Hz | 0 | % | 100 | % | 30 | C |
| 263) | 1/2/2010 | 12:46:26 | PM | 207 | V | 221 | V | 50 | Hz | 0 | % | 100 | % | 30 | C |
| 264) | 1/2/2010 | 12:46:28 | PM | 206 | V | 221 | V | 50 | Hz | 0 | % | 100 | % | 30 | C |
| 265) | 1/2/2010 | 12:46:30 | PM | 208 | V | 221 | V | 50 | Hz | 0 | % | 100 | % | 30 | C |
| 266) | 1/2/2010 | 12:46:32 | PM | 206 | V | 220 | V | 50 | Hz | 0 | % | 100 | % | 30 | C |
| 267) | 1/2/2010 | 12:46:34 | PM | 207 | V | 220 | V | 50 | Hz | 0 | % | 100 | % | 30 | C |
| 268) | 1/2/2010 | 12:46:36 | PM | 205 | V | 219 | V | 50 | Hz | 0 | % | 100 | % | 30 | C |
| 269) | 1/2/2010 | 12:46:38 | PM | 206 | V | 220 | V | 50 | Hz | 0 | % | 100 | % | 30 | C |
| 270) | 1/2/2010 | 12:46:40 | PM | 206 | V | 220 | V | 50 | Hz | 0 | % | 100 | % | 30 | C |
| 271) | 1/2/2010 | 12:46:42 | PM | 206 | V | 220 | V | 50 | Hz | 0 | % | 100 | % | 30 | C |
| 272) | 1/2/2010 | 12:46:44 | PM | 205 | V | 221 | V | 50 | Hz | 0 | % | 100 | % | 30 | C |
| 273) | 1/2/2010 | 12:46:47 | PM | 207 | V | 221 | V | 50 | Hz | 0 | % | 100 | % | 30 | C |
| 274) | 1/5/2010 | 1:37:02 | PM | 0 | V | 0 | V | 0 | Hz | 0 | % | 15 | % | 27 | C |
| 275) | 1/5/2010 | 1:37:04 | PM | 0 | V | 217 | V | 0 | Hz | 0 | % | 82 | % | 27 | C |
| 276) | 1/5/2010 | 1:37:06 | PM | 0 | V | 218 | V | 0 | Hz | 0 | % | 82 | % | 27 | C |
| 278) | 1/5/2010 | 1:37:10 | PM | 0 | V | 218 | V | 0 | Hz | 0 | % | 82 | % | 27 | C |
| 279) | 1/5/2010 | 1:37:12 | PM | 0 | V | 218 | V | 0 | Hz | 0 | % | 82 | % | 27 | C |
| 280) | 1/5/2010 | 1:37:14 | PM | 0 | V | 218 | V | 0 | Hz | 0 | % | 82 | % | 27 | C |
| 281) | 1/5/2010 | 1:37:16 | PM | 0 | V | 218 | V | 0 | Hz | 0 | % | 82 | % | 27 | C |
| 282) | 1/5/2010 | 1:37:18 | PM | 0 | V | 218 | V | 0 | Hz | 0 | % | 82 | % | 27 | C |
| 283) | 1/5/2010 | 1:37:20 | PM | 0 | V | 218 | V | 0 | Hz | 0 | % | 82 | % | 27 | C |
| 284) | 1/5/2010 | 1:37:22 | PM | 0 | V | 219 | V | 0 | Hz | 0 | % | 82 | % | 27 | C |
| 285) | 1/5/2010 | 1:37:24 | PM | 0 | V | 219 | V | 0 | Hz | 0 | % | 82 | % | 27 | C |
| 286) | 1/5/2010 | 1:37:26 | PM | 0 | V | 219 | V | 0 | Hz | 0 | % | 82 | % | 27 | C |
| 287) | 1/5/2010 | 1:37:28 | PM | 0 | V | 219 | V | 0 | Hz | 0 | % | 82 | % | 27 | C |

FIG. 6 - 10

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 288) | 1/5/2010 | 1:37:30 | PM | 0 | V | 219 | V | 0 | Hz | 0 | % | 82 | % | 27 | C |
| 289) | 1/5/2010 | 1:37:33 | PM | 0 | V | 218 | V | 0 | Hz | 0 | % | 82 | % | 27 | C |
| 290) | 1/5/2010 | 1:37:35 | PM | 0 | V | 219 | V | 0 | Hz | 0 | % | 82 | % | 27 | C |
| 291) | 1/5/2010 | 1:37:37 | PM | 0 | V | 218 | V | 0 | Hz | 0 | % | 82 | % | 27 | C |
| 292) | 1/5/2010 | 1:37:39 | PM | 0 | V | 219 | V | 0 | Hz | 0 | % | 82 | % | 27 | C |
| 293) | 1/5/2010 | 1:37:41 | PM | 0 | V | 219 | V | 0 | Hz | 0 | % | 82 | % | 27 | C |
| 294) | 1/5/2010 | 1:37:43 | PM | 0 | V | 218 | V | 0 | Hz | 0 | % | 82 | % | 27 | C |
| 295) | 1/5/2010 | 1:37:45 | PM | 0 | V | 218 | V | 0 | Hz | 0 | % | 82 | % | 27 | C |
| 296) | 1/5/2010 | 1:37:47 | PM | 0 | V | 218 | V | 0 | Hz | 0 | % | 82 | % | 27 | C |
| 297) | 1/5/2010 | 1:37:49 | PM | 0 | V | 218 | V | 0 | Hz | 0 | % | 82 | % | 27 | C |
| 298) | 1/5/2010 | 1:37:51 | PM | 0 | V | 218 | V | 0 | Hz | 0 | % | 82 | % | 27 | C |
| 299) | 1/5/2010 | 1:37:53 | PM | 0 | V | 218 | V | 0 | Hz | 0 | % | 82 | % | 27 | C |
| 300) | 1/5/2010 | 1:37:55 | PM | 0 | V | 218 | V | 0 | Hz | 0 | % | 80 | % | 27 | C |
| 301) | 1/5/2010 | 1:37:57 | PM | 0 | V | 218 | V | 0 | Hz | 0 | % | 80 | % | 27 | C |
| 302) | 1/5/2010 | 1:37:59 | PM | 0 | V | 218 | V | 0 | Hz | 0 | % | 80 | % | 27 | C |
| 303) | 1/5/2010 | 1:38:01 | PM | 0 | V | 219 | V | 0 | Hz | 0 | % | 80 | % | 27 | C |
| 304) | 1/5/2010 | 1:38:04 | PM | 0 | V | 219 | V | 0 | Hz | 0 | % | 82 | % | 27 | C |
| 305) | 1/5/2010 | 1:38:06 | PM | 0 | V | 219 | V | 0 | Hz | 0 | % | 80 | % | 27 | C |
| 306) | 1/5/2010 | 1:38:08 | PM | 0 | V | 219 | V | 0 | Hz | 0 | % | 80 | % | 27 | C |
| 307) | 1/5/2010 | 1:38:10 | PM | 0 | V | 219 | V | 0 | Hz | 0 | % | 80 | % | 27 | C |
| 308) | 1/5/2010 | 1:38:12 | PM | 0 | V | 218 | V | 0 | Hz | 0 | % | 80 | % | 27 | C |
| 309) | 1/5/2010 | 1:38:14 | PM | 0 | V | 218 | V | 0 | Hz | 0 | % | 80 | % | 27 | C |
| 310) | 1/5/2010 | 1:38:16 | PM | 0 | V | 218 | V | 0 | Hz | 0 | % | 80 | % | 27 | C |
| 311) | 1/5/2010 | 1:38:18 | PM | 0 | V | 218 | V | 0 | Hz | 0 | % | 80 | % | 27 | C |
| 312) | 1/5/2010 | 1:38:20 | PM | 0 | V | 218 | V | 0 | Hz | 0 | % | 80 | % | 27 | C |
| 313) | 1/5/2010 | 1:38:22 | PM | 0 | V | 218 | V | 0 | Hz | 0 | % | 80 | % | 27 | C |
| 314) | 1/5/2010 | 1:38:24 | PM | 2 | V | 212 | V | 0 | Hz | 131 | % | 68 | % | 25 | C |
| 315) | 1/5/2010 | 1:38:26 | PM | 2 | V | 221 | V | 0 | Hz | 11 | % | 78 | % | 27 | C |

FIG. 6 - 11

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 316) | 1/5/2010 | 1:38:28 | PM | 2 | V | 220 | V | 0 | Hz | 11 | % | 78 | % | 27 | C |
| 318) | 1/5/2010 | 1:38:32 | PM | 2 | V | 220 | V | 0 | Hz | 12 | % | 78 | % | 27 | C |
| 319) | 1/5/2010 | 1:38:36 | PM | 2 | V | 220 | V | 0 | Hz | 11 | % | 78 | % | 27 | C |
| 320) | 1/5/2010 | 1:38:38 | PM | 2 | V | 221 | V | 0 | Hz | 11 | % | 78 | % | 27 | C |
| 321) | 1/5/2010 | 1:38:40 | PM | 2 | V | 219 | V | 0 | Hz | 40 | % | 77 | % | 27 | C |
| 322) | 1/5/2010 | 1:38:42 | PM | 2 | V | 219 | V | 0 | Hz | 37 | % | 78 | % | 27 | C |
| 323) | 1/5/2010 | 1:38:44 | PM | 2 | V | 220 | V | 0 | Hz | 37 | % | 78 | % | 27 | C |
| 324) | 1/5/2010 | 1:38:46 | PM | 2 | V | 220 | V | 0 | Hz | 37 | % | 77 | % | 27 | C |
| 325) | 1/5/2010 | 1:38:48 | PM | 2 | V | 220 | V | 0 | Hz | 37 | % | 77 | % | 27 | C |
| 326) | 1/5/2010 | 1:38:50 | PM | 2 | V | 219 | V | 0 | Hz | 38 | % | 77 | % | 27 | C |
| 327) | 1/5/2010 | 1:38:52 | PM | 2 | V | 219 | V | 0 | Hz | 39 | % | 77 | % | 27 | C |
| 328) | 1/5/2010 | 1:38:56 | PM | 2 | V | 218 | V | 0 | Hz | 38 | % | 77 | % | 27 | C |
| 329) | 1/5/2010 | 1:38:58 | PM | 2 | V | 218 | V | 0 | Hz | 39 | % | 77 | % | 27 | C |
| 330) | 1/5/2010 | 1:39:00 | PM | 2 | V | 220 | V | 0 | Hz | 37 | % | 77 | % | 27 | C |
| 331) | 1/5/2010 | 1:39:02 | PM | 2 | V | 218 | V | 0 | Hz | 37 | % | 77 | % | 27 | C |
| 332) | 1/5/2010 | 1:39:04 | PM | 2 | V | 218 | V | 0 | Hz | 37 | % | 77 | % | 27 | C |
| 333) | 1/5/2010 | 1:39:07 | PM | 2 | V | 219 | V | 0 | Hz | 36 | % | 77 | % | 27 | C |
| 334) | 1/5/2010 | 1:39:09 | PM | 2 | V | 219 | V | 0 | Hz | 37 | % | 77 | % | 27 | C |
| 335) | 1/5/2010 | 1:39:11 | PM | 2 | V | 219 | V | 0 | Hz | 40 | % | 77 | % | 27 | C |
| 336) | 1/5/2010 | 1:39:13 | PM | 2 | V | 219 | V | 0 | Hz | 39 | % | 77 | % | 27 | C |
| 337) | 1/5/2010 | 1:39:15 | PM | 2 | V | 219 | V | 0 | Hz | 39 | % | 77 | % | 27 | C |
| 338) | 1/5/2010 | 1:39:17 | PM | 2 | V | 219 | V | 0 | Hz | 39 | % | 77 | % | 27 | C |
| 339) | 1/5/2010 | 1:39:19 | PM | 2 | V | 219 | V | 0 | Hz | 40 | % | 75 | % | 27 | C |
| 340) | 1/5/2010 | 1:39:21 | PM | 2 | V | 219 | V | 0 | Hz | 38 | % | 77 | % | 27 | C |
| 341) | 1/5/2010 | 1:39:23 | PM | 2 | V | 219 | V | 0 | Hz | 38 | % | 77 | % | 27 | C |
| 342) | 1/5/2010 | 1:39:25 | PM | 2 | V | 219 | V | 0 | Hz | 37 | % | 77 | % | 27 | C |
| 343) | 1/5/2010 | 1:39:27 | PM | 2 | V | 219 | V | 0 | Hz | 37 | % | 75 | % | 27 | C |
| 344) | 1/5/2010 | 1:39:29 | PM | 2 | V | 218 | V | 0 | Hz | 38 | % | 75 | % | 27 | C |

FIG. 6 - 12

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 345) | 1/5/2010 | 1:39:31 | PM | 2 | V | 218 | V | 0 | Hz | 40 | % | 75 | % | 27 | C |
| 346) | 1/5/2010 | 1:39:33 | PM | 2 | V | 219 | V | 0 | Hz | 39 | % | 75 | % | 27 | C |
| 347) | 1/5/2010 | 1:39:35 | PM | 2 | V | 218 | V | 0 | Hz | 39 | % | 75 | % | 27 | C |
| 348) | 1/5/2010 | 1:39:38 | PM | 2 | V | 218 | V | 0 | Hz | 40 | % | 75 | % | 27 | C |
| 349) | 1/5/2010 | 1:39:40 | PM | 2 | V | 218 | V | 0 | Hz | 37 | % | 75 | % | 27 | C |
| 350) | 1/5/2010 | 1:39:42 | PM | 2 | V | 218 | V | 0 | Hz | 37 | % | 77 | % | 27 | C |
| 351) | 1/5/2010 | 1:39:44 | PM | 2 | V | 218 | V | 0 | Hz | 38 | % | 75 | % | 27 | C |
| 352) | 1/5/2010 | 1:39:46 | PM | 2 | V | 218 | V | 0 | Hz | 37 | % | 77 | % | 27 | C |
| 353) | 1/5/2010 | 1:39:48 | PM | 2 | V | 218 | V | 0 | Hz | 37 | % | 77 | % | 27 | C |
| 354) | 1/5/2010 | 1:39:50 | PM | 2 | V | 210 | V | 0 | Hz | 72 | % | 65 | % | 25 | C |
| 355) | 1/5/2010 | 1:39:52 | PM | 2 | V | 213 | V | 0 | Hz | 71 | % | 65 | % | 25 | C |
| 356) | 1/5/2010 | 1:39:54 | PM | 2 | V | 210 | V | 0 | Hz | 71 | % | 62 | % | 25 | C |
| 358) | 1/5/2010 | 1:39:58 | PM | 2 | V | 206 | V | 0 | Hz | 87 | % | 58 | % | 25 | C |
| 359) | 1/5/2010 | 1:40:00 | PM | 47 | V | 217 | V | 0 | Hz | 83 | % | 58 | % | 25 | C |
| 360) | 1/5/2010 | 1:40:02 | PM | 37 | V | 203 | V | 0 | Hz | 82 | % | 58 | % | 25 | C |
| 361) | 1/5/2010 | 1:40:04 | PM | 3 | V | 202 | V | 0 | Hz | 82 | % | 58 | % | 25 | C |
| 362) | 1/5/2010 | 1:40:06 | PM | 6 | V | 216 | V | 0 | Hz | 82 | % | 58 | % | 25 | C |
| 363) | 1/5/2010 | 1:40:09 | PM | 4 | V | 190 | V | 0 | Hz | 86 | % | 58 | % | 25 | C |
| 364) | 1/5/2010 | 1:40:11 | PM | 2 | V | 217 | V | 0 | Hz | 87 | % | 58 | % | 25 | C |
| 365) | 1/5/2010 | 1:40:13 | PM | 7 | V | 212 | V | 0 | Hz | 87 | % | 58 | % | 25 | C |
| 366) | 1/5/2010 | 1:40:15 | PM | 5 | V | 195 | V | 0 | Hz | 87 | % | 58 | % | 25 | C |
| 367) | 1/5/2010 | 1:40:17 | PM | 38 | V | 216 | V | 0 | Hz | 87 | % | 58 | % | 25 | C |
| 368) | 1/5/2010 | 1:40:19 | PM | 31 | V | 216 | V | 0 | Hz | 83 | % | 58 | % | 25 | C |
| 369) | 1/5/2010 | 1:40:21 | PM | 13 | V | 201 | V | 0 | Hz | 82 | % | 58 | % | 25 | C |
| 370) | 1/5/2010 | 1:40:23 | PM | 2 | V | 216 | V | 0 | Hz | 82 | % | 58 | % | 25 | C |
| 371) | 1/5/2010 | 1:40:25 | PM | 2 | V | 210 | V | 0 | Hz | 81 | % | 58 | % | 25 | C |
| 372) | 1/5/2010 | 1:40:27 | PM | 2 | V | 208 | V | 0 | Hz | 81 | % | 58 | % | 25 | C |
| 373) | 1/5/2010 | 1:40:29 | PM | 5 | V | 183 | V | 0 | Hz | 81 | % | 58 | % | 25 | C |

FIG. 6 - 13

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 374) | 1/5/2010 | 1:40:31 | PM | 5 | V | 210 | V | 0 | Hz | 86 | % | 58 | % | 25 | C |
| 375) | 1/5/2010 | 1:40:33 | PM | 27 | V | 217 | V | 0 | Hz | 86 | % | 58 | % | 25 | C |
| 376) | 1/5/2010 | 1:40:35 | PM | 10 | V | 216 | V | 0 | Hz | 86 | % | 58 | % | 25 | C |
| 377) | 1/5/2010 | 1:40:37 | PM | 40 | V | 217 | V | 0 | Hz | 87 | % | 58 | % | 25 | C |
| 378) | 1/5/2010 | 1:40:40 | PM | 11 | V | 198 | V | 0 | Hz | 82 | % | 58 | % | 25 | C |
| 379) | 1/5/2010 | 1:40:42 | PM | 4 | V | 214 | V | 0 | Hz | 82 | % | 58 | % | 25 | C |
| 380) | 1/5/2010 | 1:40:44 | PM | 16 | V | 217 | V | 0 | Hz | 83 | % | 58 | % | 25 | C |
| 381) | 1/5/2010 | 1:40:46 | PM | 2 | V | 216 | V | 0 | Hz | 82 | % | 58 | % | 25 | C |
| 382) | 1/5/2010 | 1:40:48 | PM | 21 | V | 216 | V | 0 | Hz | 82 | % | 58 | % | 25 | C |
| 383) | 1/5/2010 | 1:40:50 | PM | 14 | V | 209 | V | 0 | Hz | 87 | % | 58 | % | 25 | C |
| 384) | 1/5/2010 | 1:40:52 | PM | 4 | V | 217 | V | 0 | Hz | 87 | % | 58 | % | 25 | C |
| 385) | 1/5/2010 | 1:40:54 | PM | 48 | V | 216 | V | 0 | Hz | 87 | % | 58 | % | 25 | C |
| 386) | 1/5/2010 | 1:40:56 | PM | 12 | V | 187 | V | 0 | Hz | 87 | % | 58 | % | 25 | C |
| 387) | 1/5/2010 | 1:40:58 | PM | 73 | V | 215 | V | 0 | Hz | 86 | % | 58 | % | 25 | C |
| 388) | 1/5/2010 | 1:41:00 | PM | 2 | V | 214 | V | 0 | Hz | 83 | % | 58 | % | 25 | C |
| 389) | 1/5/2010 | 1:41:02 | PM | 7 | V | 211 | V | 0 | Hz | 82 | % | 58 | % | 25 | C |
| 390) | 1/5/2010 | 1:41:04 | PM | 2 | V | 214 | V | 0 | Hz | 82 | % | 58 | % | 25 | C |
| 391) | 1/5/2010 | 1:41:06 | PM | 2 | V | 216 | V | 0 | Hz | 82 | % | 58 | % | 25 | C |
| 392) | 1/5/2010 | 1:41:08 | PM | 2 | V | 215 | V | 0 | Hz | 82 | % | 58 | % | 25 | C |
| 393) | 1/5/2010 | 1:41:11 | PM | 21 | V | 200 | V | 0 | Hz | 87 | % | 58 | % | 25 | C |
| 394) | 1/5/2010 | 1:41:13 | PM | 2 | V | 216 | V | 0 | Hz | 87 | % | 58 | % | 25 | C |
| 395) | 1/5/2010 | 1:41:15 | PM | 2 | V | 217 | V | 0 | Hz | 87 | % | 58 | % | 25 | C |
| 396) | 1/5/2010 | 1:41:17 | PM | 3 | V | 184 | V | 0 | Hz | 87 | % | 58 | % | 25 | C |
| 398) | 1/5/2010 | 1:41:21 | PM | 2 | V | 217 | V | 0 | Hz | 82 | % | 58 | % | 25 | C |
| 399) | 1/5/2010 | 1:41:23 | PM | 14 | V | 204 | V | 0 | Hz | 83 | % | 58 | % | 25 | C |
| 400) | 1/5/2010 | 1:41:25 | PM | 2 | V | 217 | V | 0 | Hz | 82 | % | 58 | % | 25 | C |
| 401) | 1/5/2010 | 1:41:27 | PM | 2 | V | 215 | V | 0 | Hz | 87 | % | 58 | % | 24 | C |
| 402) | 1/5/2010 | 1:41:29 | PM | 2 | V | 214 | V | 0 | Hz | 88 | % | 58 | % | 25 | C |

FIG. 6 - 14

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 403) | 1/5/2010 | 1:41:31 | PM | 10 | V | 200 | V | 0 | Hz | 87 | % | 58 | % | 25 | C |
| 404) | 1/5/2010 | 1:41:33 | PM | 26 | V | 210 | V | 0 | Hz | 87 | % | 58 | % | 25 | C |
| 405) | 1/5/2010 | 1:41:35 | PM | 3 | V | 172 | V | 0 | Hz | 88 | % | 59 | % | 25 | C |
| 406) | 1/5/2010 | 1:41:37 | PM | 44 | V | 215 | V | 0 | Hz | 87 | % | 58 | % | 25 | C |
| 407) | 1/5/2010 | 1:41:39 | PM | 2 | V | 214 | V | 0 | Hz | 82 | % | 58 | % | 25 | C |
| 408) | 1/5/2010 | 1:41:42 | PM | 60 | V | 216 | V | 0 | Hz | 82 | % | 58 | % | 25 | C |
| 409) | 1/5/2010 | 1:41:44 | PM | 21 | V | 195 | V | 0 | Hz | 81 | % | 58 | % | 25 | C |
| 410) | 1/5/2010 | 1:41:46 | PM | 2 | V | 184 | V | 0 | Hz | 82 | % | 58 | % | 25 | C |
| 411) | 1/5/2010 | 1:41:48 | PM | 2 | V | 217 | V | 0 | Hz | 87 | % | 58 | % | 25 | C |
| 412) | 1/5/2010 | 1:41:50 | PM | 14 | V | 216 | V | 0 | Hz | 86 | % | 58 | % | 25 | C |
| 413) | 1/5/2010 | 1:41:52 | PM | 2 | V | 216 | V | 0 | Hz | 85 | % | 58 | % | 25 | C |
| 414) | 1/5/2010 | 1:41:54 | PM | 88 | V | 217 | V | 0 | Hz | 87 | % | 58 | % | 25 | C |
| 415) | 1/5/2010 | 1:41:56 | PM | 35 | V | 208 | V | 0 | Hz | 82 | % | 58 | % | 25 | C |
| 416) | 1/5/2010 | 1:41:58 | PM | 10 | V | 203 | V | 0 | Hz | 82 | % | 58 | % | 25 | C |
| 417) | 1/5/2010 | 1:42:00 | PM | 2 | V | 215 | V | 0 | Hz | 82 | % | 58 | % | 25 | C |
| 418) | 1/5/2010 | 1:42:02 | PM | 54 | V | 204 | V | 0 | Hz | 82 | % | 58 | % | 25 | C |
| 419) | 1/5/2010 | 1:42:04 | PM | 2 | V | 216 | V | 0 | Hz | 82 | % | 58 | % | 25 | C |
| 420) | 1/5/2010 | 1:42:06 | PM | 2 | V | 216 | V | 0 | Hz | 86 | % | 58 | % | 25 | C |
| 421) | 1/5/2010 | 1:42:08 | PM | 2 | V | 216 | V | 0 | Hz | 87 | % | 58 | % | 25 | C |
| 422) | 1/5/2010 | 1:42:10 | PM | 5 | V | 212 | V | 0 | Hz | 87 | % | 58 | % | 25 | C |
| 423) | 1/5/2010 | 1:42:13 | PM | 6 | V | 205 | V | 0 | Hz | 87 | % | 58 | % | 25 | C |
| 424) | 1/5/2010 | 1:42:15 | PM | 17 | V | 214 | V | 0 | Hz | 82 | % | 59 | % | 25 | C |
| 425) | 1/5/2010 | 1:42:17 | PM | 8 | V | 201 | V | 0 | Hz | 82 | % | 58 | % | 25 | C |
| 426) | 1/5/2010 | 1:42:19 | PM | 2 | V | 215 | V | 0 | Hz | 82 | % | 59 | % | 25 | C |
| 427) | 1/5/2010 | 1:42:21 | PM | 4 | V | 214 | V | 0 | Hz | 82 | % | 59 | % | 25 | C |
| 428) | 1/5/2010 | 1:42:23 | PM | 2 | V | 208 | V | 0 | Hz | 82 | % | 58 | % | 25 | C |
| 429) | 1/5/2010 | 1:42:25 | PM | 2 | V | 215 | V | 0 | Hz | 86 | % | 58 | % | 25 | C |
| 430) | 1/5/2010 | 1:42:27 | PM | 4 | V | 214 | V | 0 | Hz | 86 | % | 58 | % | 84 | C |

FIG. 6 - 15

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 431) | 1/5/2010 | 1:42:29 | PM | 2 | V | 216 | V | 0 | Hz | 87 | % | 58 | % | 16 | C |
| 432) | 1/5/2010 | 1:42:31 | PM | 2 | V | 216 | V | 0 | Hz | 87 | % | 58 | % | 25 | C |
| 433) | 1/5/2010 | 1:42:33 | PM | 16 | V | 217 | V | 0 | Hz | 87 | % | 58 | % | 25 | C |
| 434) | 1/5/2010 | 1:42:35 | PM | 28 | V | 216 | V | 0 | Hz | 82 | % | 58 | % | 25 | C |
| 435) | 1/5/2010 | 1:42:37 | PM | 44 | V | 217 | V | 0 | Hz | 82 | % | 58 | % | 25 | C |
| 436) | 1/5/2010 | 1:42:39 | PM | 4 | V | 217 | V | 0 | Hz | 83 | % | 58 | % | 25 | C |
| 438) | 1/5/2010 | 1:42:44 | PM | 52 | V | 201 | V | 0 | Hz | 86 | % | 55 | % | 25 | C |
| 439) | 1/5/2010 | 1:42:46 | PM | 2 | V | 214 | V | 0 | Hz | 87 | % | 58 | % | 25 | C |
| 440) | 1/5/2010 | 1:42:48 | PM | 47 | V | 201 | V | 0 | Hz | 87 | % | 58 | % | 25 | C |
| 441) | 1/5/2010 | 1:42:50 | PM | 3 | V | 191 | V | 0 | Hz | 88 | % | 58 | % | 25 | C |
| 442) | 1/5/2010 | 1:42:52 | PM | 2 | V | 216 | V | 0 | Hz | 87 | % | 58 | % | 25 | C |
| 443) | 1/5/2010 | 1:42:54 | PM | 9 | V | 212 | V | 0 | Hz | 82 | % | 58 | % | 25 | C |
| 444) | 1/5/2010 | 1:42:56 | PM | 14 | V | 215 | V | 0 | Hz | 82 | % | 58 | % | 25 | C |
| 445) | 1/5/2010 | 1:42:58 | PM | 43 | V | 209 | V | 0 | Hz | 82 | % | 58 | % | 25 | C |
| 446) | 1/5/2010 | 1:43:00 | PM | 54 | V | 200 | V | 0 | Hz | 82 | % | 58 | % | 25 | C |
| 447) | 1/5/2010 | 1:43:02 | PM | 14 | V | 187 | V | 0 | Hz | 82 | % | 58 | % | 25 | C |
| 448) | 1/5/2010 | 1:43:04 | PM | 5 | V | 208 | V | 0 | Hz | 87 | % | 58 | % | 25 | C |
| 449) | 1/5/2010 | 1:43:06 | PM | 2 | V | 215 | V | 0 | Hz | 87 | % | 58 | % | 25 | C |
| 450) | 1/5/2010 | 1:43:08 | PM | 28 | V | 214 | V | 0 | Hz | 87 | % | 58 | % | 25 | C |
| 451) | 1/5/2010 | 1:43:10 | PM | 4 | V | 217 | V | 0 | Hz | 86 | % | 58 | % | 25 | C |
| 452) | 1/5/2010 | 1:43:12 | PM | 2 | V | 215 | V | 0 | Hz | 82 | % | 58 | % | 25 | C |
| 453) | 1/5/2010 | 1:43:15 | PM | 16 | V | 217 | V | 0 | Hz | 82 | % | 58 | % | 25 | C |
| 454) | 1/5/2010 | 1:43:17 | PM | 2 | V | 199 | V | 0 | Hz | 83 | % | 58 | % | 25 | C |
| 455) | 1/5/2010 | 1:43:19 | PM | 2 | V | 215 | V | 0 | Hz | 82 | % | 58 | % | 25 | C |
| 456) | 1/5/2010 | 1:43:21 | PM | 2 | V | 208 | V | 0 | Hz | 88 | % | 58 | % | 24 | C |
| 457) | 1/5/2010 | 1:43:23 | PM | 2 | V | 217 | V | 0 | Hz | 87 | % | 58 | % | 25 | C |
| 458) | 1/5/2010 | 1:43:25 | PM | 21 | V | 217 | V | 0 | Hz | 87 | % | 58 | % | 25 | C |
| 459) | 1/5/2010 | 1:43:27 | PM | 64 | V | 216 | V | 0 | Hz | 86 | % | 58 | % | 25 | C |

FIG. 6 - 16

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 460) | 1/5/2010 | 1:43:29 | PM | 3 | V | 216 | V | 0 | Hz | 87 | % | 58 | % | 25 | C |
| 461) | 1/5/2010 | 1:43:31 | PM | 16 | V | 193 | V | 0 | Hz | 87 | % | 58 | % | 24 | C |
| 462) | 1/5/2010 | 1:43:33 | PM | 38 | V | 216 | V | 0 | Hz | 82 | % | 58 | % | 25 | C |
| 463) | 1/5/2010 | 1:43:35 | PM | 3 | V | 215 | V | 0 | Hz | 82 | % | 58 | % | 25 | C |
| 464) | 1/5/2010 | 1:43:37 | PM | 2 | V | 216 | V | 0 | Hz | 82 | % | 58 | % | 25 | C |
| 465) | 1/5/2010 | 1:43:39 | PM | 13 | V | 203 | V | 0 | Hz | 83 | % | 58 | % | 24 | C |
| 466) | 1/5/2010 | 1:43:41 | PM | 2 | V | 198 | V | 0 | Hz | 87 | % | 58 | % | 25 | C |
| 467) | 1/5/2010 | 1:43:43 | PM | 63 | V | 216 | V | 0 | Hz | 87 | % | 58 | % | 25 | C |
| 468) | 1/5/2010 | 1:43:46 | PM | 2 | V | 216 | V | 0 | Hz | 87 | % | 58 | % | 18 | C |
| 469) | 1/5/2010 | 1:43:48 | PM | 2 | V | 215 | V | 0 | Hz | 87 | % | 58 | % | 17 | C |
| 470) | 1/5/2010 | 1:43:50 | PM | 2 | V | 217 | V | 0 | Hz | 83 | % | 58 | % | 17 | C |
| 471) | 1/5/2010 | 1:43:52 | PM | 2 | V | 213 | V | 0 | Hz | 82 | % | 58 | % | 25 | C |
| 472) | 1/5/2010 | 1:43:54 | PM | 2 | V | 217 | V | 0 | Hz | 82 | % | 58 | % | 25 | C |
| 473) | 1/5/2010 | 1:43:56 | PM | 2 | V | 214 | V | 0 | Hz | 81 | % | 58 | % | 25 | C |
| 474) | 1/5/2010 | 1:43:58 | PM | 11 | V | 215 | V | 0 | Hz | 82 | % | 58 | % | 25 | C |
| 475) | 1/5/2010 | 1:44:00 | PM | 11 | V | 196 | V | 0 | Hz | 82 | % | 58 | % | 25 | C |
| 476) | 1/5/2010 | 1:44:02 | PM | 11 | V | 204 | V | 0 | Hz | 87 | % | 58 | % | 25 | C |
| 478) | 1/5/2010 | 1:44:06 | PM | 3 | V | 216 | V | 0 | Hz | 87 | % | 58 | % | 18 | C |
| 479) | 1/5/2010 | 1:44:08 | PM | 17 | V | 216 | V | 0 | Hz | 87 | % | 58 | % | 25 | C |
| 480) | 1/5/2010 | 1:44:10 | PM | 2 | V | 215 | V | 0 | Hz | 87 | % | 58 | % | 25 | C |
| 481) | 1/5/2010 | 1:44:12 | PM | 16 | V | 216 | V | 0 | Hz | 82 | % | 58 | % | 25 | C |
| 482) | 1/5/2010 | 1:44:14 | PM | 3 | V | 215 | V | 0 | Hz | 82 | % | 58 | % | 25 | C |
| 483) | 1/5/2010 | 1:44:17 | PM | 16 | V | 216 | V | 0 | Hz | 83 | % | 58 | % | 25 | C |
| 484) | 1/5/2010 | 1:44:19 | PM | 3 | V | 214 | V | 0 | Hz | 83 | % | 58 | % | 25 | C |
| 485) | 1/5/2010 | 1:44:21 | PM | 11 | V | 212 | V | 0 | Hz | 87 | % | 58 | % | 25 | C |
| 486) | 1/5/2010 | 1:44:23 | PM | 23 | V | 204 | V | 0 | Hz | 87 | % | 58 | % | 25 | C |
| 487) | 1/5/2010 | 1:44:25 | PM | 49 | V | 217 | V | 0 | Hz | 87 | % | 58 | % | 25 | C |
| 488) | 1/5/2010 | 1:44:27 | PM | 3 | V | 215 | V | 0 | Hz | 87 | % | 58 | % | 25 | C |

FIG. 6 - 17

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 489) | 1/5/2010 | 1:44:29 | PM | 50 | V | 217 | V | 0 | Hz | 82 | % | 58 | % | 25 | C |
| 490) | 1/5/2010 | 1:44:31 | PM | 47 | V | 216 | V | 0 | Hz | 82 | % | 58 | % | 25 | C |
| 491) | 1/5/2010 | 1:44:33 | PM | 6 | V | 210 | V | 0 | Hz | 82 | % | 59 | % | 25 | C |
| 492) | 1/5/2010 | 1:44:35 | PM | 38 | V | 217 | V | 0 | Hz | 82 | % | 58 | % | 25 | C |
| 493) | 1/5/2010 | 1:44:37 | PM | 14 | V | 216 | V | 0 | Hz | 82 | % | 58 | % | 25 | C |
| 494) | 1/5/2010 | 1:44:39 | PM | 26 | V | 194 | V | 0 | Hz | 87 | % | 58 | % | 25 | C |
| 495) | 1/5/2010 | 1:44:41 | PM | 3 | V | 213 | V | 0 | Hz | 87 | % | 58 | % | 25 | C |
| 496) | 1/5/2010 | 1:44:43 | PM | 2 | V | 210 | V | 0 | Hz | 87 | % | 58 | % | 25 | C |
| 497) | 1/5/2010 | 1:44:45 | PM | 2 | V | 205 | V | 0 | Hz | 87 | % | 58 | % | 25 | C |
| 498) | 1/5/2010 | 1:44:48 | PM | 6 | V | 216 | V | 0 | Hz | 86 | % | 58 | % | 25 | C |
| 499) | 1/5/2010 | 1:44:50 | PM | 3 | V | 186 | V | 0 | Hz | 81 | % | 58 | % | 25 | C |
| 500) | 1/5/2010 | 1:44:52 | PM | 31 | V | 216 | V | 0 | Hz | 82 | % | 58 | % | 25 | C |
| 501) | 1/5/2010 | 1:44:54 | PM | 2 | V | 216 | V | 0 | Hz | 81 | % | 58 | % | 25 | C |
| 502) | 1/5/2010 | 1:44:56 | PM | 2 | V | 215 | V | 0 | Hz | 82 | % | 58 | % | 25 | C |
| 503) | 1/5/2010 | 1:44:58 | PM | 11 | V | 206 | V | 0 | Hz | 82 | % | 58 | % | 25 | C |
| 504) | 1/5/2010 | 1:45:00 | PM | 4 | V | 215 | V | 0 | Hz | 87 | % | 58 | % | 25 | C |
| 505) | 1/5/2010 | 1:45:02 | PM | 2 | V | 212 | V | 0 | Hz | 87 | % | 59 | % | 25 | C |
| 506) | 1/5/2010 | 1:45:04 | PM | 3 | V | 215 | V | 0 | Hz | 87 | % | 58 | % | 16 | C |
| 507) | 1/5/2010 | 1:45:06 | PM | 2 | V | 216 | V | 0 | Hz | 87 | % | 58 | % | 17 | C |
| 508) | 1/5/2010 | 1:45:08 | PM | 21 | V | 208 | V | 0 | Hz | 87 | % | 58 | % | 25 | C |
| 509) | 1/5/2010 | 1:45:10 | PM | 2 | V | 216 | V | 0 | Hz | 83 | % | 58 | % | 25 | C |
| 510) | 1/5/2010 | 1:45:12 | PM | 2 | V | 213 | V | 0 | Hz | 83 | % | 58 | % | 25 | C |
| 511) | 1/5/2010 | 1:45:14 | PM | 2 | V | 216 | V | 0 | Hz | 82 | % | 59 | % | 25 | C |
| 512) | 1/5/2010 | 1:45:16 | PM | 42 | V | 188 | V | 0 | Hz | 82 | % | 58 | % | 25 | C |
| 513) | 1/5/2010 | 1:45:19 | PM | 10 | V | 210 | V | 0 | Hz | 87 | % | 59 | % | 18 | C |
| 514) | 1/5/2010 | 1:45:21 | PM | 57 | V | 217 | V | 0 | Hz | 87 | % | 58 | % | 25 | C |
| 515) | 1/5/2010 | 1:45:23 | PM | 4 | V | 201 | V | 0 | Hz | 87 | % | 58 | % | 25 | C |
| 516) | 1/5/2010 | 1:45:25 | PM | 56 | V | 216 | V | 0 | Hz | 87 | % | 58 | % | 25 | C |

FIG. 6 - 18

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 518) | 1/5/2010 | 1:45:29 | PM | 13 | V | 211 | V | 0 | Hz | 83 | % | 58 | % | 25 | C |
| 519) | 1/5/2010 | 1:45:31 | PM | 23 | V | 216 | V | 0 | Hz | 83 | % | 58 | % | 25 | C |
| 520) | 1/5/2010 | 1:45:33 | PM | 12 | V | 209 | V | 0 | Hz | 83 | % | 58 | % | 25 | C |
| 521) | 1/5/2010 | 1:45:35 | PM | 6 | V | 209 | V | 0 | Hz | 82 | % | 58 | % | 25 | C |
| 522) | 1/5/2010 | 1:45:37 | PM | 11 | V | 210 | V | 0 | Hz | 82 | % | 58 | % | 25 | C |
| 523) | 1/5/2010 | 1:45:39 | PM | 18 | V | 216 | V | 0 | Hz | 87 | % | 58 | % | 25 | C |
| 524) | 1/5/2010 | 1:45:41 | PM | 35 | V | 216 | V | 0 | Hz | 87 | % | 58 | % | 25 | C |
| 525) | 1/5/2010 | 1:45:43 | PM | 3 | V | 206 | V | 0 | Hz | 87 | % | 58 | % | 25 | C |
| 526) | 1/5/2010 | 1:45:45 | PM | 2 | V | 216 | V | 0 | Hz | 87 | % | 58 | % | 25 | C |
| 527) | 1/5/2010 | 1:45:47 | PM | 10 | V | 217 | V | 0 | Hz | 87 | % | 58 | % | 25 | C |
| 528) | 1/5/2010 | 1:45:50 | PM | 24 | V | 193 | V | 0 | Hz | 81 | % | 58 | % | 25 | C |
| 529) | 1/5/2010 | 1:45:52 | PM | 7 | V | 195 | V | 0 | Hz | 82 | % | 58 | % | 18 | C |
| 530) | 1/5/2010 | 1:45:54 | PM | 2 | V | 216 | V | 0 | Hz | 81 | % | 58 | % | 25 | C |
| 531) | 1/5/2010 | 1:45:56 | PM | 3 | V | 206 | V | 0 | Hz | 81 | % | 58 | % | 25 | C |
| 532) | 1/5/2010 | 1:45:58 | PM | 2 | V | 215 | V | 0 | Hz | 86 | % | 58 | % | 25 | C |
| 533) | 1/5/2010 | 1:46:00 | PM | 3 | V | 212 | V | 0 | Hz | 87 | % | 58 | % | 16 | C |
| 534) | 1/5/2010 | 1:46:02 | PM | 2 | V | 211 | V | 0 | Hz | 88 | % | 58 | % | 25 | C |
| 535) | 1/5/2010 | 1:46:04 | PM | 2 | V | 216 | V | 0 | Hz | 88 | % | 58 | % | 25 | C |
| 536) | 1/5/2010 | 1:46:06 | PM | 6 | V | 212 | V | 0 | Hz | 87 | % | 58 | % | 25 | C |
| 537) | 1/5/2010 | 1:46:08 | PM | 33 | V | 215 | V | 0 | Hz | 82 | % | 58 | % | 25 | C |
| 538) | 1/5/2010 | 1:46:10 | PM | 7 | V | 216 | V | 0 | Hz | 83 | % | 58 | % | 25 | C |
| 539) | 1/5/2010 | 1:46:12 | PM | 7 | V | 216 | V | 0 | Hz | 82 | % | 58 | % | 25 | C |
| 540) | 1/5/2010 | 1:46:14 | PM | 3 | V | 216 | V | 0 | Hz | 83 | % | 62 | % | 25 | C |
| 541) | 1/5/2010 | 1:46:16 | PM | 2 | V | 216 | V | 0 | Hz | 82 | % | 58 | % | 25 | C |
| 542) | 1/5/2010 | 1:46:18 | PM | 2 | V | 216 | V | 0 | Hz | 86 | % | 58 | % | 25 | C |
| 543) | 1/5/2010 | 1:46:21 | PM | 7 | V | 211 | V | 0 | Hz | 86 | % | 58 | % | 25 | C |
| 544) | 1/5/2010 | 1:46:23 | PM | 25 | V | 215 | V | 0 | Hz | 87 | % | 58 | % | 25 | C |
| 545) | 1/5/2010 | 1:46:25 | PM | 2 | V | 212 | V | 0 | Hz | 87 | % | 58 | % | 25 | C |

FIG. 6 - 19

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 546) | 1/5/2010 | 1:46:27 | PM | 2 | V | 215 | V | 0 | Hz | 83 | % | 62 | % | 25 | C |
| 547) | 1/5/2010 | 1:46:29 | PM | 2 | V | 215 | V | 0 | Hz | 82 | % | 58 | % | 25 | C |
| 548) | 1/5/2010 | 1:46:31 | PM | 19 | V | 211 | V | 0 | Hz | 82 | % | 58 | % | 25 | C |
| 549) | 1/5/2010 | 1:46:33 | PM | 9 | V | 205 | V | 0 | Hz | 82 | % | 58 | % | 25 | C |
| 550) | 1/5/2010 | 1:46:35 | PM | 2 | V | 216 | V | 0 | Hz | 88 | % | 58 | % | 25 | C |
| 551) | 1/5/2010 | 1:46:37 | PM | 5 | V | 217 | V | 0 | Hz | 87 | % | 58 | % | 25 | C |
| 552) | 1/5/2010 | 1:46:39 | PM | 8 | V | 206 | V | 0 | Hz | 87 | % | 58 | % | 25 | C |
| 553) | 1/5/2010 | 1:46:41 | PM | 23 | V | 216 | V | 0 | Hz | 87 | % | 58 | % | 25 | C |
| 554) | 1/5/2010 | 1:46:43 | PM | 11 | V | 204 | V | 0 | Hz | 87 | % | 58 | % | 25 | C |
| 555) | 1/5/2010 | 1:46:45 | PM | 5 | V | 190 | V | 0 | Hz | 83 | % | 58 | % | 25 | C |
| 556) | 1/5/2010 | 1:46:47 | PM | 5 | V | 208 | V | 0 | Hz | 82 | % | 58 | % | 25 | C |
| 558) | 1/5/2010 | 1:46:52 | PM | 2 | V | 216 | V | 0 | Hz | 83 | % | 58 | % | 25 | C |
| 559) | 1/5/2010 | 1:46:54 | PM | 2 | V | 205 | V | 0 | Hz | 82 | % | 58 | % | 25 | C |
| 560) | 1/5/2010 | 1:46:56 | PM | 28 | V | 209 | V | 0 | Hz | 86 | % | 58 | % | 25 | C |
| 561) | 1/5/2010 | 1:46:58 | PM | 2 | V | 213 | V | 0 | Hz | 87 | % | 58 | % | 17 | C |
| 562) | 1/5/2010 | 1:47:00 | PM | 13 | V | 206 | V | 0 | Hz | 87 | % | 58 | % | 25 | C |
| 563) | 1/5/2010 | 1:47:02 | PM | 2 | V | 217 | V | 0 | Hz | 87 | % | 58 | % | 25 | C |
| 564) | 1/5/2010 | 1:47:04 | PM | 2 | V | 217 | V | 0 | Hz | 82 | % | 58 | % | 25 | C |
| 565) | 1/5/2010 | 1:47:06 | PM | 8 | V | 216 | V | 0 | Hz | 82 | % | 58 | % | 25 | C |
| 566) | 1/5/2010 | 1:47:08 | PM | 7 | V | 189 | V | 0 | Hz | 83 | % | 58 | % | 25 | C |
| 567) | 1/5/2010 | 1:47:10 | PM | 2 | V | 213 | V | 0 | Hz | 83 | % | 58 | % | 25 | C |
| 568) | 1/5/2010 | 1:47:12 | PM | 2 | V | 212 | V | 0 | Hz | 82 | % | 58 | % | 25 | C |
| 569) | 1/5/2010 | 1:47:14 | PM | 2 | V | 215 | V | 0 | Hz | 87 | % | 58 | % | 25 | C |
| 570) | 1/5/2010 | 1:47:16 | PM | 4 | V | 200 | V | 0 | Hz | 88 | % | 58 | % | 25 | C |
| 571) | 1/5/2010 | 1:47:18 | PM | 3 | V | 211 | V | 0 | Hz | 87 | % | 58 | % | 25 | C |
| 572) | 1/5/2010 | 1:47:20 | PM | 2 | V | 210 | V | 0 | Hz | 86 | % | 58 | % | 25 | C |
| 573) | 1/5/2010 | 1:47:23 | PM | 2 | V | 215 | V | 0 | Hz | 86 | % | 58 | % | 25 | C |
| 574) | 1/5/2010 | 1:47:25 | PM | 17 | V | 214 | V | 0 | Hz | 82 | % | 58 | % | 25 | C |

FIG. 6 - 20

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 575) | 1/5/2010 | 1:47:27 | PM | 31 | V | 214 | V | 0 | Hz | 82 | % | 58 | % | 25 | C |
| 576) | 1/5/2010 | 1:47:29 | PM | 4 | V | 213 | V | 0 | Hz | 82 | % | 58 | % | 25 | C |
| 577) | 1/5/2010 | 1:47:31 | PM | 2 | V | 214 | V | 0 | Hz | 83 | % | 58 | % | 25 | C |
| 578) | 1/5/2010 | 1:47:33 | PM | 5 | V | 200 | V | 0 | Hz | 82 | % | 58 | % | 25 | C |
| 579) | 1/5/2010 | 1:47:35 | PM | 190 | V | 217 | V | 51 | Hz | 87 | % | 53 | % | 17 | C |
| 580) | 1/5/2010 | 1:47:37 | PM | 181 | V | 207 | V | 51 | Hz | 82 | % | 53 | % | 25 | C |
| 581) | 1/5/2010 | 1:47:39 | PM | 178 | V | 208 | V | 51 | Hz | 87 | % | 53 | % | 25 | C |
| 582) | 1/5/2010 | 1:47:41 | PM | 182 | V | 199 | V | 51 | Hz | 80 | % | 53 | % | 25 | C |
| 583) | 1/5/2010 | 1:47:43 | PM | 177 | V | 203 | V | 50 | Hz | 93 | % | 53 | % | 25 | C |
| 584) | 1/5/2010 | 1:47:45 | PM | 179 | V | 196 | V | 51 | Hz | 84 | % | 53 | % | 25 | C |
| 585) | 1/5/2010 | 1:47:47 | PM | 180 | V | 219 | V | 50 | Hz | 82 | % | 53 | % | 16 | C |
| 586) | 1/5/2010 | 1:47:49 | PM | 175 | V | 202 | V | 51 | Hz | 89 | % | 55 | % | 25 | C |
| 587) | 1/5/2010 | 1:47:51 | PM | 191 | V | 205 | V | 50 | Hz | 90 | % | 68 | % | 28 | C |
| 588) | 1/5/2010 | 1:47:54 | PM | 203 | V | 218 | V | 51 | Hz | 95 | % | 70 | % | 28 | C |
| 589) | 1/5/2010 | 1:47:56 | PM | 204 | V | 224 | V | 51 | Hz | 91 | % | 70 | % | 28 | C |
| 590) | 1/5/2010 | 1:47:58 | PM | 204 | V | 222 | V | 51 | Hz | 98 | % | 73 | % | 28 | C |
| 591) | 1/5/2010 | 1:48:00 | PM | 204 | V | 204 | V | 51 | Hz | 89 | % | 73 | % | 28 | C |
| 592) | 1/5/2010 | 1:48:02 | PM | 203 | V | 215 | V | 50 | Hz | 93 | % | 73 | % | 23 | C |
| 593) | 1/5/2010 | 1:48:04 | PM | 199 | V | 217 | V | 50 | Hz | 91 | % | 72 | % | 28 | C |
| 594) | 1/5/2010 | 1:48:06 | PM | 199 | V | 213 | V | 51 | Hz | 94 | % | 75 | % | 28 | C |
| 595) | 1/5/2010 | 1:48:08 | PM | 203 | V | 218 | V | 51 | Hz | 94 | % | 73 | % | 28 | C |
| 596) | 1/5/2010 | 1:48:10 | PM | 205 | V | 200 | V | 50 | Hz | 88 | % | 73 | % | 28 | C |
| 598) | 1/5/2010 | 1:48:14 | PM | 204 | V | 207 | V | 51 | Hz | 99 | % | 73 | % | 28 | C |
| 599) | 1/5/2010 | 1:48:16 | PM | 205 | V | 219 | V | 51 | Hz | 93 | % | 75 | % | 28 | C |
| 600) | 1/5/2010 | 1:48:18 | PM | 203 | V | 210 | V | 51 | Hz | 102 | % | 73 | % | 28 | C |
| 601) | 1/5/2010 | 1:48:20 | PM | 202 | V | 210 | V | 51 | Hz | 89 | % | 75 | % | 28 | C |
| 602) | 1/5/2010 | 1:48:22 | PM | 204 | V | 209 | V | 51 | Hz | 97 | % | 75 | % | 28 | C |
| 603) | 1/5/2010 | 1:48:25 | PM | 202 | V | 222 | V | 51 | Hz | 91 | % | 75 | % | 28 | C |

FIG. 6 - 21

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 604) | 1/5/2010 | 1:48:27 | PM | 201 | V | 216 | V | 51 | Hz | 98 | % | 75 | % | 28 | C |
| 605) | 1/5/2010 | 1:48:29 | PM | 204 | V | 223 | V | 50 | Hz | 89 | % | 75 | % | 28 | C |
| 606) | 1/5/2010 | 1:48:31 | PM | 199 | V | 209 | V | 51 | Hz | 97 | % | 77 | % | 28 | C |
| 607) | 1/5/2010 | 1:48:34 | PM | 204 | V | 209 | V | 51 | Hz | 94 | % | 75 | % | 28 | C |
| 608) | 1/5/2010 | 1:48:36 | PM | 203 | V | 209 | V | 50 | Hz | 97 | % | 75 | % | 28 | C |
| 609) | 1/5/2010 | 1:48:38 | PM | 196 | V | 217 | V | 51 | Hz | 103 | % | 75 | % | 20 | C |
| 610) | 1/5/2010 | 1:48:40 | PM | 196 | V | 211 | V | 51 | Hz | 90 | % | 75 | % | 23 | C |
| 611) | 1/5/2010 | 1:48:42 | PM | 204 | V | 222 | V | 51 | Hz | 99 | % | 77 | % | 18 | C |
| 612) | 1/5/2010 | 1:48:46 | PM | 197 | V | 219 | V | 51 | Hz | 87 | % | 77 | % | 28 | C |
| 613) | 1/5/2010 | 1:48:48 | PM | 205 | V | 205 | V | 51 | Hz | 91 | % | 77 | % | 28 | C |
| 614) | 1/5/2010 | 1:48:50 | PM | 206 | V | 222 | V | 51 | Hz | 58 | % | 77 | % | 28 | C |
| 615) | 1/5/2010 | 1:48:52 | PM | 210 | V | 210 | V | 50 | Hz | 49 | % | 77 | % | 28 | C |
| 616) | 1/5/2010 | 1:48:54 | PM | 215 | V | 221 | V | 51 | Hz | 37 | % | 77 | % | 28 | C |
| 617) | 1/5/2010 | 1:48:57 | PM | 214 | V | 221 | V | 51 | Hz | 37 | % | 77 | % | 28 | C |
| 618) | 1/5/2010 | 1:48:59 | PM | 214 | V | 221 | V | 51 | Hz | 37 | % | 77 | % | 28 | C |
| 619) | 1/5/2010 | 1:49:01 | PM | 214 | V | 220 | V | 51 | Hz | 36 | % | 75 | % | 28 | C |
| 620) | 1/5/2010 | 1:49:03 | PM | 215 | V | 220 | V | 51 | Hz | 38 | % | 77 | % | 28 | C |
| 621) | 1/5/2010 | 1:49:05 | PM | 214 | V | 220 | V | 51 | Hz | 37 | % | 77 | % | 28 | C |
| 622) | 1/5/2010 | 1:49:07 | PM | 215 | V | 220 | V | 51 | Hz | 35 | % | 77 | % | 28 | C |
| 623) | 1/5/2010 | 1:49:09 | PM | 216 | V | 220 | V | 51 | Hz | 36 | % | 77 | % | 28 | C |
| 624) | 1/5/2010 | 1:49:11 | PM | 216 | V | 220 | V | 51 | Hz | 38 | % | 78 | % | 28 | C |
| 625) | 1/5/2010 | 1:49:13 | PM | 216 | V | 220 | V | 51 | Hz | 36 | % | 77 | % | 28 | C |
| 626) | 1/5/2010 | 1:49:15 | PM | 215 | V | 220 | V | 51 | Hz | 38 | % | 77 | % | 28 | C |
| 627) | 1/5/2010 | 1:49:17 | PM | 216 | V | 221 | V | 51 | Hz | 37 | % | 77 | % | 28 | C |
| 628) | 1/5/2010 | 1:49:19 | PM | 215 | V | 221 | V | 51 | Hz | 37 | % | 77 | % | 28 | C |
| 629) | 1/5/2010 | 1:49:21 | PM | 216 | V | 220 | V | 51 | Hz | 38 | % | 78 | % | 28 | C |
| 630) | 1/5/2010 | 1:49:23 | PM | 215 | V | 213 | V | 51 | Hz | 36 | % | 78 | % | 28 | C |
| 631) | 1/5/2010 | 1:49:25 | PM | 216 | V | 220 | V | 51 | Hz | 36 | % | 78 | % | 28 | C |

FIG. 6 - 22

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 632) | 1/5/2010 | 1:49:28 | PM | 215 | V | 220 | V | 51 | Hz | 39 | % | 78 | % | 28 | C |
| 633) | 1/5/2010 | 1:49:30 | PM | 215 | V | 220 | V | 51 | Hz | 38 | % | 77 | % | 28 | C |
| 634) | 1/5/2010 | 1:49:32 | PM | 216 | V | 221 | V | 51 | Hz | 39 | % | 77 | % | 28 | C |
| 635) | 1/5/2010 | 1:49:34 | PM | 216 | V | 220 | V | 51 | Hz | 36 | % | 78 | % | 28 | C |
| 636) | 1/5/2010 | 1:49:36 | PM | 216 | V | 220 | V | 51 | Hz | 36 | % | 78 | % | 28 | C |
| 638) | 1/5/2010 | 1:49:40 | PM | 215 | V | 198 | V | 51 | Hz | 39 | % | 77 | % | 28 | C |
| 639) | 1/5/2010 | 1:49:42 | PM | 216 | V | 221 | V | 51 | Hz | 40 | % | 78 | % | 28 | C |
| 640) | 1/5/2010 | 1:49:44 | PM | 216 | V | 220 | V | 51 | Hz | 39 | % | 78 | % | 28 | C |
| 641) | 1/5/2010 | 1:49:46 | PM | 216 | V | 220 | V | 51 | Hz | 36 | % | 78 | % | 28 | C |
| 642) | 1/5/2010 | 1:49:48 | PM | 216 | V | 220 | V | 51 | Hz | 39 | % | 78 | % | 28 | C |
| 643) | 1/5/2010 | 1:49:50 | PM | 215 | V | 220 | V | 51 | Hz | 38 | % | 78 | % | 28 | C |
| 644) | 1/5/2010 | 1:49:52 | PM | 216 | V | 221 | V | 51 | Hz | 40 | % | 78 | % | 28 | C |
| 645) | 1/5/2010 | 1:49:54 | PM | 215 | V | 220 | V | 50 | Hz | 39 | % | 80 | % | 28 | C |
| 646) | 1/5/2010 | 1:49:56 | PM | 216 | V | 220 | V | 51 | Hz | 36 | % | 78 | % | 28 | C |
| 647) | 1/5/2010 | 1:49:59 | PM | 215 | V | 220 | V | 51 | Hz | 39 | % | 78 | % | 28 | C |
| 648) | 1/5/2010 | 1:50:01 | PM | 216 | V | 219 | V | 51 | Hz | 39 | % | 78 | % | 28 | C |
| 649) | 1/5/2010 | 1:50:03 | PM | 216 | V | 220 | V | 51 | Hz | 37 | % | 80 | % | 28 | C |
| 650) | 1/5/2010 | 1:50:05 | PM | 216 | V | 220 | V | 51 | Hz | 35 | % | 78 | % | 28 | C |
| 651) | 1/5/2010 | 1:50:07 | PM | 216 | V | 221 | V | 51 | Hz | 38 | % | 80 | % | 28 | C |
| 652) | 1/5/2010 | 1:50:09 | PM | 217 | V | 220 | V | 51 | Hz | 39 | % | 78 | % | 28 | C |
| 653) | 1/5/2010 | 1:50:11 | PM | 217 | V | 220 | V | 51 | Hz | 37 | % | 80 | % | 28 | C |
| 654) | 1/5/2010 | 1:50:13 | PM | 216 | V | 221 | V | 51 | Hz | 40 | % | 78 | % | 28 | C |
| 655) | 1/5/2010 | 1:50:15 | PM | 215 | V | 220 | V | 51 | Hz | 40 | % | 80 | % | 28 | C |
| 656) | 1/5/2010 | 1:50:17 | PM | 216 | V | 221 | V | 51 | Hz | 37 | % | 80 | % | 28 | C |
| 657) | 1/5/2010 | 1:50:19 | PM | 216 | V | 219 | V | 51 | Hz | 37 | % | 80 | % | 28 | C |
| 658) | 1/5/2010 | 1:50:21 | PM | 217 | V | 220 | V | 51 | Hz | 38 | % | 80 | % | 28 | C |
| 659) | 1/5/2010 | 1:50:23 | PM | 216 | V | 221 | V | 51 | Hz | 36 | % | 78 | % | 28 | C |
| 660) | 1/5/2010 | 1:50:25 | PM | 216 | V | 220 | V | 50 | Hz | 39 | % | 80 | % | 28 | C |

FIG. 6 - 23

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 661) | 1/5/2010 | 1:50:27 | PM | 215 | V | 220 | V | 51 | Hz | 46 | % | 82 | % | 28 | C |
| 662) | 1/5/2010 | 1:50:30 | PM | 216 | V | 221 | V | 51 | Hz | 39 | % | 80 | % | 28 | C |
| 663) | 1/5/2010 | 1:50:32 | PM | 216 | V | 220 | V | 51 | Hz | 37 | % | 82 | % | 28 | C |
| 664) | 1/5/2010 | 1:50:34 | PM | 216 | V | 220 | V | 50 | Hz | 37 | % | 80 | % | 28 | C |
| 665) | 1/5/2010 | 1:50:36 | PM | 216 | V | 220 | V | 51 | Hz | 38 | % | 80 | % | 28 | C |
| 666) | 1/5/2010 | 1:50:38 | PM | 215 | V | 220 | V | 51 | Hz | 35 | % | 80 | % | 28 | C |
| 667) | 1/5/2010 | 1:50:40 | PM | 215 | V | 221 | V | 51 | Hz | 37 | % | 80 | % | 28 | C |
| 668) | 1/5/2010 | 1:50:42 | PM | 216 | V | 220 | V | 51 | Hz | 39 | % | 80 | % | 28 | C |
| 669) | 1/5/2010 | 1:50:44 | PM | 215 | V | 220 | V | 51 | Hz | 40 | % | 82 | % | 28 | C |
| 670) | 1/5/2010 | 1:50:46 | PM | 215 | V | 220 | V | 51 | Hz | 39 | % | 80 | % | 28 | C |
| 671) | 1/5/2010 | 1:50:48 | PM | 215 | V | 221 | V | 51 | Hz | 38 | % | 80 | % | 28 | C |
| 672) | 1/5/2010 | 1:50:50 | PM | 215 | V | 220 | V | 51 | Hz | 37 | % | 80 | % | 28 | C |
| 673) | 1/5/2010 | 1:50:52 | PM | 216 | V | 220 | V | 51 | Hz | 38 | % | 80 | % | 28 | C |
| 674) | 1/5/2010 | 1:50:54 | PM | 216 | V | 220 | V | 51 | Hz | 35 | % | 82 | % | 28 | C |
| 675) | 1/5/2010 | 1:50:56 | PM | 214 | V | 220 | V | 51 | Hz | 37 | % | 82 | % | 28 | C |
| 676) | 1/5/2010 | 1:50:58 | PM | 215 | V | 220 | V | 51 | Hz | 41 | % | 80 | % | 28 | C |
| 678) | 1/5/2010 | 1:51:03 | PM | 215 | V | 220 | V | 51 | Hz | 38 | % | 80 | % | 28 | C |
| 679) | 1/5/2010 | 1:51:05 | PM | 215 | V | 209 | V | 51 | Hz | 37 | % | 80 | % | 28 | C |
| 680) | 1/5/2010 | 1:51:07 | PM | 215 | V | 221 | V | 51 | Hz | 41 | % | 82 | % | 28 | C |
| 681) | 1/5/2010 | 1:51:09 | PM | 215 | V | 220 | V | 51 | Hz | 42 | % | 80 | % | 28 | C |
| 682) | 1/5/2010 | 1:51:11 | PM | 215 | V | 220 | V | 51 | Hz | 39 | % | 80 | % | 28 | C |
| 683) | 1/5/2010 | 1:51:13 | PM | 215 | V | 220 | V | 51 | Hz | 39 | % | 80 | % | 28 | C |
| 684) | 1/5/2010 | 1:51:15 | PM | 216 | V | 220 | V | 51 | Hz | 35 | % | 80 | % | 28 | C |
| 685) | 1/5/2010 | 1:51:17 | PM | 2 | V | 217 | V | 0 | Hz | 36 | % | 83 | % | 27 | C |
| 686) | 1/5/2010 | 1:51:19 | PM | 2 | V | 218 | V | 0 | Hz | 36 | % | 82 | % | 27 | C |
| 687) | 1/5/2010 | 1:51:21 | PM | 2 | V | 218 | V | 0 | Hz | 38 | % | 82 | % | 27 | C |
| 688) | 1/5/2010 | 1:51:23 | PM | 2 | V | 218 | V | 0 | Hz | 37 | % | 82 | % | 27 | C |
| 689) | 1/5/2010 | 1:51:25 | PM | 2 | V | 218 | V | 0 | Hz | 38 | % | 82 | % | 27 | C |

FIG. 6 - 24

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 690) | 1/5/2010 | 1:51:27 | PM | 2 | V | 218 | V | 0 | Hz | 38 | % | 82 | % | 27 | C |
| 691) | 1/5/2010 | 1:51:29 | PM | 2 | V | 219 | V | 0 | Hz | 38 | % | 82 | % | 27 | C |
| 692) | 1/5/2010 | 1:51:32 | PM | 2 | V | 218 | V | 0 | Hz | 36 | % | 82 | % | 27 | C |
| 693) | 1/5/2010 | 1:51:34 | PM | 2 | V | 218 | V | 0 | Hz | 36 | % | 80 | % | 27 | C |
| 694) | 1/5/2010 | 1:51:36 | PM | 2 | V | 218 | V | 0 | Hz | 36 | % | 80 | % | 27 | C |
| 695) | 1/5/2010 | 1:51:38 | PM | 2 | V | 218 | V | 0 | Hz | 36 | % | 80 | % | 27 | C |
| 696) | 1/5/2010 | 1:51:40 | PM | 2 | V | 218 | V | 0 | Hz | 37 | % | 80 | % | 27 | C |
| 697) | 1/5/2010 | 1:51:42 | PM | 2 | V | 218 | V | 0 | Hz | 38 | % | 80 | % | 27 | C |
| 698) | 1/5/2010 | 1:51:44 | PM | 2 | V | 218 | V | 0 | Hz | 38 | % | 80 | % | 27 | C |
| 699) | 1/5/2010 | 1:51:46 | PM | 2 | V | 218 | V | 0 | Hz | 38 | % | 80 | % | 27 | C |
| 700) | 1/5/2010 | 1:51:48 | PM | 2 | V | 218 | V | 0 | Hz | 39 | % | 80 | % | 27 | C |
| 701) | 1/5/2010 | 1:51:50 | PM | 2 | V | 218 | V | 0 | Hz | 36 | % | 80 | % | 27 | C |
| 702) | 1/5/2010 | 1:51:52 | PM | 2 | V | 218 | V | 0 | Hz | 36 | % | 78 | % | 27 | C |
| 703) | 1/5/2010 | 1:51:54 | PM | 2 | V | 218 | V | 0 | Hz | 43 | % | 77 | % | 27 | C |
| 704) | 1/5/2010 | 1:51:56 | PM | 10 | V | 196 | V | 0 | Hz | 69 | % | 68 | % | 25 | C |
| 705) | 1/5/2010 | 1:51:58 | PM | 2 | V | 215 | V | 0 | Hz | 66 | % | 65 | % | 25 | C |
| 706) | 1/5/2010 | 1:52:00 | PM | 2 | V | 213 | V | 0 | Hz | 89 | % | 65 | % | 17 | C |
| 707) | 1/5/2010 | 1:52:03 | PM | 2 | V | 217 | V | 0 | Hz | 87 | % | 62 | % | 25 | C |
| 708) | 1/5/2010 | 1:52:05 | PM | 2 | V | 216 | V | 0 | Hz | 88 | % | 62 | % | 25 | C |
| 709) | 1/5/2010 | 1:52:07 | PM | 4 | V | 205 | V | 0 | Hz | 88 | % | 62 | % | 25 | C |
| 710) | 1/5/2010 | 1:52:09 | PM | 2 | V | 215 | V | 0 | Hz | 83 | % | 62 | % | 25 | C |
| 711) | 1/5/2010 | 1:52:11 | PM | 2 | V | 215 | V | 0 | Hz | 83 | % | 62 | % | 25 | C |
| 712) | 1/5/2010 | 1:52:13 | PM | 35 | V | 217 | V | 0 | Hz | 83 | % | 62 | % | 25 | C |
| 713) | 1/5/2010 | 1:52:15 | PM | 32 | V | 205 | V | 0 | Hz | 82 | % | 58 | % | 25 | C |
| 714) | 1/5/2010 | 1:52:17 | PM | 2 | V | 196 | V | 0 | Hz | 87 | % | 58 | % | 25 | C |
| 715) | 1/5/2010 | 1:52:19 | PM | 18 | V | 216 | V | 0 | Hz | 86 | % | 58 | % | 25 | C |
| 716) | 1/5/2010 | 1:52:21 | PM | 2 | V | 214 | V | 0 | Hz | 87 | % | 58 | % | 25 | C |
| 718) | 1/5/2010 | 1:52:25 | PM | 3 | V | 215 | V | 0 | Hz | 86 | % | 58 | % | 27 | C |

FIG. 6 - 25

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 719) | 1/5/2010 | 1:52:27 | PM | 9 | V | 211 | V | 0 | Hz | 87 | % | 58 | % | 25 | C |
| 720) | 1/5/2010 | 1:52:29 | PM | 9 | V | 214 | V | 0 | Hz | 82 | % | 58 | % | 25 | C |
| 721) | 1/5/2010 | 1:52:31 | PM | 2 | V | 216 | V | 0 | Hz | 82 | % | 58 | % | 25 | C |
| 722) | 1/5/2010 | 1:52:34 | PM | 35 | V | 206 | V | 0 | Hz | 81 | % | 58 | % | 25 | C |
| 723) | 1/5/2010 | 1:52:36 | PM | 3 | V | 212 | V | 0 | Hz | 82 | % | 58 | % | 25 | C |
| 724) | 1/5/2010 | 1:52:38 | PM | 16 | V | 190 | V | 0 | Hz | 87 | % | 58 | % | 25 | C |
| 725) | 1/5/2010 | 1:52:40 | PM | 2 | V | 217 | V | 0 | Hz | 86 | % | 58 | % | 25 | C |
| 726) | 1/5/2010 | 1:52:42 | PM | 14 | V | 217 | V | 0 | Hz | 87 | % | 58 | % | 25 | C |
| 727) | 1/5/2010 | 1:52:44 | PM | 28 | V | 217 | V | 0 | Hz | 86 | % | 58 | % | 25 | C |
| 728) | 1/5/2010 | 1:52:46 | PM | 2 | V | 215 | V | 0 | Hz | 82 | % | 58 | % | 25 | C |
| 729) | 1/5/2010 | 1:52:48 | PM | 8 | V | 214 | V | 0 | Hz | 81 | % | 58 | % | 25 | C |
| 730) | 1/5/2010 | 1:52:50 | PM | 28 | V | 201 | V | 0 | Hz | 82 | % | 58 | % | 25 | C |
| 731) | 1/5/2010 | 1:52:52 | PM | 2 | V | 215 | V | 0 | Hz | 82 | % | 58 | % | 25 | C |
| 732) | 1/5/2010 | 1:52:54 | PM | 6 | V | 212 | V | 0 | Hz | 82 | % | 58 | % | 25 | C |
| 733) | 1/5/2010 | 1:52:56 | PM | 2 | V | 207 | V | 0 | Hz | 87 | % | 58 | % | 25 | C |
| 734) | 1/5/2010 | 1:52:58 | PM | 4 | V | 200 | V | 0 | Hz | 87 | % | 58 | % | 25 | C |
| 735) | 1/5/2010 | 1:53:00 | PM | 4 | V | 214 | V | 0 | Hz | 87 | % | 58 | % | 25 | C |
| 736) | 1/5/2010 | 1:53:02 | PM | 5 | V | 200 | V | 0 | Hz | 86 | % | 58 | % | 25 | C |
| 737) | 1/5/2010 | 1:53:05 | PM | 2 | V | 208 | V | 0 | Hz | 81 | % | 58 | % | 25 | C |
| 738) | 1/5/2010 | 1:53:07 | PM | 2 | V | 213 | V | 0 | Hz | 83 | % | 58 | % | 25 | C |
| 739) | 1/5/2010 | 1:53:09 | PM | 4 | V | 201 | V | 0 | Hz | 83 | % | 58 | % | 25 | C |
| 740) | 1/5/2010 | 1:53:11 | PM | 15 | V | 216 | V | 0 | Hz | 82 | % | 58 | % | 25 | C |
| 741) | 1/5/2010 | 1:53:13 | PM | 2 | V | 214 | V | 0 | Hz | 81 | % | 58 | % | 25 | C |
| 742) | 1/5/2010 | 1:53:15 | PM | 9 | V | 215 | V | 0 | Hz | 85 | % | 58 | % | 25 | C |
| 743) | 1/5/2010 | 1:53:17 | PM | 5 | V | 214 | V | 0 | Hz | 86 | % | 58 | % | 25 | C |
| 744) | 1/5/2010 | 1:53:19 | PM | 9 | V | 203 | V | 0 | Hz | 87 | % | 58 | % | 25 | C |
| 745) | 1/5/2010 | 1:53:21 | PM | 2 | V | 208 | V | 0 | Hz | 86 | % | 58 | % | 25 | C |
| 746) | 1/5/2010 | 1:53:23 | PM | 3 | V | 203 | V | 0 | Hz | 85 | % | 58 | % | 25 | C |

FIG. 6 - 26

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 747) | 1/5/2010 | 1:53:25 | PM | 27 | V | 217 | V | 0 | Hz | 82 | % | 58 | % | 25 | C |
| 748) | 1/5/2010 | 1:53:27 | PM | 2 | V | 216 | V | 0 | Hz | 82 | % | 58 | % | 25 | C |
| 749) | 1/5/2010 | 1:53:29 | PM | 2 | V | 208 | V | 0 | Hz | 82 | % | 58 | % | 25 | C |
| 750) | 1/5/2010 | 1:53:31 | PM | 6 | V | 204 | V | 0 | Hz | 82 | % | 58 | % | 25 | C |
| 751) | 1/5/2010 | 1:53:33 | PM | 4 | V | 209 | V | 0 | Hz | 86 | % | 58 | % | 25 | C |
| 752) | 1/5/2010 | 1:53:36 | PM | 2 | V | 215 | V | 0 | Hz | 86 | % | 58 | % | 25 | C |
| 753) | 1/5/2010 | 1:53:38 | PM | 10 | V | 216 | V | 0 | Hz | 87 | % | 58 | % | 25 | C |
| 754) | 1/5/2010 | 1:53:40 | PM | 10 | V | 216 | V | 0 | Hz | 87 | % | 58 | % | 25 | C |
| 755) | 1/5/2010 | 1:53:42 | PM | 2 | V | 201 | V | 0 | Hz | 82 | % | 58 | % | 15 | C |
| 756) | 1/5/2010 | 1:53:44 | PM | 3 | V | 203 | V | 0 | Hz | 82 | % | 58 | % | 25 | C |
| 758) | 1/5/2010 | 1:53:48 | PM | 2 | V | 216 | V | 0 | Hz | 82 | % | 58 | % | 25 | C |
| 759) | 1/5/2010 | 1:53:50 | PM | 2 | V | 216 | V | 0 | Hz | 82 | % | 58 | % | 25 | C |
| 760) | 1/5/2010 | 1:53:52 | PM | 2 | V | 199 | V | 0 | Hz | 82 | % | 58 | % | 25 | C |
| 761) | 1/5/2010 | 1:53:54 | PM | 2 | V | 216 | V | 0 | Hz | 86 | % | 58 | % | 25 | C |
| 762) | 1/5/2010 | 1:53:56 | PM | 13 | V | 216 | V | 0 | Hz | 86 | % | 58 | % | 25 | C |
| 763) | 1/5/2010 | 1:53:58 | PM | 3 | V | 210 | V | 0 | Hz | 86 | % | 58 | % | 25 | C |
| 764) | 1/5/2010 | 1:54:00 | PM | 2 | V | 201 | V | 0 | Hz | 87 | % | 58 | % | 25 | C |
| 765) | 1/5/2010 | 1:54:02 | PM | 2 | V | 212 | V | 0 | Hz | 82 | % | 58 | % | 18 | C |
| 766) | 1/5/2010 | 1:54:04 | PM | 2 | V | 215 | V | 0 | Hz | 82 | % | 58 | % | 17 | C |
| 767) | 1/5/2010 | 1:54:07 | PM | 5 | V | 216 | V | 0 | Hz | 82 | % | 58 | % | 25 | C |
| 768) | 1/5/2010 | 1:54:09 | PM | 24 | V | 216 | V | 0 | Hz | 82 | % | 58 | % | 25 | C |
| 769) | 1/5/2010 | 1:54:11 | PM | 2 | V | 217 | V | 0 | Hz | 86 | % | 58 | % | 25 | C |
| 770) | 1/5/2010 | 1:54:13 | PM | 2 | V | 215 | V | 0 | Hz | 87 | % | 58 | % | 25 | C |
| 771) | 1/5/2010 | 1:54:15 | PM | 13 | V | 209 | V | 0 | Hz | 86 | % | 58 | % | 25 | C |
| 772) | 1/5/2010 | 1:54:17 | PM | 14 | V | 202 | V | 0 | Hz | 87 | % | 58 | % | 25 | C |
| 773) | 1/5/2010 | 1:54:19 | PM | 27 | V | 215 | V | 0 | Hz | 87 | % | 58 | % | 25 | C |
| 774) | 1/5/2010 | 1:54:21 | PM | 2 | V | 204 | V | 0 | Hz | 82 | % | 58 | % | 25 | C |
| 775) | 1/5/2010 | 1:54:23 | PM | 8 | V | 216 | V | 0 | Hz | 82 | % | 58 | % | 25 | C |

FIG. 6 - 27

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 776) | 1/5/2010 | 1:54:25 | PM | 9 | V | 216 | V | 0 | Hz | 82 | % | 58 | % | 25 | C |
| 777) | 1/5/2010 | 1:54:27 | PM | 2 | V | 213 | V | 0 | Hz | 82 | % | 58 | % | 25 | C |
| 778) | 1/5/2010 | 1:54:29 | PM | 6 | V | 204 | V | 0 | Hz | 82 | % | 58 | % | 25 | C |
| 779) | 1/5/2010 | 1:54:31 | PM | 5 | V | 216 | V | 0 | Hz | 86 | % | 58 | % | 25 | C |
| 780) | 1/5/2010 | 1:54:33 | PM | 4 | V | 216 | V | 0 | Hz | 87 | % | 58 | % | 25 | C |
| 781) | 1/5/2010 | 1:54:35 | PM | 2 | V | 216 | V | 0 | Hz | 87 | % | 58 | % | 25 | C |
| 782) | 1/5/2010 | 1:54:38 | PM | 27 | V | 218 | V | 0 | Hz | 86 | % | 58 | % | 25 | C |
| 783) | 1/5/2010 | 1:54:40 | PM | 2 | V | 209 | V | 0 | Hz | 82 | % | 58 | % | 25 | C |
| 784) | 1/5/2010 | 1:54:42 | PM | 21 | V | 216 | V | 0 | Hz | 83 | % | 58 | % | 25 | C |
| 785) | 1/5/2010 | 1:54:44 | PM | 7 | V | 211 | V | 0 | Hz | 82 | % | 58 | % | 19 | C |
| 786) | 1/5/2010 | 1:54:46 | PM | 24 | V | 204 | V | 0 | Hz | 82 | % | 58 | % | 25 | C |
| 787) | 1/5/2010 | 1:54:48 | PM | 2 | V | 198 | V | 0 | Hz | 82 | % | 58 | % | 25 | C |
| 788) | 1/5/2010 | 1:54:50 | PM | 7 | V | 211 | V | 0 | Hz | 87 | % | 58 | % | 25 | C |
| 789) | 1/5/2010 | 1:54:52 | PM | 10 | V | 195 | V | 0 | Hz | 87 | % | 58 | % | 25 | C |
| 790) | 1/5/2010 | 1:54:54 | PM | 2 | V | 215 | V | 0 | Hz | 87 | % | 58 | % | 25 | C |
| 791) | 1/5/2010 | 1:54:56 | PM | 13 | V | 197 | V | 0 | Hz | 87 | % | 58 | % | 25 | C |
| 792) | 1/5/2010 | 1:54:58 | PM | 2 | V | 208 | V | 0 | Hz | 87 | % | 58 | % | 25 | C |
| 793) | 1/5/2010 | 1:55:00 | PM | 8 | V | 216 | V | 0 | Hz | 87 | % | 58 | % | 25 | C |
| 794) | 1/5/2010 | 1:55:02 | PM | 2 | V | 216 | V | 0 | Hz | 82 | % | 58 | % | 25 | C |
| 795) | 1/5/2010 | 1:55:04 | PM | 4 | V | 214 | V | 0 | Hz | 83 | % | 58 | % | 25 | C |
| 796) | 1/5/2010 | 1:55:06 | PM | 15 | V | 216 | V | 0 | Hz | 82 | % | 58 | % | 25 | C |
| 798) | 1/5/2010 | 1:55:11 | PM | 2 | V | 214 | V | 0 | Hz | 87 | % | 58 | % | 25 | C |
| 799) | 1/5/2010 | 1:55:13 | PM | 7 | V | 217 | V | 0 | Hz | 87 | % | 58 | % | 25 | C |
| 800) | 1/5/2010 | 1:55:15 | PM | 2 | V | 216 | V | 0 | Hz | 86 | % | 58 | % | 25 | C |
| 801) | 1/5/2010 | 1:55:17 | PM | 9 | V | 210 | V | 0 | Hz | 87 | % | 58 | % | 25 | C |
| 802) | 1/5/2010 | 1:55:19 | PM | 2 | V | 217 | V | 0 | Hz | 83 | % | 58 | % | 25 | C |
| 803) | 1/5/2010 | 1:55:21 | PM | 2 | V | 215 | V | 0 | Hz | 82 | % | 58 | % | 25 | C |
| 804) | 1/5/2010 | 1:55:23 | PM | 6 | V | 213 | V | 0 | Hz | 82 | % | 58 | % | 25 | C |

FIG. 6 - 28

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 805) | 1/5/2010 | 1:55:25 | PM | 2 | V | 213 | V | 0 | Hz | 82 | % | 58 | % | 92 | C |
| 806) | 1/5/2010 | 1:55:27 | PM | 2 | V | 214 | V | 0 | Hz | 82 | % | 58 | % | 25 | C |
| 807) | 1/5/2010 | 1:55:29 | PM | 2 | V | 197 | V | 0 | Hz | 87 | % | 58 | % | 25 | C |
| 808) | 1/5/2010 | 1:55:31 | PM | 2 | V | 218 | V | 0 | Hz | 56 | % | 62 | % | 26 | C |
| 809) | 1/5/2010 | 1:55:33 | PM | 2 | V | 222 | V | 0 | Hz | 40 | % | 70 | % | 27 | C |
| 810) | 1/5/2010 | 1:55:35 | PM | 2 | V | 220 | V | 0 | Hz | 39 | % | 73 | % | 27 | C |
| 811) | 1/5/2010 | 1:55:37 | PM | 2 | V | 220 | V | 0 | Hz | 39 | % | 73 | % | 27 | C |
| 812) | 1/5/2010 | 1:55:40 | PM | 2 | V | 220 | V | 0 | Hz | 36 | % | 73 | % | 27 | C |
| 813) | 1/5/2010 | 1:55:42 | PM | 2 | V | 220 | V | 0 | Hz | 37 | % | 73 | % | 27 | C |
| 814) | 1/5/2010 | 1:55:44 | PM | 2 | V | 220 | V | 0 | Hz | 36 | % | 73 | % | 27 | C |
| 815) | 1/5/2010 | 1:55:46 | PM | 2 | V | 220 | V | 0 | Hz | 36 | % | 73 | % | 27 | C |
| 816) | 1/5/2010 | 1:55:48 | PM | 2 | V | 220 | V | 0 | Hz | 38 | % | 75 | % | 27 | C |
| 817) | 1/5/2010 | 1:55:50 | PM | 2 | V | 220 | V | 0 | Hz | 39 | % | 75 | % | 27 | C |
| 818) | 1/5/2010 | 1:55:52 | PM | 2 | V | 221 | V | 0 | Hz | 39 | % | 75 | % | 27 | C |
| 819) | 1/5/2010 | 1:55:54 | PM | 2 | V | 221 | V | 0 | Hz | 38 | % | 73 | % | 27 | C |
| 820) | 1/5/2010 | 1:55:56 | PM | 2 | V | 221 | V | 0 | Hz | 39 | % | 75 | % | 27 | C |
| 821) | 1/5/2010 | 1:55:58 | PM | 2 | V | 221 | V | 0 | Hz | 37 | % | 75 | % | 27 | C |
| 822) | 1/5/2010 | 1:56:00 | PM | 2 | V | 220 | V | 0 | Hz | 36 | % | 75 | % | 27 | C |
| 823) | 1/5/2010 | 1:56:02 | PM | 2 | V | 220 | V | 0 | Hz | 37 | % | 73 | % | 27 | C |
| 824) | 1/5/2010 | 1:56:04 | PM | 2 | V | 220 | V | 0 | Hz | 37 | % | 73 | % | 28 | C |
| 825) | 1/5/2010 | 1:56:06 | PM | 2 | V | 220 | V | 0 | Hz | 39 | % | 73 | % | 28 | C |
| 826) | 1/5/2010 | 1:56:08 | PM | 2 | V | 220 | V | 0 | Hz | 38 | % | 73 | % | 27 | C |
| 827) | 1/5/2010 | 1:56:11 | PM | 2 | V | 220 | V | 0 | Hz | 39 | % | 75 | % | 27 | C |
| 828) | 1/5/2010 | 1:56:13 | PM | 2 | V | 220 | V | 0 | Hz | 39 | % | 75 | % | 27 | C |
| 829) | 1/5/2010 | 1:56:15 | PM | 2 | V | 220 | V | 0 | Hz | 36 | % | 75 | % | 27 | C |
| 830) | 1/5/2010 | 1:56:17 | PM | 2 | V | 220 | V | 0 | Hz | 36 | % | 75 | % | 27 | C |
| 831) | 1/5/2010 | 1:56:19 | PM | 2 | V | 220 | V | 0 | Hz | 37 | % | 75 | % | 27 | C |
| 832) | 1/5/2010 | 1:56:21 | PM | 2 | V | 220 | V | 0 | Hz | 37 | % | 75 | % | 27 | C |

FIG. 6 - 29

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 833) | 1/5/2010 | 1:56:23 | PM | 2 | V | 220 | V | 0 | Hz | 38 | % | 75 | % | 27 | C |
| 834) | 1/5/2010 | 1:56:25 | PM | 2 | V | 220 | V | 0 | Hz | 39 | % | 75 | % | 27 | C |
| 835) | 1/5/2010 | 1:56:27 | PM | 2 | V | 221 | V | 0 | Hz | 39 | % | 75 | % | 27 | C |
| 836) | 1/5/2010 | 1:56:29 | PM | 2 | V | 221 | V | 0 | Hz | 39 | % | 75 | % | 27 | C |
| 838) | 1/5/2010 | 1:56:33 | PM | 2 | V | 221 | V | 0 | Hz | 37 | % | 73 | % | 27 | C |
| 839) | 1/5/2010 | 1:56:35 | PM | 2 | V | 220 | V | 0 | Hz | 37 | % | 75 | % | 27 | C |
| 840) | 1/5/2010 | 1:56:37 | PM | 2 | V | 220 | V | 0 | Hz | 36 | % | 73 | % | 27 | C |
| 841) | 1/5/2010 | 1:56:39 | PM | 2 | V | 220 | V | 0 | Hz | 37 | % | 73 | % | 27 | C |
| 842) | 1/5/2010 | 1:56:42 | PM | 2 | V | 220 | V | 0 | Hz | 39 | % | 73 | % | 27 | C |
| 843) | 1/5/2010 | 1:56:44 | PM | 2 | V | 220 | V | 0 | Hz | 38 | % | 73 | % | 27 | C |
| 844) | 1/5/2010 | 1:56:46 | PM | 2 | V | 220 | V | 0 | Hz | 39 | % | 75 | % | 27 | C |
| 845) | 1/5/2010 | 1:56:48 | PM | 2 | V | 220 | V | 0 | Hz | 39 | % | 73 | % | 27 | C |
| 846) | 1/5/2010 | 1:56:50 | PM | 2 | V | 219 | V | 0 | Hz | 37 | % | 75 | % | 27 | C |
| 847) | 1/5/2010 | 1:56:52 | PM | 2 | V | 220 | V | 0 | Hz | 36 | % | 75 | % | 27 | C |
| 848) | 1/5/2010 | 1:56:54 | PM | 2 | V | 220 | V | 0 | Hz | 36 | % | 75 | % | 27 | C |
| 849) | 1/5/2010 | 1:56:56 | PM | 2 | V | 220 | V | 0 | Hz | 37 | % | 75 | % | 27 | C |
| 850) | 1/5/2010 | 1:56:58 | PM | 2 | V | 220 | V | 0 | Hz | 39 | % | 75 | % | 27 | C |
| 851) | 1/5/2010 | 1:57:00 | PM | 2 | V | 220 | V | 0 | Hz | 39 | % | 75 | % | 27 | C |
| 852) | 1/5/2010 | 1:57:02 | PM | 2 | V | 221 | V | 0 | Hz | 39 | % | 75 | % | 27 | C |
| 853) | 1/5/2010 | 1:57:04 | PM | 2 | V | 221 | V | 0 | Hz | 39 | % | 75 | % | 27 | C |
| 854) | 1/5/2010 | 1:57:06 | PM | 2 | V | 231 | V | 0 | Hz | 39 | % | 75 | % | 27 | C |
| 855) | 1/5/2010 | 1:57:08 | PM | 2 | V | 220 | V | 0 | Hz | 37 | % | 75 | % | 27 | C |
| 856) | 1/5/2010 | 1:57:10 | PM | 2 | V | 220 | V | 0 | Hz | 37 | % | 75 | % | 27 | C |
| 857) | 1/5/2010 | 1:57:13 | PM | 2 | V | 220 | V | 0 | Hz | 37 | % | 73 | % | 27 | C |
| 858) | 1/5/2010 | 1:57:15 | PM | 2 | V | 220 | V | 0 | Hz | 36 | % | 75 | % | 27 | C |
| 859) | 1/5/2010 | 1:57:17 | PM | 2 | V | 220 | V | 0 | Hz | 39 | % | 73 | % | 27 | C |
| 860) | 1/5/2010 | 1:57:19 | PM | 2 | V | 220 | V | 0 | Hz | 39 | % | 73 | % | 27 | C |
| 861) | 1/5/2010 | 1:57:21 | PM | 2 | V | 220 | V | 0 | Hz | 38 | % | 75 | % | 27 | C |

FIG. 6 - 30

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 862) | 1/5/2010 | 1:57:23 | PM | 2 | V | 220 | V | 0 | Hz | 38 | % | 75 | % | 27 | C |
| 863) | 1/5/2010 | 1:57:25 | PM | 2 | V | 220 | V | 0 | Hz | 37 | % | 75 | % | 27 | C |
| 864) | 1/5/2010 | 1:57:27 | PM | 2 | V | 220 | V | 0 | Hz | 36 | % | 75 | % | 27 | C |
| 865) | 1/5/2010 | 1:57:29 | PM | 2 | V | 220 | V | 0 | Hz | 36 | % | 75 | % | 28 | C |
| 866) | 1/5/2010 | 1:57:31 | PM | 2 | V | 220 | V | 0 | Hz | 36 | % | 75 | % | 28 | C |
| 867) | 1/5/2010 | 1:57:33 | PM | 2 | V | 220 | V | 0 | Hz | 37 | % | 75 | % | 27 | C |
| 868) | 1/5/2010 | 1:57:35 | PM | 2 | V | 220 | V | 0 | Hz | 39 | % | 75 | % | 27 | C |
| 869) | 1/5/2010 | 1:57:37 | PM | 2 | V | 221 | V | 0 | Hz | 38 | % | 75 | % | 27 | C |
| 870) | 1/5/2010 | 1:57:39 | PM | 2 | V | 221 | V | 0 | Hz | 39 | % | 75 | % | 27 | C |
| 871) | 1/5/2010 | 1:57:41 | PM | 2 | V | 221 | V | 0 | Hz | 39 | % | 75 | % | 27 | C |
| 872) | 1/5/2010 | 1:57:44 | PM | 2 | V | 221 | V | 0 | Hz | 36 | % | 75 | % | 27 | C |
| 873) | 1/5/2010 | 1:57:46 | PM | 2 | V | 220 | V | 0 | Hz | 36 | % | 75 | % | 27 | C |
| 874) | 1/5/2010 | 1:57:48 | PM | 2 | V | 220 | V | 0 | Hz | 37 | % | 73 | % | 27 | C |
| 875) | 1/5/2010 | 1:57:50 | PM | 2 | V | 220 | V | 0 | Hz | 37 | % | 75 | % | 27 | C |
| 876) | 1/5/2010 | 1:57:52 | PM | 2 | V | 220 | V | 0 | Hz | 38 | % | 73 | % | 27 | C |
| 878) | 1/5/2010 | 1:57:56 | PM | 2 | V | 220 | V | 0 | Hz | 39 | % | 75 | % | 27 | C |
| 879) | 1/5/2010 | 1:57:58 | PM | 2 | V | 220 | V | 0 | Hz | 38 | % | 75 | % | 27 | C |
| 880) | 1/5/2010 | 1:58:00 | PM | 2 | V | 320 | V | 0 | Hz | 39 | % | 75 | % | 27 | C |
| 881) | 1/5/2010 | 1:58:02 | PM | 2 | V | 220 | V | 0 | Hz | 37 | % | 75 | % | 27 | C |
| 882) | 1/5/2010 | 1:58:04 | PM | 2 | V | 220 | V | 0 | Hz | 37 | % | 75 | % | 28 | C |
| 883) | 1/5/2010 | 1:58:06 | PM | 2 | V | 220 | V | 0 | Hz | 36 | % | 75 | % | 27 | C |
| 884) | 1/5/2010 | 1:58:08 | PM | 2 | V | 220 | V | 0 | Hz | 36 | % | 75 | % | 28 | C |
| 885) | 1/5/2010 | 1:58:10 | PM | 2 | V | 220 | V | 0 | Hz | 39 | % | 75 | % | 28 | C |
| 886) | 1/5/2010 | 1:58:12 | PM | 2 | V | 220 | V | 0 | Hz | 39 | % | 75 | % | 27 | C |
| 887) | 1/5/2010 | 1:58:15 | PM | 2 | V | 221 | V | 0 | Hz | 39 | % | 75 | % | 27 | C |
| 888) | 1/5/2010 | 1:58:17 | PM | 2 | V | 221 | V | 0 | Hz | 40 | % | 75 | % | 27 | C |
| 889) | 1/5/2010 | 1:58:19 | PM | 2 | V | 221 | V | 0 | Hz | 37 | % | 75 | % | 27 | C |
| 890) | 1/5/2010 | 1:58:21 | PM | 2 | V | 320 | V | 0 | Hz | 37 | % | 75 | % | 28 | C |

FIG. 6 - 31

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 891) | 1/5/2010 | 1:58:23 | PM | 2 | V | 220 | V | 0 | Hz | 36 | % | 75 | % | 27 | C |
| 892) | 1/5/2010 | 1:58:25 | PM | 2 | V | 220 | V | 0 | Hz | 37 | % | 75 | % | 28 | C |
| 893) | 1/5/2010 | 1:58:27 | PM | 2 | V | 220 | V | 0 | Hz | 39 | % | 75 | % | 28 | C |
| 894) | 1/5/2010 | 1:58:29 | PM | 2 | V | 220 | V | 0 | Hz | 39 | % | 75 | % | 28 | C |
| 895) | 1/5/2010 | 1:58:31 | PM | 2 | V | 220 | V | 0 | Hz | 38 | % | 75 | % | 27 | C |
| 896) | 1/5/2010 | 1:58:35 | PM | 2 | V | 220 | V | 0 | Hz | 38 | % | 75 | % | 27 | C |
| 897) | 1/5/2010 | 1:58:37 | PM | 2 | V | 220 | V | 0 | Hz | 36 | % | 75 | % | 27 | C |
| 898) | 1/5/2010 | 1:58:39 | PM | 2 | V | 220 | V | 0 | Hz | 36 | % | 75 | % | 28 | C |
| 899) | 1/5/2010 | 1:58:41 | PM | 199 | V | 220 | V | 69 | Hz | 37 | % | 75 | % | 28 | C |
| 900) | 1/5/2010 | 1:58:43 | PM | 202 | V | 221 | V | 51 | Hz | 36 | % | 68 | % | 27 | C |
| 901) | 1/5/2010 | 1:58:46 | PM | 203 | V | 221 | V | 51 | Hz | 39 | % | 65 | % | 28 | C |
| 902) | 1/5/2010 | 1:58:48 | PM | 202 | V | 220 | V | 51 | Hz | 42 | % | 68 | % | 27 | C |
| 903) | 1/5/2010 | 1:58:50 | PM | 202 | V | 221 | V | 51 | Hz | 36 | % | 65 | % | 27 | C |
| 904) | 1/5/2010 | 1:58:52 | PM | 202 | V | 221 | V | 51 | Hz | 38 | % | 72 | % | 28 | C |
| 905) | 1/5/2010 | 1:58:54 | PM | 204 | V | 220 | V | 51 | Hz | 38 | % | 68 | % | 28 | C |
| 906) | 1/5/2010 | 1:58:56 | PM | 209 | V | 220 | V | 51 | Hz | 41 | % | 73 | % | 28 | C |
| 907) | 1/5/2010 | 1:58:58 | PM | 210 | V | 220 | V | 51 | Hz | 40 | % | 73 | % | 28 | C |
| 908) | 1/5/2010 | 1:59:00 | PM | 209 | V | 221 | V | 51 | Hz | 37 | % | 73 | % | 28 | C |
| 909) | 1/5/2010 | 1:59:02 | PM | 209 | V | 220 | V | 51 | Hz | 41 | % | 75 | % | 28 | C |
| 910) | 1/5/2010 | 1:59:04 | PM | 209 | V | 220 | V | 51 | Hz | 38 | % | 73 | % | 28 | C |
| 911) | 1/5/2010 | 1:59:06 | PM | 209 | V | 220 | V | 51 | Hz | 38 | % | 73 | % | 28 | C |
| 912) | 1/5/2010 | 1:59:08 | PM | 210 | V | 220 | V | 51 | Hz | 39 | % | 75 | % | 28 | C |
| 913) | 1/5/2010 | 1:59:10 | PM | 210 | V | 220 | V | 51 | Hz | 38 | % | 73 | % | 28 | C |
| 914) | 1/5/2010 | 1:59:12 | PM | 209 | V | 220 | V | 51 | Hz | 38 | % | 75 | % | 28 | C |
| 915) | 1/5/2010 | 1:59:14 | PM | 210 | V | 221 | V | 51 | Hz | 39 | % | 75 | % | 28 | C |
| 916) | 1/5/2010 | 1:59:17 | PM | 210 | V | 221 | V | 51 | Hz | 35 | % | 75 | % | 28 | C |
| 918) | 1/5/2010 | 1:59:21 | PM | 209 | V | 220 | V | 51 | Hz | 36 | % | 75 | % | 28 | C |
| 919) | 1/5/2010 | 1:59:23 | PM | 209 | V | 220 | V | 51 | Hz | 42 | % | 75 | % | 28 | C |

FIG. 6 - 32

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 920) | 1/5/2010 | 1:59:25 | PM | 210 | V | 220 | V | 51 | Hz | 38 | % | 75 | % | 28 | C |
| 921) | 1/5/2010 | 1:59:27 | PM | 211 | V | 220 | V | 51 | Hz | 36 | % | 77 | % | 28 | C |
| 922) | 1/5/2010 | 1:59:29 | PM | 210 | V | 201 | V | 51 | Hz | 42 | % | 77 | % | 28 | C |
| 923) | 1/5/2010 | 1:59:31 | PM | 211 | V | 220 | V | 51 | Hz | 39 | % | 77 | % | 28 | C |
| 924) | 1/5/2010 | 1:59:33 | PM | 211 | V | 220 | V | 51 | Hz | 36 | % | 77 | % | 28 | C |
| 925) | 1/5/2010 | 1:59:35 | PM | 210 | V | 221 | V | 51 | Hz | 39 | % | 77 | % | 28 | C |
| 926) | 1/5/2010 | 1:59:37 | PM | 209 | V | 220 | V | 51 | Hz | 41 | % | 77 | % | 28 | C |
| 927) | 1/5/2010 | 1:59:39 | PM | 209 | V | 221 | V | 51 | Hz | 42 | % | 75 | % | 28 | C |
| 928) | 1/5/2010 | 1:59:41 | PM | 210 | V | 220 | V | 51 | Hz | 42 | % | 77 | % | 28 | C |
| 929) | 1/5/2010 | 1:59:43 | PM | 211 | V | 220 | V | 51 | Hz | 36 | % | 77 | % | 28 | C |
| 930) | 1/5/2010 | 1:59:45 | PM | 210 | V | 221 | V | 51 | Hz | 42 | % | 78 | % | 28 | C |
| 931) | 1/5/2010 | 1:59:48 | PM | 210 | V | 220 | V | 51 | Hz | 38 | % | 75 | % | 28 | C |
| 932) | 1/5/2010 | 1:59:50 | PM | 211 | V | 221 | V | 51 | Hz | 42 | % | 78 | % | 28 | C |
| 933) | 1/5/2010 | 1:59:52 | PM | 211 | V | 219 | V | 51 | Hz | 37 | % | 77 | % | 28 | C |
| 934) | 1/5/2010 | 1:59:54 | PM | 210 | V | 221 | V | 51 | Hz | 38 | % | 77 | % | 28 | C |
| 935) | 1/5/2010 | 1:59:56 | PM | 210 | V | 220 | V | 51 | Hz | 40 | % | 78 | % | 28 | C |
| 936) | 1/5/2010 | 1:59:58 | PM | 211 | V | 220 | V | 51 | Hz | 37 | % | 77 | % | 28 | C |
| 937) | 1/5/2010 | 2:00:00 | PM | 211 | V | 220 | V | 51 | Hz | 36 | % | 77 | % | 28 | C |
| 938) | 1/5/2010 | 2:00:02 | PM | 211 | V | 220 | V | 51 | Hz | 41 | % | 77 | % | 28 | C |
| 939) | 1/5/2010 | 2:00:04 | PM | 211 | V | 220 | V | 51 | Hz | 41 | % | 77 | % | 28 | C |
| 940) | 1/5/2010 | 2:00:06 | PM | 211 | V | 220 | V | 51 | Hz | 38 | % | 77 | % | 28 | C |
| 941) | 1/5/2010 | 2:00:09 | PM | 211 | V | 220 | V | 51 | Hz | 37 | % | 77 | % | 28 | C |
| 942) | 1/5/2010 | 2:00:11 | PM | 211 | V | 221 | V | 51 | Hz | 37 | % | 78 | % | 28 | C |
| 943) | 1/5/2010 | 2:00:13 | PM | 211 | V | 220 | V | 51 | Hz | 38 | % | 77 | % | 28 | C |
| 944) | 1/5/2010 | 2:00:15 | PM | 210 | V | 220 | V | 51 | Hz | 38 | % | 78 | % | 28 | C |
| 945) | 1/5/2010 | 2:00:17 | PM | 209 | V | 220 | V | 51 | Hz | 39 | % | 77 | % | 28 | C |
| 946) | 1/5/2010 | 2:00:20 | PM | 210 | V | 220 | V | 51 | Hz | 36 | % | 78 | % | 28 | C |
| 947) | 1/5/2010 | 2:00:22 | PM | 210 | V | 220 | V | 51 | Hz | 38 | % | 78 | % | 28 | C |

FIG. 6 - 33

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 948) | 1/5/2010 | 2:00:24 | PM | 210 | V | 220 | V | 51 | Hz | 39 | % | 80 | % | 28 | C |
| 949) | 1/5/2010 | 2:00:26 | PM | 211 | V | 220 | V | 51 | Hz | 38 | % | 78 | % | 28 | C |
| 950) | 1/5/2010 | 2:00:28 | PM | 210 | V | 221 | V | 51 | Hz | 36 | % | 78 | % | 28 | C |
| 951) | 1/5/2010 | 2:00:30 | PM | 210 | V | 221 | V | 51 | Hz | 35 | % | 78 | % | 28 | C |
| 952) | 1/5/2010 | 2:00:32 | PM | 211 | V | 220 | V | 51 | Hz | 40 | % | 78 | % | 28 | C |
| 953) | 1/5/2010 | 2:00:34 | PM | 209 | V | 220 | V | 51 | Hz | 36 | % | 78 | % | 28 | C |
| 954) | 1/5/2010 | 2:00:36 | PM | 209 | V | 220 | V | 51 | Hz | 37 | % | 78 | % | 28 | C |
| 955) | 1/5/2010 | 2:00:38 | PM | 210 | V | 220 | V | 51 | Hz | 41 | % | 77 | % | 28 | C |
| 956) | 1/5/2010 | 2:00:40 | PM | 211 | V | 220 | V | 51 | Hz | 38 | % | 78 | % | 28 | C |
| 958) | 1/5/2010 | 2:00:44 | PM | 210 | V | 220 | V | 51 | Hz | 34 | % | 78 | % | 28 | C |
| 959) | 1/5/2010 | 2:00:46 | PM | 210 | V | 220 | V | 51 | Hz | 38 | % | 78 | % | 28 | C |
| 960) | 1/5/2010 | 2:00:48 | PM | 210 | V | 220 | V | 51 | Hz | 36 | % | 78 | % | 28 | C |
| 961) | 1/5/2010 | 2:00:51 | PM | 210 | V | 221 | V | 51 | Hz | 38 | % | 78 | % | 28 | C |
| 962) | 1/5/2010 | 2:00:53 | PM | 211 | V | 220 | V | 51 | Hz | 40 | % | 80 | % | 28 | C |
| 963) | 1/5/2010 | 2:00:55 | PM | 209 | V | 220 | V | 51 | Hz | 36 | % | 78 | % | 28 | C |
| 964) | 1/5/2010 | 2:00:57 | PM | 209 | V | 220 | V | 51 | Hz | 38 | % | 78 | % | 28 | C |
| 965) | 1/5/2010 | 2:00:59 | PM | 209 | V | 220 | V | 51 | Hz | 36 | % | 78 | % | 28 | C |
| 966) | 1/5/2010 | 2:01:01 | PM | 210 | V | 220 | V | 51 | Hz | 36 | % | 80 | % | 28 | C |
| 967) | 1/5/2010 | 2:01:03 | PM | 210 | V | 220 | V | 51 | Hz | 36 | % | 80 | % | 28 | C |
| 968) | 1/5/2010 | 2:01:05 | PM | 210 | V | 221 | V | 51 | Hz | 35 | % | 78 | % | 28 | C |
| 969) | 1/5/2010 | 2:01:07 | PM | 210 | V | 220 | V | 51 | Hz | 39 | % | 78 | % | 28 | C |
| 970) | 1/5/2010 | 2:01:09 | PM | 209 | V | 220 | V | 51 | Hz | 38 | % | 80 | % | 28 | C |
| 971) | 1/5/2010 | 2:01:11 | PM | 209 | V | 221 | V | 51 | Hz | 37 | % | 78 | % | 28 | C |
| 972) | 1/5/2010 | 2:01:13 | PM | 211 | V | 220 | V | 51 | Hz | 36 | % | 78 | % | 28 | C |
| 973) | 1/5/2010 | 2:01:15 | PM | 210 | V | 220 | V | 51 | Hz | 34 | % | 78 | % | 28 | C |
| 974) | 1/5/2010 | 2:01:17 | PM | 210 | V | 220 | V | 51 | Hz | 35 | % | 78 | % | 28 | C |
| 975) | 1/5/2010 | 2:01:19 | PM | 211 | V | 220 | V | 51 | Hz | 34 | % | 78 | % | 28 | C |
| 976) | 1/5/2010 | 2:01:22 | PM | 210 | V | 221 | V | 51 | Hz | 36 | % | 78 | % | 28 | C |

FIG. 6 - 34

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 977) | 1/5/2010 | 2:01:24 | PM | 210 | V | 220 | V | 51 | Hz | 36 | % | 78 | % | 28 | C |
| 978) | 1/5/2010 | 2:01:26 | PM | 211 | V | 221 | V | 51 | Hz | 35 | % | 80 | % | 28 | C |
| 979) | 1/5/2010 | 2:01:28 | PM | 211 | V | 220 | V | 51 | Hz | 35 | % | 80 | % | 28 | C |
| 980) | 1/5/2010 | 2:01:30 | PM | 212 | V | 221 | V | 51 | Hz | 35 | % | 80 | % | 28 | C |
| 981) | 1/5/2010 | 2:01:32 | PM | 211 | V | 220 | V | 51 | Hz | 37 | % | 80 | % | 28 | C |
| 982) | 1/5/2010 | 2:01:34 | PM | 210 | V | 220 | V | 51 | Hz | 34 | % | 80 | % | 28 | C |
| 983) | 1/5/2010 | 2:01:36 | PM | 206 | V | 219 | V | 0 | Hz | 37 | % | 83 | % | 28 | C |
| 984) | 1/5/2010 | 2:01:38 | PM | 204 | V | 219 | V | 0 | Hz | 36 | % | 82 | % | 28 | C |
| 985) | 1/5/2010 | 2:01:40 | PM | 204 | V | 218 | V | 0 | Hz | 35 | % | 82 | % | 28 | C |
| 986) | 1/5/2010 | 2:01:42 | PM | 204 | V | 218 | V | 0 | Hz | 36 | % | 82 | % | 28 | C |
| 987) | 1/5/2010 | 2:01:44 | PM | 204 | V | 218 | V | 0 | Hz | 36 | % | 82 | % | 28 | C |
| 988) | 1/5/2010 | 2:01:46 | PM | 203 | V | 218 | V | 0 | Hz | 36 | % | 82 | % | 28 | C |
| 989) | 1/5/2010 | 2:01:48 | PM | 204 | V | 218 | V | 0 | Hz | 36 | % | 80 | % | 28 | C |
| 990) | 1/5/2010 | 2:01:50 | PM | 204 | V | 218 | V | 0 | Hz | 37 | % | 80 | % | 28 | C |
| 991) | 1/5/2010 | 2:01:53 | PM | 204 | V | 218 | V | 0 | Hz | 36 | % | 80 | % | 28 | C |
| 992) | 1/5/2010 | 2:01:55 | PM | 202 | V | 218 | V | 0 | Hz | 36 | % | 80 | % | 28 | C |
| 993) | 1/5/2010 | 2:01:57 | PM | 204 | V | 219 | V | 0 | Hz | 39 | % | 80 | % | 28 | C |
| 994) | 1/5/2010 | 2:01:59 | PM | 2 | V | 218 | V | 0 | Hz | 38 | % | 78 | % | 28 | C |
| 995) | 1/5/2010 | 2:02:01 | PM | 2 | V | 218 | V | 0 | Hz | 38 | % | 78 | % | 28 | C |
| 996) | 1/5/2010 | 2:02:03 | PM | 2 | V | 218 | V | 0 | Hz | 38 | % | 78 | % | 28 | C |
| 998) | 1/5/2010 | 2:02:07 | PM | 2 | V | 218 | V | 0 | Hz | 38 | % | 78 | % | 28 | C |
| 999) | 1/5/2010 | 2:02:09 | PM | 2 | V | 218 | V | 0 | Hz | 36 | % | 78 | % | 28 | C |
| 1000) | 1/5/2010 | 2:02:11 | PM | 2 | V | 218 | V | 0 | Hz | 36 | % | 78 | % | 28 | C |
| 1001) | 1/5/2010 | 2:02:13 | PM | 2 | V | 218 | V | 0 | Hz | 36 | % | 78 | % | 28 | C |
| 1002) | 1/5/2010 | 2:02:15 | PM | 2 | V | 218 | V | 0 | Hz | 35 | % | 78 | % | 28 | C |
| 1003) | 1/5/2010 | 2:02:17 | PM | 2 | V | 218 | V | 0 | Hz | 38 | % | 78 | % | 28 | C |
| 1004) | 1/5/2010 | 2:02:19 | PM | 2 | V | 218 | V | 0 | Hz | 39 | % | 78 | % | 28 | C |
| 1005) | 1/5/2010 | 2:02:21 | PM | 2 | V | 218 | V | 0 | Hz | 38 | % | 78 | % | 27 | C |

FIG. 6 - 35

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1006) | 1/5/2010 | 2:02:24 | PM | 191 | V | 219 | V | 0 | Hz | 38 | % | 78 | % | 28 | C |
| 1007) | 1/5/2010 | 2:02:26 | PM | 190 | V | 219 | V | 0 | Hz | 38 | % | 78 | % | 28 | C |
| 1008) | 1/5/2010 | 2:02:28 | PM | 188 | V | 219 | V | 0 | Hz | 38 | % | 78 | % | 28 | C |
| 1009) | 1/5/2010 | 2:02:30 | PM | 191 | V | 219 | V | 0 | Hz | 38 | % | 78 | % | 28 | C |
| 1010) | 1/5/2010 | 2:02:32 | PM | 191 | V | 219 | V | 0 | Hz | 38 | % | 78 | % | 28 | C |
| 1011) | 1/5/2010 | 2:02:34 | PM | 193 | V | 219 | V | 0 | Hz | 36 | % | 78 | % | 28 | C |
| 1012) | 1/5/2010 | 2:02:36 | PM | 192 | V | 219 | V | 0 | Hz | 36 | % | 78 | % | 28 | C |
| 1013) | 1/5/2010 | 2:02:38 | PM | 193 | V | 219 | V | 57 | Hz | 36 | % | 78 | % | 28 | C |
| 1014) | 1/5/2010 | 2:02:40 | PM | 191 | V | 218 | V | 50 | Hz | 38 | % | 72 | % | 28 | C |
| 1015) | 1/5/2010 | 2:02:42 | PM | 192 | V | 219 | V | 50 | Hz | 41 | % | 72 | % | 28 | C |
| 1016) | 1/5/2010 | 2:02:44 | PM | 193 | V | 218 | V | 50 | Hz | 42 | % | 72 | % | 26 | C |
| 1017) | 1/5/2010 | 2:02:46 | PM | 192 | V | 219 | V | 50 | Hz | 38 | % | 72 | % | 28 | C |
| 1018) | 1/5/2010 | 2:02:48 | PM | 193 | V | 219 | V | 50 | Hz | 38 | % | 68 | % | 28 | C |
| 1019) | 1/5/2010 | 2:02:50 | PM | 191 | V | 219 | V | 50 | Hz | 38 | % | 70 | % | 28 | C |
| 1020) | 1/5/2010 | 2:02:52 | PM | 194 | V | 218 | V | 50 | Hz | 38 | % | 72 | % | 28 | C |
| 1021) | 1/5/2010 | 2:02:55 | PM | 199 | V | 220 | V | 50 | Hz | 38 | % | 75 | % | 28 | C |
| 1022) | 1/5/2010 | 2:02:57 | PM | 197 | V | 220 | V | 50 | Hz | 41 | % | 75 | % | 28 | C |
| 1023) | 1/5/2010 | 2:02:59 | PM | 198 | V | 220 | V | 50 | Hz | 40 | % | 77 | % | 28 | C |
| 1024) | 1/5/2010 | 2:03:01 | PM | 198 | V | 221 | V | 50 | Hz | 41 | % | 77 | % | 28 | C |
| 1025) | 1/5/2010 | 2:03:03 | PM | 199 | V | 221 | V | 50 | Hz | 38 | % | 75 | % | 28 | C |
| 1026) | 1/5/2010 | 2:03:05 | PM | 199 | V | 220 | V | 50 | Hz | 38 | % | 77 | % | 28 | C |
| 1027) | 1/5/2010 | 2:03:07 | PM | 199 | V | 204 | V | 50 | Hz | 39 | % | 77 | % | 28 | C |
| 1028) | 1/5/2010 | 2:03:09 | PM | 199 | V | 220 | V | 50 | Hz | 40 | % | 77 | % | 28 | C |
| 1029) | 1/5/2010 | 2:03:11 | PM | 199 | V | 220 | V | 50 | Hz | 42 | % | 78 | % | 28 | C |
| 1030) | 1/5/2010 | 2:03:13 | PM | 198 | V | 220 | V | 50 | Hz | 41 | % | 77 | % | 28 | C |
| 1031) | 1/5/2010 | 2:03:15 | PM | 198 | V | 220 | V | 50 | Hz | 39 | % | 77 | % | 28 | C |
| 1032) | 1/5/2010 | 2:03:17 | PM | 198 | V | 220 | V | 50 | Hz | 40 | % | 77 | % | 28 | C |
| 1033) | 1/5/2010 | 2:03:19 | PM | 199 | V | 221 | V | 50 | Hz | 40 | % | 77 | % | 28 | C |

FIG. 6 - 36

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1034) | 1/5/2010 | 2:03:21 | PM | 199 | V | 221 | V | 50 | Hz | 40 | % | 78 | % | 28 | C |
| 1035) | 1/5/2010 | 2:03:23 | PM | 199 | V | 221 | V | 50 | Hz | 37 | % | 78 | % | 28 | C |
| 1036) | 1/5/2010 | 2:03:26 | PM | 200 | V | 221 | V | 50 | Hz | 42 | % | 78 | % | 28 | C |
| 1038) | 1/5/2010 | 2:03:30 | PM | 200 | V | 220 | V | 50 | Hz | 39 | % | 78 | % | 28 | C |
| 1039) | 1/5/2010 | 2:03:32 | PM | 200 | V | 220 | V | 50 | Hz | 40 | % | 78 | % | 28 | C |
| 1040) | 1/5/2010 | 2:03:34 | PM | 199 | V | 220 | V | 50 | Hz | 37 | % | 78 | % | 28 | C |
| 1041) | 1/5/2010 | 2:03:36 | PM | 198 | V | 218 | V | 50 | Hz | 38 | % | 77 | % | 28 | C |
| 1042) | 1/5/2010 | 2:03:38 | PM | 198 | V | 220 | V | 50 | Hz | 38 | % | 78 | % | 28 | C |
| 1043) | 1/5/2010 | 2:03:40 | PM | 198 | V | 221 | V | 50 | Hz | 40 | % | 78 | % | 28 | C |
| 1044) | 1/5/2010 | 2:03:42 | PM | 200 | V | 221 | V | 50 | Hz | 39 | % | 78 | % | 28 | C |
| 1045) | 1/5/2010 | 2:03:44 | PM | 199 | V | 221 | V | 50 | Hz | 38 | % | 78 | % | 28 | C |
| 1046) | 1/5/2010 | 2:03:46 | PM | 200 | V | 221 | V | 50 | Hz | 38 | % | 78 | % | 28 | C |
| 1047) | 1/5/2010 | 2:03:48 | PM | 200 | V | 221 | V | 50 | Hz | 44 | % | 80 | % | 28 | C |
| 1048) | 1/5/2010 | 2:03:50 | PM | 200 | V | 220 | V | 50 | Hz | 40 | % | 78 | % | 28 | C |
| 1049) | 1/5/2010 | 2:03:52 | PM | 199 | V | 220 | V | 50 | Hz | 39 | % | 80 | % | 28 | C |
| 1050) | 1/5/2010 | 2:03:54 | PM | 199 | V | 220 | V | 50 | Hz | 39 | % | 78 | % | 28 | C |
| 1051) | 1/5/2010 | 2:03:57 | PM | 199 | V | 221 | V | 50 | Hz | 39 | % | 80 | % | 28 | C |
| 1052) | 1/5/2010 | 2:03:59 | PM | 200 | V | 220 | V | 50 | Hz | 38 | % | 78 | % | 28 | C |
| 1053) | 1/5/2010 | 2:04:01 | PM | 200 | V | 220 | V | 50 | Hz | 38 | % | 80 | % | 28 | C |
| 1054) | 1/5/2010 | 2:04:03 | PM | 200 | V | 220 | V | 50 | Hz | 40 | % | 80 | % | 28 | C |
| 1055) | 1/5/2010 | 2:04:05 | PM | 200 | V | 220 | V | 50 | Hz | 40 | % | 82 | % | 28 | C |
| 1056) | 1/5/2010 | 2:04:07 | PM | 198 | V | 220 | V | 50 | Hz | 39 | % | 78 | % | 28 | C |
| 1057) | 1/5/2010 | 2:04:09 | PM | 199 | V | 220 | V | 50 | Hz | 36 | % | 78 | % | 28 | C |
| 1058) | 1/5/2010 | 2:04:11 | PM | 199 | V | 220 | V | 50 | Hz | 39 | % | 78 | % | 28 | C |
| 1059) | 1/5/2010 | 2:04:13 | PM | 200 | V | 221 | V | 50 | Hz | 38 | % | 80 | % | 28 | C |
| 1060) | 1/5/2010 | 2:04:15 | PM | 200 | V | 220 | V | 50 | Hz | 42 | % | 80 | % | 28 | C |
| 1061) | 1/5/2010 | 2:04:17 | PM | 200 | V | 220 | V | 50 | Hz | 41 | % | 82 | % | 28 | C |
| 1062) | 1/5/2010 | 2:04:19 | PM | 199 | V | 220 | V | 50 | Hz | 39 | % | 80 | % | 28 | C |

FIG. 6 - 37

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1063) | 1/5/2010 | 2:04:21 | PM | 201 | V | 220 | V | 50 | Hz | 41 | % | 78 | % | 28 | C |
| 1064) | 1/5/2010 | 2:04:23 | PM | 201 | V | 220 | V | 50 | Hz | 40 | % | 80 | % | 28 | C |
| 1065) | 1/5/2010 | 2:04:25 | PM | 201 | V | 220 | V | 50 | Hz | 39 | % | 80 | % | 28 | C |
| 1066) | 1/5/2010 | 2:04:28 | PM | 199 | V | 221 | V | 50 | Hz | 41 | % | 78 | % | 28 | C |
| 1067) | 1/5/2010 | 2:04:30 | PM | 200 | V | 221 | V | 50 | Hz | 40 | % | 78 | % | 28 | C |
| 1068) | 1/5/2010 | 2:04:32 | PM | 200 | V | 220 | V | 50 | Hz | 38 | % | 80 | % | 28 | C |
| 1069) | 1/5/2010 | 2:04:34 | PM | 200 | V | 220 | V | 50 | Hz | 40 | % | 80 | % | 28 | C |
| 1070) | 1/5/2010 | 2:04:36 | PM | 200 | V | 220 | V | 50 | Hz | 43 | % | 80 | % | 28 | C |
| 1071) | 1/5/2010 | 2:04:38 | PM | 200 | V | 219 | V | 50 | Hz | 36 | % | 80 | % | 28 | C |
| 1072) | 1/5/2010 | 2:04:40 | PM | 199 | V | 207 | V | 50 | Hz | 41 | % | 80 | % | 28 | C |
| 1073) | 1/5/2010 | 2:04:42 | PM | 199 | V | 220 | V | 50 | Hz | 43 | % | 78 | % | 28 | C |
| 1074) | 1/5/2010 | 2:04:44 | PM | 199 | V | 214 | V | 50 | Hz | 38 | % | 82 | % | 29 | C |
| 1075) | 1/5/2010 | 2:04:46 | PM | 199 | V | 221 | V | 50 | Hz | 42 | % | 80 | % | 28 | C |
| 1076) | 1/5/2010 | 2:04:48 | PM | 202 | V | 220 | V | 50 | Hz | 38 | % | 80 | % | 28 | C |
| 1078) | 1/5/2010 | 2:04:52 | PM | 202 | V | 202 | V | 50 | Hz | 0 | % | 75 | % | 28 | C |
| 1079) | 1/5/2010 | 2:04:54 | PM | 82 | V | 82 | V | 0 | Hz | 0 | % | 72 | % | 28 | C |
| 1080) | 1/5/2010 | 2:04:56 | PM | 2 | V | 2 | V | 0 | Hz | 0 | % | 65 | % | 28 | C |
| 1081) | 1/5/2010 | 2:04:59 | PM | 2 | V | 2 | V | 0 | Hz | 0 | % | 55 | % | 28 | C |
| 1082) | 1/5/2010 | 2:05:01 | PM | 2 | V | 2 | V | 0 | Hz | 0 | % | 50 | % | 28 | C |
| 1083) | 1/5/2010 | 2:05:03 | PM | 2 | V | 2 | V | 0 | Hz | 0 | % | 42 | % | 28 | C |
| 1084) | 1/5/2010 | 2:05:05 | PM | 2 | V | 2 | V | 0 | Hz | 0 | % | 37 | % | 28 | C |
| 1085) | 1/5/2010 | 2:05:07 | PM | 2 | V | 2 | V | 0 | Hz | 0 | % | 30 | % | 28 | C |
| 1086) | 1/5/2010 | 2:05:09 | PM | 2 | V | 2 | V | 0 | Hz | 0 | % | 22 | % | 28 | C |
| 1087) | 1/5/2010 | 2:05:11 | PM | 2 | V | 2 | V | 0 | Hz | 0 | % | 17 | % | 28 | C |
| 1088) | 1/5/2010 | 2:05:13 | PM | 2 | V | 2 | V | 0 | Hz | 0 | % | 7 | % | 28 | C |
| 1089) | 1/5/2010 | 2:05:15 | PM | 2 | V | 2 | V | 0 | Hz | 0 | % | 0 | % | 28 | C |
| 1090) | 1/5/2010 | 2:05:17 | PM | 2 | V | 2 | V | 0 | Hz | 0 | % | 0 | % | 28 | C |
| 1091) | 1/5/2010 | 2:05:19 | PM | 2 | V | 2 | V | 0 | Hz | 0 | % | 0 | % | 28 | C |

FIG. 6 - 38

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1092) | 1/5/2010 | 2:05:21 | PM | 2 | V | 2 | V | 0 | Hz | 0 | % | 0 | % | 28 | C |
| 1093) | 1/5/2010 | 2:05:23 | PM | 2 | V | 2 | V | 0 | Hz | 0 | % | 0 | % | 28 | C |
| 1094) | 1/5/2010 | 2:05:25 | PM | 2 | V | 2 | V | 0 | Hz | 0 | % | 0 | % | 28 | C |
| 1095) | 1/5/2010 | 2:05:27 | PM | 2 | V | 2 | V | 0 | Hz | 0 | % | 0 | % | 28 | C |
| 1096) | 1/5/2010 | 2:05:30 | PM | 2 | V | 2 | V | 0 | Hz | 0 | % | 0 | % | 28 | C |
| 1097) | 1/5/2010 | 2:05:32 | PM | 2 | V | 2 | V | 0 | Hz | 0 | % | 0 | % | 28 | C |
| 1098) | 1/5/2010 | 2:05:34 | PM | 2 | V | 2 | V | 0 | Hz | 0 | % | 0 | % | 28 | C |
| 1099) | 1/5/2010 | 2:05:36 | PM | 2 | V | 2 | V | 0 | Hz | 0 | % | 0 | % | 28 | C |
| 1100) | 1/5/2010 | 2:05:38 | PM | 2 | V | 2 | V | 0 | Hz | 0 | % | 0 | % | 28 | C |
| 1101) | 1/5/2010 | 2:05:40 | PM | 2 | V | 2 | V | 0 | Hz | 0 | % | 0 | % | 28 | C |
| 1102) | 1/5/2010 | 2:05:42 | PM | 2 | V | 2 | V | 0 | Hz | 0 | % | 0 | % | 28 | C |
| 1103) | 1/5/2010 | 2:05:44 | PM | 2 | V | 2 | V | 0 | Hz | 0 | % | 0 | % | 28 | C |
| 1104) | 1/5/2010 | 2:05:46 | PM | 2 | V | 2 | V | 0 | Hz | 0 | % | 0 | % | 29 | C |
| 1105) | 1/5/2010 | 2:10:15 | PM | 0 | V | 0 | V | 0 | Hz | 0 | % | 15 | % | 29 | C |
| 1106) | 1/5/2010 | 2:10:17 | PM | 0 | V | 216 | V | 0 | Hz | 0 | % | 82 | % | 29 | C |
| 1107) | 1/5/2010 | 2:10:19 | PM | 0 | V | 218 | V | 0 | Hz | 0 | % | 82 | % | 29 | C |
| 1108) | 1/5/2010 | 2:10:21 | PM | 0 | V | 218 | V | 0 | Hz | 0 | % | 82 | % | 29 | C |
| 1109) | 1/5/2010 | 2:10:23 | PM | 0 | V | 218 | V | 0 | Hz | 0 | % | 82 | % | 29 | C |
| 1110) | 1/5/2010 | 2:10:25 | PM | 10 | V | 207 | V | 0 | Hz | 130 | % | 70 | % | 27 | C |
| 1111) | 1/5/2010 | 2:10:27 | PM | 2 | V | 222 | V | 0 | Hz | 10 | % | 80 | % | 29 | C |
| 1112) | 1/5/2010 | 2:10:29 | PM | 2 | V | 220 | V | 0 | Hz | 11 | % | 80 | % | 29 | C |
| 1113) | 1/5/2010 | 2:10:31 | PM | 2 | V | 220 | V | 0 | Hz | 12 | % | 80 | % | 29 | C |
| 1114) | 1/5/2010 | 2:10:33 | PM | 2 | V | 220 | V | 0 | Hz | 11 | % | 80 | % | 29 | C |
| 1115) | 1/5/2010 | 2:10:35 | PM | 2 | V | 221 | V | 0 | Hz | 11 | % | 80 | % | 29 | C |
| 1116) | 1/5/2010 | 2:10:37 | PM | 2 | V | 221 | V | 0 | Hz | 11 | % | 80 | % | 29 | C |
| 1118) | 1/5/2010 | 2:10:41 | PM | 2 | V | 220 | V | 0 | Hz | 37 | % | 78 | % | 28 | C |
| 1119) | 1/5/2010 | 2:10:43 | PM | 2 | V | 221 | V | 0 | Hz | 37 | % | 78 | % | 28 | C |
| 1120) | 1/5/2010 | 2:10:46 | PM | 2 | V | 220 | V | 0 | Hz | 37 | % | 78 | % | 29 | C |

FIG. 6 - 39

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1121) | 1/5/2010 | 2:10:48 | PM | 86 | V | 220 | V | 46 | Hz | 36 | % | 78 | % | 29 | C |
| 1122) | 1/5/2010 | 2:10:50 | PM | 211 | V | 222 | V | 51 | Hz | 40 | % | 70 | % | 29 | C |
| 1123) | 1/5/2010 | 2:10:52 | PM | 185 | V | 216 | V | 48 | Hz | 44 | % | 72 | % | 28 | C |
| 1124) | 1/5/2010 | 2:10:54 | PM | 202 | V | 214 | V | 48 | Hz | 43 | % | 75 | % | 28 | C |
| 1125) | 1/5/2010 | 2:10:56 | PM | 209 | V | 203 | V | 50 | Hz | 53 | % | 77 | % | 29 | C |
| 1126) | 1/5/2010 | 2:10:58 | PM | 211 | V | 222 | V | 51 | Hz | 34 | % | 73 | % | 29 | C |
| 1127) | 1/5/2010 | 2:11:00 | PM | 180 | V | 213 | V | 50 | Hz | 40 | % | 73 | % | 29 | C |
| 1128) | 1/5/2010 | 2:11:02 | PM | 206 | V | 215 | V | 48 | Hz | 48 | % | 75 | % | 29 | C |
| 1129) | 1/5/2010 | 2:11:04 | PM | 186 | V | 220 | V | 49 | Hz | 48 | % | 75 | % | 29 | C |
| 1130) | 1/5/2010 | 2:11:06 | PM | 211 | V | 222 | V | 51 | Hz | 37 | % | 73 | % | 28 | C |
| 1131) | 1/5/2010 | 2:11:08 | PM | 211 | V | 220 | V | 50 | Hz | 35 | % | 72 | % | 29 | C |
| 1132) | 1/5/2010 | 2:11:10 | PM | 210 | V | 220 | V | 50 | Hz | 35 | % | 72 | % | 29 | C |
| 1133) | 1/5/2010 | 2:11:12 | PM | 212 | V | 223 | V | 51 | Hz | 39 | % | 72 | % | 29 | C |
| 1134) | 1/5/2010 | 2:11:14 | PM | 210 | V | 217 | V | 51 | Hz | 39 | % | 72 | % | 27 | C |
| 1135) | 1/5/2010 | 2:11:17 | PM | 187 | V | 210 | V | 48 | Hz | 46 | % | 70 | % | 29 | C |
| 1136) | 1/5/2010 | 2:11:19 | PM | 184 | V | 216 | V | 48 | Hz | 43 | % | 68 | % | 29 | C |
| 1137) | 1/5/2010 | 2:11:21 | PM | 182 | V | 214 | V | 49 | Hz | 51 | % | 75 | % | 29 | C |
| 1138) | 1/5/2010 | 2:11:23 | PM | 207 | V | 224 | V | 50 | Hz | 45 | % | 72 | % | 29 | C |
| 1139) | 1/5/2010 | 2:11:25 | PM | 179 | V | 216 | V | 51 | Hz | 43 | % | 68 | % | 28 | C |
| 1140) | 1/5/2010 | 2:11:27 | PM | 210 | V | 221 | V | 50 | Hz | 36 | % | 73 | % | 29 | C |
| 1141) | 1/5/2010 | 2:11:29 | PM | 203 | V | 216 | V | 48 | Hz | 48 | % | 65 | % | 28 | C |
| 1142) | 1/5/2010 | 2:11:31 | PM | 186 | V | 207 | V | 52 | Hz | 89 | % | 70 | % | 29 | C |
| 1143) | 1/5/2010 | 2:11:33 | PM | 2 | V | 223 | V | 0 | Hz | 0 | % | 78 | % | 29 | C |
| 1144) | 1/5/2010 | 2:11:35 | PM | 2 | V | 220 | V | 0 | Hz | 0 | % | 78 | % | 29 | C |
| 1145) | 1/5/2010 | 2:11:37 | PM | 2 | V | 220 | V | 0 | Hz | 0 | % | 78 | % | 29 | C |
| 1146) | 1/5/2010 | 2:11:39 | PM | 2 | V | 220 | V | 0 | Hz | 0 | % | 78 | % | 29 | C |
| 1147) | 1/5/2010 | 2:11:41 | PM | 2 | V | 220 | V | 0 | Hz | 0 | % | 78 | % | 29 | C |
| 1148) | 1/5/2010 | 2:11:43 | PM | 2 | V | 220 | V | 0 | Hz | 0 | % | 78 | % | 29 | C |

FIG. 6 - 40

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1149) | 1/5/2010 | 2:11:45 | PM | 2 | V | 220 | V | 0 | Hz | 0 | % | 78 | % | 29 | C |
| 1150) | 1/5/2010 | 2:11:47 | PM | 2 | V | 220 | V | 0 | Hz | 0 | % | 78 | % | 29 | C |
| 1151) | 1/5/2010 | 2:11:49 | PM | 2 | V | 220 | V | 0 | Hz | 0 | % | 78 | % | 29 | C |
| 1152) | 1/5/2010 | 2:11:51 | PM | 2 | V | 220 | V | 0 | Hz | 0 | % | 78 | % | 29 | C |
| 1153) | 1/5/2010 | 2:11:53 | PM | 2 | V | 220 | V | 0 | Hz | 0 | % | 78 | % | 29 | C |
| 1154) | 1/5/2010 | 2:11:55 | PM | 2 | V | 220 | V | 0 | Hz | 0 | % | 78 | % | 29 | C |
| 1155) | 1/5/2010 | 2:11:57 | PM | 2 | V | 220 | V | 0 | Hz | 0 | % | 78 | % | 29 | C |
| 1156) | 1/5/2010 | 2:11:59 | PM | 2 | V | 220 | V | 0 | Hz | 0 | % | 78 | % | 29 | C |
| 1158) | 1/5/2010 | 2:12:03 | PM | 2 | V | 221 | V | 0 | Hz | 0 | % | 78 | % | 29 | C |
| 1159) | 1/5/2010 | 2:12:05 | PM | 2 | V | 221 | V | 0 | Hz | 0 | % | 80 | % | 29 | C |
| 1160) | 1/5/2010 | 2:12:07 | PM | 2 | V | 211 | V | 0 | Hz | 129 | % | 65 | % | 26 | C |
| 1161) | 1/5/2010 | 2:12:09 | PM | 2 | V | 222 | V | 0 | Hz | 10 | % | 78 | % | 29 | C |
| 1162) | 1/5/2010 | 2:12:11 | PM | 2 | V | 220 | V | 0 | Hz | 11 | % | 77 | % | 28 | C |
| 1163) | 1/5/2010 | 2:12:13 | PM | 2 | V | 220 | V | 0 | Hz | 11 | % | 78 | % | 28 | C |
| 1164) | 1/5/2010 | 2:12:15 | PM | 2 | V | 221 | V | 0 | Hz | 11 | % | 78 | % | 28 | C |
| 1165) | 1/5/2010 | 2:12:17 | PM | 2 | V | 220 | V | 0 | Hz | 11 | % | 78 | % | 28 | C |
| 1166) | 1/5/2010 | 2:12:20 | PM | 2 | V | 220 | V | 0 | Hz | 11 | % | 78 | % | 28 | C |
| 1167) | 1/5/2010 | 2:12:22 | PM | 2 | V | 208 | V | 0 | Hz | 36 | % | 78 | % | 28 | C |
| 1168) | 1/5/2010 | 2:12:24 | PM | 2 | V | 219 | V | 0 | Hz | 36 | % | 78 | % | 28 | C |
| 1169) | 1/5/2010 | 2:12:26 | PM | 2 | V | 220 | V | 0 | Hz | 36 | % | 77 | % | 28 | C |
| 1170) | 1/5/2010 | 2:12:28 | PM | 2 | V | 219 | V | 0 | Hz | 36 | % | 77 | % | 28 | C |
| 1171) | 1/5/2010 | 2:12:30 | PM | 158 | V | 220 | V | 47 | Hz | 39 | % | 77 | % | 28 | C |
| 1172) | 1/5/2010 | 2:12:32 | PM | 211 | V | 222 | V | 51 | Hz | 38 | % | 73 | % | 29 | C |
| 1173) | 1/5/2010 | 2:12:34 | PM | 211 | V | 220 | V | 51 | Hz | 36 | % | 70 | % | 28 | C |
| 1174) | 1/5/2010 | 2:12:36 | PM | 210 | V | 221 | V | 51 | Hz | 35 | % | 73 | % | 28 | C |
| 1175) | 1/5/2010 | 2:12:38 | PM | 212 | V | 219 | V | 51 | Hz | 39 | % | 70 | % | 29 | C |
| 1176) | 1/5/2010 | 2:12:40 | PM | 211 | V | 211 | V | 48 | Hz | 43 | % | 65 | % | 28 | C |
| 1177) | 1/5/2010 | 2:12:42 | PM | 203 | V | 215 | V | 48 | Hz | 48 | % | 65 | % | 10 | C |

FIG. 6 - 41

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1178) | 1/5/2010 | 2:12:44 | PM | 201 | V | 215 | V | 48 | Hz | 44 | % | 73 | % | 29 | C |
| 1179) | 1/5/2010 | 2:12:46 | PM | 183 | V | 220 | V | 49 | Hz | 56 | % | 58 | % | 29 | C |
| 1180) | 1/5/2010 | 2:12:51 | PM | 185 | V | 218 | V | 50 | Hz | 40 | % | 73 | % | 17 | C |
| 1181) | 1/5/2010 | 2:12:53 | PM | 183 | V | 215 | V | 48 | Hz | 41 | % | 72 | % | 29 | C |
| 1182) | 1/5/2010 | 2:12:55 | PM | 193 | V | 223 | V | 50 | Hz | 85 | % | 65 | % | 29 | C |
| 1183) | 1/5/2010 | 2:12:57 | PM | 2 | V | 223 | V | 0 | Hz | 0 | % | 78 | % | 29 | C |
| 1184) | 1/5/2010 | 2:12:59 | PM | 2 | V | 220 | V | 0 | Hz | 0 | % | 78 | % | 28 | C |
| 1185) | 1/5/2010 | 2:13:01 | PM | 2 | V | 220 | V | 0 | Hz | 0 | % | 78 | % | 29 | C |
| 1186) | 1/5/2010 | 2:13:03 | PM | 2 | V | 220 | V | 0 | Hz | 0 | % | 78 | % | 28 | C |
| 1187) | 1/5/2010 | 2:13:05 | PM | 2 | V | 220 | V | 0 | Hz | 0 | % | 78 | % | 29 | C |
| 1188) | 1/5/2010 | 2:13:07 | PM | 2 | V | 220 | V | 0 | Hz | 0 | % | 78 | % | 29 | C |
| 1189) | 1/5/2010 | 2:13:09 | PM | 2 | V | 220 | V | 0 | Hz | 0 | % | 78 | % | 29 | C |
| 1190) | 1/5/2010 | 2:13:11 | PM | 2 | V | 220 | V | 0 | Hz | 0 | % | 78 | % | 29 | C |
| 1191) | 1/5/2010 | 2:13:13 | PM | 2 | V | 220 | V | 0 | Hz | 0 | % | 78 | % | 28 | C |
| 1192) | 1/5/2010 | 2:13:15 | PM | 2 | V | 220 | V | 0 | Hz | 0 | % | 78 | % | 29 | C |
| 1193) | 1/5/2010 | 2:13:17 | PM | 2 | V | 220 | V | 0 | Hz | 0 | % | 78 | % | 29 | C |
| 1194) | 1/5/2010 | 2:13:19 | PM | 2 | V | 220 | V | 0 | Hz | 0 | % | 78 | % | 29 | C |
| 1195) | 1/5/2010 | 2:13:22 | PM | 2 | V | 220 | V | 0 | Hz | 0 | % | 78 | % | 28 | C |
| 1196) | 1/5/2010 | 2:13:24 | PM | 2 | V | 220 | V | 0 | Hz | 0 | % | 78 | % | 28 | C |
| 1198) | 1/5/2010 | 2:13:28 | PM | 2 | V | 221 | V | 0 | Hz | 0 | % | 78 | % | 28 | C |
| 1199) | 1/5/2010 | 2:13:30 | PM | 2 | V | 221 | V | 0 | Hz | 0 | % | 78 | % | 28 | C |
| 1200) | 1/5/2010 | 2:13:32 | PM | 2 | V | 220 | V | 0 | Hz | 0 | % | 78 | % | 28 | C |
| 1201) | 1/5/2010 | 2:13:34 | PM | 2 | V | 220 | V | 0 | Hz | 0 | % | 78 | % | 28 | C |
| 1202) | 1/5/2010 | 2:13:36 | PM | 2 | V | 220 | V | 0 | Hz | 0 | % | 78 | % | 28 | C |
| 1203) | 1/5/2010 | 2:13:38 | PM | 2 | V | 220 | V | 0 | Hz | 0 | % | 78 | % | 28 | C |
| 1204) | 1/5/2010 | 2:13:40 | PM | 2 | V | 220 | V | 0 | Hz | 0 | % | 78 | % | 28 | C |
| 1205) | 1/5/2010 | 2:13:42 | PM | 2 | V | 220 | V | 0 | Hz | 0 | % | 78 | % | 28 | C |
| 1206) | 1/5/2010 | 2:13:44 | PM | 2 | V | 219 | V | 0 | Hz | 0 | % | 78 | % | 28 | C |

FIG. 6 - 42

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1207) | 1/5/2010 | 2:13:46 | PM | 2 | V | 220 | V | 0 | Hz | 0 | % | 78 | % | 28 | C |
| 1208) | 1/5/2010 | 2:13:48 | PM | 2 | V | 220 | V | 0 | Hz | 0 | % | 78 | % | 28 | C |
| 1209) | 1/5/2010 | 2:13:50 | PM | 2 | V | 220 | V | 0 | Hz | 0 | % | 78 | % | 28 | C |
| 1210) | 1/5/2010 | 2:13:53 | PM | 2 | V | 220 | V | 0 | Hz | 0 | % | 78 | % | 28 | C |
| 1211) | 1/5/2010 | 2:13:55 | PM | 2 | V | 220 | V | 0 | Hz | 0 | % | 78 | % | 28 | C |
| 1212) | 1/5/2010 | 2:13:57 | PM | 2 | V | 220 | V | 0 | Hz | 0 | % | 78 | % | 28 | C |
| 1213) | 1/5/2010 | 2:13:59 | PM | 2 | V | 221 | V | 0 | Hz | 0 | % | 78 | % | 28 | C |
| 1214) | 1/5/2010 | 2:14:01 | PM | 2 | V | 221 | V | 0 | Hz | 0 | % | 78 | % | 28 | C |
| 1215) | 1/5/2010 | 2:14:03 | PM | 2 | V | 221 | V | 0 | Hz | 0 | % | 78 | % | 28 | C |
| 1216) | 1/5/2010 | 2:14:05 | PM | 2 | V | 221 | V | 0 | Hz | 0 | % | 78 | % | 28 | C |
| 1217) | 1/5/2010 | 2:14:07 | PM | 2 | V | 220 | V | 0 | Hz | 0 | % | 78 | % | 28 | C |
| 1218) | 1/5/2010 | 2:14:09 | PM | 2 | V | 220 | V | 0 | Hz | 0 | % | 78 | % | 28 | C |
| 1219) | 1/5/2010 | 2:14:11 | PM | 2 | V | 220 | V | 0 | Hz | 0 | % | 78 | % | 28 | C |
| 1220) | 1/5/2010 | 2:14:13 | PM | 2 | V | 220 | V | 0 | Hz | 0 | % | 78 | % | 28 | C |
| 1221) | 1/5/2010 | 2:14:15 | PM | 2 | V | 220 | V | 0 | Hz | 0 | % | 78 | % | 28 | C |
| 1222) | 1/5/2010 | 2:14:17 | PM | 2 | V | 220 | V | 0 | Hz | 0 | % | 78 | % | 28 | C |
| 1223) | 1/5/2010 | 2:14:19 | PM | 2 | V | 220 | V | 0 | Hz | 0 | % | 78 | % | 28 | C |
| 1224) | 1/5/2010 | 2:14:21 | PM | 2 | V | 220 | V | 0 | Hz | 0 | % | 78 | % | 28 | C |
| 1225) | 1/5/2010 | 2:14:24 | PM | 2 | V | 220 | V | 0 | Hz | 0 | % | 78 | % | 28 | C |
| 1226) | 1/5/2010 | 2:14:26 | PM | 2 | V | 220 | V | 0 | Hz | 0 | % | 78 | % | 28 | C |
| 1227) | 1/5/2010 | 2:14:28 | PM | 2 | V | 220 | V | 0 | Hz | 0 | % | 78 | % | 28 | C |
| 1228) | 1/5/2010 | 2:14:30 | PM | 2 | V | 220 | V | 0 | Hz | 0 | % | 78 | % | 28 | C |
| 1229) | 1/5/2010 | 2:14:32 | PM | 2 | V | 220 | V | 0 | Hz | 0 | % | 78 | % | 28 | C |
| 1230) | 1/5/2010 | 2:14:34 | PM | 2 | V | 221 | V | 0 | Hz | 0 | % | 78 | % | 28 | C |
| 1231) | 1/5/2010 | 2:14:36 | PM | 2 | V | 221 | V | 0 | Hz | 0 | % | 78 | % | 28 | C |
| 1232) | 1/5/2010 | 2:14:38 | PM | 2 | V | 221 | V | 0 | Hz | 0 | % | 78 | % | 28 | C |
| 1233) | 1/5/2010 | 2:14:40 | PM | 2 | V | 220 | V | 0 | Hz | 0 | % | 78 | % | 28 | C |
| 1234) | 1/5/2010 | 2:14:42 | PM | 2 | V | 220 | V | 0 | Hz | 0 | % | 78 | % | 28 | C |

FIG. 6 - 43

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1235) | 1/5/2010 | 2:14:44 | PM | 2 | V | 220 | V | 0 | Hz | 0 | % | 78 | % | 28 | C |
| 1236) | 1/5/2010 | 2:14:46 | PM | 2 | V | 220 | V | 0 | Hz | 0 | % | 78 | % | 28 | C |
| 1238) | 1/5/2010 | 2:14:50 | PM | 2 | V | 220 | V | 0 | Hz | 0 | % | 78 | % | 28 | C |
| 1239) | 1/5/2010 | 2:14:52 | PM | 2 | V | 220 | V | 0 | Hz | 0 | % | 78 | % | 38 | C |
| 1240) | 1/5/2010 | 2:14:55 | PM | 2 | V | 220 | V | 0 | Hz | 0 | % | 78 | % | 28 | C |
| 1241) | 1/5/2010 | 2:14:57 | PM | 2 | V | 220 | V | 0 | Hz | 0 | % | 78 | % | 28 | C |
| 1242) | 1/5/2010 | 2:14:59 | PM | 2 | V | 220 | V | 0 | Hz | 0 | % | 78 | % | 28 | C |
| 1243) | 1/5/2010 | 2:15:01 | PM | 2 | V | 220 | V | 0 | Hz | 0 | % | 78 | % | 28 | C |
| 1244) | 1/5/2010 | 2:15:03 | PM | 2 | V | 220 | V | 0 | Hz | 0 | % | 78 | % | 28 | C |
| 1245) | 1/5/2010 | 2:15:05 | PM | 2 | V | 220 | V | 0 | Hz | 0 | % | 78 | % | 28 | C |
| 1246) | 1/5/2010 | 2:15:07 | PM | 2 | V | 221 | V | 0 | Hz | 0 | % | 78 | % | 28 | C |
| 1247) | 1/5/2010 | 2:15:09 | PM | 2 | V | 221 | V | 0 | Hz | 0 | % | 78 | % | 28 | C |
| 1248) | 1/5/2010 | 2:15:11 | PM | 2 | V | 221 | V | 0 | Hz | 0 | % | 78 | % | 28 | C |
| 1249) | 1/5/2010 | 2:15:13 | PM | 2 | V | 221 | V | 0 | Hz | 0 | % | 78 | % | 28 | C |
| 1250) | 1/5/2010 | 2:15:15 | PM | 2 | V | 220 | V | 0 | Hz | 0 | % | 78 | % | 28 | C |
| 1251) | 1/5/2010 | 2:15:17 | PM | 2 | V | 220 | V | 0 | Hz | 0 | % | 78 | % | 28 | C |
| 1252) | 1/5/2010 | 2:15:19 | PM | 2 | V | 220 | V | 0 | Hz | 0 | % | 78 | % | 28 | C |
| 1253) | 1/5/2010 | 2:15:21 | PM | 2 | V | 220 | V | 0 | Hz | 0 | % | 78 | % | 28 | C |
| 1254) | 1/5/2010 | 2:15:23 | PM | 2 | V | 220 | V | 0 | Hz | 0 | % | 78 | % | 28 | C |
| 1255) | 1/5/2010 | 2:15:26 | PM | 2 | V | 220 | V | 0 | Hz | 0 | % | 78 | % | 28 | C |
| 1256) | 1/5/2010 | 2:15:28 | PM | 2 | V | 220 | V | 0 | Hz | 0 | % | 78 | % | 28 | C |
| 1257) | 1/5/2010 | 2:15:30 | PM | 2 | V | 220 | V | 0 | Hz | 0 | % | 78 | % | 28 | C |
| 1258) | 1/5/2010 | 2:15:32 | PM | 2 | V | 220 | V | 0 | Hz | 0 | % | 78 | % | 28 | C |
| 1259) | 1/5/2010 | 2:15:34 | PM | 2 | V | 220 | V | 0 | Hz | 0 | % | 78 | % | 28 | C |
| 1260) | 1/5/2010 | 2:15:36 | PM | 2 | V | 220 | V | 0 | Hz | 0 | % | 78 | % | 28 | C |
| 1261) | 1/5/2010 | 2:15:38 | PM | 2 | V | 220 | V | 0 | Hz | 0 | % | 78 | % | 28 | C |
| 1262) | 1/5/2010 | 2:15:40 | PM | 2 | V | 220 | V | 0 | Hz | 0 | % | 78 | % | 28 | C |
| 1263) | 1/5/2010 | 2:15:42 | PM | 2 | V | 221 | V | 0 | Hz | 0 | % | 78 | % | 28 | C |

FIG. 6 - 44

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1264) | 1/5/2010 | 2:15:44 | PM | 2 | V | 221 | V | 0 | Hz | 0 | % | 78 | % | 28 | C |
| 1265) | 1/5/2010 | 2:15:46 | PM | 2 | V | 221 | V | 0 | Hz | 0 | % | 78 | % | 28 | C |
| 1266) | 1/5/2010 | 2:15:48 | PM | 2 | V | 221 | V | 0 | Hz | 0 | % | 78 | % | 28 | C |
| 1267) | 1/5/2010 | 2:15:50 | PM | 2 | V | 220 | V | 0 | Hz | 0 | % | 78 | % | 28 | C |
| 1268) | 1/5/2010 | 2:15:52 | PM | 2 | V | 220 | V | 0 | Hz | 0 | % | 78 | % | 28 | C |
| 1269) | 1/5/2010 | 2:15:54 | PM | 2 | V | 220 | V | 0 | Hz | 0 | % | 78 | % | 28 | C |
| 1270) | 1/5/2010 | 2:15:57 | PM | 2 | V | 220 | V | 0 | Hz | 0 | % | 78 | % | 28 | C |
| 1271) | 1/5/2010 | 2:15:59 | PM | 2 | V | 220 | V | 0 | Hz | 0 | % | 78 | % | 28 | C |
| 1272) | 1/5/2010 | 2:16:01 | PM | 2 | V | 220 | V | 0 | Hz | 0 | % | 78 | % | 28 | C |
| 1273) | 1/5/2010 | 2:16:03 | PM | 2 | V | 220 | V | 0 | Hz | 0 | % | 78 | % | 28 | C |
| 1274) | 1/5/2010 | 2:16:05 | PM | 2 | V | 220 | V | 0 | Hz | 0 | % | 78 | % | 28 | C |
| 1275) | 1/5/2010 | 2:16:07 | PM | 2 | V | 220 | V | 0 | Hz | 0 | % | 78 | % | 28 | C |
| 1276) | 1/5/2010 | 2:16:09 | PM | 2 | V | 220 | V | 0 | Hz | 0 | % | 78 | % | 28 | C |
| 1277) | 1/5/2010 | 2:16:11 | PM | 2 | V | 220 | V | 0 | Hz | 0 | % | 78 | % | 28 | C |
| 1278) | 1/5/2010 | 2:16:13 | PM | 2 | V | 220 | V | 0 | Hz | 0 | % | 78 | % | 28 | C |
| 1279) | 1/5/2010 | 2:16:15 | PM | 2 | V | 220 | V | 0 | Hz | 0 | % | 78 | % | 28 | C |
| 1280) | 1/5/2010 | 2:16:17 | PM | 2 | V | 221 | V | 0 | Hz | 0 | % | 78 | % | 28 | C |
| 1281) | 1/5/2010 | 2:16:19 | PM | 2 | V | 221 | V | 0 | Hz | 0 | % | 78 | % | 28 | C |
| 1282) | 1/5/2010 | 2:16:21 | PM | 2 | V | 220 | V | 0 | Hz | 0 | % | 78 | % | 28 | C |
| 1283) | 1/5/2010 | 2:16:23 | PM | 2 | V | 221 | V | 0 | Hz | 0 | % | 78 | % | 28 | C |
| 1284) | 1/5/2010 | 2:16:25 | PM | 2 | V | 220 | V | 0 | Hz | 0 | % | 65 | % | 28 | C |
| 1285) | 1/5/2010 | 2:16:28 | PM | 2 | V | 2 | V | 0 | Hz | 0 | % | 0 | % | 28 | C |
| 1286) | 1/5/2010 | 2:16:30 | PM | 2 | V | 2 | V | 0 | Hz | 0 | % | 0 | % | 29 | C |
| 1287) | 1/5/2010 | 2:16:32 | PM | 2 | V | 2 | V | 0 | Hz | 0 | % | 0 | % | 28 | C |
| 1288) | 1/5/2010 | 2:16:34 | PM | 2 | V | 2 | V | 0 | Hz | 0 | % | 0 | % | 29 | C |
| 1289) | 1/5/2010 | 2:16:36 | PM | 2 | V | 2 | V | 0 | Hz | 0 | % | 0 | % | 29 | C |
| 1290) | 1/5/2010 | 2:16:38 | PM | 2 | V | 2 | V | 0 | Hz | 0 | % | 0 | % | 29 | C |
| 1291) | 1/5/2010 | 2:16:40 | PM | 2 | V | 2 | V | 0 | Hz | 0 | % | 0 | % | 29 | C |

FIG. 6 - 45

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1292) | 1/5/2010 | 2:16:42 | PM | 2 | V | 2 | V | 0 | Hz | 0 | % | 0 | % | 29 | C |
| 1293) | 1/5/2010 | 2:16:44 | PM | 2 | V | 2 | V | 0 | Hz | 0 | % | 0 | % | 29 | C |
| 1294) | 1/5/2010 | 2:16:46 | PM | 2 | V | 2 | V | 0 | Hz | 0 | % | 0 | % | 29 | C |
| 1295) | 1/5/2010 | 2:16:48 | PM | 2 | V | 2 | V | 0 | Hz | 0 | % | 0 | % | 29 | C |
| 1296) | 1/5/2010 | 2:16:50 | PM | 2 | V | 2 | V | 0 | Hz | 0 | % | 0 | % | 29 | C |
| 1297) | 1/5/2010 | 2:16:52 | PM | 2 | V | 2 | V | 0 | Hz | 0 | % | 0 | % | 29 | C |
| 1298) | 1/5/2010 | 2:16:54 | PM | 2 | V | 2 | V | 0 | Hz | 0 | % | 0 | % | 29 | C |
| 1299) | 1/5/2010 | 2:16:56 | PM | 2 | V | 2 | V | 0 | Hz | 0 | % | 0 | % | 29 | C |
| 1) | 1/5/2010 | 2:30:57 | PM | 0 | V | 0 | V | 0 | Hz | 0 | % | 15 | % | 30 | C |
| 2) | 1/5/2010 | 2:30:59 | PM | 0 | V | 217 | V | 0 | Hz | 0 | % | 80 | % | 29 | C |
| 3) | 1/5/2010 | 2:31:00 | PM | 0 | V | 219 | V | 0 | Hz | 0 | % | 80 | % | 30 | C |
| 4) | 1/5/2010 | 2:31:01 | PM | 0 | V | 219 | V | 0 | Hz | 0 | % | 80 | % | 30 | C |
| 5) | 1/5/2010 | 2:31:02 | PM | 0 | V | 219 | V | 0 | Hz | 0 | % | 80 | % | 30 | C |
| 6) | 1/5/2010 | 2:31:03 | PM | 0 | V | 219 | V | 0 | Hz | 0 | % | 80 | % | 30 | C |
| 7) | 1/5/2010 | 2:31:04 | PM | 0 | V | 219 | V | 0 | Hz | 0 | % | 80 | % | 30 | C |
| 8) | 1/5/2010 | 2:31:05 | PM | 0 | V | 219 | V | 0 | Hz | 0 | % | 82 | % | 30 | C |
| 9) | 1/5/2010 | 2:31:06 | PM | 0 | V | 219 | V | 0 | Hz | 0 | % | 80 | % | 30 | C |
| 10) | 1/5/2010 | 2:31:07 | PM | 0 | V | 219 | V | 0 | Hz | 0 | % | 80 | % | 30 | C |
| 11) | 1/5/2010 | 2:31:08 | PM | 0 | V | 219 | V | 0 | Hz | 0 | % | 82 | % | 30 | C |
| 12) | 1/5/2010 | 2:31:09 | PM | 0 | V | 219 | V | 0 | Hz | 0 | % | 80 | % | 29 | C |
| 13) | 1/5/2010 | 2:31:10 | PM | 0 | V | 218 | V | 0 | Hz | 0 | % | 80 | % | 29 | C |
| 14) | 1/5/2010 | 2:31:11 | PM | 0 | V | 218 | V | 0 | Hz | 0 | % | 80 | % | 29 | C |
| 15) | 1/5/2010 | 2:31:12 | PM | 0 | V | 219 | V | 0 | Hz | 0 | % | 80 | % | 29 | C |
| 16) | 1/5/2010 | 2:31:13 | PM | 0 | V | 218 | V | 0 | Hz | 0 | % | 80 | % | 29 | C |
| 17) | 1/5/2010 | 2:31:14 | PM | 0 | V | 219 | V | 0 | Hz | 0 | % | 80 | % | 29 | C |
| 18) | 1/5/2010 | 2:31:15 | PM | 0 | V | 219 | V | 0 | Hz | 0 | % | 80 | % | 29 | C |
| 19) | 1/5/2010 | 2:31:16 | PM | 0 | V | 219 | V | 0 | Hz | 0 | % | 80 | % | 29 | C |
| 20) | 1/5/2010 | 2:31:17 | PM | 0 | V | 219 | V | 0 | Hz | 0 | % | 80 | % | 29 | C |

FIG. 6 - 46

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 21) | 1/5/2010 | 2:31:18 | PM | 0 | V | 219 | V | 0 | Hz | 0 | % | 80 | % | 29 | C |
| 22) | 1/5/2010 | 2:31:19 | PM | 0 | V | 218 | V | 0 | Hz | 0 | % | 80 | % | 29 | C |
| 23) | 1/5/2010 | 2:31:20 | PM | 0 | V | 219 | V | 0 | Hz | 0 | % | 80 | % | 29 | C |
| 24) | 1/5/2010 | 2:31:21 | PM | 0 | V | 218 | V | 0 | Hz | 0 | % | 80 | % | 29 | C |
| 25) | 1/5/2010 | 2:31:22 | PM | 0 | V | 218 | V | 0 | Hz | 0 | % | 80 | % | 29 | C |
| 26) | 1/5/2010 | 2:31:23 | PM | 0 | V | 218 | V | 0 | Hz | 0 | % | 80 | % | 29 | C |
| 27) | 1/5/2010 | 2:31:24 | PM | 0 | V | 218 | V | 0 | Hz | 0 | % | 80 | % | 29 | C |
| 28) | 1/5/2010 | 2:31:25 | PM | 0 | V | 218 | V | 0 | Hz | 0 | % | 80 | % | 29 | C |
| 29) | 1/5/2010 | 2:31:26 | PM | 0 | V | 218 | V | 0 | Hz | 0 | % | 80 | % | 29 | C |
| 30) | 1/5/2010 | 2:31:28 | PM | 2 | V | 208 | V | 0 | Hz | 128 | % | 72 | % | 28 | C |
| 31) | 1/5/2010 | 2:31:30 | PM | 2 | V | 220 | V | 0 | Hz | 13 | % | 78 | % | 29 | C |
| 32) | 1/5/2010 | 2:31:31 | PM | 2 | V | 222 | V | 0 | Hz | 11 | % | 78 | % | 29 | C |
| 33) | 1/5/2010 | 2:31:32 | PM | 2 | V | 220 | V | 0 | Hz | 12 | % | 78 | % | 29 | C |
| 34) | 1/5/2010 | 2:31:33 | PM | 2 | V | 220 | V | 0 | Hz | 12 | % | 78 | % | 29 | C |
| 35) | 1/5/2010 | 2:31:34 | PM | 2 | V | 220 | V | 0 | Hz | 12 | % | 78 | % | 29 | C |
| 36) | 1/5/2010 | 2:31:35 | PM | 2 | V | 220 | V | 0 | Hz | 12 | % | 78 | % | 29 | C |
| 37) | 1/5/2010 | 2:31:36 | PM | 2 | V | 220 | V | 0 | Hz | 12 | % | 78 | % | 29 | C |
| 38) | 1/5/2010 | 2:31:37 | PM | 2 | V | 220 | V | 0 | Hz | 12 | % | 78 | % | 29 | C |
| 39) | 1/5/2010 | 2:31:38 | PM | 2 | V | 220 | V | 0 | Hz | 11 | % | 78 | % | 29 | C |
| 40) | 1/5/2010 | 2:31:39 | PM | 2 | V | 220 | V | 0 | Hz | 11 | % | 78 | % | 29 | C |
| 41) | 1/5/2010 | 2:31:40 | PM | 2 | V | 220 | V | 0 | Hz | 11 | % | 78 | % | 29 | C |
| 42) | 1/5/2010 | 2:31:41 | PM | 2 | V | 221 | V | 0 | Hz | 11 | % | 78 | % | 29 | C |
| 43) | 1/5/2010 | 2:31:42 | PM | 2 | V | 221 | V | 0 | Hz | 10 | % | 78 | % | 29 | C |
| 44) | 1/5/2010 | 2:31:43 | PM | 2 | V | 221 | V | 0 | Hz | 10 | % | 78 | % | 29 | C |
| 45) | 1/5/2010 | 2:31:44 | PM | 2 | V | 219 | V | 0 | Hz | 36 | % | 78 | % | 29 | C |
| 46) | 1/5/2010 | 2:31:45 | PM | 2 | V | 219 | V | 0 | Hz | 36 | % | 78 | % | 29 | C |
| 47) | 1/5/2010 | 2:31:46 | PM | 2 | V | 218 | V | 0 | Hz | 36 | % | 78 | % | 29 | C |
| 48) | 1/5/2010 | 2:31:47 | PM | 2 | V | 218 | V | 0 | Hz | 36 | % | 78 | % | 29 | C |

FIG. 6 - 47

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 49) | 1/5/2010 | 2:31:48 | PM | 2 | V | 218 | V | 0 | Hz | 36 | % | 78 | % | 29 | C |
| 50) | 1/5/2010 | 2:31:49 | PM | 2 | V | 219 | V | 0 | Hz | 36 | % | 77 | % | 29 | C |
| 51) | 1/5/2010 | 2:31:50 | PM | 2 | V | 219 | V | 0 | Hz | 36 | % | 78 | % | 29 | C |
| 52) | 1/5/2010 | 2:31:51 | PM | 2 | V | 218 | V | 0 | Hz | 38 | % | 77 | % | 29 | C |
| 53) | 1/5/2010 | 2:31:52 | PM | 178 | V | 218 | V | 20 | Hz | 38 | % | 78 | % | 29 | C |
| 54) | 1/5/2010 | 2:31:53 | PM | 211 | V | 219 | V | 51 | Hz | 39 | % | 72 | % | 29 | C |
| 55) | 1/5/2010 | 2:31:54 | PM | 212 | V | 221 | V | 50 | Hz | 39 | % | 70 | % | 29 | C |
| 56) | 1/5/2010 | 2:31:55 | PM | 210 | V | 220 | V | 50 | Hz | 36 | % | 72 | % | 29 | C |
| 57) | 1/5/2010 | 2:31:56 | PM | 209 | V | 220 | V | 50 | Hz | 39 | % | 72 | % | 29 | C |
| 58) | 1/5/2010 | 2:31:57 | PM | 211 | V | 220 | V | 51 | Hz | 38 | % | 70 | % | 29 | C |
| 59) | 1/5/2010 | 2:31:59 | PM | 210 | V | 220 | V | 51 | Hz | 36 | % | 72 | % | 29 | C |
| 60) | 1/5/2010 | 2:32:01 | PM | 212 | V | 223 | V | 51 | Hz | 44 | % | 68 | % | 30 | C |
| 61) | 1/5/2010 | 2:32:02 | PM | 211 | V | 222 | V | 50 | Hz | 44 | % | 68 | % | 30 | C |
| 62) | 1/5/2010 | 2:32:03 | PM | 211 | V | 220 | V | 51 | Hz | 34 | % | 72 | % | 29 | C |
| 63) | 1/5/2010 | 2:32:04 | PM | 196 | V | 218 | V | 51 | Hz | 38 | % | 75 | % | 28 | C |
| 64) | 1/5/2010 | 2:32:05 | PM | 210 | V | 219 | V | 51 | Hz | 33 | % | 73 | % | 28 | C |
| 65) | 1/5/2010 | 2:32:06 | PM | 212 | V | 214 | V | 48 | Hz | 46 | % | 73 | % | 30 | C |
| 66) | 1/5/2010 | 2:32:07 | PM | 192 | V | 213 | V | 48 | Hz | 42 | % | 72 | % | 29 | C |
| 67) | 1/5/2010 | 2:32:08 | PM | 188 | V | 221 | V | 51 | Hz | 45 | % | 70 | % | 30 | C |
| 68) | 1/5/2010 | 2:32:09 | PM | 185 | V | 222 | V | 51 | Hz | 46 | % | 68 | % | 29 | C |
| 69) | 1/5/2010 | 2:32:10 | PM | 186 | V | 217 | V | 51 | Hz | 101 | % | 75 | % | 30 | C |
| 70) | 1/5/2010 | 2:32:11 | PM | 202 | V | 215 | V | 48 | Hz | 39 | % | 73 | % | 30 | C |
| 71) | 1/5/2010 | 2:32:12 | PM | 183 | V | 202 | V | 51 | Hz | 53 | % | 70 | % | 28 | C |
| 72) | 1/5/2010 | 2:32:13 | PM | 210 | V | 223 | V | 50 | Hz | 45 | % | 68 | % | 30 | C |
| 73) | 1/5/2010 | 2:32:14 | PM | 210 | V | 225 | V | 50 | Hz | 40 | % | 73 | % | 30 | C |
| 74) | 1/5/2010 | 2:32:15 | PM | 211 | V | 220 | V | 50 | Hz | 36 | % | 73 | % | 29 | C |
| 75) | 1/5/2010 | 2:32:16 | PM | 211 | V | 220 | V | 50 | Hz | 36 | % | 72 | % | 29 | C |
| 76) | 1/5/2010 | 2:32:17 | PM | 211 | V | 218 | V | 50 | Hz | 38 | % | 68 | % | 30 | C |

FIG. 6 - 48

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 77) | 1/5/2010 | 2:32:18 | PM | 210 | V | 220 | V | 51 | Hz | 36 | % | 70 | % | 29 | C |
| 78) | 1/5/2010 | 2:32:19 | PM | 214 | V | 219 | V | 52 | Hz | 87 | % | 70 | % | 29 | C |
| 79) | 1/5/2010 | 2:32:20 | PM | 196 | V | 204 | V | 50 | Hz | 88 | % | 65 | % | 30 | C |
| 80) | 1/5/2010 | 2:32:21 | PM | 203 | V | 208 | V | 48 | Hz | 48 | % | 65 | % | 28 | C |
| 81) | 1/5/2010 | 2:32:22 | PM | 190 | V | 213 | V | 48 | Hz | 49 | % | 65 | % | 29 | C |
| 82) | 1/5/2010 | 2:32:23 | PM | 190 | V | 216 | V | 52 | Hz | 47 | % | 58 | % | 28 | C |
| 83) | 1/5/2010 | 2:32:24 | PM | 2 | V | 225 | V | 0 | Hz | 0 | % | 78 | % | 29 | C |
| 84) | 1/5/2010 | 2:32:25 | PM | 2 | V | 222 | V | 0 | Hz | 0 | % | 78 | % | 29 | C |
| 85) | 1/5/2010 | 2:32:26 | PM | 2 | V | 220 | V | 0 | Hz | 0 | % | 78 | % | 29 | C |
| 86) | 1/5/2010 | 2:32:27 | PM | 2 | V | 220 | V | 0 | Hz | 0 | % | 78 | % | 29 | C |
| 87) | 1/5/2010 | 2:32:28 | PM | 2 | V | 220 | V | 0 | Hz | 0 | % | 78 | % | 29 | C |
| 88) | 1/5/2010 | 2:32:30 | PM | 2 | V | 220 | V | 0 | Hz | 0 | % | 78 | % | 29 | C |
| 89) | 1/5/2010 | 2:32:32 | PM | 2 | V | 220 | V | 0 | Hz | 0 | % | 78 | % | 29 | C |
| 1) | 1/5/2010 | 2:51:14 | PM | 2 | V | 220 | V | 0 | Hz | 0 | % | 78 | % | 28 | C |
| 2) | 1/5/2010 | 2:51:15 | PM | 2 | V | 220 | V | 0 | Hz | 0 | % | 78 | % | 28 | C |
| 3) | 1/5/2010 | 2:51:16 | PM | 2 | V | 220 | V | 0 | Hz | 0 | % | 78 | % | 28 | C |
| 4) | 1/5/2010 | 2:51:17 | PM | 2 | V | 220 | V | 0 | Hz | 0 | % | 78 | % | 28 | C |
| 5) | 1/5/2010 | 2:51:18 | PM | 2 | V | 220 | V | 0 | Hz | 0 | % | 78 | % | 28 | C |
| 6) | 1/5/2010 | 2:51:19 | PM | 2 | V | 220 | V | 0 | Hz | 0 | % | 78 | % | 28 | C |
| 7) | 1/5/2010 | 2:51:20 | PM | 2 | V | 220 | V | 0 | Hz | 0 | % | 78 | % | 28 | C |
| 8) | 1/5/2010 | 2:51:21 | PM | 2 | V | 220 | V | 0 | Hz | 0 | % | 78 | % | 28 | C |
| 9) | 1/5/2010 | 2:51:32 | PM | 2 | V | 220 | V | 0 | Hz | 0 | % | 78 | % | 28 | C |
| 10) | 1/5/2010 | 2:51:23 | PM | 2 | V | 221 | V | 0 | Hz | 0 | % | 78 | % | 28 | C |
| 11) | 1/5/2010 | 2:51:24 | PM | 2 | V | 221 | V | 0 | Hz | 0 | % | 78 | % | 28 | C |
| 12) | 1/5/2010 | 2:51:25 | PM | 2 | V | 221 | V | 0 | Hz | 0 | % | 78 | % | 28 | C |
| 13) | 1/5/2010 | 2:51:26 | PM | 2 | V | 221 | V | 0 | Hz | 0 | % | 78 | % | 28 | C |
| 14) | 1/5/2010 | 2:51:27 | PM | 2 | V | 221 | V | 0 | Hz | 0 | % | 78 | % | 28 | C |
| 15) | 1/5/2010 | 2:51:28 | PM | 2 | V | 221 | V | 0 | Hz | 0 | % | 78 | % | 28 | C |

FIG. 6 - 49

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 16) | 1/5/2010 | 2:51:29 | PM | 2 | V | 221 | V | 0 | Hz | 0 | % | 78 | % | 28 | C |
| 17) | 1/5/2010 | 2:51:30 | PM | 2 | V | 221 | V | 0 | Hz | 0 | % | 78 | % | 28 | C |
| 18) | 1/5/2010 | 2:51:31 | PM | 2 | V | 220 | V | 0 | Hz | 0 | % | 78 | % | 28 | C |
| 19) | 1/5/2010 | 2:51:32 | PM | 2 | V | 220 | V | 0 | Hz | 0 | % | 78 | % | 28 | C |
| 20) | 1/5/2010 | 2:51:33 | PM | 2 | V | 220 | V | 0 | Hz | 0 | % | 78 | % | 28 | C |
| 21) | 1/5/2010 | 2:51:34 | PM | 2 | V | 220 | V | 0 | Hz | 0 | % | 78 | % | 28 | C |
| 22) | 1/5/2010 | 2:51:35 | PM | 2 | V | 220 | V | 0 | Hz | 0 | % | 78 | % | 28 | C |
| 23) | 1/5/2010 | 2:51:36 | PM | 2 | V | 220 | V | 0 | Hz | 0 | % | 78 | % | 28 | C |
| 24) | 1/5/2010 | 2:51:37 | PM | 2 | V | 220 | V | 0 | Hz | 0 | % | 78 | % | 28 | C |
| 25) | 1/5/2010 | 2:51:39 | PM | 2 | V | 220 | V | 0 | Hz | 0 | % | 78 | % | 28 | C |
| 26) | 1/5/2010 | 2:51:41 | PM | 2 | V | 220 | V | 0 | Hz | 0 | % | 78 | % | 28 | C |
| 27) | 1/5/2010 | 2:51:42 | PM | 2 | V | 220 | V | 0 | Hz | 0 | % | 78 | % | 28 | C |
| 28) | 1/5/2010 | 2:51:43 | PM | 2 | V | 220 | V | 0 | Hz | 0 | % | 78 | % | 28 | C |
| 29) | 1/5/2010 | 2:51:44 | PM | 2 | V | 220 | V | 0 | Hz | 0 | % | 78 | % | 28 | C |
| 30) | 1/5/2010 | 2:51:45 | PM | 2 | V | 220 | V | 0 | Hz | 0 | % | 78 | % | 28 | C |
| 31) | 1/5/2010 | 2:51:46 | PM | 2 | V | 220 | V | 0 | Hz | 0 | % | 78 | % | 28 | C |
| 32) | 1/5/2010 | 2:51:47 | PM | 2 | V | 220 | V | 0 | Hz | 0 | % | 78 | % | 28 | C |
| 33) | 1/5/2010 | 2:51:48 | PM | 2 | V | 220 | V | 0 | Hz | 0 | % | 78 | % | 28 | C |
| 34) | 1/5/2010 | 2:51:49 | PM | 2 | V | 220 | V | 0 | Hz | 0 | % | 78 | % | 28 | C |
| 35) | 1/5/2010 | 2:51:51 | PM | 2 | V | 220 | V | 0 | Hz | 0 | % | 78 | % | 28 | C |
| 36) | 1/5/2010 | 2:51:52 | PM | 2 | V | 220 | V | 0 | Hz | 0 | % | 78 | % | 28 | C |
| 38) | 1/5/2010 | 2:51:54 | PM | 2 | V | 220 | V | 0 | Hz | 0 | % | 78 | % | 28 | C |
| 39) | 1/5/2010 | 2:51:55 | PM | 2 | V | 220 | V | 0 | Hz | 0 | % | 78 | % | 28 | C |
| 40) | 1/5/2010 | 2:51:56 | PM | 2 | V | 220 | V | 0 | Hz | 0 | % | 78 | % | 28 | C |
| 41) | 1/5/2010 | 2:51:57 | PM | 2 | V | 220 | V | 0 | Hz | 0 | % | 78 | % | 28 | C |
| 42) | 1/5/2010 | 2:51:58 | PM | 2 | V | 221 | V | 0 | Hz | 0 | % | 78 | % | 28 | C |
| 43) | 1/5/2010 | 2:51:59 | PM | 2 | V | 221 | V | 0 | Hz | 0 | % | 78 | % | 28 | C |
| 44) | 1/5/2010 | 2:52:00 | PM | 2 | V | 221 | V | 0 | Hz | 0 | % | 78 | % | 28 | C |

FIG. 6 - 50

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 45) | 1/5/2010 | 2:52:01 | PM | 2 | V | 221 | V | 0 | Hz | 0 | % | 78 | % | 28 | C |
| 46) | 1/5/2010 | 2:52:02 | PM | 2 | V | 221 | V | 0 | Hz | 0 | % | 78 | % | 28 | C |
| 47) | 1/5/2010 | 2:52:03 | PM | 2 | V | 221 | V | 0 | Hz | 0 | % | 78 | % | 28 | C |
| 48) | 1/5/2010 | 2:52:04 | PM | 2 | V | 221 | V | 0 | Hz | 0 | % | 78 | % | 28 | C |
| 49) | 1/5/2010 | 2:52:05 | PM | 2 | V | 221 | V | 0 | Hz | 0 | % | 78 | % | 28 | C |
| 50) | 1/5/2010 | 2:52:06 | PM | 2 | V | 220 | V | 0 | Hz | 0 | % | 78 | % | 28 | C |
| 51) | 1/5/2010 | 2:52:07 | PM | 2 | V | 220 | V | 0 | Hz | 0 | % | 78 | % | 28 | C |
| 52) | 1/5/2010 | 2:52:08 | PM | 2 | V | 220 | V | 0 | Hz | 0 | % | 78 | % | 28 | C |
| 53) | 1/5/2010 | 2:52:09 | PM | 2 | V | 220 | V | 0 | Hz | 0 | % | 78 | % | 28 | C |
| 54) | 1/5/2010 | 2:52:11 | PM | 2 | V | 220 | V | 0 | Hz | 0 | % | 78 | % | 28 | C |
| 55) | 1/5/2010 | 2:52:13 | PM | 2 | V | 220 | V | 0 | Hz | 0 | % | 78 | % | 28 | C |
| 56) | 1/5/2010 | 2:52:14 | PM | 2 | V | 220 | V | 0 | Hz | 0 | % | 78 | % | 28 | C |
| 57) | 1/5/2010 | 2:52:15 | PM | 2 | V | 220 | V | 0 | Hz | 0 | % | 78 | % | 28 | C |
| 58) | 1/5/2010 | 2:52:16 | PM | 2 | V | 219 | V | 0 | Hz | 0 | % | 78 | % | 28 | C |
| 59) | 1/5/2010 | 2:52:17 | PM | 2 | V | 220 | V | 0 | Hz | 0 | % | 78 | % | 28 | C |
| 60) | 1/5/2010 | 2:52:18 | PM | 2 | V | 219 | V | 0 | Hz | 0 | % | 78 | % | 28 | C |
| 61) | 1/5/2010 | 2:52:19 | PM | 2 | V | 220 | V | 0 | Hz | 0 | % | 78 | % | 28 | C |
| 62) | 1/5/2010 | 2:52:20 | PM | 2 | V | 220 | V | 0 | Hz | 0 | % | 78 | % | 28 | C |
| 63) | 1/5/2010 | 2:52:21 | PM | 2 | V | 220 | V | 0 | Hz | 0 | % | 78 | % | 28 | C |
| 64) | 1/5/2010 | 2:52:22 | PM | 2 | V | 220 | V | 0 | Hz | 0 | % | 78 | % | 28 | C |
| 65) | 1/5/2010 | 2:52:23 | PM | 2 | V | 220 | V | 0 | Hz | 0 | % | 78 | % | 28 | C |
| 66) | 1/5/2010 | 2:52:24 | PM | 2 | V | 220 | V | 0 | Hz | 0 | % | 78 | % | 28 | C |
| 67) | 1/5/2010 | 2:52:25 | PM | 2 | V | 220 | V | 0 | Hz | 0 | % | 78 | % | 28 | C |
| 68) | 1/5/2010 | 2:52:26 | PM | 2 | V | 220 | V | 0 | Hz | 0 | % | 78 | % | 28 | C |
| 69) | 1/5/2010 | 2:52:27 | PM | 2 | V | 220 | V | 0 | Hz | 0 | % | 78 | % | 28 | C |
| 70) | 1/5/2010 | 2:52:28 | PM | 2 | V | 220 | V | 0 | Hz | 0 | % | 78 | % | 28 | C |
| 71) | 1/5/2010 | 2:52:29 | PM | 2 | V | 220 | V | 0 | Hz | 0 | % | 78 | % | 28 | C |
| 72) | 1/5/2010 | 2:52:30 | PM | 2 | V | 220 | V | 0 | Hz | 0 | % | 78 | % | 28 | C |

FIG. 6 - 51

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 73) | 1/5/2010 | 2:52:31 | PM | 2 | V | 220 | V | 0 | Hz | 0 | % | 78 | % | 28 | C |
| 74) | 1/5/2010 | 2:52:32 | PM | 2 | V | 220 | V | 0 | Hz | 0 | % | 78 | % | 28 | C |
| 75) | 1/5/2010 | 2:52:33 | PM | 2 | V | 221 | V | 0 | Hz | 0 | % | 78 | % | 28 | C |
| 76) | 1/5/2010 | 2:52:34 | PM | 2 | V | 221 | V | 0 | Hz | 0 | % | 78 | % | 28 | C |
| 78) | 1/5/2010 | 2:52:36 | PM | 2 | V | 221 | V | 0 | Hz | 0 | % | 78 | % | 28 | C |
| 79) | 1/5/2010 | 2:52:37 | PM | 2 | V | 221 | V | 0 | Hz | 0 | % | 78 | % | 28 | C |
| 80) | 1/5/2010 | 2:52:38 | PM | 2 | V | 221 | V | 0 | Hz | 0 | % | 78 | % | 28 | C |
| 81) | 1/5/2010 | 2:52:39 | PM | 2 | V | 221 | V | 0 | Hz | 0 | % | 78 | % | 28 | C |
| 82) | 1/5/2010 | 2:52:40 | PM | 2 | V | 221 | V | 0 | Hz | 0 | % | 78 | % | 28 | C |
| 83) | 1/5/2010 | 2:52:42 | PM | 2 | V | 220 | V | 0 | Hz | 0 | % | 78 | % | 28 | C |
| 84) | 1/5/2010 | 2:52:44 | PM | 2 | V | 220 | V | 0 | Hz | 0 | % | 78 | % | 28 | C |
| 85) | 1/5/2010 | 2:52:45 | PM | 2 | V | 220 | V | 0 | Hz | 0 | % | 78 | % | 28 | C |
| 86) | 1/5/2010 | 2:52:46 | PM | 2 | V | 220 | V | 0 | Hz | 0 | % | 78 | % | 28 | C |
| 87) | 1/5/2010 | 2:52:47 | PM | 2 | V | 220 | V | 0 | Hz | 0 | % | 78 | % | 28 | C |
| 88) | 1/5/2010 | 2:52:48 | PM | 2 | V | 220 | V | 0 | Hz | 0 | % | 78 | % | 28 | C |
| 89) | 1/5/2010 | 2:52:49 | PM | 2 | V | 220 | V | 0 | Hz | 0 | % | 78 | % | 28 | C |
| 90) | 1/5/2010 | 2:52:50 | PM | 2 | V | 220 | V | 0 | Hz | 0 | % | 78 | % | 28 | C |
| 91) | 1/5/2010 | 2:52:51 | PM | 2 | V | 220 | V | 0 | Hz | 0 | % | 78 | % | 28 | C |
| 92) | 1/5/2010 | 2:52:52 | PM | 2 | V | 220 | V | 0 | Hz | 0 | % | 78 | % | 28 | C |
| 93) | 1/5/2010 | 2:52:53 | PM | 2 | V | 220 | V | 0 | Hz | 0 | % | 78 | % | 28 | C |
| 94) | 1/5/2010 | 2:52:54 | PM | 2 | V | 220 | V | 0 | Hz | 0 | % | 78 | % | 28 | C |
| 95) | 1/5/2010 | 2:52:55 | PM | 2 | V | 220 | V | 0 | Hz | 0 | % | 78 | % | 28 | C |
| 96) | 1/5/2010 | 2:52:56 | PM | 2 | V | 220 | V | 0 | Hz | 0 | % | 78 | % | 28 | C |
| 97) | 1/5/2010 | 2:52:57 | PM | 2 | V | 220 | V | 0 | Hz | 0 | % | 78 | % | 28 | C |
| 98) | 1/5/2010 | 2:52:58 | PM | 2 | V | 220 | V | 0 | Hz | 0 | % | 78 | % | 28 | C |
| 99) | 1/5/2010 | 2:52:59 | PM | 2 | V | 220 | V | 0 | Hz | 0 | % | 78 | % | 28 | C |
| 100) | 1/5/2010 | 2:53:00 | PM | 2 | V | 220 | V | 0 | Hz | 0 | % | 78 | % | 28 | C |
| 101) | 1/5/2010 | 2:53:01 | PM | 2 | V | 220 | V | 0 | Hz | 0 | % | 78 | % | 28 | C |

FIG. 6 - 52

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 102) | 1/5/2010 | 2:53:02 | PM | 2 | V | 220 | V | 0 | Hz | 0 | % | 78 | % | 28 | C |
| 103) | 1/5/2010 | 2:53:03 | PM | 2 | V | 220 | V | 0 | Hz | 0 | % | 78 | % | 28 | C |
| 104) | 1/5/2010 | 2:53:04 | PM | 2 | V | 220 | V | 0 | Hz | 0 | % | 78 | % | 28 | C |
| 105) | 1/5/2010 | 2:53:05 | PM | 2 | V | 220 | V | 0 | Hz | 0 | % | 78 | % | 28 | C |
| 106) | 1/5/2010 | 2:53:06 | PM | 2 | V | 220 | V | 0 | Hz | 0 | % | 78 | % | 28 | C |
| 107) | 1/5/2010 | 2:53:07 | PM | 2 | V | 220 | V | 0 | Hz | 0 | % | 78 | % | 28 | C |
| 108) | 1/5/2010 | 2:53:08 | PM | 2 | V | 220 | V | 0 | Hz | 0 | % | 78 | % | 28 | C |
| 109) | 1/5/2010 | 2:53:09 | PM | 2 | V | 221 | V | 0 | Hz | 0 | % | 78 | % | 28 | C |
| 110) | 1/5/2010 | 2:53:10 | PM | 2 | V | 221 | V | 0 | Hz | 0 | % | 78 | % | 28 | C |
| 111) | 1/5/2010 | 2:53:11 | PM | 2 | V | 221 | V | 0 | Hz | 0 | % | 78 | % | 28 | C |
| 112) | 1/5/2010 | 2:53:13 | PM | 2 | V | 221 | V | 0 | Hz | 0 | % | 78 | % | 28 | C |
| 113) | 1/5/2010 | 2:53:15 | PM | 2 | V | 221 | V | 0 | Hz | 0 | % | 78 | % | 28 | C |
| 114) | 1/5/2010 | 2:53:16 | PM | 2 | V | 221 | V | 0 | Hz | 0 | % | 78 | % | 28 | C |
| 115) | 1/5/2010 | 2:53:17 | PM | 2 | V | 221 | V | 0 | Hz | 0 | % | 78 | % | 28 | C |
| 116) | 1/5/2010 | 2:53:18 | PM | 2 | V | 220 | V | 0 | Hz | 0 | % | 78 | % | 28 | C |
| 118) | 1/5/2010 | 2:53:20 | PM | 2 | V | 220 | V | 0 | Hz | 0 | % | 78 | % | 28 | C |
| 119) | 1/5/2010 | 2:53:21 | PM | 2 | V | 220 | V | 0 | Hz | 0 | % | 78 | % | 28 | C |
| 120) | 1/5/2010 | 2:53:22 | PM | 2 | V | 220 | V | 0 | Hz | 0 | % | 78 | % | 28 | C |
| 121) | 1/5/2010 | 2:53:23 | PM | 2 | V | 221 | V | 0 | Hz | 0 | % | 78 | % | 28 | C |
| 122) | 1/5/2010 | 2:53:24 | PM | 2 | V | 220 | V | 0 | Hz | 0 | % | 78 | % | 28 | C |
| 123) | 1/5/2010 | 2:53:25 | PM | 2 | V | 220 | V | 0 | Hz | 0 | % | 78 | % | 28 | C |
| 124) | 1/5/2010 | 2:53:26 | PM | 2 | V | 220 | V | 0 | Hz | 0 | % | 78 | % | 28 | C |
| 125) | 1/5/2010 | 2:53:27 | PM | 2 | V | 220 | V | 0 | Hz | 0 | % | 78 | % | 28 | C |
| 126) | 1/5/2010 | 2:53:28 | PM | 2 | V | 220 | V | 0 | Hz | 0 | % | 78 | % | 28 | C |
| 127) | 1/5/2010 | 2:53:29 | PM | 2 | V | 219 | V | 0 | Hz | 0 | % | 78 | % | 28 | C |
| 128) | 1/5/2010 | 2:53:30 | PM | 2 | V | 220 | V | 0 | Hz | 0 | % | 78 | % | 28 | C |
| 129) | 1/5/2010 | 2:53:31 | PM | 2 | V | 220 | V | 0 | Hz | 0 | % | 78 | % | 28 | C |
| 130) | 1/5/2010 | 2:53:32 | PM | 2 | V | 220 | V | 0 | Hz | 0 | % | 78 | % | 28 | C |

FIG. 6 - 53

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 131) | 1/5/2010 | 2:53:33 | PM | 2 | V | 219 | V | 0 | Hz | 0 | % | 78 | % | 28 | C |
| 132) | 1/5/2010 | 2:53:34 | PM | 2 | V | 220 | V | 0 | Hz | 0 | % | 78 | % | 28 | C |
| 133) | 1/5/2010 | 2:53:35 | PM | 2 | V | 220 | V | 0 | Hz | 0 | % | 78 | % | 28 | C |
| 134) | 1/5/2010 | 2:53:36 | PM | 2 | V | 220 | V | 0 | Hz | 0 | % | 78 | % | 28 | C |
| 135) | 1/5/2010 | 2:53:37 | PM | 2 | V | 220 | V | 0 | Hz | 0 | % | 78 | % | 28 | C |
| 136) | 1/5/2010 | 2:53:38 | PM | 2 | V | 220 | V | 0 | Hz | 0 | % | 78 | % | 28 | C |
| 137) | 1/5/2010 | 2:53:39 | PM | 2 | V | 220 | V | 0 | Hz | 0 | % | 78 | % | 28 | C |
| 138) | 1/5/2010 | 2:53:40 | PM | 2 | V | 220 | V | 0 | Hz | 0 | % | 78 | % | 28 | C |
| 139) | 1/5/2010 | 2:53:41 | PM | 2 | V | 220 | V | 0 | Hz | 0 | % | 78 | % | 28 | C |
| 140) | 1/5/2010 | 2:53:42 | PM | 2 | V | 220 | V | 0 | Hz | 0 | % | 78 | % | 28 | C |
| 141) | 1/5/2010 | 2:53:44 | PM | 2 | V | 221 | V | 0 | Hz | 0 | % | 78 | % | 28 | C |
| 142) | 1/5/2010 | 2:53:46 | PM | 2 | V | 221 | V | 0 | Hz | 0 | % | 78 | % | 28 | C |
| 143) | 1/5/2010 | 2:53:47 | PM | 2 | V | 221 | V | 0 | Hz | 0 | % | 78 | % | 28 | C |
| 144) | 1/5/2010 | 2:53:48 | PM | 2 | V | 221 | V | 0 | Hz | 0 | % | 78 | % | 28 | C |
| 145) | 1/5/2010 | 2:53:49 | PM | 2 | V | 221 | V | 0 | Hz | 0 | % | 78 | % | 28 | C |
| 146) | 1/5/2010 | 2:53:50 | PM | 2 | V | 221 | V | 0 | Hz | 0 | % | 78 | % | 28 | C |
| 147) | 1/5/2010 | 2:53:51 | PM | 2 | V | 221 | V | 0 | Hz | 0 | % | 78 | % | 28 | C |
| 148) | 1/5/2010 | 2:53:52 | PM | 2 | V | 221 | V | 0 | Hz | 0 | % | 78 | % | 28 | C |
| 149) | 1/5/2010 | 2:53:53 | PM | 2 | V | 220 | V | 0 | Hz | 0 | % | 78 | % | 28 | C |
| 150) | 1/5/2010 | 2:53:54 | PM | 2 | V | 220 | V | 0 | Hz | 0 | % | 78 | % | 28 | C |
| 151) | 1/5/2010 | 2:53:55 | PM | 2 | V | 220 | V | 0 | Hz | 0 | % | 78 | % | 28 | C |
| 152) | 1/5/2010 | 2:53:56 | PM | 2 | V | 220 | V | 0 | Hz | 0 | % | 78 | % | 28 | C |
| 153) | 1/5/2010 | 2:53:57 | PM | 2 | V | 220 | V | 0 | Hz | 0 | % | 78 | % | 28 | C |
| 154) | 1/5/2010 | 2:53:58 | PM | 2 | V | 220 | V | 0 | Hz | 0 | % | 78 | % | 28 | C |
| 155) | 1/5/2010 | 2:53:59 | PM | 2 | V | 220 | V | 0 | Hz | 0 | % | 78 | % | 28 | C |
| 156) | 1/5/2010 | 2:54:00 | PM | 2 | V | 220 | V | 0 | Hz | 0 | % | 78 | % | 28 | C |
| 158) | 1/5/2010 | 2:54:02 | PM | 2 | V | 220 | V | 0 | Hz | 0 | % | 78 | % | 28 | C |
| 159) | 1/5/2010 | 2:54:03 | PM | 2 | V | 220 | V | 0 | Hz | 0 | % | 78 | % | 28 | C |

FIG. 6 - 54

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 160) | 1/5/2010 | 2:54:04 | PM | 2 | V | 220 | V | 0 | Hz | 0 | % | 78 | % | 28 | C |
| 161) | 1/5/2010 | 2:54 | PM | 2 | V | 220 | V | 0 | Hz | 0 | % | 80 | % | 28 | C |
| 162) | 1/5/2010 | 2:54:06 | PM | 2 | V | 220 | V | 0 | Hz | 0 | % | 78 | % | 28 | C |
| 163) | 1/5/2010 | 2:54:07 | PM | 2 | V | 220 | V | 0 | Hz | 0 | % | 78 | % | 28 | C |
| 164) | 1/5/2010 | 2:54:08 | PM | 2 | V | 220 | V | 0 | Hz | 0 | % | 78 | % | 28 | C |
| 165) | 1/5/2010 | 2:54:09 | PM | 2 | V | 220 | V | 0 | Hz | 0 | % | 78 | % | 28 | C |
| 166) | 1/5/2010 | 2:54 | PM | 2 | V | 220 | V | 0 | Hz | 0 | % | 78 | % | 28 | C |
| 167) | 1/5/2010 | 2:54:11 | PM | 2 | V | 220 | V | 0 | Hz | 0 | % | 78 | % | 28 | C |
| 168) | 1/5/2010 | 2:54:12 | PM | 2 | V | 220 | V | 0 | Hz | 0 | % | 78 | % | 28 | C |
| 169) | 1/5/2010 | 2:54:13 | PM | 2 | V | 220 | V | 0 | Hz | 0 | % | 78 | % | 28 | C |
| 170) | 1/5/2010 | 2:54 | PM | 2 | V | 220 | V | 0 | Hz | 0 | % | 78 | % | 28 | C |
| 171) | 1/5/2010 | 2:54:17 | PM | 2 | V | 220 | V | 0 | Hz | 0 | % | 78 | % | 28 | C |
| 172) | 1/5/2010 | 2:54:18 | PM | 2 | V | 220 | V | 0 | Hz | 0 | % | 78 | % | 28 | C |
| 173) | 1/5/2010 | 2:54:19 | PM | 2 | V | 221 | V | 0 | Hz | 0 | % | 78 | % | 28 | C |
| 174) | 1/5/2010 | 2:54 | PM | 2 | V | 221 | V | 0 | Hz | 0 | % | 78 | % | 28 | C |
| 175) | 1/5/2010 | 2:54:21 | PM | 2 | V | 221 | V | 0 | Hz | 0 | % | 78 | % | 28 | C |
| 176) | 1/5/2010 | 2:54:22 | PM | 2 | V | 221 | V | 0 | Hz | 0 | % | 78 | % | 28 | C |
| 177) | 1/5/2010 | 2:54:23 | PM | 2 | V | 221 | V | 0 | Hz | 0 | % | 78 | % | 28 | C |
| 178) | 1/5/2010 | 2:54:24 | PM | 2 | V | 221 | V | 0 | Hz | 0 | % | 78 | % | 28 | C |
| 179) | 1/5/2010 | 2:54 | PM | 2 | V | 220 | V | 0 | Hz | 0 | % | 78 | % | 28 | C |
| 180) | 1/5/2010 | 2:54:26 | PM | 2 | V | 221 | V | 0 | Hz | 0 | % | 78 | % | 28 | C |
| 181) | 1/5/2010 | 2:54:27 | PM | 2 | V | 220 | V | 0 | Hz | 0 | % | 78 | % | 28 | C |
| 182) | 1/5/2010 | 2:54:28 | PM | 2 | V | 220 | V | 0 | Hz | 0 | % | 78 | % | 28 | C |
| 183) | 1/5/2010 | 2:54:29 | PM | 2 | V | 220 | V | 0 | Hz | 0 | % | 78 | % | 28 | C |
| 184) | 1/5/2010 | 2:54 | PM | 2 | V | 220 | V | 0 | Hz | 0 | % | 78 | % | 28 | C |
| 185) | 1/5/2010 | 2:54:31 | PM | 2 | V | 220 | V | 0 | Hz | 0 | % | 78 | % | 28 | C |
| 186) | 1/5/2010 | 2:54:32 | PM | 2 | V | 220 | V | 0 | Hz | 0 | % | 78 | % | 28 | C |
| 187) | 1/5/2010 | 2:54:33 | PM | 2 | V | 220 | V | 0 | Hz | 0 | % | 78 | % | 28 | C |

FIG. 6 - 55

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 188) | 1/5/2010 | 2:54:34 | PM | 2 | V | 220 | V | 0 | Hz | 0 | % | 78 | % | 28 | C |
| 189) | 1/5/2010 | 2:54 | PM | 2 | V | 220 | V | 0 | Hz | 0 | % | 78 | % | 28 | C |
| 190) | 1/5/2010 | 2:54:36 | PM | 2 | V | 220 | V | 0 | Hz | 0 | % | 78 | % | 28 | C |
| 191) | 1/5/2010 | 2:54:37 | PM | 2 | V | 220 | V | 0 | Hz | 0 | % | 78 | % | 27 | C |
| 192) | 1/5/2010 | 2:54:38 | PM | 2 | V | 220 | V | 0 | Hz | 0 | % | 78 | % | 28 | C |
| 193) | 1/5/2010 | 2:54:39 | PM | 2 | V | 220 | V | 0 | Hz | 0 | % | 78 | % | 28 | C |
| 194) | 1/5/2010 | 2:54 | PM | 2 | V | 219 | V | 0 | Hz | 0 | % | 78 | % | 28 | C |
| 195) | 1/5/2010 | 2:54:41 | PM | 2 | V | 220 | V | 0 | Hz | 0 | % | 78 | % | 28 | C |
| 196) | 1/5/2010 | 2:54:42 | PM | 2 | V | 220 | V | 0 | Hz | 0 | % | 78 | % | 28 | C |
| 198) | 1/5/2010 | 2:54:44 | PM | 2 | V | 220 | V | 0 | Hz | 0 | % | 78 | % | 28 | C |
| 199) | 1/5/2010 | 2:54:46 | PM | 2 | V | 220 | V | 0 | Hz | 0 | % | 78 | % | 28 | C |
| 200) | 1/5/2010 | 2:54:48 | PM | 2 | V | 220 | V | 0 | Hz | 0 | % | 78 | % | 28 | C |
| 201) | 1/5/2010 | 2:54:49 | PM | 2 | V | 220 | V | 0 | Hz | 0 | % | 78 | % | 28 | C |
| 202) | 1/5/2010 | 2:54:50 | PM | 2 | V | 220 | V | 0 | Hz | 0 | % | 78 | % | 28 | C |
| 203) | 1/5/2010 | 2:54:51 | PM | 2 | V | 220 | V | 0 | Hz | 0 | % | 78 | % | 28 | C |
| 204) | 1/5/2010 | 2:54:52 | PM | 2 | V | 220 | V | 0 | Hz | 0 | % | 78 | % | 28 | C |
| 205) | 1/5/2010 | 2:54:53 | PM | 2 | V | 220 | V | 0 | Hz | 0 | % | 78 | % | 28 | C |
| 206) | 1/5/2010 | 2:54:54 | PM | 2 | V | 221 | V | 0 | Hz | 0 | % | 78 | % | 28 | C |
| 207) | 1/5/2010 | 2:54:55 | PM | 2 | V | 221 | V | 0 | Hz | 0 | % | 78 | % | 28 | C |
| 208) | 1/5/2010 | 2:54:56 | PM | 2 | V | 221 | V | 0 | Hz | 0 | % | 78 | % | 28 | C |
| 209) | 1/5/2010 | 2:54:57 | PM | 2 | V | 221 | V | 0 | Hz | 0 | % | 78 | % | 28 | C |
| 210) | 1/5/2010 | 2:54:58 | PM | 2 | V | 221 | V | 0 | Hz | 0 | % | 78 | % | 28 | C |
| 211) | 1/5/2010 | 2:54:59 | PM | 2 | V | 221 | V | 0 | Hz | 0 | % | 78 | % | 28 | C |
| 212) | 1/5/2010 | 2:55:00 | PM | 2 | V | 221 | V | 0 | Hz | 0 | % | 78 | % | 28 | C |
| 213) | 1/5/2010 | 2:55:01 | PM | 2 | V | 221 | V | 0 | Hz | 0 | % | 78 | % | 28 | C |
| 214) | 1/5/2010 | 2:55:02 | PM | 2 | V | 221 | V | 0 | Hz | 0 | % | 78 | % | 28 | C |
| 215) | 1/5/2010 | 2:55:03 | PM | 2 | V | 220 | V | 0 | Hz | 0 | % | 78 | % | 28 | C |
| 216) | 1/5/2010 | 2:55:04 | PM | 2 | V | 220 | V | 0 | Hz | 0 | % | 78 | % | 28 | C |

FIG. 6 - 56

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 217) | 1/5/2010 | 2:55:05 | PM | 2 | V | 220 | V | 0 | Hz | 0 | % | 78 | % | 28 | C |
| 218) | 1/5/2010 | 2:55:06 | PM | 2 | V | 220 | V | 0 | Hz | 0 | % | 78 | % | 28 | C |
| 219) | 1/5/2010 | 2:55:07 | PM | 2 | V | 220 | V | 0 | Hz | 0 | % | 78 | % | 28 | C |
| 220) | 1/5/2010 | 2:55:08 | PM | 2 | V | 220 | V | 0 | Hz | 0 | % | 78 | % | 28 | C |
| 221) | 1/5/2010 | 2:55:09 | PM | 2 | V | 220 | V | 0 | Hz | 0 | % | 78 | % | 28 | C |
| 222) | 1/5/2010 | 2:55:10 | PM | 2 | V | 220 | V | 0 | Hz | 0 | % | 78 | % | 28 | C |
| 223) | 1/5/2010 | 2:55:11 | PM | 2 | V | 220 | V | 0 | Hz | 0 | % | 78 | % | 28 | C |
| 224) | 1/5/2010 | 2:55:12 | PM | 2 | V | 219 | V | 0 | Hz | 0 | % | 78 | % | 28 | C |
| 225) | 1/5/2010 | 2:55:13 | PM | 2 | V | 220 | V | 0 | Hz | 0 | % | 78 | % | 28 | C |
| 226) | 1/5/2010 | 2:55:14 | PM | 2 | V | 220 | V | 0 | Hz | 0 | % | 78 | % | 28 | C |
| 227) | 1/5/2010 | 2:55:15 | PM | 2 | V | 220 | V | 0 | Hz | 0 | % | 78 | % | 28 | C |
| 228) | 1/5/2010 | 2:55:17 | PM | 2 | V | 220 | V | 0 | Hz | 0 | % | 78 | % | 28 | C |
| 229) | 1/5/2010 | 2:55:19 | PM | 2 | V | 220 | V | 0 | Hz | 0 | % | 78 | % | 27 | C |
| 230) | 1/5/2010 | 2:55:20 | PM | 2 | V | 220 | V | 0 | Hz | 0 | % | 78 | % | 28 | C |
| 231) | 1/5/2010 | 2:55:21 | PM | 2 | V | 220 | V | 0 | Hz | 0 | % | 78 | % | 28 | C |
| 232) | 1/5/2010 | 2:55:22 | PM | 2 | V | 220 | V | 0 | Hz | 0 | % | 78 | % | 28 | C |
| 233) | 1/5/2010 | 2:55:23 | PM | 2 | V | 220 | V | 0 | Hz | 0 | % | 78 | % | 28 | C |
| 234) | 1/5/2010 | 2:55:24 | PM | 2 | V | 220 | V | 0 | Hz | 0 | % | 78 | % | 28 | C |
| 235) | 1/5/2010 | 2:55:25 | PM | 2 | V | 220 | V | 0 | Hz | 0 | % | 78 | % | 28 | C |
| 236) | 1/5/2010 | 2:55:26 | PM | 2 | V | 220 | V | 0 | Hz | 0 | % | 78 | % | 28 | C |
| 238) | 1/5/2010 | 2:55:28 | PM | 2 | V | 220 | V | 0 | Hz | 0 | % | 78 | % | 28 | C |
| 239) | 1/5/2010 | 2:55:29 | PM | 2 | V | 220 | V | 0 | Hz | 0 | % | 78 | % | 28 | C |
| 240) | 1/5/2010 | 2:55:30 | PM | 2 | V | 221 | V | 0 | Hz | 0 | % | 78 | % | 28 | C |
| 241) | 1/5/2010 | 2:55:31 | PM | 2 | V | 221 | V | 0 | Hz | 0 | % | 78 | % | 28 | C |
| 242) | 1/5/2010 | 2:55:32 | PM | 2 | V | 221 | V | 0 | Hz | 0 | % | 78 | % | 28 | C |
| 243) | 1/5/2010 | 2:55:33 | PM | 2 | V | 221 | V | 0 | Hz | 0 | % | 78 | % | 28 | C |
| 244) | 1/5/2010 | 2:55:34 | PM | 2 | V | 221 | V | 0 | Hz | 0 | % | 78 | % | 28 | C |
| 245) | 1/5/2010 | 2:55:35 | PM | 2 | V | 221 | V | 0 | Hz | 0 | % | 78 | % | 28 | C |

FIG. 6 - 57

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 246) | 1/5/2010 | 2:55:36 | PM | 2 | V | 221 | V | 0 | Hz | 0 | % | 78 | % | 28 | C |
| 247) | 1/5/2010 | 2:55:37 | PM | 2 | V | 220 | V | 0 | Hz | 0 | % | 78 | % | 28 | C |
| 248) | 1/5/2010 | 2:55:38 | PM | 2 | V | 2 | V | 0 | Hz | 0 | % | 72 | % | 28 | C |
| 249) | 1/5/2010 | 2:55:39 | PM | 2 | V | 2 | V | 0 | Hz | 0 | % | 70 | % | 28 | C |
| 250) | 1/5/2010 | 2:55:40 | PM | 2 | V | 2 | V | 0 | Hz | 0 | % | 68 | % | 28 | C |
| 251) | 1/5/2010 | 2:55:41 | PM | 2 | V | 2 | V | 0 | Hz | 0 | % | 62 | % | 28 | C |
| 252) | 1/5/2010 | 2:55:42 | PM | 2 | V | 2 | V | 0 | Hz | 0 | % | 62 | % | 28 | C |
| 253) | 1/5/2010 | 2:55:43 | PM | 2 | V | 2 | V | 0 | Hz | 0 | % | 58 | % | 28 | C |
| 254) | 1/5/2010 | 2:55:44 | PM | 2 | V | 2 | V | 0 | Hz | 0 | % | 55 | % | 28 | C |
| 255) | 1/5/2010 | 2:55:45 | PM | 2 | V | 2 | V | 0 | Hz | 0 | % | 53 | % | 28 | C |
| 256) | 1/5/2010 | 2:55:47 | PM | 2 | V | 2 | V | 0 | Hz | 0 | % | 48 | % | 28 | C |
| 257) | 1/5/2010 | 2:55:49 | PM | 2 | V | 2 | V | 0 | Hz | 0 | % | 42 | % | 28 | C |
| 258) | 1/5/2010 | 2:55:51 | PM | 2 | V | 2 | V | 0 | Hz | 0 | % | 33 | % | 28 | C |
| 259) | 1/5/2010 | 2:55:52 | PM | 2 | V | 2 | V | 0 | Hz | 0 | % | 32 | % | 28 | C |
| 260) | 1/5/2010 | 2:55:53 | PM | 2 | V | 2 | V | 0 | Hz | 0 | % | 27 | % | 28 | C |
| 261) | 1/5/2010 | 2:55:54 | PM | 2 | V | 2 | V | 0 | Hz | 0 | % | 25 | % | 28 | C |
| 262) | 1/5/2010 | 2:55:55 | PM | 2 | V | 2 | V | 0 | Hz | 0 | % | 22 | % | 28 | C |
| 263) | 1/5/2010 | 2:55:56 | PM | 2 | V | 2 | V | 0 | Hz | 0 | % | 17 | % | 28 | C |
| 264) | 1/5/2010 | 2:55:57 | PM | 2 | V | 2 | V | 0 | Hz | 0 | % | 13 | % | 28 | C |
| 265) | 1/5/2010 | 2:55:58 | PM | 2 | V | 2 | V | 0 | Hz | 0 | % | 12 | % | 28 | C |
| 266) | 1/5/2010 | 2:55:59 | PM | 2 | V | 2 | V | 0 | Hz | 0 | % | 7 | % | 28 | C |
| 267) | 1/5/2010 | 2:56:00 | PM | 2 | V | 2 | V | 0 | Hz | 0 | % | 0 | % | 28 | C |
| 268) | 1/5/2010 | 2:56:01 | PM | 2 | V | 2 | V | 0 | Hz | 0 | % | 0 | % | 28 | C |
| 269) | 1/5/2010 | 2:56:02 | PM | 2 | V | 2 | V | 0 | Hz | 0 | % | 0 | % | 28 | C |
| 270) | 1/5/2010 | 2:56:03 | PM | 2 | V | 2 | V | 0 | Hz | 0 | % | 0 | % | 28 | C |
| 271) | 1/5/2010 | 2:56:04 | PM | 2 | V | 2 | V | 0 | Hz | 0 | % | 0 | % | 28 | C |
| 272) | 1/5/2010 | 2:56:05 | PM | 2 | V | 2 | V | 0 | Hz | 0 | % | 0 | % | 28 | C |
| 273) | 1/5/2010 | 2:56:06 | PM | 2 | V | 2 | V | 0 | Hz | 0 | % | 0 | % | 28 | C |

FIG. 6 - 58

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 274) | 1/5/2010 | 2:56:07 | PM | 2 | V | 2 | V | 0 | Hz | 0 | % | 0 | % | 28 | C |
| 275) | 1/5/2010 | 2:56:08 | PM | 2 | V | 2 | V | 0 | Hz | 0 | % | 0 | % | 28 | C |
| 276) | 1/5/2010 | 2:56:09 | PM | 2 | V | 2 | V | 0 | Hz | 0 | % | 0 | % | 28 | C |
| 278) | 1/5/2010 | 2:56:11 | PM | 2 | V | 2 | V | 0 | Hz | 0 | % | 0 | % | 28 | C |
| 279) | 1/5/2010 | 2:56:12 | PM | 2 | V | 2 | V | 0 | Hz | 0 | % | 0 | % | 28 | C |
| 280) | 1/5/2010 | 2:56:13 | PM | 2 | V | 2 | V | 0 | Hz | 0 | % | 0 | % | 28 | C |
| 281) | 1/5/2010 | 2:56:14 | PM | 2 | V | 2 | V | 0 | Hz | 0 | % | 0 | % | 28 | C |
| 282) | 1/5/2010 | 2:56:15 | PM | 2 | V | 2 | V | 0 | Hz | 0 | % | 0 | % | 28 | C |
| 283) | 1/5/2010 | 2:56:16 | PM | 2 | V | 2 | V | 0 | Hz | 0 | % | 0 | % | 28 | C |
| 284) | 1/5/2010 | 2:56:17 | PM | 2 | V | 2 | V | 0 | Hz | 0 | % | 0 | % | 28 | C |
| 285) | 1/5/2010 | 2:56:18 | PM | 2 | V | 2 | V | 0 | Hz | 0 | % | 0 | % | 28 | C |
| 286) | 1/5/2010 | 2:56:20 | PM | 2 | V | 2 | V | 0 | Hz | 0 | % | 0 | % | 28 | C |
| 287) | 1/5/2010 | 2:56:22 | PM | 2 | V | 2 | V | 0 | Hz | 0 | % | 0 | % | 28 | C |
| 288) | 1/5/2010 | 2:56:23 | PM | 2 | V | 2 | V | 0 | Hz | 0 | % | 0 | % | 28 | C |
| 289) | 1/5/2010 | 2:56:24 | PM | 2 | V | 2 | V | 0 | Hz | 0 | % | 0 | % | 28 | C |
| 290) | 1/5/2010 | 2:56:25 | PM | 2 | V | 2 | V | 0 | Hz | 0 | % | 0 | % | 28 | C |
| 291) | 1/5/2010 | 2:56:26 | PM | 2 | V | 2 | V | 0 | Hz | 0 | % | 0 | % | 28 | C |
| 292) | 1/5/2010 | 2:56:27 | PM | 2 | V | 2 | V | 0 | Hz | 0 | % | 0 | % | 28 | C |
| 293) | 1/5/2010 | 2:56:28 | PM | 2 | V | 2 | V | 0 | Hz | 0 | % | 0 | % | 28 | C |
| 294) | 1/5/2010 | 2:56:29 | PM | 2 | V | 2 | V | 0 | Hz | 0 | % | 0 | % | 28 | C |
| 295) | 1/5/2010 | 2:56:30 | PM | 2 | V | 2 | V | 0 | Hz | 0 | % | 0 | % | 28 | C |
| 296) | 1/5/2010 | 2:56:31 | PM | 2 | V | 2 | V | 0 | Hz | 0 | % | 0 | % | 28 | C |
| 297) | 1/5/2010 | 2:56:32 | PM | 2 | V | 2 | V | 0 | Hz | 0 | % | 0 | % | 28 | C |
| 298) | 1/5/2010 | 2:56:33 | PM | 2 | V | 2 | V | 0 | Hz | 0 | % | 0 | % | 28 | C |
| 299) | 1/5/2010 | 2:59:18 | PM | 0 | V | 0 | V | 0 | Hz | 0 | % | 0 | % | 28 | C |
| 300) | 1/5/2010 | 2:59:20 | PM | 0 | V | 0 | V | 0 | Hz | 0 | % | 0 | % | 28 | C |
| 301) | 1/5/2010 | 2:59:21 | PM | 0 | V | 0 | V | 0 | Hz | 0 | % | 0 | % | 28 | C |
| 302) | 1/5/2010 | 2:59:22 | PM | 0 | V | 0 | V | 0 | Hz | 0 | % | 0 | % | 28 | C |

FIG. 6 - 59

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 303) | 1/5/2010 | 2:59:23 | PM | 0 | V | 0 | V | 0 | Hz | 0 | % | 0 | % | 28 | C |
| 304) | 1/5/2010 | 2:59:24 | PM | 0 | V | 0 | V | 0 | Hz | 0 | % | 0 | % | 28 | C |
| 305) | 1/5/2010 | 2:59:25 | PM | 0 | V | 0 | V | 0 | Hz | 0 | % | 0 | % | 28 | C |
| 306) | 1/5/2010 | 2:59:26 | PM | 0 | V | 0 | V | 0 | Hz | 0 | % | 0 | % | 28 | C |
| 307) | 1/5/2010 | 2:59:27 | PM | 0 | V | 0 | V | 0 | Hz | 0 | % | 0 | % | 28 | C |
| 308) | 1/5/2010 | 2:59:28 | PM | 0 | V | 0 | V | 0 | Hz | 0 | % | 0 | % | 28 | C |
| 309) | 1/5/2010 | 2:59:29 | PM | 0 | V | 0 | V | 0 | Hz | 0 | % | 0 | % | 28 | C |
| 310) | 1/5/2010 | 2:59:30 | PM | 0 | V | 0 | V | 0 | Hz | 0 | % | 0 | % | 28 | C |
| 311) | 1/5/2010 | 2:59:31 | PM | 202 | V | 202 | V | 46 | Hz | 0 | % | 0 | % | 28 | C |
| 312) | 1/5/2010 | 2:59:32 | PM | 207 | V | 207 | V | 50 | Hz | 0 | % | 0 | % | 28 | C |
| 313) | 1/5/2010 | 2:59:33 | PM | 206 | V | 206 | V | 50 | Hz | 0 | % | 7 | % | 28 | C |
| 314) | 1/5/2010 | 2:59:34 | PM | 206 | V | 206 | V | 50 | Hz | 0 | % | 22 | % | 28 | C |
| 315) | 1/5/2010 | 2:59:35 | PM | 207 | V | 206 | V | 50 | Hz | 0 | % | 45 | % | 28 | C |
| 316) | 1/5/2010 | 2:59:36 | PM | 206 | V | 206 | V | 50 | Hz | 0 | % | 50 | % | 28 | C |
| 318) | 1/5/2010 | 2:59:38 | PM | 204 | V | 204 | V | 50 | Hz | 0 | % | 55 | % | 28 | C |
| 319) | 1/5/2010 | 2:59:39 | PM | 203 | V | 203 | V | 50 | Hz | 0 | % | 58 | % | 28 | C |
| 320) | 1/5/2010 | 2:59:40 | PM | 203 | V | 203 | V | 50 | Hz | 0 | % | 62 | % | 28 | C |
| 321) | 1/5/2010 | 2:59:41 | PM | 204 | V | 204 | V | 50 | Hz | 0 | % | 62 | % | 28 | C |
| 322) | 1/5/2010 | 2:59:42 | PM | 117 | V | 117 | V | 0 | Hz | 0 | % | 62 | % | 28 | C |
| 323) | 1/5/2010 | 2:59:43 | PM | 2 | V | 2 | V | 0 | Hz | 0 | % | 62 | % | 28 | C |
| 324) | 1/5/2010 | 2:59:44 | PM | 2 | V | 2 | V | 0 | Hz | 0 | % | 55 | % | 28 | C |
| 325) | 1/5/2010 | 2:59:45 | PM | 2 | V | 2 | V | 0 | Hz | 0 | % | 53 | % | 28 | C |
| 326) | 1/5/2010 | 2:59:46 | PM | 2 | V | 2 | V | 0 | Hz | 0 | % | 48 | % | 28 | C |
| 327) | 1/5/2010 | 2:59:47 | PM | 2 | V | 2 | V | 0 | Hz | 0 | % | 45 | % | 28 | C |
| 328) | 1/5/2010 | 2:59:51 | PM | 2 | V | 2 | V | 0 | Hz | 0 | % | 32 | % | 28 | C |
| 329) | 1/5/2010 | 2:59:52 | PM | 2 | V | 2 | V | 0 | Hz | 0 | % | 25 | % | 28 | C |
| 330) | 1/5/2010 | 2:59:53 | PM | 2 | V | 2 | V | 0 | Hz | 0 | % | 20 | % | 28 | C |
| 331) | 1/5/2010 | 2:59:54 | PM | 2 | V | 2 | V | 0 | Hz | 0 | % | 17 | % | 28 | C |

FIG. 6 - 60

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 332) | 1/5/2010 | 2:59:55 | PM | 2 | V | 2 | V | 0 | Hz | 0 | % | 15 | % | 28 | C |
| 333) | 1/5/2010 | 2:59:56 | PM | 2 | V | 2 | V | 0 | Hz | 0 | % | 12 | % | 28 | C |
| 334) | 1/5/2010 | 2:59:57 | PM | 2 | V | 2 | V | 0 | Hz | 0 | % | 8 | % | 28 | C |
| 335) | 1/5/2010 | 2:59:58 | PM | 2 | V | 2 | V | 0 | Hz | 0 | % | 0 | % | 28 | C |
| 336) | 1/5/2010 | 2:59:59 | PM | 2 | V | 2 | V | 0 | Hz | 0 | % | 0 | % | 28 | C |
| 337) | 1/5/2010 | 3:00:00 | PM | 2 | V | 2 | V | 0 | Hz | 0 | % | 0 | % | 28 | C |
| 338) | 1/5/2010 | 3:00:01 | PM | 2 | V | 2 | V | 0 | Hz | 0 | % | 0 | % | 28 | C |
| 339) | 1/5/2010 | 3:00:02 | PM | 2 | V | 2 | V | 0 | Hz | 0 | % | 0 | % | 28 | C |
| 340) | 1/5/2010 | 3:00:03 | PM | 2 | V | 2 | V | 0 | Hz | 0 | % | 0 | % | 28 | C |
| 341) | 1/5/2010 | 3:00:04 | PM | 2 | V | 2 | V | 0 | Hz | 0 | % | 0 | % | 28 | C |
| 342) | 1/5/2010 | 3:00:05 | PM | 2 | V | 2 | V | 0 | Hz | 0 | % | 0 | % | 28 | C |
| 343) | 1/5/2010 | 3:00:06 | PM | 2 | V | 2 | V | 0 | Hz | 0 | % | 0 | % | 28 | C |
| 344) | 1/5/2010 | 3:00:07 | PM | 2 | V | 2 | V | 0 | Hz | 0 | % | 0 | % | 28 | C |
| 345) | 1/5/2010 | 3:00:08 | PM | 2 | V | 2 | V | 0 | Hz | 0 | % | 0 | % | 28 | C |
| 346) | 1/5/2010 | 3:00:09 | PM | 2 | V | 2 | V | 0 | Hz | 0 | % | 0 | % | 28 | C |
| 347) | 1/5/2010 | 3:00:10 | PM | 2 | V | 2 | V | 0 | Hz | 0 | % | 0 | % | 28 | C |
| 348) | 1/5/2010 | 3:00:11 | PM | 2 | V | 2 | V | 0 | Hz | 0 | % | 0 | % | 28 | C |
| 349) | 1/5/2010 | 3:00:12 | PM | 2 | V | 2 | V | 0 | Hz | 0 | % | 0 | % | 28 | C |
| 350) | 1/5/2010 | 3:00:13 | PM | 2 | V | 2 | V | 0 | Hz | 0 | % | 0 | % | 28 | C |
| 351) | 1/5/2010 | 3:00:14 | PM | 2 | V | 2 | V | 0 | Hz | 0 | % | 0 | % | 28 | C |
| 352) | 1/5/2010 | 3:00:15 | PM | 2 | V | 2 | V | 0 | Hz | 0 | % | 0 | % | 28 | C |
| 353) | 1/5/2010 | 3:00:16 | PM | 2 | V | 2 | V | 0 | Hz | 0 | % | 0 | % | 28 | C |
| 354) | 1/5/2010 | 3:00:17 | PM | 2 | V | 2 | V | 0 | Hz | 0 | % | 0 | % | 28 | C |
| 355) | 1/5/2010 | 3:00:18 | PM | 2 | V | 2 | V | 0 | Hz | 0 | % | 0 | % | 28 | C |
| 356) | 1/5/2010 | 3:00:20 | PM | 2 | V | 2 | V | 0 | Hz | 0 | % | 0 | % | 28 | C |
| 358) | 1/5/2010 | 3:00:23 | PM | 2 | V | 2 | V | 0 | Hz | 0 | % | 0 | % | 28 | C |
| 359) | 1/5/2010 | 3:00:24 | PM | 2 | V | 2 | V | 0 | Hz | 0 | % | 0 | % | 28 | C |
| 360) | 1/5/2010 | 3:00:25 | PM | 2 | V | 2 | V | 0 | Hz | 0 | % | 0 | % | 28 | C |

FIG. 6 - 61

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 361) | 1/5/2010 | 3:00:26 | PM | 2 | V | 2 | V | 0 | Hz | 0 | % | 0 | % | 28 | C |
| 362) | 1/5/2010 | 3:00:27 | PM | 2 | V | 2 | V | 0 | Hz | 0 | % | 0 | % | 28 | C |
| 363) | 1/5/2010 | 3:00:28 | PM | 2 | V | 2 | V | 0 | Hz | 0 | % | 0 | % | 28 | C |
| 364) | 1/5/2010 | 3:00:29 | PM | 2 | V | 2 | V | 0 | Hz | 0 | % | 0 | % | 28 | C |
| 365) | 1/5/2010 | 3:00:30 | PM | 2 | V | 2 | V | 0 | Hz | 0 | % | 0 | % | 28 | C |
| 366) | 1/5/2010 | 3:00:31 | PM | 2 | V | 2 | V | 0 | Hz | 0 | % | 0 | % | 28 | C |
| 367) | 1/5/2010 | 3:00:32 | PM | 2 | V | 2 | V | 0 | Hz | 0 | % | 0 | % | 28 | C |
| 368) | 1/5/2010 | 3:00:33 | PM | 2 | V | 2 | V | 0 | Hz | 0 | % | 0 | % | 28 | C |
| 369) | 1/5/2010 | 3:00:34 | PM | 2 | V | 2 | V | 0 | Hz | 0 | % | 0 | % | 28 | C |
| 370) | 1/5/2010 | 3:00:35 | PM | 2 | V | 2 | V | 0 | Hz | 0 | % | 0 | % | 28 | C |
| 371) | 1/5/2010 | 3:00:36 | PM | 2 | V | 2 | V | 0 | Hz | 0 | % | 0 | % | 28 | C |
| 372) | 1/5/2010 | 3:00:37 | PM | 2 | V | 2 | V | 0 | Hz | 0 | % | 0 | % | 28 | C |
| 373) | 1/5/2010 | 3:00:38 | PM | 2 | V | 2 | V | 0 | Hz | 0 | % | 0 | % | 28 | C |
| 374) | 1/5/2010 | 3:00:39 | PM | 2 | V | 2 | V | 0 | Hz | 0 | % | 0 | % | 28 | C |
| 375) | 1/5/2010 | 3:00:40 | PM | 2 | V | 2 | V | 0 | Hz | 0 | % | 0 | % | 28 | C |
| 376) | 1/5/2010 | 3:00:41 | PM | 2 | V | 2 | V | 0 | Hz | 0 | % | 0 | % | 28 | C |
| 377) | 1/5/2010 | 3:00:42 | PM | 2 | V | 2 | V | 0 | Hz | 0 | % | 0 | % | 28 | C |
| 378) | 1/5/2010 | 3:00:43 | PM | 2 | V | 2 | V | 0 | Hz | 0 | % | 0 | % | 28 | C |
| 379) | 1/5/2010 | 3:00:44 | PM | 2 | V | 2 | V | 0 | Hz | 0 | % | 0 | % | 28 | C |
| 380) | 1/5/2010 | 3:00:45 | PM | 2 | V | 2 | V | 0 | Hz | 0 | % | 0 | % | 28 | C |
| 381) | 1/5/2010 | 3:00:46 | PM | 2 | V | 2 | V | 0 | Hz | 0 | % | 0 | % | 28 | C |
| 382) | 1/5/2010 | 3:00:47 | PM | 2 | V | 2 | V | 0 | Hz | 0 | % | 0 | % | 28 | C |
| 383) | 1/5/2010 | 3:00:48 | PM | 2 | V | 2 | V | 0 | Hz | 0 | % | 0 | % | 28 | C |
| 384) | 1/5/2010 | 3:00:49 | PM | 2 | V | 2 | V | 0 | Hz | 0 | % | 0 | % | 28 | C |
| 385) | 1/5/2010 | 3:00:51 | PM | 2 | V | 2 | V | 0 | Hz | 0 | % | 0 | % | 28 | C |
| 386) | 1/5/2010 | 3:00:53 | PM | 2 | V | 2 | V | 0 | Hz | 0 | % | 0 | % | 28 | C |
| 387) | 1/5/2010 | 3:00:54 | PM | 2 | V | 2 | V | 0 | Hz | 0 | % | 0 | % | 28 | C |
| 388) | 1/5/2010 | 3:00:55 | PM | 2 | V | 2 | V | 0 | Hz | 0 | % | 0 | % | 28 | C |

FIG. 6 - 62

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 389) | 1/5/2010 | 3:00:56 | PM | 2 | V | 2 | V | 0 | Hz | 0 | % | 0 | % | 28 | C |
| 390) | 1/5/2010 | 3:00:57 | PM | 2 | V | 2 | V | 0 | Hz | 0 | % | 0 | % | 28 | C |
| 391) | 1/5/2010 | 3:00:58 | PM | 2 | V | 2 | V | 0 | Hz | 0 | % | 0 | % | 28 | C |
| 392) | 1/5/2010 | 3:00:59 | PM | 2 | V | 2 | V | 0 | Hz | 0 | % | 0 | % | 28 | C |
| 393) | 1/5/2010 | 3:01:00 | PM | 2 | V | 2 | V | 0 | Hz | 0 | % | 0 | % | 28 | C |
| 394) | 1/5/2010 | 3:01:01 | PM | 2 | V | 2 | V | 0 | Hz | 0 | % | 0 | % | 28 | C |
| 395) | 1/5/2010 | 3:01:02 | PM | 2 | V | 2 | V | 0 | Hz | 0 | % | 0 | % | 28 | C |
| 396) | 1/5/2010 | 3:01:03 | PM | 2 | V | 2 | V | 0 | Hz | 0 | % | 0 | % | 28 | C |
| 398) | 1/5/2010 | 3:01:05 | PM | 2 | V | 2 | V | 0 | Hz | 0 | % | 0 | % | 28 | C |
| 399) | 1/5/2010 | 3:01:06 | PM | 2 | V | 2 | V | 0 | Hz | 0 | % | 0 | % | 28 | C |
| 400) | 1/5/2010 | 3:01:07 | PM | 2 | V | 2 | V | 0 | Hz | 0 | % | 0 | % | 28 | C |
| 401) | 1/5/2010 | 3:01:08 | PM | 2 | V | 2 | V | 0 | Hz | 0 | % | 0 | % | 28 | C |
| 402) | 1/5/2010 | 3:01:09 | PM | 2 | V | 2 | V | 0 | Hz | 0 | % | 0 | % | 28 | C |
| 403) | 1/5/2010 | 3:01:10 | PM | 2 | V | 2 | V | 0 | Hz | 0 | % | 0 | % | 28 | C |
| 404) | 1/5/2010 | 3:01:11 | PM | 2 | V | 2 | V | 0 | Hz | 0 | % | 0 | % | 28 | C |
| 405) | 1/5/2010 | 3:01:12 | PM | 2 | V | 2 | V | 0 | Hz | 0 | % | 0 | % | 28 | C |
| 406) | 1/5/2010 | 3:01:13 | PM | 2 | V | 2 | V | 0 | Hz | 0 | % | 0 | % | 28 | C |
| 407) | 1/5/2010 | 3:01:14 | PM | 2 | V | 2 | V | 0 | Hz | 0 | % | 0 | % | 28 | C |
| 408) | 1/5/2010 | 3:01:15 | PM | 2 | V | 2 | V | 0 | Hz | 0 | % | 0 | % | 28 | C |
| 409) | 1/5/2010 | 3:01:16 | PM | 2 | V | 2 | V | 0 | Hz | 0 | % | 0 | % | 28 | C |
| 410) | 1/5/2010 | 3:01:17 | PM | 2 | V | 2 | V | 0 | Hz | 0 | % | 0 | % | 28 | C |
| 411) | 1/5/2010 | 3:01:18 | PM | 2 | V | 2 | V | 0 | Hz | 0 | % | 0 | % | 28 | C |
| 412) | 1/5/2010 | 3:01:19 | PM | 2 | V | 2 | V | 0 | Hz | 0 | % | 0 | % | 29 | C |
| 413) | 1/5/2010 | 3:01:20 | PM | 2 | V | 2 | V | 0 | Hz | 0 | % | 0 | % | 28 | C |
| 414) | 1/5/2010 | 3:08:18 | PM | 0 | V | 0 | V | 0 | Hz | 0 | % | 0 | % | 28 | C |
| 415) | 1/5/2010 | 3:08:20 | PM | 0 | V | 0 | V | 0 | Hz | 0 | % | 0 | % | 29 | C |
| 416) | 1/5/2010 | 3:08:21 | PM | 0 | V | 0 | V | 0 | Hz | 0 | % | 0 | % | 29 | C |
| 417) | 1/5/2010 | 3:08:22 | PM | 0 | V | 0 | V | 0 | Hz | 0 | % | 0 | % | 28 | C |

FIG. 6 - 63

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 418) | 1/5/2010 | 3:08:24 | PM | 0 | V | 0 | V | 0 | Hz | 0 | % | 0 | % | 29 | C |
| 419) | 1/5/2010 | 3:08:25 | PM | 211 | V | 211 | V | 50 | Hz | 0 | % | 0 | % | 29 | C |
| 420) | 1/5/2010 | 3:08:26 | PM | 208 | V | 208 | V | 50 | Hz | 0 | % | 23 | % | 29 | C |
| 421) | 1/5/2010 | 3:08:27 | PM | 211 | V | 211 | V | 50 | Hz | 0 | % | 42 | % | 29 | C |
| 422) | 1/5/2010 | 3:08:28 | PM | 210 | V | 210 | V | 50 | Hz | 0 | % | 47 | % | 29 | C |
| 423) | 1/5/2010 | 3:08:29 | PM | 210 | V | 210 | V | 50 | Hz | 0 | % | 50 | % | 29 | C |
| 424) | 1/5/2010 | 3:08:30 | PM | 210 | V | 210 | V | 50 | Hz | 0 | % | 53 | % | 29 | C |
| 425) | 1/5/2010 | 3:08:31 | PM | 211 | V | 211 | V | 50 | Hz | 0 | % | 58 | % | 29 | C |
| 426) | 1/5/2010 | 3:08:35 | PM | 210 | V | 210 | V | 50 | Hz | 0 | % | 58 | % | 29 | C |
| 427) | 1/5/2010 | 3:08:36 | PM | 206 | V | 206 | V | 50 | Hz | 0 | % | 65 | % | 29 | C |
| 428) | 1/5/2010 | 3:08:37 | PM | 206 | V | 206 | V | 50 | Hz | 0 | % | 65 | % | 29 | C |
| 429) | 1/5/2010 | 3:08:38 | PM | 205 | V | 205 | V | 50 | Hz | 0 | % | 65 | % | 29 | C |
| 430) | 1/5/2010 | 3:08:39 | PM | 206 | V | 206 | V | 50 | Hz | 0 | % | 65 | % | 29 | C |
| 431) | 1/5/2010 | 3:08:40 | PM | 205 | V | 205 | V | 50 | Hz | 0 | % | 65 | % | 29 | C |
| 432) | 1/5/2010 | 3:08:41 | PM | 206 | V | 206 | V | 50 | Hz | 0 | % | 65 | % | 29 | C |
| 433) | 1/5/2010 | 3:08:42 | PM | 207 | V | 207 | V | 50 | Hz | 0 | % | 65 | % | 29 | C |
| 434) | 1/5/2010 | 3:08:43 | PM | 206 | V | 206 | V | 50 | Hz | 0 | % | 65 | % | 29 | C |
| 435) | 1/5/2010 | 3:08:44 | PM | 206 | V | 206 | V | 51 | Hz | 0 | % | 65 | % | 29 | C |
| 436) | 1/5/2010 | 3:08:45 | PM | 212 | V | 212 | V | 50 | Hz | 0 | % | 65 | % | 29 | C |
| 438) | 1/5/2010 | 3:08:47 | PM | 211 | V | 211 | V | 50 | Hz | 0 | % | 65 | % | 29 | C |
| 439) | 1/5/2010 | 3:08:48 | PM | 211 | V | 211 | V | 50 | Hz | 0 | % | 65 | % | 29 | C |
| 440) | 1/5/2010 | 3:08:49 | PM | 211 | V | 211 | V | 50 | Hz | 0 | % | 65 | % | 29 | C |
| 441) | 1/5/2010 | 3:08:50 | PM | 211 | V | 211 | V | 50 | Hz | 0 | % | 65 | % | 29 | C |
| 442) | 1/5/2010 | 3:08:51 | PM | 210 | V | 210 | V | 50 | Hz | 0 | % | 65 | % | 29 | C |
| 443) | 1/5/2010 | 3:08:53 | PM | 210 | V | 210 | V | 50 | Hz | 0 | % | 65 | % | 29 | C |
| 444) | 1/5/2010 | 3:08:55 | PM | 208 | V | 208 | V | 50 | Hz | 0 | % | 65 | % | 29 | C |
| 445) | 1/5/2010 | 3:08:56 | PM | 208 | V | 208 | V | 50 | Hz | 0 | % | 65 | % | 29 | C |
| 446) | 1/5/2010 | 3:08:57 | PM | 207 | V | 207 | V | 50 | Hz | 0 | % | 65 | % | 29 | C |

FIG. 6 - 64

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 447) | 1/5/2010 | 3:08:58 | PM | 205 | V | 205 | V | 50 | Hz | 0 | % | 65 | % | 29 | C |
| 448) | 1/5/2010 | 3:08:59 | PM | 205 | V | 205 | V | 50 | Hz | 0 | % | 65 | % | 29 | C |
| 449) | 1/5/2010 | 3:09:00 | PM | 204 | V | 204 | V | 50 | Hz | 0 | % | 65 | % | 29 | C |
| 450) | 1/5/2010 | 3:09:01 | PM | 206 | V | 206 | V | 50 | Hz | 0 | % | 65 | % | 29 | C |
| 451) | 1/5/2010 | 3:13:56 | PM | 209 | V | 219 | V | 50 | Hz | 0 | % | 77 | % | 29 | C |
| 452) | 1/5/2010 | 3:13:58 | PM | 209 | V | 219 | V | 50 | Hz | 0 | % | 77 | % | 29 | C |
| 453) | 1/5/2010 | 3:13:59 | PM | 206 | V | 218 | V | 50 | Hz | 0 | % | 77 | % | 29 | C |
| 454) | 1/5/2010 | 3:14:00 | PM | 208 | V | 221 | V | 50 | Hz | 0 | % | 77 | % | 29 | C |
| 455) | 1/5/2010 | 3:14:01 | PM | 209 | V | 220 | V | 50 | Hz | 0 | % | 77 | % | 29 | C |
| 456) | 1/5/2010 | 3:14:02 | PM | 210 | V | 219 | V | 50 | Hz | 0 | % | 77 | % | 29 | C |
| 457) | 1/5/2010 | 3:14:03 | PM | 208 | V | 220 | V | 50 | Hz | 0 | % | 77 | % | 29 | C |
| 458) | 1/5/2010 | 3:14:04 | PM | 208 | V | 219 | V | 50 | Hz | 0 | % | 78 | % | 29 | C |
| 459) | 1/5/2010 | 3:14:05 | PM | 210 | V | 220 | V | 50 | Hz | 0 | % | 78 | % | 29 | C |
| 460) | 1/5/2010 | 3:14:06 | PM | 208 | V | 220 | V | 50 | Hz | 0 | % | 78 | % | 29 | C |
| 461) | 1/5/2010 | 3:14:07 | PM | 209 | V | 220 | V | 50 | Hz | 0 | % | 78 | % | 29 | C |
| 462) | 1/5/2010 | 3:14:08 | PM | 210 | V | 220 | V | 50 | Hz | 0 | % | 78 | % | 29 | C |
| 463) | 1/5/2010 | 3:14:09 | PM | 210 | V | 220 | V | 50 | Hz | 0 | % | 78 | % | 29 | C |
| 464) | 1/5/2010 | 3:14:10 | PM | 210 | V | 219 | V | 50 | Hz | 97 | % | 73 | % | 29 | C |
| 465) | 1/5/2010 | 3:14:11 | PM | 199 | V | 199 | V | 50 | Hz | 132 | % | 77 | % | 29 | C |
| 466) | 1/5/2010 | 3:14:12 | PM | 196 | V | 217 | V | 50 | Hz | 128 | % | 77 | % | 29 | C |
| 467) | 1/5/2010 | 3:14:13 | PM | 205 | V | 222 | V | 50 | Hz | 11 | % | 82 | % | 29 | C |
| 468) | 1/5/2010 | 3:14:14 | PM | 207 | V | 220 | V | 50 | Hz | 11 | % | 78 | % | 29 | C |
| 469) | 1/5/2010 | 3:14:15 | PM | 208 | V | 220 | V | 50 | Hz | 11 | % | 78 | % | 29 | C |
| 470) | 1/5/2010 | 3:14:16 | PM | 206 | V | 218 | V | 51 | Hz | 12 | % | 78 | % | 29 | C |
| 471) | 1/5/2010 | 3:14:17 | PM | 206 | V | 220 | V | 50 | Hz | 13 | % | 78 | % | 29 | C |
| 472) | 1/5/2010 | 3:14:18 | PM | 208 | V | 221 | V | 50 | Hz | 13 | % | 78 | % | 29 | C |
| 473) | 1/5/2010 | 3:14:19 | PM | 206 | V | 219 | V | 50 | Hz | 12 | % | 78 | % | 29 | C |
| 474) | 1/5/2010 | 3:14:20 | PM | 207 | V | 221 | V | 50 | Hz | 12 | % | 78 | % | 29 | C |

FIG. 6 - 65

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 475) | 1/5/2010 | 3:14:21 | PM | 206 | V | 220 | V | 50 | Hz | 10 | % | 78 | % | 29 | C |
| 476) | 1/5/2010 | 3:14:22 | PM | 206 | V | 220 | V | 51 | Hz | 12 | % | 78 | % | 29 | C |
| 478) | 1/5/2010 | 3:14:24 | PM | 208 | V | 220 | V | 50 | Hz | 12 | % | 78 | % | 29 | C |
| 479) | 1/5/2010 | 3:14:25 | PM | 209 | V | 220 | V | 50 | Hz | 12 | % | 78 | % | 29 | C |
| 480) | 1/5/2010 | 3:14:27 | PM | 208 | V | 218 | V | 50 | Hz | 37 | % | 80 | % | 29 | C |
| 481) | 1/5/2010 | 3:14:29 | PM | 208 | V | 218 | V | 49 | Hz | 40 | % | 80 | % | 29 | C |
| 482) | 1/5/2010 | 3:14:30 | PM | 208 | V | 220 | V | 51 | Hz | 36 | % | 78 | % | 29 | C |
| 483) | 1/5/2010 | 3:14:31 | PM | 208 | V | 220 | V | 50 | Hz | 40 | % | 78 | % | 29 | C |
| 484) | 1/5/2010 | 3:14:32 | PM | 208 | V | 218 | V | 50 | Hz | 38 | % | 80 | % | 29 | C |
| 485) | 1/5/2010 | 3:14:33 | PM | 206 | V | 220 | V | 50 | Hz | 38 | % | 80 | % | 29 | C |
| 486) | 1/5/2010 | 3:14:34 | PM | 207 | V | 220 | V | 50 | Hz | 37 | % | 78 | % | 29 | C |
| 487) | 1/5/2010 | 3:14:35 | PM | 207 | V | 220 | V | 50 | Hz | 36 | % | 78 | % | 29 | C |
| 488) | 1/5/2010 | 3:14:36 | PM | 205 | V | 218 | V | 50 | Hz | 41 | % | 80 | % | 29 | C |
| 489) | 1/5/2010 | 3:14:37 | PM | 206 | V | 220 | V | 50 | Hz | 37 | % | 78 | % | 29 | C |
| 490) | 1/5/2010 | 3:14:38 | PM | 206 | V | 220 | V | 50 | Hz | 40 | % | 80 | % | 29 | C |
| 491) | 1/5/2010 | 3:14:39 | PM | 204 | V | 219 | V | 50 | Hz | 39 | % | 80 | % | 29 | C |
| 492) | 1/5/2010 | 3:14:40 | PM | 205 | V | 220 | V | 50 | Hz | 40 | % | 80 | % | 29 | C |
| 493) | 1/5/2010 | 3:14:41 | PM | 207 | V | 220 | V | 50 | Hz | 42 | % | 78 | % | 29 | C |
| 494) | 1/5/2010 | 3:14:42 | PM | 204 | V | 220 | V | 50 | Hz | 39 | % | 80 | % | 29 | C |
| 495) | 1/5/2010 | 3:14:43 | PM | 206 | V | 221 | V | 50 | Hz | 41 | % | 78 | % | 29 | C |
| 496) | 1/5/2010 | 3:14:44 | PM | 205 | V | 220 | V | 50 | Hz | 41 | % | 80 | % | 29 | C |
| 497) | 1/5/2010 | 3:14:45 | PM | 207 | V | 220 | V | 50 | Hz | 37 | % | 80 | % | 29 | C |
| 498) | 1/5/2010 | 3:14:46 | PM | 205 | V | 220 | V | 51 | Hz | 41 | % | 80 | % | 29 | C |
| 499) | 1/5/2010 | 3:14:47 | PM | 208 | V | 220 | V | 50 | Hz | 39 | % | 80 | % | 29 | C |
| 500) | 1/5/2010 | 3:14:48 | PM | 207 | V | 220 | V | 50 | Hz | 38 | % | 80 | % | 29 | C |
| 501) | 1/5/2010 | 3:14:49 | PM | 207 | V | 220 | V | 50 | Hz | 40 | % | 80 | % | 29 | C |
| 502) | 1/5/2010 | 3:14:50 | PM | 207 | V | 220 | V | 50 | Hz | 39 | % | 80 | % | 29 | C |
| 503) | 1/5/2010 | 3:14:51 | PM | 206 | V | 220 | V | 50 | Hz | 39 | % | 82 | % | 29 | C |

FIG. 6 - 66

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 504) | 1/5/2010 | 3:14:52 | PM | 207 | V | 220 | V | 50 | Hz | 40 | % | 82 | % | 29 | C |
| 505) | 1/5/2010 | 3:14:53 | PM | 207 | V | 219 | V | 50 | Hz | 39 | % | 82 | % | 29 | C |
| 506) | 1/5/2010 | 3:14:54 | PM | 204 | V | 218 | V | 50 | Hz | 42 | % | 80 | % | 29 | C |
| 507) | 1/5/2010 | 3:14:55 | PM | 207 | V | 220 | V | 50 | Hz | 37 | % | 80 | % | 29 | C |
| 508) | 1/5/2010 | 3:14:56 | PM | 207 | V | 219 | V | 50 | Hz | 37 | % | 82 | % | 29 | C |
| 509) | 1/5/2010 | 3:14:58 | PM | 206 | V | 220 | V | 50 | Hz | 39 | % | 80 | % | 29 | C |
| 510) | 1/5/2010 | 3:15:00 | PM | 206 | V | 220 | V | 50 | Hz | 37 | % | 80 | % | 29 | C |
| 511) | 1/5/2010 | 3:15:01 | PM | 206 | V | 220 | V | 50 | Hz | 39 | % | 82 | % | 29 | C |
| 512) | 1/5/2010 | 3:15:02 | PM | 202 | V | 220 | V | 50 | Hz | 40 | % | 80 | % | 29 | C |
| 513) | 1/5/2010 | 3:15:03 | PM | 201 | V | 220 | V | 50 | Hz | 36 | % | 80 | % | 29 | C |
| 514) | 1/5/2010 | 3:15:04 | PM | 204 | V | 220 | V | 50 | Hz | 42 | % | 80 | % | 29 | C |
| 515) | 1/5/2010 | 3:15:05 | PM | 204 | V | 220 | V | 50 | Hz | 40 | % | 80 | % | 29 | C |
| 516) | 1/5/2010 | 3:15:06 | PM | 204 | V | 221 | V | 50 | Hz | 39 | % | 82 | % | 29 | C |
| 518) | 1/5/2010 | 3:15:08 | PM | 204 | V | 220 | V | 50 | Hz | 39 | % | 82 | % | 29 | C |
| 519) | 1/5/2010 | 3:15:09 | PM | 204 | V | 221 | V | 50 | Hz | 39 | % | 80 | % | 29 | C |
| 520) | 1/5/2010 | 3:15:10 | PM | 205 | V | 220 | V | 50 | Hz | 41 | % | 80 | % | 29 | C |
| 521) | 1/5/2010 | 3:15:11 | PM | 204 | V | 219 | V | 50 | Hz | 39 | % | 80 | % | 8 | C |
| 522) | 1/5/2010 | 3:15:12 | PM | 205 | V | 220 | V | 50 | Hz | 38 | % | 82 | % | 29 | C |
| 523) | 1/5/2010 | 3:15:13 | PM | 202 | V | 219 | V | 50 | Hz | 39 | % | 80 | % | 29 | C |
| 524) | 1/5/2010 | 3:15:14 | PM | 205 | V | 220 | V | 50 | Hz | 39 | % | 80 | % | 29 | C |
| 525) | 1/5/2010 | 3:15:15 | PM | 205 | V | 220 | V | 50 | Hz | 39 | % | 82 | % | 29 | C |
| 526) | 1/5/2010 | 3:15:16 | PM | 204 | V | 220 | V | 50 | Hz | 40 | % | 82 | % | 29 | C |
| 527) | 1/5/2010 | 3:15:17 | PM | 204 | V | 220 | V | 50 | Hz | 39 | % | 82 | % | 29 | C |
| 528) | 1/5/2010 | 3:15:18 | PM | 205 | V | 220 | V | 50 | Hz | 40 | % | 80 | % | 29 | C |
| 529) | 1/5/2010 | 3:15:19 | PM | 203 | V | 218 | V | 50 | Hz | 41 | % | 82 | % | 29 | C |
| 530) | 1/5/2010 | 3:15:20 | PM | 204 | V | 220 | V | 50 | Hz | 40 | % | 82 | % | 29 | C |
| 531) | 1/5/2010 | 3:15:21 | PM | 204 | V | 220 | V | 50 | Hz | 36 | % | 82 | % | 29 | C |
| 532) | 1/5/2010 | 3:15:22 | PM | 204 | V | 220 | V | 50 | Hz | 36 | % | 82 | % | 29 | C |

FIG. 6 - 67

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 533) | 1/5/2010 | 3:15:23 | PM | 204 | V | 207 | V | 50 | Hz | 37 | % | 82 | % | 29 | C |
| 534) | 1/5/2010 | 3:15:24 | PM | 204 | V | 220 | V | 50 | Hz | 37 | % | 82 | % | 29 | C |
| 535) | 1/5/2010 | 3:15:25 | PM | 204 | V | 220 | V | 50 | Hz | 39 | % | 82 | % | 29 | C |
| 536) | 1/5/2010 | 3:15:26 | PM | 204 | V | 220 | V | 50 | Hz | 40 | % | 82 | % | 29 | C |
| 537) | 1/5/2010 | 3:15:27 | PM | 204 | V | 207 | V | 50 | Hz | 41 | % | 82 | % | 29 | C |
| 538) | 1/5/2010 | 3:15:29 | PM | 205 | V | 221 | V | 50 | Hz | 37 | % | 82 | % | 29 | C |
| 539) | 1/5/2010 | 3:15:31 | PM | 204 | V | 221 | V | 50 | Hz | 36 | % | 82 | % | 29 | C |
| 540) | 1/5/2010 | 3:15:32 | PM | 204 | V | 219 | V | 50 | Hz | 39 | % | 82 | % | 29 | C |
| 541) | 1/5/2010 | 3:15:33 | PM | 205 | V | 220 | V | 50 | Hz | 37 | % | 82 | % | 29 | C |
| 542) | 1/5/2010 | 3:15:34 | PM | 207 | V | 217 | V | 50 | Hz | 38 | % | 82 | % | 29 | C |
| 543) | 1/5/2010 | 3:15:35 | PM | 208 | V | 220 | V | 50 | Hz | 38 | % | 82 | % | 29 | C |
| 544) | 1/5/2010 | 3:15:36 | PM | 208 | V | 220 | V | 50 | Hz | 40 | % | 82 | % | 29 | C |
| 545) | 1/5/2010 | 3:15:37 | PM | 208 | V | 220 | V | 50 | Hz | 39 | % | 82 | % | 29 | C |
| 546) | 1/5/2010 | 3:15:38 | PM | 208 | V | 220 | V | 50 | Hz | 40 | % | 82 | % | 29 | C |
| 547) | 1/5/2010 | 3:15:39 | PM | 208 | V | 220 | V | 50 | Hz | 42 | % | 82 | % | 29 | C |
| 548) | 1/5/2010 | 3:15:40 | PM | 207 | V | 219 | V | 50 | Hz | 40 | % | 82 | % | 29 | C |
| 549) | 1/5/2010 | 3:15:41 | PM | 207 | V | 220 | V | 50 | Hz | 42 | % | 82 | % | 29 | C |
| 550) | 1/5/2010 | 3:15:42 | PM | 207 | V | 220 | V | 50 | Hz | 40 | % | 82 | % | 29 | C |
| 551) | 1/5/2010 | 3:15:43 | PM | 206 | V | 220 | V | 50 | Hz | 40 | % | 82 | % | 29 | C |
| 552) | 1/5/2010 | 3:15:44 | PM | 206 | V | 220 | V | 50 | Hz | 40 | % | 82 | % | 29 | C |
| 553) | 1/5/2010 | 3:15:45 | PM | 206 | V | 220 | V | 50 | Hz | 37 | % | 82 | % | 29 | C |
| 554) | 1/5/2010 | 3:15:46 | PM | 208 | V | 220 | V | 50 | Hz | 40 | % | 82 | % | 29 | C |
| 555) | 1/5/2010 | 3:15:47 | PM | 206 | V | 213 | V | 50 | Hz | 40 | % | 82 | % | 29 | C |
| 556) | 1/5/2010 | 3:15:48 | PM | 206 | V | 220 | V | 50 | Hz | 41 | % | 82 | % | 29 | C |
| 558) | 1/5/2010 | 3:15:50 | PM | 207 | V | 221 | V | 50 | Hz | 40 | % | 82 | % | 29 | C |
| 559) | 1/5/2010 | 3:15:51 | PM | 207 | V | 221 | V | 50 | Hz | 40 | % | 82 | % | 29 | C |
| 560) | 1/5/2010 | 3:15:52 | PM | 205 | V | 220 | V | 50 | Hz | 40 | % | 82 | % | 29 | C |
| 561) | 1/5/2010 | 3:15:53 | PM | 206 | V | 221 | V | 50 | Hz | 39 | % | 82 | % | 29 | C |

FIG. 6 - 68

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 562) | 1/5/2010 | 3:15:54 | PM | 205 | V | 221 | V | 50 | Hz | 43 | % | 82 | % | 9 | C |
| 563) | 1/5/2010 | 3:15:55 | PM | 208 | V | 220 | V | 50 | Hz | 40 | % | 82 | % | 29 | C |
| 564) | 1/5/2010 | 3:15:56 | PM | 207 | V | 220 | V | 50 | Hz | 39 | % | 82 | % | 29 | C |
| 565) | 1/5/2010 | 3:15:57 | PM | 208 | V | 220 | V | 50 | Hz | 39 | % | 82 | % | 29 | C |
| 566) | 1/5/2010 | 3:15:58 | PM | 207 | V | 220 | V | 50 | Hz | 42 | % | 82 | % | 29 | C |
| 567) | 1/5/2010 | 3:16:00 | PM | 213 | V | 220 | V | 50 | Hz | 38 | % | 82 | % | 29 | C |
| 568) | 1/5/2010 | 3:16:02 | PM | 207 | V | 220 | V | 50 | Hz | 39 | % | 82 | % | 29 | C |
| 569) | 1/5/2010 | 3:16:03 | PM | 207 | V | 220 | V | 50 | Hz | 42 | % | 83 | % | 29 | C |
| 570) | 1/5/2010 | 3:16:04 | PM | 207 | V | 220 | V | 50 | Hz | 37 | % | 82 | % | 29 | C |
| 571) | 1/5/2010 | 3:16:05 | PM | 206 | V | 219 | V | 50 | Hz | 38 | % | 82 | % | 29 | C |
| 572) | 1/5/2010 | 3:16:06 | PM | 206 | V | 220 | V | 50 | Hz | 38 | % | 82 | % | 29 | C |
| 573) | 1/5/2010 | 3:16:07 | PM | 206 | V | 220 | V | 50 | Hz | 36 | % | 82 | % | 29 | C |
| 574) | 1/5/2010 | 3:16:08 | PM | 206 | V | 220 | V | 50 | Hz | 37 | % | 82 | % | 29 | C |
| 575) | 1/5/2010 | 3:16:09 | PM | 208 | V | 221 | V | 50 | Hz | 39 | % | 82 | % | 29 | C |
| 576) | 1/5/2010 | 3:16:10 | PM | 210 | V | 220 | V | 50 | Hz | 41 | % | 83 | % | 29 | C |
| 577) | 1/5/2010 | 3:16:11 | PM | 209 | V | 221 | V | 50 | Hz | 42 | % | 82 | % | 29 | C |
| 578) | 1/5/2010 | 3:16:12 | PM | 209 | V | 221 | V | 50 | Hz | 42 | % | 82 | % | 29 | C |
| 579) | 1/5/2010 | 3:16:13 | PM | 209 | V | 221 | V | 50 | Hz | 39 | % | 82 | % | 29 | C |
| 580) | 1/5/2010 | 3:16:14 | PM | 209 | V | 221 | V | 50 | Hz | 42 | % | 82 | % | 29 | C |
| 581) | 1/5/2010 | 3:16:15 | PM | 207 | V | 220 | V | 49 | Hz | 42 | % | 82 | % | 29 | C |
| 582) | 1/5/2010 | 3:16:16 | PM | 207 | V | 202 | V | 51 | Hz | 38 | % | 82 | % | 29 | C |
| 583) | 1/5/2010 | 3:16:17 | PM | 210 | V | 220 | V | 50 | Hz | 39 | % | 82 | % | 29 | C |
| 584) | 1/5/2010 | 3:16:18 | PM | 210 | V | 220 | V | 50 | Hz | 37 | % | 83 | % | 29 | C |
| 585) | 1/5/2010 | 3:16:19 | PM | 210 | V | 220 | V | 50 | Hz | 37 | % | 83 | % | 29 | C |
| 586) | 1/5/2010 | 3:16:20 | PM | 210 | V | 220 | V | 50 | Hz | 38 | % | 83 | % | 29 | C |
| 587) | 1/5/2010 | 3:16:21 | PM | 210 | V | 220 | V | 50 | Hz | 40 | % | 82 | % | 29 | C |
| 588) | 1/5/2010 | 3:16:22 | PM | 210 | V | 219 | V | 50 | Hz | 38 | % | 83 | % | 29 | C |
| 589) | 1/5/2010 | 3:16:23 | PM | 209 | V | 220 | V | 50 | Hz | 40 | % | 83 | % | 29 | C |

FIG. 6 - 69

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 590) | 1/5/2010 | 3:16:24 | PM | 209 | V | 219 | V | 50 | Hz | 40 | % | 83 | % | 29 | C |
| 591) | 1/5/2010 | 3:16:25 | PM | 210 | V | 219 | V | 50 | Hz | 40 | % | 82 | % | 29 | C |
| 592) | 1/5/2010 | 3:16:26 | PM | 208 | V | 220 | V | 50 | Hz | 38 | % | 83 | % | 29 | C |
| 593) | 1/5/2010 | 3:16:27 | PM | 208 | V | 220 | V | 50 | Hz | 38 | % | 83 | % | 29 | C |
| 594) | 1/5/2010 | 3:16:28 | PM | 210 | V | 219 | V | 50 | Hz | 37 | % | 83 | % | 29 | C |
| 595) | 1/5/2010 | 3:16:29 | PM | 208 | V | 220 | V | 50 | Hz | 36 | % | 82 | % | 29 | C |
| 596) | 1/5/2010 | 3:16:31 | PM | 209 | V | 218 | V | 50 | Hz | 38 | % | 82 | % | 29 | C |
| 598) | 1/5/2010 | 3:16:34 | PM | 209 | V | 218 | V | 50 | Hz | 41 | % | 82 | % | 29 | C |
| 599) | 1/5/2010 | 3:16:35 | PM | 209 | V | 220 | V | 50 | Hz | 39 | % | 83 | % | 29 | C |
| 600) | 1/5/2010 | 3:16:36 | PM | 208 | V | 220 | V | 50 | Hz | 39 | % | 82 | % | 29 | C |
| 601) | 1/5/2010 | 3:16:37 | PM | 210 | V | 219 | V | 50 | Hz | 39 | % | 83 | % | 29 | C |
| 602) | 1/5/2010 | 3:16:38 | PM | 209 | V | 220 | V | 50 | Hz | 37 | % | 83 | % | 29 | C |
| 603) | 1/5/2010 | 3:16:39 | PM | 205 | V | 217 | V | 0 | Hz | 37 | % | 87 | % | 28 | C |
| 604) | 1/5/2010 | 3:16:40 | PM | 202 | V | 219 | V | 0 | Hz | 38 | % | 85 | % | 28 | C |
| 605) | 1/5/2010 | 3:16:41 | PM | 203 | V | 219 | V | 0 | Hz | 38 | % | 85 | % | 28 | C |
| 606) | 1/5/2010 | 3:16:42 | PM | 203 | V | 219 | V | 0 | Hz | 38 | % | 85 | % | 28 | C |
| 607) | 1/5/2010 | 3:16:43 | PM | 203 | V | 219 | V | 0 | Hz | 38 | % | 85 | % | 28 | C |
| 608) | 1/5/2010 | 3:16:44 | PM | 203 | V | 219 | V | 0 | Hz | 38 | % | 85 | % | 28 | C |
| 609) | 1/5/2010 | 3:16:45 | PM | 204 | V | 219 | V | 0 | Hz | 38 | % | 85 | % | 28 | C |
| 610) | 1/5/2010 | 3:16:46 | PM | 203 | V | 219 | V | 0 | Hz | 38 | % | 85 | % | 28 | C |
| 611) | 1/5/2010 | 3:16:47 | PM | 203 | V | 219 | V | 0 | Hz | 38 | % | 83 | % | 28 | C |
| 612) | 1/5/2010 | 3:16:49 | PM | 202 | V | 219 | V | 0 | Hz | 37 | % | 83 | % | 28 | C |
| 613) | 1/5/2010 | 3:16:50 | PM | 202 | V | 219 | V | 0 | Hz | 38 | % | 83 | % | 28 | C |
| 614) | 1/5/2010 | 3:16:51 | PM | 200 | V | 219 | V | 0 | Hz | 36 | % | 83 | % | 28 | C |
| 615) | 1/5/2010 | 3:16:52 | PM | 204 | V | 218 | V | 0 | Hz | 36 | % | 83 | % | 28 | C |
| 616) | 1/5/2010 | 3:16:53 | PM | 202 | V | 219 | V | 0 | Hz | 36 | % | 83 | % | 28 | C |
| 617) | 1/5/2010 | 3:16:54 | PM | 202 | V | 219 | V | 0 | Hz | 36 | % | 83 | % | 28 | C |
| 618) | 1/5/2010 | 3:16:55 | PM | 202 | V | 219 | V | 0 | Hz | 35 | % | 83 | % | 28 | C |

FIG. 6 - 70

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 619) | 1/5/2010 | 3:16:56 | PM | 202 | V | 219 | V | 0 | Hz | 36 | % | 83 | % | 28 | C |
| 620) | 1/5/2010 | 3:16:57 | PM | 201 | V | 219 | V | 0 | Hz | 36 | % | 83 | % | 28 | C |
| 621) | 1/5/2010 | 3:16:58 | PM | 203 | V | 219 | V | 0 | Hz | 36 | % | 83 | % | 28 | C |
| 622) | 1/5/2010 | 3:16:59 | PM | 202 | V | 219 | V | 0 | Hz | 35 | % | 83 | % | 28 | C |
| 623) | 1/5/2010 | 3:17:00 | PM | 201 | V | 219 | V | 0 | Hz | 36 | % | 83 | % | 28 | C |
| 624) | 1/5/2010 | 3:17:02 | PM | 203 | V | 218 | V | 0 | Hz | 36 | % | 83 | % | 28 | C |
| 625) | 1/5/2010 | 3:17:04 | PM | 203 | V | 219 | V | 0 | Hz | 36 | % | 82 | % | 28 | C |
| 626) | 1/5/2010 | 3:17:05 | PM | 203 | V | 218 | V | 0 | Hz | 36 | % | 82 | % | 28 | C |
| 627) | 1/5/2010 | 3:17:06 | PM | 203 | V | 218 | V | 0 | Hz | 36 | % | 82 | % | 28 | C |
| 628) | 1/5/2010 | 3:17:07 | PM | 203 | V | 218 | V | 0 | Hz | 36 | % | 82 | % | 28 | C |
| 629) | 1/5/2010 | 3:17:08 | PM | 203 | V | 219 | V | 0 | Hz | 35 | % | 82 | % | 28 | C |
| 630) | 1/5/2010 | 3:17:09 | PM | 202 | V | 219 | V | 0 | Hz | 35 | % | 82 | % | 28 | C |
| 631) | 1/5/2010 | 3:17:10 | PM | 202 | V | 218 | V | 0 | Hz | 35 | % | 82 | % | 28 | C |
| 632) | 1/5/2010 | 3:17:11 | PM | 202 | V | 219 | V | 0 | Hz | 36 | % | 82 | % | 28 | C |
| 633) | 1/5/2010 | 3:17:12 | PM | 200 | V | 218 | V | 0 | Hz | 36 | % | 82 | % | 28 | C |
| 634) | 1/5/2010 | 3:17:13 | PM | 202 | V | 219 | V | 0 | Hz | 36 | % | 82 | % | 28 | C |
| 635) | 1/5/2010 | 3:17:14 | PM | 201 | V | 218 | V | 0 | Hz | 36 | % | 82 | % | 28 | C |
| 636) | 1/5/2010 | 3:17:15 | PM | 201 | V | 218 | V | 0 | Hz | 38 | % | 80 | % | 28 | C |
| 638) | 1/5/2010 | 3:17:17 | PM | 199 | V | 218 | V | 0 | Hz | 37 | % | 82 | % | 28 | C |
| 639) | 1/5/2010 | 3:17:18 | PM | 199 | V | 218 | V | 0 | Hz | 37 | % | 80 | % | 28 | C |
| 640) | 1/5/2010 | 3:17:19 | PM | 199 | V | 218 | V | 0 | Hz | 37 | % | 80 | % | 28 | C |
| 641) | 1/5/2010 | 3:17:20 | PM | 199 | V | 218 | V | 0 | Hz | 37 | % | 80 | % | 28 | C |
| 642) | 1/5/2010 | 3:17:21 | PM | 199 | V | 218 | V | 0 | Hz | 37 | % | 80 | % | 28 | C |
| 643) | 1/5/2010 | 3:17:22 | PM | 199 | V | 218 | V | 0 | Hz | 37 | % | 80 | % | 28 | C |
| 644) | 1/5/2010 | 3:17:23 | PM | 197 | V | 218 | V | 0 | Hz | 38 | % | 80 | % | 28 | C |
| 645) | 1/5/2010 | 3:17:24 | PM | 200 | V | 218 | V | 0 | Hz | 38 | % | 80 | % | 28 | C |
| 646) | 1/5/2010 | 3:17:25 | PM | 200 | V | 217 | V | 0 | Hz | 38 | % | 80 | % | 28 | C |
| 647) | 1/5/2010 | 3:17:26 | PM | 200 | V | 217 | V | 0 | Hz | 38 | % | 80 | % | 28 | C |

FIG. 6 - 71

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 648) | 1/5/2010 | 3:17:27 | PM | 200 | V | 218 | V | 0 | Hz | 38 | % | 80 | % | 28 | C |
| 649) | 1/5/2010 | 3:17:28 | PM | 201 | V | 218 | V | 0 | Hz | 37 | % | 80 | % | 28 | C |
| 650) | 1/5/2010 | 3:17:29 | PM | 202 | V | 218 | V | 0 | Hz | 37 | % | 80 | % | 28 | C |
| 651) | 1/5/2010 | 3:17:30 | PM | 200 | V | 218 | V | 0 | Hz | 38 | % | 80 | % | 28 | C |
| 652) | 1/5/2010 | 3:17:31 | PM | 199 | V | 218 | V | 0 | Hz | 37 | % | 80 | % | 28 | C |
| 653) | 1/5/2010 | 3:17:33 | PM | 202 | V | 217 | V | 0 | Hz | 38 | % | 82 | % | 28 | C |
| 654) | 1/5/2010 | 3:17:35 | PM | 200 | V | 217 | V | 0 | Hz | 37 | % | 80 | % | 28 | C |
| 655) | 1/5/2010 | 3:17:36 | PM | 200 | V | 218 | V | 0 | Hz | 38 | % | 80 | % | 28 | C |
| 656) | 1/5/2010 | 3:17:37 | PM | 199 | V | 217 | V | 0 | Hz | 38 | % | 80 | % | 28 | C |
| 657) | 1/5/2010 | 3:17:38 | PM | 200 | V | 217 | V | 0 | Hz | 35 | % | 80 | % | 28 | C |
| 658) | 1/5/2010 | 3:17:39 | PM | 200 | V | 217 | V | 0 | Hz | 37 | % | 80 | % | 28 | C |
| 659) | 1/5/2010 | 3:17:40 | PM | 198 | V | 218 | V | 0 | Hz | 35 | % | 80 | % | 28 | C |
| 660) | 1/5/2010 | 3:17:41 | PM | 201 | V | 218 | V | 26 | Hz | 35 | % | 80 | % | 28 | C |
| 661) | 1/5/2010 | 3:17:42 | PM | 198 | V | 218 | V | 50 | Hz | 36 | % | 75 | % | 28 | C |
| 662) | 1/5/2010 | 3:17:43 | PM | 198 | V | 219 | V | 50 | Hz | 39 | % | 75 | % | 28 | C |
| 663) | 1/5/2010 | 3:17:44 | PM | 199 | V | 217 | V | 50 | Hz | 42 | % | 75 | % | 28 | C |
| 664) | 1/5/2010 | 3:17:45 | PM | 199 | V | 219 | V | 50 | Hz | 41 | % | 73 | % | 28 | C |
| 665) | 1/5/2010 | 3:17:46 | PM | 197 | V | 219 | V | 50 | Hz | 44 | % | 73 | % | 28 | C |
| 666) | 1/5/2010 | 3:17:47 | PM | 206 | V | 220 | V | 50 | Hz | 38 | % | 75 | % | 28 | C |
| 667) | 1/5/2010 | 3:17:48 | PM | 200 | V | 215 | V | 50 | Hz | 38 | % | 75 | % | 28 | C |
| 668) | 1/5/2010 | 3:17:49 | PM | 200 | V | 220 | V | 50 | Hz | 37 | % | 73 | % | 28 | C |
| 669) | 1/5/2010 | 3:17:50 | PM | 200 | V | 219 | V | 50 | Hz | 42 | % | 68 | % | 28 | C |
| 670) | 1/5/2010 | 3:17:51 | PM | 197 | V | 219 | V | 50 | Hz | 40 | % | 72 | % | 28 | C |
| 671) | 1/5/2010 | 3:17:52 | PM | 200 | V | 218 | V | 50 | Hz | 38 | % | 73 | % | 28 | C |
| 672) | 1/5/2010 | 3:17:53 | PM | 199 | V | 218 | V | 50 | Hz | 39 | % | 73 | % | 28 | C |
| 673) | 1/5/2010 | 3:17:54 | PM | 199 | V | 218 | V | 50 | Hz | 44 | % | 75 | % | 29 | C |
| 674) | 1/5/2010 | 3:17:55 | PM | 206 | V | 220 | V | 50 | Hz | 39 | % | 73 | % | 28 | C |
| 675) | 1/5/2010 | 3:17:56 | PM | 207 | V | 220 | V | 50 | Hz | 39 | % | 77 | % | 23 | C |

FIG. 6 - 72

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 676) | 1/5/2010 | 3:17:57 | PM | 204 | V | 221 | V | 50 | Hz | 38 | % | 77 | % | 29 | C |
| 678) | 1/5/2010 | 3:17:59 | PM | 204 | V | 220 | V | 50 | Hz | 40 | % | 78 | % | 29 | C |
| 679) | 1/5/2010 | 3:18:00 | PM | 206 | V | 220 | V | 50 | Hz | 36 | % | 77 | % | 29 | C |
| 680) | 1/5/2010 | 3:18:01 | PM | 206 | V | 220 | V | 50 | Hz | 36 | % | 77 | % | 29 | C |
| 681) | 1/5/2010 | 3:18:02 | PM | 203 | V | 218 | V | 50 | Hz | 39 | % | 78 | % | 29 | C |
| 682) | 1/5/2010 | 3:18:04 | PM | 205 | V | 220 | V | 50 | Hz | 40 | % | 77 | % | 29 | C |
| 683) | 1/5/2010 | 3:18:06 | PM | 205 | V | 221 | V | 50 | Hz | 42 | % | 78 | % | 29 | C |
| 684) | 1/5/2010 | 3:18:07 | PM | 205 | V | 221 | V | 50 | Hz | 38 | % | 78 | % | 28 | C |
| 685) | 1/5/2010 | 3:18:08 | PM | 204 | V | 220 | V | 50 | Hz | 38 | % | 78 | % | 29 | C |
| 686) | 1/5/2010 | 3:18:09 | PM | 205 | V | 220 | V | 50 | Hz | 42 | % | 80 | % | 29 | C |
| 687) | 1/5/2010 | 3:18:10 | PM | 205 | V | 220 | V | 50 | Hz | 40 | % | 78 | % | 29 | C |
| 688) | 1/5/2010 | 3:18:11 | PM | 205 | V | 220 | V | 50 | Hz | 40 | % | 78 | % | 29 | C |
| 689) | 1/5/2010 | 3:18:12 | PM | 205 | V | 220 | V | 50 | Hz | 38 | % | 78 | % | 29 | C |
| 690) | 1/5/2010 | 3:18:13 | PM | 204 | V | 220 | V | 50 | Hz | 36 | % | 78 | % | 29 | C |
| 691) | 1/5/2010 | 3:18:14 | PM | 205 | V | 220 | V | 50 | Hz | 43 | % | 78 | % | 29 | C |
| 692) | 1/5/2010 | 3:18:15 | PM | 206 | V | 220 | V | 50 | Hz | 39 | % | 80 | % | 29 | C |
| 693) | 1/5/2010 | 3:18:16 | PM | 205 | V | 220 | V | 50 | Hz | 39 | % | 80 | % | 29 | C |
| 694) | 1/5/2010 | 3:18:17 | PM | 205 | V | 220 | V | 50 | Hz | 41 | % | 78 | % | 29 | C |
| 695) | 1/5/2010 | 3:18:18 | PM | 205 | V | 220 | V | 50 | Hz | 44 | % | 78 | % | 29 | C |
| 696) | 1/5/2010 | 3:18:19 | PM | 205 | V | 220 | V | 50 | Hz | 43 | % | 78 | % | 29 | C |
| 697) | 1/5/2010 | 3:18:20 | PM | 205 | V | 220 | V | 49 | Hz | 36 | % | 78 | % | 29 | C |
| 698) | 1/5/2010 | 3:18:21 | PM | 204 | V | 219 | V | 50 | Hz | 39 | % | 80 | % | 29 | C |
| 699) | 1/5/2010 | 3:18:22 | PM | 204 | V | 220 | V | 50 | Hz | 44 | % | 78 | % | 29 | C |
| 700) | 1/5/2010 | 3:18:23 | PM | 204 | V | 220 | V | 50 | Hz | 37 | % | 80 | % | 29 | C |
| 701) | 1/5/2010 | 3:18:24 | PM | 204 | V | 220 | V | 50 | Hz | 37 | % | 80 | % | 29 | C |
| 702) | 1/5/2010 | 3:18:25 | PM | 204 | V | 220 | V | 50 | Hz | 37 | % | 80 | % | 29 | C |
| 703) | 1/5/2010 | 3:18:26 | PM | 204 | V | 220 | V | 50 | Hz | 40 | % | 80 | % | 29 | C |
| 704) | 1/5/2010 | 3:18:27 | PM | 204 | V | 221 | V | 50 | Hz | 43 | % | 80 | % | 28 | C |

FIG. 6 - 73

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 705) | 1/5/2010 | 3:18:28 | PM | 204 | V | 221 | V | 50 | Hz | 39 | % | 80 | % | 29 | C |
| 706) | 1/5/2010 | 3:18:29 | PM | 204 | V | 209 | V | 50 | Hz | 37 | % | 80 | % | 29 | C |
| 707) | 1/5/2010 | 3:18:30 | PM | 205 | V | 221 | V | 50 | Hz | 40 | % | 80 | % | 29 | C |
| 708) | 1/5/2010 | 3:18:31 | PM | 202 | V | 220 | V | 50 | Hz | 37 | % | 80 | % | 28 | C |
| 709) | 1/5/2010 | 3:18:32 | PM | 208 | V | 220 | V | 50 | Hz | 39 | % | 82 | % | 28 | C |
| 710) | 1/5/2010 | 3:18:33 | PM | 198 | V | 220 | V | 50 | Hz | 41 | % | 78 | % | 29 | C |
| 711) | 1/5/2010 | 3:18:35 | PM | 208 | V | 220 | V | 50 | Hz | 41 | % | 80 | % | 29 | C |
| 712) | 1/5/2010 | 3:18:37 | PM | 208 | V | 220 | V | 50 | Hz | 41 | % | 82 | % | 29 | C |
| 713) | 1/5/2010 | 3:18:38 | PM | 206 | V | 219 | V | 50 | Hz | 42 | % | 82 | % | 29 | C |
| 714) | 1/5/2010 | 3:18:39 | PM | 207 | V | 220 | V | 50 | Hz | 38 | % | 82 | % | 29 | C |
| 715) | 1/5/2010 | 3:18:40 | PM | 208 | V | 220 | V | 50 | Hz | 37 | % | 80 | % | 28 | C |
| 716) | 1/5/2010 | 3:18:41 | PM | 206 | V | 220 | V | 50 | Hz | 39 | % | 80 | % | 29 | C |
| 718) | 1/5/2010 | 3:18:43 | PM | 204 | V | 220 | V | 50 | Hz | 37 | % | 80 | % | 29 | C |
| 719) | 1/5/2010 | 3:18:44 | PM | 205 | V | 220 | V | 50 | Hz | 43 | % | 80 | % | 28 | C |
| 720) | 1/5/2010 | 3:18:45 | PM | 204 | V | 219 | V | 50 | Hz | 42 | % | 80 | % | 29 | C |
| 721) | 1/5/2010 | 3:18:46 | PM | 204 | V | 221 | V | 50 | Hz | 42 | % | 82 | % | 28 | C |
| 722) | 1/5/2010 | 3:18:47 | PM | 205 | V | 221 | V | 50 | Hz | 37 | % | 82 | % | 29 | C |
| 723) | 1/5/2010 | 3:18:48 | PM | 204 | V | 221 | V | 49 | Hz | 42 | % | 80 | % | 28 | C |
| 724) | 1/5/2010 | 3:18:49 | PM | 202 | V | 221 | V | 50 | Hz | 41 | % | 82 | % | 28 | C |
| 725) | 1/5/2010 | 3:18:50 | PM | 203 | V | 221 | V | 50 | Hz | 40 | % | 82 | % | 29 | C |
| 726) | 1/5/2010 | 3:18:51 | PM | 205 | V | 220 | V | 50 | Hz | 41 | % | 82 | % | 28 | C |
| 727) | 1/5/2010 | 3:18:52 | PM | 204 | V | 220 | V | 50 | Hz | 39 | % | 82 | % | 28 | C |
| 728) | 1/5/2010 | 3:18:53 | PM | 204 | V | 220 | V | 50 | Hz | 41 | % | 82 | % | 29 | C |
| 729) | 1/5/2010 | 3:18:54 | PM | 204 | V | 220 | V | 51 | Hz | 39 | % | 82 | % | 28 | C |
| 730) | 1/5/2010 | 3:18:55 | PM | 204 | V | 220 | V | 50 | Hz | 37 | % | 82 | % | 28 | C |
| 731) | 1/5/2010 | 3:18:56 | PM | 201 | V | 220 | V | 50 | Hz | 39 | % | 82 | % | 28 | C |
| 732) | 1/5/2010 | 3:18:57 | PM | 202 | V | 220 | V | 50 | Hz | 36 | % | 82 | % | 28 | C |
| 733) | 1/5/2010 | 3:18:58 | PM | 204 | V | 220 | V | 50 | Hz | 36 | % | 82 | % | 29 | C |

FIG. 6 - 74

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 734) | 1/5/2010 | 3:18:59 | PM | 202 | V | 220 | V | 50 | Hz | 39 | % | 82 | % | 28 | C |
| 735) | 1/5/2010 | 3:19:00 | PM | 204 | V | 221 | V | 50 | Hz | 39 | % | 82 | % | 28 | C |
| 736) | 1/5/2010 | 3:19:01 | PM | 202 | V | 220 | V | 50 | Hz | 41 | % | 82 | % | 29 | C |
| 737) | 1/5/2010 | 3:19:02 | PM | 202 | V | 221 | V | 50 | Hz | 40 | % | 82 | % | 28 | C |
| 738) | 1/5/2010 | 3:19:03 | PM | 202 | V | 221 | V | 50 | Hz | 43 | % | 82 | % | 28 | C |
| 739) | 1/5/2010 | 3:19:04 | PM | 202 | V | 221 | V | 50 | Hz | 39 | % | 82 | % | 28 | C |
| 740) | 1/5/2010 | 3:19:06 | PM | 201 | V | 219 | V | 50 | Hz | 39 | % | 82 | % | 28 | C |
| 741) | 1/5/2010 | 3:19:08 | PM | 203 | V | 220 | V | 50 | Hz | 38 | % | 83 | % | 28 | C |
| 742) | 1/5/2010 | 3:19:09 | PM | 203 | V | 220 | V | 50 | Hz | 38 | % | 82 | % | 28 | C |
| 743) | 1/5/2010 | 3:19:10 | PM | 203 | V | 220 | V | 50 | Hz | 41 | % | 82 | % | 28 | C |
| 744) | 1/5/2010 | 3:19:11 | PM | 202 | V | 220 | V | 51 | Hz | 39 | % | 82 | % | 28 | C |
| 745) | 1/5/2010 | 3:19:12 | PM | 203 | V | 220 | V | 50 | Hz | 40 | % | 82 | % | 28 | C |
| 746) | 1/5/2010 | 3:19:13 | PM | 202 | V | 220 | V | 50 | Hz | 41 | % | 82 | % | 28 | C |
| 747) | 1/5/2010 | 3:19:14 | PM | 203 | V | 220 | V | 50 | Hz | 37 | % | 82 | % | 28 | C |
| 748) | 1/5/2010 | 3:19:15 | PM | 203 | V | 220 | V | 50 | Hz | 37 | % | 82 | % | 28 | C |
| 749) | 1/5/2010 | 3:19:16 | PM | 202 | V | 220 | V | 50 | Hz | 37 | % | 82 | % | 28 | C |
| 750) | 1/5/2010 | 3:19:17 | PM | 202 | V | 220 | V | 50 | Hz | 41 | % | 82 | % | 28 | C |
| 751) | 1/5/2010 | 3:19:18 | PM | 202 | V | 220 | V | 50 | Hz | 37 | % | 82 | % | 28 | C |
| 752) | 1/5/2010 | 3:19:19 | PM | 203 | V | 207 | V | 50 | Hz | 38 | % | 83 | % | 28 | C |
| 753) | 1/5/2010 | 3:19:20 | PM | 203 | V | 216 | V | 50 | Hz | 39 | % | 83 | % | 28 | C |
| 754) | 1/5/2010 | 3:19:21 | PM | 201 | V | 220 | V | 50 | Hz | 37 | % | 82 | % | 28 | C |
| 755) | 1/5/2010 | 3:19:22 | PM | 201 | V | 220 | V | 50 | Hz | 41 | % | 82 | % | 28 | C |
| 756) | 1/5/2010 | 3:19:23 | PM | 204 | V | 220 | V | 50 | Hz | 39 | % | 83 | % | 28 | C |
| 758) | 1/5/2010 | 3:19:25 | PM | 204 | V | 221 | V | 50 | Hz | 42 | % | 82 | % | 28 | C |
| 759) | 1/5/2010 | 3:19:26 | PM | 205 | V | 221 | V | 50 | Hz | 36 | % | 82 | % | 28 | C |
| 760) | 1/5/2010 | 3:19:27 | PM | 204 | V | 220 | V | 50 | Hz | 38 | % | 82 | % | 28 | C |
| 761) | 1/5/2010 | 3:19:28 | PM | 204 | V | 217 | V | 50 | Hz | 38 | % | 82 | % | 28 | C |
| 762) | 1/5/2010 | 3:19:29 | PM | 205 | V | 220 | V | 50 | Hz | 37 | % | 82 | % | 28 | C |

FIG. 6 - 75

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 763) | 1/5/2010 | 3:19:30 | PM | 209 | V | 221 | V | 50 | Hz | 37 | % | 82 | % | 28 | C |
| 764) | 1/5/2010 | 3:19:31 | PM | 205 | V | 204 | V | 50 | Hz | 41 | % | 82 | % | 28 | C |
| 765) | 1/5/2010 | 3:19:32 | PM | 205 | V | 211 | V | 50 | Hz | 41 | % | 82 | % | 28 | C |
| 766) | 1/5/2010 | 3:19:33 | PM | 204 | V | 217 | V | 50 | Hz | 38 | % | 82 | % | 28 | C |
| 767) | 1/5/2010 | 3:19:34 | PM | 202 | V | 220 | V | 50 | Hz | 42 | % | 82 | % | 28 | C |
| 768) | 1/5/2010 | 3:19:35 | PM | 203 | V | 220 | V | 50 | Hz | 40 | % | 83 | % | 28 | C |
| 769) | 1/5/2010 | 3:19:37 | PM | 203 | V | 219 | V | 50 | Hz | 38 | % | 83 | % | 28 | C |
| 770) | 1/5/2010 | 3:19:39 | PM | 203 | V | 220 | V | 50 | Hz | 40 | % | 83 | % | 28 | C |
| 771) | 1/5/2010 | 3:19:40 | PM | 202 | V | 218 | V | 50 | Hz | 42 | % | 83 | % | 29 | C |
| 772) | 1/5/2010 | 3:19:41 | PM | 202 | V | 220 | V | 50 | Hz | 40 | % | 83 | % | 28 | C |
| 773) | 1/5/2010 | 3:19:42 | PM | 202 | V | 220 | V | 50 | Hz | 37 | % | 82 | % | 28 | C |
| 774) | 1/5/2010 | 3:19:43 | PM | 202 | V | 220 | V | 50 | Hz | 40 | % | 83 | % | 28 | C |
| 775) | 1/5/2010 | 3:19:44 | PM | 204 | V | 220 | V | 50 | Hz | 41 | % | 82 | % | 28 | C |
| 776) | 1/5/2010 | 3:19:46 | PM | 207 | V | 221 | V | 50 | Hz | 42 | % | 82 | % | 28 | C |
| 777) | 1/5/2010 | 3:19:47 | PM | 201 | V | 220 | V | 51 | Hz | 35 | % | 83 | % | 28 | C |
| 778) | 1/5/2010 | 3:19:48 | PM | 203 | V | 214 | V | 50 | Hz | 39 | % | 83 | % | 28 | C |
| 779) | 1/5/2010 | 3:19:49 | PM | 204 | V | 221 | V | 50 | Hz | 37 | % | 82 | % | 28 | C |
| 780) | 1/5/2010 | 3:19:50 | PM | 204 | V | 221 | V | 50 | Hz | 38 | % | 83 | % | 28 | C |
| 781) | 1/5/2010 | 3:19:51 | PM | 204 | V | 221 | V | 50 | Hz | 38 | % | 83 | % | 28 | C |
| 782) | 1/5/2010 | 3:19:52 | PM | 202 | V | 220 | V | 50 | Hz | 41 | % | 82 | % | 28 | C |
| 783) | 1/5/2010 | 3:19:53 | PM | 202 | V | 220 | V | 50 | Hz | 39 | % | 83 | % | 28 | C |
| 784) | 1/5/2010 | 3:19:54 | PM | 204 | V | 220 | V | 50 | Hz | 40 | % | 83 | % | 28 | C |
| 785) | 1/5/2010 | 3:19:55 | PM | 203 | V | 219 | V | 50 | Hz | 42 | % | 82 | % | 28 | C |
| 786) | 1/5/2010 | 3:19:56 | PM | 204 | V | 220 | V | 50 | Hz | 40 | % | 82 | % | 28 | C |
| 787) | 1/5/2010 | 3:19:57 | PM | 203 | V | 220 | V | 50 | Hz | 38 | % | 83 | % | 28 | C |
| 788) | 1/5/2010 | 3:19:58 | PM | 203 | V | 221 | V | 50 | Hz | 40 | % | 82 | % | 29 | C |
| 789) | 1/5/2010 | 3:19:59 | PM | 204 | V | 220 | V | 50 | Hz | 41 | % | 82 | % | 28 | C |
| 790) | 1/5/2010 | 3:20:00 | PM | 203 | V | 220 | V | 50 | Hz | 42 | % | 83 | % | 28 | C |

FIG. 6 - 76

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 791) | 1/5/2010 | 3:20:01 | PM | 202 | V | 220 | V | 50 | Hz | 40 | % | 82 | % | 28 | C |
| 792) | 1/5/2010 | 3:20:02 | PM | 203 | V | 220 | V | 50 | Hz | 40 | % | 83 | % | 28 | C |
| 793) | 1/5/2010 | 3:20:03 | PM | 201 | V | 218 | V | 50 | Hz | 44 | % | 82 | % | 28 | C |
| 794) | 1/5/2010 | 3:20:04 | PM | 201 | V | 219 | V | 50 | Hz | 37 | % | 83 | % | 28 | C |
| 795) | 1/5/2010 | 3:20:05 | PM | 204 | V | 220 | V | 50 | Hz | 41 | % | 83 | % | 28 | C |
| 796) | 1/5/2010 | 3:20:06 | PM | 203 | V | 220 | V | 50 | Hz | 39 | % | 83 | % | 28 | C |
| 798) | 1/5/2010 | 3:20:09 | PM | 203 | V | 220 | V | 50 | Hz | 40 | % | 82 | % | 28 | C |
| 799) | 1/5/2010 | 3:20:11 | PM | 204 | V | 221 | V | 50 | Hz | 40 | % | 82 | % | 28 | C |
| 800) | 1/5/2010 | 3:20:12 | PM | 203 | V | 221 | V | 50 | Hz | 38 | % | 83 | % | 28 | C |
| 801) | 1/5/2010 | 3:20:13 | PM | 204 | V | 202 | V | 50 | Hz | 43 | % | 82 | % | 28 | C |
| 802) | 1/5/2010 | 3:20:14 | PM | 203 | V | 221 | V | 50 | Hz | 39 | % | 83 | % | 28 | C |
| 803) | 1/5/2010 | 3:20:15 | PM | 204 | V | 220 | V | 50 | Hz | 39 | % | 83 | % | 28 | C |
| 804) | 1/5/2010 | 3:20:16 | PM | 203 | V | 219 | V | 50 | Hz | 38 | % | 83 | % | 28 | C |
| 805) | 1/5/2010 | 3:20:17 | PM | 202 | V | 220 | V | 50 | Hz | 36 | % | 83 | % | 28 | C |
| 806) | 1/5/2010 | 3:20:18 | PM | 203 | V | 220 | V | 49 | Hz | 40 | % | 82 | % | 28 | C |
| 807) | 1/5/2010 | 3:20:19 | PM | 203 | V | 220 | V | 50 | Hz | 38 | % | 83 | % | 28 | C |
| 808) | 1/5/2010 | 3:20:20 | PM | 204 | V | 215 | V | 50 | Hz | 44 | % | 85 | % | 28 | C |
| 809) | 1/5/2010 | 3:20:21 | PM | 207 | V | 220 | V | 50 | Hz | 41 | % | 83 | % | 28 | C |
| 810) | 1/5/2010 | 3:20:22 | PM | 204 | V | 220 | V | 50 | Hz | 37 | % | 83 | % | 28 | C |
| 811) | 1/5/2010 | 3:20:23 | PM | 204 | V | 220 | V | 50 | Hz | 40 | % | 83 | % | 28 | C |
| 812) | 1/5/2010 | 3:20:24 | PM | 204 | V | 220 | V | 49 | Hz | 38 | % | 83 | % | 28 | C |
| 813) | 1/5/2010 | 3:20:25 | PM | 204 | V | 218 | V | 50 | Hz | 36 | % | 83 | % | 28 | C |
| 814) | 1/5/2010 | 3:20:26 | PM | 204 | V | 219 | V | 50 | Hz | 35 | % | 83 | % | 28 | C |
| 815) | 1/5/2010 | 3:20:27 | PM | 204 | V | 219 | V | 50 | Hz | 36 | % | 83 | % | 28 | C |
| 816) | 1/5/2010 | 3:20:28 | PM | 204 | V | 219 | V | 50 | Hz | 40 | % | 83 | % | 28 | C |
| 817) | 1/5/2010 | 3:20:29 | PM | 204 | V | 213 | V | 50 | Hz | 44 | % | 83 | % | 28 | C |
| 818) | 1/5/2010 | 3:20:30 | PM | 204 | V | 220 | V | 50 | Hz | 42 | % | 83 | % | 28 | C |
| 819) | 1/5/2010 | 3:20:31 | PM | 204 | V | 220 | V | 50 | Hz | 39 | % | 83 | % | 28 | C |

FIG. 6 - 77

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 820) | 1/5/2010 | 3:20:32 | PM | 204 | V | 219 | V | 50 | Hz | 48 | % | 83 | % | 28 | C |
| 821) | 1/5/2010 | 3:20:33 | PM | 204 | V | 219 | V | 50 | Hz | 48 | % | 82 | % | 28 | C |
| 822) | 1/5/2010 | 3:20:34 | PM | 204 | V | 220 | V | 50 | Hz | 48 | % | 83 | % | 28 | C |
| 823) | 1/5/2010 | 3:20:35 | PM | 202 | V | 217 | V | 50 | Hz | 49 | % | 83 | % | 28 | C |
| 824) | 1/5/2010 | 3:20:36 | PM | 199 | V | 215 | V | 50 | Hz | 56 | % | 83 | % | 28 | C |
| 825) | 1/5/2010 | 3:20:37 | PM | 201 | V | 219 | V | 50 | Hz | 56 | % | 83 | % | 28 | C |
| 826) | 1/5/2010 | 3:20:38 | PM | 195 | V | 220 | V | 50 | Hz | 90 | % | 85 | % | 28 | C |
| 827) | 1/5/2010 | 3:20:40 | PM | 200 | V | 211 | V | 51 | Hz | 86 | % | 82 | % | 28 | C |
| 828) | 1/5/2010 | 3:20:42 | PM | 199 | V | 219 | V | 50 | Hz | 101 | % | 85 | % | 28 | C |
| 829) | 1/5/2010 | 3:20:43 | PM | 205 | V | 203 | V | 50 | Hz | 91 | % | 85 | % | 28 | C |
| 830) | 1/5/2010 | 3:20:44 | PM | 195 | V | 217 | V | 51 | Hz | 95 | % | 87 | % | 28 | C |
| 831) | 1/5/2010 | 3:20:45 | PM | 201 | V | 217 | V | 50 | Hz | 97 | % | 85 | % | 28 | C |
| 832) | 1/5/2010 | 3:20:46 | PM | 193 | V | 222 | V | 50 | Hz | 97 | % | 85 | % | 28 | C |
| 833) | 1/5/2010 | 3:20:47 | PM | 198 | V | 218 | V | 50 | Hz | 91 | % | 83 | % | 28 | C |
| 834) | 1/5/2010 | 3:20:48 | PM | 193 | V | 203 | V | 50 | Hz | 92 | % | 83 | % | 28 | C |
| 835) | 1/5/2010 | 3:20:49 | PM | 188 | V | 221 | V | 50 | Hz | 86 | % | 83 | % | 28 | C |
| 836) | 1/5/2010 | 3:20:50 | PM | 195 | V | 212 | V | 50 | Hz | 92 | % | 87 | % | 28 | C |
| 838) | 1/5/2010 | 3:20:52 | PM | 195 | V | 213 | V | 49 | Hz | 99 | % | 85 | % | 28 | C |
| 839) | 1/5/2010 | 3:20:53 | PM | 195 | V | 214 | V | 50 | Hz | 91 | % | 85 | % | 28 | C |
| 840) | 1/5/2010 | 3:20:54 | PM | 200 | V | 218 | V | 51 | Hz | 85 | % | 83 | % | 28 | C |
| 841) | 1/5/2010 | 3:20:55 | PM | 199 | V | 220 | V | 50 | Hz | 94 | % | 83 | % | 28 | C |
| 842) | 1/5/2010 | 3:20:56 | PM | 197 | V | 222 | V | 50 | Hz | 98 | % | 87 | % | 28 | C |
| 843) | 1/5/2010 | 3:20:57 | PM | 194 | V | 217 | V | 50 | Hz | 88 | % | 87 | % | 21 | C |
| 844) | 1/5/2010 | 3:20:58 | PM | 190 | V | 220 | V | 50 | Hz | 87 | % | 80 | % | 28 | C |
| 845) | 1/5/2010 | 3:20:59 | PM | 190 | V | 211 | V | 49 | Hz | 86 | % | 85 | % | 20 | C |
| 846) | 1/5/2010 | 3:21:00 | PM | 200 | V | 218 | V | 50 | Hz | 85 | % | 87 | % | 96 | C |
| 847) | 1/5/2010 | 3:21:01 | PM | 192 | V | 220 | V | 49 | Hz | 83 | % | 82 | % | 28 | C |
| 848) | 1/5/2010 | 3:21:02 | PM | 189 | V | 221 | V | 50 | Hz | 73 | % | 87 | % | 28 | C |

FIG. 6 - 78

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 849) | 1/5/2010 | 3:21:03 | PM | 206 | V | 217 | V | 50 | Hz | 100 | % | 82 | % | 28 | C |
| 850) | 1/5/2010 | 3:21:04 | PM | 197 | V | 220 | V | 50 | Hz | 89 | % | 85 | % | 28 | C |
| 851) | 1/5/2010 | 3:21:05 | PM | 195 | V | 203 | V | 49 | Hz | 103 | % | 83 | % | 28 | C |
| 852) | 1/5/2010 | 3:21:06 | PM | 196 | V | 220 | V | 49 | Hz | 91 | % | 83 | % | 28 | C |
| 853) | 1/5/2010 | 3:21:07 | PM | 194 | V | 208 | V | 49 | Hz | 99 | % | 83 | % | 28 | C |
| 854) | 1/5/2010 | 3:21:08 | PM | 195 | V | 219 | V | 49 | Hz | 102 | % | 83 | % | 28 | C |
| 855) | 1/5/2010 | 3:21:09 | PM | 193 | V | 217 | V | 50 | Hz | 94 | % | 83 | % | 28 | C |
| 856) | 1/5/2010 | 3:21:11 | PM | 195 | V | 219 | V | 50 | Hz | 91 | % | 83 | % | 28 | C |
| 857) | 1/5/2010 | 3:21:13 | PM | 194 | V | 224 | V | 51 | Hz | 95 | % | 83 | % | 28 | C |
| 858) | 1/5/2010 | 3:21:14 | PM | 199 | V | 212 | V | 49 | Hz | 95 | % | 83 | % | 28 | C |
| 859) | 1/5/2010 | 3:21:15 | PM | 196 | V | 218 | V | 51 | Hz | 90 | % | 83 | % | 28 | C |
| 860) | 1/5/2010 | 3:21:16 | PM | 199 | V | 224 | V | 50 | Hz | 98 | % | 82 | % | 24 | C |
| 861) | 1/5/2010 | 3:21:17 | PM | 197 | V | 222 | V | 50 | Hz | 99 | % | 83 | % | 28 | C |
| 862) | 1/5/2010 | 3:21:18 | PM | 193 | V | 223 | V | 50 | Hz | 107 | % | 83 | % | 28 | C |
| 863) | 1/5/2010 | 3:21:19 | PM | 193 | V | 225 | V | 51 | Hz | 94 | % | 87 | % | 28 | C |
| 864) | 1/5/2010 | 3:21:20 | PM | 192 | V | 223 | V | 50 | Hz | 90 | % | 85 | % | 28 | C |
| 865) | 1/5/2010 | 3:21:21 | PM | 194 | V | 215 | V | 50 | Hz | 89 | % | 83 | % | 28 | C |
| 866) | 1/5/2010 | 3:21:22 | PM | 194 | V | 217 | V | 50 | Hz | 95 | % | 83 | % | 28 | C |
| 867) | 1/5/2010 | 3:21:23 | PM | 194 | V | 207 | V | 50 | Hz | 88 | % | 83 | % | 28 | C |
| 868) | 1/5/2010 | 3:21:24 | PM | 195 | V | 224 | V | 50 | Hz | 85 | % | 85 | % | 28 | C |
| 869) | 1/5/2010 | 3:21:25 | PM | 202 | V | 210 | V | 50 | Hz | 91 | % | 85 | % | 28 | C |
| 870) | 1/5/2010 | 3:21:26 | PM | 198 | V | 215 | V | 51 | Hz | 89 | % | 85 | % | 23 | C |
| 871) | 1/5/2010 | 3:21:27 | PM | 209 | V | 221 | V | 50 | Hz | 95 | % | 85 | % | 28 | C |
| 872) | 1/5/2010 | 3:21:28 | PM | 195 | V | 222 | V | 51 | Hz | 93 | % | 85 | % | 28 | C |
| 873) | 1/5/2010 | 3:21:29 | PM | 193 | V | 222 | V | 50 | Hz | 95 | % | 87 | % | 28 | C |
| 874) | 1/5/2010 | 3:21:30 | PM | 194 | V | 222 | V | 51 | Hz | 90 | % | 85 | % | 28 | C |
| 875) | 1/5/2010 | 3:21:31 | PM | 194 | V | 206 | V | 50 | Hz | 97 | % | 85 | % | 28 | C |
| 876) | 1/5/2010 | 3:21:32 | PM | 196 | V | 211 | V | 50 | Hz | 89 | % | 85 | % | 28 | C |

FIG. 6 - 79

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 878) | 1/5/2010 | 3:21:34 | PM | 192 | V | 220 | V | 50 | Hz | 94 | % | 85 | % | 28 | C |
| 879) | 1/5/2010 | 3:21:35 | PM | 192 | V | 217 | V | 49 | Hz | 99 | % | 88 | % | 28 | C |
| 880) | 1/5/2010 | 3:21:36 | PM | 189 | V | 216 | V | 50 | Hz | 73 | % | 87 | % | 28 | C |
| 881) | 1/5/2010 | 3:21:37 | PM | 192 | V | 215 | V | 50 | Hz | 98 | % | 85 | % | 28 | C |
| 882) | 1/5/2010 | 3:21:38 | PM | 194 | V | 212 | V | 49 | Hz | 101 | % | 87 | % | 28 | C |
| 883) | 1/5/2010 | 3:21:39 | PM | 194 | V | 211 | V | 49 | Hz | 90 | % | 87 | % | 28 | C |
| 884) | 1/5/2010 | 3:21:40 | PM | 194 | V | 211 | V | 49 | Hz | 87 | % | 83 | % | 28 | C |
| 885) | 1/5/2010 | 3:21:42 | PM | 198 | V | 224 | V | 50 | Hz | 86 | % | 85 | % | 28 | C |
| 886) | 1/5/2010 | 3:21:44 | PM | 202 | V | 223 | V | 49 | Hz | 98 | % | 87 | % | 22 | C |
| 887) | 1/5/2010 | 3:21:45 | PM | 198 | V | 217 | V | 49 | Hz | 93 | % | 88 | % | 28 | C |
| 888) | 1/5/2010 | 3:21:46 | PM | 199 | V | 198 | V | 50 | Hz | 84 | % | 83 | % | 28 | C |
| 889) | 1/5/2010 | 3:21:47 | PM | 196 | V | 213 | V | 49 | Hz | 88 | % | 85 | % | 28 | C |
| 890) | 1/5/2010 | 3:21:48 | PM | 199 | V | 221 | V | 49 | Hz | 96 | % | 83 | % | 28 | C |
| 891) | 1/5/2010 | 3:21:49 | PM | 199 | V | 216 | V | 49 | Hz | 91 | % | 83 | % | 28 | C |
| 892) | 1/5/2010 | 3:21:50 | PM | 197 | V | 219 | V | 50 | Hz | 95 | % | 83 | % | 28 | C |
| 893) | 1/5/2010 | 3:21:51 | PM | 198 | V | 199 | V | 49 | Hz | 96 | % | 82 | % | 28 | C |
| 894) | 1/5/2010 | 3:21:52 | PM | 193 | V | 217 | V | 50 | Hz | 98 | % | 85 | % | 28 | C |
| 895) | 1/5/2010 | 3:21:53 | PM | 196 | V | 216 | V | 49 | Hz | 96 | % | 83 | % | 28 | C |
| 896) | 1/5/2010 | 3:21:55 | PM | 196 | V | 222 | V | 49 | Hz | 95 | % | 83 | % | 28 | C |
| 897) | 1/5/2010 | 3:21:56 | PM | 196 | V | 217 | V | 49 | Hz | 95 | % | 83 | % | 28 | C |
| 898) | 1/5/2010 | 3:21:57 | PM | 197 | V | 208 | V | 49 | Hz | 91 | % | 83 | % | 28 | C |
| 899) | 1/5/2010 | 3:21:58 | PM | 196 | V | 216 | V | 50 | Hz | 89 | % | 82 | % | 28 | C |
| 900) | 1/5/2010 | 3:21:59 | PM | 195 | V | 211 | V | 50 | Hz | 85 | % | 83 | % | 28 | C |
| 901) | 1/5/2010 | 3:22:00 | PM | 195 | V | 218 | V | 51 | Hz | 92 | % | 85 | % | 28 | C |
| 902) | 1/5/2010 | 3:22:01 | PM | 189 | V | 217 | V | 50 | Hz | 104 | % | 83 | % | 28 | C |
| 903) | 1/5/2010 | 3:22:02 | PM | 199 | V | 209 | V | 51 | Hz | 102 | % | 83 | % | 28 | C |
| 904) | 1/5/2010 | 3:22:03 | PM | 196 | V | 214 | V | 51 | Hz | 105 | % | 83 | % | 28 | C |
| 905) | 1/5/2010 | 3:22:04 | PM | 195 | V | 225 | V | 51 | Hz | 90 | % | 83 | % | 28 | C |

FIG. 6 - 80

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 906) | 1/5/2010 | 3:22:05 | PM | 197 | V | 219 | V | 51 | Hz | 92 | % | 83 | % | 28 | C |
| 907) | 1/5/2010 | 3:22:06 | PM | 207 | V | 219 | V | 50 | Hz | 93 | % | 83 | % | 28 | C |
| 908) | 1/5/2010 | 3:22:07 | PM | 199 | V | 216 | V | 50 | Hz | 98 | % | 83 | % | 28 | C |
| 909) | 1/5/2010 | 3:22:08 | PM | 200 | V | 196 | V | 50 | Hz | 91 | % | 83 | % | 28 | C |
| 910) | 1/5/2010 | 3:22:09 | PM | 200 | V | 220 | V | 51 | Hz | 98 | % | 83 | % | 28 | C |
| 911) | 1/5/2010 | 3:22:10 | PM | 198 | V | 217 | V | 51 | Hz | 86 | % | 85 | % | 28 | C |
| 912) | 1/5/2010 | 3:22:11 | PM | 190 | V | 222 | V | 50 | Hz | 96 | % | 83 | % | 28 | C |
| 913) | 1/5/2010 | 3:22:13 | PM | 195 | V | 203 | V | 50 | Hz | 93 | % | 82 | % | 28 | C |
| 914) | 1/5/2010 | 3:22:15 | PM | 197 | V | 210 | V | 51 | Hz | 97 | % | 85 | % | 28 | C |
| 915) | 1/5/2010 | 3:22:16 | PM | 198 | V | 219 | V | 51 | Hz | 97 | % | 88 | % | 28 | C |
| 916) | 1/5/2010 | 3:22:17 | PM | 197 | V | 219 | V | 51 | Hz | 85 | % | 85 | % | 28 | C |
| 918) | 1/5/2010 | 3:22:19 | PM | 204 | V | 218 | V | 51 | Hz | 92 | % | 88 | % | 28 | C |
| 919) | 1/5/2010 | 3:22:20 | PM | 194 | V | 222 | V | 50 | Hz | 84 | % | 82 | % | 28 | C |
| 920) | 1/5/2010 | 3:22:21 | PM | 197 | V | 207 | V | 49 | Hz | 94 | % | 90 | % | 28 | C |
| 921) | 1/5/2010 | 3:22:22 | PM | 191 | V | 221 | V | 49 | Hz | 86 | % | 87 | % | 28 | C |
| 922) | 1/5/2010 | 3:22:23 | PM | 196 | V | 216 | V | 49 | Hz | 90 | % | 83 | % | 23 | C |
| 923) | 1/5/2010 | 3:22:24 | PM | 194 | V | 206 | V | 50 | Hz | 96 | % | 87 | % | 28 | C |
| 924) | 1/5/2010 | 3:22:25 | PM | 198 | V | 209 | V | 49 | Hz | 109 | % | 88 | % | 28 | C |
| 925) | 1/5/2010 | 3:22:26 | PM | 192 | V | 217 | V | 49 | Hz | 89 | % | 83 | % | 28 | C |
| 926) | 1/5/2010 | 3:22:27 | PM | 206 | V | 223 | V | 50 | Hz | 90 | % | 87 | % | 28 | C |
| 927) | 1/5/2010 | 3:22:28 | PM | 196 | V | 224 | V | 50 | Hz | 95 | % | 85 | % | 28 | C |
| 928) | 1/5/2010 | 3:22:29 | PM | 196 | V | 189 | V | 49 | Hz | 106 | % | 87 | % | 19 | C |
| 929) | 1/5/2010 | 3:22:30 | PM | 198 | V | 213 | V | 50 | Hz | 93 | % | 85 | % | 28 | C |
| 930) | 1/5/2010 | 3:22:31 | PM | 186 | V | 219 | V | 49 | Hz | 97 | % | 85 | % | 98 | C |
| 931) | 1/5/2010 | 3:22:32 | PM | 198 | V | 215 | V | 49 | Hz | 88 | % | 82 | % | 28 | C |
| 932) | 1/5/2010 | 3:22:33 | PM | 198 | V | 220 | V | 50 | Hz | 101 | % | 85 | % | 28 | C |
| 933) | 1/5/2010 | 3:22:34 | PM | 200 | V | 209 | V | 49 | Hz | 99 | % | 83 | % | 28 | C |
| 934) | 1/5/2010 | 3:22:35 | PM | 196 | V | 220 | V | 50 | Hz | 104 | % | 83 | % | 33 | C |

FIG. 6 - 81

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 935) | 1/5/2010 | 3:22:36 | PM | 200 | V | 207 | V | 50 | Hz | 78 | % | 83 | % | 28 | C |
| 936) | 1/5/2010 | 3:22:37 | PM | 197 | V | 223 | V | 50 | Hz | 43 | % | 85 | % | 28 | C |
| 937) | 1/5/2010 | 3:22:38 | PM | 207 | V | 221 | V | 50 | Hz | 38 | % | 87 | % | 28 | C |
| 938) | 1/5/2010 | 3:22:39 | PM | 206 | V | 212 | V | 50 | Hz | 38 | % | 85 | % | 28 | C |
| 939) | 1/5/2010 | 3:22:40 | PM | 210 | V | 220 | V | 50 | Hz | 41 | % | 87 | % | 28 | C |
| 940) | 1/5/2010 | 3:22:41 | PM | 209 | V | 220 | V | 50 | Hz | 39 | % | 87 | % | 28 | C |
| 941) | 1/5/2010 | 3:22:42 | PM | 210 | V | 221 | V | 50 | Hz | 38 | % | 85 | % | 28 | C |
| 942) | 1/5/2010 | 3:22:44 | PM | 208 | V | 220 | V | 50 | Hz | 40 | % | 85 | % | 28 | C |
| 943) | 1/5/2010 | 3:22:46 | PM | 205 | V | 218 | V | 50 | Hz | 46 | % | 85 | % | 28 | C |
| 944) | 1/5/2010 | 3:22:47 | PM | 206 | V | 219 | V | 50 | Hz | 49 | % | 85 | % | 28 | C |
| 945) | 1/5/2010 | 3:22:48 | PM | 205 | V | 210 | V | 50 | Hz | 47 | % | 85 | % | 28 | C |
| 946) | 1/5/2010 | 3:22:49 | PM | 206 | V | 218 | V | 50 | Hz | 48 | % | 85 | % | 28 | C |
| 947) | 1/5/2010 | 3:22:50 | PM | 206 | V | 218 | V | 50 | Hz | 48 | % | 85 | % | 28 | C |
| 948) | 1/5/2010 | 3:22:51 | PM | 202 | V | 207 | V | 50 | Hz | 59 | % | 85 | % | 28 | C |
| 949) | 1/5/2010 | 3:22:52 | PM | 201 | V | 218 | V | 50 | Hz | 53 | % | 83 | % | 28 | C |
| 950) | 1/5/2010 | 3:22:53 | PM | 199 | V | 217 | V | 50 | Hz | 55 | % | 85 | % | 28 | C |
| 951) | 1/5/2010 | 3:22:54 | PM | 204 | V | 218 | V | 50 | Hz | 55 | % | 83 | % | 28 | C |
| 952) | 1/5/2010 | 3:22:55 | PM | 193 | V | 221 | V | 49 | Hz | 59 | % | 85 | % | 28 | C |
| 953) | 1/5/2010 | 3:22:56 | PM | 202 | V | 220 | V | 50 | Hz | 58 | % | 87 | % | 28 | C |
| 954) | 1/5/2010 | 3:22:57 | PM | 200 | V | 222 | V | 50 | Hz | 63 | % | 83 | % | 28 | C |
| 955) | 1/5/2010 | 3:22:58 | PM | 201 | V | 205 | V | 50 | Hz | 72 | % | 85 | % | 28 | C |
| 956) | 1/5/2010 | 3:22:59 | PM | 200 | V | 221 | V | 50 | Hz | 79 | % | 85 | % | 28 | C |
| 958) | 1/5/2010 | 3:23:01 | PM | 196 | V | 212 | V | 49 | Hz | 90 | % | 87 | % | 28 | C |
| 959) | 1/5/2010 | 3:23:02 | PM | 192 | V | 207 | V | 49 | Hz | 94 | % | 87 | % | 28 | C |
| 960) | 1/5/2010 | 3:23:03 | PM | 198 | V | 219 | V | 50 | Hz | 95 | % | 87 | % | 28 | C |
| 961) | 1/5/2010 | 3:23:04 | PM | 194 | V | 222 | V | 49 | Hz | 89 | % | 85 | % | 28 | C |
| 962) | 1/5/2010 | 3:23 | PM | 196 | V | 222 | V | 50 | Hz | 87 | % | 85 | % | 28 | C |
| 963) | 1/5/2010 | 3:23:06 | PM | 192 | V | 215 | V | 50 | Hz | 97 | % | 87 | % | 28 | C |

FIG. 6 - 82

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 964) | 1/5/2010 | 3:23:07 | PM | 198 | V | 219 | V | 49 | Hz | 101 | % | 83 | % | 28 | C |
| 965) | 1/5/2010 | 3:23:08 | PM | 193 | V | 215 | V | 49 | Hz | 100 | % | 83 | % | 28 | C |
| 966) | 1/5/2010 | 3:23:09 | PM | 199 | V | 221 | V | 50 | Hz | 93 | % | 85 | % | 28 | C |
| 967) | 1/5/2010 | 3:23 | PM | 192 | V | 207 | V | 50 | Hz | 88 | % | 83 | % | 28 | C |
| 968) | 1/5/2010 | 3:23:11 | PM | 198 | V | 222 | V | 49 | Hz | 101 | % | 83 | % | 28 | C |
| 969) | 1/5/2010 | 3:23:12 | PM | 198 | V | 220 | V | 49 | Hz | 90 | % | 85 | % | 28 | C |
| 970) | 1/5/2010 | 3:23:13 | PM | 195 | V | 209 | V | 49 | Hz | 91 | % | 83 | % | 28 | C |
| 971) | 1/5/2010 | 3:23 | PM | 197 | V | 209 | V | 50 | Hz | 96 | % | 87 | % | 28 | C |
| 972) | 1/5/2010 | 3:23:17 | PM | 198 | V | 225 | V | 50 | Hz | 104 | % | 85 | % | 28 | C |
| 973) | 1/5/2010 | 3:23:18 | PM | 197 | V | 224 | V | 50 | Hz | 96 | % | 83 | % | 28 | C |
| 974) | 1/5/2010 | 3:23:19 | PM | 201 | V | 223 | V | 51 | Hz | 94 | % | 85 | % | 28 | C |
| 975) | 1/5/2010 | 3:23 | PM | 197 | V | 224 | V | 50 | Hz | 96 | % | 83 | % | 28 | C |
| 976) | 1/5/2010 | 3:23:21 | PM | 195 | V | 190 | V | 50 | Hz | 97 | % | 85 | % | 28 | C |
| 977) | 1/5/2010 | 3:23:22 | PM | 191 | V | 221 | V | 51 | Hz | 99 | % | 87 | % | 28 | C |
| 978) | 1/5/2010 | 3:23:23 | PM | 186 | V | 222 | V | 51 | Hz | 95 | % | 83 | % | 28 | C |
| 979) | 1/5/2010 | 3:23:24 | PM | 191 | V | 222 | V | 50 | Hz | 92 | % | 83 | % | 28 | C |
| 980) | 1/5/2010 | 3:23 | PM | 194 | V | 205 | V | 51 | Hz | 92 | % | 83 | % | 28 | C |
| 981) | 1/5/2010 | 3:23:26 | PM | 197 | V | 223 | V | 51 | Hz | 94 | % | 85 | % | 28 | C |
| 982) | 1/5/2010 | 3:23:27 | PM | 195 | V | 220 | V | 51 | Hz | 85 | % | 83 | % | 28 | C |
| 983) | 1/5/2010 | 3:23:28 | PM | 197 | V | 216 | V | 51 | Hz | 96 | % | 87 | % | 28 | C |
| 984) | 1/5/2010 | 3:23:29 | PM | 196 | V | 217 | V | 50 | Hz | 94 | % | 87 | % | 28 | C |
| 985) | 1/5/2010 | 3:23 | PM | 199 | V | 220 | V | 50 | Hz | 94 | % | 87 | % | 28 | C |
| 986) | 1/5/2010 | 3:23:31 | PM | 194 | V | 202 | V | 50 | Hz | 96 | % | 87 | % | 28 | C |
| 987) | 1/5/2010 | 3:23:32 | PM | 200 | V | 222 | V | 51 | Hz | 86 | % | 85 | % | 28 | C |
| 988) | 1/5/2010 | 3:23:33 | PM | 201 | V | 222 | V | 50 | Hz | 96 | % | 88 | % | 28 | C |
| 989) | 1/5/2010 | 3:23:34 | PM | 196 | V | 214 | V | 50 | Hz | 93 | % | 87 | % | 28 | C |
| 990) | 1/5/2010 | 3:23 | PM | 192 | V | 213 | V | 50 | Hz | 87 | % | 87 | % | 28 | C |
| 991) | 1/5/2010 | 3:23:36 | PM | 191 | V | 223 | V | 50 | Hz | 92 | % | 87 | % | 28 | C |

FIG. 6 - 83

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 992) | 1/5/2010 | 3:23:37 | PM | 197 | V | 221 | V | 49 | Hz | 83 | % | 85 | % | 28 | C |
| 993) | 1/5/2010 | 3:23:38 | PM | 203 | V | 219 | V | 50 | Hz | 89 | % | 87 | % | 28 | C |
| 994) | 1/5/2010 | 3:23:39 | PM | 195 | V | 207 | V | 49 | Hz | 81 | % | 87 | % | 28 | C |
| 995) | 1/5/2010 | 3:23 | PM | 195 | V | 219 | V | 50 | Hz | 66 | % | 87 | % | 28 | C |
| 996) | 1/5/2010 | 3:23:41 | PM | 204 | V | 204 | V | 50 | Hz | 39 | % | 87 | % | 28 | C |
| 998) | 1/5/2010 | 3:23:43 | PM | 207 | V | 220 | V | 50 | Hz | 46 | % | 85 | % | 28 | C |
| 999) | 1/5/2010 | 3:23:44 | PM | 208 | V | 221 | V | 50 | Hz | 41 | % | 85 | % | 28 | C |
| 1000) | 1/5/2010 | 3:23:46 | PM | 206 | V | 219 | V | 50 | Hz | 38 | % | 85 | % | 28 | C |
| 1001) | 1/5/2010 | 3:23:48 | PM | 207 | V | 219 | V | 50 | Hz | 38 | % | 87 | % | 28 | C |
| 1002) | 1/5/2010 | 3:23:49 | PM | 208 | V | 220 | V | 50 | Hz | 37 | % | 85 | % | 28 | C |
| 1003) | 1/5/2010 | 3:23:50 | PM | 208 | V | 219 | V | 49 | Hz | 38 | % | 85 | % | 28 | C |
| 1004) | 1/5/2010 | 3:23:51 | PM | 208 | V | 220 | V | 50 | Hz | 41 | % | 87 | % | 28 | C |
| 1005) | 1/5/2010 | 3:23:52 | PM | 209 | V | 220 | V | 50 | Hz | 40 | % | 87 | % | 28 | C |
| 1006) | 1/5/2010 | 3:23:53 | PM | 208 | V | 220 | V | 50 | Hz | 48 | % | 87 | % | 28 | C |
| 1007) | 1/5/2010 | 3:23:54 | PM | 208 | V | 219 | V | 50 | Hz | 41 | % | 85 | % | 28 | C |
| 1008) | 1/5/2010 | 3:23:55 | PM | 208 | V | 219 | V | 50 | Hz | 42 | % | 87 | % | 28 | C |
| 1009) | 1/5/2010 | 3:23:56 | PM | 207 | V | 218 | V | 50 | Hz | 44 | % | 87 | % | 28 | C |
| 1010) | 1/5/2010 | 3:23:57 | PM | 207 | V | 205 | V | 50 | Hz | 41 | % | 85 | % | 28 | C |
| 1011) | 1/5/2010 | 3:23:58 | PM | 208 | V | 217 | V | 49 | Hz | 43 | % | 85 | % | 28 | C |
| 1012) | 1/5/2010 | 3:23:59 | PM | 208 | V | 221 | V | 50 | Hz | 36 | % | 87 | % | 28 | C |
| 1013) | 1/5/2010 | 3:24:00 | PM | 209 | V | 220 | V | 50 | Hz | 41 | % | 87 | % | 28 | C |
| 1014) | 1/5/2010 | 3:24:01 | PM | 206 | V | 220 | V | 50 | Hz | 41 | % | 85 | % | 28 | C |
| 1015) | 1/5/2010 | 3:24:02 | PM | 206 | V | 220 | V | 50 | Hz | 39 | % | 87 | % | 28 | C |
| 1016) | 1/5/2010 | 3:24:03 | PM | 208 | V | 220 | V | 50 | Hz | 41 | % | 87 | % | 28 | C |
| 1017) | 1/5/2010 | 3:24:04 | PM | 207 | V | 217 | V | 50 | Hz | 41 | % | 87 | % | 28 | C |
| 1018) | 1/5/2010 | 3:24:05 | PM | 209 | V | 221 | V | 50 | Hz | 46 | % | 87 | % | 28 | C |
| 1019) | 1/5/2010 | 3:24:06 | PM | 208 | V | 221 | V | 50 | Hz | 43 | % | 85 | % | 28 | C |
| 1020) | 1/5/2010 | 3:24:07 | PM | 207 | V | 221 | V | 50 | Hz | 39 | % | 85 | % | 28 | C |

FIG. 6 - 84

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1021) | 1/5/2010 | 3:24:08 | PM | 209 | V | 221 | V | 50 | Hz | 41 | % | 87 | % | 28 | C |
| 1022) | 1/5/2010 | 3:24:09 | PM | 208 | V | 220 | V | 50 | Hz | 40 | % | 87 | % | 28 | C |
| 1023) | 1/5/2010 | 3:24:10 | PM | 207 | V | 219 | V | 50 | Hz | 42 | % | 87 | % | 28 | C |
| 1024) | 1/5/2010 | 3:24:11 | PM | 207 | V | 221 | V | 50 | Hz | 38 | % | 85 | % | 28 | C |
| 1025) | 1/5/2010 | 3:24:12 | PM | 20 | V | 218 | V | 0 | Hz | 35 | % | 86 | % | 28 | C |
| 1026) | 1/5/2010 | 3:24:13 | PM | 2 | V | 218 | V | 0 | Hz | 36 | % | 87 | % | 28 | C |
| 1027) | 1/5/2010 | 3:24:14 | PM | 2 | V | 218 | V | 0 | Hz | 38 | % | 87 | % | 28 | C |
| 1028) | 1/5/2010 | 3:24:15 | PM | 2 | V | 218 | V | 0 | Hz | 38 | % | 87 | % | 28 | C |
| 1029) | 1/5/2010 | 3:24:17 | PM | 2 | V | 218 | V | 0 | Hz | 38 | % | 87 | % | 28 | C |
| 1030) | 1/5/2010 | 3:24:19 | PM | 2 | V | 218 | V | 0 | Hz | 38 | % | 87 | % | 28 | C |
| 1031) | 1/5/2010 | 3:24:20 | PM | 2 | V | 218 | V | 0 | Hz | 38 | % | 85 | % | 27 | C |
| 1032) | 1/5/2010 | 3:24:21 | PM | 2 | V | 218 | V | 0 | Hz | 38 | % | 87 | % | 27 | C |
| 1033) | 1/5/2010 | 3:24:22 | PM | 2 | V | 218 | V | 0 | Hz | 39 | % | 87 | % | 28 | C |
| 1034) | 1/5/2010 | 3:24:23 | PM | 2 | V | 218 | V | 0 | Hz | 38 | % | 85 | % | 27 | C |
| 1035) | 1/5/2010 | 3:24:24 | PM | 2 | V | 218 | V | 0 | Hz | 36 | % | 85 | % | 27 | C |
| 1036) | 1/5/2010 | 3:24:25 | PM | 2 | V | 218 | V | 0 | Hz | 36 | % | 85 | % | 28 | C |
| 1038) | 1/5/2010 | 3:24:27 | PM | 2 | V | 218 | V | 0 | Hz | 36 | % | 85 | % | 28 | C |
| 1039) | 1/5/2010 | 3:24:28 | PM | 2 | V | 218 | V | 0 | Hz | 36 | % | 85 | % | 28 | C |
| 1040) | 1/5/2010 | 3:24:29 | PM | 2 | V | 218 | V | 0 | Hz | 36 | % | 85 | % | 28 | C |
| 1041) | 1/5/2010 | 3:24:30 | PM | 2 | V | 218 | V | 0 | Hz | 36 | % | 85 | % | 28 | C |
| 1042) | 1/5/2010 | 3:24:31 | PM | 2 | V | 218 | V | 0 | Hz | 36 | % | 85 | % | 28 | C |
| 1043) | 1/5/2010 | 3:24:32 | PM | 2 | V | 218 | V | 0 | Hz | 38 | % | 85 | % | 28 | C |
| 1044) | 1/5/2010 | 3:24:33 | PM | 2 | V | 218 | V | 0 | Hz | 38 | % | 85 | % | 28 | C |
| 1045) | 1/5/2010 | 3:24:34 | PM | 2 | V | 218 | V | 0 | Hz | 38 | % | 85 | % | 28 | C |
| 1046) | 1/5/2010 | 3:24:35 | PM | 2 | V | 218 | V | 0 | Hz | 38 | % | 85 | % | 28 | C |
| 1047) | 1/5/2010 | 3:24:36 | PM | 2 | V | 218 | V | 0 | Hz | 38 | % | 83 | % | 27 | C |
| 1048) | 1/5/2010 | 3:24:37 | PM | 2 | V | 219 | V | 0 | Hz | 38 | % | 83 | % | 27 | C |
| 1049) | 1/5/2010 | 3:24:38 | PM | 2 | V | 219 | V | 0 | Hz | 38 | % | 83 | % | 27 | C |

FIG. 6 - 85

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1050) | 1/5/2010 | 3:24:39 | PM | 2 | V | 219 | V | 0 | Hz | 38 | % | 83 | % | 27 | C |
| 1051) | 1/5/2010 | 3:24:40 | PM | 2 | V | 219 | V | 0 | Hz | 38 | % | 83 | % | 27 | C |
| 1052) | 1/5/2010 | 3:24:41 | PM | 2 | V | 218 | V | 0 | Hz | 38 | % | 83 | % | 27 | C |
| 1053) | 1/5/2010 | 3:24:42 | PM | 2 | V | 219 | V | 0 | Hz | 36 | % | 83 | % | 27 | C |
| 1054) | 1/5/2010 | 3:24:43 | PM | 2 | V | 219 | V | 0 | Hz | 36 | % | 83 | % | 28 | C |
| 1055) | 1/5/2010 | 3:24:44 | PM | 2 | V | 218 | V | 0 | Hz | 36 | % | 83 | % | 27 | C |
| 1056) | 1/5/2010 | 3:24:45 | PM | 2 | V | 218 | V | 0 | Hz | 36 | % | 83 | % | 27 | C |
| 1057) | 1/5/2010 | 3:24:46 | PM | 2 | V | 218 | V | 0 | Hz | 36 | % | 83 | % | 28 | C |
| 1058) | 1/5/2010 | 3:24:48 | PM | 2 | V | 218 | V | 0 | Hz | 36 | % | 83 | % | 28 | C |
| 1059) | 1/5/2010 | 3:24:50 | PM | 2 | V | 218 | V | 0 | Hz | 36 | % | 82 | % | 28 | C |
| 1060) | 1/5/2010 | 3:24:51 | PM | 2 | V | 218 | V | 0 | Hz | 38 | % | 82 | % | 28 | C |
| 1061) | 1/5/2010 | 3:24:52 | PM | 2 | V | 218 | V | 0 | Hz | 38 | % | 83 | % | 28 | C |
| 1062) | 1/5/2010 | 3:24:53 | PM | 2 | V | 218 | V | 0 | Hz | 38 | % | 83 | % | 28 | C |
| 1063) | 1/5/2010 | 3:24:54 | PM | 2 | V | 218 | V | 0 | Hz | 38 | % | 82 | % | 28 | C |
| 1064) | 1/5/2010 | 3:24:55 | PM | 2 | V | 218 | V | 0 | Hz | 38 | % | 82 | % | 27 | C |
| 1065) | 1/5/2010 | 3:24:56 | PM | 2 | V | 218 | V | 0 | Hz | 38 | % | 83 | % | 27 | C |
| 1066) | 1/5/2010 | 3:24:57 | PM | 2 | V | 218 | V | 0 | Hz | 38 | % | 82 | % | 27 | C |
| 1067) | 1/5/2010 | 3:24:58 | PM | 2 | V | 218 | V | 0 | Hz | 38 | % | 83 | % | 27 | C |
| 1068) | 1/5/2010 | 3:24:59 | PM | 2 | V | 218 | V | 0 | Hz | 38 | % | 83 | % | 28 | C |
| 1069) | 1/5/2010 | 3:25:00 | PM | 2 | V | 218 | V | 0 | Hz | 38 | % | 82 | % | 27 | C |
| 1070) | 1/5/2010 | 3:25:01 | PM | 2 | V | 218 | V | 0 | Hz | 36 | % | 83 | % | 27 | C |
| 1071) | 1/5/2010 | 3:25:02 | PM | 2 | V | 217 | V | 0 | Hz | 36 | % | 83 | % | 27 | C |
| 1072) | 1/5/2010 | 3:25:03 | PM | 2 | V | 217 | V | 0 | Hz | 35 | % | 83 | % | 27 | C |
| 1073) | 1/5/2010 | 3:25:04 | PM | 2 | V | 217 | V | 0 | Hz | 35 | % | 83 | % | 28 | C |
| 1074) | 1/5/2010 | 3:25:05 | PM | 2 | V | 218 | V | 0 | Hz | 35 | % | 83 | % | 28 | C |
| 1075) | 1/5/2010 | 3:25:06 | PM | 2 | V | 218 | V | 0 | Hz | 36 | % | 82 | % | 28 | C |
| 1076) | 1/5/2010 | 3:25:07 | PM | 2 | V | 218 | V | 0 | Hz | 36 | % | 82 | % | 28 | C |
| 1078) | 1/5/2010 | 3:25:09 | PM | 2 | V | 218 | V | 0 | Hz | 36 | % | 83 | % | 28 | C |

FIG. 6 - 86

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1079) | 1/5/2010 | 3:25:10 | PM | 2 | V | 218 | V | 0 | Hz | 35 | % | 82 | % | 28 | C |
| 1080) | 1/5/2010 | 3:25:11 | PM | 2 | V | 218 | V | 0 | Hz | 37 | % | 82 | % | 28 | C |
| 1081) | 1/5/2010 | 3:25:12 | PM | 2 | V | 218 | V | 0 | Hz | 38 | % | 82 | % | 28 | C |
| 1082) | 1/5/2010 | 3:25:13 | PM | 2 | V | 218 | V | 0 | Hz | 38 | % | 82 | % | 28 | C |
| 1083) | 1/5/2010 | 3:25:14 | PM | 2 | V | 218 | V | 0 | Hz | 38 | % | 82 | % | 27 | C |
| 1084) | 1/5/2010 | 3:25:15 | PM | 2 | V | 218 | V | 0 | Hz | 38 | % | 82 | % | 28 | C |
| 1085) | 1/5/2010 | 3:25:16 | PM | 2 | V | 219 | V | 0 | Hz | 38 | % | 82 | % | 27 | C |
| 1086) | 1/5/2010 | 3:25:17 | PM | 2 | V | 219 | V | 0 | Hz | 38 | % | 82 | % | 27 | C |
| 1087) | 1/5/2010 | 3:25:19 | PM | 2 | V | 218 | V | 0 | Hz | 38 | % | 82 | % | 27 | C |
| 1088) | 1/5/2010 | 3:25:21 | PM | 198 | V | 218 | V | 58 | Hz | 36 | % | 82 | % | 28 | C |
| 1089) | 1/5/2010 | 3:25:22 | PM | 198 | V | 219 | V | 50 | Hz | 37 | % | 75 | % | 28 | C |
| 1090) | 1/5/2010 | 3:25:23 | PM | 202 | V | 218 | V | 50 | Hz | 40 | % | 75 | % | 27 | C |
| 1091) | 1/5/2010 | 3:25:24 | PM | 198 | V | 218 | V | 50 | Hz | 37 | % | 78 | % | 28 | C |
| 1092) | 1/5/2010 | 3:25:25 | PM | 199 | V | 219 | V | 50 | Hz | 43 | % | 78 | % | 28 | C |
| 1093) | 1/5/2010 | 3:25:26 | PM | 199 | V | 218 | V | 50 | Hz | 36 | % | 75 | % | 28 | C |
| 1094) | 1/5/2010 | 3:25:27 | PM | 200 | V | 218 | V | 50 | Hz | 37 | % | 75 | % | 28 | C |
| 1095) | 1/5/2010 | 3:25:28 | PM | 200 | V | 218 | V | 50 | Hz | 40 | % | 77 | % | 28 | C |
| 1096) | 1/5/2010 | 3:25:29 | PM | 199 | V | 221 | V | 50 | Hz | 40 | % | 77 | % | 28 | C |
| 1097) | 1/5/2010 | 3:25:30 | PM | 199 | V | 219 | V | 50 | Hz | 39 | % | 77 | % | 27 | C |
| 1098) | 1/5/2010 | 3:25:31 | PM | 200 | V | 219 | V | 50 | Hz | 38 | % | 73 | % | 28 | C |
| 1099) | 1/5/2010 | 3:25:32 | PM | 196 | V | 219 | V | 50 | Hz | 39 | % | 73 | % | 94 | C |
| 1100) | 1/5/2010 | 3:25:33 | PM | 196 | V | 218 | V | 50 | Hz | 37 | % | 75 | % | 27 | C |
| 1101) | 1/5/2010 | 3:25:34 | PM | 198 | V | 219 | V | 50 | Hz | 39 | % | 75 | % | 28 | C |
| 1102) | 1/5/2010 | 3:25:35 | PM | 199 | V | 220 | V | 50 | Hz | 38 | % | 77 | % | 28 | C |
| 1103) | 1/5/2010 | 3:25:36 | PM | 202 | V | 219 | V | 50 | Hz | 39 | % | 75 | % | 28 | C |
| 1104) | 1/5/2010 | 3:25:37 | PM | 197 | V | 222 | V | 50 | Hz | 39 | % | 80 | % | 28 | C |
| 1105) | 1/5/2010 | 3:25:38 | PM | 202 | V | 218 | V | 50 | Hz | 39 | % | 80 | % | 28 | C |
| 1106) | 1/5/2010 | 3:25:39 | PM | 202 | V | 220 | V | 50 | Hz | 39 | % | 78 | % | 28 | C |

FIG. 6 - 87

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1107) | 1/5/2010 | 3:25:40 | PM | 204 | V | 220 | V | 50 | Hz | 41 | % | 78 | % | 28 | C |
| 1108) | 1/5/2010 | 3:25:41 | PM | 204 | V | 220 | V | 50 | Hz | 36 | % | 80 | % | 28 | C |
| 1109) | 1/5/2010 | 3:25:42 | PM | 204 | V | 220 | V | 50 | Hz | 38 | % | 82 | % | 28 | C |
| 1110) | 1/5/2010 | 3:25:43 | PM | 203 | V | 198 | V | 50 | Hz | 38 | % | 78 | % | 28 | C |
| 1111) | 1/5/2010 | 3:25:44 | PM | 204 | V | 220 | V | 50 | Hz | 40 | % | 78 | % | 28 | C |
| 1112) | 1/5/2010 | 3:25:45 | PM | 201 | V | 220 | V | 50 | Hz | 39 | % | 78 | % | 28 | C |
| 1113) | 1/5/2010 | 3:25:46 | PM | 202 | V | 220 | V | 50 | Hz | 37 | % | 80 | % | 28 | C |
| 1114) | 1/5/2010 | 3:25:47 | PM | 202 | V | 221 | V | 50 | Hz | 40 | % | 82 | % | 28 | C |
| 1115) | 1/5/2010 | 3:25:48 | PM | 204 | V | 221 | V | 50 | Hz | 39 | % | 82 | % | 28 | C |
| 1116) | 1/5/2010 | 3:25:50 | PM | 204 | V | 222 | V | 50 | Hz | 37 | % | 80 | % | 28 | C |
| 1118) | 1/5/2010 | 3:25:53 | PM | 205 | V | 220 | V | 50 | Hz | 38 | % | 82 | % | 28 | C |
| 1119) | 1/5/2010 | 3:25:54 | PM | 205 | V | 220 | V | 50 | Hz | 44 | % | 80 | % | 28 | C |
| 1120) | 1/5/2010 | 3:25:55 | PM | 205 | V | 195 | V | 50 | Hz | 42 | % | 82 | % | 28 | C |
| 1121) | 1/5/2010 | 3:25:56 | PM | 204 | V | 220 | V | 50 | Hz | 38 | % | 82 | % | 28 | C |
| 1122) | 1/5/2010 | 3:25:57 | PM | 205 | V | 220 | V | 50 | Hz | 41 | % | 82 | % | 28 | C |
| 1123) | 1/5/2010 | 3:25:58 | PM | 204 | V | 220 | V | 50 | Hz | 39 | % | 83 | % | 29 | C |
| 1124) | 1/5/2010 | 3:25:59 | PM | 204 | V | 220 | V | 50 | Hz | 43 | % | 82 | % | 28 | C |
| 1125) | 1/5/2010 | 3:26:00 | PM | 204 | V | 218 | V | 50 | Hz | 43 | % | 82 | % | 28 | C |
| 1126) | 1/5/2010 | 3:26:01 | PM | 203 | V | 215 | V | 50 | Hz | 40 | % | 82 | % | 28 | C |
| 1127) | 1/5/2010 | 3:26:02 | PM | 204 | V | 220 | V | 50 | Hz | 40 | % | 83 | % | 28 | C |
| 1128) | 1/5/2010 | 3:26:03 | PM | 205 | V | 219 | V | 50 | Hz | 38 | % | 82 | % | 28 | C |
| 1129) | 1/5/2010 | 3:26:04 | PM | 206 | V | 220 | V | 50 | Hz | 37 | % | 82 | % | 28 | C |
| 1130) | 1/5/2010 | 3:26:05 | PM | 206 | V | 220 | V | 50 | Hz | 37 | % | 82 | % | 28 | C |
| 1131) | 1/5/2010 | 3:26:06 | PM | 206 | V | 220 | V | 50 | Hz | 41 | % | 83 | % | 28 | C |
| 1132) | 1/5/2010 | 3:26:07 | PM | 206 | V | 216 | V | 50 | Hz | 42 | % | 82 | % | 28 | C |
| 1133) | 1/5/2010 | 3:26:08 | PM | 204 | V | 221 | V | 50 | Hz | 44 | % | 82 | % | 28 | C |
| 1134) | 1/5/2010 | 3:26:09 | PM | 196 | V | 207 | V | 50 | Hz | 41 | % | 83 | % | 28 | C |
| 1135) | 1/5/2010 | 3:26:10 | PM | 207 | V | 221 | V | 50 | Hz | 43 | % | 82 | % | 28 | C |

FIG. 6 - 88

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1136) | 1/5/2010 | 3:26:11 | PM | 207 | V | 202 | V | 50 | Hz | 40 | % | 82 | % | 28 | C |
| 1137) | 1/5/2010 | 3:26:12 | PM | 207 | V | 221 | V | 50 | Hz | 40 | % | 82 | % | 28 | C |
| 1138) | 1/5/2010 | 3:26:13 | PM | 206 | V | 221 | V | 50 | Hz | 39 | % | 83 | % | 28 | C |
| 1139) | 1/5/2010 | 3:26:14 | PM | 207 | V | 213 | V | 50 | Hz | 39 | % | 83 | % | 28 | C |
| 1140) | 1/5/2010 | 3:26:15 | PM | 207 | V | 220 | V | 50 | Hz | 39 | % | 82 | % | 28 | C |
| 1141) | 1/5/2010 | 3:26:16 | PM | 206 | V | 220 | V | 50 | Hz | 40 | % | 82 | % | 28 | C |
| 1142) | 1/5/2010 | 3:26:17 | PM | 207 | V | 220 | V | 50 | Hz | 38 | % | 83 | % | 28 | C |
| 1143) | 1/5/2010 | 3:26:18 | PM | 204 | V | 219 | V | 50 | Hz | 40 | % | 82 | % | 28 | C |
| 1144) | 1/5/2010 | 3:26:19 | PM | 206 | V | 219 | V | 50 | Hz | 38 | % | 82 | % | 28 | C |
| 1145) | 1/5/2010 | 3:26:21 | PM | 207 | V | 220 | V | 50 | Hz | 40 | % | 83 | % | 28 | C |
| 1146) | 1/5/2010 | 3:26:23 | PM | 207 | V | 220 | V | 50 | Hz | 39 | % | 83 | % | 28 | C |
| 1147) | 1/5/2010 | 3:26:24 | PM | 207 | V | 220 | V | 50 | Hz | 37 | % | 82 | % | 28 | C |
| 1148) | 1/5/2010 | 3:26:25 | PM | 200 | V | 220 | V | 50 | Hz | 39 | % | 83 | % | 28 | C |
| 1149) | 1/5/2010 | 3:26:26 | PM | 206 | V | 220 | V | 50 | Hz | 37 | % | 83 | % | 28 | C |
| 1150) | 1/5/2010 | 3:26:27 | PM | 206 | V | 213 | V | 50 | Hz | 39 | % | 83 | % | 28 | C |
| 1151) | 1/5/2010 | 3:26:28 | PM | 205 | V | 220 | V | 50 | Hz | 42 | % | 83 | % | 28 | C |
| 1152) | 1/5/2010 | 3:26:29 | PM | 206 | V | 220 | V | 50 | Hz | 42 | % | 83 | % | 28 | C |
| 1153) | 1/5/2010 | 3:26:30 | PM | 205 | V | 220 | V | 50 | Hz | 40 | % | 83 | % | 28 | C |
| 1154) | 1/5/2010 | 3:26:31 | PM | 204 | V | 220 | V | 50 | Hz | 39 | % | 83 | % | 28 | C |
| 1155) | 1/5/2010 | 3:26:32 | PM | 192 | V | 220 | V | 49 | Hz | 39 | % | 83 | % | 28 | C |
| 1156) | 1/5/2010 | 3:26:33 | PM | 206 | V | 221 | V | 50 | Hz | 37 | % | 83 | % | 28 | C |
| 1158) | 1/5/2010 | 3:26:35 | PM | 202 | V | 199 | V | 50 | Hz | 40 | % | 82 | % | 28 | C |
| 1159) | 1/5/2010 | 3:26:36 | PM | 204 | V | 221 | V | 50 | Hz | 39 | % | 83 | % | 28 | C |
| 1160) | 1/5/2010 | 3:26:37 | PM | 201 | V | 220 | V | 50 | Hz | 38 | % | 83 | % | 28 | C |
| 1161) | 1/5/2010 | 3:26:38 | PM | 205 | V | 220 | V | 50 | Hz | 39 | % | 83 | % | 28 | C |
| 1162) | 1/5/2010 | 3:26:39 | PM | 204 | V | 220 | V | 50 | Hz | 38 | % | 83 | % | 28 | C |
| 1163) | 1/5/2010 | 3:26:40 | PM | 202 | V | 221 | V | 51 | Hz | 33 | % | 83 | % | 28 | C |
| 1164) | 1/5/2010 | 3:26:41 | PM | 205 | V | 205 | V | 50 | Hz | 43 | % | 83 | % | 28 | C |

FIG. 6 - 89

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1165) | 1/5/2010 | 3:26:42 | PM | 205 | V | 220 | V | 50 | Hz | 39 | % | 83 | % | 28 | C |
| 1166) | 1/5/2010 | 3:26:43 | PM | 204 | V | 220 | V | 50 | Hz | 39 | % | 83 | % | 28 | C |
| 1167) | 1/5/2010 | 3:26:44 | PM | 203 | V | 219 | V | 50 | Hz | 40 | % | 83 | % | 28 | C |
| 1168) | 1/5/2010 | 3:26:45 | PM | 204 | V | 220 | V | 50 | Hz | 45 | % | 83 | % | 28 | C |
| 1169) | 1/5/2010 | 3:26:46 | PM | 204 | V | 220 | V | 50 | Hz | 42 | % | 83 | % | 28 | C |
| 1170) | 1/5/2010 | 3:26:47 | PM | 207 | V | 220 | V | 51 | Hz | 37 | % | 85 | % | 28 | C |
| 1171) | 1/5/2010 | 3:26:48 | PM | 205 | V | 220 | V | 50 | Hz | 39 | % | 83 | % | 28 | C |
| 1172) | 1/5/2010 | 3:26:49 | PM | 205 | V | 220 | V | 50 | Hz | 36 | % | 83 | % | 28 | C |
| 1173) | 1/5/2010 | 3:26:50 | PM | 205 | V | 221 | V | 50 | Hz | 40 | % | 85 | % | 28 | C |
| 1174) | 1/5/2010 | 3:26:52 | PM | 206 | V | 220 | V | 50 | Hz | 42 | % | 83 | % | 28 | C |
| 1175) | 1/5/2010 | 3:26:54 | PM | 205 | V | 220 | V | 50 | Hz | 45 | % | 83 | % | 28 | C |
| 1176) | 1/5/2010 | 3:26:55 | PM | 205 | V | 220 | V | 50 | Hz | 41 | % | 85 | % | 28 | C |
| 1177) | 1/5/2010 | 3:26:56 | PM | 204 | V | 221 | V | 50 | Hz | 43 | % | 83 | % | 28 | C |
| 1178) | 1/5/2010 | 3:26:57 | PM | 206 | V | 220 | V | 50 | Hz | 38 | % | 85 | % | 28 | C |
| 1179) | 1/5/2010 | 3:26:58 | PM | 204 | V | 220 | V | 50 | Hz | 45 | % | 83 | % | 28 | C |
| 1180) | 1/5/2010 | 3:27:00 | PM | 204 | V | 203 | V | 51 | Hz | 41 | % | 83 | % | 28 | C |
| 1181) | 1/5/2010 | 3:27:01 | PM | 205 | V | 220 | V | 50 | Hz | 46 | % | 83 | % | 28 | C |
| 1182) | 1/5/2010 | 3:27:02 | PM | 205 | V | 220 | V | 50 | Hz | 50 | % | 83 | % | 28 | C |
| 1183) | 1/5/2010 | 3:27:03 | PM | 205 | V | 220 | V | 50 | Hz | 49 | % | 83 | % | 28 | C |
| 1184) | 1/5/2010 | 3:27:04 | PM | 205 | V | 220 | V | 50 | Hz | 53 | % | 83 | % | 28 | C |
| 1185) | 1/5/2010 | 3:27:05 | PM | 205 | V | 211 | V | 50 | Hz | 44 | % | 83 | % | 28 | C |
| 1186) | 1/5/2010 | 3:27:06 | PM | 205 | V | 211 | V | 50 | Hz | 44 | % | 83 | % | 28 | C |
| 1187) | 1/5/2010 | 3:27:07 | PM | 195 | V | 218 | V | 50 | Hz | 45 | % | 82 | % | 28 | C |
| 1188) | 1/5/2010 | 3:27:08 | PM | 202 | V | 222 | V | 50 | Hz | 47 | % | 87 | % | 28 | C |
| 1189) | 1/5/2010 | 3:27:09 | PM | 202 | V | 219 | V | 50 | Hz | 45 | % | 85 | % | 28 | C |
| 1190) | 1/5/2010 | 3:27:10 | PM | 202 | V | 220 | V | 50 | Hz | 54 | % | 83 | % | 28 | C |
| 1191) | 1/5/2010 | 3:27:11 | PM | 201 | V | 218 | V | 50 | Hz | 44 | % | 83 | % | 28 | C |
| 1192) | 1/5/2010 | 3:27:12 | PM | 201 | V | 220 | V | 50 | Hz | 56 | % | 83 | % | 28 | C |

FIG. 6 - 90

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1193) | 1/5/2010 | 3:27:13 | PM | 201 | V | 220 | V | 50 | Hz | 46 | % | 85 | % | 28 | C |
| 1194) | 1/5/2010 | 3:27:14 | PM | 189 | V | 219 | V | 50 | Hz | 46 | % | 85 | % | 28 | C |
| 1195) | 1/5/2010 | 3:27:15 | PM | 200 | V | 213 | V | 50 | Hz | 45 | % | 83 | % | 28 | C |
| 1196) | 1/5/2010 | 3:27:16 | PM | 201 | V | 222 | V | 50 | Hz | 47 | % | 85 | % | 28 | C |
| 1198) | 1/5/2010 | 3:27:18 | PM | 202 | V | 221 | V | 50 | Hz | 48 | % | 83 | % | 28 | C |
| 1199) | 1/5/2010 | 3:27:19 | PM | 202 | V | 221 | V | 50 | Hz | 49 | % | 83 | % | 28 | C |
| 1200) | 1/5/2010 | 3:27:20 | PM | 199 | V | 219 | V | 50 | Hz | 64 | % | 83 | % | 28 | C |
| 1201) | 1/5/2010 | 3:27:21 | PM | 199 | V | 213 | V | 49 | Hz | 60 | % | 83 | % | 28 | C |
| 1202) | 1/5/2010 | 3:27:23 | PM | 200 | V | 221 | V | 50 | Hz | 61 | % | 85 | % | 28 | C |
| 1203) | 1/5/2010 | 3:27:25 | PM | 198 | V | 220 | V | 50 | Hz | 55 | % | 85 | % | 28 | C |
| 1204) | 1/5/2010 | 3:27:26 | PM | 199 | V | 220 | V | 50 | Hz | 53 | % | 85 | % | 29 | C |
| 1205) | 1/5/2010 | 3:27:27 | PM | 197 | V | 220 | V | 50 | Hz | 60 | % | 83 | % | 28 | C |
| 1206) | 1/5/2010 | 3:27:28 | PM | 200 | V | 220 | V | 50 | Hz | 54 | % | 87 | % | 14 | C |
| 1207) | 1/5/2010 | 3:27:29 | PM | 199 | V | 220 | V | 50 | Hz | 66 | % | 87 | % | 28 | C |
| 1208) | 1/5/2010 | 3:27:30 | PM | 200 | V | 221 | V | 50 | Hz | 52 | % | 87 | % | 28 | C |
| 1209) | 1/5/2010 | 3:27:31 | PM | 199 | V | 218 | V | 50 | Hz | 65 | % | 85 | % | 28 | C |
| 1210) | 1/5/2010 | 3:27:32 | PM | 197 | V | 217 | V | 50 | Hz | 59 | % | 85 | % | 28 | C |
| 1211) | 1/5/2010 | 3:27:33 | PM | 200 | V | 220 | V | 50 | Hz | 54 | % | 87 | % | 28 | C |
| 1212) | 1/5/2010 | 3:27:34 | PM | 198 | V | 220 | V | 50 | Hz | 61 | % | 83 | % | 28 | C |
| 1213) | 1/5/2010 | 3:27:35 | PM | 198 | V | 220 | V | 50 | Hz | 55 | % | 85 | % | 28 | C |
| 1214) | 1/5/2010 | 3:27:36 | PM | 198 | V | 220 | V | 50 | Hz | 56 | % | 87 | % | 28 | C |
| 1215) | 1/5/2010 | 3:27:37 | PM | 198 | V | 220 | V | 50 | Hz | 64 | % | 83 | % | 28 | C |
| 1216) | 1/5/2010 | 3:27:38 | PM | 198 | V | 221 | V | 50 | Hz | 60 | % | 83 | % | 28 | C |
| 1217) | 1/5/2010 | 3:27:39 | PM | 196 | V | 221 | V | 50 | Hz | 78 | % | 85 | % | 28 | C |
| 1218) | 1/5/2010 | 3:27:40 | PM | 195 | V | 216 | V | 50 | Hz | 78 | % | 85 | % | 28 | C |
| 1219) | 1/5/2010 | 3:27:41 | PM | 191 | V | 215 | V | 50 | Hz | 77 | % | 85 | % | 28 | C |
| 1220) | 1/5/2010 | 3:27:42 | PM | 191 | V | 217 | V | 50 | Hz | 89 | % | 87 | % | 28 | C |
| 1221) | 1/5/2010 | 3:27:43 | PM | 197 | V | 217 | V | 50 | Hz | 78 | % | 85 | % | 28 | C |

FIG. 6 - 91

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1222) | 1/5/2010 | 3:27:44 | PM | 196 | V | 223 | V | 50 | Hz | 78 | % | 87 | % | 28 | C |
| 1223) | 1/5/2010 | 3:27:45 | PM | 196 | V | 218 | V | 51 | Hz | 76 | % | 87 | % | 28 | C |
| 1224) | 1/5/2010 | 3:27:46 | PM | 196 | V | 220 | V | 50 | Hz | 72 | % | 87 | % | 28 | C |
| 1225) | 1/5/2010 | 3:27:47 | PM | 193 | V | 219 | V | 50 | Hz | 80 | % | 87 | % | 28 | C |
| 1226) | 1/5/2010 | 3:27:48 | PM | 191 | V | 205 | V | 50 | Hz | 75 | % | 83 | % | 28 | C |
| 1227) | 1/5/2010 | 3:27:49 | PM | 196 | V | 217 | V | 50 | Hz | 73 | % | 85 | % | 28 | C |
| 1228) | 1/5/2010 | 3:27:50 | PM | 178 | V | 215 | V | 50 | Hz | 80 | % | 87 | % | 28 | C |
| 1229) | 1/5/2010 | 3:27:51 | PM | 184 | V | 199 | V | 50 | Hz | 74 | % | 88 | % | 28 | C |
| 1230) | 1/5/2010 | 3:27:52 | PM | 191 | V | 220 | V | 50 | Hz | 73 | % | 87 | % | 28 | C |
| 1231) | 1/5/2010 | 3:27:54 | PM | 197 | V | 222 | V | 51 | Hz | 73 | % | 85 | % | 28 | C |
| 1232) | 1/5/2010 | 3:27:56 | PM | 196 | V | 201 | V | 50 | Hz | 68 | % | 87 | % | 28 | C |
| 1233) | 1/5/2010 | 3:27:57 | PM | 195 | V | 214 | V | 50 | Hz | 72 | % | 85 | % | 28 | C |
| 1234) | 1/5/2010 | 3:27:58 | PM | 196 | V | 214 | V | 50 | Hz | 71 | % | 87 | % | 28 | C |
| 1235) | 1/5/2010 | 3:27:59 | PM | 188 | V | 204 | V | 50 | Hz | 74 | % | 87 | % | 28 | C |
| 1236) | 1/5/2010 | 3:28:00 | PM | 181 | V | 213 | V | 50 | Hz | 76 | % | 87 | % | 28 | C |
| 1238) | 1/5/2010 | 3:28:02 | PM | 196 | V | 222 | V | 50 | Hz | 68 | % | 85 | % | 28 | C |
| 1239) | 1/5/2010 | 3:28:03 | PM | 190 | V | 223 | V | 50 | Hz | 85 | % | 87 | % | 28 | C |
| 1240) | 1/5/2010 | 3:28:04 | PM | 196 | V | 223 | V | 50 | Hz | 80 | % | 87 | % | 28 | C |
| 1241) | 1/5/2010 | 3:28 | PM | 194 | V | 222 | V | 50 | Hz | 72 | % | 87 | % | 28 | C |
| 1242) | 1/5/2010 | 3:28:06 | PM | 195 | V | 220 | V | 50 | Hz | 78 | % | 88 | % | 28 | C |
| 1243) | 1/5/2010 | 3:28:07 | PM | 189 | V | 216 | V | 50 | Hz | 74 | % | 87 | % | 28 | C |
| 1244) | 1/5/2010 | 3:28:08 | PM | 195 | V | 212 | V | 50 | Hz | 76 | % | 83 | % | 38 | C |
| 1245) | 1/5/2010 | 3:28:09 | PM | 197 | V | 219 | V | 50 | Hz | 74 | % | 87 | % | 28 | C |
| 1246) | 1/5/2010 | 3:28 | PM | 192 | V | 210 | V | 50 | Hz | 74 | % | 87 | % | 15 | C |
| 1247) | 1/5/2010 | 3:28:11 | PM | 196 | V | 220 | V | 50 | Hz | 76 | % | 85 | % | 28 | C |
| 1248) | 1/5/2010 | 3:28:12 | PM | 197 | V | 219 | V | 50 | Hz | 78 | % | 85 | % | 28 | C |
| 1249) | 1/5/2010 | 3:28:13 | PM | 193 | V | 219 | V | 50 | Hz | 76 | % | 85 | % | 15 | C |
| 1250) | 1/5/2010 | 3:28:14 | PM | 196 | V | 218 | V | 50 | Hz | 78 | % | 85 | % | 28 | C |

FIG. 6 - 92

| Seq. # | Date | Time | | Input Voltage | Volts | Output Voltage | Volts | Input Frequency | Hertz | Output Load | % | B.B. Capacity | % | System Temperature | |
|---|---|---|---|---|---|---|---|---|---|---|---|---|---|---|---|
| 1251) | 1/5/2010 | 3:28 | PM | 196 | V | 220 | V | 50 | Hz | 81 | % | 85 | % | 28 | C |
| 1252) | 1/5/2010 | 3:28:16 | PM | 196 | V | 221 | V | 50 | Hz | 73 | % | 85 | % | 28 | C |
| 1253) | 1/5/2010 | 3:28:17 | PM | 193 | V | 220 | V | 50 | Hz | 81 | % | 85 | % | 28 | C |
| 1254) | 1/5/2010 | 3:28:18 | PM | 190 | V | 221 | V | 50 | Hz | 74 | % | 85 | % | 28 | C |
| 1255) | 1/5/2010 | 3:28:19 | PM | 195 | V | 211 | V | 50 | Hz | 78 | % | 87 | % | 28 | C |
| 1256) | 1/5/2010 | 3:28 | PM | 191 | V | 223 | V | 50 | Hz | 72 | % | 85 | % | 28 | C |
| 1257) | 1/5/2010 | 3:28:21 | PM | 196 | V | 218 | V | 50 | Hz | 79 | % | 85 | % | 28 | C |
| 1258) | 1/5/2010 | 3:28:22 | PM | 194 | V | 222 | V | 50 | Hz | 79 | % | 85 | % | 29 | C |
| 1259) | 1/5/2010 | 3:28:23 | PM | 185 | V | 221 | V | 50 | Hz | 76 | % | 85 | % | 28 | C |
| 1260) | 1/5/2010 | 3:28 | PM | 193 | V | 208 | V | 50 | Hz | 79 | % | 85 | % | 28 | C |
| 1261) | 1/5/2010 | 3:28:27 | PM | 196 | V | 221 | V | 50 | Hz | 78 | % | 85 | % | 28 | C |
| 1262) | 1/5/2010 | 3:28:28 | PM | 185 | V | 199 | V | 50 | Hz | 72 | % | 85 | % | 28 | C |
| 1263) | 1/5/2010 | 3:28:29 | PM | 196 | V | 219 | V | 50 | Hz | 76 | % | 87 | % | 28 | C |
| 1264) | 1/5/2010 | 3:28 | PM | 197 | V | 218 | V | 50 | Hz | 72 | % | 85 | % | 28 | C |
| 1265) | 1/5/2010 | 3:28:31 | PM | 187 | V | 218 | V | 50 | Hz | 77 | % | 85 | % | 28 | C |
| 1266) | 1/5/2010 | 3:28:32 | PM | 196 | V | 220 | V | 50 | Hz | 75 | % | 87 | % | 28 | C |
| 1267) | 1/5/2010 | 3:28:33 | PM | 196 | V | 222 | V | 50 | Hz | 71 | % | 87 | % | 28 | C |
| 1268) | 1/5/2010 | 3:28:34 | PM | 197 | V | 219 | V | 50 | Hz | 73 | % | 83 | % | 28 | C |
| 1269) | 1/5/2010 | 3:28 | PM | 197 | V | 195 | V | 50 | Hz | 74 | % | 87 | % | 28 | C |
| 1270) | 1/5/2010 | 3:28:36 | PM | 197 | V | 219 | V | 50 | Hz | 76 | % | 87 | % | 28 | C |
| 1271) | 1/5/2010 | 3:28:37 | PM | 195 | V | 220 | V | 50 | Hz | 74 | % | 87 | % | 28 | C |
| 1272) | 1/5/2010 | 3:28:38 | PM | 196 | V | 218 | V | 50 | Hz | 75 | % | 83 | % | 28 | C |
| 1273) | 1/5/2010 | 3:28:39 | PM | 197 | V | 210 | V | 50 | Hz | 75 | % | 85 | % | 28 | C |
| 1274) | 1/5/2010 | 3:28 | PM | 196 | V | 222 | V | 50 | Hz | 68 | % | 85 | % | 28 | C |
| 1275) | 1/5/2010 | 3:28:41 | PM | 196 | V | 219 | V | 50 | Hz | 66 | % | 87 | % | 28 | C |
| 1276) | 1/5/2010 | 3:28:42 | PM | 188 | V | 220 | V | 50 | Hz | 70 | % | 87 | % | 28 | C |
| 1278) | 1/5/2010 | 3:28:44 | PM | 195 | V | 212 | V | 50 | Hz | 71 | % | 87 | % | 28 | C |
| 1279) | 1/5/2010 | 3:28:45 | PM | 196 | V | 212 | V | 49 | Hz | 73 | % | 87 | % | 28 | C |

FIG. 6 - 93

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1280) | 1/5/2010 | 3:28:46 | PM | 196 | V | 220 | V | 50 | Hz | 77 | % | 87 | % | 28 | C |
| 1281) | 1/5/2010 | 3:28:47 | PM | 195 | V | 206 | V | 50 | Hz | 75 | % | 87 | % | 28 | C |
| 1282) | 1/5/2010 | 3:28:48 | PM | 196 | V | 221 | V | 50 | Hz | 76 | % | 87 | % | 28 | C |
| 1283) | 1/5/2010 | 3:28:49 | PM | 196 | V | 221 | V | 50 | Hz | 77 | % | 87 | % | 28 | C |
| 1284) | 1/5/2010 | 3:28:50 | PM | 197 | V | 222 | V | 50 | Hz | 73 | % | 87 | % | 28 | C |
| 1285) | 1/5/2010 | 3:28:51 | PM | 197 | V | 211 | V | 50 | Hz | 74 | % | 87 | % | 28 | C |
| 1286) | 1/5/2010 | 3:28:52 | PM | 193 | V | 216 | V | 49 | Hz | 74 | % | 87 | % | 28 | C |
| 1287) | 1/5/2010 | 3:28:53 | PM | 210 | V | 217 | V | 50 | Hz | 88 | % | 87 | % | 28 | C |
| 1288) | 1/5/2010 | 3:28:54 | PM | 196 | V | 213 | V | 50 | Hz | 77 | % | 85 | % | 28 | C |
| 1289) | 1/5/2010 | 3:28:56 | PM | 195 | V | 210 | V | 50 | Hz | 74 | % | 85 | % | 28 | C |
| 1290) | 1/5/2010 | 3:28:58 | PM | 196 | V | 214 | V | 50 | Hz | 77 | % | 87 | % | 28 | C |
| 1291) | 1/5/2010 | 3:28:59 | PM | 195 | V | 217 | V | 50 | Hz | 81 | % | 87 | % | 28 | C |
| 1292) | 1/5/2010 | 3:29:00 | PM | 196 | V | 215 | V | 50 | Hz | 75 | % | 85 | % | 28 | C |
| 1293) | 1/5/2010 | 3:29:01 | PM | 192 | V | 217 | V | 50 | Hz | 82 | % | 85 | % | 28 | C |
| 1294) | 1/5/2010 | 3:29:02 | PM | 196 | V | 222 | V | 50 | Hz | 69 | % | 87 | % | 28 | C |
| 1295) | 1/5/2010 | 3:29:03 | PM | 196 | V | 221 | V | 50 | Hz | 74 | % | 87 | % | 28 | C |
| 1296) | 1/5/2010 | 3:29:04 | PM | 196 | V | 209 | V | 50 | Hz | 77 | % | 87 | % | 28 | C |
| 1297) | 1/5/2010 | 3:29:05 | PM | 185 | V | 221 | V | 50 | Hz | 69 | % | 85 | % | 28 | C |
| 1298) | 1/5/2010 | 3:29:06 | PM | 195 | V | 223 | V | 50 | Hz | 73 | % | 87 | % | 28 | C |
| 1299) | 1/5/2010 | 3:29:07 | PM | 187 | V | 210 | V | 50 | Hz | 77 | % | 87 | % | 28 | C |
| 1300) | 1/5/2010 | 3:29:08 | PM | 197 | V | 219 | V | 50 | Hz | 78 | % | 87 | % | 28 | C |
| 1301) | 1/5/2010 | 3:29:09 | PM | 189 | V | 207 | V | 50 | Hz | 78 | % | 90 | % | 28 | C |
| 1302) | 1/5/2010 | 3:29:10 | PM | 195 | V | 215 | V | 50 | Hz | 77 | % | 85 | % | 28 | C |
| 1303) | 1/5/2010 | 3:29:11 | PM | 192 | V | 221 | V | 51 | Hz | 74 | % | 83 | % | 28 | C |
| 1304) | 1/5/2010 | 3:29:12 | PM | 196 | V | 222 | V | 50 | Hz | 76 | % | 87 | % | 28 | C |
| 1305) | 1/5/2010 | 3:29:13 | PM | 193 | V | 208 | V | 50 | Hz | 75 | % | 87 | % | 28 | C |
| 1306) | 1/5/2010 | 3:29:14 | PM | 188 | V | 220 | V | 50 | Hz | 73 | % | 87 | % | 28 | C |
| 1307) | 1/5/2010 | 3:29:15 | PM | 196 | V | 215 | V | 50 | Hz | 72 | % | 87 | % | 28 | C |

FIG. 6 - 94

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1308) | 1/5/2010 | 3:29:16 | PM | 196 | V | 221 | V | 50 | Hz | 75 | % | 87 | % | 28 | C |
| 1309) | 1/5/2010 | 3:29:17 | PM | 196 | V | 206 | V | 50 | Hz | 75 | % | 87 | % | 28 | C |
| 1310) | 1/5/2010 | 3:29:18 | PM | 196 | V | 222 | V | 50 | Hz | 79 | % | 87 | % | 28 | C |
| 1311) | 1/5/2010 | 3:29:19 | PM | 191 | V | 220 | V | 50 | Hz | 76 | % | 87 | % | 28 | C |
| 1312) | 1/5/2010 | 3:29:20 | PM | 199 | V | 222 | V | 50 | Hz | 80 | % | 87 | % | 28 | C |
| 1313) | 1/5/2010 | 3:29:21 | PM | 192 | V | 216 | V | 50 | Hz | 76 | % | 87 | % | 28 | C |
| 1314) | 1/5/2010 | 3:29:22 | PM | 195 | V | 209 | V | 50 | Hz | 80 | % | 88 | % | 28 | C |
| 1315) | 1/5/2010 | 3:29:23 | PM | 196 | V | 217 | V | 50 | Hz | 74 | % | 87 | % | 28 | C |
| 1316) | 1/5/2010 | 3:29:24 | PM | 196 | V | 216 | V | 50 | Hz | 69 | % | 87 | % | 28 | C |
| 1318) | 1/5/2010 | 3:29:27 | PM | 196 | V | 178 | V | 50 | Hz | 75 | % | 87 | % | 28 | C |
| 1319) | 1/5/2010 | 3:29:29 | PM | 197 | V | 224 | V | 50 | Hz | 83 | % | 87 | % | 28 | C |
| 1320) | 1/5/2010 | 3:29:30 | PM | 195 | V | 223 | V | 50 | Hz | 77 | % | 87 | % | 28 | C |
| 1321) | 1/5/2010 | 3:29:31 | PM | 197 | V | 222 | V | 50 | Hz | 81 | % | 85 | % | 28 | C |
| 1322) | 1/5/2010 | 3:29:32 | PM | 197 | V | 207 | V | 50 | Hz | 82 | % | 87 | % | 28 | C |
| 1323) | 1/5/2010 | 3:29:33 | PM | 197 | V | 222 | V | 50 | Hz | 80 | % | 87 | % | 28 | C |
| 1324) | 1/5/2010 | 3:29:34 | PM | 193 | V | 222 | V | 50 | Hz | 81 | % | 87 | % | 28 | C |
| 1325) | 1/5/2010 | 3:29:35 | PM | 197 | V | 204 | V | 50 | Hz | 78 | % | 87 | % | 28 | C |
| 1326) | 1/5/2010 | 3:29:36 | PM | 190 | V | 206 | V | 50 | Hz | 77 | % | 87 | % | 28 | C |
| 1327) | 1/5/2010 | 3:29:37 | PM | 196 | V | 220 | V | 50 | Hz | 69 | % | 87 | % | 28 | C |
| 1328) | 1/5/2010 | 3:29:38 | PM | 195 | V | 206 | V | 50 | Hz | 76 | % | 85 | % | 28 | C |
| 1329) | 1/5/2010 | 3:29:39 | PM | 196 | V | 221 | V | 49 | Hz | 72 | % | 87 | % | 28 | C |
| 1330) | 1/5/2010 | 3:29:40 | PM | 196 | V | 223 | V | 51 | Hz | 76 | % | 87 | % | 28 | C |
| 1331) | 1/5/2010 | 3:29:41 | PM | 196 | V | 222 | V | 50 | Hz | 79 | % | 87 | % | 28 | C |
| 1332) | 1/5/2010 | 3:29:42 | PM | 196 | V | 199 | V | 50 | Hz | 78 | % | 87 | % | 28 | C |
| 1333) | 1/5/2010 | 3:29:43 | PM | 194 | V | 218 | V | 50 | Hz | 78 | % | 87 | % | 28 | C |
| 1334) | 1/5/2010 | 3:29:44 | PM | 196 | V | 224 | V | 50 | Hz | 74 | % | 87 | % | 28 | C |
| 1335) | 1/5/2010 | 3:29:45 | PM | 196 | V | 221 | V | 50 | Hz | 86 | % | 85 | % | 28 | C |
| 1336) | 1/5/2010 | 3:29:46 | PM | 196 | V | 200 | V | 50 | Hz | 85 | % | 87 | % | 28 | C |

FIG. 6 - 95

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1337) | 1/5/2010 | 3:29:47 | PM | 202 | V | 221 | V | 50 | Hz | 73 | % | 87 | % | 28 | C |
| 1338) | 1/5/2010 | 3:29:48 | PM | 194 | V | 221 | V | 50 | Hz | 72 | % | 87 | % | 28 | C |
| 1339) | 1/5/2010 | 3:29:49 | PM | 197 | V | 220 | V | 50 | Hz | 76 | % | 87 | % | 28 | C |
| 1340) | 1/5/2010 | 3:29:50 | PM | 196 | V | 208 | V | 50 | Hz | 76 | % | 85 | % | 28 | C |
| 1341) | 1/5/2010 | 3:29:51 | PM | 195 | V | 221 | V | 50 | Hz | 79 | % | 87 | % | 28 | C |
| 1342) | 1/5/2010 | 3:29:52 | PM | 197 | V | 224 | V | 50 | Hz | 78 | % | 87 | % | 28 | C |
| 1343) | 1/5/2010 | 3:29:53 | PM | 197 | V | 223 | V | 50 | Hz | 76 | % | 87 | % | 28 | C |
| 1344) | 1/5/2010 | 3:29:54 | PM | 197 | V | 220 | V | 50 | Hz | 78 | % | 88 | % | 28 | C |
| 1345) | 1/5/2010 | 3:29:55 | PM | 196 | V | 223 | V | 51 | Hz | 69 | % | 87 | % | 28 | C |
| 1346) | 1/5/2010 | 3:29:56 | PM | 197 | V | 219 | V | 50 | Hz | 75 | % | 87 | % | 28 | C |
| 1347) | 1/5/2010 | 3:29:58 | PM | 196 | V | 222 | V | 50 | Hz | 69 | % | 87 | % | 28 | C |
| 1348) | 1/5/2010 | 3:30:00 | PM | 196 | V | 219 | V | 50 | Hz | 74 | % | 87 | % | 28 | C |
| 1349) | 1/5/2010 | 3:30:01 | PM | 196 | V | 224 | V | 50 | Hz | 76 | % | 87 | % | 28 | C |
| 1350) | 1/5/2010 | 3:30:02 | PM | 195 | V | 211 | V | 50 | Hz | 71 | % | 87 | % | 28 | C |
| 1351) | 1/5/2010 | 3:30:03 | PM | 196 | V | 219 | V | 49 | Hz | 68 | % | 88 | % | 28 | C |
| 1352) | 1/5/2010 | 3:30:04 | PM | 196 | V | 217 | V | 50 | Hz | 72 | % | 87 | % | 28 | C |
| 1353) | 1/5/2010 | 3:30:05 | PM | 194 | V | 220 | V | 50 | Hz | 73 | % | 87 | % | 28 | C |
| 1354) | 1/5/2010 | 3:30:06 | PM | 194 | V | 214 | V | 49 | Hz | 90 | % | 87 | % | 28 | C |
| 1355) | 1/5/2010 | 3:30:07 | PM | 190 | V | 216 | V | 50 | Hz | 93 | % | 87 | % | 28 | C |
| 1356) | 1/5/2010 | 3:30:08 | PM | 187 | V | 216 | V | 49 | Hz | 89 | % | 88 | % | 28 | C |
| 1358) | 1/5/2010 | 3:30:10 | PM | 189 | V | 221 | V | 50 | Hz | 93 | % | 87 | % | 28 | C |
| 1359) | 1/5/2010 | 3:30:11 | PM | 191 | V | 206 | V | 50 | Hz | 91 | % | 87 | % | 28 | C |
| 1360) | 1/5/2010 | 3:30:12 | PM | 189 | V | 212 | V | 49 | Hz | 97 | % | 88 | % | 28 | C |
| 1361) | 1/5/2010 | 3:30:13 | PM | 191 | V | 204 | V | 50 | Hz | 94 | % | 88 | % | 28 | C |
| 1362) | 1/5/2010 | 3:30:14 | PM | 192 | V | 220 | V | 50 | Hz | 107 | % | 88 | % | 28 | C |
| 1363) | 1/5/2010 | 3:30:15 | PM | 185 | V | 209 | V | 50 | Hz | 108 | % | 88 | % | 28 | C |
| 1364) | 1/5/2010 | 3:30:16 | PM | 207 | V | 203 | V | 49 | Hz | 100 | % | 87 | % | 21 | C |
| 1365) | 1/5/2010 | 3:30:17 | PM | 191 | V | 215 | V | 49 | Hz | 98 | % | 85 | % | 28 | C |

FIG. 6 - 96

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1366) | 1/5/2010 | 3:30:18 | PM | 196 | V | 222 | V | 49 | Hz | 96 | % | 87 | % | 28 | C |
| 1367) | 1/5/2010 | 3:30:19 | PM | 189 | V | 221 | V | 50 | Hz | 92 | % | 85 | % | 23 | C |
| 1368) | 1/5/2010 | 3:30:20 | PM | 191 | V | 223 | V | 49 | Hz | 91 | % | 85 | % | 28 | C |
| 1369) | 1/5/2010 | 3:30:21 | PM | 188 | V | 213 | V | 49 | Hz | 93 | % | 85 | % | 28 | C |
| 1370) | 1/5/2010 | 3:30:22 | PM | 189 | V | 221 | V | 49 | Hz | 90 | % | 87 | % | 28 | C |
| 1371) | 1/5/2010 | 3:30:23 | PM | 192 | V | 221 | V | 50 | Hz | 95 | % | 87 | % | 28 | C |
| 1372) | 1/5/2010 | 3:30:24 | PM | 193 | V | 197 | V | 51 | Hz | 95 | % | 88 | % | 28 | C |
| 1373) | 1/5/2010 | 3:30:25 | PM | 186 | V | 205 | V | 50 | Hz | 98 | % | 87 | % | 28 | C |
| 1374) | 1/5/2010 | 3:30:26 | PM | 192 | V | 222 | V | 50 | Hz | 100 | % | 87 | % | 28 | C |
| 1375) | 1/5/2010 | 3:30:27 | PM | 190 | V | 212 | V | 50 | Hz | 98 | % | 87 | % | 28 | C |
| 1376) | 1/5/2010 | 3:30:29 | PM | 190 | V | 222 | V | 50 | Hz | 100 | % | 85 | % | 28 | C |
| 1377) | 1/5/2010 | 3:30:31 | PM | 193 | V | 217 | V | 50 | Hz | 97 | % | 87 | % | 28 | C |
| 1378) | 1/5/2010 | 3:30:32 | PM | 192 | V | 221 | V | 51 | Hz | 93 | % | 88 | % | 28 | C |
| 1379) | 1/5/2010 | 3:30:33 | PM | 194 | V | 203 | V | 49 | Hz | 97 | % | 87 | % | 28 | C |
| 1380) | 1/5/2010 | 3:30:34 | PM | 193 | V | 222 | V | 50 | Hz | 96 | % | 87 | % | 28 | C |
| 1381) | 1/5/2010 | 3:30:35 | PM | 186 | V | 225 | V | 50 | Hz | 94 | % | 87 | % | 28 | C |
| 1382) | 1/5/2010 | 3:30:36 | PM | 183 | V | 201 | V | 50 | Hz | 91 | % | 87 | % | 28 | C |
| 1383) | 1/5/2010 | 3:30:37 | PM | 185 | V | 224 | V | 50 | Hz | 93 | % | 87 | % | 28 | C |
| 1384) | 1/5/2010 | 3:30:38 | PM | 187 | V | 216 | V | 50 | Hz | 93 | % | 88 | % | 28 | C |
| 1385) | 1/5/2010 | 3:30:39 | PM | 192 | V | 219 | V | 50 | Hz | 93 | % | 90 | % | 28 | C |
| 1386) | 1/5/2010 | 3:30:40 | PM | 188 | V | 214 | V | 50 | Hz | 89 | % | 88 | % | 28 | C |
| 1387) | 1/5/2010 | 3:30:41 | PM | 193 | V | 214 | V | 50 | Hz | 93 | % | 88 | % | 28 | C |
| 1388) | 1/5/2010 | 3:30:42 | PM | 188 | V | 215 | V | 50 | Hz | 89 | % | 87 | % | 28 | C |
| 1389) | 1/5/2010 | 3:30:43 | PM | 192 | V | 212 | V | 50 | Hz | 95 | % | 88 | % | 28 | C |
| 1390) | 1/5/2010 | 3:30:44 | PM | 192 | V | 212 | V | 50 | Hz | 96 | % | 88 | % | 28 | C |
| 1391) | 1/5/2010 | 3:30:45 | PM | 191 | V | 205 | V | 51 | Hz | 74 | % | 88 | % | 28 | C |
| 1392) | 1/5/2010 | 3:30:46 | PM | 196 | V | 212 | V | 50 | Hz | 58 | % | 87 | % | 28 | C |
| 1393) | 1/5/2010 | 3:30:47 | PM | 201 | V | 221 | V | 50 | Hz | 41 | % | 87 | % | 28 | C |

FIG. 6 - 97

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1394) | 1/5/2010 | 3:30:48 | PM | 204 | V | 220 | V | 50 | Hz | 40 | % | 87 | % | 28 | C |
| 1395) | 1/5/2010 | 3:30:49 | PM | 201 | V | 218 | V | 50 | Hz | 37 | % | 87 | % | 28 | C |
| 1396) | 1/5/2010 | 3:30:50 | PM | 204 | V | 221 | V | 50 | Hz | 39 | % | 87 | % | 28 | C |
| 1397) | 1/5/2010 | 3:30:51 | PM | 204 | V | 221 | V | 50 | Hz | 39 | % | 87 | % | 28 | C |
| 1398) | 1/5/2010 | 3:30:52 | PM | 205 | V | 218 | V | 50 | Hz | 36 | % | 87 | % | 28 | C |
| 1399) | 1/5/2010 | 3:30:53 | PM | 204 | V | 220 | V | 50 | Hz | 38 | % | 87 | % | 28 | C |
| 1400) | 1/5/2010 | 3:30:54 | PM | 204 | V | 220 | V | 50 | Hz | 38 | % | 87 | % | 28 | C |
| 1401) | 1/5/2010 | 3:30:55 | PM | 204 | V | 220 | V | 50 | Hz | 38 | % | 87 | % | 28 | C |
| 1402) | 1/5/2010 | 3:30:56 | PM | 204 | V | 220 | V | 50 | Hz | 40 | % | 87 | % | 28 | C |
| 1403) | 1/5/2010 | 3:30:57 | PM | 204 | V | 220 | V | 50 | Hz | 36 | % | 87 | % | 28 | C |
| 1404) | 1/5/2010 | 3:30:58 | PM | 204 | V | 220 | V | 50 | Hz | 37 | % | 87 | % | 28 | C |
| 1405) | 1/5/2010 | 3:31:01 | PM | 204 | V | 220 | V | 50 | Hz | 36 | % | 87 | % | 28 | C |

FIG. 6 - 98

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 316) | 1/5/2010 | 1:38:28 | PM | 2 | V | 220 | V | 0 | Hz | 11 | % | 78 | % | 27 | C |
| 318) | 1/5/2010 | 1:38:32 | PM | 2 | V | 220 | V | 0 | Hz | 12 | % | 78 | % | 27 | C |
| 319) | 1/5/2010 | 1:38:36 | PM | 2 | V | 220 | V | 0 | Hz | 11 | % | 78 | % | 27 | C |
| 320) | 1/5/2010 | 1:38:38 | PM | 2 | V | 221 | V | 0 | Hz | 11 | % | 78 | % | 27 | C |
| 321) | 1/5/2010 | 1:38:40 | PM | 2 | V | 219 | V | 0 | Hz | 40 | % | 77 | % | 27 | C |
| 322) | 1/5/2010 | 1:38:42 | PM | 2 | V | 219 | V | 0 | Hz | 37 | % | 78 | % | 27 | C |
| 323) | 1/5/2010 | 1:38:44 | PM | 2 | V | 220 | V | 0 | Hz | 37 | % | 78 | % | 27 | C |
| 324) | 1/5/2010 | 1:38:46 | PM | 2 | V | 220 | V | 0 | Hz | 37 | % | 77 | % | 27 | C |
| 325) | 1/5/2010 | 1:38:48 | PM | 2 | V | 220 | V | 0 | Hz | 37 | % | 77 | % | 27 | C |
| 326) | 1/5/2010 | 1:38:50 | PM | 2 | V | 219 | V | 0 | Hz | 38 | % | 77 | % | 27 | C |
| 327) | 1/5/2010 | 1:38:52 | PM | 2 | V | 219 | V | 0 | Hz | 39 | % | 77 | % | 27 | C |
| 328) | 1/5/2010 | 1:38:56 | PM | 2 | V | 218 | V | 0 | Hz | 38 | % | 77 | % | 27 | C |
| 329) | 1/5/2010 | 1:38:58 | PM | 2 | V | 218 | V | 0 | Hz | 39 | % | 77 | % | 27 | C |
| 330) | 1/5/2010 | 1:39:00 | PM | 2 | V | 220 | V | 0 | Hz | 37 | % | 77 | % | 27 | C |
| 331) | 1/5/2010 | 1:39:02 | PM | 2 | V | 218 | V | 0 | Hz | 37 | % | 77 | % | 27 | C |
| 332) | 1/5/2010 | 1:39:04 | PM | 2 | V | 218 | V | 0 | Hz | 37 | % | 77 | % | 27 | C |
| 333) | 1/5/2010 | 1:39:07 | PM | 2 | V | 219 | V | 0 | Hz | 36 | % | 77 | % | 27 | C |
| 334) | 1/5/2010 | 1:39:09 | PM | 2 | V | 219 | V | 0 | Hz | 37 | % | 77 | % | 27 | C |
| 335) | 1/5/2010 | 1:39:11 | PM | 2 | V | 219 | V | 0 | Hz | 40 | % | 77 | % | 27 | C |
| 336) | 1/5/2010 | 1:39:13 | PM | 2 | V | 219 | V | 0 | Hz | 39 | % | 77 | % | 27 | C |
| 337) | 1/5/2010 | 1:39:15 | PM | 2 | V | 219 | V | 0 | Hz | 39 | % | 77 | % | 27 | C |
| 338) | 1/5/2010 | 1:39:17 | PM | 2 | V | 219 | V | 0 | Hz | 39 | % | 77 | % | 27 | C |
| 339) | 1/5/2010 | 1:39:19 | PM | 2 | V | 219 | V | 0 | Hz | 40 | % | 75 | % | 27 | C |
| 340) | 1/5/2010 | 1:39:21 | PM | 2 | V | 219 | V | 0 | Hz | 38 | % | 77 | % | 27 | C |
| 341) | 1/5/2010 | 1:39:23 | PM | 2 | V | 219 | V | 0 | Hz | 38 | % | 77 | % | 27 | C |
| 342) | 1/5/2010 | 1:39:25 | PM | 2 | V | 219 | V | 0 | Hz | 37 | % | 77 | % | 27 | C |
| 343) | 1/5/2010 | 1:39:27 | PM | 2 | V | 219 | V | 0 | Hz | 37 | % | 75 | % | 27 | C |
| 344) | 1/5/2010 | 1:39:29 | PM | 2 | V | 218 | V | 0 | Hz | 38 | % | 75 | % | 27 | C |

FIG. 6 - 99

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 345} | 1/5/2010 | 1:39:31 | PM | 2 | V | 218 | V | 0 | Hz | 40 | % | 75 | % | 27 | C |
| 346} | 1/5/2010 | 1:39:33 | PM | 2 | V | 218 | V | 0 | Hz | 39 | % | 75 | % | 27 | C |
| 347} | 1/5/2010 | 1:39:35 | PM | 2 | V | 218 | V | 0 | Hz | 39 | % | 75 | % | 27 | C |
| 348} | 1/5/2010 | 1:39:38 | PM | 2 | V | 218 | V | 0 | Hz | 40 | % | 75 | % | 27 | C |
| 349} | 1/5/2010 | 1:39:40 | PM | 2 | V | 218 | V | 0 | Hz | 37 | % | 75 | % | 27 | C |
| 350} | 1/5/2010 | 1:39:42 | PM | 2 | V | 218 | V | 0 | Hz | 37 | % | 77 | % | 27 | C |
| 351} | 1/5/2010 | 1:39:44 | PM | 2 | V | 218 | V | 0 | Hz | 38 | % | 75 | % | 27 | C |
| 352} | 1/5/2010 | 1:39:46 | PM | 2 | V | 218 | V | 0 | Hz | 37 | % | 77 | % | 27 | C |
| 353} | 1/5/2010 | 1:39:48 | PM | 2 | V | 218 | V | 0 | Hz | 37 | % | 77 | % | 27 | C |
| 354} | 1/5/2010 | 1:39:50 | PM | 2 | V | 210 | V | 0 | Hz | 72 | % | 65 | % | 25 | C |
| 355} | 1/5/2010 | 1:39:52 | PM | 2 | V | 213 | V | 0 | Hz | 71 | % | 65 | % | 25 | C |
| 356} | 1/5/2010 | 1:39:54 | PM | 2 | V | 210 | V | 0 | Hz | 71 | % | 62 | % | 25 | C |
| 358} | 1/5/2010 | 1:39:58 | PM | 2 | V | 206 | V | 0 | Hz | 87 | % | 58 | % | 25 | C |
| 359} | 1/5/2010 | 1:40:00 | PM | 47 | V | 217 | V | 0 | Hz | 83 | % | 58 | % | 25 | C |
| 360} | 1/5/2010 | 1:40:02 | PM | 37 | V | 203 | V | 0 | Hz | 82 | % | 58 | % | 25 | C |
| 361} | 1/5/2010 | 1:40:04 | PM | 3 | V | 202 | V | 0 | Hz | 82 | % | 58 | % | 25 | C |
| 362} | 1/5/2010 | 1:40:06 | PM | 6 | V | 216 | V | 0 | Hz | 82 | % | 58 | % | 25 | C |
| 363} | 1/5/2010 | 1:40:09 | PM | 4 | V | 190 | V | 0 | Hz | 86 | % | 58 | % | 25 | C |
| 364} | 1/5/2010 | 1:40:11 | PM | 2 | V | 217 | V | 0 | Hz | 87 | % | 58 | % | 25 | C |
| 365} | 1/5/2010 | 1:40:13 | PM | 7 | V | 212 | V | 0 | Hz | 87 | % | 58 | % | 25 | C |
| 366} | 1/5/2010 | 1:40:15 | PM | 5 | V | 195 | V | 0 | Hz | 87 | % | 58 | % | 25 | C |
| 367} | 1/5/2010 | 1:40:17 | PM | 38 | V | 216 | V | 0 | Hz | 87 | % | 58 | % | 25 | C |
| 368} | 1/5/2010 | 1:40:19 | PM | 31 | V | 216 | V | 0 | Hz | 83 | % | 58 | % | 25 | C |
| 369} | 1/5/2010 | 1:40:21 | PM | 13 | V | 201 | V | 0 | Hz | 82 | % | 58 | % | 25 | C |
| 370} | 1/5/2010 | 1:40:23 | PM | 2 | V | 216 | V | 0 | Hz | 82 | % | 58 | % | 25 | C |
| 371} | 1/5/2010 | 1:40:25 | PM | 2 | V | 210 | V | 0 | Hz | 81 | % | 58 | % | 25 | C |
| 372} | 1/5/2010 | 1:40:27 | PM | 2 | V | 208 | V | 0 | Hz | 81 | % | 58 | % | 25 | C |
| 373} | 1/5/2010 | 1:40:29 | PM | 5 | V | 183 | V | 0 | Hz | 81 | % | 58 | % | 25 | C |

FIG. 6 - 100

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 374) | 1/5/2010 | 1:40:31 | PM | 5 | V | 210 | V | 0 | Hz | 86 | % | 58 | % | 25 | C |
| 375) | 1/5/2010 | 1:40:33 | PM | 27 | V | 217 | V | 0 | Hz | 86 | % | 58 | % | 25 | C |
| 376) | 1/5/2010 | 1:40:35 | PM | 10 | V | 216 | V | 0 | Hz | 86 | % | 58 | % | 25 | C |
| 377) | 1/5/2010 | 1:40:37 | PM | 40 | V | 217 | V | 0 | Hz | 87 | % | 58 | % | 25 | C |
| 378) | 1/5/2010 | 1:40:40 | PM | 11 | V | 198 | V | 0 | Hz | 82 | % | 58 | % | 25 | C |
| 379) | 1/5/2010 | 1:40:42 | PM | 4 | V | 214 | V | 0 | Hz | 82 | % | 58 | % | 25 | C |
| 380) | 1/5/2010 | 1:40:44 | PM | 16 | V | 217 | V | 0 | Hz | 82 | % | 58 | % | 25 | C |
| 381) | 1/5/2010 | 1:40:46 | PM | 2 | V | 216 | V | 0 | Hz | 82 | % | 58 | % | 25 | C |
| 382) | 1/5/2010 | 1:40:48 | PM | 21 | V | 216 | V | 0 | Hz | 82 | % | 58 | % | 25 | C |
| 383) | 1/5/2010 | 1:40:50 | PM | 14 | V | 209 | V | 0 | Hz | 87 | % | 58 | % | 25 | C |
| 384) | 1/5/2010 | 1:40:52 | PM | 4 | V | 217 | V | 0 | Hz | 87 | % | 58 | % | 25 | C |
| 385) | 1/5/2010 | 1:40:54 | PM | 48 | V | 216 | V | 0 | Hz | 87 | % | 58 | % | 25 | C |
| 386) | 1/5/2010 | 1:40:56 | PM | 12 | V | 187 | V | 0 | Hz | 87 | % | 58 | % | 25 | C |
| 387) | 1/5/2010 | 1:40:58 | PM | 73 | V | 215 | V | 0 | Hz | 86 | % | 58 | % | 25 | C |
| 388) | 1/5/2010 | 1:41:00 | PM | 2 | V | 214 | V | 0 | Hz | 83 | % | 58 | % | 25 | C |
| 389) | 1/5/2010 | 1:41:02 | PM | 7 | V | 211 | V | 0 | Hz | 82 | % | 58 | % | 25 | C |
| 390) | 1/5/2010 | 1:41:04 | PM | 2 | V | 214 | V | 0 | Hz | 82 | % | 58 | % | 25 | C |
| 391) | 1/5/2010 | 1:41:06 | PM | 2 | V | 216 | V | 0 | Hz | 82 | % | 58 | % | 25 | C |
| 392) | 1/5/2010 | 1:41:08 | PM | 2 | V | 215 | V | 0 | Hz | 82 | % | 58 | % | 25 | C |
| 393) | 1/5/2010 | 1:41:11 | PM | 21 | V | 200 | V | 0 | Hz | 87 | % | 58 | % | 25 | C |
| 394) | 1/5/2010 | 1:41:13 | PM | 2 | V | 216 | V | 0 | Hz | 87 | % | 58 | % | 25 | C |
| 395) | 1/5/2010 | 1:41:15 | PM | 2 | V | 217 | V | 0 | Hz | 87 | % | 58 | % | 25 | C |
| 396) | 1/5/2010 | 1:41:17 | PM | 3 | V | 184 | V | 0 | Hz | 87 | % | 58 | % | 25 | C |
| 398) | 1/5/2010 | 1:41:21 | PM | 2 | V | 217 | V | 0 | Hz | 82 | % | 58 | % | 25 | C |
| 399) | 1/5/2010 | 1:41:23 | PM | 14 | V | 204 | V | 0 | Hz | 83 | % | 58 | % | 25 | C |
| 400) | 1/5/2010 | 1:41:25 | PM | 2 | V | 217 | V | 0 | Hz | 82 | % | 58 | % | 25 | C |
| 401) | 1/5/2010 | 1:41:27 | PM | 2 | V | 215 | V | 0 | Hz | 87 | % | 58 | % | 24 | C |
| 402) | 1/5/2010 | 1:41:29 | PM | 2 | V | 214 | V | 0 | Hz | 88 | % | 58 | % | 25 | C |

FIG. 6 - 101

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 403) | 1/5/2010 | 1:41:31 | PM | 10 | V | 200 | V | 0 | Hz | 87 | % | 58 | % | 25 | C |
| 404) | 1/5/2010 | 1:41:33 | PM | 26 | V | 210 | V | 0 | Hz | 87 | % | 58 | % | 25 | C |
| 405) | 1/5/2010 | 1:41:35 | PM | 3 | V | 172 | V | 0 | Hz | 88 | % | 58 | % | 25 | C |
| 406) | 1/5/2010 | 1:41:37 | PM | 44 | V | 215 | V | 0 | Hz | 87 | % | 58 | % | 25 | C |
| 407) | 1/5/2010 | 1:41:39 | PM | 2 | V | 214 | V | 0 | Hz | 82 | % | 58 | % | 25 | C |
| 408) | 1/5/2010 | 1:41:42 | PM | 60 | V | 216 | V | 0 | Hz | 82 | % | 58 | % | 25 | C |
| 409) | 1/5/2010 | 1:41:44 | PM | 21 | V | 195 | V | 0 | Hz | 81 | % | 58 | % | 25 | C |
| 410) | 1/5/2010 | 1:41:46 | PM | 2 | V | 184 | V | 0 | Hz | 82 | % | 58 | % | 25 | C |
| 411) | 1/5/2010 | 1:41:48 | PM | 2 | V | 217 | V | 0 | Hz | 87 | % | 58 | % | 25 | C |
| 412) | 1/5/2010 | 1:41:50 | PM | 14 | V | 216 | V | 0 | Hz | 86 | % | 58 | % | 25 | C |
| 413) | 1/5/2010 | 1:41:52 | PM | 2 | V | 216 | V | 0 | Hz | 85 | % | 58 | % | 25 | C |
| 414) | 1/5/2010 | 1:41:54 | PM | 88 | V | 217 | V | 0 | Hz | 87 | % | 58 | % | 25 | C |
| 415) | 1/5/2010 | 1:41:56 | PM | 35 | V | 208 | V | 0 | Hz | 82 | % | 58 | % | 25 | C |
| 416) | 1/5/2010 | 1:41:58 | PM | 10 | V | 203 | V | 0 | Hz | 82 | % | 58 | % | 25 | C |
| 417) | 1/5/2010 | 1:42:00 | PM | 2 | V | 215 | V | 0 | Hz | 82 | % | 58 | % | 25 | C |
| 418) | 1/5/2010 | 1:42:02 | PM | 54 | V | 204 | V | 0 | Hz | 82 | % | 58 | % | 25 | C |
| 419) | 1/5/2010 | 1:42:04 | PM | 2 | V | 216 | V | 0 | Hz | 82 | % | 58 | % | 25 | C |
| 420) | 1/5/2010 | 1:42:06 | PM | 2 | V | 216 | V | 0 | Hz | 86 | % | 58 | % | 25 | C |
| 421) | 1/5/2010 | 1:42:08 | PM | 2 | V | 216 | V | 0 | Hz | 87 | % | 58 | % | 25 | C |
| 422) | 1/5/2010 | 1:42:10 | PM | 5 | V | 212 | V | 0 | Hz | 87 | % | 58 | % | 25 | C |
| 423) | 1/5/2010 | 1:42:13 | PM | 6 | V | 205 | V | 0 | Hz | 87 | % | 58 | % | 25 | C |
| 424) | 1/5/2010 | 1:42:15 | PM | 17 | V | 214 | V | 0 | Hz | 82 | % | 58 | % | 25 | C |
| 425) | 1/5/2010 | 1:42:17 | PM | 8 | V | 201 | V | 0 | Hz | 82 | % | 58 | % | 25 | C |
| 426) | 1/5/2010 | 1:42:19 | PM | 2 | V | 215 | V | 0 | Hz | 82 | % | 58 | % | 25 | C |
| 427) | 1/5/2010 | 1:42:21 | PM | 4 | V | 214 | V | 0 | Hz | 82 | % | 58 | % | 25 | C |
| 428) | 1/5/2010 | 1:42:23 | PM | 2 | V | 208 | V | 0 | Hz | 82 | % | 58 | % | 25 | C |
| 429) | 1/5/2010 | 1:42:25 | PM | 2 | V | 215 | V | 0 | Hz | 86 | % | 58 | % | 25 | C |
| 430) | 1/5/2010 | 1:42:27 | PM | 4 | V | 214 | V | 0 | Hz | 86 | % | 58 | % | 84 | C |

FIG. 6 - 102

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 431) | 1/5/2010 | 1:42:29 | PM | 2 | V | 216 | V | 0 | Hz | 87 | % | 58 | % | 16 | C |
| 432) | 1/5/2010 | 1:42:31 | PM | 2 | V | 216 | V | 0 | Hz | 87 | % | 58 | % | 25 | C |
| 433) | 1/5/2010 | 1:42:33 | PM | 16 | V | 217 | V | 0 | Hz | 87 | % | 58 | % | 25 | C |
| 434) | 1/5/2010 | 1:42:35 | PM | 26 | V | 216 | V | 0 | Hz | 82 | % | 58 | % | 25 | C |
| 435) | 1/5/2010 | 1:42:37 | PM | 44 | V | 217 | V | 0 | Hz | 82 | % | 58 | % | 25 | C |
| 436) | 1/5/2010 | 1:42:39 | PM | 4 | V | 217 | V | 0 | Hz | 83 | % | 58 | % | 25 | C |
| 438) | 1/5/2010 | 1:42:44 | PM | 52 | V | 201 | V | 0 | Hz | 86 | % | 55 | % | 25 | C |
| 439) | 1/5/2010 | 1:42:46 | PM | 2 | V | 214 | V | 0 | Hz | 87 | % | 58 | % | 25 | C |
| 440) | 1/5/2010 | 1:42:48 | PM | 47 | V | 201 | V | 0 | Hz | 87 | % | 58 | % | 25 | C |
| 441) | 1/5/2010 | 1:42:50 | PM | 3 | V | 191 | V | 0 | Hz | 88 | % | 58 | % | 25 | C |
| 442) | 1/5/2010 | 1:42:52 | PM | 2 | V | 216 | V | 0 | Hz | 87 | % | 58 | % | 25 | C |
| 443) | 1/5/2010 | 1:42:54 | PM | 9 | V | 212 | V | 0 | Hz | 82 | % | 58 | % | 25 | C |
| 444) | 1/5/2010 | 1:42:56 | PM | 14 | V | 215 | V | 0 | Hz | 82 | % | 58 | % | 25 | C |
| 445) | 1/5/2010 | 1:42:58 | PM | 43 | V | 209 | V | 0 | Hz | 82 | % | 58 | % | 25 | C |
| 446) | 1/5/2010 | 1:43:00 | PM | 54 | V | 200 | V | 0 | Hz | 82 | % | 58 | % | 25 | C |
| 447) | 1/5/2010 | 1:43:02 | PM | 14 | V | 187 | V | 0 | Hz | 82 | % | 58 | % | 25 | C |
| 448) | 1/5/2010 | 1:43:04 | PM | 5 | V | 208 | V | 0 | Hz | 87 | % | 58 | % | 25 | C |
| 449) | 1/5/2010 | 1:43:06 | PM | 2 | V | 215 | V | 0 | Hz | 87 | % | 58 | % | 25 | C |
| 450) | 1/5/2010 | 1:43:08 | PM | 28 | V | 214 | V | 0 | Hz | 87 | % | 58 | % | 25 | C |
| 451) | 1/5/2010 | 1:43:10 | PM | 4 | V | 217 | V | 0 | Hz | 86 | % | 58 | % | 25 | C |
| 452) | 1/5/2010 | 1:43:12 | PM | 2 | V | 215 | V | 0 | Hz | 82 | % | 58 | % | 25 | C |
| 453) | 1/5/2010 | 1:43:15 | PM | 16 | V | 217 | V | 0 | Hz | 82 | % | 58 | % | 25 | C |
| 454) | 1/5/2010 | 1:43:17 | PM | 2 | V | 199 | V | 0 | Hz | 83 | % | 58 | % | 25 | C |
| 455) | 1/5/2010 | 1:43:19 | PM | 2 | V | 215 | V | 0 | Hz | 82 | % | 58 | % | 25 | C |
| 456) | 1/5/2010 | 1:43:21 | PM | 2 | V | 208 | V | 0 | Hz | 88 | % | 58 | % | 24 | C |
| 457) | 1/5/2010 | 1:43:23 | PM | 2 | V | 217 | V | 0 | Hz | 87 | % | 58 | % | 25 | C |
| 458) | 1/5/2010 | 1:43:25 | PM | 21 | V | 217 | V | 0 | Hz | 87 | % | 58 | % | 25 | C |
| 459) | 1/5/2010 | 1:43:27 | PM | 64 | V | 216 | V | 0 | Hz | 86 | % | 58 | % | 25 | C |

FIG. 6 - 103

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 460) | 1/5/2010 | 1:43:29 | PM | 2 | V | 216 | V | 0 | Hz | 87 | % | 58 | % | 25 | C |
| 461) | 1/5/2010 | 1:43:31 | PM | 16 | V | 193 | V | 0 | Hz | 87 | % | 58 | % | 24 | C |
| 462) | 1/5/2010 | 1:43:33 | PM | 38 | V | 216 | V | 0 | Hz | 82 | % | 58 | % | 25 | C |
| 463) | 1/5/2010 | 1:43:35 | PM | 2 | V | 215 | V | 0 | Hz | 82 | % | 58 | % | 25 | C |
| 464) | 1/5/2010 | 1:43:37 | PM | 2 | V | 216 | V | 0 | Hz | 82 | % | 58 | % | 25 | C |
| 465) | 1/5/2010 | 1:43:39 | PM | 13 | V | 203 | V | 0 | Hz | 83 | % | 58 | % | 24 | C |
| 466) | 1/5/2010 | 1:43:41 | PM | 2 | V | 198 | V | 0 | Hz | 87 | % | 58 | % | 25 | C |
| 467) | 1/5/2010 | 1:43:43 | PM | 63 | V | 216 | V | 0 | Hz | 87 | % | 58 | % | 25 | C |
| 468) | 1/5/2010 | 1:43:46 | PM | 2 | V | 216 | V | 0 | Hz | 87 | % | 58 | % | 18 | C |
| 469) | 1/5/2010 | 1:43:48 | PM | 2 | V | 215 | V | 0 | Hz | 87 | % | 58 | % | 17 | C |
| 470) | 1/5/2010 | 1:43:50 | PM | 2 | V | 217 | V | 0 | Hz | 83 | % | 58 | % | 17 | C |
| 471) | 1/5/2010 | 1:43:52 | PM | 2 | V | 213 | V | 0 | Hz | 82 | % | 58 | % | 25 | C |
| 472) | 1/5/2010 | 1:43:54 | PM | 2 | V | 217 | V | 0 | Hz | 82 | % | 58 | % | 25 | C |
| 473) | 1/5/2010 | 1:43:56 | PM | 2 | V | 214 | V | 0 | Hz | 81 | % | 58 | % | 25 | C |
| 474) | 1/5/2010 | 1:43:58 | PM | 11 | V | 215 | V | 0 | Hz | 82 | % | 58 | % | 25 | C |
| 475) | 1/5/2010 | 1:44:00 | PM | 11 | V | 196 | V | 0 | Hz | 82 | % | 58 | % | 25 | C |
| 476) | 1/5/2010 | 1:44:02 | PM | 11 | V | 204 | V | 0 | Hz | 87 | % | 58 | % | 25 | C |
| 478) | 1/5/2010 | 1:44:06 | PM | 3 | V | 216 | V | 0 | Hz | 87 | % | 58 | % | 16 | C |
| 479) | 1/5/2010 | 1:44:08 | PM | 17 | V | 216 | V | 0 | Hz | 87 | % | 58 | % | 25 | C |
| 480) | 1/5/2010 | 1:44:10 | PM | 2 | V | 215 | V | 0 | Hz | 87 | % | 58 | % | 25 | C |
| 481) | 1/5/2010 | 1:44:12 | PM | 16 | V | 216 | V | 0 | Hz | 82 | % | 58 | % | 25 | C |
| 482) | 1/5/2010 | 1:44:14 | PM | 2 | V | 215 | V | 0 | Hz | 82 | % | 58 | % | 25 | C |
| 483) | 1/5/2010 | 1:44:17 | PM | 16 | V | 216 | V | 0 | Hz | 83 | % | 58 | % | 25 | C |
| 484) | 1/5/2010 | 1:44:19 | PM | 3 | V | 214 | V | 0 | Hz | 83 | % | 58 | % | 25 | C |
| 485) | 1/5/2010 | 1:44:21 | PM | 11 | V | 212 | V | 0 | Hz | 87 | % | 58 | % | 25 | C |
| 486) | 1/5/2010 | 1:44:23 | PM | 23 | V | 204 | V | 0 | Hz | 87 | % | 58 | % | 25 | C |
| 487) | 1/5/2010 | 1:44:25 | PM | 49 | V | 217 | V | 0 | Hz | 87 | % | 58 | % | 25 | C |
| 488) | 1/5/2010 | 1:44:27 | PM | 3 | V | 215 | V | 0 | Hz | 87 | % | 58 | % | 25 | C |

FIG. 6 - 104

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 489) | 1/5/2010 | 1:44:29 | PM | 50 | V | 217 | V | 0 | Hz | 82 | % | 58 | % | 25 | C |
| 490) | 1/5/2010 | 1:44:31 | PM | 47 | V | 216 | V | 0 | Hz | 82 | % | 58 | % | 25 | C |
| 491) | 1/5/2010 | 1:44:33 | PM | 6 | V | 210 | V | 0 | Hz | 82 | % | 58 | % | 25 | C |
| 492) | 1/5/2010 | 1:44:35 | PM | 38 | V | 217 | V | 0 | Hz | 82 | % | 58 | % | 25 | C |
| 493) | 1/5/2010 | 1:44:37 | PM | 14 | V | 216 | V | 0 | Hz | 82 | % | 58 | % | 25 | C |
| 494) | 1/5/2010 | 1:44:39 | PM | 26 | V | 194 | V | 0 | Hz | 87 | % | 58 | % | 25 | C |
| 495) | 1/5/2010 | 1:44:41 | PM | 3 | V | 213 | V | 0 | Hz | 87 | % | 58 | % | 25 | C |
| 496) | 1/5/2010 | 1:44:43 | PM | 2 | V | 210 | V | 0 | Hz | 87 | % | 58 | % | 25 | C |
| 497) | 1/5/2010 | 1:44:45 | PM | 2 | V | 205 | V | 0 | Hz | 87 | % | 58 | % | 25 | C |
| 498) | 1/5/2010 | 1:44:48 | PM | 6 | V | 216 | V | 0 | Hz | 86 | % | 58 | % | 25 | C |
| 499) | 1/5/2010 | 1:44:50 | PM | 3 | V | 186 | V | 0 | Hz | 81 | % | 58 | % | 25 | C |
| 500) | 1/5/2010 | 1:44:52 | PM | 31 | V | 216 | V | 0 | Hz | 82 | % | 58 | % | 25 | C |
| 501) | 1/5/2010 | 1:44:54 | PM | 2 | V | 216 | V | 0 | Hz | 81 | % | 58 | % | 25 | C |
| 502) | 1/5/2010 | 1:44:56 | PM | 2 | V | 215 | V | 0 | Hz | 82 | % | 58 | % | 25 | C |
| 503) | 1/5/2010 | 1:44:58 | PM | 11 | V | 206 | V | 0 | Hz | 82 | % | 58 | % | 25 | C |
| 504) | 1/5/2010 | 1:45:00 | PM | 4 | V | 215 | V | 0 | Hz | 87 | % | 58 | % | 25 | C |
| 505) | 1/5/2010 | 1:45:02 | PM | 2 | V | 212 | V | 0 | Hz | 87 | % | 58 | % | 25 | C |
| 506) | 1/5/2010 | 1:45:04 | PM | 3 | V | 215 | V | 0 | Hz | 87 | % | 58 | % | 16 | C |
| 507) | 1/5/2010 | 1:45:06 | PM | 2 | V | 216 | V | 0 | Hz | 87 | % | 58 | % | 17 | C |
| 508) | 1/5/2010 | 1:45:08 | PM | 21 | V | 208 | V | 0 | Hz | 87 | % | 58 | % | 25 | C |
| 509) | 1/5/2010 | 1:45:10 | PM | 2 | V | 216 | V | 0 | Hz | 83 | % | 58 | % | 25 | C |
| 510) | 1/5/2010 | 1:45:12 | PM | 2 | V | 213 | V | 0 | Hz | 83 | % | 58 | % | 25 | C |
| 511) | 1/5/2010 | 1:45:14 | PM | 2 | V | 216 | V | 0 | Hz | 82 | % | 58 | % | 25 | C |
| 512) | 1/5/2010 | 1:45:16 | PM | 42 | V | 188 | V | 0 | Hz | 82 | % | 58 | % | 25 | C |
| 513) | 1/5/2010 | 1:45:19 | PM | 10 | V | 210 | V | 0 | Hz | 87 | % | 58 | % | 18 | C |
| 514) | 1/5/2010 | 1:45:21 | PM | 57 | V | 217 | V | 0 | Hz | 87 | % | 58 | % | 25 | C |
| 515) | 1/5/2010 | 1:45:23 | PM | 4 | V | 201 | V | 0 | Hz | 87 | % | 58 | % | 25 | C |
| 516) | 1/5/2010 | 1:45:25 | PM | 56 | V | 216 | V | 0 | Hz | 87 | % | 58 | % | 25 | C |

FIG. 6 - 105

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 518) | 1/5/2010 | 1:45:29 | PM | 13 | V | 211 | V | 0 | Hz | 83 | % | 58 | % | 25 | C |
| 519) | 1/5/2010 | 1:45:31 | PM | 23 | V | 216 | V | 0 | Hz | 83 | % | 58 | % | 25 | C |
| 520) | 1/5/2010 | 1:45:33 | PM | 12 | V | 209 | V | 0 | Hz | 83 | % | 58 | % | 25 | C |
| 521) | 1/5/2010 | 1:45:35 | PM | 6 | V | 209 | V | 0 | Hz | 82 | % | 58 | % | 25 | C |
| 522) | 1/5/2010 | 1:45:37 | PM | 11 | V | 210 | V | 0 | Hz | 82 | % | 58 | % | 25 | C |
| 523) | 1/5/2010 | 1:45:39 | PM | 18 | V | 216 | V | 0 | Hz | 87 | % | 58 | % | 25 | C |
| 524) | 1/5/2010 | 1:45:41 | PM | 35 | V | 216 | V | 0 | Hz | 87 | % | 58 | % | 25 | C |
| 525) | 1/5/2010 | 1:45:43 | PM | 3 | V | 206 | V | 0 | Hz | 87 | % | 58 | % | 25 | C |
| 526) | 1/5/2010 | 1:45:45 | PM | 2 | V | 216 | V | 0 | Hz | 87 | % | 58 | % | 25 | C |
| 527) | 1/5/2010 | 1:45:47 | PM | 10 | V | 217 | V | 0 | Hz | 87 | % | 58 | % | 25 | C |
| 528) | 1/5/2010 | 1:45:50 | PM | 24 | V | 193 | V | 0 | Hz | 81 | % | 58 | % | 25 | C |
| 529) | 1/5/2010 | 1:45:52 | PM | 7 | V | 195 | V | 0 | Hz | 82 | % | 58 | % | 18 | C |
| 530) | 1/5/2010 | 1:45:54 | PM | 2 | V | 216 | V | 0 | Hz | 81 | % | 58 | % | 25 | C |
| 531) | 1/5/2010 | 1:45:56 | PM | 3 | V | 206 | V | 0 | Hz | 81 | % | 58 | % | 25 | C |
| 532) | 1/5/2010 | 1:45:58 | PM | 2 | V | 215 | V | 0 | Hz | 86 | % | 58 | % | 25 | C |
| 533) | 1/5/2010 | 1:46:00 | PM | 3 | V | 212 | V | 0 | Hz | 87 | % | 58 | % | 16 | C |
| 534) | 1/5/2010 | 1:46:02 | PM | 2 | V | 211 | V | 0 | Hz | 88 | % | 58 | % | 25 | C |
| 535) | 1/5/2010 | 1:46:04 | PM | 2 | V | 216 | V | 0 | Hz | 88 | % | 58 | % | 25 | C |
| 536) | 1/5/2010 | 1:46:06 | PM | 6 | V | 212 | V | 0 | Hz | 87 | % | 58 | % | 25 | C |
| 537) | 1/5/2010 | 1:46:08 | PM | 33 | V | 215 | V | 0 | Hz | 82 | % | 58 | % | 25 | C |
| 538) | 1/5/2010 | 1:46:10 | PM | 7 | V | 216 | V | 0 | Hz | 83 | % | 58 | % | 25 | C |
| 539) | 1/5/2010 | 1:46:12 | PM | 7 | V | 216 | V | 0 | Hz | 82 | % | 58 | % | 25 | C |
| 540) | 1/5/2010 | 1:46:14 | PM | 3 | V | 216 | V | 0 | Hz | 83 | % | 62 | % | 25 | C |
| 541) | 1/5/2010 | 1:46:16 | PM | 2 | V | 216 | V | 0 | Hz | 82 | % | 58 | % | 25 | C |
| 542) | 1/5/2010 | 1:46:18 | PM | 2 | V | 216 | V | 0 | Hz | 86 | % | 58 | % | 25 | C |
| 543) | 1/5/2010 | 1:46:21 | PM | 7 | V | 211 | V | 0 | Hz | 80 | % | 58 | % | 25 | C |
| 544) | 1/5/2010 | 1:46:23 | PM | 25 | V | 215 | V | 0 | Hz | 87 | % | 58 | % | 25 | C |
| 545) | 1/5/2010 | 1:46:25 | PM | 2 | V | 212 | V | 0 | Hz | 87 | % | 58 | % | 25 | C |

FIG. 6 - 106

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 546) | 1/5/2010 | 1:46:27 | PM | 2 | V | 215 | V | 0 | Hz | 83 | % | 62 | % | 25 | C |
| 547) | 1/5/2010 | 1:46:29 | PM | 2 | V | 215 | V | 0 | Hz | 82 | % | 58 | % | 25 | C |
| 548) | 1/5/2010 | 1:46:31 | PM | 19 | V | 211 | V | 0 | Hz | 82 | % | 58 | % | 25 | C |
| 549) | 1/5/2010 | 1:46:33 | PM | 9 | V | 205 | V | 0 | Hz | 82 | % | 58 | % | 25 | C |
| 550) | 1/5/2010 | 1:46:35 | PM | 2 | V | 216 | V | 0 | Hz | 88 | % | 58 | % | 25 | C |
| 551) | 1/5/2010 | 1:46:37 | PM | 5 | V | 217 | V | 0 | Hz | 87 | % | 58 | % | 25 | C |
| 552) | 1/5/2010 | 1:46:39 | PM | 8 | V | 206 | V | 0 | Hz | 87 | % | 58 | % | 25 | C |
| 553) | 1/5/2010 | 1:46:41 | PM | 23 | V | 216 | V | 0 | Hz | 87 | % | 58 | % | 25 | C |
| 554) | 1/5/2010 | 1:46:43 | PM | 11 | V | 204 | V | 0 | Hz | 87 | % | 58 | % | 25 | C |
| 555) | 1/5/2010 | 1:46:45 | PM | 5 | V | 190 | V | 0 | Hz | 83 | % | 58 | % | 25 | C |
| 556) | 1/5/2010 | 1:46:47 | PM | 5 | V | 208 | V | 0 | Hz | 82 | % | 58 | % | 25 | C |
| 558) | 1/5/2010 | 1:46:52 | PM | 2 | V | 216 | V | 0 | Hz | 83 | % | 58 | % | 25 | C |
| 559) | 1/5/2010 | 1:46:54 | PM | 2 | V | 205 | V | 0 | Hz | 82 | % | 58 | % | 25 | C |
| 560) | 1/5/2010 | 1:46:56 | PM | 28 | V | 209 | V | 0 | Hz | 86 | % | 58 | % | 25 | C |
| 561) | 1/5/2010 | 1:46:58 | PM | 2 | V | 213 | V | 0 | Hz | 87 | % | 58 | % | 17 | C |
| 562) | 1/5/2010 | 1:47:00 | PM | 13 | V | 206 | V | 0 | Hz | 87 | % | 58 | % | 25 | C |
| 563) | 1/5/2010 | 1:47:02 | PM | 2 | V | 217 | V | 0 | Hz | 87 | % | 58 | % | 25 | C |
| 564) | 1/5/2010 | 1:47:04 | PM | 2 | V | 217 | V | 0 | Hz | 82 | % | 58 | % | 25 | C |
| 565) | 1/5/2010 | 1:47:06 | PM | 8 | V | 216 | V | 0 | Hz | 82 | % | 58 | % | 25 | C |
| 566) | 1/5/2010 | 1:47:08 | PM | 7 | V | 189 | V | 0 | Hz | 83 | % | 58 | % | 25 | C |
| 567) | 1/5/2010 | 1:47:10 | PM | 2 | V | 213 | V | 0 | Hz | 83 | % | 58 | % | 25 | C |
| 568) | 1/5/2010 | 1:47:12 | PM | 2 | V | 212 | V | 0 | Hz | 82 | % | 58 | % | 25 | C |
| 569) | 1/5/2010 | 1:47:14 | PM | 2 | V | 215 | V | 0 | Hz | 87 | % | 58 | % | 25 | C |
| 570) | 1/5/2010 | 1:47:16 | PM | 4 | V | 200 | V | 0 | Hz | 88 | % | 58 | % | 25 | C |
| 571) | 1/5/2010 | 1:47:18 | PM | 2 | V | 211 | V | 0 | Hz | 87 | % | 58 | % | 25 | C |
| 572) | 1/5/2010 | 1:47:20 | PM | 2 | V | 210 | V | 0 | Hz | 86 | % | 58 | % | 25 | C |
| 573) | 1/5/2010 | 1:47:23 | PM | 2 | V | 215 | V | 0 | Hz | 86 | % | 58 | % | 25 | C |
| 574) | 1/5/2010 | 1:47:25 | PM | 17 | V | 214 | V | 0 | Hz | 82 | % | 58 | % | 25 | C |

FIG. 6 - 107

| Seq. # | Date | Time | | Input Voltage | Volts | Output Voltage | Volts | Input Frequency | Hertz | Output Load | % | B.B. Capacity | % | System Temperature | |
|---|---|---|---|---|---|---|---|---|---|---|---|---|---|---|---|
| 575) | 1/5/2010 | 1:47:27 | PM | 31 | V | 214 | V | 0 | Hz | 82 | % | 58 | % | 25 | C |
| 576) | 1/5/2010 | 1:47:29 | PM | 4 | V | 213 | V | 0 | Hz | 82 | % | 58 | % | 25 | C |
| 577) | 1/5/2010 | 1:47:31 | PM | 2 | V | 214 | V | 0 | Hz | 83 | % | 58 | % | 25 | C |
| 578) | 1/5/2010 | 1:47:33 | PM | 5 | V | 200 | V | 0 | Hz | 82 | % | 58 | % | 25 | C |
| 579) | 1/5/2010 | 1:47:35 | PM | 190 | V | 217 | V | 51 | Hz | 87 | % | 53 | % | 17 | C |
| 580) | 1/5/2010 | 1:47:37 | PM | 181 | V | 207 | V | 51 | Hz | 82 | % | 53 | % | 25 | C |
| 581) | 1/5/2010 | 1:47:39 | PM | 178 | V | 208 | V | 51 | Hz | 87 | % | 53 | % | 25 | C |
| 582) | 1/5/2010 | 1:47:41 | PM | 182 | V | 199 | V | 51 | Hz | 80 | % | 53 | % | 25 | C |
| 583) | 1/5/2010 | 1:47:43 | PM | 177 | V | 203 | V | 50 | Hz | 93 | % | 53 | % | 25 | C |
| 584) | 1/5/2010 | 1:47:45 | PM | 179 | V | 196 | V | 51 | Hz | 84 | % | 53 | % | 25 | C |
| 585) | 1/5/2010 | 1:47:47 | PM | 180 | V | 219 | V | 50 | Hz | 82 | % | 53 | % | 16 | C |
| 586) | 1/5/2010 | 1:47:49 | PM | 175 | V | 202 | V | 51 | Hz | 89 | % | 55 | % | 25 | C |
| 587) | 1/5/2010 | 1:47:51 | PM | 191 | V | 205 | V | 50 | Hz | 90 | % | 68 | % | 28 | C |
| 588) | 1/5/2010 | 1:47:54 | PM | 203 | V | 218 | V | 51 | Hz | 95 | % | 70 | % | 28 | C |
| 589) | 1/5/2010 | 1:47:56 | PM | 204 | V | 224 | V | 51 | Hz | 91 | % | 70 | % | 28 | C |
| 590) | 1/5/2010 | 1:47:58 | PM | 204 | V | 222 | V | 51 | Hz | 98 | % | 73 | % | 28 | C |
| 591) | 1/5/2010 | 1:48:00 | PM | 204 | V | 204 | V | 51 | Hz | 89 | % | 73 | % | 28 | C |
| 592) | 1/5/2010 | 1:48:02 | PM | 203 | V | 215 | V | 50 | Hz | 93 | % | 73 | % | 23 | C |
| 593) | 1/5/2010 | 1:48:04 | PM | 199 | V | 217 | V | 50 | Hz | 91 | % | 72 | % | 28 | C |
| 594) | 1/5/2010 | 1:48:06 | PM | 199 | V | 213 | V | 51 | Hz | 94 | % | 75 | % | 28 | C |
| 595) | 1/5/2010 | 1:48:08 | PM | 203 | V | 218 | V | 51 | Hz | 94 | % | 73 | % | 28 | C |
| 596) | 1/5/2010 | 1:48:10 | PM | 205 | V | 200 | V | 50 | Hz | 88 | % | 73 | % | 28 | C |
| 598) | 1/5/2010 | 1:48:14 | PM | 204 | V | 207 | V | 51 | Hz | 99 | % | 73 | % | 28 | C |
| 599) | 1/5/2010 | 1:48:16 | PM | 205 | V | 219 | V | 51 | Hz | 93 | % | 75 | % | 28 | C |
| 600) | 1/5/2010 | 1:48:18 | PM | 203 | V | 210 | V | 51 | Hz | 102 | % | 73 | % | 28 | C |
| 601) | 1/5/2010 | 1:48:20 | PM | 202 | V | 210 | V | 51 | Hz | 89 | % | 75 | % | 28 | C |
| 602) | 1/5/2010 | 1:48:22 | PM | 204 | V | 209 | V | 51 | Hz | 97 | % | 75 | % | 28 | C |
| 603) | 1/5/2010 | 1:48:25 | PM | 202 | V | 222 | V | 51 | Hz | 91 | % | 75 | % | 28 | C |

FIG. 6 - 108

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 604) | 1/5/2010 | 1:48:27 | PM | 201 | V | 216 | V | 51 | Hz | 98 | % | 75 | % | 28 | C |
| 605) | 1/5/2010 | 1:48:29 | PM | 204 | V | 223 | V | 50 | Hz | 89 | % | 75 | % | 28 | C |
| 606) | 1/5/2010 | 1:48:31 | PM | 199 | V | 209 | V | 51 | Hz | 97 | % | 77 | % | 28 | C |
| 607) | 1/5/2010 | 1:48:34 | PM | 204 | V | 209 | V | 51 | Hz | 94 | % | 75 | % | 28 | C |
| 608) | 1/5/2010 | 1:48:36 | PM | 203 | V | 209 | V | 50 | Hz | 97 | % | 75 | % | 28 | C |
| 609) | 1/5/2010 | 1:48:38 | PM | 196 | V | 217 | V | 51 | Hz | 103 | % | 75 | % | 20 | C |
| 610) | 1/5/2010 | 1:48:40 | PM | 196 | V | 211 | V | 51 | Hz | 90 | % | 75 | % | 23 | C |
| 611) | 1/5/2010 | 1:48:42 | PM | 204 | V | 222 | V | 51 | Hz | 99 | % | 77 | % | 18 | C |
| 612) | 1/5/2010 | 1:48:46 | PM | 197 | V | 219 | V | 51 | Hz | 87 | % | 77 | % | 28 | C |
| 613) | 1/5/2010 | 1:48:48 | PM | 205 | V | 205 | V | 51 | Hz | 91 | % | 77 | % | 28 | C |
| 614) | 1/5/2010 | 1:48:50 | PM | 206 | V | 222 | V | 51 | Hz | 58 | % | 77 | % | 28 | C |
| 615) | 1/5/2010 | 1:48:52 | PM | 210 | V | 210 | V | 50 | Hz | 49 | % | 77 | % | 28 | C |
| 616) | 1/5/2010 | 1:48:54 | PM | 215 | V | 221 | V | 51 | Hz | 37 | % | 77 | % | 28 | C |
| 617) | 1/5/2010 | 1:48:57 | PM | 214 | V | 221 | V | 51 | Hz | 37 | % | 77 | % | 28 | C |
| 618) | 1/5/2010 | 1:48:59 | PM | 214 | V | 221 | V | 51 | Hz | 37 | % | 77 | % | 28 | C |
| 619) | 1/5/2010 | 1:49:01 | PM | 214 | V | 220 | V | 51 | Hz | 36 | % | 75 | % | 28 | C |
| 620) | 1/5/2010 | 1:49:03 | PM | 215 | V | 220 | V | 51 | Hz | 38 | % | 77 | % | 28 | C |
| 621) | 1/5/2010 | 1:49:05 | PM | 214 | V | 220 | V | 51 | Hz | 37 | % | 77 | % | 28 | C |
| 622) | 1/5/2010 | 1:49:07 | PM | 215 | V | 220 | V | 51 | Hz | 35 | % | 77 | % | 28 | C |
| 623) | 1/5/2010 | 1:49:09 | PM | 216 | V | 220 | V | 51 | Hz | 36 | % | 77 | % | 28 | C |
| 624) | 1/5/2010 | 1:49:11 | PM | 216 | V | 220 | V | 51 | Hz | 38 | % | 78 | % | 28 | C |
| 625) | 1/5/2010 | 1:49:13 | PM | 216 | V | 220 | V | 51 | Hz | 36 | % | 77 | % | 28 | C |
| 626) | 1/5/2010 | 1:49:15 | PM | 215 | V | 220 | V | 51 | Hz | 38 | % | 77 | % | 28 | C |
| 627) | 1/5/2010 | 1:49:17 | PM | 216 | V | 221 | V | 51 | Hz | 37 | % | 77 | % | 28 | C |
| 628) | 1/5/2010 | 1:49:19 | PM | 215 | V | 221 | V | 51 | Hz | 37 | % | 77 | % | 28 | C |
| 629) | 1/5/2010 | 1:49:21 | PM | 216 | V | 220 | V | 51 | Hz | 38 | % | 78 | % | 28 | C |
| 630) | 1/5/2010 | 1:49:23 | PM | 215 | V | 213 | V | 51 | Hz | 36 | % | 78 | % | 28 | C |
| 631) | 1/5/2010 | 1:49:25 | PM | 216 | V | 220 | V | 51 | Hz | 36 | % | 78 | % | 28 | C |

FIG. 6 - 109

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 632) | 1/5/2010 | 1:49:28 | PM | 215 | V | 220 | V | 51 | Hz | 39 | % | 78 | % | 28 | C |
| 633) | 1/5/2010 | 1:49:30 | PM | 215 | V | 220 | V | 51 | Hz | 38 | % | 77 | % | 28 | C |
| 634) | 1/5/2010 | 1:49:32 | PM | 216 | V | 221 | V | 51 | Hz | 39 | % | 77 | % | 28 | C |
| 635) | 1/5/2010 | 1:49:34 | PM | 216 | V | 220 | V | 51 | Hz | 36 | % | 78 | % | 28 | C |
| 636) | 1/5/2010 | 1:49:36 | PM | 216 | V | 220 | V | 51 | Hz | 36 | % | 78 | % | 28 | C |
| 638) | 1/5/2010 | 1:49:40 | PM | 215 | V | 198 | V | 51 | Hz | 39 | % | 77 | % | 28 | C |
| 639) | 1/5/2010 | 1:49:42 | PM | 216 | V | 221 | V | 51 | Hz | 40 | % | 78 | % | 28 | C |
| 640) | 1/5/2010 | 1:49:44 | PM | 216 | V | 220 | V | 51 | Hz | 39 | % | 78 | % | 28 | C |
| 641) | 1/5/2010 | 1:49:46 | PM | 216 | V | 220 | V | 51 | Hz | 36 | % | 78 | % | 28 | C |
| 642) | 1/5/2010 | 1:49:48 | PM | 216 | V | 220 | V | 51 | Hz | 39 | % | 78 | % | 28 | C |
| 643) | 1/5/2010 | 1:49:50 | PM | 215 | V | 220 | V | 51 | Hz | 38 | % | 78 | % | 28 | C |
| 644) | 1/5/2010 | 1:49:52 | PM | 216 | V | 221 | V | 51 | Hz | 40 | % | 78 | % | 28 | C |
| 645) | 1/5/2010 | 1:49:54 | PM | 215 | V | 220 | V | 50 | Hz | 39 | % | 80 | % | 28 | C |
| 646) | 1/5/2010 | 1:49:55 | PM | 216 | V | 220 | V | 51 | Hz | 36 | % | 78 | % | 28 | C |
| 647) | 1/5/2010 | 1:49:59 | PM | 215 | V | 220 | V | 51 | Hz | 39 | % | 78 | % | 28 | C |
| 648) | 1/5/2010 | 1:50:01 | PM | 216 | V | 219 | V | 51 | Hz | 39 | % | 78 | % | 28 | C |
| 649) | 1/5/2010 | 1:50:03 | PM | 216 | V | 220 | V | 51 | Hz | 37 | % | 80 | % | 28 | C |
| 650) | 1/5/2010 | 1:50:05 | PM | 216 | V | 220 | V | 51 | Hz | 35 | % | 78 | % | 28 | C |
| 651) | 1/5/2010 | 1:50:07 | PM | 216 | V | 221 | V | 51 | Hz | 38 | % | 80 | % | 28 | C |
| 652) | 1/5/2010 | 1:50:09 | PM | 217 | V | 220 | V | 51 | Hz | 39 | % | 78 | % | 28 | C |
| 653) | 1/5/2010 | 1:50:11 | PM | 217 | V | 220 | V | 51 | Hz | 37 | % | 80 | % | 28 | C |
| 654) | 1/5/2010 | 1:50:13 | PM | 216 | V | 221 | V | 51 | Hz | 40 | % | 78 | % | 28 | C |
| 655) | 1/5/2010 | 1:50:15 | PM | 215 | V | 220 | V | 51 | Hz | 40 | % | 80 | % | 28 | C |
| 656) | 1/5/2010 | 1:50:17 | PM | 216 | V | 221 | V | 51 | Hz | 37 | % | 80 | % | 28 | C |
| 657) | 1/5/2010 | 1:50:19 | PM | 216 | V | 219 | V | 51 | Hz | 37 | % | 80 | % | 28 | C |
| 658) | 1/5/2010 | 1:50:21 | PM | 217 | V | 220 | V | 51 | Hz | 38 | % | 80 | % | 28 | C |
| 659) | 1/5/2010 | 1:50:23 | PM | 216 | V | 221 | V | 51 | Hz | 36 | % | 78 | % | 28 | C |
| 660) | 1/5/2010 | 1:50:25 | PM | 216 | V | 220 | V | 50 | Hz | 39 | % | 80 | % | 28 | C |

FIG. 6 - 110

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 661) | 1/5/2010 | 1:50:27 | PM | 215 | V | 220 | V | 51 | Hz | 46 | % | 82 | % | 28 | C |
| 662) | 1/5/2010 | 1:50:30 | PM | 216 | V | 221 | V | 51 | Hz | 39 | % | 80 | % | 28 | C |
| 663) | 1/5/2010 | 1:50:32 | PM | 216 | V | 220 | V | 51 | Hz | 37 | % | 82 | % | 28 | C |
| 664) | 1/5/2010 | 1:50:34 | PM | 216 | V | 220 | V | 50 | Hz | 37 | % | 80 | % | 28 | C |
| 665) | 1/5/2010 | 1:50:36 | PM | 216 | V | 220 | V | 51 | Hz | 38 | % | 80 | % | 28 | C |
| 666) | 1/5/2010 | 1:50:38 | PM | 215 | V | 220 | V | 51 | Hz | 35 | % | 80 | % | 28 | C |
| 667) | 1/5/2010 | 1:50:40 | PM | 215 | V | 221 | V | 51 | Hz | 37 | % | 80 | % | 28 | C |
| 668) | 1/5/2010 | 1:50:42 | PM | 216 | V | 220 | V | 51 | Hz | 39 | % | 80 | % | 28 | C |
| 669) | 1/5/2010 | 1:50:44 | PM | 215 | V | 220 | V | 51 | Hz | 40 | % | 82 | % | 28 | C |
| 670) | 1/5/2010 | 1:50:46 | PM | 215 | V | 220 | V | 51 | Hz | 39 | % | 80 | % | 28 | C |
| 671) | 1/5/2010 | 1:50:48 | PM | 215 | V | 221 | V | 51 | Hz | 38 | % | 80 | % | 28 | C |
| 672) | 1/5/2010 | 1:50:50 | PM | 215 | V | 220 | V | 51 | Hz | 37 | % | 80 | % | 28 | C |
| 673) | 1/5/2010 | 1:50:52 | PM | 216 | V | 220 | V | 51 | Hz | 38 | % | 80 | % | 28 | C |
| 674) | 1/5/2010 | 1:50:54 | PM | 216 | V | 220 | V | 51 | Hz | 35 | % | 82 | % | 28 | C |
| 675) | 1/5/2010 | 1:50:56 | PM | 214 | V | 220 | V | 51 | Hz | 37 | % | 82 | % | 28 | C |
| 676) | 1/5/2010 | 1:50:58 | PM | 215 | V | 220 | V | 51 | Hz | 41 | % | 80 | % | 28 | C |
| 678) | 1/5/2010 | 1:51:03 | PM | 215 | V | 220 | V | 51 | Hz | 38 | % | 80 | % | 28 | C |
| 679) | 1/5/2010 | 1:51:05 | PM | 215 | V | 209 | V | 51 | Hz | 37 | % | 80 | % | 28 | C |
| 680) | 1/5/2010 | 1:51:07 | PM | 215 | V | 221 | V | 51 | Hz | 41 | % | 82 | % | 28 | C |
| 681) | 1/5/2010 | 1:51:09 | PM | 215 | V | 220 | V | 51 | Hz | 42 | % | 80 | % | 28 | C |
| 682) | 1/5/2010 | 1:51:11 | PM | 215 | V | 220 | V | 51 | Hz | 39 | % | 80 | % | 28 | C |
| 683) | 1/5/2010 | 1:51:13 | PM | 215 | V | 220 | V | 51 | Hz | 39 | % | 80 | % | 28 | C |
| 684) | 1/5/2010 | 1:51:15 | PM | 216 | V | 220 | V | 51 | Hz | 35 | % | 80 | % | 28 | C |
| 685) | 1/5/2010 | 1:51:17 | PM | 2 | V | 217 | V | 0 | Hz | 36 | % | 83 | % | 27 | C |
| 686) | 1/5/2010 | 1:51:19 | PM | 2 | V | 218 | V | 0 | Hz | 36 | % | 82 | % | 27 | C |
| 687) | 1/5/2010 | 1:51:21 | PM | 2 | V | 218 | V | 0 | Hz | 38 | % | 82 | % | 27 | C |
| 688) | 1/5/2010 | 1:51:23 | PM | 2 | V | 218 | V | 0 | Hz | 37 | % | 82 | % | 27 | C |
| 689) | 1/5/2010 | 1:51:25 | PM | 2 | V | 218 | V | 0 | Hz | 38 | % | 82 | % | 27 | C |

FIG. 6 - 111

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 690) | 1/5/2010 | 1:51:27 | PM | 2 | V | 218 | V | 0 | Hz | 38 | % | 82 | % | 27 | C |
| 691) | 1/5/2010 | 1:51:29 | PM | 2 | V | 219 | V | 0 | Hz | 38 | % | 82 | % | 27 | C |
| 692) | 1/5/2010 | 1:51:32 | PM | 2 | V | 218 | V | 0 | Hz | 36 | % | 82 | % | 27 | C |
| 693) | 1/5/2010 | 1:51:34 | PM | 2 | V | 218 | V | 0 | Hz | 36 | % | 80 | % | 27 | C |
| 694) | 1/5/2010 | 1:51:36 | PM | 2 | V | 218 | V | 0 | Hz | 36 | % | 80 | % | 27 | C |
| 695) | 1/5/2010 | 1:51:38 | PM | 2 | V | 218 | V | 0 | Hz | 36 | % | 80 | % | 27 | C |
| 696) | 1/5/2010 | 1:51:40 | PM | 2 | V | 218 | V | 0 | Hz | 37 | % | 80 | % | 27 | C |
| 697) | 1/5/2010 | 1:51:42 | PM | 2 | V | 218 | V | 0 | Hz | 38 | % | 80 | % | 27 | C |
| 698) | 1/5/2010 | 1:51:44 | PM | 2 | V | 218 | V | 0 | Hz | 38 | % | 80 | % | 27 | C |
| 699) | 1/5/2010 | 1:51:46 | PM | 2 | V | 218 | V | 0 | Hz | 38 | % | 80 | % | 27 | C |
| 700) | 1/5/2010 | 1:51:48 | PM | 2 | V | 218 | V | 0 | Hz | 39 | % | 80 | % | 27 | C |
| 701) | 1/5/2010 | 1:51:50 | PM | 2 | V | 218 | V | 0 | Hz | 38 | % | 80 | % | 27 | C |
| 702) | 1/5/2010 | 1:51:52 | PM | 2 | V | 218 | V | 0 | Hz | 36 | % | 78 | % | 27 | C |
| 703) | 1/5/2010 | 1:51:54 | PM | 2 | V | 218 | V | 0 | Hz | 43 | % | 77 | % | 27 | C |
| 704) | 1/5/2010 | 1:51:56 | PM | 10 | V | 196 | V | 0 | Hz | 69 | % | 68 | % | 25 | C |
| 705) | 1/5/2010 | 1:51:58 | PM | 2 | V | 215 | V | 0 | Hz | 66 | % | 65 | % | 25 | C |
| 706) | 1/5/2010 | 1:52:00 | PM | 2 | V | 213 | V | 0 | Hz | 89 | % | 65 | % | 17 | C |
| 707) | 1/5/2010 | 1:52:03 | PM | 2 | V | 217 | V | 0 | Hz | 87 | % | 62 | % | 25 | C |
| 708) | 1/5/2010 | 1:52:05 | PM | 2 | V | 216 | V | 0 | Hz | 88 | % | 62 | % | 25 | C |
| 709) | 1/5/2010 | 1:52:07 | PM | 4 | V | 205 | V | 0 | Hz | 88 | % | 62 | % | 25 | C |
| 710) | 1/5/2010 | 1:52:09 | PM | 2 | V | 215 | V | 0 | Hz | 83 | % | 62 | % | 25 | C |
| 711) | 1/5/2010 | 1:52:11 | PM | 2 | V | 215 | V | 0 | Hz | 83 | % | 62 | % | 25 | C |
| 712) | 1/5/2010 | 1:52:13 | PM | 35 | V | 217 | V | 0 | Hz | 83 | % | 62 | % | 25 | C |
| 713) | 1/5/2010 | 1:52:15 | PM | 32 | V | 205 | V | 0 | Hz | 82 | % | 58 | % | 25 | C |
| 714) | 1/5/2010 | 1:52:17 | PM | 2 | V | 196 | V | 0 | Hz | 87 | % | 58 | % | 25 | C |
| 715) | 1/5/2010 | 1:52:19 | PM | 18 | V | 216 | V | 0 | Hz | 86 | % | 58 | % | 25 | C |
| 716) | 1/5/2010 | 1:52:21 | PM | 2 | V | 214 | V | 0 | Hz | 87 | % | 58 | % | 25 | C |
| 718) | 1/5/2010 | 1:52:25 | PM | 3 | V | 215 | V | 0 | Hz | 86 | % | 58 | % | 27 | C |

FIG. 6 - 112

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 719} | 1/5/2010 | 1:52:27 | PM | 9 | V | 211 | V | 0 | Hz | 87 | % | 58 | % | 25 | C |
| 720} | 1/5/2010 | 1:52:29 | PM | 9 | V | 214 | V | 0 | Hz | 82 | % | 58 | % | 25 | C |
| 721} | 1/5/2010 | 1:52:31 | PM | 2 | V | 216 | V | 0 | Hz | 82 | % | 58 | % | 25 | C |
| 722} | 1/5/2010 | 1:52:34 | PM | 35 | V | 206 | V | 0 | Hz | 81 | % | 58 | % | 25 | C |
| 723} | 1/5/2010 | 1:52:36 | PM | 3 | V | 212 | V | 0 | Hz | 82 | % | 58 | % | 25 | C |
| 724} | 1/5/2010 | 1:52:38 | PM | 16 | V | 190 | V | 0 | Hz | 87 | % | 58 | % | 25 | C |
| 725} | 1/5/2010 | 1:52:40 | PM | 2 | V | 217 | V | 0 | Hz | 86 | % | 58 | % | 25 | C |
| 726} | 1/5/2010 | 1:52:42 | PM | 14 | V | 217 | V | 0 | Hz | 87 | % | 58 | % | 25 | C |
| 727} | 1/5/2010 | 1:52:44 | PM | 28 | V | 217 | V | 0 | Hz | 86 | % | 58 | % | 25 | C |
| 728} | 1/5/2010 | 1:52:46 | PM | 2 | V | 215 | V | 0 | Hz | 82 | % | 58 | % | 25 | C |
| 729} | 1/5/2010 | 1:52:48 | PM | 8 | V | 214 | V | 0 | Hz | 81 | % | 58 | % | 25 | C |
| 730} | 1/5/2010 | 1:52:50 | PM | 28 | V | 201 | V | 0 | Hz | 82 | % | 58 | % | 25 | C |
| 731} | 1/5/2010 | 1:52:52 | PM | 2 | V | 215 | V | 0 | Hz | 82 | % | 58 | % | 25 | C |
| 732} | 1/5/2010 | 1:52:54 | PM | 6 | V | 212 | V | 0 | Hz | 82 | % | 58 | % | 25 | C |
| 733} | 1/5/2010 | 1:52:56 | PM | 2 | V | 207 | V | 0 | Hz | 87 | % | 58 | % | 25 | C |
| 734} | 1/5/2010 | 1:52:58 | PM | 4 | V | 200 | V | 0 | Hz | 87 | % | 58 | % | 25 | C |
| 735} | 1/5/2010 | 1:53:00 | PM | 4 | V | 214 | V | 0 | Hz | 87 | % | 58 | % | 25 | C |
| 736} | 1/5/2010 | 1:53:02 | PM | 5 | V | 200 | V | 0 | Hz | 86 | % | 58 | % | 25 | C |
| 737} | 1/5/2010 | 1:53:05 | PM | 2 | V | 208 | V | 0 | Hz | 81 | % | 58 | % | 25 | C |
| 738} | 1/5/2010 | 1:53:07 | PM | 2 | V | 213 | V | 0 | Hz | 83 | % | 58 | % | 25 | C |
| 739} | 1/5/2010 | 1:53:09 | PM | 4 | V | 201 | V | 0 | Hz | 83 | % | 58 | % | 25 | C |
| 740} | 1/5/2010 | 1:53:11 | PM | 15 | V | 216 | V | 0 | Hz | 82 | % | 58 | % | 25 | C |
| 741} | 1/5/2010 | 1:53:13 | PM | 2 | V | 214 | V | 0 | Hz | 81 | % | 58 | % | 25 | C |
| 742} | 1/5/2010 | 1:53:15 | PM | 9 | V | 215 | V | 0 | Hz | 86 | % | 58 | % | 25 | C |
| 743} | 1/5/2010 | 1:53:17 | PM | 5 | V | 214 | V | 0 | Hz | 86 | % | 58 | % | 25 | C |
| 744} | 1/5/2010 | 1:53:19 | PM | 9 | V | 203 | V | 0 | Hz | 87 | % | 58 | % | 25 | C |
| 745} | 1/5/2010 | 1:53:21 | PM | 2 | V | 208 | V | 0 | Hz | 86 | % | 58 | % | 25 | C |
| 746} | 1/5/2010 | 1:53:23 | PM | 3 | V | 203 | V | 0 | Hz | 86 | % | 58 | % | 25 | C |

FIG. 6 - 113

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 747) | 1/5/2010 | 1:53:25 | PM | 27 | V | 217 | V | 0 | Hz | 82 | % | 58 | % | 25 | C |
| 748) | 1/5/2010 | 1:53:27 | PM | 2 | V | 216 | V | 0 | Hz | 82 | % | 58 | % | 25 | C |
| 749) | 1/5/2010 | 1:53:29 | PM | 2 | V | 208 | V | 0 | Hz | 82 | % | 58 | % | 25 | C |
| 750) | 1/5/2010 | 1:53:31 | PM | 6 | V | 204 | V | 0 | Hz | 82 | % | 58 | % | 25 | C |
| 751) | 1/5/2010 | 1:53:33 | PM | 4 | V | 209 | V | 0 | Hz | 86 | % | 58 | % | 25 | C |
| 752) | 1/5/2010 | 1:53:36 | PM | 2 | V | 215 | V | 0 | Hz | 86 | % | 58 | % | 25 | C |
| 753) | 1/5/2010 | 1:53:38 | PM | 10 | V | 216 | V | 0 | Hz | 87 | % | 58 | % | 25 | C |
| 754) | 1/5/2010 | 1:53:40 | PM | 10 | V | 216 | V | 0 | Hz | 87 | % | 58 | % | 25 | C |
| 755) | 1/5/2010 | 1:53:42 | PM | 2 | V | 201 | V | 0 | Hz | 82 | % | 58 | % | 15 | C |
| 756) | 1/5/2010 | 1:53:44 | PM | 3 | V | 203 | V | 0 | Hz | 82 | % | 58 | % | 25 | C |
| 758) | 1/5/2010 | 1:53:48 | PM | 2 | V | 216 | V | 0 | Hz | 82 | % | 58 | % | 25 | C |
| 759) | 1/5/2010 | 1:53:50 | PM | 2 | V | 216 | V | 0 | Hz | 82 | % | 58 | % | 25 | C |
| 760) | 1/5/2010 | 1:53:52 | PM | 2 | V | 199 | V | 0 | Hz | 82 | % | 58 | % | 25 | C |
| 761) | 1/5/2010 | 1:53:54 | PM | 2 | V | 216 | V | 0 | Hz | 86 | % | 58 | % | 25 | C |
| 762) | 1/5/2010 | 1:53:56 | PM | 13 | V | 216 | V | 0 | Hz | 86 | % | 58 | % | 25 | C |
| 763) | 1/5/2010 | 1:53:58 | PM | 3 | V | 218 | V | 0 | Hz | 86 | % | 58 | % | 25 | C |
| 764) | 1/5/2010 | 1:54:00 | PM | 2 | V | 201 | V | 0 | Hz | 87 | % | 58 | % | 25 | C |
| 765) | 1/5/2010 | 1:54:02 | PM | 2 | V | 212 | V | 0 | Hz | 82 | % | 58 | % | 18 | C |
| 766) | 1/5/2010 | 1:54:04 | PM | 2 | V | 215 | V | 0 | Hz | 82 | % | 58 | % | 17 | C |
| 767) | 1/5/2010 | 1:54:07 | PM | 5 | V | 216 | V | 0 | Hz | 82 | % | 58 | % | 25 | C |
| 768) | 1/5/2010 | 1:54:09 | PM | 24 | V | 216 | V | 0 | Hz | 82 | % | 58 | % | 25 | C |
| 769) | 1/5/2010 | 1:54:11 | PM | 2 | V | 217 | V | 0 | Hz | 86 | % | 58 | % | 25 | C |
| 770) | 1/5/2010 | 1:54:13 | PM | 2 | V | 215 | V | 0 | Hz | 87 | % | 58 | % | 25 | C |
| 771) | 1/5/2010 | 1:54:15 | PM | 13 | V | 209 | V | 0 | Hz | 86 | % | 58 | % | 25 | C |
| 772) | 1/5/2010 | 1:54:17 | PM | 14 | V | 202 | V | 0 | Hz | 87 | % | 58 | % | 25 | C |
| 773) | 1/5/2010 | 1:54:19 | PM | 27 | V | 215 | V | 0 | Hz | 87 | % | 58 | % | 25 | C |
| 774) | 1/5/2010 | 1:54:21 | PM | 2 | V | 204 | V | 0 | Hz | 82 | % | 58 | % | 25 | C |
| 775) | 1/5/2010 | 1:54:23 | PM | 8 | V | 216 | V | 0 | Hz | 82 | % | 58 | % | 25 | C |

FIG. 6 - 114

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 776) | 1/5/2010 | 1:54:25 | PM | 9 | V | 216 | V | 0 | Hz | 82 | % | 58 | % | 25 | C |
| 777) | 1/5/2010 | 1:54:27 | PM | 2 | V | 213 | V | 0 | Hz | 82 | % | 58 | % | 25 | C |
| 778) | 1/5/2010 | 1:54:29 | PM | 6 | V | 204 | V | 0 | Hz | 82 | % | 58 | % | 25 | C |
| 779) | 1/5/2010 | 1:54:31 | PM | 5 | V | 216 | V | 0 | Hz | 86 | % | 58 | % | 25 | C |
| 780) | 1/5/2010 | 1:54:33 | PM | 4 | V | 216 | V | 0 | Hz | 87 | % | 58 | % | 25 | C |
| 781) | 1/5/2010 | 1:54:35 | PM | 2 | V | 216 | V | 0 | Hz | 87 | % | 58 | % | 25 | C |
| 782) | 1/5/2010 | 1:54:38 | PM | 27 | V | 216 | V | 0 | Hz | 86 | % | 58 | % | 25 | C |
| 783) | 1/5/2010 | 1:54:40 | PM | 2 | V | 209 | V | 0 | Hz | 82 | % | 58 | % | 25 | C |
| 784) | 1/5/2010 | 1:54:42 | PM | 21 | V | 216 | V | 0 | Hz | 83 | % | 58 | % | 25 | C |
| 785) | 1/5/2010 | 1:54:44 | PM | 7 | V | 211 | V | 0 | Hz | 82 | % | 58 | % | 19 | C |
| 786) | 1/5/2010 | 1:54:46 | PM | 24 | V | 204 | V | 0 | Hz | 82 | % | 58 | % | 25 | C |
| 787) | 1/5/2010 | 1:54:48 | PM | 2 | V | 198 | V | 0 | Hz | 82 | % | 58 | % | 25 | C |
| 788) | 1/5/2010 | 1:54:50 | PM | 7 | V | 211 | V | 0 | Hz | 87 | % | 58 | % | 25 | C |
| 789) | 1/5/2010 | 1:54:52 | PM | 10 | V | 195 | V | 0 | Hz | 87 | % | 58 | % | 25 | C |
| 790) | 1/5/2010 | 1:54:54 | PM | 2 | V | 215 | V | 0 | Hz | 87 | % | 58 | % | 25 | C |
| 791) | 1/5/2010 | 1:54:56 | PM | 13 | V | 197 | V | 0 | Hz | 87 | % | 58 | % | 25 | C |
| 792) | 1/5/2010 | 1:54:58 | PM | 2 | V | 208 | V | 0 | Hz | 87 | % | 58 | % | 25 | C |
| 793) | 1/5/2010 | 1:55:00 | PM | 8 | V | 216 | V | 0 | Hz | 87 | % | 58 | % | 25 | C |
| 794) | 1/5/2010 | 1:55:02 | PM | 2 | V | 216 | V | 0 | Hz | 82 | % | 58 | % | 25 | C |
| 795) | 1/5/2010 | 1:55:04 | PM | 4 | V | 214 | V | 0 | Hz | 83 | % | 58 | % | 25 | C |
| 796) | 1/5/2010 | 1:55:06 | PM | 15 | V | 216 | V | 0 | Hz | 82 | % | 58 | % | 25 | C |
| 798) | 1/5/2010 | 1:55:11 | PM | 2 | V | 214 | V | 0 | Hz | 87 | % | 58 | % | 25 | C |
| 799) | 1/5/2010 | 1:55:13 | PM | 7 | V | 217 | V | 0 | Hz | 87 | % | 58 | % | 25 | C |
| 800) | 1/5/2010 | 1:55:15 | PM | 2 | V | 216 | V | 0 | Hz | 86 | % | 58 | % | 25 | C |
| 801) | 1/5/2010 | 1:55:17 | PM | 9 | V | 210 | V | 0 | Hz | 87 | % | 58 | % | 25 | C |
| 802) | 1/5/2010 | 1:55:19 | PM | 2 | V | 217 | V | 0 | Hz | 83 | % | 58 | % | 25 | C |
| 803) | 1/5/2010 | 1:55:21 | PM | 2 | V | 215 | V | 0 | Hz | 82 | % | 58 | % | 25 | C |
| 804) | 1/5/2010 | 1:55:23 | PM | 6 | V | 213 | V | 0 | Hz | 82 | % | 58 | % | 25 | C |

FIG. 6 - 115

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 805) | 1/5/2010 | 1:55:25 | PM | 2 | V | 213 | V | 0 | Hz | 82 | % | 58 | % | 92 | C |
| 806) | 1/5/2010 | 1:55:27 | PM | 2 | V | 214 | V | 0 | Hz | 82 | % | 58 | % | 25 | C |
| 807) | 1/5/2010 | 1:55:29 | PM | 2 | V | 197 | V | 0 | Hz | 87 | % | 58 | % | 25 | C |
| 808) | 1/5/2010 | 1:55:31 | PM | 2 | V | 218 | V | 0 | Hz | 56 | % | 62 | % | 26 | C |
| 809) | 1/5/2010 | 1:55:33 | PM | 2 | V | 222 | V | 0 | Hz | 40 | % | 70 | % | 27 | C |
| 810) | 1/5/2010 | 1:55:35 | PM | 2 | V | 220 | V | 0 | Hz | 39 | % | 73 | % | 27 | C |
| 811) | 1/5/2010 | 1:55:37 | PM | 2 | V | 220 | V | 0 | Hz | 39 | % | 73 | % | 27 | C |
| 812) | 1/5/2010 | 1:55:40 | PM | 2 | V | 220 | V | 0 | Hz | 36 | % | 73 | % | 27 | C |
| 813) | 1/5/2010 | 1:55:42 | PM | 2 | V | 220 | V | 0 | Hz | 37 | % | 73 | % | 27 | C |
| 814) | 1/5/2010 | 1:55:44 | PM | 2 | V | 220 | V | 0 | Hz | 36 | % | 73 | % | 27 | C |
| 815) | 1/5/2010 | 1:55:46 | PM | 2 | V | 220 | V | 0 | Hz | 36 | % | 73 | % | 27 | C |
| 816) | 1/5/2010 | 1:55:48 | PM | 2 | V | 220 | V | 0 | Hz | 38 | % | 75 | % | 27 | C |
| 817) | 1/5/2010 | 1:55:50 | PM | 2 | V | 220 | V | 0 | Hz | 39 | % | 75 | % | 27 | C |
| 818) | 1/5/2010 | 1:55:52 | PM | 2 | V | 221 | V | 0 | Hz | 39 | % | 75 | % | 27 | C |
| 819) | 1/5/2010 | 1:55:54 | PM | 2 | V | 221 | V | 0 | Hz | 38 | % | 73 | % | 27 | C |
| 820) | 1/5/2010 | 1:55:56 | PM | 2 | V | 221 | V | 0 | Hz | 39 | % | 75 | % | 27 | C |
| 821) | 1/5/2010 | 1:55:58 | PM | 2 | V | 221 | V | 0 | Hz | 37 | % | 75 | % | 27 | C |
| 822) | 1/5/2010 | 1:56:00 | PM | 2 | V | 220 | V | 0 | Hz | 36 | % | 75 | % | 27 | C |
| 823) | 1/5/2010 | 1:56:02 | PM | 2 | V | 220 | V | 0 | Hz | 37 | % | 73 | % | 27 | C |
| 824) | 1/5/2010 | 1:56:04 | PM | 2 | V | 220 | V | 0 | Hz | 37 | % | 73 | % | 28 | C |
| 825) | 1/5/2010 | 1:56:06 | PM | 2 | V | 220 | V | 0 | Hz | 39 | % | 73 | % | 28 | C |
| 826) | 1/5/2010 | 1:56:08 | PM | 2 | V | 220 | V | 0 | Hz | 38 | % | 73 | % | 27 | C |
| 827) | 1/5/2010 | 1:56:11 | PM | 2 | V | 220 | V | 0 | Hz | 39 | % | 75 | % | 27 | C |
| 828) | 1/5/2010 | 1:56:13 | PM | 2 | V | 220 | V | 0 | Hz | 39 | % | 75 | % | 27 | C |
| 829) | 1/5/2010 | 1:56:15 | PM | 2 | V | 220 | V | 0 | Hz | 36 | % | 75 | % | 27 | C |
| 830) | 1/5/2010 | 1:56:17 | PM | 2 | V | 220 | V | 0 | Hz | 36 | % | 75 | % | 27 | C |
| 831) | 1/5/2010 | 1:56:19 | PM | 2 | V | 220 | V | 0 | Hz | 37 | % | 75 | % | 27 | C |
| 832) | 1/5/2010 | 1:56:21 | PM | 2 | V | 220 | V | 0 | Hz | 37 | % | 75 | % | 27 | C |

FIG. 6 - 116

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1) | 1/7/2010 | 1:01:48 | PM | 2 | V | 218 | V | 0 | Hz | 35 | % | 82 | % | 29 | C |
| 2) | 1/7/2010 | 1:01:50 | PM | 2 | V | 218 | V | 0 | Hz | 35 | % | 80 | % | 29 | C |
| 3) | 1/7/2010 | 1:01:52 | PM | 2 | V | 218 | V | 0 | Hz | 36 | % | 80 | % | 29 | C |
| 4) | 1/7/2010 | 1:01:55 | PM | 2 | V | 218 | V | 0 | Hz | 37 | % | 80 | % | 29 | C |
| 5) | 1/7/2010 | 1:01:57 | PM | 2 | V | 218 | V | 0 | Hz | 37 | % | 80 | % | 29 | C |
| 6) | 1/7/2010 | 1:01:59 | PM | 2 | V | 218 | V | 0 | Hz | 37 | % | 80 | % | 29 | C |
| 7) | 1/7/2010 | 1:02:01 | PM | 2 | V | 218 | V | 0 | Hz | 37 | % | 80 | % | 29 | C |
| 8) | 1/7/2010 | 1:02:03 | PM | 2 | V | 218 | V | 0 | Hz | 37 | % | 80 | % | 29 | C |
| 9) | 1/7/2010 | 1:02:05 | PM | 2 | V | 218 | V | 0 | Hz | 35 | % | 80 | % | 29 | C |
| 10) | 1/7/2010 | 1:02:07 | PM | 2 | V | 218 | V | 0 | Hz | 35 | % | 80 | % | 29 | C |
| 11) | 1/7/2010 | 1:02:09 | PM | 2 | V | 218 | V | 0 | Hz | 35 | % | 82 | % | 29 | C |
| 12) | 1/7/2010 | 1:02:11 | PM | 2 | V | 218 | V | 0 | Hz | 35 | % | 80 | % | 29 | C |
| 13) | 1/7/2010 | 1:02:13 | PM | 2 | V | 218 | V | 0 | Hz | 36 | % | 80 | % | 29 | C |
| 14) | 1/7/2010 | 1:02:15 | PM | 2 | V | 218 | V | 0 | Hz | 37 | % | 80 | % | 29 | C |
| 15) | 1/7/2010 | 1:02:17 | PM | 2 | V | 219 | V | 0 | Hz | 37 | % | 80 | % | 29 | C |
| 16) | 1/7/2010 | 1:02:19 | PM | 2 | V | 219 | V | 0 | Hz | 37 | % | 82 | % | 29 | C |
| 17) | 1/7/2010 | 1:02:21 | PM | 2 | V | 219 | V | 0 | Hz | 38 | % | 80 | % | 28 | C |
| 18) | 1/7/2010 | 1:02:23 | PM | 2 | V | 218 | V | 0 | Hz | 36 | % | 80 | % | 29 | C |
| 19) | 1/7/2010 | 1:02:26 | PM | 2 | V | 218 | V | 0 | Hz | 35 | % | 80 | % | 29 | C |
| 20) | 1/7/2010 | 1:02:28 | PM | 2 | V | 218 | V | 0 | Hz | 35 | % | 80 | % | 29 | C |
| 21) | 1/7/2010 | 1:02:30 | PM | 2 | V | 218 | V | 0 | Hz | 35 | % | 80 | % | 29 | C |
| 22) | 1/7/2010 | 1:02:32 | PM | 2 | V | 218 | V | 0 | Hz | 38 | % | 80 | % | 29 | C |
| 23) | 1/7/2010 | 1:02:34 | PM | 2 | V | 218 | V | 0 | Hz | 37 | % | 80 | % | 29 | C |
| 24) | 1/7/2010 | 1:02:36 | PM | 2 | V | 218 | V | 0 | Hz | 37 | % | 80 | % | 29 | C |
| 25) | 1/7/2010 | 1:02:38 | PM | 2 | V | 218 | V | 0 | Hz | 37 | % | 80 | % | 29 | C |
| 26) | 1/7/2010 | 1:02:40 | PM | 2 | V | 218 | V | 0 | Hz | 37 | % | 80 | % | 29 | C |
| 27) | 1/7/2010 | 1:02:42 | PM | 2 | V | 218 | V | 0 | Hz | 37 | % | 80 | % | 29 | C |
| 28) | 1/7/2010 | 1:02:44 | PM | 2 | V | 217 | V | 0 | Hz | 35 | % | 80 | % | 29 | C |
| 29) | 1/7/2010 | 1:02:46 | PM | 2 | V | 218 | V | 0 | Hz | 35 | % | 80 | % | 29 | C |

FIG. 7 - 1

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 30) | 1/7/2010 | 1:02:48 | PM | 2 | V | 218 | V | 0 | Hz | 35 | % | 80 | % | 29 | C |
| 31) | 1/7/2010 | 1:02:50 | PM | 2 | V | 218 | V | 0 | Hz | 35 | % | 82 | % | 29 | C |
| 32) | 1/7/2010 | 1:02:52 | PM | 2 | V | 218 | V | 0 | Hz | 35 | % | 80 | % | 29 | C |
| 33) | 1/7/2010 | 1:02:54 | PM | 2 | V | 218 | V | 0 | Hz | 37 | % | 80 | % | 29 | C |
| 34) | 1/7/2010 | 1:02:57 | PM | 2 | V | 219 | V | 0 | Hz | 37 | % | 80 | % | 29 | C |
| 35) | 1/7/2010 | 1:02:59 | PM | 2 | V | 219 | V | 0 | Hz | 37 | % | 80 | % | 28 | C |
| 36) | 1/7/2010 | 1:03:01 | PM | 2 | V | 218 | V | 0 | Hz | 37 | % | 80 | % | 28 | C |
| 38) | 1/7/2010 | 1:03:05 | PM | 2 | V | 218 | V | 0 | Hz | 35 | % | 80 | % | 28 | C |
| 39) | 1/7/2010 | 1:03:07 | PM | 2 | V | 218 | V | 0 | Hz | 35 | % | 80 | % | 29 | C |
| 40) | 1/7/2010 | 1:03:09 | PM | 2 | V | 218 | V | 0 | Hz | 35 | % | 80 | % | 29 | C |
| 41) | 1/7/2010 | 1:03:11 | PM | 2 | V | 218 | V | 0 | Hz | 36 | % | 80 | % | 29 | C |
| 42) | 1/7/2010 | 1:03:13 | PM | 2 | V | 218 | V | 0 | Hz | 37 | % | 80 | % | 29 | C |
| 43) | 1/7/2010 | 1:03:15 | PM | 2 | V | 218 | V | 0 | Hz | 37 | % | 80 | % | 29 | C |
| 44) | 1/7/2010 | 1:03:19 | PM | 2 | V | 218 | V | 0 | Hz | 37 | % | 80 | % | 29 | C |
| 45) | 1/7/2010 | 1:03:21 | PM | 2 | V | 218 | V | 0 | Hz | 37 | % | 80 | % | 29 | C |
| 46) | 1/7/2010 | 1:03:23 | PM | 2 | V | 218 | V | 0 | Hz | 35 | % | 80 | % | 29 | C |
| 47) | 1/7/2010 | 1:03:25 | PM | 2 | V | 218 | V | 0 | Hz | 35 | % | 80 | % | 29 | C |
| 48) | 1/7/2010 | 1:03:28 | PM | 2 | V | 218 | V | 0 | Hz | 35 | % | 80 | % | 29 | C |
| 49) | 1/7/2010 | 1:03:30 | PM | 2 | V | 218 | V | 0 | Hz | 35 | % | 80 | % | 29 | C |
| 50) | 1/7/2010 | 1:03:32 | PM | 2 | V | 218 | V | 0 | Hz | 38 | % | 80 | % | 29 | C |
| 51) | 1/7/2010 | 1:03:34 | PM | 2 | V | 218 | V | 0 | Hz | 37 | % | 80 | % | 29 | C |
| 52) | 1/7/2010 | 1:03:36 | PM | 2 | V | 219 | V | 0 | Hz | 37 | % | 80 | % | 29 | C |
| 53) | 1/7/2010 | 1:03:38 | PM | 2 | V | 219 | V | 0 | Hz | 37 | % | 80 | % | 29 | C |
| 54) | 1/7/2010 | 1:03:40 | PM | 2 | V | 219 | V | 0 | Hz | 36 | % | 80 | % | 29 | C |
| 55) | 1/7/2010 | 1:03:42 | PM | 2 | V | 219 | V | 0 | Hz | 35 | % | 80 | % | 29 | C |
| 56) | 1/7/2010 | 1:03:44 | PM | 2 | V | 219 | V | 0 | Hz | 35 | % | 80 | % | 28 | C |
| 57) | 1/7/2010 | 1:03:46 | PM | 2 | V | 218 | V | 0 | Hz | 35 | % | 80 | % | 29 | C |
| 58) | 1/7/2010 | 1:03:48 | PM | 2 | V | 218 | V | 0 | Hz | 35 | % | 80 | % | 29 | C |
| 59) | 1/7/2010 | 1:03:50 | PM | 2 | V | 218 | V | 0 | Hz | 37 | % | 80 | % | 29 | C |

FIG. 7 - 2

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 60) | 1/7/2010 | 1:03:52 | PM | 2 | V | 218 | V | 0 | Hz | 37 | % | 80 | % | 29 | C |
| 61) | 1/7/2010 | 1:03:54 | PM | 2 | V | 218 | V | 0 | Hz | 37 | % | 80 | % | 29 | C |
| 62) | 1/7/2010 | 1:03:56 | PM | 2 | V | 218 | V | 0 | Hz | 37 | % | 80 | % | 29 | C |
| 63) | 1/7/2010 | 1:03:59 | PM | 2 | V | 218 | V | 0 | Hz | 37 | % | 80 | % | 29 | C |
| 64) | 1/7/2010 | 1:04:01 | PM | 2 | V | 218 | V | 0 | Hz | 35 | % | 80 | % | 29 | C |
| 65) | 1/7/2010 | 1:04:03 | PM | 2 | V | 218 | V | 0 | Hz | 35 | % | 80 | % | 29 | C |
| 66) | 1/7/2010 | 1:04:05 | PM | 2 | V | 218 | V | 0 | Hz | 34 | % | 80 | % | 29 | C |
| 67) | 1/7/2010 | 1:04:07 | PM | 2 | V | 218 | V | 0 | Hz | 35 | % | 80 | % | 29 | C |
| 68) | 1/7/2010 | 1:04:09 | PM | 2 | V | 218 | V | 0 | Hz | 37 | % | 80 | % | 29 | C |
| 69) | 1/7/2010 | 1:04:11 | PM | 2 | V | 218 | V | 0 | Hz | 38 | % | 80 | % | 29 | C |
| 70) | 1/7/2010 | 1:04:13 | PM | 2 | V | 218 | V | 0 | Hz | 37 | % | 80 | % | 28 | C |
| 71) | 1/7/2010 | 1:04:15 | PM | 2 | V | 219 | V | 0 | Hz | 36 | % | 80 | % | 29 | C |
| 72) | 1/7/2010 | 1:04:17 | PM | 2 | V | 218 | V | 0 | Hz | 37 | % | 80 | % | 28 | C |
| 73) | 1/7/2010 | 1:04:19 | PM | 2 | V | 218 | V | 0 | Hz | 36 | % | 80 | % | 29 | C |
| 74) | 1/7/2010 | 1:04:21 | PM | 2 | V | 218 | V | 0 | Hz | 35 | % | 80 | % | 28 | C |
| 75) | 1/7/2010 | 1:04:23 | PM | 2 | V | 219 | V | 0 | Hz | 35 | % | 80 | % | 29 | C |
| 76) | 1/7/2010 | 1:04:25 | PM | 2 | V | 218 | V | 0 | Hz | 35 | % | 80 | % | 29 | C |
| 78) | 1/7/2010 | 1:04:30 | PM | 2 | V | 218 | V | 0 | Hz | 38 | % | 80 | % | 29 | C |
| 79) | 1/7/2010 | 1:04:32 | PM | 2 | V | 218 | V | 0 | Hz | 37 | % | 80 | % | 29 | C |
| 80) | 1/7/2010 | 1:04:34 | PM | 2 | V | 217 | V | 0 | Hz | 36 | % | 80 | % | 29 | C |
| 81) | 1/7/2010 | 1:04:36 | PM | 2 | V | 218 | V | 0 | Hz | 37 | % | 80 | % | 29 | C |
| 82) | 1/7/2010 | 1:04:38 | PM | 2 | V | 218 | V | 0 | Hz | 37 | % | 80 | % | 29 | C |
| 83) | 1/7/2010 | 1:04:40 | PM | 2 | V | 217 | V | 0 | Hz | 37 | % | 80 | % | 29 | C |
| 84) | 1/7/2010 | 1:04:42 | PM | 2 | V | 218 | V | 0 | Hz | 35 | % | 80 | % | 29 | C |
| 85) | 1/7/2010 | 1:04:44 | PM | 2 | V | 218 | V | 0 | Hz | 34 | % | 80 | % | 29 | C |
| 86) | 1/7/2010 | 1:04:46 | PM | 2 | V | 218 | V | 0 | Hz | 35 | % | 80 | % | 29 | C |
| 87) | 1/7/2010 | 1:04:48 | PM | 2 | V | 218 | V | 0 | Hz | 35 | % | 80 | % | 29 | C |
| 88) | 1/7/2010 | 1:04:50 | PM | 2 | V | 218 | V | 0 | Hz | 37 | % | 80 | % | 29 | C |
| 89) | 1/7/2010 | 1:04:52 | PM | 2 | V | 218 | V | 0 | Hz | 37 | % | 80 | % | 29 | C |

FIG. 7 - 3

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 90) | 1/7/2010 | 1:04:54 | PM | 2 | V | 219 | V | 0 | Hz | 37 | % | 80 | % | 28 | C |
| 91) | 1/7/2010 | 1:04:56 | PM | 2 | V | 219 | V | 0 | Hz | 37 | % | 80 | % | 28 | C |
| 92) | 1/7/2010 | 1:04:58 | PM | 2 | V | 219 | V | 0 | Hz | 37 | % | 80 | % | 28 | C |
| 93) | 1/7/2010 | 1:05:01 | PM | 2 | V | 218 | V | 0 | Hz | 35 | % | 80 | % | 28 | C |
| 94) | 1/7/2010 | 1:05:03 | PM | 2 | V | 218 | V | 0 | Hz | 35 | % | 80 | % | 29 | C |
| 95) | 1/7/2010 | 1:05:05 | PM | 2 | V | 218 | V | 0 | Hz | 35 | % | 78 | % | 29 | C |
| 96) | 1/7/2010 | 1:05:07 | PM | 2 | V | 218 | V | 0 | Hz | 35 | % | 78 | % | 29 | C |
| 97) | 1/7/2010 | 1:05:09 | PM | 2 | V | 218 | V | 0 | Hz | 38 | % | 80 | % | 29 | C |
| 98) | 1/7/2010 | 1:05:11 | PM | 2 | V | 218 | V | 0 | Hz | 37 | % | 80 | % | 29 | C |
| 99) | 1/7/2010 | 1:05:13 | PM | 2 | V | 217 | V | 0 | Hz | 36 | % | 80 | % | 29 | C |
| 100) | 1/7/2010 | 1:05:15 | PM | 2 | V | 218 | V | 0 | Hz | 37 | % | 80 | % | 29 | C |
| 101) | 1/7/2010 | 1:05:17 | PM | 2 | V | 218 | V | 0 | Hz | 37 | % | 80 | % | 29 | C |
| 102) | 1/7/2010 | 1:05:19 | PM | 2 | V | 217 | V | 0 | Hz | 35 | % | 80 | % | 29 | C |
| 103) | 1/7/2010 | 1:05:21 | PM | 2 | V | 217 | V | 0 | Hz | 35 | % | 80 | % | 29 | C |
| 104) | 1/7/2010 | 1:05:23 | PM | 2 | V | 218 | V | 0 | Hz | 35 | % | 80 | % | 29 | C |
| 105) | 1/7/2010 | 1:05:25 | PM | 2 | V | 218 | V | 0 | Hz | 35 | % | 80 | % | 29 | C |
| 106) | 1/7/2010 | 1:05:27 | PM | 2 | V | 218 | V | 0 | Hz | 34 | % | 80 | % | 29 | C |
| 107) | 1/7/2010 | 1:05:29 | PM | 2 | V | 218 | V | 0 | Hz | 37 | % | 80 | % | 29 | C |
| 108) | 1/7/2010 | 1:05:32 | PM | 2 | V | 218 | V | 0 | Hz | 37 | % | 80 | % | 29 | C |
| 109) | 1/7/2010 | 1:05:34 | PM | 2 | V | 219 | V | 0 | Hz | 37 | % | 80 | % | 28 | C |
| 110) | 1/7/2010 | 1:05:36 | PM | 2 | V | 219 | V | 0 | Hz | 37 | % | 80 | % | 29 | C |
| 111) | 1/7/2010 | 1:05:38 | PM | 2 | V | 218 | V | 0 | Hz | 36 | % | 80 | % | 28 | C |
| 112) | 1/7/2010 | 1:05:40 | PM | 2 | V | 219 | V | 0 | Hz | 35 | % | 80 | % | 28 | C |
| 113) | 1/7/2010 | 1:05:42 | PM | 2 | V | 218 | V | 0 | Hz | 35 | % | 80 | % | 29 | C |
| 114) | 1/7/2010 | 1:05:44 | PM | 2 | V | 218 | V | 0 | Hz | 35 | % | 78 | % | 29 | C |
| 115) | 1/7/2010 | 1:05:46 | PM | 2 | V | 218 | V | 0 | Hz | 35 | % | 78 | % | 29 | C |
| 116) | 1/7/2010 | 1:05:48 | PM | 2 | V | 218 | V | 0 | Hz | 37 | % | 80 | % | 29 | C |
| 118) | 1/7/2010 | 1:05:52 | PM | 2 | V | 218 | V | 0 | Hz | 36 | % | 78 | % | 29 | C |
| 119) | 1/7/2010 | 1:05:54 | PM | 2 | V | 218 | V | 0 | Hz | 37 | % | 80 | % | 29 | C |

FIG. 7 - 4

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 120) | 1/7/2010 | 1:05:56 | PM | 2 | V | 218 | V | 0 | Hz | 37 | % | 80 | % | 29 | C |
| 121) | 1/7/2010 | 1:05:58 | PM | 2 | V | 218 | V | 0 | Hz | 37 | % | 80 | % | 29 | C |
| 122) | 1/7/2010 | 1:06:00 | PM | 2 | V | 218 | V | 0 | Hz | 35 | % | 80 | % | 29 | C |
| 123) | 1/7/2010 | 1:06:03 | PM | 2 | V | 218 | V | 0 | Hz | 35 | % | 80 | % | 29 | C |
| 124) | 1/7/2010 | 1:06:05 | PM | 2 | V | 218 | V | 0 | Hz | 35 | % | 80 | % | 29 | C |
| 125) | 1/7/2010 | 1:06:07 | PM | 2 | V | 218 | V | 0 | Hz | 35 | % | 80 | % | 29 | C |
| 126) | 1/7/2010 | 1:06:09 | PM | 2 | V | 218 | V | 0 | Hz | 37 | % | 80 | % | 29 | C |
| 127) | 1/7/2010 | 1:06:11 | PM | 2 | V | 218 | V | 0 | Hz | 37 | % | 80 | % | 28 | C |
| 128) | 1/7/2010 | 1:06:13 | PM | 2 | V | 219 | V | 0 | Hz | 37 | % | 80 | % | 29 | C |
| 129) | 1/7/2010 | 1:06:15 | PM | 2 | V | 219 | V | 0 | Hz | 37 | % | 80 | % | 28 | C |
| 130) | 1/7/2010 | 1:06:17 | PM | 2 | V | 219 | V | 0 | Hz | 38 | % | 80 | % | 29 | C |
| 131) | 1/7/2010 | 1:06:19 | PM | 2 | V | 219 | V | 0 | Hz | 35 | % | 80 | % | 29 | C |
| 132) | 1/7/2010 | 1:06:21 | PM | 2 | V | 218 | V | 0 | Hz | 35 | % | 80 | % | 29 | C |
| 133) | 1/7/2010 | 1:06:23 | PM | 2 | V | 218 | V | 0 | Hz | 35 | % | 80 | % | 29 | C |
| 134) | 1/7/2010 | 1:06:25 | PM | 2 | V | 218 | V | 0 | Hz | 35 | % | 78 | % | 29 | C |
| 135) | 1/7/2010 | 1:06:27 | PM | 2 | V | 218 | V | 0 | Hz | 37 | % | 78 | % | 29 | C |
| 136) | 1/7/2010 | 1:06:29 | PM | 2 | V | 218 | V | 0 | Hz | 37 | % | 78 | % | 29 | C |
| 137) | 1/7/2010 | 1:06:31 | PM | 2 | V | 217 | V | 0 | Hz | 36 | % | 78 | % | 29 | C |
| 138) | 1/7/2010 | 1:06:34 | PM | 2 | V | 218 | V | 0 | Hz | 37 | % | 80 | % | 29 | C |
| 139) | 1/7/2010 | 1:06:37 | PM | 2 | V | 218 | V | 0 | Hz | 38 | % | 80 | % | 29 | C |
| 140) | 1/7/2010 | 1:06:39 | PM | 2 | V | 217 | V | 0 | Hz | 35 | % | 80 | % | 29 | C |
| 141) | 1/7/2010 | 1:06:41 | PM | 2 | V | 218 | V | 0 | Hz | 35 | % | 80 | % | 29 | C |
| 142) | 1/7/2010 | 1:06:43 | PM | 2 | V | 218 | V | 0 | Hz | 35 | % | 80 | % | 29 | C |
| 143) | 1/7/2010 | 1:06:45 | PM | 2 | V | 218 | V | 0 | Hz | 34 | % | 80 | % | 29 | C |
| 144) | 1/7/2010 | 1:06:47 | PM | 2 | V | 218 | V | 0 | Hz | 35 | % | 80 | % | 29 | C |
| 145) | 1/7/2010 | 1:06:49 | PM | 2 | V | 218 | V | 0 | Hz | 37 | % | 80 | % | 29 | C |
| 146) | 1/7/2010 | 1:06:51 | PM | 2 | V | 218 | V | 0 | Hz | 37 | % | 80 | % | 29 | C |
| 147) | 1/7/2010 | 1:06:53 | PM | 2 | V | 219 | V | 0 | Hz | 37 | % | 80 | % | 28 | C |
| 148) | 1/7/2010 | 1:06:55 | PM | 2 | V | 219 | V | 0 | Hz | 37 | % | 80 | % | 28 | C |

FIG. 7 - 5

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 149) | 1/7/2010 | 1:06:57 | PM | 2 | V | 218 | V | 0 | Hz | 36 | % | 80 | % | 28 | C |
| 150) | 1/7/2010 | 1:06:59 | PM | 2 | V | 218 | V | 0 | Hz | 35 | % | 80 | % | 29 | C |
| 151) | 1/7/2010 | 1:07:01 | PM | 2 | V | 218 | V | 0 | Hz | 35 | % | 80 | % | 29 | C |
| 152) | 1/7/2010 | 1:07:03 | PM | 2 | V | 218 | V | 0 | Hz | 35 | % | 78 | % | 29 | C |
| 153) | 1/7/2010 | 1:07:06 | PM | 2 | V | 218 | V | 0 | Hz | 37 | % | 80 | % | 29 | C |
| 154) | 1/7/2010 | 1:07:08 | PM | 2 | V | 218 | V | 0 | Hz | 37 | % | 78 | % | 29 | C |
| 155) | 1/7/2010 | 1:07:10 | PM | 2 | V | 218 | V | 0 | Hz | 37 | % | 80 | % | 29 | C |
| 156) | 1/7/2010 | 1:07:12 | PM | 2 | V | 218 | V | 0 | Hz | 37 | % | 80 | % | 29 | C |
| 158) | 1/7/2010 | 1:07:16 | PM | 2 | V | 218 | V | 0 | Hz | 37 | % | 80 | % | 29 | C |
| 159) | 1/7/2010 | 1:07:18 | PM | 2 | V | 218 | V | 0 | Hz | 35 | % | 80 | % | 29 | C |
| 160) | 1/7/2010 | 1:07:20 | PM | 2 | V | 217 | V | 0 | Hz | 35 | % | 80 | % | 29 | C |
| 161) | 1/7/2010 | 1:07:22 | PM | 2 | V | 218 | V | 0 | Hz | 35 | % | 80 | % | 29 | C |
| 162) | 1/7/2010 | 1:07:24 | PM | 2 | V | 218 | V | 0 | Hz | 35 | % | 80 | % | 29 | C |
| 163) | 1/7/2010 | 1:07:26 | PM | 2 | V | 218 | V | 0 | Hz | 35 | % | 80 | % | 29 | C |
| 164) | 1/7/2010 | 1:07:28 | PM | 2 | V | 218 | V | 0 | Hz | 37 | % | 80 | % | 29 | C |
| 165) | 1/7/2010 | 1:07:30 | PM | 2 | V | 218 | V | 0 | Hz | 37 | % | 80 | % | 28 | C |
| 166) | 1/7/2010 | 1:07:32 | PM | 2 | V | 219 | V | 0 | Hz | 37 | % | 80 | % | 28 | C |
| 167) | 1/7/2010 | 1:07:34 | PM | 2 | V | 218 | V | 0 | Hz | 37 | % | 80 | % | 28 | C |
| 168) | 1/7/2010 | 1:07:37 | PM | 2 | V | 218 | V | 0 | Hz | 35 | % | 80 | % | 28 | C |
| 169) | 1/7/2010 | 1:07:39 | PM | 2 | V | 218 | V | 0 | Hz | 36 | % | 80 | % | 28 | C |
| 170) | 1/7/2010 | 1:07:41 | PM | 2 | V | 218 | V | 0 | Hz | 35 | % | 80 | % | 29 | C |
| 171) | 1/7/2010 | 1:07:43 | PM | 2 | V | 218 | V | 0 | Hz | 35 | % | 78 | % | 29 | C |
| 172) | 1/7/2010 | 1:07:45 | PM | 2 | V | 218 | V | 0 | Hz | 37 | % | 78 | % | 29 | C |
| 173) | 1/7/2010 | 1:07:47 | PM | 2 | V | 218 | V | 0 | Hz | 37 | % | 78 | % | 29 | C |
| 174) | 1/7/2010 | 1:07:49 | PM | 2 | V | 218 | V | 0 | Hz | 37 | % | 78 | % | 29 | C |
| 175) | 1/7/2010 | 1:07:51 | PM | 2 | V | 218 | V | 0 | Hz | 37 | % | 78 | % | 29 | C |
| 176) | 1/7/2010 | 1:07:53 | PM | 2 | V | 218 | V | 0 | Hz | 37 | % | 80 | % | 28 | C |
| 177) | 1/7/2010 | 1:07:55 | PM | 2 | V | 218 | V | 0 | Hz | 37 | % | 80 | % | 29 | C |
| 178) | 1/7/2010 | 1:07:57 | PM | 2 | V | 217 | V | 0 | Hz | 35 | % | 80 | % | 29 | C |

FIG. 7 - 6

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 179) | 1/7/2010 | 1:07:59 | PM | 2 | V | 218 | V | 0 | Hz | 34 | % | 80 | % | 29 | C |
| 180) | 1/7/2010 | 1:08:01 | PM | 2 | V | 218 | V | 0 | Hz | 35 | % | 80 | % | 29 | C |
| 181) | 1/7/2010 | 1:08:03 | PM | 2 | V | 218 | V | 0 | Hz | 35 | % | 80 | % | 29 | C |
| 182) | 1/7/2010 | 1:08:05 | PM | 2 | V | 218 | V | 0 | Hz | 37 | % | 80 | % | 29 | C |
| 183) | 1/7/2010 | 1:08:08 | PM | 2 | V | 218 | V | 0 | Hz | 37 | % | 80 | % | 28 | C |
| 184) | 1/7/2010 | 1:08:10 | PM | 2 | V | 218 | V | 0 | Hz | 37 | % | 80 | % | 28 | C |
| 185) | 1/7/2010 | 1:08:12 | PM | 2 | V | 219 | V | 0 | Hz | 37 | % | 80 | % | 28 | C |
| 186) | 1/7/2010 | 1:08:14 | PM | 2 | V | 219 | V | 0 | Hz | 36 | % | 80 | % | 28 | C |
| 187) | 1/7/2010 | 1:08:16 | PM | 2 | V | 218 | V | 0 | Hz | 35 | % | 80 | % | 28 | C |
| 188) | 1/7/2010 | 1:08:18 | PM | 2 | V | 218 | V | 0 | Hz | 35 | % | 80 | % | 28 | C |
| 189) | 1/7/2010 | 1:08:20 | PM | 2 | V | 218 | V | 0 | Hz | 35 | % | 80 | % | 29 | C |
| 190) | 1/7/2010 | 1:08:22 | PM | 2 | V | 218 | V | 0 | Hz | 35 | % | 78 | % | 29 | C |
| 191) | 1/7/2010 | 1:08:24 | PM | 2 | V | 218 | V | 0 | Hz | 37 | % | 78 | % | 29 | C |
| 192) | 1/7/2010 | 1:08:26 | PM | 2 | V | 218 | V | 0 | Hz | 37 | % | 78 | % | 29 | C |
| 193) | 1/7/2010 | 1:08:28 | PM | 2 | V | 218 | V | 0 | Hz | 36 | % | 78 | % | 29 | C |
| 194) | 1/7/2010 | 1:08:30 | PM | 2 | V | 218 | V | 0 | Hz | 36 | % | 78 | % | 29 | C |
| 195) | 1/7/2010 | 1:08:32 | PM | 2 | V | 218 | V | 0 | Hz | 37 | % | 80 | % | 29 | C |
| 196) | 1/7/2010 | 1:08:34 | PM | 2 | V | 217 | V | 0 | Hz | 37 | % | 80 | % | 28 | C |
| 198) | 1/7/2010 | 1:08:39 | PM | 2 | V | 218 | V | 0 | Hz | 35 | % | 80 | % | 29 | C |
| 199) | 1/7/2010 | 1:08:41 | PM | 2 | V | 218 | V | 0 | Hz | 35 | % | 80 | % | 29 | C |
| 200) | 1/7/2010 | 1:08:43 | PM | 2 | V | 218 | V | 0 | Hz | 38 | % | 80 | % | 29 | C |
| 201) | 1/7/2010 | 1:08:45 | PM | 2 | V | 218 | V | 0 | Hz | 37 | % | 80 | % | 29 | C |
| 202) | 1/7/2010 | 1:08:47 | PM | 2 | V | 218 | V | 0 | Hz | 37 | % | 80 | % | 28 | C |
| 203) | 1/7/2010 | 1:08:49 | PM | 2 | V | 219 | V | 0 | Hz | 37 | % | 80 | % | 28 | C |
| 204) | 1/7/2010 | 1:08:51 | PM | 2 | V | 218 | V | 0 | Hz | 37 | % | 80 | % | 28 | C |
| 205) | 1/7/2010 | 1:08:53 | PM | 2 | V | 219 | V | 0 | Hz | 36 | % | 80 | % | 28 | C |
| 206) | 1/7/2010 | 1:08:55 | PM | 2 | V | 219 | V | 0 | Hz | 35 | % | 80 | % | 28 | C |
| 207) | 1/7/2010 | 1:08:57 | PM | 2 | V | 218 | V | 0 | Hz | 35 | % | 80 | % | 29 | C |
| 208) | 1/7/2010 | 1:08:59 | PM | 2 | V | 218 | V | 0 | Hz | 35 | % | 78 | % | 29 | C |

FIG. 7 - 7

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 209) | 1/7/2010 | 1:09:01 | PM | 2 | V | 218 | V | 0 | Hz | 37 | % | 78 | % | 29 | C |
| 210) | 1/7/2010 | 1:09:03 | PM | 2 | V | 218 | V | 0 | Hz | 37 | % | 78 | % | 29 | C |
| 211) | 1/7/2010 | 1:09:05 | PM | 2 | V | 218 | V | 0 | Hz | 37 | % | 78 | % | 29 | C |
| 212) | 1/7/2010 | 1:09:07 | PM | 2 | V | 218 | V | 0 | Hz | 36 | % | 78 | % | 29 | C |
| 213) | 1/7/2010 | 1:09:10 | PM | 2 | V | 217 | V | 0 | Hz | 37 | % | 80 | % | 29 | C |
| 214) | 1/7/2010 | 1:09:12 | PM | 2 | V | 218 | V | 0 | Hz | 36 | % | 80 | % | 29 | C |
| 215) | 1/7/2010 | 1:09:14 | PM | 2 | V | 218 | V | 0 | Hz | 35 | % | 80 | % | 29 | C |
| 216) | 1/7/2010 | 1:09:16 | PM | 2 | V | 218 | V | 0 | Hz | 34 | % | 80 | % | 29 | C |
| 217) | 1/7/2010 | 1:09:18 | PM | 2 | V | 218 | V | 0 | Hz | 35 | % | 80 | % | 29 | C |
| 218) | 1/7/2010 | 1:09:20 | PM | 2 | V | 218 | V | 0 | Hz | 35 | % | 80 | % | 29 | C |
| 219) | 1/7/2010 | 1:09:22 | PM | 2 | V | 218 | V | 0 | Hz | 35 | % | 80 | % | 29 | C |
| 220) | 1/7/2010 | 1:09:24 | PM | 3 | V | 218 | V | 0 | Hz | 37 | % | 80 | % | 29 | C |
| 221) | 1/7/2010 | 1:09:26 | PM | 2 | V | 219 | V | 0 | Hz | 37 | % | 80 | % | 28 | C |
| 222) | 1/7/2010 | 1:09:28 | PM | 2 | V | 219 | V | 0 | Hz | 37 | % | 80 | % | 28 | C |
| 223) | 1/7/2010 | 1:09:30 | PM | 2 | V | 218 | V | 0 | Hz | 37 | % | 80 | % | 28 | C |
| 224) | 1/7/2010 | 1:09:32 | PM | 2 | V | 219 | V | 0 | Hz | 36 | % | 80 | % | 28 | C |
| 225) | 1/7/2010 | 1:09:34 | PM | 2 | V | 219 | V | 0 | Hz | 35 | % | 80 | % | 28 | C |
| 226) | 1/7/2010 | 1:09:36 | PM | 2 | V | 218 | V | 0 | Hz | 35 | % | 80 | % | 29 | C |
| 227) | 1/7/2010 | 1:09:38 | PM | 2 | V | 218 | V | 0 | Hz | 35 | % | 78 | % | 29 | C |
| 228) | 1/7/2010 | 1:09:41 | PM | 2 | V | 218 | V | 0 | Hz | 37 | % | 78 | % | 29 | C |
| 229) | 1/7/2010 | 1:09:43 | PM | 2 | V | 218 | V | 0 | Hz | 37 | % | 78 | % | 29 | C |
| 230) | 1/7/2010 | 1:09:45 | PM | 2 | V | 218 | V | 0 | Hz | 37 | % | 78 | % | 29 | C |
| 231) | 1/7/2010 | 1:09:47 | PM | 2 | V | 217 | V | 0 | Hz | 37 | % | 80 | % | 29 | C |
| 232) | 1/7/2010 | 1:09:49 | PM | 2 | V | 218 | V | 0 | Hz | 36 | % | 80 | % | 29 | C |
| 233) | 1/7/2010 | 1:09:51 | PM | 2 | V | 218 | V | 0 | Hz | 35 | % | 80 | % | 29 | C |
| 234) | 1/7/2010 | 1:09:53 | PM | 2 | V | 218 | V | 0 | Hz | 35 | % | 80 | % | 29 | C |
| 235) | 1/7/2010 | 1:09:55 | PM | 2 | V | 218 | V | 0 | Hz | 35 | % | 80 | % | 29 | C |
| 236) | 1/7/2010 | 1:09:57 | PM | 2 | V | 218 | V | 0 | Hz | 35 | % | 80 | % | 29 | C |
| 238) | 1/7/2010 | 1:10:01 | PM | 2 | V | 218 | V | 0 | Hz | 37 | % | 80 | % | 29 | C |

FIG. 7 - 8

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 239) | 1/7/2010 | 1:10:03 | PM | 2 | V | 218 | V | 0 | Hz | 37 | % | 80 | % | 29 | C |
| 240) | 1/7/2010 | 1:10:05 | PM | 2 | V | 218 | V | 0 | Hz | 37 | % | 78 | % | 28 | C |
| 241) | 1/7/2010 | 1:10:07 | PM | 2 | V | 219 | V | 0 | Hz | 37 | % | 80 | % | 29 | C |
| 242) | 1/7/2010 | 1:10:09 | PM | 2 | V | 218 | V | 0 | Hz | 37 | % | 80 | % | 28 | C |
| 243) | 1/7/2010 | 1:10:12 | PM | 2 | V | 219 | V | 0 | Hz | 35 | % | 80 | % | 28 | C |
| 244) | 1/7/2010 | 1:10:14 | PM | 2 | V | 218 | V | 0 | Hz | 35 | % | 80 | % | 29 | C |
| 245) | 1/7/2010 | 1:10:16 | PM | 2 | V | 218 | V | 0 | Hz | 35 | % | 78 | % | 29 | C |
| 246) | 1/7/2010 | 1:10:18 | PM | 2 | V | 218 | V | 0 | Hz | 35 | % | 78 | % | 29 | C |
| 247) | 1/7/2010 | 1:10:20 | PM | 2 | V | 218 | V | 0 | Hz | 37 | % | 78 | % | 29 | C |
| 248) | 1/7/2010 | 1:10:22 | PM | 2 | V | 218 | V | 0 | Hz | 37 | % | 78 | % | 29 | C |
| 249) | 1/7/2010 | 1:10:24 | PM | 2 | V | 217 | V | 0 | Hz | 37 | % | 78 | % | 28 | C |
| 250) | 1/7/2010 | 1:10:26 | PM | 2 | V | 217 | V | 0 | Hz | 37 | % | 80 | % | 29 | C |
| 251) | 1/7/2010 | 1:10:28 | PM | 2 | V | 218 | V | 0 | Hz | 37 | % | 78 | % | 29 | C |
| 252) | 1/7/2010 | 1:10:30 | PM | 2 | V | 218 | V | 0 | Hz | 35 | % | 80 | % | 28 | C |
| 253) | 1/7/2010 | 1:10:32 | PM | 2 | V | 217 | V | 0 | Hz | 35 | % | 80 | % | 29 | C |
| 254) | 1/7/2010 | 1:10:34 | PM | 2 | V | 218 | V | 0 | Hz | 34 | % | 80 | % | 29 | C |
| 255) | 1/7/2010 | 1:10:36 | PM | 2 | V | 218 | V | 0 | Hz | 35 | % | 80 | % | 29 | C |
| 256) | 1/7/2010 | 1:10:38 | PM | 2 | V | 218 | V | 0 | Hz | 35 | % | 80 | % | 29 | C |
| 257) | 1/7/2010 | 1:10:40 | PM | 2 | V | 218 | V | 0 | Hz | 38 | % | 80 | % | 29 | C |
| 258) | 1/7/2010 | 1:10:43 | PM | 2 | V | 218 | V | 0 | Hz | 37 | % | 80 | % | 29 | C |
| 259) | 1/7/2010 | 1:10:45 | PM | 2 | V | 218 | V | 0 | Hz | 37 | % | 78 | % | 28 | C |
| 260) | 1/7/2010 | 1:10:47 | PM | 2 | V | 218 | V | 0 | Hz | 37 | % | 80 | % | 28 | C |
| 261) | 1/7/2010 | 1:10:49 | PM | 2 | V | 219 | V | 0 | Hz | 36 | % | 80 | % | 28 | C |
| 262) | 1/7/2010 | 1:10:51 | PM | 2 | V | 219 | V | 0 | Hz | 35 | % | 78 | % | 28 | C |
| 263) | 1/7/2010 | 1:10:53 | PM | 2 | V | 218 | V | 0 | Hz | 35 | % | 80 | % | 29 | C |
| 264) | 1/7/2010 | 1:10:55 | PM | 2 | V | 218 | V | 0 | Hz | 35 | % | 78 | % | 29 | C |
| 265) | 1/7/2010 | 1:10:57 | PM | 2 | V | 218 | V | 0 | Hz | 35 | % | 78 | % | 29 | C |
| 266) | 1/7/2010 | 1:10:59 | PM | 2 | V | 218 | V | 0 | Hz | 37 | % | 78 | % | 29 | C |
| 267) | 1/7/2010 | 1:11:01 | PM | 2 | V | 218 | V | 0 | Hz | 37 | % | 78 | % | 29 | C |

FIG. 7 - 9

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 268) | 1/7/2010 | 1:11:03 | PM | 2 | V | 218 | V | 0 | Hz | 37 | % | 78 | % | 29 | C |
| 269) | 1/7/2010 | 1:11:05 | PM | 2 | V | 218 | V | 0 | Hz | 37 | % | 78 | % | 29 | C |
| 270) | 1/7/2010 | 1:11:07 | PM | 2 | V | 218 | V | 0 | Hz | 37 | % | 80 | % | 29 | C |
| 271) | 1/7/2010 | 1:11:09 | PM | 2 | V | 218 | V | 0 | Hz | 35 | % | 80 | % | 29 | C |
| 272) | 1/7/2010 | 1:11:11 | PM | 2 | V | 218 | V | 0 | Hz | 35 | % | 80 | % | 29 | C |
| 273) | 1/7/2010 | 1:11:14 | PM | 2 | V | 218 | V | 0 | Hz | 34 | % | 80 | % | 29 | C |
| 274) | 1/7/2010 | 1:11:16 | PM | 2 | V | 218 | V | 0 | Hz | 35 | % | 80 | % | 29 | C |
| 275) | 1/7/2010 | 1:11:18 | PM | 2 | V | 218 | V | 0 | Hz | 37 | % | 78 | % | 29 | C |
| 276) | 1/7/2010 | 1:11:20 | PM | 2 | V | 218 | V | 0 | Hz | 37 | % | 80 | % | 29 | C |
| 278) | 1/7/2010 | 1:11:24 | PM | 2 | V | 218 | V | 0 | Hz | 36 | % | 80 | % | 28 | C |
| 279) | 1/7/2010 | 1:11:26 | PM | 2 | V | 219 | V | 0 | Hz | 37 | % | 80 | % | 28 | C |
| 280) | 1/7/2010 | 1:11:28 | PM | 2 | V | 218 | V | 0 | Hz | 36 | % | 80 | % | 28 | C |
| 281) | 1/7/2010 | 1:11:30 | PM | 2 | V | 218 | V | 0 | Hz | 35 | % | 78 | % | 28 | C |
| 282) | 1/7/2010 | 1:11:32 | PM | 2 | V | 218 | V | 0 | Hz | 35 | % | 80 | % | 29 | C |
| 283) | 1/7/2010 | 1:11:34 | PM | 2 | V | 218 | V | 0 | Hz | 35 | % | 78 | % | 29 | C |
| 284) | 1/7/2010 | 1:11:36 | PM | 2 | V | 218 | V | 0 | Hz | 35 | % | 78 | % | 29 | C |
| 285) | 1/7/2010 | 1:11:38 | PM | 2 | V | 218 | V | 0 | Hz | 37 | % | 78 | % | 29 | C |
| 286) | 1/7/2010 | 1:11:40 | PM | 2 | V | 218 | V | 0 | Hz | 37 | % | 78 | % | 29 | C |
| 287) | 1/7/2010 | 1:11:42 | PM | 2 | V | 218 | V | 0 | Hz | 37 | % | 78 | % | 29 | C |
| 288) | 1/7/2010 | 1:11:45 | PM | 2 | V | 218 | V | 0 | Hz | 37 | % | 78 | % | 29 | C |
| 289) | 1/7/2010 | 1:11:47 | PM | 2 | V | 217 | V | 0 | Hz | 34 | % | 80 | % | 29 | C |
| 290) | 1/7/2010 | 1:11:49 | PM | 2 | V | 217 | V | 0 | Hz | 35 | % | 80 | % | 29 | C |
| 291) | 1/7/2010 | 1:11:51 | PM | 2 | V | 218 | V | 0 | Hz | 35 | % | 80 | % | 29 | C |
| 292) | 1/7/2010 | 1:11:53 | PM | 2 | V | 218 | V | 0 | Hz | 34 | % | 80 | % | 29 | C |
| 293) | 1/7/2010 | 1:11:55 | PM | 2 | V | 218 | V | 0 | Hz | 35 | % | 80 | % | 29 | C |
| 294) | 1/7/2010 | 1:11:57 | PM | 2 | V | 218 | V | 0 | Hz | 37 | % | 80 | % | 29 | C |
| 295) | 1/7/2010 | 1:11:59 | PM | 2 | V | 218 | V | 0 | Hz | 38 | % | 78 | % | 29 | C |
| 296) | 1/7/2010 | 1:12:01 | PM | 2 | V | 218 | V | 0 | Hz | 37 | % | 80 | % | 28 | C |
| 297) | 1/7/2010 | 1:12:03 | PM | 2 | V | 218 | V | 0 | Hz | 36 | % | 80 | % | 28 | C |

FIG. 7 - 10

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 298) | 1/7/2010 | 1:12:05 | PM | 2 | V | 218 | V | 0 | Hz | 37 | % | 78 | % | 28 | C |
| 299) | 1/7/2010 | 1:12:07 | PM | 2 | V | 219 | V | 0 | Hz | 36 | % | 80 | % | 28 | C |
| 300) | 1/7/2010 | 1:12:09 | PM | 2 | V | 219 | V | 0 | Hz | 35 | % | 80 | % | 28 | C |
| 301) | 1/7/2010 | 1:12:11 | PM | 2 | V | 218 | V | 0 | Hz | 35 | % | 80 | % | 29 | C |
| 302) | 1/7/2010 | 1:12:13 | PM | 2 | V | 218 | V | 0 | Hz | 35 | % | 78 | % | 29 | C |
| 303) | 1/7/2010 | 1:12:16 | PM | 2 | V | 218 | V | 0 | Hz | 37 | % | 78 | % | 29 | C |
| 304) | 1/7/2010 | 1:12:18 | PM | 2 | V | 218 | V | 0 | Hz | 37 | % | 78 | % | 29 | C |
| 305) | 1/7/2010 | 1:12:20 | PM | 2 | V | 218 | V | 0 | Hz | 37 | % | 78 | % | 29 | C |
| 306) | 1/7/2010 | 1:12:22 | PM | 2 | V | 218 | V | 0 | Hz | 37 | % | 80 | % | 29 | C |
| 307) | 1/7/2010 | 1:12:24 | PM | 2 | V | 218 | V | 0 | Hz | 37 | % | 78 | % | 29 | C |
| 308) | 1/7/2010 | 1:12:26 | PM | 2 | V | 217 | V | 0 | Hz | 34 | % | 80 | % | 29 | C |
| 309) | 1/7/2010 | 1:12:28 | PM | 2 | V | 217 | V | 0 | Hz | 35 | % | 80 | % | 29 | C |
| 310) | 1/7/2010 | 1:12:30 | PM | 2 | V | 218 | V | 0 | Hz | 35 | % | 80 | % | 29 | C |
| 311) | 1/7/2010 | 1:12:32 | PM | 2 | V | 218 | V | 0 | Hz | 35 | % | 80 | % | 29 | C |
| 312) | 1/7/2010 | 1:12:34 | PM | 2 | V | 218 | V | 0 | Hz | 34 | % | 80 | % | 29 | C |
| 313) | 1/7/2010 | 1:12:36 | PM | 2 | V | 218 | V | 0 | Hz | 37 | % | 80 | % | 29 | C |
| 314) | 1/7/2010 | 1:12:38 | PM | 2 | V | 218 | V | 0 | Hz | 38 | % | 80 | % | 29 | C |
| 315) | 1/7/2010 | 1:12:40 | PM | 2 | V | 218 | V | 0 | Hz | 38 | % | 78 | % | 29 | C |
| 316) | 1/7/2010 | 1:12:42 | PM | 2 | V | 218 | V | 0 | Hz | 37 | % | 80 | % | 28 | C |
| 318) | 1/7/2010 | 1:12:47 | PM | 2 | V | 218 | V | 0 | Hz | 35 | % | 80 | % | 28 | C |
| 319) | 1/7/2010 | 1:12:49 | PM | 2 | V | 218 | V | 0 | Hz | 35 | % | 80 | % | 29 | C |
| 320) | 1/7/2010 | 1:12:51 | PM | 2 | V | 218 | V | 0 | Hz | 35 | % | 78 | % | 29 | C |
| 321) | 1/7/2010 | 1:12:53 | PM | 2 | V | 218 | V | 0 | Hz | 36 | % | 78 | % | 29 | C |
| 322) | 1/7/2010 | 1:12:55 | PM | 2 | V | 218 | V | 0 | Hz | 37 | % | 78 | % | 29 | C |
| 323) | 1/7/2010 | 1:12:57 | PM | 2 | V | 218 | V | 0 | Hz | 37 | % | 78 | % | 29 | C |
| 324) | 1/7/2010 | 1:12:59 | PM | 2 | V | 218 | V | 0 | Hz | 37 | % | 78 | % | 29 | C |
| 325) | 1/7/2010 | 1:13:01 | PM | 2 | V | 218 | V | 0 | Hz | 37 | % | 78 | % | 29 | C |
| 326) | 1/7/2010 | 1:13:03 | PM | 2 | V | 217 | V | 0 | Hz | 36 | % | 78 | % | 29 | C |
| 327) | 1/7/2010 | 1:13:05 | PM | 2 | V | 217 | V | 0 | Hz | 35 | % | 80 | % | 29 | C |

FIG. 7 - 11

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 328) | 1/7/2010 | 1:13:09 | PM | 2 | V | 218 | V | 0 | Hz | 35 | % | 80 | % | 29 | C |
| 329) | 1/7/2010 | 1:13:11 | PM | 2 | V | 218 | V | 0 | Hz | 35 | % | 78 | % | 29 | C |
| 330) | 1/7/2010 | 1:13:13 | PM | 2 | V | 218 | V | 0 | Hz | 36 | % | 80 | % | 29 | C |
| 331) | 1/7/2010 | 1:13:15 | PM | 2 | V | 218 | V | 0 | Hz | 37 | % | 78 | % | 29 | C |
| 332) | 1/7/2010 | 1:13:18 | PM | 2 | V | 218 | V | 0 | Hz | 38 | % | 78 | % | 28 | C |
| 333) | 1/7/2010 | 1:13:20 | PM | 2 | V | 219 | V | 0 | Hz | 37 | % | 78 | % | 28 | C |
| 334) | 1/7/2010 | 1:13:22 | PM | 2 | V | 218 | V | 0 | Hz | 35 | % | 78 | % | 29 | C |
| 335) | 1/7/2010 | 1:13:24 | PM | 2 | V | 219 | V | 0 | Hz | 35 | % | 78 | % | 29 | C |
| 336) | 1/7/2010 | 1:13:26 | PM | 2 | V | 219 | V | 0 | Hz | 35 | % | 78 | % | 28 | C |
| 337) | 1/7/2010 | 1:13:28 | PM | 2 | V | 218 | V | 0 | Hz | 35 | % | 78 | % | 29 | C |
| 338) | 1/7/2010 | 1:13:30 | PM | 2 | V | 218 | V | 0 | Hz | 35 | % | 78 | % | 29 | C |
| 339) | 1/7/2010 | 1:13:32 | PM | 2 | V | 218 | V | 0 | Hz | 35 | % | 78 | % | 29 | C |
| 340) | 1/7/2010 | 1:13:34 | PM | 2 | V | 218 | V | 0 | Hz | 37 | % | 78 | % | 29 | C |
| 341) | 1/7/2010 | 1:13:36 | PM | 2 | V | 218 | V | 0 | Hz | 36 | % | 78 | % | 29 | C |
| 342) | 1/7/2010 | 1:13:38 | PM | 2 | V | 218 | V | 0 | Hz | 37 | % | 78 | % | 29 | C |
| 343) | 1/7/2010 | 1:13:40 | PM | 2 | V | 217 | V | 0 | Hz | 37 | % | 78 | % | 29 | C |
| 344) | 1/7/2010 | 1:13:42 | PM | 2 | V | 218 | V | 0 | Hz | 37 | % | 78 | % | 29 | C |
| 345) | 1/7/2010 | 1:13:44 | PM | 2 | V | 218 | V | 0 | Hz | 35 | % | 78 | % | 29 | C |
| 346) | 1/7/2010 | 1:13:46 | PM | 2 | V | 218 | V | 0 | Hz | 35 | % | 78 | % | 29 | C |
| 347) | 1/7/2010 | 1:13:49 | PM | 2 | V | 218 | V | 0 | Hz | 35 | % | 78 | % | 29 | C |
| 348) | 1/7/2010 | 1:13:51 | PM | 2 | V | 218 | V | 0 | Hz | 35 | % | 78 | % | 29 | C |
| 349) | 1/7/2010 | 1:13:53 | PM | 2 | V | 218 | V | 0 | Hz | 34 | % | 78 | % | 29 | C |
| 350) | 1/7/2010 | 1:13:55 | PM | 2 | V | 217 | V | 0 | Hz | 37 | % | 78 | % | 29 | C |
| 351) | 1/7/2010 | 1:13:57 | PM | 2 | V | 219 | V | 0 | Hz | 38 | % | 80 | % | 29 | C |
| 352) | 1/7/2010 | 1:13:59 | PM | 2 | V | 218 | V | 0 | Hz | 37 | % | 78 | % | 28 | C |
| 353) | 1/7/2010 | 1:14:01 | PM | 2 | V | 219 | V | 0 | Hz | 37 | % | 78 | % | 29 | C |
| 354) | 1/7/2010 | 1:14:03 | PM | 2 | V | 218 | V | 0 | Hz | 35 | % | 78 | % | 28 | C |
| 355) | 1/7/2010 | 1:14:05 | PM | 2 | V | 218 | V | 0 | Hz | 35 | % | 78 | % | 28 | C |
| 356) | 1/7/2010 | 1:14:07 | PM | 2 | V | 218 | V | 0 | Hz | 36 | % | 78 | % | 29 | C |

FIG. 7 - 12

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 358) | 1/7/2010 | 1:14:11 | PM | 2 | V | 218 | V | 0 | Hz | 35 | % | 78 | % | 29 | C |
| 359) | 1/7/2010 | 1:14:13 | PM | 2 | V | 218 | V | 0 | Hz | 37 | % | 78 | % | 29 | C |
| 360) | 1/7/2010 | 1:14:15 | PM | 2 | V | 218 | V | 0 | Hz | 37 | % | 78 | % | 29 | C |
| 361) | 1/7/2010 | 1:14:17 | PM | 2 | V | 218 | V | 0 | Hz | 37 | % | 78 | % | 29 | C |
| 362) | 1/7/2010 | 1:14:20 | PM | 2 | V | 217 | V | 0 | Hz | 37 | % | 78 | % | 29 | C |
| 363) | 1/7/2010 | 1:14:22 | PM | 2 | V | 218 | V | 0 | Hz | 37 | % | 78 | % | 29 | C |
| 364) | 1/7/2010 | 1:14:24 | PM | 2 | V | 217 | V | 0 | Hz | 35 | % | 78 | % | 29 | C |
| 365) | 1/7/2010 | 1:14:26 | PM | 2 | V | 217 | V | 0 | Hz | 34 | % | 78 | % | 29 | C |
| 366) | 1/7/2010 | 1:14:28 | PM | 2 | V | 218 | V | 0 | Hz | 35 | % | 78 | % | 29 | C |
| 367) | 1/7/2010 | 1:14:30 | PM | 2 | V | 218 | V | 0 | Hz | 35 | % | 78 | % | 29 | C |
| 368) | 1/7/2010 | 1:14:32 | PM | 2 | V | 218 | V | 0 | Hz | 36 | % | 78 | % | 29 | C |
| 369) | 1/7/2010 | 1:14:34 | PM | 2 | V | 218 | V | 0 | Hz | 37 | % | 78 | % | 29 | C |
| 370) | 1/7/2010 | 1:14:36 | PM | 2 | V | 219 | V | 0 | Hz | 37 | % | 78 | % | 28 | C |
| 371) | 1/7/2010 | 1:14:38 | PM | 2 | V | 219 | V | 0 | Hz | 37 | % | 78 | % | 28 | C |
| 372) | 1/7/2010 | 1:14:40 | PM | 2 | V | 219 | V | 0 | Hz | 37 | % | 78 | % | 28 | C |
| 373) | 1/7/2010 | 1:14:42 | PM | 2 | V | 218 | V | 0 | Hz | 35 | % | 78 | % | 29 | C |
| 374) | 1/7/2010 | 1:14:44 | PM | 2 | V | 219 | V | 0 | Hz | 35 | % | 78 | % | 28 | C |
| 375) | 1/7/2010 | 1:14:46 | PM | 2 | V | 218 | V | 0 | Hz | 35 | % | 78 | % | 29 | C |
| 376) | 1/7/2010 | 1:14:48 | PM | 2 | V | 218 | V | 0 | Hz | 35 | % | 78 | % | 29 | C |
| 377) | 1/7/2010 | 1:14:51 | PM | 2 | V | 218 | V | 0 | Hz | 36 | % | 78 | % | 29 | C |
| 378) | 1/7/2010 | 1:14:53 | PM | 2 | V | 218 | V | 0 | Hz | 37 | % | 78 | % | 29 | C |
| 379) | 1/7/2010 | 1:14:55 | PM | 2 | V | 217 | V | 0 | Hz | 37 | % | 78 | % | 29 | C |
| 380) | 1/7/2010 | 1:14:57 | PM | 2 | V | 217 | V | 0 | Hz | 37 | % | 78 | % | 29 | C |
| 381) | 1/7/2010 | 1:14:59 | PM | 2 | V | 217 | V | 0 | Hz | 37 | % | 78 | % | 29 | C |
| 382) | 1/7/2010 | 1:15:01 | PM | 2 | V | 217 | V | 0 | Hz | 34 | % | 78 | % | 29 | C |
| 383) | 1/7/2010 | 1:15:03 | PM | 2 | V | 218 | V | 0 | Hz | 34 | % | 78 | % | 29 | C |
| 384) | 1/7/2010 | 1:15:05 | PM | 2 | V | 218 | V | 0 | Hz | 35 | % | 78 | % | 29 | C |
| 385) | 1/7/2010 | 1:15:07 | PM | 2 | V | 218 | V | 0 | Hz | 35 | % | 78 | % | 29 | C |
| 386) | 1/7/2010 | 1:15:09 | PM | 2 | V | 218 | V | 0 | Hz | 35 | % | 78 | % | 29 | C |

FIG. 7 - 13

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 387) | 1/7/2010 | 1:15:11 | PM | 2 | V | 218 | V | 0 | Hz | 36 | % | 78 | % | 29 | C |
| 388) | 1/7/2010 | 1:15:13 | PM | 2 | V | 218 | V | 0 | Hz | 37 | % | 78 | % | 29 | C |
| 389) | 1/7/2010 | 1:15:15 | PM | 2 | V | 219 | V | 0 | Hz | 37 | % | 78 | % | 28 | C |
| 390) | 1/7/2010 | 1:15:17 | PM | 2 | V | 218 | V | 0 | Hz | 37 | % | 78 | % | 29 | C |
| 391) | 1/7/2010 | 1:15:19 | PM | 2 | V | 219 | V | 0 | Hz | 37 | % | 78 | % | 28 | C |
| 392) | 1/7/2010 | 1:15:22 | PM | 2 | V | 219 | V | 0 | Hz | 36 | % | 78 | % | 28 | C |
| 393) | 1/7/2010 | 1:15:24 | PM | 2 | V | 218 | V | 0 | Hz | 36 | % | 78 | % | 29 | C |
| 394) | 1/7/2010 | 1:15:26 | PM | 2 | V | 218 | V | 0 | Hz | 36 | % | 78 | % | 29 | C |
| 395) | 1/7/2010 | 1:15:28 | PM | 2 | V | 218 | V | 0 | Hz | 36 | % | 78 | % | 29 | C |
| 396) | 1/7/2010 | 1:15:30 | PM | 2 | V | 218 | V | 0 | Hz | 37 | % | 78 | % | 29 | C |
| 398) | 1/7/2010 | 1:15:34 | PM | 2 | V | 218 | V | 0 | Hz | 38 | % | 78 | % | 29 | C |
| 399) | 1/7/2010 | 1:15:36 | PM | 2 | V | 218 | V | 0 | Hz | 38 | % | 78 | % | 29 | C |
| 400) | 1/7/2010 | 1:15:38 | PM | 2 | V | 218 | V | 0 | Hz | 38 | % | 78 | % | 29 | C |
| 401) | 1/7/2010 | 1:15:40 | PM | 2 | V | 218 | V | 0 | Hz | 37 | % | 78 | % | 29 | C |
| 402) | 1/7/2010 | 1:15:42 | PM | 2 | V | 218 | V | 0 | Hz | 35 | % | 78 | % | 29 | C |
| 403) | 1/7/2010 | 1:15:44 | PM | 2 | V | 218 | V | 0 | Hz | 36 | % | 78 | % | 29 | C |
| 404) | 1/7/2010 | 1:15:46 | PM | 2 | V | 218 | V | 0 | Hz | 36 | % | 78 | % | 29 | C |
| 405) | 1/7/2010 | 1:15:48 | PM | 2 | V | 218 | V | 0 | Hz | 36 | % | 78 | % | 29 | C |
| 406) | 1/7/2010 | 1:15:50 | PM | 2 | V | 218 | V | 0 | Hz | 37 | % | 78 | % | 29 | C |
| 407) | 1/7/2010 | 1:15:53 | PM | 2 | V | 218 | V | 0 | Hz | 38 | % | 78 | % | 29 | C |
| 408) | 1/7/2010 | 1:15:55 | PM | 2 | V | 219 | V | 0 | Hz | 38 | % | 78 | % | 28 | C |
| 409) | 1/7/2010 | 1:15:57 | PM | 2 | V | 219 | V | 0 | Hz | 38 | % | 78 | % | 28 | C |
| 410) | 1/7/2010 | 1:15:59 | PM | 2 | V | 219 | V | 0 | Hz | 38 | % | 78 | % | 29 | C |
| 411) | 1/7/2010 | 1:16:01 | PM | 2 | V | 219 | V | 0 | Hz | 36 | % | 78 | % | 28 | C |
| 412) | 1/7/2010 | 1:16:03 | PM | 2 | V | 219 | V | 0 | Hz | 36 | % | 78 | % | 28 | C |
| 413) | 1/7/2010 | 1:16:05 | PM | 2 | V | 218 | V | 0 | Hz | 36 | % | 78 | % | 29 | C |
| 414) | 1/7/2010 | 1:16:07 | PM | 2 | V | 218 | V | 0 | Hz | 36 | % | 78 | % | 29 | C |
| 415) | 1/7/2010 | 1:16:09 | PM | 2 | V | 218 | V | 0 | Hz | 35 | % | 78 | % | 29 | C |
| 416) | 1/7/2010 | 1:16:11 | PM | 2 | V | 218 | V | 0 | Hz | 38 | % | 78 | % | 29 | C |

FIG. 7 - 14

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 417) | 1/7/2010 | 1:16:13 | PM | 2 | V | 218 | V | 0 | Hz | 38 | % | 78 | % | 29 | C |
| 418) | 1/7/2010 | 1:16:15 | PM | 2 | V | 218 | V | 0 | Hz | 38 | % | 78 | % | 29 | C |
| 419) | 1/7/2010 | 1:16:17 | PM | 2 | V | 218 | V | 0 | Hz | 38 | % | 78 | % | 29 | C |
| 420) | 1/7/2010 | 1:16:19 | PM | 2 | V | 218 | V | 0 | Hz | 37 | % | 78 | % | 28 | C |
| 421) | 1/7/2010 | 1:16:21 | PM | 2 | V | 218 | V | 0 | Hz | 35 | % | 78 | % | 29 | C |
| 422) | 1/7/2010 | 1:16:24 | PM | 2 | V | 218 | V | 0 | Hz | 36 | % | 78 | % | 29 | C |
| 423) | 1/7/2010 | 1:16:26 | PM | 2 | V | 218 | V | 0 | Hz | 36 | % | 78 | % | 29 | C |
| 424) | 1/7/2010 | 1:16:28 | PM | 2 | V | 218 | V | 0 | Hz | 35 | % | 78 | % | 29 | C |
| 425) | 1/7/2010 | 1:16:30 | PM | 2 | V | 218 | V | 0 | Hz | 38 | % | 78 | % | 29 | C |
| 426) | 1/7/2010 | 1:16:32 | PM | 2 | V | 218 | V | 0 | Hz | 38 | % | 78 | % | 29 | C |
| 427) | 1/7/2010 | 1:16:34 | PM | 2 | V | 218 | V | 0 | Hz | 38 | % | 78 | % | 29 | C |
| 428) | 1/7/2010 | 1:16:36 | PM | 2 | V | 219 | V | 0 | Hz | 38 | % | 78 | % | 28 | C |
| 429) | 1/7/2010 | 1:16:38 | PM | 2 | V | 219 | V | 0 | Hz | 38 | % | 78 | % | 28 | C |
| 430) | 1/7/2010 | 1:16:40 | PM | 2 | V | 219 | V | 0 | Hz | 36 | % | 78 | % | 28 | C |
| 431) | 1/7/2010 | 1:16:42 | PM | 2 | V | 219 | V | 0 | Hz | 36 | % | 78 | % | 28 | C |
| 432) | 1/7/2010 | 1:16:44 | PM | 2 | V | 219 | V | 0 | Hz | 36 | % | 78 | % | 29 | C |
| 433) | 1/7/2010 | 1:16:46 | PM | 2 | V | 218 | V | 0 | Hz | 36 | % | 78 | % | 29 | C |
| 434) | 1/7/2010 | 1:16:48 | PM | 2 | V | 218 | V | 0 | Hz | 35 | % | 78 | % | 29 | C |
| 435) | 1/7/2010 | 1:16:50 | PM | 2 | V | 218 | V | 0 | Hz | 38 | % | 78 | % | 29 | C |
| 436) | 1/7/2010 | 1:16:52 | PM | 2 | V | 218 | V | 0 | Hz | 38 | % | 78 | % | 29 | C |
| 438) | 1/7/2010 | 1:16:57 | PM | 2 | V | 218 | V | 0 | Hz | 38 | % | 78 | % | 29 | C |
| 439) | 1/7/2010 | 1:16:59 | PM | 2 | V | 218 | V | 0 | Hz | 38 | % | 78 | % | 29 | C |
| 440) | 1/7/2010 | 1:17:01 | PM | 2 | V | 218 | V | 0 | Hz | 37 | % | 78 | % | 29 | C |
| 441) | 1/7/2010 | 1:17:03 | PM | 2 | V | 218 | V | 0 | Hz | 36 | % | 78 | % | 29 | C |
| 442) | 1/7/2010 | 1:17:05 | PM | 2 | V | 218 | V | 0 | Hz | 36 | % | 78 | % | 29 | C |
| 443) | 1/7/2010 | 1:17:07 | PM | 2 | V | 218 | V | 0 | Hz | 35 | % | 78 | % | 29 | C |
| 444) | 1/7/2010 | 1:17:09 | PM | 2 | V | 218 | V | 0 | Hz | 35 | % | 78 | % | 29 | C |
| 445) | 1/7/2010 | 1:17:11 | PM | 2 | V | 218 | V | 0 | Hz | 38 | % | 78 | % | 29 | C |
| 446) | 1/7/2010 | 1:17:13 | PM | 2 | V | 218 | V | 0 | Hz | 38 | % | 78 | % | 29 | C |

FIG. 7 - 15

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 447) | 1/7/2010 | 1:17:15 | PM | 2 | V | 219 | V | 0 | Hz | 38 | % | 78 | % | 28 | C |
| 448) | 1/7/2010 | 1:17:17 | PM | 2 | V | 219 | V | 0 | Hz | 37 | % | 78 | % | 28 | C |
| 449) | 1/7/2010 | 1:17:19 | PM | 2 | V | 219 | V | 0 | Hz | 38 | % | 78 | % | 28 | C |
| 450) | 1/7/2010 | 1:17:21 | PM | 2 | V | 219 | V | 0 | Hz | 36 | % | 78 | % | 29 | C |
| 451) | 1/7/2010 | 1:17:23 | PM | 2 | V | 219 | V | 0 | Hz | 36 | % | 78 | % | 28 | C |
| 452) | 1/7/2010 | 1:17:26 | PM | 2 | V | 218 | V | 0 | Hz | 36 | % | 78 | % | 29 | C |
| 453) | 1/7/2010 | 1:17:28 | PM | 2 | V | 218 | V | 0 | Hz | 36 | % | 78 | % | 29 | C |
| 454) | 1/7/2010 | 1:17:30 | PM | 2 | V | 218 | V | 0 | Hz | 37 | % | 78 | % | 29 | C |
| 455) | 1/7/2010 | 1:17:32 | PM | 2 | V | 218 | V | 0 | Hz | 38 | % | 78 | % | 29 | C |
| 456) | 1/7/2010 | 1:17:34 | PM | 2 | V | 218 | V | 0 | Hz | 38 | % | 78 | % | 29 | C |
| 457) | 1/7/2010 | 1:17:36 | PM | 2 | V | 218 | V | 0 | Hz | 37 | % | 78 | % | 29 | C |
| 458) | 1/7/2010 | 1:17:38 | PM | 2 | V | 218 | V | 0 | Hz | 38 | % | 78 | % | 29 | C |
| 459) | 1/7/2010 | 1:17:40 | PM | 2 | V | 218 | V | 0 | Hz | 38 | % | 78 | % | 29 | C |
| 460) | 1/7/2010 | 1:17:42 | PM | 2 | V | 218 | V | 0 | Hz | 36 | % | 78 | % | 29 | C |
| 461) | 1/7/2010 | 1:17:44 | PM | 2 | V | 218 | V | 0 | Hz | 36 | % | 78 | % | 29 | C |
| 462) | 1/7/2010 | 1:17:46 | PM | 2 | V | 219 | V | 0 | Hz | 35 | % | 78 | % | 29 | C |
| 463) | 1/7/2010 | 1:17:48 | PM | 2 | V | 218 | V | 0 | Hz | 35 | % | 78 | % | 29 | C |
| 464) | 1/7/2010 | 1:17:50 | PM | 2 | V | 218 | V | 0 | Hz | 36 | % | 78 | % | 29 | C |
| 465) | 1/7/2010 | 1:17:52 | PM | 2 | V | 218 | V | 0 | Hz | 38 | % | 78 | % | 29 | C |
| 466) | 1/7/2010 | 1:17:54 | PM | 2 | V | 218 | V | 0 | Hz | 38 | % | 78 | % | 29 | C |
| 467) | 1/7/2010 | 1:17:57 | PM | 2 | V | 219 | V | 0 | Hz | 38 | % | 78 | % | 28 | C |
| 468) | 1/7/2010 | 1:17:59 | PM | 2 | V | 219 | V | 0 | Hz | 38 | % | 78 | % | 28 | C |
| 469) | 1/7/2010 | 1:18:01 | PM | 2 | V | 219 | V | 0 | Hz | 36 | % | 78 | % | 29 | C |
| 470) | 1/7/2010 | 1:18:03 | PM | 2 | V | 219 | V | 0 | Hz | 36 | % | 78 | % | 28 | C |
| 471) | 1/7/2010 | 1:18:05 | PM | 2 | V | 219 | V | 0 | Hz | 36 | % | 78 | % | 29 | C |
| 472) | 1/7/2010 | 1:18:07 | PM | 2 | V | 218 | V | 0 | Hz | 36 | % | 77 | % | 29 | C |
| 473) | 1/7/2010 | 1:18:09 | PM | 2 | V | 218 | V | 0 | Hz | 36 | % | 78 | % | 29 | C |
| 474) | 1/7/2010 | 1:18:11 | PM | 2 | V | 219 | V | 0 | Hz | 38 | % | 78 | % | 29 | C |
| 475) | 1/7/2010 | 1:18:13 | PM | 2 | V | 218 | V | 0 | Hz | 38 | % | 78 | % | 29 | C |

FIG. 7 - 16

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 476) | 1/7/2010 | 1:18:15 | PM | 2 | V | 218 | V | 0 | Hz | 38 | % | 78 | % | 29 | C |
| 478) | 1/7/2010 | 1:18:19 | PM | 2 | V | 218 | V | 0 | Hz | 37 | % | 78 | % | 29 | C |
| 479) | 1/7/2010 | 1:18:21 | PM | 2 | V | 218 | V | 0 | Hz | 38 | % | 78 | % | 29 | C |
| 480) | 1/7/2010 | 1:18:23 | PM | 2 | V | 218 | V | 0 | Hz | 35 | % | 78 | % | 29 | C |
| 481) | 1/7/2010 | 1:18:25 | PM | 2 | V | 218 | V | 0 | Hz | 35 | % | 78 | % | 29 | C |
| 482) | 1/7/2010 | 1:18:27 | PM | 2 | V | 218 | V | 0 | Hz | 36 | % | 78 | % | 29 | C |
| 483) | 1/7/2010 | 1:18:29 | PM | 2 | V | 218 | V | 0 | Hz | 35 | % | 78 | % | 29 | C |
| 484) | 1/7/2010 | 1:18:31 | PM | 2 | V | 218 | V | 0 | Hz | 36 | % | 78 | % | 29 | C |
| 485) | 1/7/2010 | 1:18:33 | PM | 2 | V | 218 | V | 0 | Hz | 38 | % | 78 | % | 29 | C |
| 486) | 1/7/2010 | 1:18:35 | PM | 2 | V | 218 | V | 0 | Hz | 38 | % | 78 | % | 29 | C |
| 487) | 1/7/2010 | 1:18:37 | PM | 2 | V | 219 | V | 0 | Hz | 38 | % | 78 | % | 28 | C |
| 488) | 1/7/2010 | 1:18:39 | PM | 2 | V | 219 | V | 0 | Hz | 38 | % | 78 | % | 28 | C |
| 489) | 1/7/2010 | 1:18:41 | PM | 2 | V | 219 | V | 0 | Hz | 36 | % | 78 | % | 28 | C |
| 490) | 1/7/2010 | 1:18:43 | PM | 2 | V | 219 | V | 0 | Hz | 36 | % | 78 | % | 28 | C |
| 491) | 1/7/2010 | 1:18:45 | PM | 2 | V | 219 | V | 0 | Hz | 36 | % | 78 | % | 28 | C |
| 492) | 1/7/2010 | 1:18:47 | PM | 2 | V | 218 | V | 0 | Hz | 36 | % | 78 | % | 29 | C |
| 493) | 1/7/2010 | 1:18:49 | PM | 2 | V | 218 | V | 0 | Hz | 36 | % | 78 | % | 29 | C |
| 494) | 1/7/2010 | 1:18:51 | PM | 2 | V | 218 | V | 0 | Hz | 38 | % | 78 | % | 29 | C |
| 495) | 1/7/2010 | 1:18:53 | PM | 2 | V | 218 | V | 0 | Hz | 38 | % | 78 | % | 29 | C |
| 496) | 1/7/2010 | 1:18:55 | PM | 2 | V | 218 | V | 0 | Hz | 37 | % | 78 | % | 29 | C |
| 497) | 1/7/2010 | 1:18:57 | PM | 2 | V | 218 | V | 0 | Hz | 38 | % | 78 | % | 29 | C |
| 498) | 1/7/2010 | 1:19:00 | PM | 2 | V | 219 | V | 0 | Hz | 38 | % | 78 | % | 29 | C |
| 499) | 1/7/2010 | 1:19:02 | PM | 2 | V | 218 | V | 0 | Hz | 36 | % | 78 | % | 29 | C |
| 500) | 1/7/2010 | 1:19:04 | PM | 2 | V | 218 | V | 0 | Hz | 35 | % | 78 | % | 29 | C |
| 501) | 1/7/2010 | 1:19:06 | PM | 2 | V | 218 | V | 0 | Hz | 35 | % | 78 | % | 29 | C |
| 502) | 1/7/2010 | 1:19:08 | PM | 2 | V | 218 | V | 0 | Hz | 35 | % | 78 | % | 29 | C |
| 503) | 1/7/2010 | 1:19:10 | PM | 2 | V | 218 | V | 0 | Hz | 36 | % | 78 | % | 29 | C |
| 504) | 1/7/2010 | 1:19:12 | PM | 2 | V | 218 | V | 0 | Hz | 38 | % | 78 | % | 29 | C |
| 505) | 1/7/2010 | 1:19:14 | PM | 2 | V | 218 | V | 0 | Hz | 37 | % | 78 | % | 29 | C |

FIG. 7 - 17

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 506) | 1/7/2010 | 1:19:16 | PM | 2 | V | 219 | V | 0 | Hz | 38 | % | 78 | % | 28 | C |
| 507) | 1/7/2010 | 1:19:18 | PM | 2 | V | 219 | V | 0 | Hz | 38 | % | 78 | % | 28 | C |
| 508) | 1/7/2010 | 1:19:20 | PM | 2 | V | 219 | V | 0 | Hz | 38 | % | 78 | % | 28 | C |
| 509) | 1/7/2010 | 1:19:22 | PM | 2 | V | 219 | V | 0 | Hz | 36 | % | 78 | % | 28 | C |
| 510) | 1/7/2010 | 1:19:24 | PM | 2 | V | 219 | V | 0 | Hz | 35 | % | 78 | % | 28 | C |
| 511) | 1/7/2010 | 1:19:26 | PM | 2 | V | 219 | V | 0 | Hz | 36 | % | 78 | % | 29 | C |
| 512) | 1/7/2010 | 1:19:28 | PM | 2 | V | 218 | V | 0 | Hz | 36 | % | 78 | % | 29 | C |
| 513) | 1/7/2010 | 1:19:31 | PM | 2 | V | 219 | V | 0 | Hz | 38 | % | 78 | % | 29 | C |
| 514) | 1/7/2010 | 1:19:33 | PM | 2 | V | 218 | V | 0 | Hz | 37 | % | 78 | % | 29 | C |
| 515) | 1/7/2010 | 1:19:35 | PM | 2 | V | 218 | V | 0 | Hz | 37 | % | 78 | % | 29 | C |
| 516) | 1/7/2010 | 1:19:37 | PM | 2 | V | 218 | V | 0 | Hz | 38 | % | 78 | % | 29 | C |
| 518) | 1/7/2010 | 1:19:41 | PM | 2 | V | 218 | V | 0 | Hz | 38 | % | 78 | % | 29 | C |
| 519) | 1/7/2010 | 1:19:43 | PM | 2 | V | 218 | V | 0 | Hz | 35 | % | 78 | % | 29 | C |
| 520) | 1/7/2010 | 1:19:45 | PM | 2 | V | 218 | V | 0 | Hz | 35 | % | 78 | % | 29 | C |
| 521) | 1/7/2010 | 1:19:47 | PM | 2 | V | 218 | V | 0 | Hz | 35 | % | 78 | % | 29 | C |
| 522) | 1/7/2010 | 1:19:49 | PM | 2 | V | 218 | V | 0 | Hz | 36 | % | 78 | % | 29 | C |
| 523) | 1/7/2010 | 1:19:51 | PM | 2 | V | 218 | V | 0 | Hz | 38 | % | 78 | % | 29 | C |
| 524) | 1/7/2010 | 1:19:53 | PM | 2 | V | 218 | V | 0 | Hz | 38 | % | 78 | % | 29 | C |
| 525) | 1/7/2010 | 1:19:55 | PM | 2 | V | 218 | V | 0 | Hz | 38 | % | 78 | % | 28 | C |
| 526) | 1/7/2010 | 1:19:57 | PM | 2 | V | 219 | V | 0 | Hz | 38 | % | 78 | % | 28 | C |
| 527) | 1/7/2010 | 1:19:59 | PM | 2 | V | 219 | V | 0 | Hz | 38 | % | 78 | % | 28 | C |
| 528) | 1/7/2010 | 1:20:02 | PM | 2 | V | 219 | V | 0 | Hz | 36 | % | 78 | % | 28 | C |
| 529) | 1/7/2010 | 1:20:04 | PM | 2 | V | 219 | V | 0 | Hz | 35 | % | 78 | % | 28 | C |
| 530) | 1/7/2010 | 1:20:06 | PM | 2 | V | 218 | V | 0 | Hz | 36 | % | 78 | % | 29 | C |
| 531) | 1/7/2010 | 1:20:08 | PM | 2 | V | 218 | V | 0 | Hz | 36 | % | 78 | % | 29 | C |
| 532) | 1/7/2010 | 1:20:10 | PM | 2 | V | 218 | V | 0 | Hz | 36 | % | 78 | % | 29 | C |
| 533) | 1/7/2010 | 1:20:12 | PM | 2 | V | 218 | V | 0 | Hz | 38 | % | 78 | % | 29 | C |
| 534) | 1/7/2010 | 1:20:14 | PM | 2 | V | 219 | V | 0 | Hz | 37 | % | 78 | % | 29 | C |
| 535) | 1/7/2010 | 1:20:16 | PM | 2 | V | 218 | V | 0 | Hz | 37 | % | 78 | % | 29 | C |

FIG. 7 - 18

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 536) | 1/7/2010 | 1:20:18 | PM | 2 | V | 218 | V | 0 | Hz | 38 | % | 78 | % | 29 | C |
| 537) | 1/7/2010 | 1:20:20 | PM | 2 | V | 218 | V | 0 | Hz | 38 | % | 78 | % | 29 | C |
| 538) | 1/7/2010 | 1:20:22 | PM | 2 | V | 218 | V | 0 | Hz | 35 | % | 78 | % | 29 | C |
| 539) | 1/7/2010 | 1:20:24 | PM | 2 | V | 218 | V | 0 | Hz | 36 | % | 78 | % | 29 | C |
| 540) | 1/7/2010 | 1:20:26 | PM | 2 | V | 218 | V | 0 | Hz | 35 | % | 78 | % | 29 | C |
| 541) | 1/7/2010 | 1:20:28 | PM | 2 | V | 218 | V | 0 | Hz | 36 | % | 78 | % | 29 | C |
| 542) | 1/7/2010 | 1:20:30 | PM | 2 | V | 218 | V | 0 | Hz | 36 | % | 78 | % | 29 | C |
| 543) | 1/7/2010 | 1:20:33 | PM | 2 | V | 218 | V | 0 | Hz | 37 | % | 78 | % | 29 | C |
| 544) | 1/7/2010 | 1:20:35 | PM | 2 | V | 218 | V | 0 | Hz | 37 | % | 78 | % | 29 | C |
| 545) | 1/7/2010 | 1:20:37 | PM | 2 | V | 219 | V | 0 | Hz | 38 | % | 78 | % | 28 | C |
| 546) | 1/7/2010 | 1:20:39 | PM | 2 | V | 219 | V | 0 | Hz | 38 | % | 78 | % | 28 | C |
| 547) | 1/7/2010 | 1:20:41 | PM | 2 | V | 219 | V | 0 | Hz | 36 | % | 78 | % | 28 | C |
| 548) | 1/7/2010 | 1:20:43 | PM | 2 | V | 219 | V | 0 | Hz | 36 | % | 78 | % | 28 | C |
| 549) | 1/7/2010 | 1:20:45 | PM | 2 | V | 218 | V | 0 | Hz | 36 | % | 78 | % | 28 | C |
| 550) | 1/7/2010 | 1:20:47 | PM | 2 | V | 218 | V | 0 | Hz | 36 | % | 78 | % | 29 | C |
| 551) | 1/7/2010 | 1:20:49 | PM | 2 | V | 218 | V | 0 | Hz | 36 | % | 78 | % | 29 | C |
| 552) | 1/7/2010 | 1:20:51 | PM | 2 | V | 218 | V | 0 | Hz | 36 | % | 78 | % | 29 | C |
| 553) | 1/7/2010 | 1:20:53 | PM | 2 | V | 218 | V | 0 | Hz | 38 | % | 78 | % | 29 | C |
| 554) | 1/7/2010 | 1:20:55 | PM | 2 | V | 218 | V | 0 | Hz | 37 | % | 78 | % | 29 | C |
| 555) | 1/7/2010 | 1:20:57 | PM | 2 | V | 218 | V | 0 | Hz | 38 | % | 78 | % | 29 | C |
| 556) | 1/7/2010 | 1:20:59 | PM | 2 | V | 218 | V | 0 | Hz | 38 | % | 78 | % | 29 | C |
| 558) | 1/7/2010 | 1:21:04 | PM | 2 | V | 218 | V | 0 | Hz | 35 | % | 78 | % | 29 | C |
| 559) | 1/7/2010 | 1:21:06 | PM | 2 | V | 218 | V | 0 | Hz | 36 | % | 78 | % | 29 | C |
| 560) | 1/7/2010 | 1:21:08 | PM | 2 | V | 218 | V | 0 | Hz | 36 | % | 78 | % | 29 | C |
| 561) | 1/7/2010 | 1:21:10 | PM | 2 | V | 218 | V | 0 | Hz | 36 | % | 78 | % | 29 | C |
| 562) | 1/7/2010 | 1:21:12 | PM | 2 | V | 218 | V | 0 | Hz | 37 | % | 78 | % | 29 | C |
| 563) | 1/7/2010 | 1:21:14 | PM | 2 | V | 218 | V | 0 | Hz | 38 | % | 78 | % | 29 | C |
| 564) | 1/7/2010 | 1:21:16 | PM | 2 | V | 219 | V | 0 | Hz | 38 | % | 78 | % | 29 | C |
| 565) | 1/7/2010 | 1:21:18 | PM | 2 | V | 219 | V | 0 | Hz | 38 | % | 78 | % | 28 | C |

FIG. 7 - 19

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 566) | 1/7/2010 | 1:21:20 | PM | 2 | V | 218 | V | 0 | Hz | 38 | % | 78 | % | 28 | C |
| 567) | 1/7/2010 | 1:21:22 | PM | 2 | V | 219 | V | 0 | Hz | 35 | % | 78 | % | 28 | C |
| 568) | 1/7/2010 | 1:21:24 | PM | 2 | V | 219 | V | 0 | Hz | 36 | % | 78 | % | 28 | C |
| 569) | 1/7/2010 | 1:21:26 | PM | 2 | V | 218 | V | 0 | Hz | 36 | % | 78 | % | 29 | C |
| 570) | 1/7/2010 | 1:21:28 | PM | 2 | V | 218 | V | 0 | Hz | 36 | % | 78 | % | 29 | C |
| 571) | 1/7/2010 | 1:21:30 | PM | 2 | V | 218 | V | 0 | Hz | 36 | % | 78 | % | 29 | C |
| 572) | 1/7/2010 | 1:21:32 | PM | 2 | V | 219 | V | 0 | Hz | 37 | % | 78 | % | 29 | C |
| 573) | 1/7/2010 | 1:21:35 | PM | 2 | V | 218 | V | 0 | Hz | 38 | % | 78 | % | 29 | C |
| 574) | 1/7/2010 | 1:21:37 | PM | 2 | V | 218 | V | 0 | Hz | 38 | % | 78 | % | 29 | C |
| 575) | 1/7/2010 | 1:21:39 | PM | 2 | V | 218 | V | 0 | Hz | 38 | % | 78 | % | 29 | C |
| 576) | 1/7/2010 | 1:21:41 | PM | 2 | V | 218 | V | 0 | Hz | 37 | % | 78 | % | 29 | C |
| 577) | 1/7/2010 | 1:21:43 | PM | 2 | V | 218 | V | 0 | Hz | 35 | % | 78 | % | 28 | C |
| 578) | 1/7/2010 | 1:21:45 | PM | 2 | V | 218 | V | 0 | Hz | 36 | % | 78 | % | 29 | C |
| 579) | 1/7/2010 | 1:21:47 | PM | 2 | V | 218 | V | 0 | Hz | 36 | % | 78 | % | 29 | C |
| 580) | 1/7/2010 | 1:21:49 | PM | 2 | V | 218 | V | 0 | Hz | 35 | % | 78 | % | 29 | C |
| 581) | 1/7/2010 | 1:21:51 | PM | 2 | V | 218 | V | 0 | Hz | 35 | % | 78 | % | 29 | C |
| 582) | 1/7/2010 | 1:21:53 | PM | 2 | V | 218 | V | 0 | Hz | 38 | % | 78 | % | 29 | C |
| 583) | 1/7/2010 | 1:21:55 | PM | 2 | V | 218 | V | 0 | Hz | 38 | % | 78 | % | 29 | C |
| 584) | 1/7/2010 | 1:21:57 | PM | 2 | V | 219 | V | 0 | Hz | 38 | % | 78 | % | 28 | C |
| 585) | 1/7/2010 | 1:21:59 | PM | 2 | V | 219 | V | 0 | Hz | 38 | % | 78 | % | 28 | C |
| 586) | 1/7/2010 | 1:22:01 | PM | 2 | V | 219 | V | 0 | Hz | 37 | % | 78 | % | 28 | C |
| 587) | 1/7/2010 | 1:22:03 | PM | 2 | V | 219 | V | 0 | Hz | 35 | % | 78 | % | 28 | C |
| 588) | 1/7/2010 | 1:22:06 | PM | 2 | V | 219 | V | 0 | Hz | 36 | % | 78 | % | 29 | C |
| 589) | 1/7/2010 | 1:22:08 | PM | 2 | V | 218 | V | 0 | Hz | 36 | % | 78 | % | 29 | C |
| 590) | 1/7/2010 | 1:22:10 | PM | 2 | V | 218 | V | 0 | Hz | 35 | % | 78 | % | 29 | C |
| 591) | 1/7/2010 | 1:22:12 | PM | 2 | V | 218 | V | 0 | Hz | 37 | % | 78 | % | 29 | C |
| 592) | 1/7/2010 | 1:22:14 | PM | 2 | V | 218 | V | 0 | Hz | 38 | % | 78 | % | 29 | C |
| 593) | 1/7/2010 | 1:22:16 | PM | 2 | V | 218 | V | 0 | Hz | 38 | % | 78 | % | 28 | C |
| 594) | 1/7/2010 | 1:22:18 | PM | 2 | V | 218 | V | 0 | Hz | 38 | % | 78 | % | 28 | C |

FIG. 7 - 20

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 595) | 1/7/2010 | 1:22:20 | PM | 2 | V | 218 | V | 0 | Hz | 37 | % | 78 | % | 28 | C |
| 596) | 1/7/2010 | 1:22:22 | PM | 2 | V | 218 | V | 0 | Hz | 35 | % | 78 | % | 29 | C |
| 598) | 1/7/2010 | 1:22:26 | PM | 2 | V | 218 | V | 0 | Hz | 36 | % | 78 | % | 29 | C |
| 599) | 1/7/2010 | 1:22:28 | PM | 2 | V | 218 | V | 0 | Hz | 36 | % | 78 | % | 29 | C |
| 600) | 1/7/2010 | 1:22:30 | PM | 2 | V | 218 | V | 0 | Hz | 35 | % | 78 | % | 29 | C |
| 601) | 1/7/2010 | 1:22:32 | PM | 2 | V | 218 | V | 0 | Hz | 38 | % | 78 | % | 29 | C |
| 602) | 1/7/2010 | 1:22:34 | PM | 2 | V | 218 | V | 0 | Hz | 38 | % | 78 | % | 29 | C |
| 603) | 1/7/2010 | 1:22:37 | PM | 2 | V | 219 | V | 0 | Hz | 38 | % | 78 | % | 28 | C |
| 604) | 1/7/2010 | 1:22:39 | PM | 2 | V | 219 | V | 0 | Hz | 38 | % | 78 | % | 28 | C |
| 605) | 1/7/2010 | 1:22:41 | PM | 2 | V | 219 | V | 0 | Hz | 38 | % | 78 | % | 28 | C |
| 606) | 1/7/2010 | 1:22:43 | PM | 2 | V | 219 | V | 0 | Hz | 36 | % | 78 | % | 28 | C |
| 607) | 1/7/2010 | 1:22:45 | PM | 2 | V | 219 | V | 0 | Hz | 36 | % | 78 | % | 28 | C |
| 608) | 1/7/2010 | 1:22:47 | PM | 2 | V | 218 | V | 0 | Hz | 36 | % | 78 | % | 29 | C |
| 609) | 1/7/2010 | 1:22:49 | PM | 2 | V | 218 | V | 0 | Hz | 35 | % | 77 | % | 29 | C |
| 610) | 1/7/2010 | 1:22:51 | PM | 2 | V | 218 | V | 0 | Hz | 36 | % | 78 | % | 29 | C |
| 611) | 1/7/2010 | 1:22:53 | PM | 2 | V | 218 | V | 0 | Hz | 38 | % | 78 | % | 29 | C |
| 612) | 1/7/2010 | 1:22:57 | PM | 2 | V | 218 | V | 0 | Hz | 38 | % | 78 | % | 29 | C |
| 613) | 1/7/2010 | 1:22:59 | PM | 2 | V | 218 | V | 0 | Hz | 37 | % | 78 | % | 28 | C |
| 614) | 1/7/2010 | 1:23:01 | PM | 2 | V | 218 | V | 0 | Hz | 38 | % | 78 | % | 29 | C |
| 615) | 1/7/2010 | 1:23:03 | PM | 2 | V | 218 | V | 0 | Hz | 37 | % | 78 | % | 29 | C |
| 616) | 1/7/2010 | 1:23:05 | PM | 2 | V | 218 | V | 0 | Hz | 36 | % | 78 | % | 29 | C |
| 617) | 1/7/2010 | 1:23:08 | PM | 2 | V | 218 | V | 0 | Hz | 35 | % | 78 | % | 29 | C |
| 618) | 1/7/2010 | 1:23:10 | PM | 2 | V | 218 | V | 0 | Hz | 35 | % | 78 | % | 29 | C |
| 619) | 1/7/2010 | 1:23:12 | PM | 2 | V | 218 | V | 0 | Hz | 35 | % | 78 | % | 29 | C |
| 620) | 1/7/2010 | 1:23:14 | PM | 2 | V | 218 | V | 0 | Hz | 38 | % | 78 | % | 29 | C |
| 621) | 1/7/2010 | 1:23:16 | PM | 2 | V | 218 | V | 0 | Hz | 38 | % | 78 | % | 29 | C |
| 622) | 1/7/2010 | 1:23:18 | PM | 2 | V | 219 | V | 0 | Hz | 37 | % | 78 | % | 28 | C |
| 623) | 1/7/2010 | 1:23:20 | PM | 2 | V | 219 | V | 0 | Hz | 38 | % | 78 | % | 28 | C |
| 624) | 1/7/2010 | 1:23:22 | PM | 2 | V | 219 | V | 0 | Hz | 38 | % | 78 | % | 29 | C |

FIG. 7 - 21

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 625) | 1/7/2010 | 1:23:24 | PM | 2 | V | 219 | V | 0 | Hz | 36 | % | 78 | % | 28 | C |
| 626) | 1/7/2010 | 1:23:26 | PM | 2 | V | 218 | V | 0 | Hz | 36 | % | 78 | % | 29 | C |
| 627) | 1/7/2010 | 1:23:28 | PM | 2 | V | 218 | V | 0 | Hz | 35 | % | 78 | % | 29 | C |
| 628) | 1/7/2010 | 1:23:30 | PM | 2 | V | 218 | V | 0 | Hz | 36 | % | 78 | % | 29 | C |
| 629) | 1/7/2010 | 1:23:32 | PM | 2 | V | 218 | V | 0 | Hz | 38 | % | 78 | % | 29 | C |
| 630) | 1/7/2010 | 1:23:34 | PM | 2 | V | 219 | V | 0 | Hz | 38 | % | 78 | % | 29 | C |
| 631) | 1/7/2010 | 1:23:36 | PM | 2 | V | 218 | V | 0 | Hz | 38 | % | 78 | % | 29 | C |
| 632) | 1/7/2010 | 1:23:39 | PM | 2 | V | 218 | V | 0 | Hz | 37 | % | 78 | % | 29 | C |
| 633) | 1/7/2010 | 1:23:41 | PM | 2 | V | 218 | V | 0 | Hz | 38 | % | 78 | % | 29 | C |
| 634) | 1/7/2010 | 1:23:43 | PM | 2 | V | 218 | V | 0 | Hz | 38 | % | 78 | % | 29 | C |
| 635) | 1/7/2010 | 1:23:45 | PM | 2 | V | 218 | V | 0 | Hz | 36 | % | 78 | % | 28 | C |
| 636) | 1/7/2010 | 1:23:47 | PM | 2 | V | 218 | V | 0 | Hz | 35 | % | 78 | % | 29 | C |
| 638) | 1/7/2010 | 1:23:51 | PM | 2 | V | 218 | V | 0 | Hz | 35 | % | 78 | % | 29 | C |
| 639) | 1/7/2010 | 1:23:53 | PM | 2 | V | 218 | V | 0 | Hz | 36 | % | 78 | % | 29 | C |
| 640) | 1/7/2010 | 1:23:55 | PM | 2 | V | 218 | V | 0 | Hz | 38 | % | 78 | % | 29 | C |
| 641) | 1/7/2010 | 1:23:57 | PM | 2 | V | 219 | V | 0 | Hz | 37 | % | 78 | % | 28 | C |
| 642) | 1/7/2010 | 1:23:59 | PM | 2 | V | 219 | V | 0 | Hz | 38 | % | 78 | % | 28 | C |
| 643) | 1/7/2010 | 1:24:01 | PM | 2 | V | 219 | V | 0 | Hz | 38 | % | 78 | % | 28 | C |
| 644) | 1/7/2010 | 1:24:03 | PM | 2 | V | 219 | V | 0 | Hz | 36 | % | 78 | % | 28 | C |
| 645) | 1/7/2010 | 1:24:05 | PM | 2 | V | 219 | V | 0 | Hz | 36 | % | 78 | % | 28 | C |
| 646) | 1/7/2010 | 1:24:07 | PM | 2 | V | 219 | V | 0 | Hz | 35 | % | 78 | % | 29 | C |
| 647) | 1/7/2010 | 1:24:10 | PM | 2 | V | 218 | V | 0 | Hz | 35 | % | 77 | % | 29 | C |
| 648) | 1/7/2010 | 1:24:12 | PM | 2 | V | 219 | V | 0 | Hz | 38 | % | 77 | % | 29 | C |
| 649) | 1/7/2010 | 1:24:14 | PM | 2 | V | 218 | V | 0 | Hz | 38 | % | 78 | % | 29 | C |
| 650) | 1/7/2010 | 1:24:16 | PM | 2 | V | 218 | V | 0 | Hz | 38 | % | 78 | % | 28 | C |
| 651) | 1/7/2010 | 1:24:18 | PM | 2 | V | 218 | V | 0 | Hz | 37 | % | 78 | % | 28 | C |
| 652) | 1/7/2010 | 1:24:20 | PM | 2 | V | 218 | V | 0 | Hz | 37 | % | 78 | % | 28 | C |
| 653) | 1/7/2010 | 1:24:22 | PM | 2 | V | 218 | V | 0 | Hz | 38 | % | 78 | % | 28 | C |
| 654) | 1/7/2010 | 1:24:24 | PM | 2 | V | 218 | V | 0 | Hz | 36 | % | 78 | % | 28 | C |

FIG. 7 - 22

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 655) | 1/7/2010 | 1:24:26 | PM | 2 | V | 218 | V | 0 | Hz | 35 | % | 78 | % | 29 | C |
| 656) | 1/7/2010 | 1:24:28 | PM | 2 | V | 218 | V | 0 | Hz | 36 | % | 78 | % | 29 | C |
| 657) | 1/7/2010 | 1:24:30 | PM | 2 | V | 218 | V | 0 | Hz | 35 | % | 78 | % | 29 | C |
| 658) | 1/7/2010 | 1:24:32 | PM | 2 | V | 218 | V | 0 | Hz | 36 | % | 78 | % | 29 | C |
| 659) | 1/7/2010 | 1:24:34 | PM | 2 | V | 219 | V | 0 | Hz | 38 | % | 78 | % | 29 | C |
| 660) | 1/7/2010 | 1:24:36 | PM | 2 | V | 218 | V | 0 | Hz | 37 | % | 78 | % | 29 | C |
| 661) | 1/7/2010 | 1:24:38 | PM | 2 | V | 219 | V | 0 | Hz | 38 | % | 78 | % | 28 | C |
| 662) | 1/7/2010 | 1:24:41 | PM | 2 | V | 219 | V | 0 | Hz | 38 | % | 78 | % | 28 | C |
| 663) | 1/7/2010 | 1:24:43 | PM | 2 | V | 219 | V | 0 | Hz | 36 | % | 78 | % | 28 | C |
| 664) | 1/7/2010 | 1:24:45 | PM | 2 | V | 219 | V | 0 | Hz | 36 | % | 78 | % | 28 | C |
| 665) | 1/7/2010 | 1:24:47 | PM | 2 | V | 218 | V | 0 | Hz | 36 | % | 78 | % | 29 | C |
| 666) | 1/7/2010 | 1:24:49 | PM | 2 | V | 218 | V | 0 | Hz | 35 | % | 78 | % | 29 | C |
| 667) | 1/7/2010 | 1:24:51 | PM | 2 | V | 218 | V | 0 | Hz | 36 | % | 78 | % | 29 | C |
| 668) | 1/7/2010 | 1:24:53 | PM | 2 | V | 218 | V | 0 | Hz | 38 | % | 78 | % | 29 | C |
| 669) | 1/7/2010 | 1:24:55 | PM | 2 | V | 218 | V | 0 | Hz | 38 | % | 78 | % | 29 | C |
| 670) | 1/7/2010 | 1:24:57 | PM | 2 | V | 218 | V | 0 | Hz | 38 | % | 77 | % | 28 | C |
| 671) | 1/7/2010 | 1:24:59 | PM | 2 | V | 218 | V | 0 | Hz | 37 | % | 77 | % | 28 | C |
| 672) | 1/7/2010 | 1:25:01 | PM | 2 | V | 218 | V | 0 | Hz | 38 | % | 78 | % | 28 | C |
| 673) | 1/7/2010 | 1:25:03 | PM | 2 | V | 218 | V | 0 | Hz | 36 | % | 78 | % | 28 | C |
| 674) | 1/7/2010 | 1:25:05 | PM | 2 | V | 218 | V | 0 | Hz | 35 | % | 78 | % | 29 | C |
| 675) | 1/7/2010 | 1:25:07 | PM | 2 | V | 218 | V | 0 | Hz | 36 | % | 78 | % | 29 | C |
| 676) | 1/7/2010 | 1:25:09 | PM | 2 | V | 218 | V | 0 | Hz | 36 | % | 78 | % | 29 | C |
| 678) | 1/7/2010 | 1:25:14 | PM | 2 | V | 218 | V | 0 | Hz | 38 | % | 78 | % | 29 | C |
| 679) | 1/7/2010 | 1:25:16 | PM | 2 | V | 218 | V | 0 | Hz | 38 | % | 78 | % | 29 | C |
| 680) | 1/7/2010 | 1:25:18 | PM | 2 | V | 219 | V | 0 | Hz | 38 | % | 78 | % | 28 | C |
| 681) | 1/7/2010 | 1:25:20 | PM | 2 | V | 219 | V | 0 | Hz | 38 | % | 78 | % | 28 | C |
| 682) | 1/7/2010 | 1:25:22 | PM | 2 | V | 219 | V | 0 | Hz | 36 | % | 78 | % | 28 | C |
| 683) | 1/7/2010 | 1:25:24 | PM | 2 | V | 219 | V | 0 | Hz | 36 | % | 78 | % | 28 | C |
| 684) | 1/7/2010 | 1:25:26 | PM | 2 | V | 218 | V | 0 | Hz | 36 | % | 78 | % | 29 | C |

FIG. 7 - 23

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 685) | 1/7/2010 | 1:25:28 | PM | 2 | V | 218 | V | 0 | Hz | 36 | % | 78 | % | 29 | C |
| 686) | 1/7/2010 | 1:25:30 | PM | 2 | V | 218 | V | 0 | Hz | 36 | % | 78 | % | 29 | C |
| 687) | 1/7/2010 | 1:25:32 | PM | 2 | V | 218 | V | 0 | Hz | 38 | % | 77 | % | 29 | C |
| 688) | 1/7/2010 | 1:25:34 | PM | 2 | V | 218 | V | 0 | Hz | 37 | % | 78 | % | 29 | C |
| 689) | 1/7/2010 | 1:25:36 | PM | 2 | V | 218 | V | 0 | Hz | 37 | % | 78 | % | 28 | C |
| 690) | 1/7/2010 | 1:25:38 | PM | 2 | V | 218 | V | 0 | Hz | 38 | % | 78 | % | 28 | C |
| 691) | 1/7/2010 | 1:25:40 | PM | 2 | V | 218 | V | 0 | Hz | 38 | % | 78 | % | 28 | C |
| 692) | 1/7/2010 | 1:25:43 | PM | 2 | V | 218 | V | 0 | Hz | 35 | % | 78 | % | 28 | C |
| 693) | 1/7/2010 | 1:25:45 | PM | 2 | V | 218 | V | 0 | Hz | 35 | % | 78 | % | 29 | C |
| 694) | 1/7/2010 | 1:25:47 | PM | 2 | V | 218 | V | 0 | Hz | 35 | % | 78 | % | 29 | C |
| 695) | 1/7/2010 | 1:25:49 | PM | 2 | V | 218 | V | 0 | Hz | 36 | % | 78 | % | 29 | C |
| 696) | 1/7/2010 | 1:25:51 | PM | 2 | V | 218 | V | 0 | Hz | 36 | % | 78 | % | 29 | C |
| 697) | 1/7/2010 | 1:25:53 | PM | 2 | V | 218 | V | 0 | Hz | 38 | % | 78 | % | 29 | C |
| 698) | 1/7/2010 | 1:25:55 | PM | 2 | V | 218 | V | 0 | Hz | 37 | % | 78 | % | 29 | C |
| 699) | 1/7/2010 | 1:25:57 | PM | 2 | V | 219 | V | 0 | Hz | 37 | % | 78 | % | 28 | C |
| 700) | 1/7/2010 | 1:25:59 | PM | 2 | V | 219 | V | 0 | Hz | 38 | % | 78 | % | 28 | C |
| 701) | 1/7/2010 | 1:26:01 | PM | 2 | V | 219 | V | 0 | Hz | 36 | % | 78 | % | 28 | C |
| 702) | 1/7/2010 | 1:26:03 | PM | 2 | V | 219 | V | 0 | Hz | 36 | % | 78 | % | 28 | C |
| 703) | 1/7/2010 | 1:26:05 | PM | 2 | V | 219 | V | 0 | Hz | 35 | % | 78 | % | 28 | C |
| 704) | 1/7/2010 | 1:26:07 | PM | 2 | V | 218 | V | 0 | Hz | 36 | % | 78 | % | 29 | C |
| 705) | 1/7/2010 | 1:26:09 | PM | 2 | V | 218 | V | 0 | Hz | 36 | % | 78 | % | 29 | C |
| 706) | 1/7/2010 | 1:26:11 | PM | 2 | V | 218 | V | 0 | Hz | 36 | % | 77 | % | 29 | C |
| 707) | 1/7/2010 | 1:26:14 | PM | 2 | V | 218 | V | 0 | Hz | 37 | % | 78 | % | 29 | C |
| 708) | 1/7/2010 | 1:26:16 | PM | 2 | V | 218 | V | 0 | Hz | 37 | % | 77 | % | 28 | C |
| 709) | 1/7/2010 | 1:26:18 | PM | 2 | V | 218 | V | 0 | Hz | 38 | % | 77 | % | 28 | C |
| 710) | 1/7/2010 | 1:26:20 | PM | 2 | V | 218 | V | 0 | Hz | 38 | % | 78 | % | 29 | C |
| 711) | 1/7/2010 | 1:26:22 | PM | 2 | V | 218 | V | 0 | Hz | 38 | % | 78 | % | 28 | C |
| 712) | 1/7/2010 | 1:26:24 | PM | 2 | V | 218 | V | 0 | Hz | 35 | % | 78 | % | 28 | C |
| 713) | 1/7/2010 | 1:26:26 | PM | 2 | V | 218 | V | 0 | Hz | 35 | % | 78 | % | 29 | C |

FIG. 7 - 24

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 714) | 1/7/2010 | 1:26:28 | PM | 2 | V | 218 | V | 0 | Hz | 36 | % | 78 | % | 29 | C |
| 715) | 1/7/2010 | 1:26:30 | PM | 2 | V | 218 | V | 0 | Hz | 36 | % | 78 | % | 29 | C |
| 716) | 1/7/2010 | 1:26:32 | PM | 2 | V | 218 | V | 0 | Hz | 36 | % | 78 | % | 28 | C |
| 718) | 1/7/2010 | 1:26:36 | PM | 2 | V | 219 | V | 0 | Hz | 37 | % | 78 | % | 28 | C |
| 719) | 1/7/2010 | 1:26:38 | PM | 2 | V | 219 | V | 0 | Hz | 38 | % | 78 | % | 28 | C |
| 720) | 1/7/2010 | 1:26:40 | PM | 2 | V | 219 | V | 0 | Hz | 38 | % | 78 | % | 28 | C |
| 721) | 1/7/2010 | 1:26:42 | PM | 2 | V | 219 | V | 0 | Hz | 36 | % | 78 | % | 28 | C |
| 722) | 1/7/2010 | 1:26:45 | PM | 2 | V | 219 | V | 0 | Hz | 36 | % | 78 | % | 28 | C |
| 723) | 1/7/2010 | 1:26:47 | PM | 2 | V | 218 | V | 0 | Hz | 36 | % | 78 | % | 29 | C |
| 724) | 1/7/2010 | 1:26:49 | PM | 2 | V | 218 | V | 0 | Hz | 36 | % | 77 | % | 29 | C |
| 725) | 1/7/2010 | 1:26:51 | PM | 2 | V | 218 | V | 0 | Hz | 36 | % | 78 | % | 29 | C |
| 726) | 1/7/2010 | 1:26:53 | PM | 2 | V | 218 | V | 0 | Hz | 37 | % | 78 | % | 29 | C |
| 727) | 1/7/2010 | 1:26:55 | PM | 2 | V | 218 | V | 0 | Hz | 37 | % | 77 | % | 29 | C |
| 728) | 1/7/2010 | 1:26:57 | PM | 2 | V | 218 | V | 0 | Hz | 38 | % | 77 | % | 29 | C |
| 729) | 1/7/2010 | 1:26:59 | PM | 2 | V | 218 | V | 0 | Hz | 38 | % | 78 | % | 29 | C |
| 730) | 1/7/2010 | 1:27:01 | PM | 2 | V | 218 | V | 0 | Hz | 38 | % | 78 | % | 29 | C |
| 731) | 1/7/2010 | 1:27:03 | PM | 2 | V | 218 | V | 0 | Hz | 35 | % | 78 | % | 29 | C |
| 732) | 1/7/2010 | 1:27:05 | PM | 2 | V | 218 | V | 0 | Hz | 35 | % | 78 | % | 29 | C |
| 733) | 1/7/2010 | 1:27:07 | PM | 2 | V | 218 | V | 0 | Hz | 36 | % | 78 | % | 29 | C |
| 734) | 1/7/2010 | 1:27:09 | PM | 2 | V | 218 | V | 0 | Hz | 35 | % | 78 | % | 29 | C |
| 735) | 1/7/2010 | 1:27:11 | PM | 2 | V | 218 | V | 0 | Hz | 38 | % | 78 | % | 29 | C |
| 736) | 1/7/2010 | 1:27:13 | PM | 2 | V | 218 | V | 0 | Hz | 38 | % | 78 | % | 29 | C |
| 737) | 1/7/2010 | 1:27:16 | PM | 2 | V | 219 | V | 0 | Hz | 38 | % | 78 | % | 28 | C |
| 738) | 1/7/2010 | 1:27:18 | PM | 2 | V | 219 | V | 0 | Hz | 38 | % | 78 | % | 28 | C |
| 739) | 1/7/2010 | 1:27:20 | PM | 2 | V | 219 | V | 0 | Hz | 36 | % | 78 | % | 28 | C |
| 740) | 1/7/2010 | 1:27:22 | PM | 2 | V | 219 | V | 0 | Hz | 35 | % | 78 | % | 28 | C |
| 741) | 1/7/2010 | 1:27:24 | PM | 2 | V | 219 | V | 0 | Hz | 36 | % | 78 | % | 28 | C |
| 742) | 1/7/2010 | 1:27:26 | PM | 2 | V | 218 | V | 0 | Hz | 36 | % | 78 | % | 29 | C |
| 743) | 1/7/2010 | 1:27:28 | PM | 2 | V | 218 | V | 0 | Hz | 36 | % | 77 | % | 29 | C |

FIG. 7 - 25

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 744) | 1/7/2010 | 1:27:30 | PM | 2 | V | 218 | V | 0 | Hz | 36 | % | 77 | % | 29 | C |
| 745) | 1/7/2010 | 1:27:32 | PM | 2 | V | 218 | V | 0 | Hz | 37 | % | 77 | % | 29 | C |
| 746) | 1/7/2010 | 1:27:34 | PM | 2 | V | 218 | V | 0 | Hz | 38 | % | 77 | % | 29 | C |
| 747) | 1/7/2010 | 1:27:36 | PM | 2 | V | 218 | V | 0 | Hz | 38 | % | 77 | % | 29 | C |
| 748) | 1/7/2010 | 1:27:38 | PM | 2 | V | 218 | V | 0 | Hz | 38 | % | 78 | % | 28 | C |
| 749) | 1/7/2010 | 1:27:40 | PM | 2 | V | 218 | V | 0 | Hz | 38 | % | 78 | % | 28 | C |
| 750) | 1/7/2010 | 1:27:42 | PM | 2 | V | 218 | V | 0 | Hz | 35 | % | 78 | % | 28 | C |
| 751) | 1/7/2010 | 1:27:44 | PM | 2 | V | 218 | V | 0 | Hz | 35 | % | 78 | % | 29 | C |
| 752) | 1/7/2010 | 1:27:47 | PM | 2 | V | 218 | V | 0 | Hz | 36 | % | 78 | % | 29 | C |
| 753) | 1/7/2010 | 1:27:49 | PM | 2 | V | 218 | V | 0 | Hz | 36 | % | 78 | % | 29 | C |
| 754) | 1/7/2010 | 1:27:51 | PM | 2 | V | 218 | V | 0 | Hz | 37 | % | 78 | % | 29 | C |
| 755) | 1/7/2010 | 1:27:53 | PM | 2 | V | 218 | V | 0 | Hz | 38 | % | 78 | % | 29 | C |
| 756) | 1/7/2010 | 1:27:55 | PM | 2 | V | 218 | V | 0 | Hz | 38 | % | 78 | % | 28 | C |
| 758) | 1/7/2010 | 1:27:59 | PM | 2 | V | 219 | V | 0 | Hz | 38 | % | 78 | % | 28 | C |
| 759) | 1/7/2010 | 1:28:01 | PM | 12 | V | 219 | V | 50.5 | Hz | 35 | % | 78 | % | 28 | C |
| 760) | 1/7/2010 | 1:28:03 | PM | 201 | V | 220 | V | 50.5 | Hz | 36 | % | 72 | % | 29 | C |
| 761) | 1/7/2010 | 1:28:05 | PM | 202 | V | 218 | V | 50.6 | Hz | 35 | % | 72 | % | 28 | C |
| 762) | 1/7/2010 | 1:28:07 | PM | 202 | V | 218 | V | 50.6 | Hz | 34 | % | 72 | % | 29 | C |
| 763) | 1/7/2010 | 1:28:09 | PM | 201 | V | 218 | V | 50.6 | Hz | 34 | % | 72 | % | 29 | C |
| 764) | 1/7/2010 | 1:28:11 | PM | 201 | V | 218 | V | 50.6 | Hz | 35 | % | 72 | % | 29 | C |
| 765) | 1/7/2010 | 1:28:13 | PM | 202 | V | 218 | V | 50.6 | Hz | 33 | % | 72 | % | 29 | C |
| 766) | 1/7/2010 | 1:28:15 | PM | 205 | V | 219 | V | 50.5 | Hz | 35 | % | 70 | % | 29 | C |
| 767) | 1/7/2010 | 1:28:18 | PM | 206 | V | 220 | V | 50.6 | Hz | 34 | % | 77 | % | 29 | C |
| 768) | 1/7/2010 | 1:28:20 | PM | 208 | V | 220 | V | 50.5 | Hz | 34 | % | 77 | % | 29 | C |
| 769) | 1/7/2010 | 1:28:22 | PM | 208 | V | 221 | V | 50.5 | Hz | 34 | % | 77 | % | 93 | C |
| 770) | 1/7/2010 | 1:28:24 | PM | 208 | V | 220 | V | 50.6 | Hz | 37 | % | 78 | % | 29 | C |
| 771) | 1/7/2010 | 1:28:26 | PM | 207 | V | 221 | V | 50.6 | Hz | 36 | % | 78 | % | 29 | C |
| 772) | 1/7/2010 | 1:28:28 | PM | 207 | V | 220 | V | 50.6 | Hz | 38 | % | 78 | % | 29 | C |
| 773) | 1/7/2010 | 1:28:30 | PM | 208 | V | 220 | V | 50.6 | Hz | 38 | % | 78 | % | 29 | C |

FIG. 7 - 26

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 774) | 1/7/2010 | 1:28:32 | PM | 206 | V | 220 | V | 50.6 | Hz | 38 | % | 80 | % | 29 | C |
| 775) | 1/7/2010 | 1:28:34 | PM | 208 | V | 220 | V | 50.6 | Hz | 36 | % | 80 | % | 29 | C |
| 776) | 1/7/2010 | 1:28:36 | PM | 206 | V | 220 | V | 50.5 | Hz | 39 | % | 80 | % | 29 | C |
| 777) | 1/7/2010 | 1:28:38 | PM | 205 | V | 220 | V | 50.5 | Hz | 36 | % | 78 | % | 29 | C |
| 778) | 1/7/2010 | 1:28:40 | PM | 204 | V | 220 | V | 50.6 | Hz | 35 | % | 80 | % | 29 | C |
| 779) | 1/7/2010 | 1:28:42 | PM | 204 | V | 220 | V | 50.6 | Hz | 36 | % | 82 | % | 29 | C |
| 780) | 1/7/2010 | 1:28:44 | PM | 204 | V | 220 | V | 50.6 | Hz | 35 | % | 80 | % | 29 | C |
| 781) | 1/7/2010 | 1:28:46 | PM | 205 | V | 220 | V | 50.5 | Hz | 41 | % | 82 | % | 29 | C |
| 782) | 1/7/2010 | 1:28:49 | PM | 208 | V | 221 | V | 50.5 | Hz | 36 | % | 80 | % | 29 | C |
| 783) | 1/7/2010 | 1:28:51 | PM | 206 | V | 220 | V | 50.6 | Hz | 39 | % | 82 | % | 29 | C |
| 784) | 1/7/2010 | 1:28:53 | PM | 206 | V | 220 | V | 50.5 | Hz | 38 | % | 80 | % | 29 | C |
| 785) | 1/7/2010 | 1:28:55 | PM | 208 | V | 220 | V | 50.6 | Hz | 34 | % | 82 | % | 29 | C |
| 786) | 1/7/2010 | 1:28:57 | PM | 206 | V | 220 | V | 50.5 | Hz | 36 | % | 82 | % | 29 | C |
| 787) | 1/7/2010 | 1:28:59 | PM | 207 | V | 221 | V | 50.5 | Hz | 38 | % | 83 | % | 29 | C |
| 788) | 1/7/2010 | 1:29:01 | PM | 208 | V | 220 | V | 50.5 | Hz | 34 | % | 82 | % | 29 | C |
| 789) | 1/7/2010 | 1:29:03 | PM | 207 | V | 221 | V | 50.5 | Hz | 35 | % | 83 | % | 29 | C |
| 790) | 1/7/2010 | 1:29:05 | PM | 207 | V | 221 | V | 50.6 | Hz | 36 | % | 83 | % | 29 | C |
| 791) | 1/7/2010 | 1:29:07 | PM | 207 | V | 221 | V | 50.5 | Hz | 36 | % | 82 | % | 29 | C |
| 792) | 1/7/2010 | 1:29:09 | PM | 206 | V | 220 | V | 50.6 | Hz | 37 | % | 82 | % | 29 | C |
| 793) | 1/7/2010 | 1:29:11 | PM | 206 | V | 221 | V | 50.6 | Hz | 37 | % | 82 | % | 29 | C |
| 794) | 1/7/2010 | 1:29:13 | PM | 208 | V | 220 | V | 50.5 | Hz | 38 | % | 83 | % | 29 | C |
| 795) | 1/7/2010 | 1:29:15 | PM | 206 | V | 220 | V | 50.6 | Hz | 34 | % | 83 | % | 29 | C |
| 796) | 1/7/2010 | 1:29:17 | PM | 204 | V | 221 | V | 50.6 | Hz | 34 | % | 83 | % | 29 | C |
| 798) | 1/7/2010 | 1:29:22 | PM | 208 | V | 220 | V | 50.5 | Hz | 39 | % | 83 | % | 29 | C |
| 799) | 1/7/2010 | 1:29:24 | PM | 207 | V | 220 | V | 50.5 | Hz | 37 | % | 83 | % | 29 | C |
| 800) | 1/7/2010 | 1:29:26 | PM | 206 | V | 221 | V | 50.6 | Hz | 39 | % | 85 | % | 29 | C |
| 801) | 1/7/2010 | 1:29:28 | PM | 208 | V | 221 | V | 50.5 | Hz | 36 | % | 85 | % | 29 | C |
| 802) | 1/7/2010 | 1:29:30 | PM | 208 | V | 220 | V | 50.6 | Hz | 36 | % | 87 | % | 29 | C |
| 803) | 1/7/2010 | 1:29:32 | PM | 207 | V | 221 | V | 50.6 | Hz | 35 | % | 85 | % | 29 | C |

FIG. 7 - 27

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 804) | 1/7/2010 | 1:29:34 | PM | 207 | V | 221 | V | 50.5 | Hz | 36 | % | 83 | % | 29 | C |
| 805) | 1/7/2010 | 1:29:36 | PM | 207 | V | 221 | V | 50.5 | Hz | 37 | % | 85 | % | 29 | C |
| 806) | 1/7/2010 | 1:29:38 | PM | 207 | V | 221 | V | 50.5 | Hz | 39 | % | 85 | % | 29 | C |
| 807) | 1/7/2010 | 1:29:40 | PM | 207 | V | 221 | V | 50.6 | Hz | 38 | % | 87 | % | 29 | C |
| 808) | 1/7/2010 | 1:29:42 | PM | 205 | V | 221 | V | 50.6 | Hz | 40 | % | 87 | % | 29 | C |
| 809) | 1/7/2010 | 1:29:44 | PM | 204 | V | 220 | V | 50.6 | Hz | 37 | % | 87 | % | 29 | C |
| 810) | 1/7/2010 | 1:29:46 | PM | 205 | V | 221 | V | 50.6 | Hz | 35 | % | 87 | % | 29 | C |
| 811) | 1/7/2010 | 1:29:48 | PM | 204 | V | 220 | V | 50.5 | Hz | 38 | % | 87 | % | 29 | C |
| 812) | 1/7/2010 | 1:29:50 | PM | 204 | V | 221 | V | 50.6 | Hz | 38 | % | 87 | % | 29 | C |
| 813) | 1/7/2010 | 1:29:52 | PM | 205 | V | 221 | V | 50.5 | Hz | 34 | % | 87 | % | 29 | C |
| 814) | 1/7/2010 | 1:29:54 | PM | 205 | V | 220 | V | 50.5 | Hz | 38 | % | 87 | % | 29 | C |
| 815) | 1/7/2010 | 1:29:56 | PM | 205 | V | 220 | V | 50.6 | Hz | 37 | % | 87 | % | 29 | C |
| 816) | 1/7/2010 | 1:29:58 | PM | 205 | V | 220 | V | 50.5 | Hz | 38 | % | 87 | % | 29 | C |
| 817) | 1/7/2010 | 1:30:00 | PM | 202 | V | 220 | V | 50.6 | Hz | 37 | % | 87 | % | 29 | C |
| 818) | 1/7/2010 | 1:30:02 | PM | 204 | V | 221 | V | 50.6 | Hz | 35 | % | 87 | % | 29 | C |
| 819) | 1/7/2010 | 1:30:04 | PM | 205 | V | 220 | V | 50.5 | Hz | 36 | % | 88 | % | 29 | C |
| 820) | 1/7/2010 | 1:30:06 | PM | 202 | V | 221 | V | 50.5 | Hz | 36 | % | 88 | % | 29 | C |
| 821) | 1/7/2010 | 1:30:08 | PM | 202 | V | 221 | V | 50.6 | Hz | 34 | % | 87 | % | 29 | C |
| 822) | 1/7/2010 | 1:30:10 | PM | 202 | V | 221 | V | 50.5 | Hz | 36 | % | 88 | % | 29 | C |
| 823) | 1/7/2010 | 1:30:12 | PM | 203 | V | 221 | V | 50.5 | Hz | 36 | % | 87 | % | 29 | C |
| 824) | 1/7/2010 | 1:30:14 | PM | 204 | V | 221 | V | 50.6 | Hz | 38 | % | 88 | % | 29 | C |
| 825) | 1/7/2010 | 1:30:16 | PM | 204 | V | 220 | V | 50.6 | Hz | 36 | % | 90 | % | 29 | C |
| 826) | 1/7/2010 | 1:30:18 | PM | 204 | V | 220 | V | 50.6 | Hz | 35 | % | 88 | % | 29 | C |
| 827) | 1/7/2010 | 1:30:20 | PM | 205 | V | 220 | V | 50.6 | Hz | 39 | % | 88 | % | 29 | C |
| 828) | 1/7/2010 | 1:30:23 | PM | 203 | V | 220 | V | 50.5 | Hz | 36 | % | 90 | % | 29 | C |
| 829) | 1/7/2010 | 1:30:25 | PM | 201 | V | 220 | V | 50.6 | Hz | 36 | % | 88 | % | 29 | C |
| 830) | 1/7/2010 | 1:30:27 | PM | 201 | V | 220 | V | 50.5 | Hz | 34 | % | 88 | % | 29 | C |
| 831) | 1/7/2010 | 1:30:29 | PM | 201 | V | 220 | V | 50.5 | Hz | 34 | % | 90 | % | 29 | C |
| 832) | 1/7/2010 | 1:30:31 | PM | 201 | V | 220 | V | 50.6 | Hz | 34 | % | 88 | % | 29 | C |

FIG. 7 - 28

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 833) | 1/7/2010 | 1:30:33 | PM | 201 | V | 220 | V | 50.6 | Hz | 34 | % | 90 | % | 29 | C |
| 834) | 1/7/2010 | 1:30:35 | PM | 202 | V | 220 | V | 50.6 | Hz | 34 | % | 90 | % | 29 | C |
| 835) | 1/7/2010 | 1:30:37 | PM | 202 | V | 220 | V | 50.6 | Hz | 36 | % | 90 | % | 29 | C |
| 836) | 1/7/2010 | 1:30:39 | PM | 202 | V | 221 | V | 50.6 | Hz | 38 | % | 90 | % | 29 | C |
| 838) | 1/7/2010 | 1:30:43 | PM | 202 | V | 221 | V | 50.6 | Hz | 36 | % | 90 | % | 29 | C |
| 839) | 1/7/2010 | 1:30:45 | PM | 201 | V | 220 | V | 50.5 | Hz | 36 | % | 90 | % | 29 | C |
| 840) | 1/7/2010 | 1:30:47 | PM | 202 | V | 220 | V | 50.6 | Hz | 35 | % | 100 | % | 29 | C |
| 841) | 1/7/2010 | 1:30:49 | PM | 201 | V | 220 | V | 50.6 | Hz | 36 | % | 90 | % | 29 | C |
| 842) | 1/7/2010 | 1:30:51 | PM | 202 | V | 220 | V | 50.6 | Hz | 36 | % | 100 | % | 29 | C |
| 843) | 1/7/2010 | 1:30:54 | PM | 202 | V | 220 | V | 50.5 | Hz | 39 | % | 90 | % | 29 | C |
| 844) | 1/7/2010 | 1:30:56 | PM | 202 | V | 221 | V | 50.6 | Hz | 35 | % | 90 | % | 29 | C |
| 845) | 1/7/2010 | 1:30:58 | PM | 201 | V | 221 | V | 50.5 | Hz | 35 | % | 100 | % | 29 | C |
| 846) | 1/7/2010 | 1:31:00 | PM | 204 | V | 221 | V | 50.6 | Hz | 39 | % | 100 | % | 29 | C |
| 847) | 1/7/2010 | 1:31:02 | PM | 205 | V | 220 | V | 50.5 | Hz | 36 | % | 90 | % | 29 | C |
| 848) | 1/7/2010 | 1:31:04 | PM | 204 | V | 220 | V | 50.6 | Hz | 41 | % | 100 | % | 29 | C |
| 849) | 1/7/2010 | 1:31:06 | PM | 204 | V | 220 | V | 50.5 | Hz | 37 | % | 90 | % | 29 | C |
| 850) | 1/7/2010 | 1:31:08 | PM | 205 | V | 220 | V | 50.6 | Hz | 36 | % | 100 | % | 29 | C |
| 851) | 1/7/2010 | 1:31:10 | PM | 204 | V | 220 | V | 50.6 | Hz | 34 | % | 100 | % | 29 | C |
| 852) | 1/7/2010 | 1:31:12 | PM | 202 | V | 220 | V | 50.6 | Hz | 35 | % | 100 | % | 29 | C |
| 853) | 1/7/2010 | 1:31:14 | PM | 202 | V | 221 | V | 50.6 | Hz | 35 | % | 100 | % | 29 | C |
| 854) | 1/7/2010 | 1:31:16 | PM | 203 | V | 221 | V | 50.6 | Hz | 35 | % | 100 | % | 29 | C |
| 855) | 1/7/2010 | 1:31:18 | PM | 204 | V | 220 | V | 50.6 | Hz | 34 | % | 100 | % | 29 | C |
| 856) | 1/7/2010 | 1:31:20 | PM | 204 | V | 221 | V | 50.6 | Hz | 35 | % | 100 | % | 29 | C |
| 857) | 1/7/2010 | 1:31:22 | PM | 202 | V | 221 | V | 50.6 | Hz | 34 | % | 100 | % | 29 | C |
| 858) | 1/7/2010 | 1:31:25 | PM | 202 | V | 220 | V | 50.6 | Hz | 34 | % | 100 | % | 29 | C |
| 859) | 1/7/2010 | 1:31:27 | PM | 202 | V | 220 | V | 50.5 | Hz | 38 | % | 100 | % | 29 | C |
| 860) | 1/7/2010 | 1:31:29 | PM | 202 | V | 220 | V | 50.6 | Hz | 35 | % | 100 | % | 29 | C |
| 861) | 1/7/2010 | 1:31:31 | PM | 202 | V | 221 | V | 50.6 | Hz | 35 | % | 100 | % | 29 | C |
| 862) | 1/7/2010 | 1:31:33 | PM | 202 | V | 220 | V | 50.6 | Hz | 36 | % | 100 | % | 29 | C |

FIG. 7 - 29

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 863) | 1/7/2010 | 1:31:35 | PM | 202 | V | 221 | V | 50.5 | Hz | 39 | % | 100 | % | 29 | C |
| 864) | 1/7/2010 | 1:31:37 | PM | 202 | V | 220 | V | 50.6 | Hz | 37 | % | 100 | % | 29 | C |
| 865) | 1/7/2010 | 1:31:39 | PM | 204 | V | 220 | V | 50.6 | Hz | 39 | % | 100 | % | 29 | C |
| 866) | 1/7/2010 | 1:31:41 | PM | 204 | V | 220 | V | 50.6 | Hz | 36 | % | 100 | % | 29 | C |
| 867) | 1/7/2010 | 1:31:43 | PM | 205 | V | 221 | V | 50.6 | Hz | 36 | % | 100 | % | 29 | C |
| 868) | 1/7/2010 | 1:31:45 | PM | 203 | V | 220 | V | 50.6 | Hz | 35 | % | 100 | % | 29 | C |
| 869) | 1/7/2010 | 1:31:47 | PM | 204 | V | 220 | V | 50.5 | Hz | 36 | % | 100 | % | 29 | C |
| 870) | 1/7/2010 | 1:31:49 | PM | 205 | V | 220 | V | 50.6 | Hz | 36 | % | 100 | % | 29 | C |
| 871) | 1/7/2010 | 1:31:51 | PM | 205 | V | 220 | V | 50.6 | Hz | 38 | % | 100 | % | 29 | C |
| 872) | 1/7/2010 | 1:31:53 | PM | 205 | V | 220 | V | 50.5 | Hz | 35 | % | 100 | % | 29 | C |
| 873) | 1/7/2010 | 1:31:56 | PM | 204 | V | 221 | V | 50.6 | Hz | 39 | % | 100 | % | 29 | C |
| 874) | 1/7/2010 | 1:31:58 | PM | 205 | V | 221 | V | 50.5 | Hz | 38 | % | 100 | % | 29 | C |
| 875) | 1/7/2010 | 1:32:00 | PM | 204 | V | 220 | V | 50.5 | Hz | 36 | % | 100 | % | 29 | C |
| 876) | 1/7/2010 | 1:32:02 | PM | 204 | V | 221 | V | 50.6 | Hz | 38 | % | 100 | % | 29 | C |
| 878) | 1/7/2010 | 1:32:06 | PM | 204 | V | 220 | V | 50.6 | Hz | 34 | % | 100 | % | 29 | C |
| 879) | 1/7/2010 | 1:32:08 | PM | 204 | V | 221 | V | 50.6 | Hz | 37 | % | 100 | % | 29 | C |
| 880) | 1/7/2010 | 1:32:10 | PM | 204 | V | 221 | V | 50.6 | Hz | 38 | % | 100 | % | 29 | C |
| 881) | 1/7/2010 | 1:32:12 | PM | 207 | V | 221 | V | 50.5 | Hz | 37 | % | 100 | % | 29 | C |
| 882) | 1/7/2010 | 1:32:14 | PM | 206 | V | 220 | V | 50.5 | Hz | 36 | % | 100 | % | 29 | C |
| 883) | 1/7/2010 | 1:32:16 | PM | 206 | V | 220 | V | 50.5 | Hz | 38 | % | 100 | % | 29 | C |
| 884) | 1/7/2010 | 1:32:18 | PM | 204 | V | 220 | V | 50.5 | Hz | 35 | % | 100 | % | 29 | C |
| 885) | 1/7/2010 | 1:32:20 | PM | 204 | V | 221 | V | 50.5 | Hz | 36 | % | 100 | % | 29 | C |
| 886) | 1/7/2010 | 1:32:22 | PM | 205 | V | 220 | V | 50.6 | Hz | 34 | % | 100 | % | 29 | C |
| 887) | 1/7/2010 | 1:32:24 | PM | 205 | V | 220 | V | 50.5 | Hz | 40 | % | 100 | % | 29 | C |
| 888) | 1/7/2010 | 1:32:27 | PM | 205 | V | 220 | V | 50.5 | Hz | 36 | % | 100 | % | 29 | C |
| 889) | 1/7/2010 | 1:32:29 | PM | 204 | V | 220 | V | 50.6 | Hz | 37 | % | 100 | % | 29 | C |
| 890) | 1/7/2010 | 1:32:31 | PM | 205 | V | 221 | V | 50.5 | Hz | 38 | % | 100 | % | 29 | C |
| 891) | 1/7/2010 | 1:32:33 | PM | 208 | V | 221 | V | 50.5 | Hz | 37 | % | 100 | % | 29 | C |
| 892) | 1/7/2010 | 1:32:35 | PM | 208 | V | 220 | V | 50.5 | Hz | 35 | % | 100 | % | 29 | C |

FIG. 7 - 30

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 893) | 1/7/2010 | 1:32:37 | PM | 207 | V | 221 | V | 50.5 | Hz | 34 | % | 100 | % | 29 | C |
| 894) | 1/7/2010 | 1:32:39 | PM | 207 | V | 221 | V | 50.5 | Hz | 37 | % | 100 | % | 29 | C |
| 895) | 1/7/2010 | 1:32:41 | PM | 207 | V | 221 | V | 50.5 | Hz | 39 | % | 100 | % | 29 | C |
| 896) | 1/7/2010 | 1:32:45 | PM | 208 | V | 220 | V | 50.5 | Hz | 37 | % | 100 | % | 29 | C |
| 897) | 1/7/2010 | 1:32:47 | PM | 206 | V | 221 | V | 50.5 | Hz | 40 | % | 100 | % | 29 | C |
| 898) | 1/7/2010 | 1:32:49 | PM | 206 | V | 220 | V | 50.5 | Hz | 34 | % | 100 | % | 29 | C |
| 899) | 1/7/2010 | 1:32:51 | PM | 207 | V | 220 | V | 50.6 | Hz | 37 | % | 100 | % | 29 | C |
| 900) | 1/7/2010 | 1:32:53 | PM | 207 | V | 220 | V | 50.5 | Hz | 40 | % | 100 | % | 29 | C |
| 901) | 1/7/2010 | 1:32:55 | PM | 207 | V | 221 | V | 50.5 | Hz | 37 | % | 100 | % | 29 | C |
| 902) | 1/7/2010 | 1:32:58 | PM | 206 | V | 220 | V | 50.5 | Hz | 36 | % | 100 | % | 29 | C |
| 903) | 1/7/2010 | 1:33:00 | PM | 208 | V | 221 | V | 50.5 | Hz | 34 | % | 100 | % | 29 | C |
| 904) | 1/7/2010 | 1:33:02 | PM | 208 | V | 221 | V | 50.5 | Hz | 38 | % | 100 | % | 29 | C |
| 905) | 1/7/2010 | 1:33:04 | PM | 207 | V | 221 | V | 50.6 | Hz | 35 | % | 100 | % | 29 | C |
| 906) | 1/7/2010 | 1:33:06 | PM | 207 | V | 221 | V | 50.5 | Hz | 36 | % | 100 | % | 29 | C |
| 907) | 1/7/2010 | 1:33:08 | PM | 207 | V | 221 | V | 50.5 | Hz | 38 | % | 100 | % | 29 | C |
| 908) | 1/7/2010 | 1:33:10 | PM | 206 | V | 220 | V | 50.5 | Hz | 39 | % | 100 | % | 29 | C |
| 909) | 1/7/2010 | 1:33:12 | PM | 206 | V | 221 | V | 50.6 | Hz | 37 | % | 100 | % | 29 | C |
| 910) | 1/7/2010 | 1:33:14 | PM | 208 | V | 221 | V | 50.6 | Hz | 35 | % | 100 | % | 29 | C |
| 911) | 1/7/2010 | 1:33:16 | PM | 206 | V | 221 | V | 50.6 | Hz | 35 | % | 100 | % | 29 | C |
| 912) | 1/7/2010 | 1:33:18 | PM | 207 | V | 221 | V | 50.6 | Hz | 34 | % | 100 | % | 29 | C |
| 913) | 1/7/2010 | 1:33:20 | PM | 207 | V | 220 | V | 50.5 | Hz | 35 | % | 100 | % | 29 | C |
| 914) | 1/7/2010 | 1:33:22 | PM | 207 | V | 221 | V | 50.6 | Hz | 38 | % | 100 | % | 29 | C |
| 915) | 1/7/2010 | 1:33:24 | PM | 207 | V | 221 | V | 50.6 | Hz | 37 | % | 100 | % | 29 | C |
| 916) | 1/7/2010 | 1:33:26 | PM | 208 | V | 220 | V | 50.6 | Hz | 39 | % | 100 | % | 29 | C |
| 918) | 1/7/2010 | 1:33:31 | PM | 208 | V | 220 | V | 50.5 | Hz | 37 | % | 100 | % | 29 | C |
| 919) | 1/7/2010 | 1:33:33 | PM | 208 | V | 221 | V | 50.6 | Hz | 36 | % | 100 | % | 29 | C |
| 920) | 1/7/2010 | 1:33:35 | PM | 208 | V | 220 | V | 50.6 | Hz | 37 | % | 100 | % | 29 | C |
| 921) | 1/7/2010 | 1:33:37 | PM | 207 | V | 221 | V | 50.6 | Hz | 34 | % | 100 | % | 29 | C |
| 922) | 1/7/2010 | 1:33:39 | PM | 207 | V | 221 | V | 50.5 | Hz | 37 | % | 100 | % | 29 | C |

FIG. 7 - 31

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 923) | 1/7/2010 | 1:33:41 | PM | 208 | V | 219 | V | 50.6 | Hz | 36 | % | 100 | % | 29 | C |
| 924) | 1/7/2010 | 1:33:43 | PM | 207 | V | 221 | V | 50.6 | Hz | 36 | % | 100 | % | 29 | C |
| 925) | 1/7/2010 | 1:33:45 | PM | 206 | V | 221 | V | 50.5 | Hz | 39 | % | 100 | % | 29 | C |
| 926) | 1/7/2010 | 1:33:47 | PM | 208 | V | 221 | V | 50.5 | Hz | 38 | % | 100 | % | 29 | C |
| 927) | 1/7/2010 | 1:33:49 | PM | 206 | V | 220 | V | 50.5 | Hz | 34 | % | 100 | % | 29 | C |
| 928) | 1/7/2010 | 1:33:51 | PM | 208 | V | 220 | V | 50.5 | Hz | 37 | % | 100 | % | 29 | C |
| 929) | 1/7/2010 | 1:33:53 | PM | 207 | V | 220 | V | 50.6 | Hz | 34 | % | 100 | % | 29 | C |
| 930) | 1/7/2010 | 1:33:55 | PM | 204 | V | 220 | V | 50.5 | Hz | 34 | % | 100 | % | 29 | C |
| 931) | 1/7/2010 | 1:33:57 | PM | 202 | V | 221 | V | 50.6 | Hz | 35 | % | 100 | % | 29 | C |
| 932) | 1/7/2010 | 1:34:00 | PM | 205 | V | 220 | V | 50.5 | Hz | 36 | % | 100 | % | 29 | C |
| 933) | 1/7/2010 | 1:34:02 | PM | 205 | V | 220 | V | 50.5 | Hz | 38 | % | 100 | % | 29 | C |
| 934) | 1/7/2010 | 1:34:04 | PM | 205 | V | 220 | V | 50.5 | Hz | 36 | % | 100 | % | 29 | C |
| 935) | 1/7/2010 | 1:34:06 | PM | 205 | V | 220 | V | 50.6 | Hz | 35 | % | 100 | % | 29 | C |
| 936) | 1/7/2010 | 1:34:08 | PM | 205 | V | 220 | V | 50.5 | Hz | 38 | % | 100 | % | 29 | C |
| 937) | 1/7/2010 | 1:34:10 | PM | 205 | V | 220 | V | 50.6 | Hz | 34 | % | 100 | % | 29 | C |
| 938) | 1/7/2010 | 1:34:12 | PM | 204 | V | 221 | V | 50.5 | Hz | 35 | % | 100 | % | 29 | C |
| 939) | 1/7/2010 | 1:34:14 | PM | 205 | V | 220 | V | 50.5 | Hz | 38 | % | 100 | % | 29 | C |
| 940) | 1/7/2010 | 1:34:16 | PM | 205 | V | 220 | V | 50.6 | Hz | 35 | % | 100 | % | 29 | C |
| 941) | 1/7/2010 | 1:34:18 | PM | 205 | V | 220 | V | 50.6 | Hz | 40 | % | 100 | % | 29 | C |
| 942) | 1/7/2010 | 1:34:20 | PM | 205 | V | 220 | V | 50.6 | Hz | 36 | % | 100 | % | 29 | C |
| 943) | 1/7/2010 | 1:34:22 | PM | 205 | V | 220 | V | 50.6 | Hz | 36 | % | 100 | % | 29 | C |
| 944) | 1/7/2010 | 1:34:24 | PM | 205 | V | 220 | V | 50.5 | Hz | 34 | % | 100 | % | 29 | C |
| 945) | 1/7/2010 | 1:34:26 | PM | 205 | V | 220 | V | 50.6 | Hz | 36 | % | 100 | % | 29 | C |
| 946) | 1/7/2010 | 1:34:28 | PM | 205 | V | 220 | V | 50.6 | Hz | 36 | % | 100 | % | 29 | C |
| 947) | 1/7/2010 | 1:34:31 | PM | 205 | V | 220 | V | 50.5 | Hz | 37 | % | 100 | % | 29 | C |
| 948) | 1/7/2010 | 1:34:33 | PM | 204 | V | 220 | V | 50.6 | Hz | 37 | % | 100 | % | 29 | C |
| 949) | 1/7/2010 | 1:34:35 | PM | 205 | V | 220 | V | 50.6 | Hz | 39 | % | 100 | % | 29 | C |
| 950) | 1/7/2010 | 1:34:37 | PM | 204 | V | 220 | V | 50.5 | Hz | 36 | % | 100 | % | 29 | C |
| 951) | 1/7/2010 | 1:34:39 | PM | 204 | V | 220 | V | 50.5 | Hz | 38 | % | 100 | % | 29 | C |

FIG. 7 - 32

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 952) | 1/7/2010 | 1:34:41 | PM | 205 | V | 220 | V | 50.6 | Hz | 37 | % | 100 | % | 29 | C |
| 953) | 1/7/2010 | 1:34:43 | PM | 205 | V | 220 | V | 50.6 | Hz | 34 | % | 100 | % | 29 | C |
| 954) | 1/7/2010 | 1:34:45 | PM | 204 | V | 220 | V | 50.5 | Hz | 34 | % | 100 | % | 29 | C |
| 955) | 1/7/2010 | 1:34:47 | PM | 205 | V | 219 | V | 50.6 | Hz | 35 | % | 100 | % | 29 | C |
| 956) | 1/7/2010 | 1:34:49 | PM | 205 | V | 220 | V | 50.6 | Hz | 34 | % | 100 | % | 29 | C |
| 958) | 1/7/2010 | 1:34:53 | PM | 205 | V | 220 | V | 50.5 | Hz | 36 | % | 100 | % | 29 | C |
| 959) | 1/7/2010 | 1:34:55 | PM | 205 | V | 220 | V | 50.6 | Hz | 37 | % | 100 | % | 29 | C |
| 960) | 1/7/2010 | 1:34:57 | PM | 205 | V | 220 | V | 50.5 | Hz | 38 | % | 100 | % | 29 | C |
| 961) | 1/7/2010 | 1:34:59 | PM | 205 | V | 220 | V | 50.5 | Hz | 38 | % | 100 | % | 29 | C |
| 962) | 1/7/2010 | 1:35:02 | PM | 205 | V | 220 | V | 50.5 | Hz | 35 | % | 100 | % | 29 | C |
| 963) | 1/7/2010 | 1:35:04 | PM | 206 | V | 219 | V | 50.5 | Hz | 36 | % | 100 | % | 30 | C |
| 964) | 1/7/2010 | 1:35:06 | PM | 206 | V | 221 | V | 50.5 | Hz | 37 | % | 100 | % | 29 | C |
| 965) | 1/7/2010 | 1:35:08 | PM | 206 | V | 220 | V | 50.5 | Hz | 36 | % | 100 | % | 29 | C |
| 966) | 1/7/2010 | 1:35:10 | PM | 205 | V | 220 | V | 50.5 | Hz | 35 | % | 100 | % | 29 | C |
| 967) | 1/7/2010 | 1:35:12 | PM | 204 | V | 220 | V | 50.6 | Hz | 36 | % | 100 | % | 29 | C |
| 968) | 1/7/2010 | 1:35:14 | PM | 205 | V | 220 | V | 50.5 | Hz | 36 | % | 100 | % | 29 | C |
| 969) | 1/7/2010 | 1:35:16 | PM | 205 | V | 220 | V | 50.5 | Hz | 37 | % | 100 | % | 29 | C |
| 970) | 1/7/2010 | 1:35:18 | PM | 205 | V | 220 | V | 50.5 | Hz | 37 | % | 100 | % | 29 | C |
| 971) | 1/7/2010 | 1:35:20 | PM | 205 | V | 220 | V | 50.5 | Hz | 36 | % | 100 | % | 29 | C |
| 972) | 1/7/2010 | 1:35:22 | PM | 205 | V | 220 | V | 50.6 | Hz | 35 | % | 100 | % | 29 | C |
| 973) | 1/7/2010 | 1:35:24 | PM | 204 | V | 220 | V | 50.5 | Hz | 39 | % | 100 | % | 29 | C |
| 974) | 1/7/2010 | 1:35:26 | PM | 205 | V | 220 | V | 50.5 | Hz | 34 | % | 100 | % | 29 | C |
| 975) | 1/7/2010 | 1:35:28 | PM | 205 | V | 220 | V | 50.6 | Hz | 34 | % | 100 | % | 29 | C |
| 976) | 1/7/2010 | 1:35:30 | PM | 204 | V | 220 | V | 50.5 | Hz | 34 | % | 100 | % | 29 | C |
| 977) | 1/7/2010 | 1:35:33 | PM | 205 | V | 221 | V | 50.6 | Hz | 36 | % | 100 | % | 29 | C |
| 978) | 1/7/2010 | 1:35:35 | PM | 205 | V | 220 | V | 50.5 | Hz | 37 | % | 100 | % | 29 | C |
| 979) | 1/7/2010 | 1:35:37 | PM | 205 | V | 220 | V | 50.6 | Hz | 38 | % | 100 | % | 29 | C |
| 980) | 1/7/2010 | 1:35:39 | PM | 204 | V | 221 | V | 50.5 | Hz | 35 | % | 100 | % | 29 | C |
| 981) | 1/7/2010 | 1:35:41 | PM | 204 | V | 220 | V | 50.6 | Hz | 36 | % | 100 | % | 29 | C |

FIG. 7 - 33

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 982) | 1/7/2010 | 1:35:43 | PM | 204 | V | 220 | V | 50.6 | Hz | 36 | % | 100 | % | 29 | C |
| 983) | 1/7/2010 | 1:35:45 | PM | 204 | V | 220 | V | 50.6 | Hz | 36 | % | 100 | % | 29 | C |
| 984) | 1/7/2010 | 1:35:47 | PM | 204 | V | 220 | V | 50.5 | Hz | 34 | % | 100 | % | 29 | C |
| 985) | 1/7/2010 | 1:35:49 | PM | 204 | V | 220 | V | 50.5 | Hz | 34 | % | 100 | % | 29 | C |
| 986) | 1/7/2010 | 1:35:51 | PM | 204 | V | 220 | V | 50.6 | Hz | 35 | % | 100 | % | 29 | C |
| 987) | 1/7/2010 | 1:35:53 | PM | 204 | V | 221 | V | 50.5 | Hz | 34 | % | 100 | % | 29 | C |
| 988) | 1/7/2010 | 1:35:55 | PM | 206 | V | 220 | V | 50.6 | Hz | 36 | % | 100 | % | 29 | C |
| 989) | 1/7/2010 | 1:35:57 | PM | 205 | V | 221 | V | 50.6 | Hz | 36 | % | 100 | % | 29 | C |
| 990) | 1/7/2010 | 1:35:59 | PM | 206 | V | 220 | V | 50.6 | Hz | 37 | % | 100 | % | 29 | C |
| 991) | 1/7/2010 | 1:36:01 | PM | 205 | V | 220 | V | 50.5 | Hz | 37 | % | 100 | % | 30 | C |
| 992) | 1/7/2010 | 1:36:04 | PM | 207 | V | 220 | V | 50.5 | Hz | 40 | % | 100 | % | 29 | C |
| 993) | 1/7/2010 | 1:36:06 | PM | 205 | V | 220 | V | 50.5 | Hz | 34 | % | 100 | % | 29 | C |
| 994) | 1/7/2010 | 1:36:08 | PM | 205 | V | 220 | V | 50.6 | Hz | 35 | % | 100 | % | 29 | C |
| 995) | 1/7/2010 | 1:36:10 | PM | 205 | V | 220 | V | 50.5 | Hz | 33 | % | 100 | % | 29 | C |
| 996) | 1/7/2010 | 1:36:12 | PM | 204 | V | 221 | V | 50.5 | Hz | 36 | % | 100 | % | 30 | C |
| 998) | 1/7/2010 | 1:36:16 | PM | 205 | V | 220 | V | 50.5 | Hz | 39 | % | 100 | % | 29 | C |
| 999) | 1/7/2010 | 1:36:18 | PM | 205 | V | 220 | V | 50.5 | Hz | 35 | % | 100 | % | 29 | C |
| 1000) | 1/7/2010 | 1:36:20 | PM | 207 | V | 220 | V | 50.6 | Hz | 38 | % | 100 | % | 29 | C |
| 1001) | 1/7/2010 | 1:36:22 | PM | 207 | V | 220 | V | 50.5 | Hz | 38 | % | 100 | % | 30 | C |
| 1002) | 1/7/2010 | 1:36:24 | PM | 206 | V | 220 | V | 50.5 | Hz | 34 | % | 100 | % | 30 | C |
| 1003) | 1/7/2010 | 1:36:26 | PM | 207 | V | 221 | V | 50.5 | Hz | 35 | % | 100 | % | 30 | C |
| 1004) | 1/7/2010 | 1:36:28 | PM | 207 | V | 220 | V | 50.6 | Hz | 37 | % | 100 | % | 29 | C |
| 1005) | 1/7/2010 | 1:36:30 | PM | 205 | V | 221 | V | 50.5 | Hz | 39 | % | 100 | % | 29 | C |
| 1006) | 1/7/2010 | 1:36:32 | PM | 205 | V | 220 | V | 50.6 | Hz | 37 | % | 100 | % | 29 | C |
| 1007) | 1/7/2010 | 1:36:35 | PM | 207 | V | 220 | V | 50.5 | Hz | 38 | % | 100 | % | 29 | C |
| 1008) | 1/7/2010 | 1:36:37 | PM | 206 | V | 220 | V | 50.6 | Hz | 36 | % | 100 | % | 29 | C |
| 1009) | 1/7/2010 | 1:36:39 | PM | 204 | V | 220 | V | 50.6 | Hz | 36 | % | 100 | % | 29 | C |
| 1010) | 1/7/2010 | 1:36:41 | PM | 205 | V | 221 | V | 50.6 | Hz | 35 | % | 100 | % | 30 | C |
| 1011) | 1/7/2010 | 1:36:43 | PM | 206 | V | 221 | V | 50.5 | Hz | 37 | % | 100 | % | 30 | C |

FIG. 7 - 34

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1012) | 1/7/2010 | 1:36:45 | PM | 205 | V | 221 | V | 50.5 | Hz | 38 | % | 100 | % | 30 | C |
| 1013) | 1/7/2010 | 1:36:47 | PM | 205 | V | 221 | V | 50.5 | Hz | 36 | % | 100 | % | 30 | C |
| 1014) | 1/7/2010 | 1:36:49 | PM | 207 | V | 220 | V | 50.6 | Hz | 36 | % | 100 | % | 30 | C |
| 1015) | 1/7/2010 | 1:36:51 | PM | 204 | V | 220 | V | 50.5 | Hz | 36 | % | 100 | % | 30 | C |
| 1016) | 1/7/2010 | 1:36:53 | PM | 205 | V | 220 | V | 50.5 | Hz | 37 | % | 100 | % | 29 | C |
| 1017) | 1/7/2010 | 1:36:55 | PM | 205 | V | 220 | V | 50.6 | Hz | 37 | % | 100 | % | 29 | C |
| 1018) | 1/7/2010 | 1:36:57 | PM | 205 | V | 220 | V | 50.6 | Hz | 37 | % | 100 | % | 30 | C |
| 1019) | 1/7/2010 | 1:36:59 | PM | 204 | V | 221 | V | 50.5 | Hz | 37 | % | 100 | % | 30 | C |
| 1020) | 1/7/2010 | 1:37:01 | PM | 204 | V | 221 | V | 50.5 | Hz | 34 | % | 100 | % | 30 | C |
| 1021) | 1/7/2010 | 1:37:03 | PM | 204 | V | 221 | V | 50.5 | Hz | 35 | % | 100 | % | 30 | C |
| 1022) | 1/7/2010 | 1:37:06 | PM | 205 | V | 220 | V | 50.6 | Hz | 37 | % | 100 | % | 30 | C |
| 1023) | 1/7/2010 | 1:37:08 | PM | 206 | V | 220 | V | 50.5 | Hz | 36 | % | 100 | % | 30 | C |
| 1024) | 1/7/2010 | 1:37:10 | PM | 206 | V | 220 | V | 50.6 | Hz | 36 | % | 100 | % | 30 | C |
| 1025) | 1/7/2010 | 1:37:12 | PM | 204 | V | 220 | V | 50.6 | Hz | 34 | % | 100 | % | 30 | C |
| 1026) | 1/7/2010 | 1:37:14 | PM | 206 | V | 220 | V | 50.6 | Hz | 36 | % | 100 | % | 29 | C |
| 1027) | 1/7/2010 | 1:37:16 | PM | 205 | V | 220 | V | 50.6 | Hz | 34 | % | 100 | % | 30 | C |
| 1028) | 1/7/2010 | 1:37:18 | PM | 205 | V | 220 | V | 50.6 | Hz | 34 | % | 100 | % | 30 | C |
| 1029) | 1/7/2010 | 1:37:20 | PM | 205 | V | 221 | V | 50.6 | Hz | 36 | % | 100 | % | 30 | C |
| 1030) | 1/7/2010 | 1:37:22 | PM | 205 | V | 220 | V | 50.6 | Hz | 36 | % | 100 | % | 30 | C |
| 1031) | 1/7/2010 | 1:37:24 | PM | 206 | V | 220 | V | 50.5 | Hz | 37 | % | 100 | % | 30 | C |
| 1032) | 1/7/2010 | 1:37:26 | PM | 208 | V | 220 | V | 50.6 | Hz | 37 | % | 100 | % | 30 | C |
| 1033) | 1/7/2010 | 1:37:28 | PM | 206 | V | 220 | V | 50.5 | Hz | 38 | % | 100 | % | 30 | C |
| 1034) | 1/7/2010 | 1:37:30 | PM | 205 | V | 220 | V | 50.6 | Hz | 35 | % | 100 | % | 29 | C |
| 1035) | 1/7/2010 | 1:37:32 | PM | 206 | V | 220 | V | 50.6 | Hz | 37 | % | 100 | % | 30 | C |
| 1036) | 1/7/2010 | 1:37:34 | PM | 205 | V | 221 | V | 50.6 | Hz | 34 | % | 100 | % | 30 | C |
| 1038) | 1/7/2010 | 1:37:39 | PM | 205 | V | 220 | V | 50.5 | Hz | 38 | % | 100 | % | 30 | C |
| 1039) | 1/7/2010 | 1:37:41 | PM | 206 | V | 221 | V | 50.6 | Hz | 39 | % | 100 | % | 30 | C |
| 1040) | 1/7/2010 | 1:37:43 | PM | 205 | V | 220 | V | 50.6 | Hz | 38 | % | 100 | % | 30 | C |
| 1041) | 1/7/2010 | 1:37:45 | PM | 204 | V | 220 | V | 50.6 | Hz | 38 | % | 100 | % | 30 | C |

FIG. 7 - 35

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1042) | 1/7/2010 | 1:37:47 | PM | 206 | V | 220 | V | 50.5 | Hz | 38 | % | 100 | % | 30 | C |
| 1043) | 1/7/2010 | 1:37:49 | PM | 206 | V | 220 | V | 50.5 | Hz | 37 | % | 100 | % | 30 | C |
| 1044) | 1/7/2010 | 1:37:51 | PM | 207 | V | 220 | V | 50.6 | Hz | 34 | % | 100 | % | 30 | C |
| 1045) | 1/7/2010 | 1:37:53 | PM | 207 | V | 220 | V | 50.5 | Hz | 34 | % | 100 | % | 30 | C |
| 1046) | 1/7/2010 | 1:37:55 | PM | 208 | V | 220 | V | 50.6 | Hz | 36 | % | 100 | % | 30 | C |
| 1047) | 1/7/2010 | 1:37:57 | PM | 208 | V | 220 | V | 50.5 | Hz | 37 | % | 100 | % | 30 | C |
| 1048) | 1/7/2010 | 1:37:59 | PM | 208 | V | 220 | V | 50.5 | Hz | 37 | % | 100 | % | 30 | C |
| 1049) | 1/7/2010 | 1:38:01 | PM | 208 | V | 220 | V | 50.6 | Hz | 38 | % | 100 | % | 30 | C |
| 1050) | 1/7/2010 | 1:38:03 | PM | 206 | V | 220 | V | 50.5 | Hz | 38 | % | 100 | % | 30 | C |
| 1051) | 1/7/2010 | 1:38:05 | PM | 208 | V | 220 | V | 50.6 | Hz | 37 | % | 100 | % | 30 | C |
| 1052) | 1/7/2010 | 1:38:08 | PM | 207 | V | 221 | V | 50.6 | Hz | 35 | % | 100 | % | 30 | C |
| 1053) | 1/7/2010 | 1:38:10 | PM | 207 | V | 220 | V | 50.6 | Hz | 34 | % | 100 | % | 30 | C |
| 1054) | 1/7/2010 | 1:38:12 | PM | 208 | V | 221 | V | 50.6 | Hz | 38 | % | 100 | % | 30 | C |
| 1055) | 1/7/2010 | 1:38:14 | PM | 207 | V | 221 | V | 50.5 | Hz | 36 | % | 100 | % | 30 | C |
| 1056) | 1/7/2010 | 1:38:16 | PM | 205 | V | 220 | V | 50.5 | Hz | 36 | % | 100 | % | 30 | C |
| 1057) | 1/7/2010 | 1:38:18 | PM | 206 | V | 220 | V | 50.6 | Hz | 35 | % | 100 | % | 30 | C |
| 1058) | 1/7/2010 | 1:38:20 | PM | 206 | V | 220 | V | 50.5 | Hz | 36 | % | 100 | % | 30 | C |
| 1059) | 1/7/2010 | 1:38:22 | PM | 207 | V | 220 | V | 50.5 | Hz | 36 | % | 100 | % | 30 | C |
| 1060) | 1/7/2010 | 1:38:24 | PM | 208 | V | 220 | V | 50.5 | Hz | 37 | % | 100 | % | 30 | C |
| 1061) | 1/7/2010 | 1:38:26 | PM | 207 | V | 220 | V | 50.5 | Hz | 39 | % | 100 | % | 30 | C |
| 1062) | 1/7/2010 | 1:38:28 | PM | 208 | V | 220 | V | 50.5 | Hz | 38 | % | 100 | % | 30 | C |
| 1063) | 1/7/2010 | 1:38:30 | PM | 208 | V | 221 | V | 50.6 | Hz | 37 | % | 100 | % | 30 | C |
| 1064) | 1/7/2010 | 1:38:32 | PM | 207 | V | 220 | V | 50.5 | Hz | 38 | % | 100 | % | 30 | C |
| 1065) | 1/7/2010 | 1:38:34 | PM | 208 | V | 220 | V | 50.6 | Hz | 36 | % | 100 | % | 30 | C |
| 1066) | 1/7/2010 | 1:38:36 | PM | 207 | V | 220 | V | 50.6 | Hz | 36 | % | 100 | % | 30 | C |
| 1067) | 1/7/2010 | 1:38:39 | PM | 206 | V | 220 | V | 50.6 | Hz | 33 | % | 100 | % | 30 | C |
| 1068) | 1/7/2010 | 1:38:41 | PM | 208 | V | 220 | V | 50.6 | Hz | 35 | % | 100 | % | 30 | C |
| 1069) | 1/7/2010 | 1:38:43 | PM | 207 | V | 220 | V | 50.6 | Hz | 35 | % | 100 | % | 30 | C |
| 1070) | 1/7/2010 | 1:38:45 | PM | 208 | V | 220 | V | 50.6 | Hz | 34 | % | 100 | % | 30 | C |

FIG. 7 - 36

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1071) | 1/7/2010 | 1:38:47 | PM | 208 | V | 220 | V | 50.5 | Hz | 34 | % | 100 | % | 30 | C |
| 1072) | 1/7/2010 | 1:38:49 | PM | 208 | V | 220 | V | 50.6 | Hz | 36 | % | 100 | % | 30 | C |
| 1073) | 1/7/2010 | 1:38:51 | PM | 208 | V | 220 | V | 50.5 | Hz | 34 | % | 100 | % | 30 | C |
| 1074) | 1/7/2010 | 1:38:53 | PM | 207 | V | 220 | V | 50.6 | Hz | 36 | % | 100 | % | 30 | C |
| 1075) | 1/7/2010 | 1:38:55 | PM | 204 | V | 220 | V | 50.6 | Hz | 34 | % | 100 | % | 30 | C |
| 1076) | 1/7/2010 | 1:38:57 | PM | 205 | V | 221 | V | 50.6 | Hz | 34 | % | 100 | % | 30 | C |
| 1078) | 1/7/2010 | 1:39:01 | PM | 207 | V | 220 | V | 50.6 | Hz | 34 | % | 100 | % | 30 | C |
| 1079) | 1/7/2010 | 1:39:03 | PM | 204 | V | 221 | V | 50.6 | Hz | 37 | % | 100 | % | 30 | C |
| 1080) | 1/7/2010 | 1:39:05 | PM | 205 | V | 220 | V | 50.6 | Hz | 35 | % | 100 | % | 30 | C |
| 1081) | 1/7/2010 | 1:39:07 | PM | 207 | V | 221 | V | 50.5 | Hz | 36 | % | 100 | % | 30 | C |
| 1082) | 1/7/2010 | 1:39:10 | PM | 204 | V | 221 | V | 50.6 | Hz | 36 | % | 100 | % | 30 | C |
| 1083) | 1/7/2010 | 1:39:12 | PM | 204 | V | 221 | V | 50.6 | Hz | 36 | % | 100 | % | 30 | C |
| 1084) | 1/7/2010 | 1:39:14 | PM | 204 | V | 221 | V | 50.5 | Hz | 36 | % | 100 | % | 30 | C |
| 1085) | 1/7/2010 | 1:39:16 | PM | 204 | V | 221 | V | 50.6 | Hz | 36 | % | 100 | % | 30 | C |
| 1086) | 1/7/2010 | 1:39:18 | PM | 205 | V | 220 | V | 50.6 | Hz | 36 | % | 100 | % | 30 | C |
| 1087) | 1/7/2010 | 1:39:20 | PM | 204 | V | 220 | V | 50.6 | Hz | 39 | % | 100 | % | 30 | C |
| 1088) | 1/7/2010 | 1:39:22 | PM | 204 | V | 220 | V | 50.6 | Hz | 38 | % | 100 | % | 30 | C |
| 1089) | 1/7/2010 | 1:39:24 | PM | 202 | V | 220 | V | 50.6 | Hz | 36 | % | 100 | % | 30 | C |
| 1090) | 1/7/2010 | 1:39:26 | PM | 203 | V | 220 | V | 50.6 | Hz | 36 | % | 100 | % | 30 | C |
| 1091) | 1/7/2010 | 1:39:28 | PM | 205 | V | 220 | V | 50.6 | Hz | 35 | % | 100 | % | 30 | C |
| 1092) | 1/7/2010 | 1:39:30 | PM | 205 | V | 220 | V | 50.6 | Hz | 35 | % | 100 | % | 30 | C |
| 1093) | 1/7/2010 | 1:39:32 | PM | 204 | V | 220 | V | 50.6 | Hz | 36 | % | 100 | % | 30 | C |
| 1094) | 1/7/2010 | 1:39:34 | PM | 204 | V | 220 | V | 50.5 | Hz | 34 | % | 100 | % | 30 | C |
| 1095) | 1/7/2010 | 1:39:36 | PM | 205 | V | 220 | V | 50.6 | Hz | 34 | % | 100 | % | 30 | C |
| 1096) | 1/7/2010 | 1:39:38 | PM | 202 | V | 221 | V | 50.6 | Hz | 35 | % | 100 | % | 29 | C |
| 1097) | 1/7/2010 | 1:39:41 | PM | 204 | V | 220 | V | 50.6 | Hz | 38 | % | 100 | % | 30 | C |
| 1098) | 1/7/2010 | 1:39:43 | PM | 205 | V | 220 | V | 50.6 | Hz | 36 | % | 100 | % | 30 | C |
| 1099) | 1/7/2010 | 1:39:45 | PM | 205 | V | 220 | V | 50.5 | Hz | 35 | % | 100 | % | 30 | C |
| 1100) | 1/7/2010 | 1:39:47 | PM | 204 | V | 220 | V | 50.5 | Hz | 35 | % | 100 | % | 30 | C |

FIG. 7 - 37

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1101) | 1/7/2010 | 1:39:49 | PM | 205 | V | 220 | V | 50.5 | Hz | 37 | % | 100 | % | 30 | C |
| 1102) | 1/7/2010 | 1:39:51 | PM | 204 | V | 220 | V | 50.5 | Hz | 39 | % | 100 | % | 30 | C |
| 1103) | 1/7/2010 | 1:39:53 | PM | 205 | V | 220 | V | 50.5 | Hz | 36 | % | 100 | % | 30 | C |
| 1104) | 1/7/2010 | 1:39:55 | PM | 204 | V | 220 | V | 50.5 | Hz | 36 | % | 100 | % | 30 | C |
| 1105) | 1/7/2010 | 1:39:57 | PM | 205 | V | 220 | V | 50.5 | Hz | 34 | % | 100 | % | 30 | C |
| 1106) | 1/7/2010 | 1:39:59 | PM | 204 | V | 221 | V | 50.6 | Hz | 34 | % | 100 | % | 30 | C |
| 1107) | 1/7/2010 | 1:40:01 | PM | 205 | V | 220 | V | 50.6 | Hz | 34 | % | 100 | % | 30 | C |
| 1108) | 1/7/2010 | 1:40:03 | PM | 205 | V | 220 | V | 50.6 | Hz | 34 | % | 100 | % | 30 | C |
| 1109) | 1/7/2010 | 1:40:05 | PM | 204 | V | 220 | V | 50.6 | Hz | 34 | % | 100 | % | 30 | C |
| 1110) | 1/7/2010 | 1:40:07 | PM | 204 | V | 220 | V | 50.6 | Hz | 34 | % | 100 | % | 30 | C |
| 1111) | 1/7/2010 | 1:40:09 | PM | 203 | V | 220 | V | 50.6 | Hz | 34 | % | 100 | % | 30 | C |
| 1112) | 1/7/2010 | 1:40:12 | PM | 205 | V | 220 | V | 50.6 | Hz | 36 | % | 100 | % | 30 | C |
| 1113) | 1/7/2010 | 1:40:14 | PM | 204 | V | 220 | V | 50.6 | Hz | 36 | % | 100 | % | 30 | C |
| 1114) | 1/7/2010 | 1:40:16 | PM | 205 | V | 220 | V | 50.6 | Hz | 36 | % | 100 | % | 30 | C |
| 1115) | 1/7/2010 | 1:40:18 | PM | 205 | V | 220 | V | 50.6 | Hz | 36 | % | 100 | % | 30 | C |
| 1116) | 1/7/2010 | 1:40:20 | PM | 204 | V | 220 | V | 50.6 | Hz | 38 | % | 100 | % | 30 | C |
| 1118) | 1/7/2010 | 1:40:24 | PM | 205 | V | 221 | V | 50.6 | Hz | 36 | % | 100 | % | 30 | C |
| 1119) | 1/7/2010 | 1:40:26 | PM | 204 | V | 221 | V | 50.6 | Hz | 36 | % | 100 | % | 30 | C |
| 1120) | 1/7/2010 | 1:40:28 | PM | 204 | V | 221 | V | 50.6 | Hz | 36 | % | 100 | % | 30 | C |
| 1121) | 1/7/2010 | 1:40:30 | PM | 204 | V | 221 | V | 50.6 | Hz | 35 | % | 100 | % | 30 | C |
| 1122) | 1/7/2010 | 1:40:32 | PM | 205 | V | 221 | V | 50.6 | Hz | 34 | % | 100 | % | 30 | C |
| 1123) | 1/7/2010 | 1:40:34 | PM | 204 | V | 221 | V | 50.6 | Hz | 34 | % | 100 | % | 30 | C |
| 1124) | 1/7/2010 | 1:40:36 | PM | 204 | V | 220 | V | 50.6 | Hz | 34 | % | 100 | % | 30 | C |
| 1125) | 1/7/2010 | 1:40:38 | PM | 202 | V | 220 | V | 50.6 | Hz | 35 | % | 100 | % | 30 | C |
| 1126) | 1/7/2010 | 1:40:40 | PM | 205 | V | 221 | V | 50.6 | Hz | 36 | % | 100 | % | 30 | C |
| 1127) | 1/7/2010 | 1:40:43 | PM | 205 | V | 220 | V | 50.6 | Hz | 36 | % | 100 | % | 30 | C |
| 1128) | 1/7/2010 | 1:40:45 | PM | 204 | V | 220 | V | 50.6 | Hz | 38 | % | 100 | % | 30 | C |
| 1129) | 1/7/2010 | 1:40:47 | PM | 204 | V | 220 | V | 50.6 | Hz | 35 | % | 100 | % | 30 | C |
| 1130) | 1/7/2010 | 1:40:49 | PM | 202 | V | 220 | V | 50.6 | Hz | 36 | % | 100 | % | 30 | C |

FIG. 7 - 38

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1131) | 1/7/2010 | 1:40:51 | PM | 202 | V | 220 | V | 50.6 | Hz | 35 | % | 100 | % | 30 | C |
| 1132) | 1/7/2010 | 1:40:53 | PM | 202 | V | 220 | V | 50.6 | Hz | 35 | % | 100 | % | 30 | C |
| 1133) | 1/7/2010 | 1:40:55 | PM | 204 | V | 220 | V | 50.5 | Hz | 36 | % | 100 | % | 29 | C |
| 1134) | 1/7/2010 | 1:40:57 | PM | 204 | V | 220 | V | 50.6 | Hz | 35 | % | 100 | % | 30 | C |
| 1135) | 1/7/2010 | 1:40:59 | PM | 205 | V | 220 | V | 50.6 | Hz | 35 | % | 100 | % | 30 | C |
| 1136) | 1/7/2010 | 1:41:01 | PM | 204 | V | 220 | V | 50.6 | Hz | 34 | % | 100 | % | 30 | C |
| 1137) | 1/7/2010 | 1:41:03 | PM | 204 | V | 220 | V | 50.6 | Hz | 34 | % | 100 | % | 30 | C |
| 1138) | 1/7/2010 | 1:41:05 | PM | 204 | V | 220 | V | 50.6 | Hz | 34 | % | 100 | % | 30 | C |
| 1139) | 1/7/2010 | 1:41:07 | PM | 204 | V | 220 | V | 50.6 | Hz | 34 | % | 100 | % | 30 | C |
| 1140) | 1/7/2010 | 1:41:09 | PM | 204 | V | 220 | V | 50.6 | Hz | 36 | % | 100 | % | 30 | C |
| 1141) | 1/7/2010 | 1:41:11 | PM | 206 | V | 220 | V | 50.6 | Hz | 35 | % | 100 | % | 30 | C |
| 1142) | 1/7/2010 | 1:41:14 | PM | 207 | V | 220 | V | 50.6 | Hz | 35 | % | 100 | % | 30 | C |
| 1143) | 1/7/2010 | 1:41:16 | PM | 204 | V | 221 | V | 50.6 | Hz | 36 | % | 100 | % | 30 | C |
| 1144) | 1/7/2010 | 1:41:18 | PM | 204 | V | 220 | V | 50.6 | Hz | 36 | % | 100 | % | 30 | C |
| 1145) | 1/7/2010 | 1:41:20 | PM | 204 | V | 220 | V | 50.6 | Hz | 36 | % | 100 | % | 30 | C |
| 1146) | 1/7/2010 | 1:41:22 | PM | 204 | V | 221 | V | 50.6 | Hz | 38 | % | 100 | % | 30 | C |
| 1147) | 1/7/2010 | 1:41:24 | PM | 204 | V | 220 | V | 50.6 | Hz | 36 | % | 100 | % | 30 | C |
| 1148) | 1/7/2010 | 1:41:26 | PM | 204 | V | 220 | V | 50.6 | Hz | 36 | % | 100 | % | 30 | C |
| 1149) | 1/7/2010 | 1:41:28 | PM | 204 | V | 220 | V | 50.6 | Hz | 34 | % | 100 | % | 30 | C |
| 1150) | 1/7/2010 | 1:41:30 | PM | 202 | V | 221 | V | 50.6 | Hz | 34 | % | 100 | % | 30 | C |
| 1151) | 1/7/2010 | 1:41:32 | PM | 205 | V | 219 | V | 50.6 | Hz | 34 | % | 100 | % | 30 | C |
| 1152) | 1/7/2010 | 1:41:34 | PM | 205 | V | 220 | V | 50.6 | Hz | 35 | % | 100 | % | 30 | C |
| 1153) | 1/7/2010 | 1:41:36 | PM | 204 | V | 220 | V | 50.6 | Hz | 34 | % | 100 | % | 30 | C |
| 1154) | 1/7/2010 | 1:41:38 | PM | 204 | V | 220 | V | 50.6 | Hz | 37 | % | 100 | % | 30 | C |
| 1155) | 1/7/2010 | 1:41:40 | PM | 206 | V | 220 | V | 50.6 | Hz | 34 | % | 100 | % | 30 | C |
| 1156) | 1/7/2010 | 1:41:42 | PM | 208 | V | 220 | V | 50.6 | Hz | 34 | % | 100 | % | 30 | C |
| 1158) | 1/7/2010 | 1:41:46 | PM | 206 | V | 220 | V | 50.6 | Hz | 35 | % | 100 | % | 30 | C |
| 1159) | 1/7/2010 | 1:41:48 | PM | 207 | V | 220 | V | 50.6 | Hz | 37 | % | 100 | % | 30 | C |
| 1160) | 1/7/2010 | 1:41:50 | PM | 205 | V | 220 | V | 50.6 | Hz | 36 | % | 100 | % | 30 | C |

FIG. 7 - 39

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1161) | 1/7/2010 | 1:41:52 | PM | 207 | V | 220 | V | 50.6 | Hz | 36 | % | 100 | % | 30 | C |
| 1162) | 1/7/2010 | 1:41:54 | PM | 205 | V | 220 | V | 50.6 | Hz | 36 | % | 100 | % | 30 | C |
| 1163) | 1/7/2010 | 1:41:56 | PM | 207 | V | 220 | V | 50.6 | Hz | 36 | % | 100 | % | 30 | C |
| 1164) | 1/7/2010 | 1:41:58 | PM | 205 | V | 221 | V | 50.6 | Hz | 34 | % | 100 | % | 30 | C |
| 1165) | 1/7/2010 | 1:42:00 | PM | 205 | V | 220 | V | 50.6 | Hz | 35 | % | 100 | % | 30 | C |
| 1166) | 1/7/2010 | 1:42:02 | PM | 205 | V | 220 | V | 50.6 | Hz | 34 | % | 100 | % | 30 | C |
| 1167) | 1/7/2010 | 1:42:04 | PM | 205 | V | 221 | V | 50.6 | Hz | 36 | % | 100 | % | 30 | C |
| 1168) | 1/7/2010 | 1:42:06 | PM | 205 | V | 220 | V | 50.6 | Hz | 36 | % | 100 | % | 30 | C |
| 1169) | 1/7/2010 | 1:42:08 | PM | 204 | V | 221 | V | 50.6 | Hz | 34 | % | 100 | % | 30 | C |
| 1170) | 1/7/2010 | 1:42:10 | PM | 207 | V | 221 | V | 50.6 | Hz | 34 | % | 100 | % | 30 | C |
| 1171) | 1/7/2010 | 1:42:12 | PM | 207 | V | 221 | V | 50.5 | Hz | 34 | % | 100 | % | 30 | C |
| 1172) | 1/7/2010 | 1:42:14 | PM | 206 | V | 221 | V | 50.6 | Hz | 34 | % | 100 | % | 30 | C |
| 1173) | 1/7/2010 | 1:42:17 | PM | 207 | V | 220 | V | 50.6 | Hz | 34 | % | 100 | % | 30 | C |
| 1174) | 1/7/2010 | 1:42:19 | PM | 207 | V | 220 | V | 50.6 | Hz | 34 | % | 100 | % | 30 | C |
| 1175) | 1/7/2010 | 1:42:21 | PM | 207 | V | 220 | V | 50.6 | Hz | 34 | % | 100 | % | 30 | C |
| 1176) | 1/7/2010 | 1:42:23 | PM | 207 | V | 219 | V | 50.5 | Hz | 34 | % | 100 | % | 30 | C |
| 1177) | 1/7/2010 | 1:42:25 | PM | 207 | V | 220 | V | 50.6 | Hz | 34 | % | 100 | % | 30 | C |
| 1178) | 1/7/2010 | 1:42:27 | PM | 207 | V | 221 | V | 50.6 | Hz | 35 | % | 100 | % | 30 | C |
| 1179) | 1/7/2010 | 1:42:29 | PM | 207 | V | 220 | V | 50.6 | Hz | 34 | % | 100 | % | 30 | C |
| 1180) | 1/7/2010 | 1:42:33 | PM | 207 | V | 221 | V | 50.6 | Hz | 38 | % | 100 | % | 30 | C |
| 1181) | 1/7/2010 | 1:42:35 | PM | 207 | V | 221 | V | 50.5 | Hz | 36 | % | 100 | % | 30 | C |
| 1182) | 1/7/2010 | 1:42:37 | PM | 206 | V | 221 | V | 50.6 | Hz | 39 | % | 100 | % | 30 | C |
| 1183) | 1/7/2010 | 1:42:39 | PM | 206 | V | 221 | V | 50.6 | Hz | 36 | % | 100 | % | 30 | C |
| 1184) | 1/7/2010 | 1:42:41 | PM | 206 | V | 220 | V | 50.5 | Hz | 36 | % | 100 | % | 30 | C |
| 1185) | 1/7/2010 | 1:42:43 | PM | 205 | V | 220 | V | 50.6 | Hz | 34 | % | 100 | % | 30 | C |
| 1186) | 1/7/2010 | 1:42:45 | PM | 206 | V | 220 | V | 50.6 | Hz | 36 | % | 100 | % | 30 | C |
| 1187) | 1/7/2010 | 1:42:48 | PM | 207 | V | 221 | V | 50.5 | Hz | 35 | % | 100 | % | 30 | C |
| 1188) | 1/7/2010 | 1:42:50 | PM | 207 | V | 220 | V | 50.6 | Hz | 35 | % | 100 | % | 29 | C |
| 1189) | 1/7/2010 | 1:42:52 | PM | 207 | V | 221 | V | 50.6 | Hz | 36 | % | 100 | % | 30 | C |

FIG. 7 - 40

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1190) | 1/7/2010 | 1:42:54 | PM | 208 | V | 220 | V | 50.6 | Hz | 36 | % | 100 | % | 30 | C |
| 1191) | 1/7/2010 | 1:42:56 | PM | 207 | V | 220 | V | 50.5 | Hz | 38 | % | 100 | % | 30 | C |
| 1192) | 1/7/2010 | 1:42:58 | PM | 206 | V | 220 | V | 50.6 | Hz | 37 | % | 100 | % | 29 | C |
| 1193) | 1/7/2010 | 1:43:00 | PM | 207 | V | 220 | V | 50.6 | Hz | 38 | % | 100 | % | 30 | C |
| 1194) | 1/7/2010 | 1:43:02 | PM | 206 | V | 220 | V | 50.6 | Hz | 36 | % | 100 | % | 29 | C |
| 1195) | 1/7/2010 | 1:43:04 | PM | 207 | V | 221 | V | 50.5 | Hz | 35 | % | 100 | % | 30 | C |
| 1196) | 1/7/2010 | 1:43:06 | PM | 205 | V | 221 | V | 50.5 | Hz | 37 | % | 100 | % | 30 | C |
| 1198) | 1/7/2010 | 1:43:10 | PM | 205 | V | 220 | V | 50.5 | Hz | 41 | % | 100 | % | 30 | C |
| 1199) | 1/7/2010 | 1:43:12 | PM | 204 | V | 220 | V | 50.5 | Hz | 35 | % | 100 | % | 30 | C |
| 1200) | 1/7/2010 | 1:43:14 | PM | 204 | V | 220 | V | 50.5 | Hz | 42 | % | 100 | % | 30 | C |
| 1201) | 1/7/2010 | 1:43:16 | PM | 205 | V | 220 | V | 50.5 | Hz | 36 | % | 100 | % | 30 | C |
| 1202) | 1/7/2010 | 1:43:19 | PM | 205 | V | 221 | V | 50.5 | Hz | 40 | % | 100 | % | 30 | C |
| 1203) | 1/7/2010 | 1:43:21 | PM | 205 | V | 220 | V | 50.5 | Hz | 41 | % | 100 | % | 30 | C |
| 1204) | 1/7/2010 | 1:43:23 | PM | 205 | V | 221 | V | 50.5 | Hz | 37 | % | 100 | % | 30 | C |
| 1205) | 1/7/2010 | 1:43:25 | PM | 206 | V | 220 | V | 50.5 | Hz | 43 | % | 100 | % | 30 | C |
| 1206) | 1/7/2010 | 1:43:27 | PM | 206 | V | 221 | V | 50.5 | Hz | 35 | % | 100 | % | 30 | C |
| 1207) | 1/7/2010 | 1:43:29 | PM | 205 | V | 221 | V | 50.6 | Hz | 39 | % | 100 | % | 30 | C |
| 1208) | 1/7/2010 | 1:43:31 | PM | 206 | V | 220 | V | 50.5 | Hz | 40 | % | 100 | % | 30 | C |
| 1209) | 1/7/2010 | 1:43:33 | PM | 206 | V | 220 | V | 50.6 | Hz | 38 | % | 100 | % | 30 | C |
| 1210) | 1/7/2010 | 1:43:35 | PM | 204 | V | 220 | V | 50.5 | Hz | 37 | % | 100 | % | 30 | C |
| 1211) | 1/7/2010 | 1:43:37 | PM | 206 | V | 220 | V | 50.6 | Hz | 36 | % | 100 | % | 30 | C |
| 1212) | 1/7/2010 | 1:43:39 | PM | 208 | V | 220 | V | 50.5 | Hz | 36 | % | 100 | % | 30 | C |
| 1213) | 1/7/2010 | 1:43:41 | PM | 207 | V | 221 | V | 50.5 | Hz | 38 | % | 100 | % | 30 | C |
| 1214) | 1/7/2010 | 1:43:43 | PM | 208 | V | 220 | V | 50.5 | Hz | 38 | % | 100 | % | 29 | C |
| 1215) | 1/7/2010 | 1:43:45 | PM | 208 | V | 220 | V | 50.6 | Hz | 38 | % | 100 | % | 30 | C |
| 1216) | 1/7/2010 | 1:43:47 | PM | 206 | V | 220 | V | 50.5 | Hz | 36 | % | 100 | % | 30 | C |
| 1217) | 1/7/2010 | 1:43:50 | PM | 2 | V | 218 | V | 0 | Hz | 35 | % | 100 | % | 29 | C |
| 1218) | 1/7/2010 | 1:43:52 | PM | 2 | V | 218 | V | 0 | Hz | 35 | % | 100 | % | 29 | C |
| 1219) | 1/7/2010 | 1:43:54 | PM | 2 | V | 218 | V | 0 | Hz | 38 | % | 100 | % | 29 | C |

FIG. 7 - 41

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1220) | 1/7/2010 | 1:43:56 | PM | 201 | V | 218 | V | 50.5 | Hz | 43 | % | 88 | % | 29 | C |
| 1221) | 1/7/2010 | 1:43:58 | PM | 201 | V | 220 | V | 50.5 | Hz | 39 | % | 100 | % | 30 | C |
| 1222) | 1/7/2010 | 1:44:00 | PM | 201 | V | 220 | V | 50.6 | Hz | 34 | % | 100 | % | 29 | C |
| 1223) | 1/7/2010 | 1:44:02 | PM | 201 | V | 219 | V | 50.5 | Hz | 35 | % | 100 | % | 29 | C |
| 1224) | 1/7/2010 | 1:44:04 | PM | 202 | V | 219 | V | 50.5 | Hz | 36 | % | 100 | % | 28 | C |
| 1225) | 1/7/2010 | 1:44:06 | PM | 202 | V | 219 | V | 50.5 | Hz | 36 | % | 100 | % | 28 | C |
| 1226) | 1/7/2010 | 1:44:08 | PM | 203 | V | 220 | V | 50.5 | Hz | 37 | % | 100 | % | 29 | C |
| 1227) | 1/7/2010 | 1:44:10 | PM | 201 | V | 220 | V | 50.5 | Hz | 37 | % | 90 | % | 28 | C |
| 1228) | 1/7/2010 | 1:44:12 | PM | 203 | V | 219 | V | 50.5 | Hz | 35 | % | 88 | % | 30 | C |
| 1229) | 1/7/2010 | 1:44:14 | PM | 200 | V | 220 | V | 50.5 | Hz | 35 | % | 100 | % | 29 | C |
| 1230) | 1/7/2010 | 1:44:16 | PM | 202 | V | 219 | V | 0 | Hz | 35 | % | 100 | % | 29 | C |
| 1231) | 1/7/2010 | 1:44:18 | PM | 202 | V | 218 | V | 0 | Hz | 36 | % | 100 | % | 29 | C |
| 1232) | 1/7/2010 | 1:44:21 | PM | 201 | V | 218 | V | 0 | Hz | 35 | % | 100 | % | 29 | C |
| 1233) | 1/7/2010 | 1:44:23 | PM | 201 | V | 218 | V | 0 | Hz | 35 | % | 100 | % | 29 | C |
| 1234) | 1/7/2010 | 1:44:25 | PM | 201 | V | 218 | V | 0 | Hz | 35 | % | 100 | % | 29 | C |
| 1235) | 1/7/2010 | 1:44:27 | PM | 202 | V | 218 | V | 0 | Hz | 37 | % | 100 | % | 29 | C |
| 1236) | 1/7/2010 | 1:44:29 | PM | 202 | V | 218 | V | 0 | Hz | 35 | % | 100 | % | 29 | C |
| 1238) | 1/7/2010 | 1:44:33 | PM | 201 | V | 218 | V | 0 | Hz | 37 | % | 100 | % | 29 | C |
| 1239) | 1/7/2010 | 1:44:35 | PM | 202 | V | 218 | V | 0 | Hz | 37 | % | 100 | % | 29 | C |
| 1240) | 1/7/2010 | 1:44:37 | PM | 201 | V | 219 | V | 0 | Hz | 37 | % | 100 | % | 29 | C |
| 1241) | 1/7/2010 | 1:44:39 | PM | 202 | V | 218 | V | 0 | Hz | 37 | % | 100 | % | 29 | C |
| 1242) | 1/7/2010 | 1:44:41 | PM | 202 | V | 219 | V | 0 | Hz | 37 | % | 100 | % | 29 | C |
| 1243) | 1/7/2010 | 1:44:43 | PM | 201 | V | 219 | V | 0 | Hz | 37 | % | 100 | % | 29 | C |
| 1244) | 1/7/2010 | 1:44:45 | PM | 202 | V | 219 | V | 0 | Hz | 37 | % | 100 | % | 29 | C |
| 1245) | 1/7/2010 | 1:44:47 | PM | 202 | V | 219 | V | 0 | Hz | 35 | % | 100 | % | 29 | C |
| 1246) | 1/7/2010 | 1:44:49 | PM | 202 | V | 219 | V | 0 | Hz | 37 | % | 100 | % | 29 | C |
| 1247) | 1/7/2010 | 1:44:52 | PM | 201 | V | 218 | V | 0 | Hz | 35 | % | 90 | % | 29 | C |
| 1248) | 1/7/2010 | 1:44:54 | PM | 201 | V | 218 | V | 0 | Hz | 35 | % | 90 | % | 29 | C |
| 1249) | 1/7/2010 | 1:44:56 | PM | 201 | V | 218 | V | 0 | Hz | 35 | % | 90 | % | 29 | C |

FIG. 7 - 42

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1250) | 1/7/2010 | 1:44:58 | PM | 202 | V | 218 | V | 0 | Hz | 36 | % | 90 | % | 29 | C |
| 1251) | 1/7/2010 | 1:45:00 | PM | 201 | V | 218 | V | 0 | Hz | 35 | % | 90 | % | 29 | C |
| 1252) | 1/7/2010 | 1:45:02 | PM | 201 | V | 218 | V | 0 | Hz | 35 | % | 90 | % | 29 | C |
| 1253) | 1/7/2010 | 1:45:04 | PM | 201 | V | 218 | V | 0 | Hz | 35 | % | 88 | % | 29 | C |
| 1254) | 1/7/2010 | 1:45:06 | PM | 202 | V | 211 | V | 0 | Hz | 36 | % | 88 | % | 29 | C |
| 1255) | 1/7/2010 | 1:45:08 | PM | 202 | V | 218 | V | 0 | Hz | 36 | % | 88 | % | 29 | C |
| 1256) | 1/7/2010 | 1:45:10 | PM | 202 | V | 218 | V | 0 | Hz | 36 | % | 88 | % | 29 | C |
| 1257) | 1/7/2010 | 1:45:12 | PM | 202 | V | 218 | V | 0 | Hz | 35 | % | 88 | % | 29 | C |
| 1258) | 1/7/2010 | 1:45:14 | PM | 202 | V | 218 | V | 0 | Hz | 37 | % | 88 | % | 29 | C |
| 1259) | 1/7/2010 | 1:45:16 | PM | 202 | V | 218 | V | 0 | Hz | 38 | % | 87 | % | 29 | C |
| 1260) | 1/7/2010 | 1:45:18 | PM | 202 | V | 218 | V | 45.3 | Hz | 38 | % | 87 | % | 29 | C |
| 1261) | 1/7/2010 | 1:45:20 | PM | 201 | V | 219 | V | 50.6 | Hz | 36 | % | 82 | % | 29 | C |
| 1262) | 1/7/2010 | 1:45:23 | PM | 202 | V | 218 | V | 50.6 | Hz | 33 | % | 82 | % | 29 | C |
| 1263) | 1/7/2010 | 1:45:25 | PM | 202 | V | 218 | V | 50.6 | Hz | 32 | % | 82 | % | 29 | C |
| 1264) | 1/7/2010 | 1:45:27 | PM | 203 | V | 218 | V | 50.6 | Hz | 35 | % | 77 | % | 29 | C |
| 1265) | 1/7/2010 | 1:45:29 | PM | 202 | V | 218 | V | 50.6 | Hz | 33 | % | 82 | % | 29 | C |
| 1266) | 1/7/2010 | 1:45:31 | PM | 203 | V | 218 | V | 50.6 | Hz | 32 | % | 80 | % | 29 | C |
| 1267) | 1/7/2010 | 1:45:33 | PM | 208 | V | 218 | V | 50.6 | Hz | 34 | % | 83 | % | 30 | C |
| 1268) | 1/7/2010 | 1:45:35 | PM | 209 | V | 209 | V | 50.6 | Hz | 38 | % | 85 | % | 30 | C |
| 1269) | 1/7/2010 | 1:45:37 | PM | 209 | V | 219 | V | 50.6 | Hz | 35 | % | 85 | % | 30 | C |
| 1270) | 1/7/2010 | 1:45:39 | PM | 206 | V | 218 | V | 50.6 | Hz | 35 | % | 85 | % | 30 | C |
| 1271) | 1/7/2010 | 1:45:41 | PM | 206 | V | 218 | V | 50.6 | Hz | 34 | % | 87 | % | 30 | C |
| 1272) | 1/7/2010 | 1:45:43 | PM | 208 | V | 220 | V | 50.6 | Hz | 38 | % | 87 | % | 30 | C |
| 1273) | 1/7/2010 | 1:45:45 | PM | 206 | V | 220 | V | 50.6 | Hz | 35 | % | 87 | % | 30 | C |
| 1274) | 1/7/2010 | 1:45:47 | PM | 206 | V | 219 | V | 50.6 | Hz | 38 | % | 88 | % | 30 | C |
| 1275) | 1/7/2010 | 1:45:49 | PM | 207 | V | 220 | V | 50.6 | Hz | 35 | % | 87 | % | 30 | C |
| 1276) | 1/7/2010 | 1:45:51 | PM | 208 | V | 220 | V | 50.6 | Hz | 34 | % | 88 | % | 30 | C |
| 1278) | 1/7/2010 | 1:45:56 | PM | 209 | V | 219 | V | 50.6 | Hz | 36 | % | 88 | % | 30 | C |
| 1279) | 1/7/2010 | 1:45:58 | PM | 207 | V | 220 | V | 50.6 | Hz | 35 | % | 90 | % | 30 | C |

FIG. 7 - 43

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1280) | 1/7/2010 | 1:46:00 | PM | 210 | V | 219 | V | 50.6 | Hz | 34 | % | 90 | % | 30 | C |
| 1281) | 1/7/2010 | 1:46:02 | PM | 209 | V | 220 | V | 50.5 | Hz | 35 | % | 90 | % | 30 | C |
| 1282) | 1/7/2010 | 1:46:04 | PM | 209 | V | 220 | V | 50.6 | Hz | 37 | % | 90 | % | 30 | C |
| 1283) | 1/7/2010 | 1:46:06 | PM | 206 | V | 220 | V | 50.6 | Hz | 35 | % | 90 | % | 30 | C |
| 1284) | 1/7/2010 | 1:46:08 | PM | 207 | V | 220 | V | 50.6 | Hz | 36 | % | 90 | % | 30 | C |
| 1285) | 1/7/2010 | 1:46:10 | PM | 209 | V | 220 | V | 50.6 | Hz | 35 | % | 90 | % | 30 | C |
| 1286) | 1/7/2010 | 1:46:12 | PM | 209 | V | 220 | V | 50.6 | Hz | 34 | % | 90 | % | 30 | C |
| 1287) | 1/7/2010 | 1:46:14 | PM | 208 | V | 220 | V | 50.5 | Hz | 33 | % | 100 | % | 30 | C |
| 1288) | 1/7/2010 | 1:46:16 | PM | 209 | V | 220 | V | 50.6 | Hz | 34 | % | 90 | % | 30 | C |
| 1289) | 1/7/2010 | 1:46:18 | PM | 208 | V | 220 | V | 50.6 | Hz | 38 | % | 100 | % | 30 | C |
| 1290) | 1/7/2010 | 1:46:20 | PM | 210 | V | 220 | V | 50.6 | Hz | 33 | % | 100 | % | 30 | C |
| 1291) | 1/7/2010 | 1:46:22 | PM | 206 | V | 220 | V | 50.5 | Hz | 33 | % | 100 | % | 30 | C |
| 1292) | 1/7/2010 | 1:46:25 | PM | 209 | V | 220 | V | 50.6 | Hz | 34 | % | 100 | % | 30 | C |
| 1293) | 1/7/2010 | 1:46:27 | PM | 209 | V | 221 | V | 50.6 | Hz | 34 | % | 100 | % | 30 | C |
| 1294) | 1/7/2010 | 1:46:29 | PM | 210 | V | 220 | V | 50.5 | Hz | 36 | % | 100 | % | 30 | C |
| 1295) | 1/7/2010 | 1:46:31 | PM | 210 | V | 219 | V | 50.6 | Hz | 35 | % | 100 | % | 30 | C |
| 1296) | 1/7/2010 | 1:46:33 | PM | 210 | V | 221 | V | 50.6 | Hz | 33 | % | 100 | % | 30 | C |
| 1297) | 1/7/2010 | 1:46:35 | PM | 210 | V | 220 | V | 50.6 | Hz | 34 | % | 100 | % | 30 | C |
| 1298) | 1/7/2010 | 1:46:37 | PM | 208 | V | 220 | V | 50.5 | Hz | 37 | % | 100 | % | 30 | C |
| 1299) | 1/7/2010 | 1:46:39 | PM | 209 | V | 220 | V | 50.6 | Hz | 37 | % | 100 | % | 30 | C |
| 1300) | 1/7/2010 | 1:46:41 | PM | 208 | V | 219 | V | 50.6 | Hz | 36 | % | 100 | % | 30 | C |
| 1301) | 1/7/2010 | 1:46:43 | PM | 210 | V | 220 | V | 50.5 | Hz | 36 | % | 100 | % | 30 | C |
| 1302) | 1/7/2010 | 1:46:45 | PM | 210 | V | 220 | V | 50.6 | Hz | 36 | % | 100 | % | 30 | C |
| 1303) | 1/7/2010 | 1:46:47 | PM | 211 | V | 220 | V | 50.5 | Hz | 36 | % | 100 | % | 30 | C |
| 1304) | 1/7/2010 | 1:46:49 | PM | 209 | V | 220 | V | 50.5 | Hz | 36 | % | 100 | % | 30 | C |
| 1305) | 1/7/2010 | 1:46:51 | PM | 210 | V | 220 | V | 50.6 | Hz | 36 | % | 100 | % | 30 | C |
| 1306) | 1/7/2010 | 1:46:53 | PM | 209 | V | 220 | V | 50.5 | Hz | 34 | % | 100 | % | 30 | C |
| 1307) | 1/7/2010 | 1:46:56 | PM | 210 | V | 220 | V | 50.6 | Hz | 34 | % | 100 | % | 30 | C |
| 1308) | 1/7/2010 | 1:46:58 | PM | 210 | V | 221 | V | 50.5 | Hz | 35 | % | 100 | % | 30 | C |

FIG. 7 - 44

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1309) | 1/7/2010 | 1:47:00 | PM | 209 | V | 221 | V | 50.6 | Hz | 36 | % | 100 | % | 30 | C |
| 1310) | 1/7/2010 | 1:47:02 | PM | 209 | V | 220 | V | 50.5 | Hz | 36 | % | 100 | % | 30 | C |
| 1311) | 1/7/2010 | 1:47:04 | PM | 207 | V | 220 | V | 50.6 | Hz | 35 | % | 100 | % | 30 | C |
| 1312) | 1/7/2010 | 1:47:06 | PM | 209 | V | 220 | V | 50.6 | Hz | 38 | % | 100 | % | 30 | C |
| 1313) | 1/7/2010 | 1:47:08 | PM | 207 | V | 220 | V | 50.5 | Hz | 37 | % | 100 | % | 30 | C |
| 1314) | 1/7/2010 | 1:47:10 | PM | 208 | V | 220 | V | 50.5 | Hz | 36 | % | 100 | % | 30 | C |
| 1315) | 1/7/2010 | 1:47:12 | PM | 210 | V | 221 | V | 50.5 | Hz | 37 | % | 100 | % | 30 | C |
| 1316) | 1/7/2010 | 1:47:14 | PM | 210 | V | 220 | V | 50.5 | Hz | 42 | % | 100 | % | 30 | C |
| 1318) | 1/7/2010 | 1:47:18 | PM | 210 | V | 220 | V | 50.5 | Hz | 38 | % | 100 | % | 30 | C |
| 1319) | 1/7/2010 | 1:47:20 | PM | 209 | V | 220 | V | 50.5 | Hz | 38 | % | 100 | % | 30 | C |
| 1320) | 1/7/2010 | 1:47:22 | PM | 209 | V | 221 | V | 50.5 | Hz | 36 | % | 100 | % | 30 | C |
| 1321) | 1/7/2010 | 1:47:24 | PM | 209 | V | 220 | V | 50.5 | Hz | 37 | % | 100 | % | 30 | C |
| 1322) | 1/7/2010 | 1:47:27 | PM | 210 | V | 221 | V | 50.5 | Hz | 38 | % | 100 | % | 30 | C |
| 1323) | 1/7/2010 | 1:47:29 | PM | 210 | V | 221 | V | 50.5 | Hz | 40 | % | 100 | % | 30 | C |
| 1324) | 1/7/2010 | 1:47:31 | PM | 208 | V | 220 | V | 50.5 | Hz | 39 | % | 100 | % | 30 | C |
| 1325) | 1/7/2010 | 1:47:33 | PM | 208 | V | 220 | V | 50.5 | Hz | 35 | % | 100 | % | 30 | C |
| 1326) | 1/7/2010 | 1:47:35 | PM | 207 | V | 220 | V | 50.5 | Hz | 41 | % | 100 | % | 30 | C |
| 1327) | 1/7/2010 | 1:47:37 | PM | 208 | V | 220 | V | 50.5 | Hz | 37 | % | 100 | % | 30 | C |
| 1328) | 1/7/2010 | 1:47:39 | PM | 208 | V | 220 | V | 50.5 | Hz | 37 | % | 100 | % | 30 | C |
| 1329) | 1/7/2010 | 1:47:41 | PM | 207 | V | 221 | V | 50.5 | Hz | 37 | % | 100 | % | 30 | C |
| 1330) | 1/7/2010 | 1:47:43 | PM | 207 | V | 220 | V | 50.5 | Hz | 38 | % | 100 | % | 30 | C |
| 1331) | 1/7/2010 | 1:47:45 | PM | 210 | V | 220 | V | 50.5 | Hz | 38 | % | 100 | % | 30 | C |
| 1332) | 1/7/2010 | 1:47:47 | PM | 209 | V | 220 | V | 50.5 | Hz | 41 | % | 100 | % | 30 | C |
| 1333) | 1/7/2010 | 1:47:49 | PM | 206 | V | 220 | V | 50.5 | Hz | 38 | % | 100 | % | 30 | C |
| 1334) | 1/7/2010 | 1:47:51 | PM | 209 | V | 220 | V | 50.5 | Hz | 39 | % | 100 | % | 30 | C |
| 1335) | 1/7/2010 | 1:47:53 | PM | 208 | V | 220 | V | 50.5 | Hz | 36 | % | 100 | % | 30 | C |
| 1336) | 1/7/2010 | 1:47:55 | PM | 208 | V | 220 | V | 50.5 | Hz | 37 | % | 100 | % | 30 | C |
| 1337) | 1/7/2010 | 1:47:58 | PM | 207 | V | 220 | V | 50.5 | Hz | 37 | % | 100 | % | 30 | C |
| 1338) | 1/7/2010 | 1:48:00 | PM | 207 | V | 220 | V | 50.4 | Hz | 39 | % | 100 | % | 30 | C |

FIG. 7 - 45

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1339) | 1/7/2010 | 1:48:02 | PM | 207 | V | 220 | V | 50.5 | Hz | 40 | % | 100 | % | 30 | C |
| 1340) | 1/7/2010 | 1:48:04 | PM | 207 | V | 221 | V | 50.5 | Hz | 38 | % | 100 | % | 30 | C |
| 1341) | 1/7/2010 | 1:48:06 | PM | 207 | V | 221 | V | 50.5 | Hz | 39 | % | 100 | % | 30 | C |
| 1342) | 1/7/2010 | 1:48:08 | PM | 208 | V | 220 | V | 50.5 | Hz | 36 | % | 100 | % | 30 | C |
| 1343) | 1/7/2010 | 1:48:10 | PM | 208 | V | 220 | V | 50.5 | Hz | 38 | % | 100 | % | 30 | C |
| 1344) | 1/7/2010 | 1:48:12 | PM | 206 | V | 220 | V | 50.5 | Hz | 36 | % | 100 | % | 30 | C |
| 1345) | 1/7/2010 | 1:48:14 | PM | 207 | V | 220 | V | 50.5 | Hz | 35 | % | 100 | % | 30 | C |
| 1346) | 1/7/2010 | 1:48:16 | PM | 204 | V | 220 | V | 50.5 | Hz | 38 | % | 100 | % | 30 | C |
| 1347) | 1/7/2010 | 1:48:18 | PM | 207 | V | 221 | V | 50.5 | Hz | 35 | % | 100 | % | 30 | C |
| 1348) | 1/7/2010 | 1:48:20 | PM | 207 | V | 221 | V | 50.5 | Hz | 37 | % | 100 | % | 30 | C |
| 1349) | 1/7/2010 | 1:48:22 | PM | 207 | V | 220 | V | 50.5 | Hz | 41 | % | 100 | % | 30 | C |
| 1350) | 1/7/2010 | 1:48:24 | PM | 208 | V | 220 | V | 50.5 | Hz | 39 | % | 100 | % | 30 | C |
| 1351) | 1/7/2010 | 1:48:26 | PM | 208 | V | 220 | V | 50.4 | Hz | 38 | % | 100 | % | 30 | C |
| 1352) | 1/7/2010 | 1:48:29 | PM | 206 | V | 220 | V | 50.5 | Hz | 39 | % | 100 | % | 30 | C |
| 1353) | 1/7/2010 | 1:48:31 | PM | 206 | V | 220 | V | 50.5 | Hz | 35 | % | 100 | % | 30 | C |
| 1354) | 1/7/2010 | 1:48:33 | PM | 204 | V | 220 | V | 50.4 | Hz | 41 | % | 100 | % | 30 | C |
| 1355) | 1/7/2010 | 1:48:35 | PM | 203 | V | 220 | V | 50.5 | Hz | 38 | % | 100 | % | 30 | C |
| 1356) | 1/7/2010 | 1:48:37 | PM | 204 | V | 221 | V | 50.5 | Hz | 38 | % | 100 | % | 30 | C |
| 1357) | 1/7/2010 | 1:48:39 | PM | 204 | V | 220 | V | 50.5 | Hz | 38 | % | 100 | % | 30 | C |
| 1358) | 1/7/2010 | 1:48:41 | PM | 205 | V | 220 | V | 50.5 | Hz | 37 | % | 100 | % | 30 | C |
| 1359) | 1/7/2010 | 1:48:43 | PM | 205 | V | 220 | V | 50.4 | Hz | 37 | % | 100 | % | 30 | C |
| 1360) | 1/7/2010 | 1:48:45 | PM | 203 | V | 220 | V | 50.4 | Hz | 37 | % | 100 | % | 30 | C |
| 1361) | 1/7/2010 | 1:48:47 | PM | 205 | V | 218 | V | 50.4 | Hz | 37 | % | 100 | % | 30 | C |
| 1362) | 1/7/2010 | 1:48:49 | PM | 205 | V | 220 | V | 50.4 | Hz | 39 | % | 100 | % | 30 | C |
| 1363) | 1/7/2010 | 1:48:51 | PM | 204 | V | 220 | V | 50.3 | Hz | 40 | % | 100 | % | 30 | C |
| 1364) | 1/7/2010 | 1:48:53 | PM | 205 | V | 220 | V | 50.4 | Hz | 38 | % | 100 | % | 30 | C |
| 1365) | 1/7/2010 | 1:48:55 | PM | 204 | V | 220 | V | 50.4 | Hz | 40 | % | 100 | % | 30 | C |
| 1366) | 1/7/2010 | 1:48:57 | PM | 205 | V | 217 | V | 50.3 | Hz | 38 | % | 100 | % | 30 | C |
| 1367) | 1/7/2010 | 1:49:00 | PM | 205 | V | 220 | V | 50.4 | Hz | 37 | % | 100 | % | 30 | C |

FIG. 7 - 46

| | | | | Input | Volts | Output | Volts | Input | Hertz | Output | % | B.B. | % | System | |
|---|---|---|---|---|---|---|---|---|---|---|---|---|---|---|---|
| Seq. # | Date | Time | | Voltage | | Voltage | | Frequency | | Load | | Capacity | | Temperature | |
| 1368) | 1/7/2010 | 1:49:02 | PM | 204 | V | 219 | V | 50.4 | Hz | 38 | % | 100 | % | 30 | C |
| 1369) | 1/7/2010 | 1:49:04 | PM | 207 | V | 221 | V | 50.4 | Hz | 38 | % | 100 | % | 30 | C |
| 1370) | 1/7/2010 | 1:49:06 | PM | 210 | V | 220 | V | 50.4 | Hz | 38 | % | 100 | % | 30 | C |
| 1371) | 1/7/2010 | 1:49:08 | PM | 205 | V | 220 | V | 50.4 | Hz | 37 | % | 100 | % | 30 | C |
| 1372) | 1/7/2010 | 1:49:10 | PM | 204 | V | 221 | V | 50.3 | Hz | 37 | % | 100 | % | 30 | C |
| 1373) | 1/7/2010 | 1:49:12 | PM | 204 | V | 221 | V | 50.4 | Hz | 37 | % | 100 | % | 30 | C |
| 1374) | 1/7/2010 | 1:49:14 | PM | 203 | V | 220 | V | 50.4 | Hz | 39 | % | 100 | % | 30 | C |
| 1375) | 1/7/2010 | 1:49:16 | PM | 204 | V | 221 | V | 50.4 | Hz | 36 | % | 100 | % | 30 | C |
| 1376) | 1/7/2010 | 1:49:18 | PM | 204 | V | 220 | V | 50.4 | Hz | 36 | % | 100 | % | 30 | C |
| 1377) | 1/7/2010 | 1:49:20 | PM | 205 | V | 220 | V | 50.4 | Hz | 40 | % | 100 | % | 30 | C |

Notes: Data recording using a Fluke 345 for the purpose of analyzing the extracted data from the EPS. All data, spreadsheets, graphs and reports are an actual representation of the performance of the EPS.

| | |
|---|---|
| Instrument | FLUKE 345 |
| Measurement topology | Single phase without neutral mode |
| First recording | 1/22/2010 6:20:26 PM |
| Last recording | 1/22/2010 7:39:16 PM |
| Recording interval | 0h 0m 10s 0ms |
| Number of RMS recordings | 474 |
| Number or DC recordings | 0 |
| Number of frequency recordings | 474 |
| Number of harmonic recordings | 0 |
| Number of dips | 0 |
| Number of swells | 0 |
| Number of interruptions | 0 |
| Number of recorded transients | 0 |
| Number of voltage profiles | 0 |
| Number of active energy recordings | 474 |
| Number of reactive energy recordings | 474 |
| Number of rapid voltage changes | 0 |

Fig. 8-A

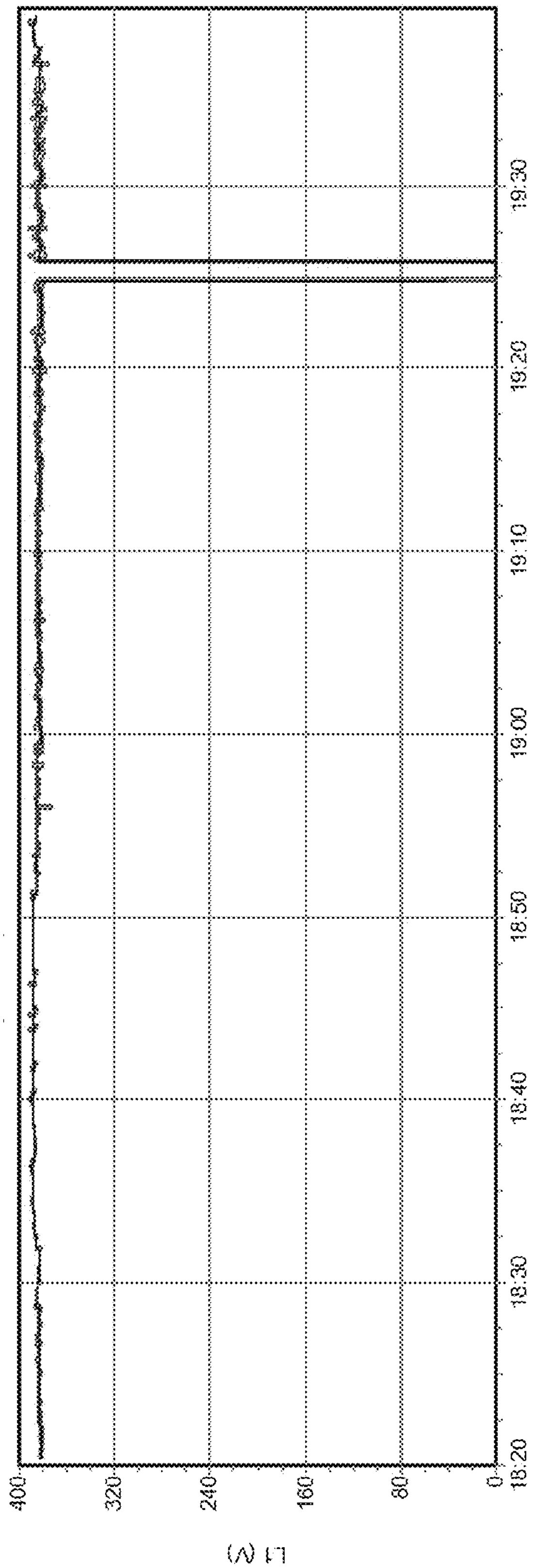
Fig. 8-B

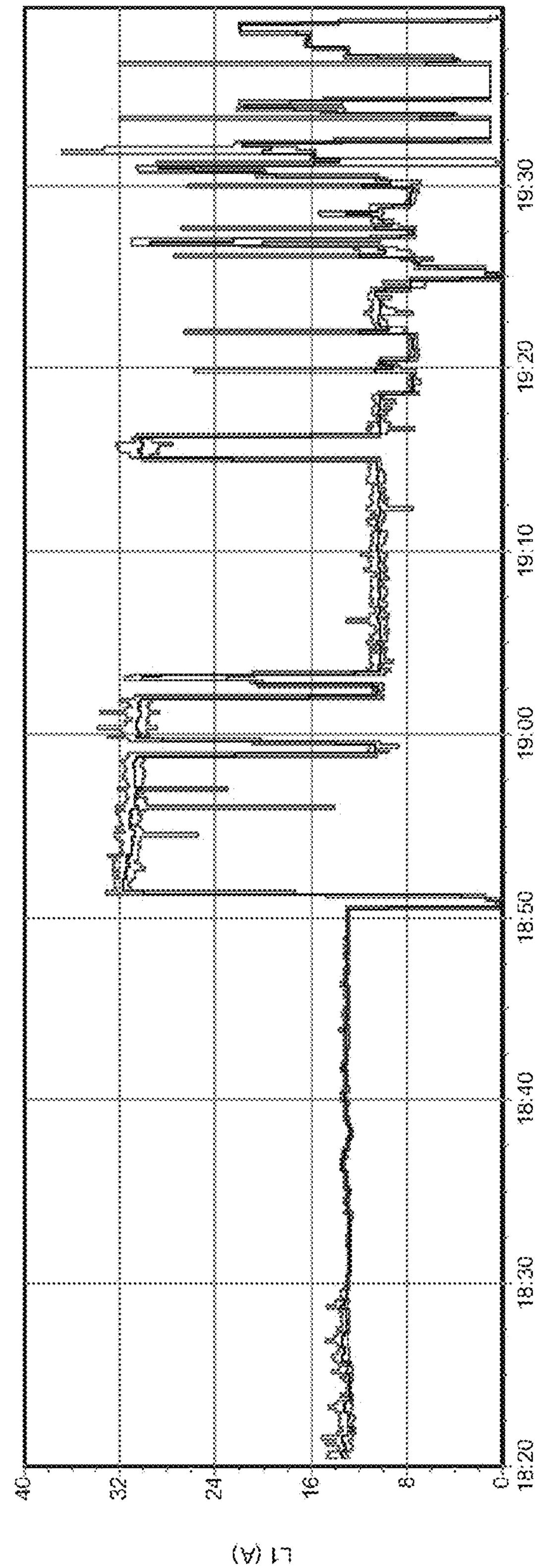
Fig. 8-C

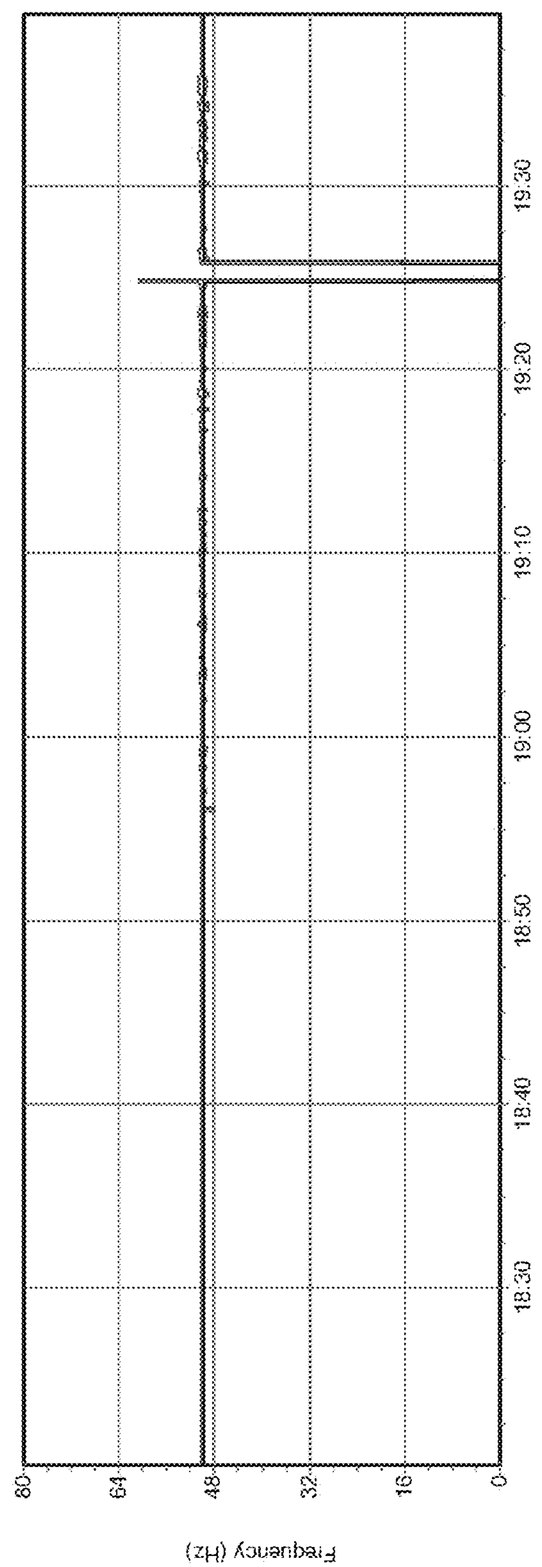
Fig. 8-D

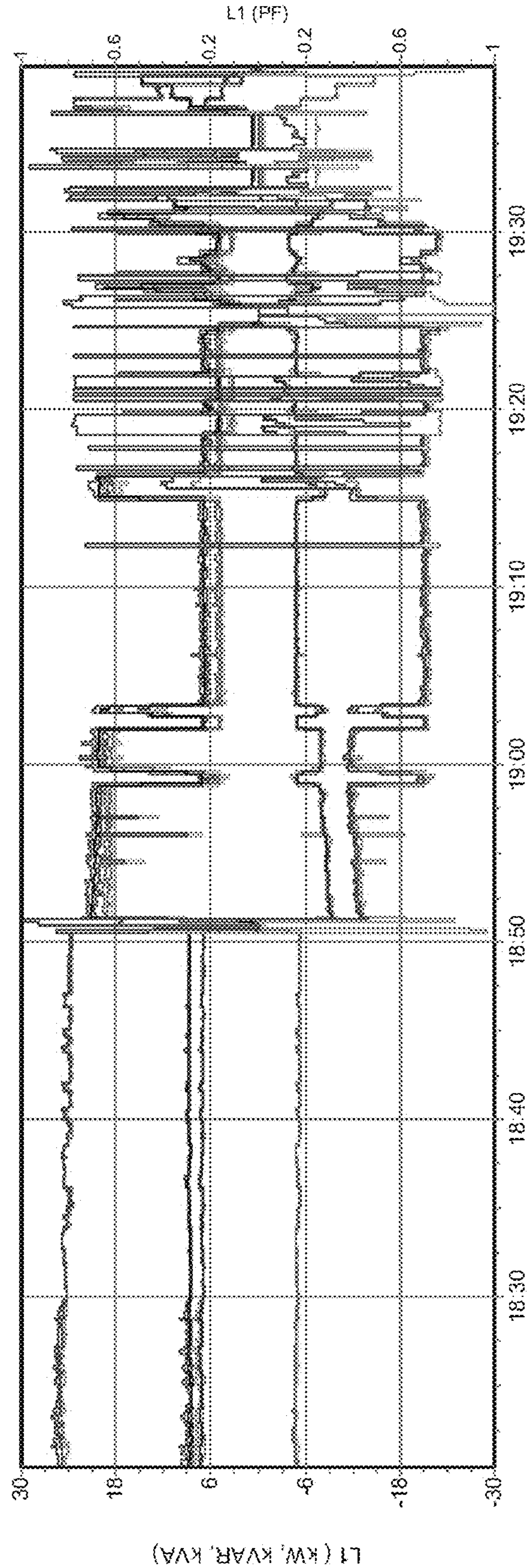
Fig. 8-E

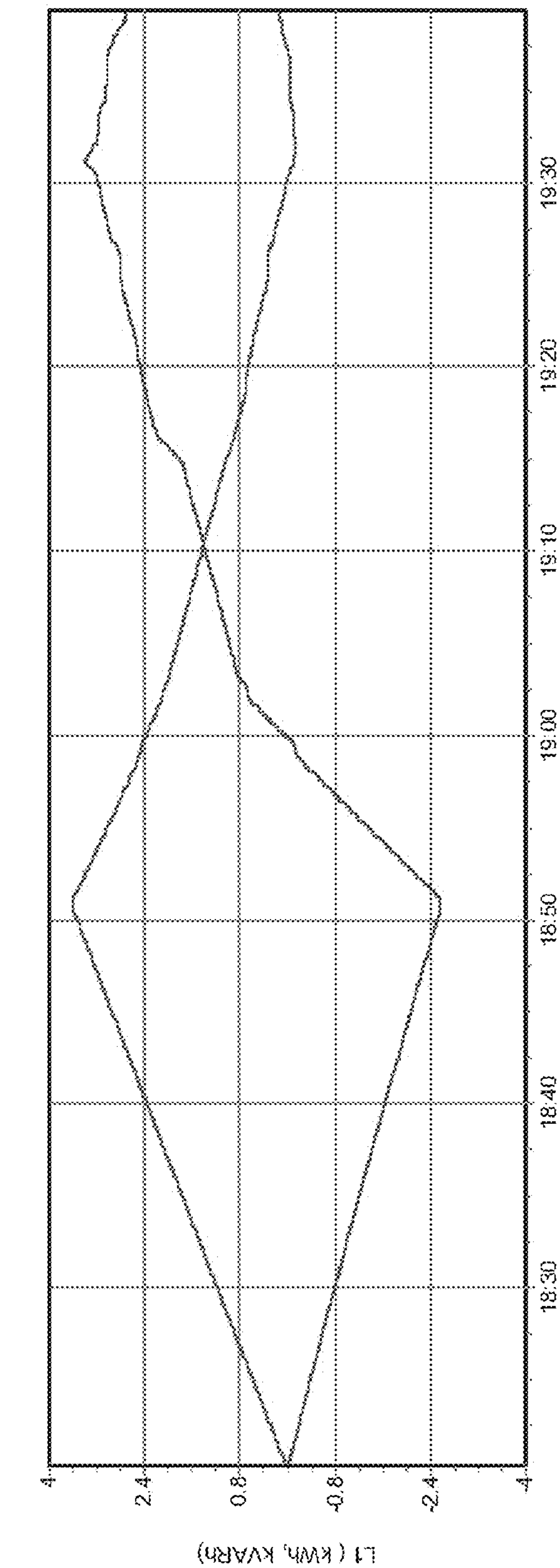
Fig. 8-F

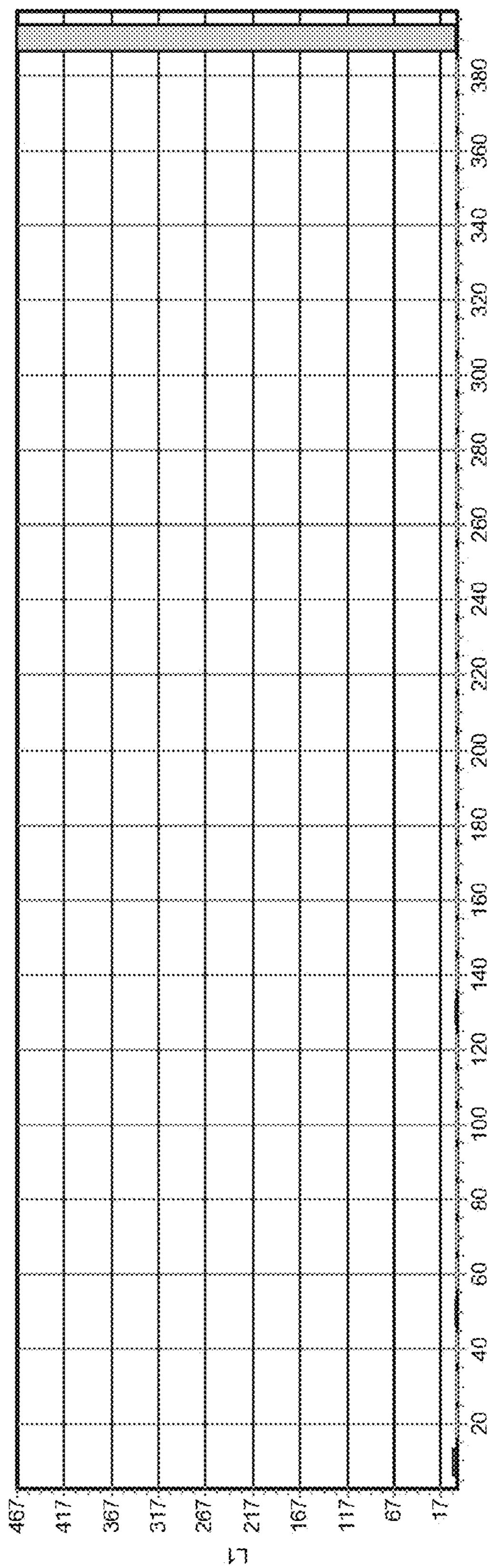
Fig. 8-G

100

Notes: Taken for analysis of the EPS-With EDL With Loads from the dummy load Stepped up and down when taking the readings.

| | |
|---|---|
| Instrument | FLUKE 345 |
| Measurement topology | Single phase without neutral mode |
| First recording | 1/22/2010 4:54:11 PM |
| Last recording | 1/22/2010 5:19:51 PM |
| Recording interval | 0h 0m 10s 0ms |
| Number of RMS recordings | 155 |
| Number or DC recordings | 0 |
| Number of frequency recordings | 155 |
| Number of harmonic recordings | 0 |
| Number of dips | 0 |
| Number of swells | 0 |
| Number of interruptions | 0 |
| Number of recorded transients | 0 |
| Number of voltage profiles | 0 |
| Number of active energy recordings | 155 |
| Number of reactive energy recordings | 155 |
| Number of rapid voltage changes | 0 |

Fig. 9-A

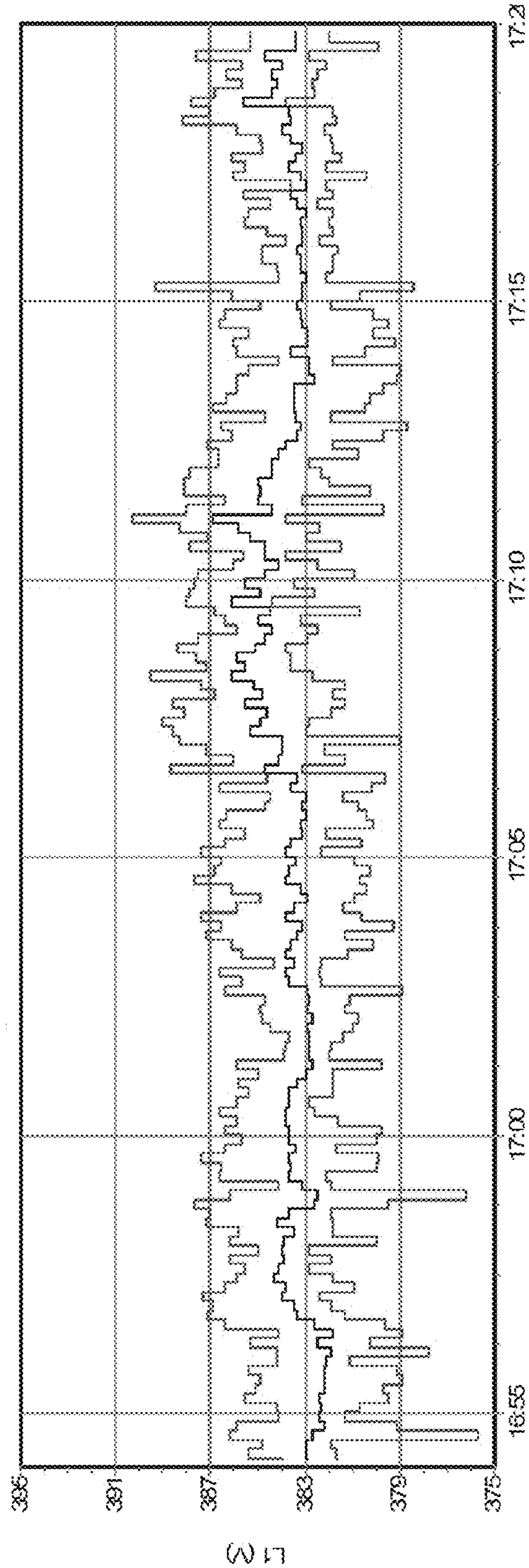
Fig. 9-B

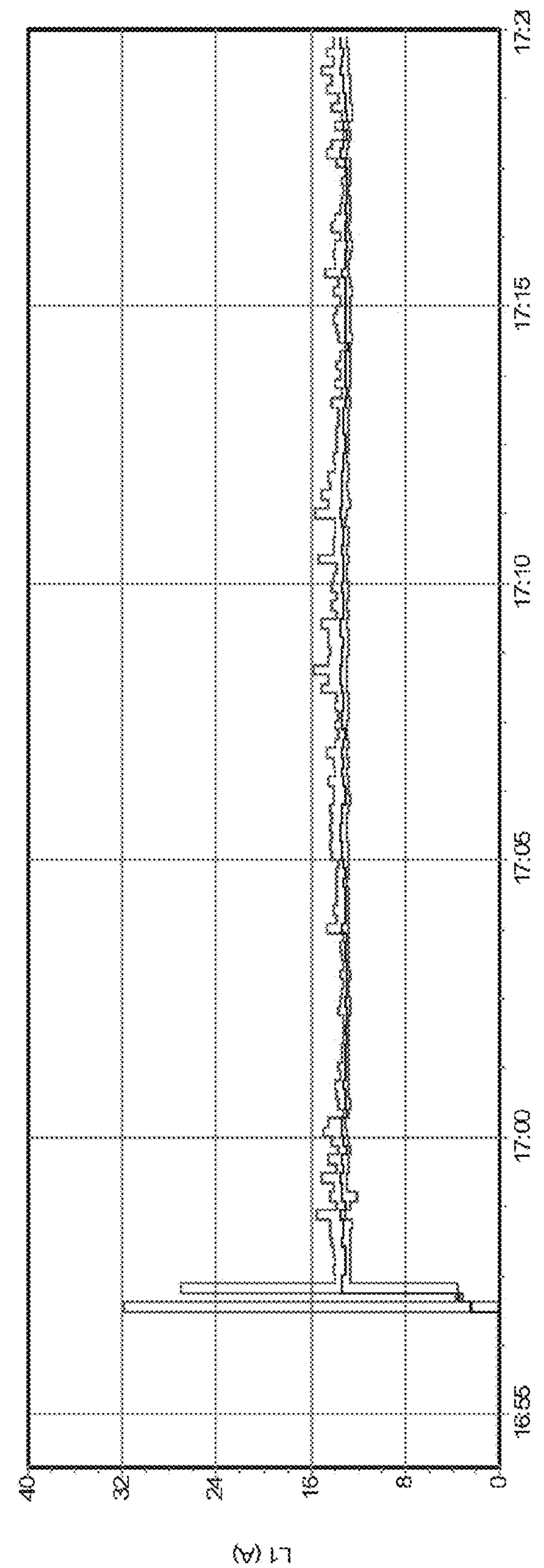
Fig. 9-C

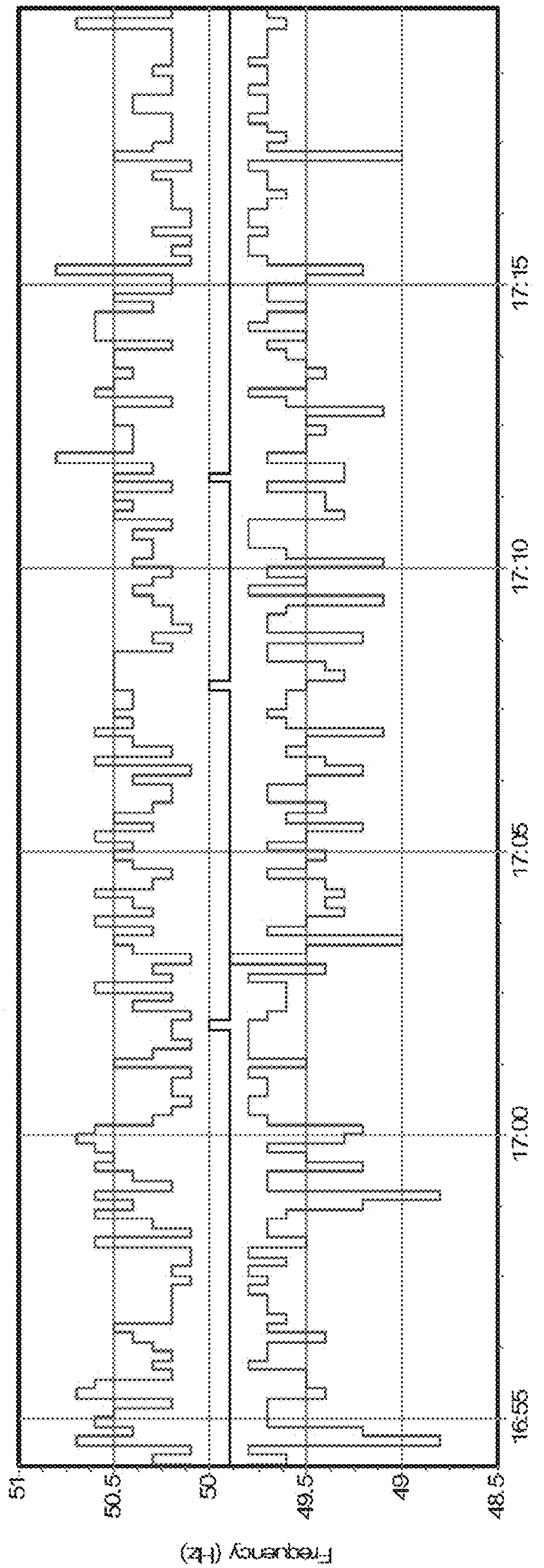
Fig. 9-D

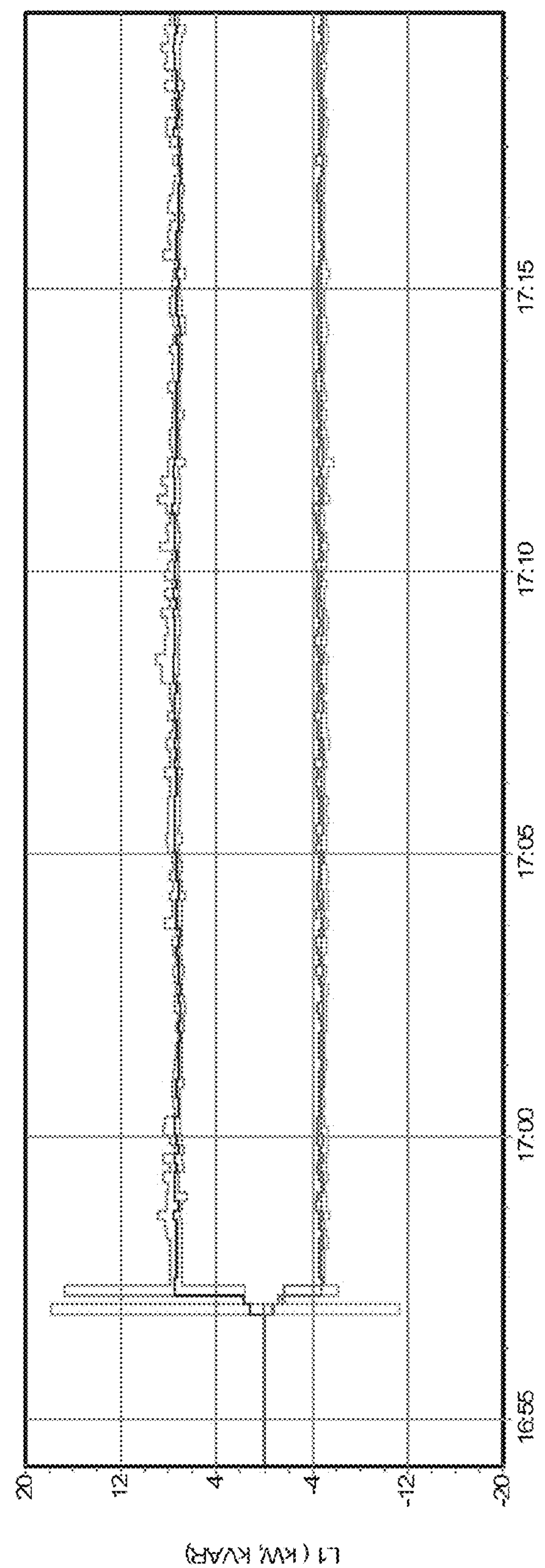
Fig. 9-E

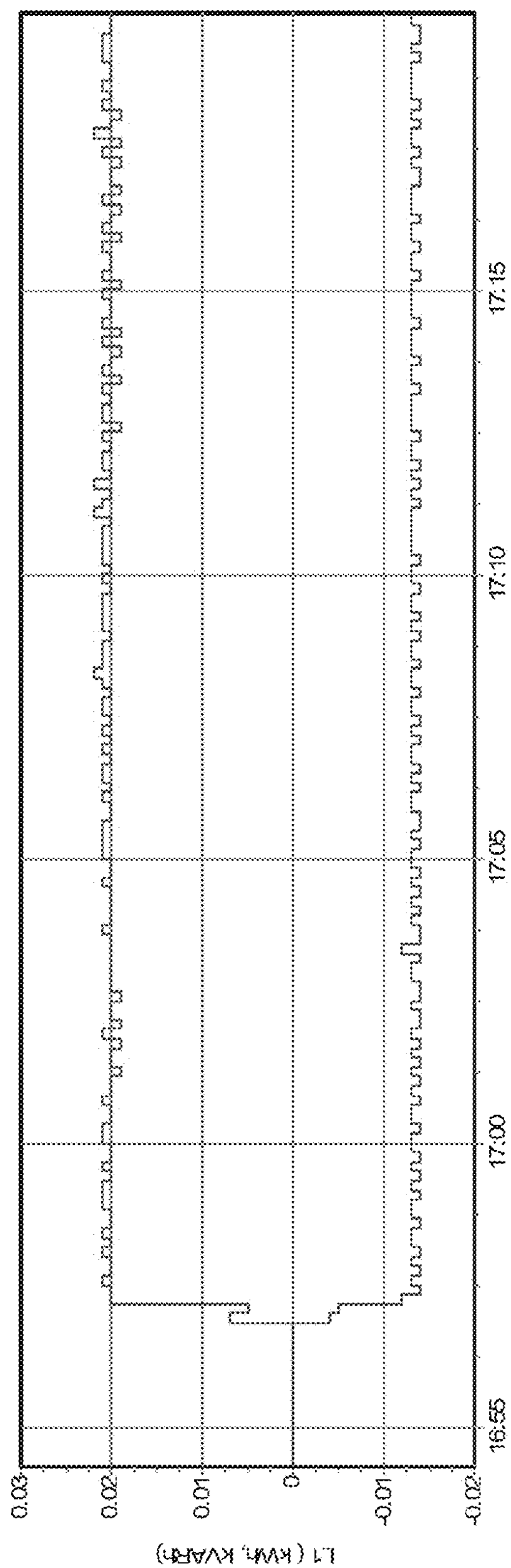
Fig. 9-F

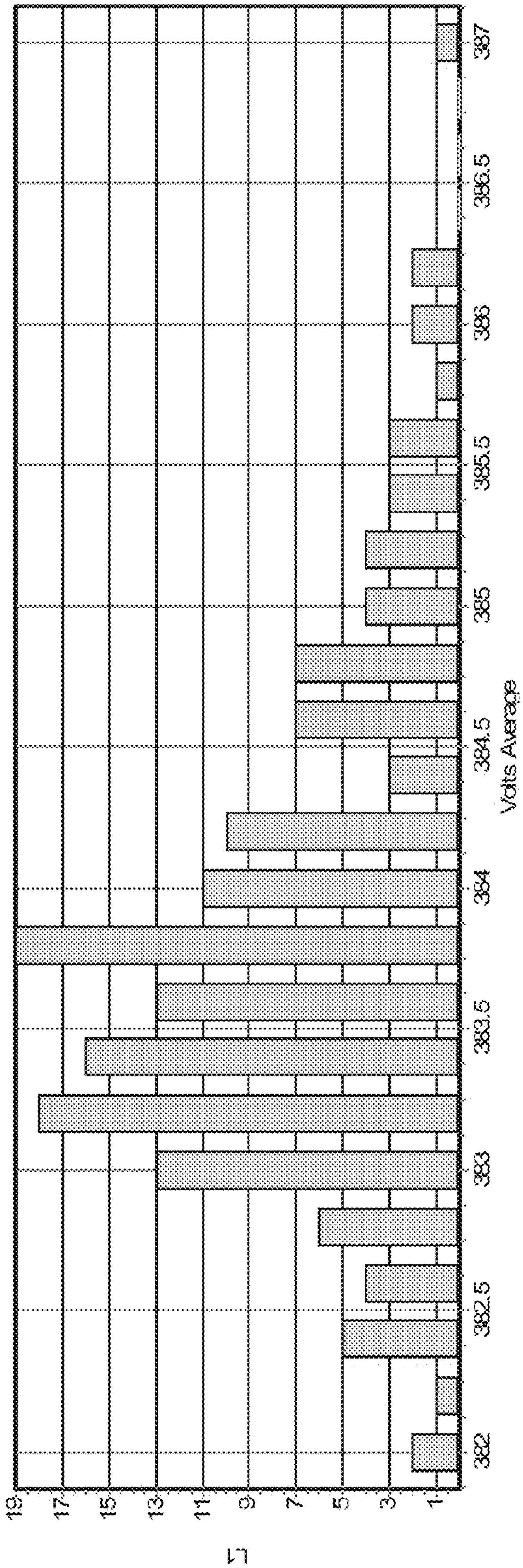
Fig. 9-G

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 16:57:21 0ms | 383.80 | 13.39 | 50 | 7,510 | -4,720 | 8,900 | 0.83 | 32 | -21 |
| 22/01/2010 | 16:57:31 0ms | 384.30 | 13.38 | 50 | 7,450 | -4,880 | 8,910 | 0.84 | 52 | -35 |
| 22/01/2010 | 16:57:41 0ms | 384.10 | 13.10 | 50 | 7,260 | -4,820 | 8,720 | 0.83 | 73 | -48 |
| 22/01/2010 | 16:57:51 0ms | 383.90 | 13.11 | 50 | 7,260 | -4,810 | 8,720 | 0.83 | 93 | -62 |
| 22/01/2010 | 16:58:01 0ms | 384.00 | 13.12 | 50 | 7,280 | -4,810 | 8,730 | 0.83 | 113 | -75 |
| 22/01/2010 | 16:58:11 0ms | 383.90 | 13.32 | 50 | 7,390 | -4,880 | 8,860 | 0.83 | 134 | -89 |
| 22/01/2010 | 16:58:21 0ms | 383.50 | 13.25 | 50 | 7,310 | -4,890 | 8,800 | 0.83 | 154 | -102 |
| 22/01/2010 | 16:58:31 0ms | 384.20 | 13.17 | 50 | 7,360 | -4,760 | 8,770 | 0.84 | 175 | -115 |
| 22/01/2010 | 16:58:41 0ms | 383.70 | 13.53 | 50 | 7,560 | -4,870 | 9,000 | 0.84 | 195 | -129 |
| 22/01/2010 | 16:58:51 0ms | 382.60 | 13.04 | 50 | 7,240 | -4,720 | 8,640 | 0.84 | 215 | -142 |
| 22/01/2010 | 16:59:01 0ms | 382.50 | 13.36 | 50 | 7,420 | -4,830 | 8,850 | 0.84 | 236 | -155 |
| 22/01/2010 | 16:59:11 0ms | 383.10 | 13.40 | 50 | 7,460 | -4,840 | 8,890 | 0.84 | 257 | -169 |
| 22/01/2010 | 16:59:21 0ms | 383.70 | 13.46 | 50 | 7,520 | -4,840 | 8,950 | 0.84 | 278 | -182 |
| 22/01/2010 | 16:59:31 0ms | 383.60 | 13.24 | 50 | 7,380 | -4,790 | 8,800 | 0.84 | 298 | -196 |
| 22/01/2010 | 16:59:41 0ms | 383.70 | 13.45 | 50 | 7,490 | -4,870 | 8,940 | 0.84 | 319 | -209 |
| 22/01/2010 | 16:59:51 0ms | 383.40 | 12.97 | 50 | 7,140 | -4,810 | 8,610 | 0.83 | 339 | -223 |
| 22/01/2010 | 17:00:01 0ms | 383.70 | 13.30 | 50 | 7,390 | -4,850 | 8,840 | 0.84 | 359 | -236 |
| 22/01/2010 | 17:00:11 0ms | 383.70 | 13.34 | 50 | 7,450 | -4,800 | 8,870 | 0.84 | 380 | -249 |
| 22/01/2010 | 17:00:21 0ms | 383.80 | 13.42 | 50 | 7,500 | -4,830 | 8,930 | 0.84 | 401 | -263 |
| 22/01/2010 | 17:00:31 0ms | 383.80 | 12.99 | 50 | 7,220 | -4,730 | 8,640 | 0.84 | 421 | -276 |
| 22/01/2010 | 17:00:41 0ms | 383.70 | 13.06 | 50 | 7,250 | -4,770 | 8,680 | 0.83 | 441 | -289 |
| 22/01/2010 | 17:00:51 0ms | 383.70 | 13.13 | 50 | 7,300 | -4,730 | 8,730 | 0.84 | 462 | -303 |
| 22/01/2010 | 17:01:01 0ms | 383.30 | 13.17 | 50 | 7,270 | -4,840 | 8,740 | 0.83 | 482 | -316 |
| 22/01/2010 | 17:01:11 0ms | 383.00 | 13.08 | 50 | 7,190 | -4,860 | 8,680 | 0.83 | 502 | -330 |
| 22/01/2010 | 17:01:21 0ms | 382.70 | 13.05 | 50 | 7,120 | -4,910 | 8,650 | 0.82 | 521 | -343 |
| 22/01/2010 | 17:01:31 0ms | 382.80 | 13.04 | 50 | 7,140 | -4,870 | 8,650 | 0.83 | 541 | -357 |
| 22/01/2010 | 17:01:41 0ms | 382.80 | 13.04 | 50 | 7,150 | -4,870 | 8,650 | 0.83 | 561 | -370 |
| 22/01/2010 | 17:01:51 0ms | 382.80 | 12.99 | 50 | 7,110 | -4,870 | 8,620 | 0.82 | 580 | -384 |
| 22/01/2010 | 17:02:01 0ms | 382.90 | 13.05 | 50 | 7,150 | -4,880 | 8,660 | 0.83 | 601 | -397 |
| 22/01/2010 | 17:02:11 0ms | 382.70 | 13.01 | 50 | 7,080 | -4,920 | 8,620 | 0.82 | 620 | -411 |
| 22/01/2010 | 17:02:21 0ms | 382.90 | 13.02 | 50 | 7,100 | -4,900 | 8,630 | 0.82 | 640 | -425 |
| 22/01/2010 | 17:02:31 0ms | 382.80 | 13.03 | 50 | 7,120 | -4,900 | 8,640 | 0.82 | 660 | -438 |
| 22/01/2010 | 17:02:41 0ms | 382.90 | 12.99 | 50 | 7,050 | -4,940 | 8,620 | 0.82 | 679 | -452 |
| 22/01/2010 | 17:02:51 0ms | 383.70 | 12.98 | 50 | 7,160 | -4,810 | 8,630 | 0.83 | 699 | -466 |
| 22/01/2010 | 17:03:01 0ms | 383.80 | 13.02 | 50 | 7,170 | -4,840 | 8,660 | 0.83 | 719 | -479 |

FIG. 10 - 1

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 17:03:11 0ms | 383.50 | 12.98 | 50 | 7,160 | -4,810 | 8,630 | 0.83 | 739 | -492 |
| 22/01/2010 | 17:03:21 0ms | 383.80 | 13.06 | 50 | 7,260 | -4,760 | 8,680 | 0.84 | 759 | -506 |
| 22/01/2010 | 17:03:31 0ms | 383.60 | 13.05 | 50 | 7,230 | -4,780 | 8,670 | 0.83 | 779 | -518 |
| 22/01/2010 | 17:03:41 0ms | 383.30 | 12.95 | 50 | 7,100 | -4,840 | 8,600 | 0.83 | 799 | -532 |
| 22/01/2010 | 17:03:51 0ms | 383.10 | 13.39 | 50 | 7,370 | -4,950 | 8,880 | 0.83 | 820 | -546 |
| 22/01/2010 | 17:04:01 0ms | 383.80 | 13.07 | 50 | 7,270 | -4,770 | 8,690 | 0.84 | 840 | -559 |
| 22/01/2010 | 17:04:11 0ms | 383.50 | 13.16 | 50 | 7,280 | -4,840 | 8,750 | 0.83 | 860 | -573 |
| 22/01/2010 | 17:04:21 0ms | 382.90 | 13.12 | 50 | 7,190 | -4,890 | 8,700 | 0.83 | 880 | -586 |
| 22/01/2010 | 17:04:31 0ms | 383.20 | 13.11 | 50 | 7,230 | -4,830 | 8,700 | 0.83 | 900 | -600 |
| 22/01/2010 | 17:04:41 0ms | 383.80 | 13.22 | 50 | 7,350 | -4,820 | 8,790 | 0.84 | 921 | -613 |
| 22/01/2010 | 17:04:51 0ms | 383.70 | 13.16 | 50 | 7,300 | -4,820 | 8,750 | 0.83 | 941 | -627 |
| 22/01/2010 | 17:05:01 0ms | 383.40 | 13.18 | 50 | 7,280 | -4,850 | 8,750 | 0.83 | 961 | -640 |
| 22/01/2010 | 17:05:11 0ms | 383.80 | 13.38 | 50 | 7,500 | -4,770 | 8,890 | 0.84 | 982 | -653 |
| 22/01/2010 | 17:05:21 0ms | 383.60 | 13.45 | 50 | 7,530 | -4,810 | 8,940 | 0.84 | 1,003 | -667 |
| 22/01/2010 | 17:05:31 0ms | 383.10 | 13.49 | 50 | 7,470 | -4,920 | 8,950 | 0.83 | 1,024 | -680 |
| 22/01/2010 | 17:05:41 0ms | 383.20 | 13.48 | 50 | 7,480 | -4,900 | 8,950 | 0.84 | 1,045 | -694 |
| 22/01/2010 | 17:05:51 0ms | 383.00 | 13.44 | 50 | 7,470 | -4,860 | 8,920 | 0.84 | 1,065 | -708 |
| 22/01/2010 | 17:06:01 0ms | 383.10 | 13.38 | 50 | 7,410 | -4,890 | 8,880 | 0.83 | 1,085 | -721 |
| 22/01/2010 | 17:06:11 0ms | 383.00 | 13.10 | 50 | 7,270 | -4,760 | 8,690 | 0.84 | 1,106 | -734 |
| 22/01/2010 | 17:06:21 0ms | 383.50 | 13.16 | 50 | 7,330 | -4,760 | 8,740 | 0.84 | 1,126 | -748 |
| 22/01/2010 | 17:06:31 0ms | 383.30 | 13.25 | 50 | 7,390 | -4,770 | 8,800 | 0.84 | 1,147 | -761 |
| 22/01/2010 | 17:06:41 0ms | 384.70 | 13.32 | 50 | 7,420 | -4,870 | 8,880 | 0.83 | 1,168 | -775 |
| 22/01/2010 | 17:06:51 0ms | 384.10 | 13.22 | 50 | 7,340 | -4,850 | 8,800 | 0.83 | 1,188 | -788 |
| 22/01/2010 | 17:07:01 0ms | 384.00 | 13.32 | 50 | 7,410 | -4,850 | 8,860 | 0.84 | 1,209 | -801 |
| 22/01/2010 | 17:07:11 0ms | 384.00 | 13.26 | 50 | 7,380 | -4,820 | 8,820 | 0.84 | 1,229 | -815 |
| 22/01/2010 | 17:07:21 0ms | 385.30 | 13.15 | 50 | 7,340 | -4,800 | 8,780 | 0.84 | 1,250 | -828 |
| 22/01/2010 | 17:07:31 0ms | 384.90 | 13.37 | 50 | 7,530 | -4,770 | 8,910 | 0.84 | 1,270 | -842 |
| 22/01/2010 | 17:07:41 0ms | 384.60 | 13.33 | 50 | 7,430 | -4,850 | 8,880 | 0.84 | 1,291 | -855 |
| 22/01/2010 | 17:07:51 0ms | 385.50 | 13.22 | 50 | 7,460 | -4,720 | 8,830 | 0.84 | 1,312 | -868 |
| 22/01/2010 | 17:08:01 0ms | 384.80 | 13.22 | 50 | 7,360 | -4,840 | 8,810 | 0.83 | 1,332 | -882 |
| 22/01/2010 | 17:08:11 0ms | 385.20 | 13.44 | 50 | 7,570 | -4,790 | 8,960 | 0.84 | 1,353 | -895 |
| 22/01/2010 | 17:08:21 0ms | 386.10 | 13.50 | 50 | 7,650 | -4,800 | 9,030 | 0.85 | 1,375 | -908 |
| 22/01/2010 | 17:08:31 0ms | 385.50 | 13.57 | 50 | 7,640 | -4,860 | 9,060 | 0.84 | 1,396 | -922 |
| 22/01/2010 | 17:08:41 0ms | 385.90 | 13.31 | 50 | 7,540 | -4,730 | 8,900 | 0.85 | 1,417 | -935 |
| 22/01/2010 | 17:08:51 0ms | 385.10 | 13.34 | 50 | 7,490 | -4,790 | 8,900 | 0.84 | 1,438 | -948 |

FIG. 10 - 2

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 17:09:01 0ms | 384.70 | 13.30 | 50 | 7,420 | -4,840 | 8,860 | 0.84 | 1,458 | -962 |
| 22/01/2010 | 17:09:11 0ms | 384.40 | 13.46 | 50 | 7,480 | -4,930 | 8,970 | 0.83 | 1,479 | -975 |
| 22/01/2010 | 17:09:21 0ms | 385.00 | 13.54 | 50 | 7,610 | -4,850 | 9,030 | 0.84 | 1,500 | -989 |
| 22/01/2010 | 17:09:31 0ms | 384.50 | 13.24 | 50 | 7,390 | -4,810 | 8,820 | 0.84 | 1,521 | -1,002 |
| 22/01/2010 | 17:09:41 0ms | 386.10 | 13.30 | 50 | 7,570 | -4,660 | 8,900 | 0.85 | 1,542 | -1,015 |
| 22/01/2010 | 17:09:51 0ms | 384.90 | 13.18 | 50 | 7,350 | -4,820 | 8,790 | 0.84 | 1,562 | -1,029 |
| 22/01/2010 | 17:10:01 0ms | 385.50 | 13.31 | 50 | 7,520 | -4,740 | 8,890 | 0.84 | 1,583 | -1,042 |
| 22/01/2010 | 17:10:11 0ms | 384.70 | 13.29 | 50 | 7,470 | -4,760 | 8,860 | 0.84 | 1,603 | -1,055 |
| 22/01/2010 | 17:10:21 0ms | 384.10 | 13.23 | 50 | 7,350 | -4,840 | 8,810 | 0.83 | 1,624 | -1,069 |
| 22/01/2010 | 17:10:31 0ms | 384.70 | 13.27 | 50 | 7,410 | -4,830 | 8,850 | 0.84 | 1,645 | -1,082 |
| 22/01/2010 | 17:10:41 0ms | 384.70 | 13.33 | 50 | 7,440 | -4,840 | 8,880 | 0.84 | 1,666 | -1,095 |
| 22/01/2010 | 17:10:51 0ms | 385.30 | 13.27 | 50 | 7,520 | -4,680 | 8,860 | 0.85 | 1,687 | -1,108 |
| 22/01/2010 | 17:11:01 0ms | 385.80 | 13.27 | 50 | 7,540 | -4,660 | 8,870 | 0.85 | 1,707 | -1,121 |
| 22/01/2010 | 17:11:11 0ms | 386.90 | 13.39 | 50 | 7,710 | -4,580 | 8,980 | 0.86 | 1,729 | -1,134 |
| 22/01/2010 | 17:11:21 0ms | 384.40 | 13.47 | 50 | 7,500 | -4,920 | 8,970 | 0.83 | 1,750 | -1,148 |
| 22/01/2010 | 17:11:31 0ms | 385.00 | 13.41 | 50 | 7,510 | -4,850 | 8,950 | 0.84 | 1,770 | -1,161 |
| 22/01/2010 | 17.11.41 0ms | 384.90 | 13.36 | 50 | 7,470 | -4,840 | 8,910 | 0.84 | 1,792 | -1,175 |
| 22/01/2010 | 17:11:51 0ms | 385.00 | 13.45 | 50 | 7,560 | -4,820 | 8,970 | 0.84 | 1,812 | -1,188 |
| 22/01/2010 | 17:12:01 0ms | 384.40 | 13.40 | 50 | 7,480 | -4,850 | 8,920 | 0.84 | 1,833 | -1,202 |
| 22/01/2010 | 17:12:11 0ms | 384.40 | 13.20 | 50 | 7,330 | -4,840 | 8,790 | 0.83 | 1,854 | -1,215 |
| 22/01/2010 | 17:12:21 0ms | 384.10 | 13.30 | 50 | 7,400 | -4,850 | 8,850 | 0.84 | 1,874 | -1,228 |
| 22/01/2010 | 17:12:31 0ms | 383.80 | 13.10 | 50 | 7,310 | -4,740 | 8,710 | 0.84 | 1,895 | -1,242 |
| 22/01/2010 | 17:12:41 0ms | 383.30 | 13.14 | 50 | 7,340 | -4,710 | 8,730 | 0.84 | 1,914 | -1,255 |
| 22/01/2010 | 17:12:51 0ms | 383.20 | 13.19 | 50 | 7,360 | -4,730 | 8,750 | 0.84 | 1,935 | -1,268 |
| 22/01/2010 | 17:13:01 0ms | 383.40 | 13.18 | 50 | 7,340 | -4,760 | 8,750 | 0.84 | 1,956 | -1,281 |
| 22/01/2010 | 17:13:11 0ms | 383.50 | 13.17 | 50 | 7,350 | -4,750 | 8,750 | 0.84 | 1,976 | -1,294 |
| 22/01/2010 | 17:13:21 0ms | 383.50 | 13.13 | 50 | 7,340 | -4,710 | 8,720 | 0.84 | 1,997 | -1,308 |
| 22/01/2010 | 17:13:31 0ms | 383.50 | 13.02 | 50 | 7,240 | -4,730 | 8,650 | 0.84 | 2,016 | -1,321 |
| 22/01/2010 | 17:13:41 0ms | 382.60 | 13.13 | 50 | 7,250 | -4,800 | 8,700 | 0.83 | 2,037 | -1,334 |
| 22/01/2010 | 17:13:51 0ms | 382.80 | 13.07 | 50 | 7,220 | -4,800 | 8,670 | 0.83 | 2,057 | -1,348 |
| 22/01/2010 | 17:14:01 0ms | 382.80 | 13.04 | 50 | 7,200 | -4,780 | 8,650 | 0.83 | 2,076 | -1,361 |
| 22/01/2010 | 17:14:11 0ms | 383.60 | 13.04 | 50 | 7,270 | -4,710 | 8,670 | 0.84 | 2,097 | -1,374 |
| 22/01/2010 | 17:14:21 0ms | 382.90 | 12.86 | 50 | 7,070 | -4,760 | 8,530 | 0.83 | 2,116 | -1,387 |
| 22/01/2010 | 17:14:31 0ms | 382.90 | 13.04 | 50 | 7,210 | -4,770 | 8,650 | 0.83 | 2,137 | -1,401 |
| 22/01/2010 | 17:14:41 0ms | 383.10 | 13.11 | 50 | 7,290 | -4,730 | 8,700 | 0.84 | 2,157 | -1,414 |

FIG. 10 - 3

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 17:14:51 0ms | 383.20 | 13.07 | 50 | 7,260 | -4,740 | 8,670 | 0.84 | 2,177 | -1,427 |
| 22/01/2010 | 17:15:01 0ms | 383.30 | 13.15 | 50 | 7,340 | -4,720 | 8,740 | 0.84 | 2,198 | -1,440 |
| 22/01/2010 | 17:15:11 0ms | 383.10 | 13.03 | 50 | 7,210 | -4,760 | 8,650 | 0.83 | 2,217 | -1,453 |
| 22/01/2010 | 17:15:21 0ms | 383.10 | 13.13 | 50 | 7,270 | -4,810 | 8,720 | 0.83 | 2,238 | -1,467 |
| 22/01/2010 | 17:15:31 0ms | 383.00 | 13.08 | 50 | 7,250 | -4,770 | 8,680 | 0.83 | 2,258 | -1,480 |
| 22/01/2010 | 17:15:41 0ms | 383.20 | 13.33 | 50 | 7,400 | -4,840 | 8,850 | 0.84 | 2,278 | -1,493 |
| 22/01/2010 | 17:15:51 0ms | 383.20 | 13.15 | 50 | 7,260 | -4,840 | 8,730 | 0.83 | 2,299 | -1,507 |
| 22/01/2010 | 17:16:01 0ms | 383.30 | 13.12 | 50 | 7,270 | -4,790 | 8,710 | 0.83 | 2,318 | -1,520 |
| 22/01/2010 | 17:16:11 0ms | 383.10 | 12.98 | 50 | 7,160 | -4,800 | 8,620 | 0.83 | 2,339 | -1,533 |
| 22/01/2010 | 17:16:21 0ms | 383.10 | 13.04 | 50 | 7,200 | -4,790 | 8,650 | 0.83 | 2,359 | -1,547 |
| 22/01/2010 | 17:16:31 0ms | 383.20 | 13.08 | 50 | 7,220 | -4,810 | 8,680 | 0.83 | 2,378 | -1,560 |
| 22/01/2010 | 17:16:41 0ms | 383.00 | 13.00 | 50 | 7,170 | -4,780 | 8,620 | 0.83 | 2,399 | -1,573 |
| 22/01/2010 | 17:16:51 0ms | 383.30 | 13.05 | 50 | 7,220 | -4,790 | 8,660 | 0.83 | 2,418 | -1,586 |
| 22/01/2010 | 17:17:01 0ms | 383.60 | 12.93 | 50 | 7,110 | -4,820 | 8,590 | 0.83 | 2,438 | -1,600 |
| 22/01/2010 | 17:17:11 0ms | 383.00 | 12.94 | 50 | 7,060 | -4,890 | 8,590 | 0.82 | 2,458 | -1,614 |
| 22/01/2010 | 17:17:21 0ms | 383.20 | 13.01 | 50 | 7,120 | -4,880 | 8,640 | 0.82 | 2,477 | -1,627 |
| 22/01/2010 | 17:17:31 0ms | 383.70 | 12.90 | 50 | 7,100 | -4,800 | 8,570 | 0.83 | 2,498 | -1,641 |
| 22/01/2010 | 17:17:41 0ms | 383.40 | 13.04 | 50 | 7,210 | -4,790 | 8,660 | 0.83 | 2,517 | -1,654 |
| 22/01/2010 | 17:17:51 0ms | 383.10 | 13.54 | 50 | 7,560 | -4,850 | 8,990 | 0.84 | 2,539 | -1,667 |
| 22/01/2010 | 17:18:01 0ms | 383.60 | 13.18 | 50 | 7,290 | -4,860 | 8,760 | 0.83 | 2,559 | -1,681 |
| 22/01/2010 | 17:18:11 0ms | 384.00 | 12.97 | 50 | 7,130 | -4,850 | 8,630 | 0.83 | 2,578 | -1,694 |
| 22/01/2010 | 17:18:21 0ms | 383.60 | 13.26 | 50 | 7,350 | -4,870 | 8,820 | 0.83 | 2,599 | -1,708 |
| 22/01/2010 | 17:18:31 0ms | 383.70 | 12.93 | 50 | 7,170 | -4,740 | 8,600 | 0.83 | 2,619 | -1,721 |
| 22/01/2010 | 17:18:41 0ms | 385.60 | 13.12 | 50 | 7,390 | -4,710 | 8,770 | 0.84 | 2,640 | -1,734 |
| 22/01/2010 | 17:18:51 0ms | 384.40 | 13.08 | 50 | 7,310 | -4,720 | 8,710 | 0.84 | 2,660 | -1,747 |
| 22/01/2010 | 17:19:01 0ms | 384.20 | 13.23 | 50 | 7,410 | -4,750 | 8,810 | 0.84 | 2,680 | -1,760 |
| 22/01/2010 | 17:19:11 0ms | 384.40 | 13.29 | 50 | 7,460 | -4,750 | 8,850 | 0.84 | 2,701 | -1,774 |
| 22/01/2010 | 17:19:21 0ms | 384.00 | 13.57 | 50 | 7,560 | -4,920 | 9,020 | 0.84 | 2,722 | -1,787 |
| 22/01/2010 | 17:19:31 0ms | 384.70 | 13.37 | 50 | 7,420 | -4,930 | 8,910 | 0.83 | 2,743 | -1,801 |
| 22/01/2010 | 17:19:41 0ms | 383.40 | 13.29 | 50 | 7,330 | -4,910 | 8,830 | 0.83 | 2,763 | -1,815 |
| 22/01/2010 | 17:19:51 0ms | 383.40 | 13.49 | 50 | 7,440 | -4,980 | 8,960 | 0.83 | 2,783 | -1,828 |
| AVERAGES | 25 Minutes Test | 383.82 | 13.20 | 50 | 7,337 | -4,813 | 8,780 | 0.83 | 1,408 | -926 |

FIG. 10 - 4

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:20:26 0ms | 381.50 | 13.23 | 50 | 7,220 | -4,920 | 8,740 | 0.83 | 21 | -14 |
| 22/01/2010 | 18:20:36 0ms | 381.70 | 13.41 | 50 | 7,370 | -4,930 | 8,870 | 0.83 | 42 | -28 |
| 22/01/2010 | 18:20:46 0ms | 381.80 | 13.49 | 50 | 7,430 | -4,930 | 8,920 | 0.83 | 62 | -42 |
| 22/01/2010 | 18:20:56 0ms | 381.40 | 13.20 | 50 | 7,240 | -4,860 | 8,720 | 0.83 | 82 | -55 |
| 22/01/2010 | 18:21:06 0ms | 381.40 | 13.08 | 50 | 7,160 | -4,820 | 8,640 | 0.83 | 102 | -69 |
| 22/01/2010 | 18:21:16 0ms | 381.40 | 13.20 | 50 | 7,260 | -4,820 | 8,720 | 0.83 | 123 | -82 |
| 22/01/2010 | 18:21:26 0ms | 381.30 | 13.32 | 50 | 7,310 | -4,890 | 8,800 | 0.83 | 143 | -96 |
| 22/01/2010 | 18:21:36 0ms | 381.20 | 13.41 | 50 | 7,400 | -4,860 | 8,860 | 0.83 | 163 | -109 |
| 22/01/2010 | 18:21:46 0ms | 381.20 | 12.96 | 50 | 7,110 | -4,750 | 8,560 | 0.83 | 183 | -122 |
| 22/01/2010 | 18:21:56 0ms | 381.30 | 12.89 | 50 | 7,110 | -4,690 | 8,520 | 0.83 | 203 | -135 |
| 22/01/2010 | 18:22:06 0ms | 381.50 | 12.58 | 50 | 6,910 | -4,620 | 8,320 | 0.83 | 222 | -148 |
| 22/01/2010 | 18:22:16 0ms | 382.50 | 12.98 | 50 | 7,210 | -4,690 | 8,600 | 0.84 | 242 | -161 |
| 22/01/2010 | 18:22:26 0ms | 382.90 | 12.91 | 50 | 7,210 | -4,620 | 8,560 | 0.84 | 262 | -174 |
| 22/01/2010 | 18:22:36 0ms | 383.40 | 12.90 | 50 | 7,210 | -4,630 | 8,570 | 0.84 | 282 | -187 |
| 22/01/2010 | 18:22:46 0ms | 382.50 | 12.83 | 50 | 7,080 | -4,710 | 8,500 | 0.83 | 302 | -200 |
| 22/01/2010 | 18:22:56 0ms | 382.90 | 12.96 | 50 | 7,200 | -4,700 | 8,600 | 0.84 | 322 | -213 |
| 22/01/2010 | 18:23:06 0ms | 383.40 | 13.22 | 50 | 7,400 | -4,720 | 8,780 | 0.84 | 342 | -226 |
| 22/01/2010 | 18:23:16 0ms | 383.10 | 13.23 | 50 | 7,390 | -4,730 | 8,780 | 0.84 | 363 | -239 |
| 22/01/2010 | 18:23:26 0ms | 382.60 | 13.29 | 50 | 7,390 | -4,780 | 8,810 | 0.84 | 384 | -253 |
| 22/01/2010 | 18:23:36 0ms | 383.00 | 13.06 | 50 | 7,270 | -4,720 | 8,670 | 0.84 | 404 | -266 |
| 22/01/2010 | 18:23:46 0ms | 383.10 | 12.62 | 50 | 7,000 | -4,600 | 8,370 | 0.84 | 423 | -279 |
| 22/01/2010 | 18:23:56 0ms | 383.20 | 12.85 | 50 | 7,160 | -4,630 | 8,530 | 0.84 | 443 | -291 |
| 22/01/2010 | 18:24:06 0ms | 383.30 | 12.79 | 50 | 7,120 | -4,620 | 8,490 | 0.84 | 463 | -304 |
| 22/01/2010 | 18:24:16 0ms | 382.90 | 12.81 | 50 | 7,100 | -4,670 | 8,500 | 0.83 | 483 | -317 |
| 22/01/2010 | 18:24:26 0ms | 383.20 | 12.79 | 50 | 7,110 | -4,640 | 8,490 | 0.84 | 502 | -330 |
| 22/01/2010 | 18:24:36 0ms | 383.00 | 12.84 | 50 | 7,120 | -4,670 | 8,520 | 0.84 | 522 | -343 |
| 22/01/2010 | 18:24:46 0ms | 382.80 | 12.85 | 50 | 7,120 | -4,690 | 8,520 | 0.83 | 542 | -356 |
| 22/01/2010 | 18:24:56 0ms | 382.90 | 12.84 | 50 | 7,120 | -4,680 | 8,520 | 0.84 | 562 | -369 |
| 22/01/2010 | 18:25:06 0ms | 383.10 | 12.81 | 50 | 7,100 | -4,670 | 8,500 | 0.83 | 582 | -382 |
| 22/01/2010 | 18:25:16 0ms | 382.60 | 13.05 | 50 | 7,240 | -4,720 | 8,650 | 0.84 | 602 | -395 |
| 22/01/2010 | 18:25:26 0ms | 383.30 | 12.99 | 50 | 7,230 | -4,710 | 8,630 | 0.84 | 622 | -408 |
| 22/01/2010 | 18:25:36 0ms | 383.80 | 12.83 | 50 | 7,120 | -4,700 | 8,530 | 0.83 | 642 | -422 |
| 22/01/2010 | 18:25:46 0ms | 383.60 | 12.93 | 50 | 7,160 | -4,750 | 8,590 | 0.83 | 661 | -435 |
| 22/01/2010 | 18:25:56 0ms | 383.20 | 13.37 | 50 | 7,420 | -4,870 | 8,880 | 0.84 | 682 | -448 |
| 22/01/2010 | 18:26:06 0ms | 383.60 | 13.45 | 50 | 7,530 | -4,820 | 8,940 | 0.84 | 703 | -462 |

FIG. 10 - 5

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:26:16 0ms | 383.30 | 13.18 | 50 | 7,320 | -4,800 | 8,750 | 0.84 | 723 | -475 |
| 22/01/2010 | 18:26:26 0ms | 383.30 | 13.18 | 50 | 7,320 | -4,790 | 8,750 | 0.84 | 744 | -488 |
| 22/01/2010 | 18:26:36 0ms | 383.80 | 13.34 | 50 | 7,460 | -4,800 | 8,870 | 0.84 | 765 | -502 |
| 22/01/2010 | 18:26:46 0ms | 383.40 | 13.36 | 50 | 7,450 | -4,820 | 8,880 | 0.84 | 785 | -515 |
| 22/01/2010 | 18:26:56 0ms | 384.00 | 13.38 | 50 | 7,500 | -4,790 | 8,900 | 0.84 | 806 | -528 |
| 22/01/2010 | 18:27:06 0ms | 384.00 | 13.40 | 50 | 7,490 | -4,820 | 8,910 | 0.84 | 827 | -542 |
| 22/01/2010 | 18:27:16 0ms | 383.50 | 13.18 | 50 | 7,280 | -4,860 | 8,760 | 0.83 | 847 | -555 |
| 22/01/2010 | 18:27:26 0ms | 383.40 | 13.02 | 50 | 7,170 | -4,830 | 8,650 | 0.83 | 867 | -569 |
| 22/01/2010 | 18:27:36 0ms | 383.30 | 13.08 | 50 | 7,220 | -4,830 | 8,680 | 0.83 | 887 | -582 |
| 22/01/2010 | 18:27:46 0ms | 383.20 | 13.03 | 50 | 7,160 | -4,840 | 8,650 | 0.83 | 907 | -596 |
| 22/01/2010 | 18:27:56 0ms | 383.20 | 13.00 | 50 | 7,150 | -4,830 | 8,630 | 0.83 | 927 | -609 |
| 22/01/2010 | 18:28:06 0ms | 383.20 | 13.06 | 50 | 7,180 | -4,860 | 8,670 | 0.83 | 947 | -623 |
| 22/01/2010 | 18:28:16 0ms | 383.20 | 13.04 | 50 | 7,180 | -4,830 | 8,660 | 0.83 | 967 | -636 |
| 22/01/2010 | 18:28:26 0ms | 383.10 | 13.03 | 50 | 7,160 | -4,840 | 8,650 | 0.83 | 987 | -649 |
| 22/01/2010 | 18:28:36 0ms | 383.20 | 13.04 | 50 | 7,180 | -4,820 | 8,650 | 0.83 | 1,007 | -663 |
| 22/01/2010 | 18:28:46 0ms | 385.20 | 13.51 | 50 | 7,490 | -5,010 | 9,010 | 0.83 | 1,027 | -677 |
| 22/01/2010 | 18:28:56 0ms | 384.90 | 13.28 | 50 | 7,320 | -4,980 | 8,850 | 0.83 | 1,048 | -691 |
| 22/01/2010 | 18:29:06 0ms | 384.80 | 13.23 | 50 | 7,260 | -5,000 | 8,820 | 0.82 | 1,068 | -705 |
| 22/01/2010 | 18:29:16 0ms | 384.70 | 13.12 | 50 | 7,190 | -4,970 | 8,740 | 0.82 | 1,088 | -718 |
| 22/01/2010 | 18:29:26 0ms | 384.60 | 13.15 | 50 | 7,190 | -5,000 | 8,760 | 0.82 | 1,108 | -732 |
| 22/01/2010 | 18:29:36 0ms | 384.70 | 13.16 | 50 | 7,200 | -4,990 | 8,770 | 0.82 | 1,128 | -746 |
| 22/01/2010 | 18:29:46 0ms | 384.30 | 13.02 | 50 | 7,010 | -5,080 | 8,670 | 0.81 | 1,147 | -760 |
| 22/01/2010 | 18:29:56 0ms | 384.00 | 12.97 | 50 | 6,970 | -5,080 | 8,630 | 0.81 | 1,167 | -774 |
| 22/01/2010 | 18:30:06 0ms | 383.70 | 12.95 | 50 | 6,950 | -5,080 | 8,610 | 0.81 | 1,186 | -788 |
| 22/01/2010 | 18:30:16 0ms | 383.50 | 12.93 | 50 | 6,930 | -5,070 | 8,590 | 0.81 | 1,205 | -803 |
| 22/01/2010 | 18:30:26 0ms | 383.30 | 12.90 | 50 | 6,910 | -5,050 | 8,560 | 0.81 | 1,225 | -817 |
| 22/01/2010 | 18:30:36 0ms | 383.10 | 12.89 | 50 | 6,910 | -5,050 | 8,560 | 0.81 | 1,244 | -831 |
| 22/01/2010 | 18:30:46 0ms | 383.70 | 12.85 | 50 | 6,950 | -4,970 | 8,540 | 0.81 | 1,263 | -844 |
| 22/01/2010 | 18:30:56 0ms | 383.50 | 12.85 | 50 | 6,950 | -4,960 | 8,540 | 0.81 | 1,282 | -858 |
| 22/01/2010 | 18:31:06 0ms | 383.40 | 12.83 | 50 | 6,940 | -4,950 | 8,520 | 0.81 | 1,302 | -872 |
| 22/01/2010 | 18:31:16 0ms | 383.30 | 12.83 | 50 | 6,930 | -4,950 | 8,520 | 0.81 | 1,321 | -886 |
| 22/01/2010 | 18:31:26 0ms | 383.20 | 12.82 | 50 | 6,920 | -4,950 | 8,510 | 0.81 | 1,340 | -900 |
| 22/01/2010 | 18:31:36 0ms | 383.20 | 12.81 | 50 | 6,920 | -4,950 | 8,500 | 0.81 | 1,359 | -913 |
| 22/01/2010 | 18:31:46 0ms | 383.10 | 12.81 | 50 | 6,910 | -4,940 | 8,500 | 0.81 | 1,379 | -927 |
| 22/01/2010 | 18:31:56 0ms | 384.20 | 12.85 | 50 | 6,990 | -4,910 | 8,550 | 0.82 | 1,398 | -941 |

FIG. 10 - 6

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:32:06 0ms | 385.50 | 12.89 | 50 | 7,080 | -4,890 | 8,610 | 0.82 | 1,418 | -954 |
| 22/01/2010 | 18:32:16 0ms | 385.40 | 12.86 | 50 | 7,040 | -4,910 | 8,580 | 0.82 | 1,437 | -968 |
| 22/01/2010 | 18:32:26 0ms | 385.30 | 12.82 | 50 | 6,990 | -4,930 | 8,560 | 0.82 | 1,457 | -982 |
| 22/01/2010 | 18:32:36 0ms | 386.00 | 12.86 | 50 | 7,040 | -4,940 | 8,600 | 0.82 | 1,476 | -995 |
| 22/01/2010 | 18:32:46 0ms | 387.10 | 12.85 | 50 | 7,090 | -4,900 | 8,620 | 0.82 | 1,496 | -1,009 |
| 22/01/2010 | 18:32:56 0ms | 387.80 | 12.84 | 50 | 7,150 | -4,810 | 8,620 | 0.83 | 1,516 | -1,022 |
| 22/01/2010 | 18:33:06 0ms | 387.80 | 12.83 | 50 | 7,150 | -4,810 | 8,620 | 0.83 | 1,536 | -1,036 |
| 22/01/2010 | 18:33:16 0ms | 387.80 | 12.83 | 50 | 7,160 | -4,800 | 8,620 | 0.83 | 1,556 | -1,049 |
| 22/01/2010 | 18:33:26 0ms | 387.80 | 12.82 | 50 | 7,150 | -4,800 | 8,620 | 0.83 | 1,575 | -1,063 |
| 22/01/2010 | 18:33:36 0ms | 387.80 | 12.76 | 50 | 7,070 | -4,850 | 8,570 | 0.82 | 1,595 | -1,076 |
| 22/01/2010 | 18:33:46 0ms | 387.80 | 12.75 | 50 | 7,050 | -4,860 | 8,560 | 0.82 | 1,615 | -1,089 |
| 22/01/2010 | 18:33:56 0ms | 388.20 | 12.94 | 50 | 7,130 | -4,990 | 8,700 | 0.82 | 1,635 | -1,103 |
| 22/01/2010 | 18:34:06 0ms | 388.70 | 12.97 | 50 | 7,040 | -5,160 | 8,730 | 0.81 | 1,654 | -1,118 |
| 22/01/2010 | 18:34:16 0ms | 388.70 | 13.00 | 50 | 7,080 | -5,140 | 8,750 | 0.81 | 1,674 | -1,132 |
| 22/01/2010 | 18:34:26 0ms | 389.10 | 13.06 | 50 | 7,160 | -5,120 | 8,800 | 0.81 | 1,694 | -1,146 |
| 22/01/2010 | 18:34:36 0ms | 388.90 | 13.06 | 50 | 7,160 | -5,110 | 8,800 | 0.81 | 1,714 | -1,160 |
| 22/01/2010 | 18:34:46 0ms | 388.60 | 12.94 | 50 | 6,990 | -5,200 | 8,710 | 0.80 | 1,733 | -1,175 |
| 22/01/2010 | 18:34:56 0ms | 388.60 | 12.95 | 50 | 7,010 | -5,180 | 8,720 | 0.80 | 1,753 | -1,189 |
| 22/01/2010 | 18:35:06 0ms | 388.10 | 12.88 | 50 | 6,910 | -5,210 | 8,660 | 0.80 | 1,772 | -1,204 |
| 22/01/2010 | 18:35:16 0ms | 388.30 | 12.99 | 50 | 6,910 | -5,370 | 8,750 | 0.79 | 1,791 | -1,219 |
| 22/01/2010 | 18:35:26 0ms | 389.00 | 13.10 | 50 | 7,020 | -5,350 | 8,830 | 0.79 | 1,810 | -1,234 |
| 22/01/2010 | 18:35:36 0ms | 388.90 | 13.09 | 50 | 7,020 | -5,340 | 8,820 | 0.79 | 1,830 | -1,248 |
| 22/01/2010 | 18:35:46 0ms | 388.90 | 13.10 | 50 | 7,030 | -5,340 | 8,830 | 0.80 | 1,850 | -1,263 |
| 22/01/2010 | 18:35:56 0ms | 388.90 | 13.08 | 50 | 7,000 | -5,360 | 8,810 | 0.79 | 1,869 | -1,278 |
| 22/01/2010 | 18:36:06 0ms | 389.20 | 13.11 | 50 | 7,040 | -5,340 | 8,840 | 0.80 | 1,889 | -1,293 |
| 22/01/2010 | 18:36:16 0ms | 390.00 | 13.39 | 50 | 7,420 | -5,170 | 9,050 | 0.82 | 1,909 | -1,307 |
| 22/01/2010 | 18:36:26 0ms | 389.50 | 13.34 | 50 | 7,390 | -5,140 | 9,000 | 0.82 | 1,930 | -1,322 |
| 22/01/2010 | 18:36:36 0ms | 389.00 | 13.35 | 50 | 7,410 | -5,090 | 8,990 | 0.82 | 1,950 | -1,336 |
| 22/01/2010 | 18:36:46 0ms | 388.60 | 13.31 | 50 | 7,350 | -5,120 | 8,960 | 0.82 | 1,971 | -1,350 |
| 22/01/2010 | 18:36:56 0ms | 387.40 | 13.19 | 50 | 7,210 | -5,130 | 8,850 | 0.81 | 1,991 | -1,364 |
| 22/01/2010 | 18:37:06 0ms | 387.50 | 13.19 | 50 | 7,210 | -5,130 | 8,850 | 0.81 | 2,011 | -1,379 |
| 22/01/2010 | 18:37:16 0ms | 387.20 | 13.17 | 50 | 7,210 | -5,100 | 8,830 | 0.82 | 2,031 | -1,393 |
| 22/01/2010 | 18:37:26 0ms | 385.90 | 13.01 | 50 | 7,110 | -5,010 | 8,700 | 0.82 | 2,050 | -1,406 |
| 22/01/2010 | 18:37:36 0ms | 386.60 | 12.99 | 50 | 7,160 | -4,930 | 8,700 | 0.82 | 2,071 | -1,420 |
| 22/01/2010 | 18:37:46 0ms | 386.60 | 12.98 | 50 | 7,160 | -4,930 | 8,700 | 0.82 | 2,090 | -1,434 |

FIG. 10 - 7

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:37:56 0ms | 386.70 | 12.83 | 50 | 7,080 | -4,870 | 8,600 | 0.82 | 2,110 | -1,448 |
| 22/01/2010 | 18:38:06 0ms | 387.60 | 12.75 | 50 | 7,070 | -4,830 | 8,560 | 0.83 | 2,130 | -1,461 |
| 22/01/2010 | 18:38:16 0ms | 387.50 | 12.72 | 50 | 7,030 | -4,840 | 8,540 | 0.82 | 2,149 | -1,474 |
| 22/01/2010 | 18:38:26 0ms | 387.50 | 12.69 | 50 | 6,990 | -4,860 | 8,520 | 0.82 | 2,169 | -1,488 |
| 22/01/2010 | 18:38:36 0ms | 387.90 | 12.79 | 50 | 6,980 | -5,010 | 8,600 | 0.81 | 2,188 | -1,502 |
| 22/01/2010 | 18:38:46 0ms | 388.50 | 12.94 | 50 | 7,000 | -5,190 | 8,710 | 0.80 | 2,208 | -1,516 |
| 22/01/2010 | 18:38:56 0ms | 388.40 | 12.93 | 50 | 6,990 | -5,180 | 8,700 | 0.80 | 2,227 | -1,531 |
| 22/01/2010 | 18:39:06 0ms | 388.70 | 13.07 | 50 | 7,050 | -5,260 | 8,800 | 0.80 | 2,246 | -1,545 |
| 22/01/2010 | 18:39:16 0ms | 388.80 | 13.11 | 50 | 7,060 | -5,300 | 8,830 | 0.80 | 2,266 | -1,560 |
| 22/01/2010 | 18:39:26 0ms | 388.80 | 13.06 | 50 | 6,990 | -5,340 | 8,800 | 0.79 | 2,286 | -1,575 |
| 22/01/2010 | 18:39:36 0ms | 388.80 | 13.07 | 50 | 7,000 | -5,340 | 8,800 | 0.79 | 2,305 | -1,590 |
| 22/01/2010 | 18:39:46 0ms | 388.70 | 13.07 | 50 | 7,010 | -5,320 | 8,800 | 0.80 | 2,325 | -1,605 |
| 22/01/2010 | 18:39:56 0ms | 389.00 | 13.10 | 50 | 7,050 | -5,310 | 8,830 | 0.80 | 2,344 | -1,619 |
| 22/01/2010 | 18:40:06 0ms | 389.80 | 13.27 | 50 | 7,270 | -5,230 | 8,960 | 0.81 | 2,364 | -1,634 |
| 22/01/2010 | 18:40:16 0ms | 388.90 | 13.26 | 50 | 7,300 | -5,150 | 8,940 | 0.82 | 2,385 | -1,648 |
| 22/01/2010 | 18:40:26 0ms | 387.40 | 13.23 | 50 | 7,280 | -5,070 | 8,880 | 0.82 | 2,405 | -1,662 |
| 22/01/2010 | 18:40:36 0ms | 388.10 | 13.10 | 50 | 7,140 | -5,150 | 8,810 | 0.81 | 2,425 | -1,677 |
| 22/01/2010 | 18:40:46 0ms | 388.70 | 13.08 | 50 | 7,040 | -5,300 | 8,810 | 0.80 | 2,444 | -1,691 |
| 22/01/2010 | 18:40:56 0ms | 388.70 | 13.04 | 50 | 6,970 | -5,340 | 8,780 | 0.79 | 2,464 | -1,706 |
| 22/01/2010 | 18:41:06 0ms | 388.70 | 13.06 | 50 | 6,990 | -5,330 | 8,790 | 0.79 | 2,483 | -1,721 |
| 22/01/2010 | 18:41:16 0ms | 388.70 | 13.05 | 50 | 6,980 | -5,320 | 8,780 | 0.79 | 2,503 | -1,736 |
| 22/01/2010 | 18:41:26 0ms | 388.70 | 13.05 | 50 | 6,990 | -5,330 | 8,790 | 0.79 | 2,522 | -1,751 |
| 22/01/2010 | 18:41:36 0ms | 388.70 | 13.05 | 50 | 6,990 | -5,320 | 8,790 | 0.80 | 2,541 | -1,765 |
| 22/01/2010 | 18:41:46 0ms | 389.30 | 13.31 | 50 | 7,290 | -5,230 | 8,970 | 0.81 | 2,562 | -1,780 |
| 22/01/2010 | 18:41:56 0ms | 387.10 | 13.20 | 50 | 7,260 | -5,060 | 8,850 | 0.82 | 2,582 | -1,794 |
| 22/01/2010 | 18:42:06 0ms | 388.20 | 13.13 | 50 | 7,140 | -5,190 | 8,830 | 0.81 | 2,602 | -1,808 |
| 22/01/2010 | 18:42:16 0ms | 388.60 | 13.05 | 50 | 6,980 | -5,330 | 8,790 | 0.79 | 2,621 | -1,823 |
| 22/01/2010 | 18:42:26 0ms | 388.60 | 13.04 | 50 | 6,970 | -5,340 | 8,780 | 0.79 | 2,640 | -1,838 |
| 22/01/2010 | 18:42:36 0ms | 388.50 | 13.03 | 50 | 6,950 | -5,350 | 8,770 | 0.79 | 2,660 | -1,853 |
| 22/01/2010 | 18:42:46 0ms | 388.50 | 13.04 | 50 | 6,980 | -5,330 | 8,780 | 0.79 | 2,679 | -1,868 |
| 22/01/2010 | 18:42:56 0ms | 388.50 | 13.04 | 50 | 6,980 | -5,330 | 8,780 | 0.79 | 2,699 | -1,883 |
| 22/01/2010 | 18:43:06 0ms | 388.50 | 13.04 | 50 | 6,960 | -5,340 | 8,770 | 0.79 | 2,718 | -1,897 |
| 22/01/2010 | 18:43:16 0ms | 388.50 | 13.03 | 50 | 6,950 | -5,330 | 8,770 | 0.79 | 2,737 | -1,912 |
| 22/01/2010 | 18:43:26 0ms | 388.50 | 13.04 | 50 | 6,980 | -5,320 | 8,780 | 0.79 | 2,757 | -1,927 |
| 22/01/2010 | 18:43:36 0ms | 388.50 | 13.04 | 50 | 6,990 | -5,310 | 8,780 | 0.80 | 2,776 | -1,942 |

FIG. 10 - 8

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:43:46 0ms | 388.40 | 13.03 | 50 | 6,970 | -5,310 | 8,770 | 0.79 | 2,796 | -1,957 |
| 22/01/2010 | 18:43:56 0ms | 388.20 | 13.24 | 50 | 7,250 | -5,170 | 8,910 | 0.81 | 2,816 | -1,971 |
| 22/01/2010 | 18:44:06 0ms | 386.70 | 13.10 | 50 | 7,200 | -5,010 | 8,780 | 0.82 | 2,835 | -1,985 |
| 22/01/2010 | 18:44:16 0ms | 388.50 | 13.09 | 50 | 7,060 | -5,260 | 8,810 | 0.80 | 2,855 | -2,000 |
| 22/01/2010 | 18:44:26 0ms | 388.40 | 13.08 | 50 | 7,050 | -5,260 | 8,800 | 0.80 | 2,875 | -2,014 |
| 22/01/2010 | 18:44:36 0ms | 388.40 | 13.02 | 50 | 6,970 | -5,310 | 8,760 | 0.79 | 2,894 | -2,029 |
| 22/01/2010 | 18:44:46 0ms | 387.70 | 13.11 | 50 | 7,100 | -5,200 | 8,810 | 0.81 | 2,914 | -2,043 |
| 22/01/2010 | 18:44:56 0ms | 386.60 | 13.05 | 50 | 7,130 | -5,050 | 8,740 | 0.82 | 2,933 | -2,057 |
| 22/01/2010 | 18:45:06 0ms | 388.10 | 13.01 | 50 | 7,000 | -5,230 | 8,750 | 0.80 | 2,953 | -2,072 |
| 22/01/2010 | 18:45:16 0ms | 388.40 | 13.01 | 50 | 6,960 | -5,310 | 8,760 | 0.79 | 2,973 | -2,087 |
| 22/01/2010 | 18:45:26 0ms | 388.30 | 13.02 | 50 | 6,950 | -5,320 | 8,760 | 0.79 | 2,992 | -2,102 |
| 22/01/2010 | 18:45:36 0ms | 388.30 | 13.01 | 50 | 6,930 | -5,340 | 8,750 | 0.79 | 3,011 | -2,116 |
| 22/01/2010 | 18:45:46 0ms | 388.30 | 13.02 | 50 | 6,960 | -5,310 | 8,760 | 0.79 | 3,030 | -2,131 |
| 22/01/2010 | 18:45:56 0ms | 388.30 | 13.01 | 50 | 6,940 | -5,330 | 8,750 | 0.79 | 3,050 | -2,146 |
| 22/01/2010 | 18:46:06 0ms | 388.30 | 13.02 | 50 | 6,950 | -5,330 | 8,760 | 0.79 | 3,069 | -2,161 |
| 22/01/2010 | 18:46:16 0ms | 388.30 | 13.00 | 50 | 6,930 | -5,330 | 8,750 | 0.79 | 3,089 | -2,176 |
| 22/01/2010 | 18:46:26 0ms | 388.20 | 13.18 | 50 | 7,190 | -5,180 | 8,860 | 0.81 | 3,109 | -2,190 |
| 22/01/2010 | 18:46:36 0ms | 386.80 | 13.11 | 50 | 7,150 | -5,100 | 8,790 | 0.81 | 3,128 | -2,204 |
| 22/01/2010 | 18:46:46 0ms | 386.80 | 13.12 | 50 | 7,150 | -5,110 | 8,790 | 0.81 | 3,148 | -2,218 |
| 22/01/2010 | 18:46:56 0ms | 386.90 | 13.12 | 50 | 7,160 | -5,110 | 8,800 | 0.81 | 3,168 | -2,233 |
| 22/01/2010 | 18:47:06 0ms | 387.30 | 13.08 | 50 | 7,110 | -5,140 | 8,780 | 0.81 | 3,188 | -2,247 |
| 22/01/2010 | 18:47:16 0ms | 388.30 | 13.02 | 50 | 6,950 | -5,330 | 8,760 | 0.79 | 3,207 | -2,262 |
| 22/01/2010 | 18:47:26 0ms | 388.30 | 13.01 | 50 | 6,940 | -5,320 | 8,750 | 0.79 | 3,226 | -2,276 |
| 22/01/2010 | 18:47:36 0ms | 388.30 | 13.04 | 50 | 6,990 | -5,290 | 8,770 | 0.80 | 3,246 | -2,291 |
| 22/01/2010 | 18:47:46 0ms | 388.30 | 13.03 | 50 | 6,970 | -5,310 | 8,760 | 0.79 | 3,265 | -2,306 |
| 22/01/2010 | 18:47:56 0ms | 388.30 | 13.06 | 50 | 7,020 | -5,280 | 8,780 | 0.80 | 3,290 | -2,320 |
| 22/01/2010 | 18:48:06 0ms | 388.30 | 13.03 | 50 | 6,990 | -5,290 | 8,770 | 0.80 | 3,300 | -2,340 |
| 22/01/2010 | 18:48:16 0ms | 388.30 | 13.01 | 50 | 6,940 | -5,320 | 8,750 | 0.79 | 3,320 | -2,350 |
| 22/01/2010 | 18:48:26 0ms | 388.30 | 13.00 | 50 | 6,930 | -5,330 | 8,740 | 0.79 | 3,340 | -2,370 |
| 22/01/2010 | 18:48:36 0ms | 388.30 | 13.01 | 50 | 6,950 | -5,320 | 8,750 | 0.79 | 3,360 | -2,380 |
| 22/01/2010 | 18:48:46 0ms | 388.30 | 13.00 | 50 | 6,940 | -5,320 | 8,740 | 0.79 | 3,380 | -2,400 |
| 22/01/2010 | 18:48:56 0ms | 388.30 | 13.06 | 50 | 7,030 | -5,270 | 8,780 | 0.80 | 3,400 | -2,410 |
| 22/01/2010 | 18:49:06 0ms | 388.20 | 13.00 | 50 | 6,940 | -5,310 | 8,740 | 0.79 | 3,420 | -2,420 |
| 22/01/2010 | 18:49:16 0ms | 388.30 | 13.00 | 50 | 6,940 | -5,320 | 8,740 | 0.79 | 3,440 | -2,440 |
| 22/01/2010 | 18:49:26 0ms | 388.30 | 13.00 | 50 | 6,950 | -5,310 | 8,750 | 0.79 | 3,460 | -2,450 |

FIG. 10 - 9

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:49:36 0ms | 388.20 | 13.00 | 50 | 6,940 | -5,310 | 8,740 | 0.79 | 3,480 | -2,470 |
| 22/01/2010 | 18:49:46 0ms | 388.20 | 12.97 | 50 | 6,900 | -5,330 | 8,730 | 0.79 | 3,500 | -2,480 |
| 22/01/2010 | 18:49:56 0ms | 388.20 | 13.00 | 50 | 6,940 | -5,310 | 8,740 | 0.79 | 3,520 | -2,500 |
| 22/01/2010 | 18:50:06 0ms | 388.20 | 13.00 | 50 | 6,940 | -5,310 | 8,740 | 0.79 | 3,540 | -2,510 |
| 22/01/2010 | 18:50:16 0ms | 388.20 | 12.97 | 50 | 6,890 | -5,340 | 8,720 | 0.79 | 3,560 | -2,530 |
| 22/01/2010 | 18:50:26 0ms | 388.20 | 12.98 | 50 | 6,920 | -5,320 | 8,730 | 0.79 | 3,570 | -2,540 |
| 22/01/2010 | 18:50:36 0ms | 388.20 | 9.49 | 50 | 4,940 | -3,820 | 6,380 | 0.83 | 3,590 | -2,550 |
| 22/01/2010 | 18:50:46 0ms | 388.20 | 0.13 | 50 | 8 | -63 | 94 | 0.83 | 3,590 | -2,550 |
| 22/01/2010 | 18:50:56 0ms | 388.20 | 0.08 | 50 | 0 | -31 | 58 | 0.83 | 3,590 | -2,550 |
| 22/01/2010 | 18:51:06 0ms | 388.30 | 1.00 | 50 | 580 | -314 | 679 | 0.83 | 3,590 | -2,550 |
| 22/01/2010 | 18:51:16 0ms | 388.10 | 3.46 | 50 | -210 | 820 | 2,330 | 0.83 | 3,590 | -2,550 |
| 22/01/2010 | 18:51:26 0ms | 386.00 | 30.10 | 50 | -9,280 | 17,840 | 20,140 | 0.83 | 3,560 | -2,500 |
| 22/01/2010 | 18:51:36 0ms | 384.20 | 31.80 | 50 | -9,340 | 19,050 | 21,220 | 0.83 | 3,540 | -2,450 |
| 22/01/2010 | 18:51:46 0ms | 384.60 | 31.70 | 50 | -9,130 | 19,100 | 21,180 | 0.83 | 3,510 | -2,400 |
| 22/01/2010 | 18:51:56 0ms | 384.60 | 31.70 | 50 | -9,020 | 19,100 | 21,130 | 0.83 | 3,490 | -2,340 |
| 22/01/2010 | 18:52:06 0ms | 384.70 | 31.80 | 50 | -9,160 | 19,140 | 21,220 | 0.83 | 3,460 | -2,290 |
| 22/01/2010 | 18:52:16 0ms | 384.80 | 31.50 | 50 | -9,040 | 18,990 | 21,040 | 0.83 | 3,440 | -2,240 |
| 22/01/2010 | 18:52:26 0ms | 384.90 | 31.60 | 50 | -8,990 | 19,070 | 21,100 | 0.84 | 3,410 | -2,190 |
| 22/01/2010 | 18:52:36 0ms | 385.10 | 31.50 | 50 | -8,900 | 19,050 | 21,030 | 0.84 | 3,390 | -2,130 |
| 22/01/2010 | 18:52:46 0ms | 385.00 | 31.50 | 50 | -8,820 | 19,090 | 21,030 | 0.84 | 3,360 | -2,080 |
| 22/01/2010 | 18:52:56 0ms | 385.20 | 31.20 | 50 | -8,840 | 18,890 | 20,860 | 0.83 | 3,340 | -2,030 |
| 22/01/2010 | 18:53:06 0ms | 385.20 | 31.50 | 50 | -8,830 | 19,100 | 21,050 | 0.84 | 3,310 | -1,970 |
| 22/01/2010 | 18:53:16 0ms | 385.10 | 31.30 | 50 | -8,800 | 18,970 | 20,920 | 0.84 | 3,290 | -1,920 |
| 22/01/2010 | 18:53:26 0ms | 384.90 | 31.40 | 50 | -8,820 | 19,040 | 20,990 | 0.84 | 3,270 | -1,870 |
| 22/01/2010 | 18:53:36 0ms | 384.50 | 31.10 | 50 | -8,770 | 18,830 | 20,770 | 0.84 | 3,240 | -1,820 |
| 22/01/2010 | 18:53:46 0ms | 384.50 | 31.10 | 50 | -8,800 | 18,790 | 20,760 | 0.84 | 3,220 | -1,760 |
| 22/01/2010 | 18:53:56 0ms | 383.90 | 31.00 | 50 | -8,790 | 18,660 | 20,640 | 0.84 | 3,190 | -1,710 |
| 22/01/2010 | 18:54:06 0ms | 383.80 | 30.90 | 50 | -8,730 | 18,660 | 20,610 | 0.84 | 3,170 | -1,660 |
| 22/01/2010 | 18:54:16 0ms | 384.70 | 31.10 | 50 | -8,680 | 18,850 | 20,760 | 0.84 | 3,140 | -1,610 |
| 22/01/2010 | 18:54:26 0ms | 384.80 | 31.10 | 50 | -8,620 | 18,900 | 20,790 | 0.83 | 3,120 | -1,560 |
| 22/01/2010 | 18:54:36 0ms | 384.90 | 30.80 | 50 | -8,670 | 18,610 | 20,540 | 0.84 | 3,100 | -1,500 |
| 22/01/2010 | 18:54:46 0ms | 384.90 | 30.80 | 50 | -8,740 | 18,610 | 20,560 | 0.84 | 3,070 | -1,450 |
| 22/01/2010 | 18:54:56 0ms | 384.90 | 31.13 | 50 | -8,780 | 18,810 | 20,760 | 0.83 | 3,050 | -1,400 |
| 22/01/2010 | 18:55:06 0ms | 384.90 | 31.06 | 50 | -8,720 | 18,780 | 20,710 | 0.84 | 3,020 | -1,350 |
| 22/01/2010 | 18:55:16 0ms | 384.90 | 31.20 | 50 | -8,770 | 18,860 | 20,800 | 0.83 | 3,000 | -1,300 |

FIG. 10 - 10

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 18:55:26 0ms | 384.30 | 31.24 | 50 | -8,750 | 18,870 | 20,800 | 0.84 | 2,970 | -1,240 |
| 22/01/2010 | 18:55:36 0ms | 384.10 | 31.09 | 50 | -8,660 | 18,780 | 20,690 | 0.84 | 2,950 | -1,190 |
| 22/01/2010 | 18:55:46 0ms | 384.10 | 31.20 | 50 | -8,720 | 18,830 | 20,760 | 0.83 | 2,930 | -1,140 |
| 22/01/2010 | 18:55:56 0ms | 384.30 | 31.08 | 50 | -8,650 | 18,790 | 20,690 | 0.83 | 2,900 | -1,080 |
| 22/01/2010 | 18:56:06 0ms | 383.80 | 30.47 | 50 | -8,490 | 18,400 | 20,280 | 0.84 | 2,880 | -1,030 |
| 22/01/2010 | 18:56:16 0ms | 385.10 | 30.80 | 50 | -8,260 | 18,850 | 20,590 | 0.84 | 2,860 | -990 |
| 22/01/2010 | 18:56:26 0ms | 385.00 | 30.80 | 50 | -8,300 | 18,870 | 20,620 | 0.84 | 2,830 | -930 |
| 22/01/2010 | 18:56:36 0ms | 385.00 | 30.60 | 50 | -8,160 | 18,780 | 20,480 | 0.84 | 2,810 | -880 |
| 22/01/2010 | 18:56:46 0ms | 384.50 | 30.80 | 50 | -8,170 | 18,830 | 20,530 | 0.84 | 2,790 | -830 |
| 22/01/2010 | 18:56:56 0ms | 384.20 | 30.60 | 50 | -8,220 | 18,670 | 20,410 | 0.84 | 2,770 | -780 |
| 22/01/2010 | 18:57:06 0ms | 384.30 | 30.30 | 50 | -8,110 | 18,500 | 20,220 | 0.84 | 2,740 | -730 |
| 22/01/2010 | 18:57:16 0ms | 384.40 | 30.79 | 50 | -8,070 | 18,840 | 20,500 | 0.84 | 2,720 | -670 |
| 22/01/2010 | 18:57:26 0ms | 384.40 | 30.77 | 50 | -8,070 | 18,830 | 20,490 | 0.83 | 2,700 | -620 |
| 22/01/2010 | 18:57:36 0ms | 384.40 | 30.74 | 50 | -8,110 | 18,800 | 20,470 | 0.83 | 2,670 | -570 |
| 22/01/2010 | 18:57:46 0ms | 385.00 | 30.75 | 50 | -8,020 | 18,880 | 20,510 | 0.83 | 2,650 | -520 |
| 22/01/2010 | 18:57:56 0ms | 384.40 | 30.79 | 50 | -8,010 | 18,870 | 20,500 | 0.83 | 2,630 | -460 |
| 22/01/2010 | 18:58:06 0ms | 384.50 | 30.72 | 50 | -8,120 | 18,780 | 20,460 | 0.83 | 2,610 | -410 |
| 22/01/2010 | 18:58:16 0ms | 384.30 | 30.78 | 50 | -8,160 | 18,800 | 20,500 | 0.83 | 2,590 | -360 |
| 22/01/2010 | 18:58:26 0ms | 384.40 | 30.82 | 50 | -8,230 | 18,790 | 20,520 | 0.83 | 2,560 | -310 |
| 22/01/2010 | 18:58:36 0ms | 384.40 | 30.71 | 50 | -8,020 | 18,810 | 20,450 | 0.83 | 2,540 | -260 |
| 22/01/2010 | 18:58:46 0ms | 384.40 | 30.59 | 50 | -7,890 | 18,780 | 20,370 | 0.83 | 2,520 | -200 |
| 22/01/2010 | 18:58:56 0ms | 384.50 | 22.34 | 50 | -7,100 | 13,000 | 14,880 | 0.83 | 2,500 | -160 |
| 22/01/2010 | 18:59:06 0ms | 384.50 | 10.62 | 50 | -4,940 | 5,060 | 7,070 | 0.83 | 2,480 | -150 |
| 22/01/2010 | 18:59:16 0ms | 384.10 | 10.67 | 50 | -4,910 | 5,130 | 7,100 | 0.82 | 2,470 | -140 |
| 22/01/2010 | 18:59:26 0ms | 384.10 | 10.68 | 50 | -4,940 | 5,100 | 7,110 | 0.82 | 2,450 | -120 |
| 22/01/2010 | 18:59:36 0ms | 382.20 | 13.88 | 50 | -5,680 | 7,140 | 9,180 | 0.82 | 2,440 | -100 |
| 22/01/2010 | 18:59:46 0ms | 381.90 | 28.40 | 50 | -7,850 | 17,050 | 18,790 | 0.82 | 2,420 | -60 |
| 22/01/2010 | 18:59:56 0ms | 381.90 | 30.61 | 50 | -7,990 | 18,600 | 20,250 | 0.81 | 2,400 | 0 |
| 22/01/2010 | 19:00:06 0ms | 381.90 | 30.39 | 50 | -8,010 | 18,440 | 20,110 | 0.81 | 2,370 | 50 |
| 22/01/2010 | 19:00:16 0ms | 382.20 | 30.53 | 50 | -7,990 | 18,560 | 20,210 | 0.81 | 2,350 | 100 |
| 22/01/2010 | 19:00:26 0ms | 383.30 | 30.67 | 50 | -7,970 | 18,740 | 20,370 | 0.81 | 2,330 | 150 |
| 22/01/2010 | 19:00:36 0ms | 383.50 | 30.59 | 50 | -7,920 | 18,710 | 20,320 | 0.81 | 2,310 | 200 |
| 22/01/2010 | 19:00:46 0ms | 383.50 | 30.64 | 50 | -7,960 | 18,740 | 20,360 | 0.81 | 2,290 | 260 |
| 22/01/2010 | 19:00:56 0ms | 383.30 | 30.48 | 50 | -7,930 | 18,620 | 20,240 | 0.81 | 2,260 | 310 |
| 22/01/2010 | 19:01:06 0ms | 382.80 | 30.37 | 50 | -7,910 | 18,520 | 20,140 | 0.81 | 2,240 | 360 |

FIG. 10 - 11

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:01:16 0ms | 382.70 | 30.39 | 50 | -8,010 | 18,490 | 20,150 | 0.81 | 2,220 | 410 |
| 22/01/2010 | 19:01:26 0ms | 383.10 | 30.46 | 50 | -8,020 | 18,550 | 20,220 | 0.81 | 2,200 | 460 |
| 22/01/2010 | 19:01:36 0ms | 383.30 | 30.35 | 50 | -8,020 | 18,480 | 20,150 | 0.81 | 2,180 | 510 |
| 22/01/2010 | 19:01:46 0ms | 383.10 | 30.43 | 50 | -8,070 | 18,510 | 20,200 | 0.81 | 2,150 | 570 |
| 22/01/2010 | 19:01:56 0ms | 382.80 | 30.35 | 50 | -8,040 | 18,450 | 20,130 | 0.81 | 2,130 | 620 |
| 22/01/2010 | 19:02:06 0ms | 384.00 | 16.24 | 50 | -5,910 | 8,840 | 10,800 | 0.82 | 2,110 | 640 |
| 22/01/2010 | 19:02:16 0ms | 384.10 | 10.48 | 50 | -4,950 | 4,910 | 6,970 | 0.82 | 2,100 | 660 |
| 22/01/2010 | 19:02:26 0ms | 384.10 | 10.48 | 50 | -4,940 | 4,920 | 6,980 | 0.82 | 2,090 | 670 |
| 22/01/2010 | 19:02:36 0ms | 384.20 | 10.40 | 50 | -4,920 | 4,870 | 6,920 | 0.82 | 2,070 | 680 |
| 22/01/2010 | 19:02:46 0ms | 384.00 | 10.83 | 50 | -4,990 | 5,170 | 7,200 | 0.82 | 2,060 | 700 |
| 22/01/2010 | 19:02:56 0ms | 382.10 | 20.59 | 50 | -7,300 | 11,510 | 13,630 | 0.82 | 2,040 | 730 |
| 22/01/2010 | 19:03:06 0ms | 382.90 | 30.11 | 50 | -8,250 | 18,190 | 19,980 | 0.83 | 2,020 | 780 |
| 22/01/2010 | 19:03:16 0ms | 383.10 | 28.60 | 50 | -7,920 | 17,230 | 18,980 | 0.83 | 1,990 | 830 |
| 22/01/2010 | 19:03:26 0ms | 384.40 | 12.42 | 50 | -5,340 | 6,240 | 8,260 | 0.83 | 1,980 | 840 |
| 22/01/2010 | 19:03:36 0ms | 384.00 | 10.30 | 50 | -4,830 | 4,860 | 6,860 | 0.83 | 1,970 | 860 |
| 22/01/2010 | 19:03:46 0ms | 383.60 | 10.46 | 50 | -4,900 | 4,920 | 6,950 | 0.82 | 1,950 | 870 |
| 22/01/2010 | 19:03:56 0ms | 383.50 | 10.30 | 50 | -4,830 | 4,850 | 6,850 | 0.82 | 1,940 | 890 |
| 22/01/2010 | 19:04:06 0ms | 383.30 | 10.28 | 50 | -4,820 | 4,830 | 6,820 | 0.82 | 1,930 | 900 |
| 22/01/2010 | 19:04:16 0ms | 383.60 | 10.27 | 50 | -4,780 | 4,870 | 6,820 | 0.81 | 1,910 | 910 |
| 22/01/2010 | 19:04:26 0ms | 383.50 | 10.26 | 50 | -4,800 | 4,840 | 6,820 | 0.81 | 1,900 | 930 |
| 22/01/2010 | 19:04:36 0ms | 383.50 | 10.15 | 50 | -4,760 | 4,770 | 6,740 | 0.81 | 1,890 | 940 |
| 22/01/2010 | 19:04:46 0ms | 383.70 | 10.26 | 50 | -4,840 | 4,810 | 6,820 | 0.81 | 1,870 | 950 |
| 22/01/2010 | 19:04:56 0ms | 383.60 | 10.21 | 50 | -4,810 | 4,780 | 6,780 | 0.80 | 1,860 | 970 |
| 22/01/2010 | 19:05:06 0ms | 383.70 | 10.51 | 50 | -4,990 | 4,890 | 6,990 | 0.80 | 1,840 | 980 |
| 22/01/2010 | 19:05:16 0ms | 383.70 | 10.13 | 50 | -4,800 | 4,720 | 6,730 | 0.80 | 1,830 | 990 |
| 22/01/2010 | 19:05:26 0ms | 383.70 | 10.27 | 50 | -4,880 | 4,770 | 6,830 | 0.79 | 1,820 | 1,010 |
| 22/01/2010 | 19:05:36 0ms | 383.70 | 10.22 | 50 | -4,830 | 4,780 | 6,800 | 0.79 | 1,800 | 1,020 |
| 22/01/2010 | 19:05:46 0ms | 383.50 | 10.19 | 50 | -4,820 | 4,760 | 6,770 | 0.79 | 1,790 | 1,030 |
| 22/01/2010 | 19:05:56 0ms | 383.60 | 10.26 | 50 | -4,850 | 4,790 | 6,820 | 0.80 | 1,780 | 1,050 |
| 22/01/2010 | 19:06:06 0ms | 383.70 | 10.27 | 50 | -4,850 | 4,800 | 6,820 | 0.79 | 1,760 | 1,060 |
| 22/01/2010 | 19:06:16 0ms | 383.50 | 10.42 | 50 | -4,910 | 4,870 | 6,920 | 0.80 | 1,750 | 1,070 |
| 22/01/2010 | 19:06:26 0ms | 383.70 | 10.51 | 50 | -5,030 | 4,840 | 6,980 | 0.82 | 1,740 | 1,090 |
| 22/01/2010 | 19:06:36 0ms | 383.70 | 10.35 | 50 | -4,940 | 4,790 | 6,880 | 0.82 | 1,720 | 1,100 |
| 22/01/2010 | 19:06:46 0ms | 383.50 | 10.19 | 50 | -4,810 | 4,760 | 6,770 | 0.82 | 1,710 | 1,110 |
| 22/01/2010 | 19:06:56 0ms | 383.60 | 10.25 | 50 | -4,860 | 4,770 | 6,810 | 0.82 | 1,700 | 1,130 |

FIG. 10 - 12

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:07:06 0ms | 383.70 | 10.40 | 50 | -4,970 | 4,800 | 6,910 | 0.81 | 1,680 | 1,140 |
| 22/01/2010 | 19:07:16 0ms | 383.60 | 10.36 | 50 | -4,910 | 4,830 | 6,890 | 0.81 | 1,670 | 1,150 |
| 22/01/2010 | 19:07:26 0ms | 383.70 | 10.35 | 50 | -4,860 | 4,870 | 6,880 | 0.82 | 1,650 | 1,170 |
| 22/01/2010 | 19:07:36 0ms | 383.70 | 10.29 | 50 | -4,860 | 4,810 | 6,840 | 0.82 | 1,640 | 1,180 |
| 22/01/2010 | 19:07:46 0ms | 383.90 | 10.27 | 50 | -4,800 | 4,860 | 6,830 | 0.82 | 1,630 | 1,190 |
| 22/01/2010 | 19:07:56 0ms | 384.00 | 10.41 | 50 | -4,840 | 4,950 | 6,920 | 0.82 | 1,610 | 1,210 |
| 22/01/2010 | 19:08:06 0ms | 383.90 | 10.32 | 50 | -4,830 | 4,880 | 6,870 | 0.82 | 1,600 | 1,220 |
| 22/01/2010 | 19:08:16 0ms | 384.10 | 10.39 | 50 | -4,810 | 4,960 | 6,910 | 0.83 | 1,590 | 1,230 |
| 22/01/2010 | 19:08:26 0ms | 383.90 | 10.33 | 50 | -4,820 | 4,890 | 6,870 | 0.82 | 1,570 | 1,250 |
| 22/01/2010 | 19:08:36 0ms | 384.00 | 10.31 | 50 | -4,920 | 4,780 | 6,860 | 0.82 | 1,560 | 1,260 |
| 22/01/2010 | 19:08:46 0ms | 383.80 | 10.19 | 50 | -4,780 | 4,800 | 6,780 | 0.81 | 1,550 | 1,270 |
| 22/01/2010 | 19:08:56 0ms | 383.70 | 10.29 | 50 | -4,850 | 4,820 | 6,840 | 0.80 | 1,530 | 1,290 |
| 22/01/2010 | 19:09:06 0ms | 383.80 | 10.26 | 50 | -4,840 | 4,800 | 6,820 | 0.80 | 1,520 | 1,300 |
| 22/01/2010 | 19:09:16 0ms | 383.80 | 10.38 | 50 | -4,870 | 4,890 | 6,900 | 0.80 | 1,510 | 1,310 |
| 22/01/2010 | 19:09:26 0ms | 384.00 | 10.46 | 50 | -4,890 | 4,950 | 6,960 | 0.80 | 1,490 | 1,330 |
| 22/01/2010 | 19:09:36 0ms | 383.60 | 10.32 | 50 | -4,860 | 4,840 | 6,860 | 0.79 | 1,480 | 1,340 |
| 22/01/2010 | 19:09:46 0ms | 383.90 | 10.38 | 50 | -4,880 | 4,880 | 6,900 | 0.79 | 1,470 | 1,360 |
| 22/01/2010 | 19:09:56 0ms | 383.80 | 10.44 | 50 | -4,920 | 4,900 | 6,950 | 0.80 | 1,450 | 1,370 |
| 22/01/2010 | 19:10:06 0ms | 383.60 | 10.41 | 50 | -4,890 | 4,890 | 6,920 | 0.80 | 1,440 | 1,380 |
| 22/01/2010 | 19:10:16 0ms | 383.90 | 10.47 | 50 | -4,930 | 4,920 | 6,970 | 0.81 | 1,430 | 1,400 |
| 22/01/2010 | 19:10:26 0ms | 383.70 | 10.36 | 50 | -4,880 | 4,860 | 6,890 | 0.82 | 1,410 | 1,410 |
| 22/01/2010 | 19:10:36 0ms | 383.90 | 10.39 | 50 | -4,890 | 4,880 | 6,910 | 0.82 | 1,400 | 1,420 |
| 22/01/2010 | 19:10:46 0ms | 383.80 | 10.33 | 50 | -4,870 | 4,830 | 6,860 | 0.81 | 1,380 | 1,440 |
| 22/01/2010 | 19:10:56 0ms | 384.00 | 10.33 | 50 | -4,860 | 4,850 | 6,870 | 0.80 | 1,370 | 1,450 |
| 22/01/2010 | 19:11:06 0ms | 383.80 | 10.24 | 50 | -4,830 | 4,800 | 6,810 | 0.79 | 1,360 | 1,460 |
| 22/01/2010 | 19:11:16 0ms | 383.70 | 10.34 | 50 | -4,880 | 4,830 | 6,870 | 0.79 | 1,340 | 1,480 |
| 22/01/2010 | 19:11:26 0ms | 383.70 | 10.37 | 50 | -4,890 | 4,850 | 6,890 | 0.79 | 1,330 | 1,490 |
| 22/01/2010 | 19:11:36 0ms | 383.90 | 10.47 | 50 | -4,930 | 4,910 | 6,960 | 0.79 | 1,320 | 1,500 |
| 22/01/2010 | 19:11:46 0ms | 384.00 | 10.42 | 50 | -4,910 | 4,890 | 6,930 | 0.80 | 1,300 | 1,520 |
| 22/01/2010 | 19:11:56 0ms | 383.80 | 10.33 | 50 | -4,880 | 4,830 | 6,870 | 0.81 | 1,290 | 1,530 |
| 22/01/2010 | 19:12:06 0ms | 383.90 | 10.31 | 50 | -4,880 | 4,810 | 6,860 | 0.82 | 1,280 | 1,540 |
| 22/01/2010 | 19:12:16 0ms | 384.00 | 10.32 | 50 | -4,870 | 4,840 | 6,870 | 0.81 | 1,260 | 1,560 |
| 22/01/2010 | 19:12:26 0ms | 383.80 | 10.23 | 50 | -4,400 | 4,790 | 6,800 | 0.79 | 1,250 | 1,570 |
| 22/01/2010 | 19:12:36 0ms | 383.10 | 10.36 | 50 | -4,830 | 4,890 | 6,870 | 0.79 | 1,240 | 1,580 |
| 22/01/2010 | 19:12:46 0ms | 383.20 | 10.37 | 50 | -4,860 | 4,880 | 6,890 | 0.79 | 1,220 | 1,600 |

FIG. 10 - 13

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:12:56 0ms | 383.30 | 10.35 | 50 | -4,840 | 4,880 | 6,830 | 0.79 | 1,210 | 1,610 |
| 22/01/2010 | 19:13:06 0ms | 383.20 | 10.26 | 50 | -4,810 | 4,820 | 6,810 | 0.79 | 1,200 | 1,630 |
| 22/01/2010 | 19:13:16 0ms | 383.10 | 10.26 | 50 | -4,820 | 4,810 | 6,810 | 0.79 | 1,180 | 1,640 |
| 22/01/2010 | 19:13:26 0ms | 383.30 | 10.36 | 50 | -4,840 | 4,890 | 6,880 | 0.79 | 1,170 | 1,650 |
| 22/01/2010 | 19:13:36 0ms | 383.20 | 10.39 | 50 | -4,850 | 4,900 | 6,890 | 0.79 | 1,160 | 1,670 |
| 22/01/2010 | 19:13:46 0ms | 383.20 | 10.43 | 50 | -4,850 | 4,940 | 6,930 | 0.80 | 1,140 | 1,680 |
| 22/01/2010 | 19:13:56 0ms | 383.20 | 10.41 | 50 | -4,900 | 4,880 | 6,910 | 0.79 | 1,130 | 1,690 |
| 22/01/2010 | 19:14:06 0ms | 383.30 | 10.47 | 50 | -4,910 | 4,910 | 6,950 | 0.81 | 1,110 | 1,710 |
| 22/01/2010 | 19:14:16 0ms | 383.20 | 10.40 | 50 | -4,860 | 4,900 | 6,900 | 0.82 | 1,100 | 1,720 |
| 22/01/2010 | 19:14:26 0ms | 383.10 | 10.41 | 50 | -4,900 | 4,870 | 6,910 | 0.80 | 1,090 | 1,730 |
| 22/01/2010 | 19:14:36 0ms | 383.40 | 10.48 | 50 | -4,880 | 4,970 | 6,960 | 0.80 | 1,070 | 1,750 |
| 22/01/2010 | 19:14:46 0ms | 383.40 | 10.51 | 50 | -4,890 | 4,980 | 6,930 | 0.79 | 1,060 | 1,760 |
| 22/01/2010 | 19:14:56 0ms | 383.30 | 10.57 | 50 | -4,920 | 5,000 | 7,020 | 0.81 | 1,050 | 1,780 |
| 22/01/2010 | 19:15:06 0ms | 382.00 | 22.70 | 50 | -6,960 | 13,220 | 15,030 | 0.82 | 1,030 | 1,810 |
| 22/01/2010 | 19:15:16 0ms | 384.50 | 30.30 | 50 | -8,430 | 18,360 | 20,210 | 0.80 | 1,000 | 1,860 |
| 22/01/2010 | 19:15:26 0ms | 383.70 | 30.20 | 50 | -8,380 | 18,300 | 20,140 | 0.79 | 980 | 1,920 |
| 22/01/2010 | 19:15:36 0ms | 384.10 | 30.40 | 50 | -8,430 | 18,390 | 20,240 | 0.79 | 960 | 1,970 |
| 22/01/2010 | 19:15:46 0ms | 383.90 | 30.20 | 50 | -7,460 | 18,430 | 20,150 | 0.79 | 940 | 2,020 |
| 22/01/2010 | 19:15:56 0ms | 383.80 | 30.00 | 50 | -6,490 | 18,370 | 20,010 | 0.79 | 920 | 2,070 |
| 22/01/2010 | 19:16:06 0ms | 383.20 | 30.30 | 50 | -630 | 18,770 | 20,110 | 0.79 | 920 | 2,120 |
| 22/01/2010 | 19:16:16 0ms | 383.70 | 30.53 | 50 | -5,130 | 18,870 | 20,300 | 0.79 | 900 | 2,170 |
| 22/01/2010 | 19:16:26 0ms | 384.60 | 15.90 | 50 | -5,570 | 8,800 | 10,590 | 0.79 | 890 | 2,200 |
| 22/01/2010 | 19:16:36 0ms | 384.50 | 10.31 | 50 | -4,750 | 4,960 | 6,870 | 0.81 | 870 | 2,220 |
| 22/01/2010 | 19:16:46 0ms | 384.20 | 10.19 | 50 | -4,400 | 4,870 | 6,780 | 0.81 | 860 | 2,230 |
| 22/01/2010 | 19:16:56 0ms | 384.30 | 10.28 | 50 | -4,790 | 4,890 | 6,850 | 0.81 | 850 | 2,250 |
| 22/01/2010 | 19:17:06 0ms | 383.80 | 10.38 | 50 | -4,900 | 4,850 | 6,900 | 0.81 | 830 | 2,260 |
| 22/01/2010 | 19:17:16 0ms | 383.40 | 10.24 | 50 | -4,810 | 4,810 | 6,800 | 0.81 | 820 | 2,270 |
| 22/01/2010 | 19:17:26 0ms | 383.50 | 10.29 | 50 | -4,820 | 4,840 | 6,840 | 0.79 | 810 | 2,290 |
| 22/01/2010 | 19:17:36 0ms | 383.40 | 10.34 | 50 | -4,840 | 4,870 | 6,870 | 0.79 | 790 | 2,300 |
| 22/01/2010 | 19:17:46 0ms | 383.50 | 10.33 | 50 | -4,830 | 4,870 | 6,860 | 0.80 | 780 | 2,310 |
| 22/01/2010 | 19:17:56 0ms | 383.40 | 10.27 | 50 | -4,390 | 4,860 | 6,820 | 0.79 | 770 | 2,330 |
| 22/01/2010 | 19:18:06 0ms | 383.50 | 10.35 | 50 | -4,830 | 4,890 | 6,870 | 0.80 | 750 | 2,340 |
| 22/01/2010 | 19:18:16 0ms | 383.80 | 10.31 | 50 | -4,790 | 4,900 | 6,850 | 0.80 | 740 | 2,350 |
| 22/01/2010 | 19:18:26 0ms | 383.50 | 10.27 | 50 | -4,810 | 4,840 | 6,820 | 0.79 | 730 | 2,370 |
| 22/01/2010 | 19:18:36 0ms | 383.40 | 10.26 | 50 | -4,800 | 4,830 | 6,820 | 0.79 | 710 | 2,380 |

FIG. 10 - 14

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:18:46 0ms | 384.30 | 8.29 | 50 | -2,170 | 3,680 | 5,520 | 0.79 | 710 | 2,390 |
| 22/01/2010 | 19:18:56 0ms | 383.50 | 7.57 | 50 | -760 | 3,260 | 5,030 | 0.79 | 710 | 2,400 |
| 22/01/2010 | 19:19:06 0ms | 383.70 | 7.58 | 50 | -470 | 3,270 | 5,040 | 0.80 | 700 | 2,410 |
| 22/01/2010 | 19:19:16 0ms | 383.60 | 7.60 | 50 | -3,250 | 3,250 | 5,050 | 0.79 | 700 | 2,420 |
| 22/01/2010 | 19:19:26 0ms | 383.70 | 7.60 | 50 | -2,280 | 3,270 | 5,050 | 0.79 | 690 | 2,430 |
| 22/01/2010 | 19:19:36 0ms | 383.60 | 7.49 | 50 | -770 | 3,200 | 4,980 | 0.79 | 690 | 2,440 |
| 22/01/2010 | 19:19:46 0ms | 383.40 | 7.47 | 50 | -1,600 | 3,190 | 4,960 | 0.79 | 680 | 2,450 |
| 22/01/2010 | 19:19:56 0ms | 383.10 | 10.66 | 50 | -4,590 | 5,240 | 7,070 | 0.79 | 670 | 2,460 |
| 22/01/2010 | 19:20:06 0ms | 383.80 | 9.15 | 50 | -4,420 | 4,180 | 6,080 | 0.79 | 660 | 2,470 |
| 22/01/2010 | 19:20:16 0ms | 381.80 | 9.85 | 50 | -4,670 | 4,540 | 6,520 | 0.79 | 650 | 2,480 |
| 22/01/2010 | 19:20:26 0ms | 381.70 | 10.18 | 50 | -4,770 | 4,750 | 6,730 | 0.79 | 630 | 2,500 |
| 22/01/2010 | 19:20:36 0ms | 384.10 | 7.89 | 50 | -1,560 | 3,410 | 5,250 | 0.79 | 630 | 2,510 |
| 22/01/2010 | 19:20:46 0ms | 383.70 | 7.47 | 50 | -2,890 | 3,160 | 4,960 | 0.83 | 620 | 2,520 |
| 22/01/2010 | 19:20:56 0ms | 383.50 | 7.44 | 50 | -3,790 | 3,170 | 4,950 | 0.83 | 610 | 2,520 |
| 22/01/2010 | 19:21:06 0ms | 383.70 | 7.47 | 50 | -3,220 | 3,180 | 4,960 | 0.83 | 600 | 2,530 |
| 22/01/2010 | 19:21:16 0ms | 383.70 | 7.50 | 50 | -3,820 | 3,200 | 4,990 | 0.83 | 590 | 2,540 |
| 22/01/2010 | 19:21:26 0ms | 383.80 | 7.49 | 50 | -3,510 | 3,190 | 4,980 | 0.83 | 580 | 2,550 |
| 22/01/2010 | 19:21:36 0ms | 383.70 | 7.54 | 50 | -3,240 | 3,200 | 5,020 | 0.83 | 570 | 2,560 |
| 22/01/2010 | 19:21:46 0ms | 383.80 | 7.42 | 50 | -2,000 | 3,160 | 4,930 | 0.83 | 570 | 2,570 |
| 22/01/2010 | 19:21:56 0ms | 383.60 | 7.46 | 50 | -2,880 | 3,170 | 4,960 | 0.83 | 560 | 2,580 |
| 22/01/2010 | 19:22:06 0ms | 383.80 | 11.92 | 50 | -5,050 | 5,980 | 7,920 | 0.83 | 540 | 2,590 |
| 22/01/2010 | 19:22:16 0ms | 382.60 | 9.58 | 50 | -4,570 | 4,400 | 6,350 | 0.83 | 530 | 2,610 |
| 22/01/2010 | 19:22:26 0ms | 381.70 | 10.26 | 50 | -4,780 | 4,810 | 6,780 | 0.83 | 520 | 2,620 |
| 22/01/2010 | 19:22:36 0ms | 381.80 | 10.33 | 50 | -4,800 | 4,860 | 6,840 | 0.84 | 500 | 2,630 |
| 22/01/2010 | 19:22:46 0ms | 381.60 | 10.45 | 50 | -4,840 | 4,920 | 6,910 | 0.84 | 490 | 2,650 |
| 22/01/2010 | 19:22:56 0ms | 381.80 | 10.45 | 50 | -4,830 | 4,940 | 6,910 | 0.84 | 480 | 2,660 |
| 22/01/2010 | 19:23:06 0ms | 381.70 | 10.29 | 50 | -4,080 | 4,820 | 6,810 | 0.83 | 470 | 2,670 |
| 22/01/2010 | 19:23:16 0ms | 381.70 | 10.25 | 50 | -4,790 | 4,800 | 6,780 | 0.84 | 450 | 2,690 |
| 22/01/2010 | 19:23:26 0ms | 381.90 | 10.16 | 50 | -4,740 | 4,770 | 6,730 | 0.84 | 440 | 2,700 |
| 22/01/2010 | 19:23:36 0ms | 381.80 | 10.25 | 50 | -4,780 | 4,800 | 6,780 | 0.84 | 430 | 2,710 |
| 22/01/2010 | 19:23:46 0ms | 381.90 | 10.32 | 50 | -4,800 | 4,850 | 6,830 | 0.84 | 410 | 2,730 |
| 22/01/2010 | 19:23:56 0ms | 382.00 | 10.39 | 50 | -4,830 | 4,890 | 6,880 | 0.84 | 400 | 2,740 |
| 22/01/2010 | 19:24:06 0ms | 382.10 | 10.70 | 50 | -4,950 | 5,070 | 7,080 | 0.84 | 390 | 2,760 |
| 22/01/2010 | 19:24:16 0ms | 382.00 | 10.64 | 50 | -4,920 | 5,030 | 7,040 | 0.84 | 370 | 2,770 |
| 22/01/2010 | 19:24:26 0ms | 382.60 | 9.77 | 50 | -4,650 | 4,500 | 6,470 | 0.84 | 360 | 2,780 |

FIG. 10 - 15

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:24:36 0ms | 383.80 | 7.62 | 50 | -3,880 | 3,250 | 5,060 | 0.83 | 350 | 2,790 |
| 22/01/2010 | 19:24:46 0ms | 383.50 | 7.68 | 50 | -3,600 | 3,310 | 5,100 | 0.84 | 340 | 2,800 |
| 22/01/2010 | 19:26:06 0ms | 384.10 | 7.36 | 50 | -2,570 | 3,090 | 4,900 | 0.33 | 330 | 2,810 |
| 22/01/2010 | 19.26:16 0ms | 383.50 | 11.93 | 50 | -4,720 | 6,000 | 7,920 | 0.84 | 320 | 2,830 |
| 22/01/2010 | 19:26:26 0ms | 383.00 | 9.78 | 50 | -3,990 | 4,530 | 6,490 | 0.84 | 310 | 2,840 |
| 22/01/2010 | 19:26:36 0ms | 381.70 | 10.33 | 50 | -4,810 | 4,850 | 6,830 | 0.84 | 290 | 2,860 |
| 22/01/2010 | 19:26:46 0ms | 381.80 | 19.52 | 50 | -6,790 | 10,960 | 12,910 | 0.84 | 270 | 2,890 |
| 22/01/2010 | 19:26:56 0ms | 382.30 | 29.47 | 50 | -7,760 | 17,900 | 19,510 | 0.84 | 250 | 2,940 |
| 22/01/2010 | 19:27:06 0ms | 383.40 | 22.48 | 50 | -6,990 | 13,070 | 14,930 | 0.34 | 230 | 2,970 |
| 22/01/2010 | 19.27:16 0ms | 384.50 | 8.55 | 50 | -4,180 | 3,850 | 5,690 | 0.84 | 220 | 2,980 |
| 22/01/2010 | 19:27:26 0ms | 383.80 | 7.60 | 50 | -3,520 | 3,280 | 5,050 | 0.84 | 210 | 2,990 |
| 22/01/2010 | 19:27:36 0ms | 383.70 | 7.61 | 50 | -3,550 | 3,270 | 5,060 | 0.83 | 200 | 3,000 |
| 22/01/2010 | 19:27:46 0ms | 383.40 | 10.71 | 50 | -4,620 | 5,270 | 7,110 | 0.83 | 190 | 3,020 |
| 22/01/2010 | 19:27:56 0ms | 383.40 | 9.26 | 50 | -4,480 | 4,210 | 6,150 | 0.33 | 180 | 3,030 |
| 22/01/2010 | 19.28:06 0ms | 381.60 | 9.97 | 50 | -4,640 | 4,670 | 6,590 | 0.83 | 160 | 3,040 |
| 22/01/2010 | 19:28:16 0ms | 381.40 | 10.40 | 50 | -4,780 | 4,930 | 6,870 | 0.83 | 150 | 3,060 |
| 22/01/2010 | 19:28:26 0ms | 381.10 | 10.98 | 50 | -4,970 | 5,260 | 7,250 | 0.83 | 140 | 3,070 |
| 22/01/2010 | 19:28:36 0ms | 381.20 | 13.08 | 50 | -5,500 | 6,630 | 8,630 | 0.83 | 120 | 3,090 |
| 22/01/2010 | 19:28:46 0ms | 383.00 | 10.42 | 50 | -4,820 | 4,950 | 6,910 | 0.83 | 110 | 3,100 |
| 22/01/2010 | 19:28:56 0ms | 383.70 | 9.09 | 50 | -4,360 | 4,170 | 6,040 | 0.83 | 100 | 3,110 |
| 22/01/2010 | 19.29:06 0ms | 384.00 | 7.74 | 50 | -3,910 | 3,340 | 5,150 | 0.83 | 90 | 3,120 |
| 22/01/2010 | 19:29:16 0ms | 383.90 | 7.76 | 50 | -3,910 | 3,360 | 5,160 | 0.83 | 70 | 3,130 |
| 22/01/2010 | 19:29:26 0ms | 383.90 | 7.71 | 50 | -3,910 | 3,320 | 5,130 | 0.82 | 60 | 3,140 |
| 22/01/2010 | 19:29:36 0ms | 384.00 | 7.70 | 50 | -3,900 | 3,320 | 5,120 | 0.82 | 50 | 3,150 |
| 22/01/2010 | 19:29:46 0ms | 383.80 | 7.56 | 50 | -3,840 | 3,240 | 5,020 | 0.82 | 40 | 3,160 |
| 22/01/2010 | 19.29.56 0ms | 383.90 | 7.59 | 50 | -3,860 | 3,250 | 5,050 | 0.82 | 30 | 3,170 |
| 22/01/2010 | 19.30.06 0ms | 383.90 | 11.66 | 50 | -5,020 | 5,780 | 7,750 | 0.81 | 20 | 3,180 |
| 22/01/2010 | 19:30:16 0ms | 383.60 | 9.37 | 50 | -4,220 | 4,280 | 6,230 | 0.81 | 10 | 3,200 |
| 22/01/2010 | 19:30:26 0ms | 381.70 | 10.22 | 50 | -4,780 | 4,770 | 6,760 | 0.81 | -10 | 3,210 |
| 22/01/2010 | 19:30:36 0ms | 380.90 | 18.99 | 50 | -6,640 | 10,600 | 12,530 | 0.81 | -30 | 3,240 |
| 22/01/2010 | 19:30:46 0ms | 381.50 | 20.06 | 50 | -6,900 | 11,320 | 13,250 | 0.81 | -50 | 3,270 |
| 22/01/2010 | 19.30.56 0ms | 381.80 | 25.80 | 50 | -7,500 | 15,290 | 17,060 | 0.81 | -70 | 3,310 |
| 22/01/2010 | 19:31:06 0ms | 383.60 | 28.75 | 50 | -7,800 | 17,430 | 19,100 | 0.81 | -90 | 3,360 |
| 22/01/2010 | 19:31:16 0ms | 384.00 | 15.85 | 50 | -4,440 | 9,550 | 10,550 | 0.81 | -100 | 3,390 |
| 22/01/2010 | 19:31:26 0ms | 384.10 | 13.63 | 50 | -4,200 | -8,040 | 9,070 | 0.81 | -110 | 3,370 |

FIG. 10 - 16

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:31:36 0ms | 384.00 | 15.85 | 50 | -4,860 | -9,350 | 10,540 | 0.81 | -130 | 3,340 |
| 22/01/2010 | 19:31:46 0ms | 384.10 | 15.86 | 50 | -4,860 | -9,360 | 10,550 | 0.81 | -140 | 3,320 |
| 22/01/2010 | 19:31:56 0ms | 383.40 | 20.08 | 50 | -590 | -12,110 | 13,310 | 0.81 | -140 | 3,280 |
| 22/01/2010 | 19:32:06 0ms | 384.40 | 19.31 | 50 | -410 | -12,040 | 12,850 | 0.81 | -140 | 3,250 |
| 22/01/2010 | 19:32:16 0ms | 383.30 | 21.82 | 50 | 2,970 | -14,180 | 14,490 | 0.82 | -140 | 3,210 |
| 22/01/2010 | 19:32:26 0ms | 384.50 | 14.99 | 50 | 6,920 | -6,780 | 9,990 | 0.82 | -120 | 3,190 |
| 22/01/2010 | 19:32:36 0ms | 384.20 | 3.67 | 50 | 1,420 | -1,670 | 2,430 | 0.82 | -110 | 3,190 |
| 22/01/2010 | 19:32:46 0ms | 384.00 | 0.98 | 50 | -140 | -637 | 657 | 0.82 | -110 | 3,180 |
| 22/01/2010 | 19:32:56 0ms | 383.90 | 0.98 | 50 | -80 | -634 | 654 | 0.82 | -110 | 3,180 |
| 22/01/2010 | 19:33:06 0ms | 384.10 | 0.98 | 50 | -77 | -636 | 656 | 0.82 | -110 | 3,180 |
| 22/01/2010 | 19:33:16 0ms | 383.50 | 0.97 | 50 | -112 | -630 | 651 | 0.83 | -110 | 3,180 |
| 22/01/2010 | 19:33:26 0ms | 383.00 | 0.98 | 50 | -96 | -633 | 653 | 0.83 | -110 | 3,180 |
| 22/01/2010 | 19:33:36 0ms | 383.00 | 0.97 | 50 | -137 | -629 | 649 | 0.83 | -110 | 3,170 |
| 22/01/2010 | 19:33:46 0ms | 383.30 | 6.88 | 50 | 3,340 | -2,740 | 4,540 | 0.83 | -110 | 3,170 |
| 22/01/2010 | 19:33:56 0ms | 385.10 | 4.06 | 50 | 1,582 | -2,200 | 2,711 | 0.82 | -100 | 3,160 |
| 22/01/2010 | 19:34:06 0ms | 382.40 | 13.76 | 50 | 7,310 | -5,450 | 9,120 | 0.82 | -80 | 3,150 |
| 22/01/2010 | 19:34:16 0ms | 381.90 | 17.43 | 50 | 5,290 | -9,500 | 11,530 | 0.82 | -70 | 3,120 |
| 22/01/2010 | 19:34:26 0ms | 381.70 | 21.67 | 50 | 2,670 | -14,070 | 14,330 | 0.81 | -60 | 3,080 |
| 22/01/2010 | 19:34:36 0ms | 383.80 | 17.75 | 50 | 5,380 | -9,640 | 11,800 | 0.81 | -50 | 3,060 |
| 22/01/2010 | 19:34:46 0ms | 384.40 | 4.06 | 50 | 1,680 | -1,770 | 2,700 | 0.81 | -40 | 3,050 |
| 22/01/2010 | 19:34:56 0ms | 384.00 | 0.98 | 50 | -95 | -633 | 653 | 0.81 | -40 | 3,050 |
| 22/01/2010 | 19:35:06 0ms | 384.00 | 0.98 | 50 | -127 | -635 | 655 | 0.80 | -40 | 3,050 |
| 22/01/2010 | 19:35:16 0ms | 383.40 | 0.98 | 50 | -128 | -636 | 656 | 0.80 | -40 | 3,050 |
| 22/01/2010 | 19:35:26 0ms | 383.00 | 0.97 | 50 | -116 | -630 | 650 | 0.80 | -40 | 3,040 |
| 22/01/2010 | 19:35:36 0ms | 382.90 | 0.98 | 50 | -96 | -630 | 650 | 0.79 | -40 | 3,040 |
| 22/01/2010 | 19:35:46 0ms | 383.10 | 0.98 | 50 | -110 | -632 | 652 | 0.79 | -40 | 3,040 |
| 22/01/2010 | 19:35:56 0ms | 383.00 | 0.97 | 50 | -101 | -628 | 648 | 0.79 | -40 | 3,040 |
| 22/01/2010 | 19:36:06 0ms | 382.80 | 0.97 | 50 | -90 | -628 | 647 | 0.80 | -40 | 3,040 |
| 22/01/2010 | 19:36:16 0ms | 382.60 | 0.97 | 50 | -73 | -630 | 650 | 0.79 | -40 | 3,030 |
| 22/01/2010 | 19:36:26 0ms | 382.40 | 0.97 | 50 | -75 | -630 | 649 | 0.80 | -40 | 3,030 |
| 22/01/2010 | 19:36:36 0ms | 382.30 | 0.97 | 50 | -63 | -625 | 645 | 0.82 | -50 | 3,030 |
| 22/01/2010 | 19:36:46 0ms | 382.20 | 6.41 | 50 | 3,060 | -2,490 | 4,220 | 0.82 | -40 | 3,020 |
| 22/01/2010 | 19:36:56 0ms | 387.10 | 3.88 | 50 | 1,494 | -2,132 | 2,604 | 0.82 | -30 | 3,020 |
| 22/01/2010 | 19:37:06 0ms | 384.80 | 10.37 | 50 | 5,200 | -4,490 | 6,900 | 0.82 | -20 | 3,010 |
| 22/01/2010 | 19:37:16 0ms | 383.60 | 12.99 | 50 | 6,710 | -5,420 | 8,630 | 0.81 | 0 | 2,990 |

FIG. 10 - 17

| Date | Time | Voltage VOLTS | Current AMPS | Frequency HERTZ | Active Power KW | Reactive Power KWR | Apparent Power KVA | Power Factor | Active Energy KWh | Reactive Energy KWh-R |
|---|---|---|---|---|---|---|---|---|---|---|
| 22/01/2010 | 19:37:26 0ms | 383.50 | 12.96 | 50 | 6,700 | -5,410 | 8,610 | 0.81 | 20 | 2,980 |
| 22/01/2010 | 19:37:36 0ms | 383.40 | 13.20 | 50 | 6,500 | -5,760 | 8,770 | 0.82 | 30 | 2,960 |
| 22/01/2010 | 19:37:46 0ms | 386.70 | 16.43 | 50 | 4,530 | -10,030 | 11,000 | 0.82 | 50 | 2,930 |
| 22/01/2010 | 19:37:56 0ms | 387.40 | 16.35 | 50 | 4,600 | -9,960 | 10,970 | 0.82 | 60 | 2,910 |
| 22/01/2010 | 19:38:06 0ms | 388.10 | 16.21 | 50 | 4,620 | -9,870 | 10,900 | 0.82 | 70 | 2,880 |
| 22/01/2010 | 19:38:16 0ms | 388.30 | 16.19 | 50 | 4,560 | -9,890 | 10,890 | 0.82 | 90 | 2,850 |
| 22/01/2010 | 19:38:26 0ms | 388.30 | 17.23 | 50 | 4,090 | -10,750 | 11,590 | 0.83 | 100 | 2,820 |
| 22/01/2010 | 19:38:36 0ms | 388.70 | 21.98 | 50 | 2,040 | -14,660 | 14,800 | 0.82 | 100 | 2,780 |
| 22/01/2010 | 19:38:46 0ms | 388.60 | 22.02 | 50 | 1,930 | -14,700 | 14,830 | 0.82 | 110 | 2,740 |
| 22/01/2010 | 19:38:56 0ms | 388.70 | 16.97 | 50 | 4,850 | -9,730 | 11,430 | 0.81 | 120 | 2,710 |
| 22/01/2010 | 19:39:06 0ms | 386.90 | 4.51 | 50 | 1,860 | -2,070 | 3,020 | 0.80 | 130 | 2,710 |
| 22/01/2010 | 19:39:16 0ms | 386.20 | 0.46 | 50 | -75 | -274 | 316 | 0.80 | 130 | 2,710 |
| AVERAGES | 1 HOUR 20 Minutes Test | 384.73 | 14.31 | 50 | 102.21 | 2073.06 | 9540.98 | 0.82 | 1476.58 | 406.20 |

FIG. 10 - 18

| Date | Time | Volts | Amps | Freq. | W | VAR | VA | PF | Active | Reactive |
|---|---|---|---|---|---|---|---|---|---|---|
| 22/01/2010 | 18:20:26 | 382 | 13.82 | 50 | 7,640 | -5,080 | 9,120 | 0.84 | 21 | -14 |
| 22/01/2010 | 18:20:36 | 383 | 14.68 | 50 | 8,230 | -5,210 | 9,740 | 0.84 | 42 | -28 |
| 22/01/2010 | 18:20:46 | 383 | 14.52 | 50 | 8,070 | -5,220 | 9,610 | 0.85 | 62 | -42 |
| 22/01/2010 | 18:20:56 | 383 | 13.76 | 50 | 7,620 | -5,000 | 9,100 | 0.85 | 82 | -55 |
| 22/01/2010 | 18:21:06 | 382 | 13.73 | 50 | 7,600 | -5,000 | 9,070 | 0.84 | 102 | -69 |
| 22/01/2010 | 18:21:16 | 382 | 14.75 | 50 | 8,310 | -5,110 | 9,760 | 0.85 | 123 | -82 |
| 22/01/2010 | 18:21:26 | 382 | 13.94 | 50 | 7,750 | -5,160 | 9,230 | 0.85 | 143 | -96 |
| 22/01/2010 | 18:21:36 | 383 | 15.04 | 50 | 8,670 | -5,150 | 9,960 | 0.87 | 163 | -109 |
| 22/01/2010 | 18:21:46 | 382 | 13.72 | 50 | 7,660 | -5,060 | 9,080 | 0.85 | 183 | -122 |
| 22/01/2010 | 18:21:56 | 383 | 13.74 | 50 | 7,790 | -4,940 | 9,080 | 0.87 | 203 | -135 |
| 22/01/2010 | 18:22:06 | 382 | 13.35 | 50 | 7,360 | -4,860 | 8,820 | 0.84 | 222 | -148 |
| 22/01/2010 | 18:22:16 | 384 | 13.62 | 50 | 7,620 | -4,910 | 9,040 | 0.85 | 242 | -161 |
| 22/01/2010 | 18:22:26 | 384 | 13.70 | 50 | 7,770 | -4,810 | 9,120 | 0.86 | 262 | -174 |
| 22/01/2010 | 18:22:36 | 384 | 13.50 | 50 | 7,580 | -4,890 | 8,960 | 0.86 | 282 | -187 |
| 22/01/2010 | 18:22:46 | 383 | 13.61 | 50 | 7,710 | -4,880 | 9,020 | 0.85 | 302 | -200 |
| 22/01/2010 | 18:22:56 | 384 | 13.55 | 50 | 7,650 | -4,820 | 8,990 | 0.86 | 322 | -213 |
| 22/01/2010 | 18:23:06 | 384 | 13.93 | 50 | 7,900 | -4,880 | 9,230 | 0.86 | 342 | -226 |
| 22/01/2010 | 18:23:16 | 385 | 14.58 | 50 | 8,430 | -4,940 | 9,690 | 0.87 | 363 | -239 |
| 22/01/2010 | 18:23:26 | 383 | 14.03 | 50 | 7,880 | -4,950 | 9,310 | 0.85 | 384 | -253 |
| 22/01/2010 | 18:23:36 | 384 | 13.79 | 50 | 7,900 | -4,880 | 9,160 | 0.86 | 404 | -266 |
| 22/01/2010 | 18:23:46 | 384 | 12.82 | 50 | 7,140 | -4,750 | 8,510 | 0.84 | 423 | -279 |
| 22/01/2010 | 18:23:56 | 384 | 13.56 | 50 | 7,640 | -4,830 | 9,000 | 0.85 | 443 | -291 |
| 22/01/2010 | 18:24:06 | 384 | 13.08 | 50 | 7,320 | -4,790 | 8,680 | 0.85 | 463 | -304 |
| 22/01/2010 | 18:24:16 | 384 | 13.11 | 50 | 7,260 | -4,790 | 8,690 | 0.84 | 483 | -317 |
| 22/01/2010 | 18:24:26 | 384 | 13.00 | 50 | 7,270 | -4,710 | 8,640 | 0.84 | 502 | -330 |
| 22/01/2010 | 18:24:36 | 384 | 13.01 | 50 | 7,240 | -4,750 | 8,630 | 0.84 | 522 | -343 |
| 22/01/2010 | 18:24:46 | 383 | 13.24 | 50 | 7,350 | -4,810 | 8,780 | 0.84 | 542 | -356 |
| 22/01/2010 | 18:24:56 | 384 | 13.56 | 50 | 7,590 | -4,830 | 8,990 | 0.84 | 562 | -369 |
| 22/01/2010 | 18:25:06 | 384 | 13.16 | 50 | 7,350 | -4,800 | 8,740 | 0.85 | 582 | -382 |
| 22/01/2010 | 18:25:16 | 384 | 14.28 | 50 | 8,130 | -4,940 | 9,490 | 0.86 | 602 | -395 |
| 22/01/2010 | 18:25:26 | 384 | 13.69 | 50 | 7,730 | -4,950 | 9,110 | 0.85 | 622 | -408 |
| 22/01/2010 | 18:25:36 | 385 | 13.08 | 50 | 7,310 | -4,820 | 8,700 | 0.84 | 642 | -422 |
| 22/01/2010 | 18:25:46 | 386 | 13.83 | 50 | 7,710 | -4,980 | 9,180 | 0.85 | 661 | -435 |
| 22/01/2010 | 18:25:56 | 385 | 14.03 | 50 | 7,860 | -5,040 | 9,320 | 0.85 | 682 | -448 |
| 22/01/2010 | 18:26:06 | 385 | 14.22 | 50 | 8,190 | -5,130 | 9,450 | 0.87 | 703 | -462 |
| 22/01/2010 | 18:26:16 | 384 | 13.76 | 50 | 7,730 | -4,940 | 9,130 | 0.85 | 723 | -475 |
| 22/01/2010 | 18:26:26 | 384 | 13.60 | 50 | 7,570 | -4,950 | 9,030 | 0.85 | 744 | -488 |
| 22/01/2010 | 18:26:36 | 385 | 13.59 | 50 | 7,690 | -4,920 | 9,030 | 0.86 | 765 | -502 |

FIG. 11 - 1

| Date | Time | Volts | Amps | Freq. | W | VAR | VA | PF | Active | Reactive |
|---|---|---|---|---|---|---|---|---|---|---|
| 22/01/2010 | 18:26:46 | 386 | 13.75 | 50 | 7,740 | -4,980 | 9,110 | 0.85 | 785 | -515 |
| 22/01/2010 | 18:26:56 | 385 | 14.80 | 50 | 8,450 | -5,080 | 9,870 | 0.86 | 806 | -528 |
| 22/01/2010 | 18:27:06 | 386 | 14.09 | 50 | 7,950 | -5,030 | 9,380 | 0.86 | 827 | -542 |
| 22/01/2010 | 18:27:16 | 385 | 13.75 | 50 | 7,610 | -5,110 | 9,160 | 0.85 | 847 | -555 |
| 22/01/2010 | 18:27:26 | 384 | 13.31 | 50 | 7,420 | -5,040 | 8,840 | 0.84 | 867 | -569 |
| 22/01/2010 | 18:27:36 | 384 | 13.76 | 50 | 7,730 | -4,980 | 9,140 | 0.85 | 887 | -582 |
| 22/01/2010 | 18:27:46 | 384 | 13.33 | 50 | 7,430 | -4,990 | 8,860 | 0.84 | 907 | -596 |
| 22/01/2010 | 18:27:56 | 384 | 13.31 | 50 | 7,360 | -5,060 | 8,840 | 0.84 | 927 | -609 |
| 22/01/2010 | 18:28:06 | 384 | 13.56 | 50 | 7,610 | -4,940 | 9,030 | 0.84 | 947 | -623 |
| 22/01/2010 | 18:28:16 | 384 | 13.41 | 50 | 7,390 | -4,990 | 8,900 | 0.84 | 967 | -636 |
| 22/01/2010 | 18:28:26 | 384 | 13.33 | 50 | 7,400 | -4,980 | 8,870 | 0.84 | 987 | -649 |
| 22/01/2010 | 18:28:36 | 384 | 13.62 | 50 | 7,620 | -4,970 | 9,050 | 0.84 | 1,007 | -663 |
| 22/01/2010 | 18:28:46 | 387 | 14.72 | 50 | 8,430 | -5,170 | 9,840 | 0.86 | 1,027 | -677 |
| 22/01/2010 | 18:28:56 | 386 | 14.02 | 50 | 7,820 | -5,180 | 9,360 | 0.84 | 1,048 | -691 |
| 22/01/2010 | 18:29:06 | 385 | 13.94 | 50 | 7,830 | -5,110 | 9,310 | 0.84 | 1,068 | -705 |
| 22/01/2010 | 18:29:16 | 385 | 13.36 | 50 | 7,450 | -5,110 | 8,910 | 0.84 | 1,088 | -718 |
| 22/01/2010 | 18:29:26 | 385 | 13.48 | 50 | 7,430 | -5,080 | 8,980 | 0.83 | 1,108 | -732 |
| 22/01/2010 | 18:29:36 | 385 | 13.52 | 50 | 7,490 | -5,150 | 9,010 | 0.83 | 1,128 | -746 |
| 22/01/2010 | 18:29:46 | 385 | 13.22 | 50 | 7,280 | -5,150 | 8,820 | 0.83 | 1,147 | -760 |
| 22/01/2010 | 18:29:56 | 384 | 13.12 | 50 | 7,070 | -5,140 | 8,730 | 0.81 | 1,167 | -774 |
| 22/01/2010 | 18:30:06 | 384 | 13.09 | 50 | 7,040 | -5,140 | 8,700 | 0.81 | 1,186 | -788 |
| 22/01/2010 | 18:30:16 | 384 | 13.07 | 50 | 7,020 | -5,130 | 8,690 | 0.81 | 1,205 | -803 |
| 22/01/2010 | 18:30:26 | 384 | 13.07 | 50 | 7,010 | -5,120 | 8,680 | 0.81 | 1,225 | -817 |
| 22/01/2010 | 18:30:36 | 384 | 13.04 | 50 | 7,020 | -5,110 | 8,660 | 0.81 | 1,244 | -831 |
| 22/01/2010 | 18:30:46 | 384 | 13.02 | 50 | 7,050 | -5,030 | 8,660 | 0.81 | 1,263 | -844 |
| 22/01/2010 | 18:30:56 | 384 | 13.02 | 50 | 7,050 | -5,020 | 8,650 | 0.82 | 1,282 | -858 |
| 22/01/2010 | 18:31:06 | 384 | 12.99 | 50 | 7,030 | -5,010 | 8,630 | 0.82 | 1,302 | -872 |
| 22/01/2010 | 18:31.16 | 384 | 12.98 | 50 | 7,020 | -5,000 | 8,620 | 0.82 | 1,321 | -886 |
| 22/01/2010 | 18:31:26 | 383 | 12.96 | 50 | 7,010 | -5,000 | 8,610 | 0.82 | 1,340 | -900 |
| 22/01/2010 | 18:31:36 | 383 | 12.97 | 50 | 7,010 | -5,000 | 8,610 | 0.82 | 1,359 | -913 |
| 22/01/2010 | 18:31:46 | 383 | 12.96 | 50 | 7,010 | -4,990 | 8,600 | 0.81 | 1,379 | -927 |
| 22/01/2010 | 18:31:56 | 386 | 12.96 | 50 | 7,100 | -5,000 | 8,630 | 0.82 | 1,398 | -941 |
| 22/01/2010 | 18:32:06 | 386 | 13.03 | 50 | 7,170 | -4,950 | 8,710 | 0.82 | 1,418 | -954 |
| 22/01/2010 | 18:32:16 | 386 | 13.03 | 50 | 7,160 | -4,950 | 8,700 | 0.82 | 1,437 | -968 |
| 22/01/2010 | 18:32:26 | 386 | 12.96 | 50 | 7,070 | -4,990 | 8,650 | 0.82 | 1,457 | -982 |
| 22/01/2010 | 18:32:36 | 387 | 13.09 | 50 | 7,170 | -5,080 | 8,760 | 0.82 | 1,476 | -995 |
| 22/01/2010 | 18:32:46 | 388 | 12.99 | 50 | 7,160 | -4,980 | 8,700 | 0.83 | 1,496 | -1,009 |
| 22/01/2010 | 18:32:56 | 388 | 12.98 | 50 | 7,230 | -4,870 | 8,720 | 0.83 | 1,516 | -1,022 |

FIG. 11 - 2

| Date | Time | Volts | Amps | Freq. | W | VAR | VA | PF | Active | Reactive |
|---|---|---|---|---|---|---|---|---|---|---|
| 22/01/2010 | 18:33:06 | 388 | 12.97 | 50 | 7,240 | -4,870 | 8,720 | 0.83 | 1,536 | -1,036 |
| 22/01/2010 | 18:33:16 | 388 | 12.96 | 50 | 7,230 | -4,860 | 8,710 | 0.83 | 1,556 | -1,049 |
| 22/01/2010 | 18:33:26 | 388 | 12.97 | 50 | 7,250 | -4,850 | 8,720 | 0.83 | 1,575 | -1,063 |
| 22/01/2010 | 18:33:36 | 388 | 12.91 | 50 | 7,150 | -4,920 | 8,670 | 0.83 | 1,595 | -1,076 |
| 22/01/2010 | 18:33:46 | 388 | 12.89 | 50 | 7,130 | -4,920 | 8,660 | 0.82 | 1,615 | -1,089 |
| 22/01/2010 | 18:33:56 | 389 | 13.24 | 50 | 7,280 | -5,190 | 8,920 | 0.82 | 1,635 | -1,103 |
| 22/01/2010 | 18:34:06 | 389 | 13.15 | 50 | 7,190 | -5,220 | 8,860 | 0.81 | 1,654 | -1,118 |
| 22/01/2010 | 18:34:16 | 389 | 13.16 | 50 | 7,180 | -5,230 | 8,860 | 0.81 | 1,674 | -1,132 |
| 22/01/2010 | 18:34:26 | 390 | 13.20 | 50 | 7,270 | -5,260 | 8,900 | 0.82 | 1,694 | -1,146 |
| 22/01/2010 | 18:34:36 | 390 | 13.29 | 50 | 7,370 | -5,210 | 8,960 | 0.82 | 1,714 | -1,160 |
| 22/01/2010 | 18:34:46 | 389 | 13.09 | 50 | 7,080 | -5,280 | 8,810 | 0.80 | 1,733 | -1,175 |
| 22/01/2010 | 18:34:56 | 389 | 13.10 | 50 | 7,090 | -5,290 | 8,820 | 0.81 | 1,753 | -1,189 |
| 22/01/2010 | 18:35:06 | 388 | 13.07 | 50 | 7,080 | -5,300 | 8,790 | 0.81 | 1,772 | -1,204 |
| 22/01/2010 | 18:35:16 | 389 | 13.23 | 50 | 7,100 | -5,480 | 8,920 | 0.80 | 1,791 | -1,219 |
| 22/01/2010 | 18:35:26 | 389 | 13.26 | 50 | 7,170 | -5,420 | 8,940 | 0.80 | 1,810 | -1,234 |
| 22/01/2010 | 18:35:36 | 389 | 13.23 | 50 | 7,100 | -5,400 | 8,910 | 0.80 | 1,830 | -1,248 |
| 22/01/2010 | 18:35:46 | 389 | 13.23 | 50 | 7,120 | -5,450 | 8,920 | 0.80 | 1,850 | -1,263 |
| 22/01/2010 | 18:35:56 | 389 | 13.22 | 50 | 7,090 | -5,440 | 8,910 | 0.80 | 1,869 | -1,278 |
| 22/01/2010 | 18:36:06 | 390 | 13.27 | 50 | 7,260 | -5,480 | 8,960 | 0.81 | 1,889 | -1,293 |
| 22/01/2010 | 18:36:16 | 390 | 13.55 | 50 | 7,530 | -5,250 | 9,160 | 0.82 | 1,909 | -1,307 |
| 22/01/2010 | 18:36:26 | 391 | 13.49 | 50 | 7,500 | -5,250 | 9,100 | 0.82 | 1,930 | -1,322 |
| 22/01/2010 | 18:36:36 | 389 | 13.49 | 50 | 7,500 | -5,150 | 9,090 | 0.82 | 1,950 | -1,336 |
| 22/01/2010 | 18:36:46 | 391 | 13.58 | 50 | 7,510 | -5,300 | 9,190 | 0.82 | 1,971 | -1,350 |
| 22/01/2010 | 18:36:56 | 388 | 13.33 | 50 | 7,310 | -5,190 | 8,950 | 0.82 | 1,991 | -1,364 |
| 22/01/2010 | 18:37:06 | 388 | 13.34 | 50 | 7,310 | -5,180 | 8,960 | 0.82 | 2,011 | -1,379 |
| 22/01/2010 | 18:37:16 | 388 | 13.31 | 50 | 7,280 | -5,180 | 8,930 | 0.82 | 2,031 | -1,393 |
| 22/01/2010 | 18:37:26 | 387 | 13.20 | 50 | 7,250 | -5,060 | 8,820 | 0.82 | 2,050 | -1,406 |
| 22/01/2010 | 18:37:36 | 387 | 13.15 | 50 | 7,250 | -5,000 | 8,810 | 0.82 | 2,071 | -1,420 |
| 22/01/2010 | 18:37:46 | 387 | 13.14 | 50 | 7,250 | -5,000 | 8,800 | 0.82 | 2,090 | -1,434 |
| 22/01/2010 | 18:37:56 | 388 | 13.10 | 50 | 7,230 | -5,010 | 8,780 | 0.83 | 2,110 | -1,448 |
| 22/01/2010 | 18:38:06 | 388 | 12.94 | 50 | 7,220 | -4,860 | 8,700 | 0.83 | 2,130 | -1,461 |
| 22/01/2010 | 18:38:16 | 388 | 12.87 | 50 | 7,120 | -4,900 | 8,650 | 0.82 | 2,149 | -1,474 |
| 22/01/2010 | 18:38:26 | 388 | 12.86 | 50 | 7,110 | -4,900 | 8,640 | 0.82 | 2,169 | -1,488 |
| 22/01/2010 | 18:38:36 | 389 | 12.98 | 50 | 7,090 | -5,190 | 8,740 | 0.82 | 2,188 | -1,502 |
| 22/01/2010 | 18:38:46 | 389 | 13.08 | 50 | 7,080 | -5,240 | 8,810 | 0.80 | 2,208 | -1,516 |
| 22/01/2010 | 18:38:56 | 389 | 13.07 | 50 | 7,080 | -5,240 | 8,800 | 0.80 | 2,227 | -1,531 |
| 22/01/2010 | 18:39:06 | 389 | 13.29 | 50 | 7,190 | -5,360 | 8,950 | 0.81 | 2,246 | -1,545 |
| 22/01/2010 | 18:39:16 | 389 | 13.27 | 50 | 7,180 | -5,360 | 8,940 | 0.80 | 2,266 | -1,560 |

FIG. 11 - 3

| Date | Time | Volts | Amps | Freq. | W | VAR | VA | PF | Active | Reactive |
|---|---|---|---|---|---|---|---|---|---|---|
| 22/01/2010 | 18:39:26 | 389 | 13.20 | 50 | 7,090 | -5,430 | 8,900 | 0.80 | 2,286 | -1,575 |
| 22/01/2010 | 18:39:36 | 389 | 13.22 | 50 | 7,100 | -5,380 | 8,910 | 0.80 | 2,305 | -1,590 |
| 22/01/2010 | 18:39:46 | 389 | 13.24 | 50 | 7,160 | -5,390 | 8,920 | 0.80 | 2,325 | -1,605 |
| 22/01/2010 | 18:39:56 | 389 | 13.30 | 50 | 7,210 | -5,390 | 8,970 | 0.81 | 2,344 | -1,619 |
| 22/01/2010 | 18:40:06 | 391 | 13.49 | 50 | 7,470 | -5,280 | 9,120 | 0.82 | 2,364 | -1,634 |
| 22/01/2010 | 18:40:16 | 390 | 13.54 | 50 | 7,470 | -5,270 | 9,140 | 0.82 | 2,385 | -1,648 |
| 22/01/2010 | 18:40:26 | 390 | 13.47 | 50 | 7,410 | -5,330 | 9,100 | 0.82 | 2,405 | -1,662 |
| 22/01/2010 | 18:40:36 | 389 | 13.35 | 50 | 7,350 | -5,320 | 8,960 | 0.83 | 2,425 | -1,677 |
| 22/01/2010 | 18:40:46 | 389 | 13.28 | 50 | 7,180 | -5,420 | 8,940 | 0.80 | 2,444 | -1,691 |
| 22/01/2010 | 18:40:56 | 389 | 13.20 | 50 | 7,080 | -5,440 | 8,890 | 0.80 | 2,464 | -1,706 |
| 22/01/2010 | 18:41:06 | 389 | 13.20 | 50 | 7,080 | -5,400 | 8,890 | 0.80 | 2,483 | -1,721 |
| 22/01/2010 | 18:41:16 | 389 | 13.20 | 50 | 7,080 | -5,390 | 8,890 | 0.80 | 2,503 | -1,736 |
| 22/01/2010 | 18:41:26 | 389 | 13.19 | 50 | 7,090 | -5,380 | 8,880 | 0.80 | 2,522 | -1,751 |
| 22/01/2010 | 18:41:36 | 389 | 13.17 | 50 | 7,110 | -5,440 | 8,870 | 0.80 | 2,541 | -1,765 |
| 22/01/2010 | 18:41:46 | 391 | 13.51 | 50 | 7,500 | -5,370 | 9,140 | 0.82 | 2,562 | -1,780 |
| 22/01/2010 | 18:41:56 | 387 | 13.35 | 50 | 7,350 | -5,110 | 8,960 | 0.82 | 2,582 | -1,794 |
| 22/01/2010 | 18:42:06 | 389 | 13.37 | 50 | 7,340 | -5,340 | 9,010 | 0.83 | 2,602 | -1,808 |
| 22/01/2010 | 18:42:16 | 389 | 13.19 | 50 | 7,070 | -5,390 | 8,880 | 0.80 | 2,621 | -1,823 |
| 22/01/2010 | 18:42:26 | 389 | 13.16 | 50 | 7,030 | -5,450 | 8,860 | 0.80 | 2,640 | -1,838 |
| 22/01/2010 | 18:42:36 | 389 | 13.19 | 50 | 7,060 | -5,420 | 8,880 | 0.80 | 2,660 | -1,853 |
| 22/01/2010 | 18:42:46 | 389 | 13.18 | 50 | 7,060 | -5,380 | 8,870 | 0.80 | 2,679 | -1,868 |
| 22/01/2010 | 18:42:56 | 389 | 13.17 | 50 | 7,060 | -5,390 | 8,870 | 0.80 | 2,699 | -1,883 |
| 22/01/2010 | 18:43:06 | 389 | 13.17 | 50 | 7,050 | -5,420 | 8,870 | 0.80 | 2,718 | -1,897 |
| 22/01/2010 | 18:43:16 | 389 | 13.19 | 50 | 7,060 | -5,390 | 8,880 | 0.80 | 2,737 | -1,912 |
| 22/01/2010 | 18:43:26 | 389 | 13.18 | 50 | 7,090 | -5,440 | 8,880 | 0.80 | 2,757 | -1,927 |
| 22/01/2010 | 18:43:36 | 389 | 13.22 | 50 | 7,140 | -5,430 | 8,900 | 0.80 | 2,776 | -1,942 |
| 22/01/2010 | 18:43:46 | 389 | 13.18 | 50 | 7,070 | -5,380 | 8,870 | 0.80 | 2,796 | -1,957 |
| 22/01/2010 | 18:43:56 | 391 | 13.68 | 50 | 7,560 | -5,360 | 9,260 | 0.83 | 2,816 | -1,971 |
| 22/01/2010 | 18:44:06 | 388 | 13.27 | 50 | 7,310 | -5,150 | 8,900 | 0.83 | 2,835 | -1,985 |
| 22/01/2010 | 18:44:16 | 389 | 13.23 | 50 | 7,150 | -5,380 | 8,910 | 0.81 | 2,855 | -2,000 |
| 22/01/2010 | 18:44:26 | 389 | 13.23 | 50 | 7,160 | -5,420 | 8,900 | 0.80 | 2,875 | -2,014 |
| 22/01/2010 | 18:44:36 | 389 | 13.18 | 50 | 7,130 | -5,420 | 8,880 | 0.80 | 2,894 | -2,029 |
| 22/01/2010 | 18:44:46 | 392 | 13.34 | 50 | 7,240 | -5,470 | 9,050 | 0.82 | 2,914 | -2,043 |
| 22/01/2010 | 18:44:56 | 387 | 13.26 | 50 | 7,240 | -5,160 | 8,890 | 0.83 | 2,933 | -2,057 |
| 22/01/2010 | 18:45:06 | 389 | 13.23 | 50 | 7,210 | -5,360 | 8,900 | 0.82 | 2,953 | -2,072 |
| 22/01/2010 | 18:45:16 | 389 | 13.16 | 50 | 7,050 | -5,370 | 8,860 | 0.80 | 2,973 | -2,087 |
| 22/01/2010 | 18:45:26 | 389 | 13.15 | 50 | 7,030 | -5,380 | 8,840 | 0.80 | 2,992 | -2,102 |
| 22/01/2010 | 18:45:36 | 388 | 13.16 | 50 | 7,040 | -5,420 | 8,860 | 0.80 | 3,011 | -2,116 |

FIG. 11 - 4

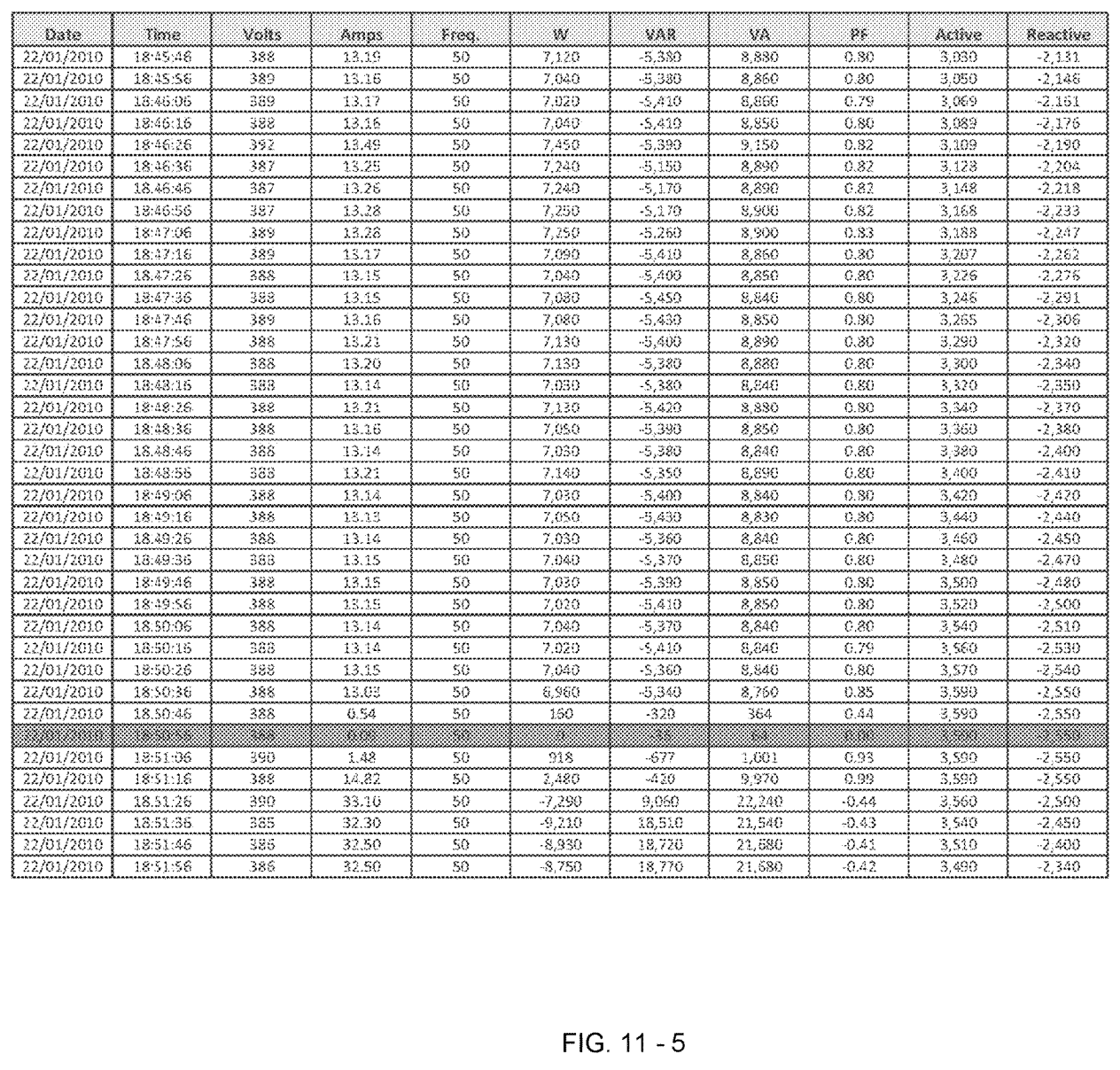

| Date | Time | Volts | Amps | Freq. | W | VAR | VA | PF | Active | Reactive |
|---|---|---|---|---|---|---|---|---|---|---|
| 22/01/2010 | 18:45:46 | 388 | 13.19 | 50 | 7,120 | -5,380 | 8,880 | 0.80 | 3,030 | -2,131 |
| 22/01/2010 | 18:45:56 | 389 | 13.16 | 50 | 7,040 | -5,380 | 8,860 | 0.80 | 3,050 | -2,146 |
| 22/01/2010 | 18:46:06 | 389 | 13.17 | 50 | 7,020 | -5,410 | 8,860 | 0.79 | 3,069 | -2,161 |
| 22/01/2010 | 18:46:16 | 388 | 13.16 | 50 | 7,040 | -5,410 | 8,850 | 0.80 | 3,089 | -2,176 |
| 22/01/2010 | 18:46:26 | 392 | 13.49 | 50 | 7,450 | -5,390 | 9,150 | 0.82 | 3,109 | -2,190 |
| 22/01/2010 | 18:46:36 | 387 | 13.25 | 50 | 7,240 | -5,150 | 8,890 | 0.82 | 3,128 | -2,204 |
| 22/01/2010 | 18:46:46 | 387 | 13.26 | 50 | 7,240 | -5,170 | 8,890 | 0.82 | 3,148 | -2,218 |
| 22/01/2010 | 18:46:56 | 387 | 13.28 | 50 | 7,250 | -5,170 | 8,900 | 0.82 | 3,168 | -2,233 |
| 22/01/2010 | 18:47:06 | 389 | 13.28 | 50 | 7,250 | -5,260 | 8,900 | 0.83 | 3,188 | -2,247 |
| 22/01/2010 | 18:47:16 | 389 | 13.17 | 50 | 7,090 | -5,410 | 8,860 | 0.80 | 3,207 | -2,262 |
| 22/01/2010 | 18:47:26 | 388 | 13.15 | 50 | 7,040 | -5,400 | 8,850 | 0.80 | 3,226 | -2,276 |
| 22/01/2010 | 18:47:36 | 388 | 13.15 | 50 | 7,080 | -5,450 | 8,840 | 0.80 | 3,246 | -2,291 |
| 22/01/2010 | 18:47:46 | 389 | 13.16 | 50 | 7,080 | -5,430 | 8,850 | 0.80 | 3,265 | -2,306 |
| 22/01/2010 | 18:47:56 | 388 | 13.21 | 50 | 7,130 | -5,400 | 8,890 | 0.80 | 3,290 | -2,320 |
| 22/01/2010 | 18:48:06 | 388 | 13.20 | 50 | 7,130 | -5,380 | 8,880 | 0.80 | 3,300 | -2,340 |
| 22/01/2010 | 18:48:16 | 388 | 13.14 | 50 | 7,030 | -5,380 | 8,840 | 0.80 | 3,320 | -2,350 |
| 22/01/2010 | 18:48:26 | 388 | 13.21 | 50 | 7,130 | -5,420 | 8,880 | 0.80 | 3,340 | -2,370 |
| 22/01/2010 | 18:48:36 | 388 | 13.16 | 50 | 7,050 | -5,390 | 8,850 | 0.80 | 3,360 | -2,380 |
| 22/01/2010 | 18:48:46 | 388 | 13.14 | 50 | 7,030 | -5,380 | 8,840 | 0.80 | 3,380 | -2,400 |
| 22/01/2010 | 18:48:56 | 388 | 13.21 | 50 | 7,140 | -5,350 | 8,890 | 0.80 | 3,400 | -2,410 |
| 22/01/2010 | 18:49:06 | 388 | 13.14 | 50 | 7,030 | -5,400 | 8,840 | 0.80 | 3,420 | -2,420 |
| 22/01/2010 | 18:49:16 | 388 | 13.13 | 50 | 7,050 | -5,430 | 8,830 | 0.80 | 3,440 | -2,440 |
| 22/01/2010 | 18:49:26 | 388 | 13.14 | 50 | 7,030 | -5,360 | 8,840 | 0.80 | 3,460 | -2,450 |
| 22/01/2010 | 18:49:36 | 388 | 13.15 | 50 | 7,040 | -5,370 | 8,850 | 0.80 | 3,480 | -2,470 |
| 22/01/2010 | 18:49:46 | 388 | 13.15 | 50 | 7,030 | -5,390 | 8,850 | 0.80 | 3,500 | -2,480 |
| 22/01/2010 | 18:49:56 | 388 | 13.15 | 50 | 7,020 | -5,410 | 8,850 | 0.80 | 3,520 | -2,500 |
| 22/01/2010 | 18:50:06 | 388 | 13.14 | 50 | 7,040 | -5,370 | 8,840 | 0.80 | 3,540 | -2,510 |
| 22/01/2010 | 18:50:16 | 388 | 13.14 | 50 | 7,020 | -5,410 | 8,840 | 0.79 | 3,560 | -2,530 |
| 22/01/2010 | 18:50:26 | 388 | 13.15 | 50 | 7,040 | -5,360 | 8,840 | 0.80 | 3,570 | -2,540 |
| 22/01/2010 | 18:50:36 | 388 | 13.03 | 50 | 6,960 | -5,340 | 8,760 | 0.85 | 3,590 | -2,550 |
| 22/01/2010 | 18:50:46 | 388 | 0.54 | 50 | 160 | -320 | 364 | 0.44 | 3,590 | -2,550 |
| 22/01/2010 | 18:50:56 | 388 | [illegible] | 50 | 1 | [illegible] | [illegible] | [illegible] | 3,590 | -2,550 |
| 22/01/2010 | 18:51:06 | 390 | 1.48 | 50 | 918 | -677 | 1,001 | 0.93 | 3,590 | -2,550 |
| 22/01/2010 | 18:51:16 | 388 | 14.82 | 50 | 3,480 | -430 | 9,970 | 0.99 | 3,590 | -2,550 |
| 22/01/2010 | 18:51:26 | 390 | 33.10 | 50 | -7,290 | 9,060 | 22,240 | -0.44 | 3,560 | -2,500 |
| 22/01/2010 | 18:51:36 | 385 | 32.30 | 50 | -9,210 | 18,510 | 21,540 | -0.43 | 3,540 | -2,450 |
| 22/01/2010 | 18:51:46 | 385 | 32.50 | 50 | -8,930 | 18,720 | 21,680 | -0.41 | 3,510 | -2,400 |
| 22/01/2010 | 18:51:56 | 386 | 32.50 | 50 | -8,750 | 18,770 | 21,680 | -0.42 | 3,490 | -2,340 |

FIG. 11 - 5

| Date | Time | Volts | Amps | Freq. | W | VAR | VA | PF | Active | Reactive |
|---|---|---|---|---|---|---|---|---|---|---|
| 22/01/2010 | 18:52:06 | 386 | 32.40 | 50 | -8,930 | 18,610 | 21,650 | -0.42 | 3,460 | -2,290 |
| 22/01/2010 | 18:52:16 | 386 | 32.20 | 50 | -8,820 | 18,270 | 21,500 | -0.42 | 3,440 | -2,240 |
| 22/01/2010 | 18:52:26 | 386 | 32.60 | 50 | -8,710 | 18,520 | 21,770 | -0.41 | 3,410 | -2,190 |
| 22/01/2010 | 18:52:36 | 387 | 32.10 | 50 | -8,570 | 18,630 | 21,540 | -0.41 | 3,390 | -2,130 |
| 22/01/2010 | 18:52:46 | 386 | 32.60 | 50 | -8,570 | 17,950 | 21,820 | -0.41 | 3,360 | -2,080 |
| 22/01/2010 | 18:52:56 | 387 | 32.40 | 50 | -8,600 | 18,210 | 21,630 | -0.41 | 3,340 | -2,030 |
| 22/01/2010 | 18:53:06 | 386 | 32.60 | 50 | -8,710 | 18,580 | 21,740 | -0.41 | 3,310 | -1,970 |
| 22/01/2010 | 18:53:16 | 386 | 32.30 | 50 | -8,640 | 18,390 | 21,560 | -0.41 | 3,290 | -1,920 |
| 22/01/2010 | 18:53:26 | 388 | 33.00 | 50 | -8,710 | 18,290 | 21,860 | -0.40 | 3,270 | -1,870 |
| 22/01/2010 | 18:53:36 | 385 | 31.80 | 50 | -8,570 | 18,200 | 21,170 | -0.41 | 3,240 | -1,820 |
| 22/01/2010 | 18:53:46 | 385 | 31.90 | 50 | -8,680 | 18,210 | 21,330 | -0.41 | 3,220 | -1,760 |
| 22/01/2010 | 18:53:56 | 386 | 31.90 | 50 | -8,600 | 18,120 | 21,300 | -0.41 | 3,190 | -1,710 |
| 22/01/2010 | 18:54:06 | 385 | 31.80 | 50 | -8,530 | 18,210 | 21,200 | -0.41 | 3,170 | -1,660 |
| 22/01/2010 | 18:54:16 | 386 | 31.90 | 50 | -8,420 | 18,270 | 21,240 | -0.40 | 3,140 | -1,610 |
| 22/01/2010 | 18:54:26 | 386 | 32.30 | 50 | -8,380 | 18,260 | 21,490 | -0.40 | 3,120 | -1,560 |
| 22/01/2010 | 18:54:36 | 386 | 32.50 | 50 | -8,490 | 14,320 | 21,680 | -0.40 | 3,100 | -1,500 |
| 22/01/2010 | 18:54:46 | 386 | 31.60 | 50 | -8,570 | 18,040 | 21,170 | -0.42 | 3,070 | -1,450 |
| 22/01/2010 | 18:54:56 | 386 | 32.37 | 50 | -8,520 | 18,320 | 21,640 | -0.41 | 3,050 | -1,400 |
| 22/01/2010 | 18:55:06 | 386 | 31.73 | 50 | -8,560 | 18,450 | 21,150 | -0.41 | 3,020 | -1,350 |
| 22/01/2010 | 18:55:16 | 386 | 31.88 | 50 | -8,570 | 18,370 | 21,290 | -0.41 | 3,000 | -1,300 |
| 22/01/2010 | 18:55:26 | 386 | 32.08 | 50 | -8,590 | 18,290 | 21,370 | -0.41 | 2,970 | -1,240 |
| 22/01/2010 | 18:55:36 | 386 | 31.99 | 50 | -8,480 | 18,070 | 21,320 | -0.40 | 2,950 | -1,190 |
| 22/01/2010 | 18:55:46 | 385 | 32.33 | 50 | -8,420 | 18,360 | 21,510 | -0.41 | 2,930 | -1,140 |
| 22/01/2010 | 18:55:56 | 385 | 31.59 | 50 | -8,420 | 17,990 | 21,060 | -0.40 | 2,900 | -1,080 |
| 22/01/2010 | 18:56:06 | 386 | 32.30 | 50 | -5,610 | 7,190 | 21,580 | -0.40 | 2,880 | -1,030 |
| 22/01/2010 | 18:56:16 | 386 | 31.60 | 50 | -8,070 | 18,120 | 21,090 | -0.39 | 2,860 | -990 |
| 22/01/2010 | 18:56:26 | 386 | 31.40 | 50 | -8,000 | 18,270 | 20,960 | -0.39 | 2,830 | -930 |
| 22/01/2010 | 18:56:36 | 387 | 31.30 | 50 | -7,920 | 18,060 | 20,870 | -0.38 | 2,810 | -880 |
| 22/01/2010 | 18:56:46 | 386 | 31.40 | 50 | -8,030 | 18,520 | 21,040 | -0.39 | 2,790 | -830 |
| 22/01/2010 | 18:56:56 | 385 | 31.40 | 50 | -8,030 | 18,170 | 20,950 | -0.39 | 2,770 | -780 |
| 22/01/2010 | 18:57:06 | 385 | 32.10 | 50 | -7,950 | 12,750 | 21,350 | -0.38 | 2,740 | -730 |
| 22/01/2010 | 18:57:16 | 386 | 31.33 | 50 | -7,910 | 18,390 | 20,880 | -0.39 | 2,720 | -670 |
| 22/01/2010 | 18:57:26 | 385 | 31.44 | 50 | -7,980 | 18,290 | 20,940 | -0.39 | 2,700 | -620 |
| 22/01/2010 | 18:57:36 | 386 | 31.40 | 50 | -8,020 | 18,400 | 20,940 | -0.39 | 2,670 | -570 |
| 22/01/2010 | 18:57:46 | 386 | 31.69 | 50 | -7,850 | 18,270 | 21,180 | -0.38 | 2,650 | -520 |
| 22/01/2010 | 18:57:56 | 386 | 31.66 | 50 | -7,890 | 18,210 | 21,070 | -0.38 | 2,630 | -460 |
| 22/01/2010 | 18:58:06 | 386 | 31.52 | 50 | -7,870 | 18,190 | 20,990 | -0.39 | 2,610 | -410 |
| 22/01/2010 | 18:58:16 | 386 | 31.63 | 50 | -7,910 | 18,280 | 21,150 | -0.38 | 2,590 | -360 |

FIG. 11 - 6

| Date | Time | Volts | Amps | Freq. | W | VAR | VA | PF | Active | Reactive |
|---|---|---|---|---|---|---|---|---|---|---|
| 22/01/2010 | 18:58:26 | 388 | 31.67 | 50 | -7,970 | 18,470 | 21,070 | -0.39 | 2,560 | -310 |
| 22/01/2010 | 18:58:36 | 385 | 31.94 | 50 | -7,800 | 18,350 | 21,280 | -0.38 | 2,540 | -260 |
| 22/01/2010 | 18:58:46 | 385 | 31.40 | 50 | -7,800 | 18,310 | 20,910 | -0.38 | 2,520 | -200 |
| 22/01/2010 | 18:58:56 | 386 | 31.38 | 50 | -4,960 | 5,030 | 20,980 | -0.38 | 2,500 | -160 |
| 22/01/2010 | 18:59:06 | 388 | 11.38 | 50 | -4,570 | 4,370 | 7,640 | -0.68 | 2,480 | -150 |
| 22/01/2010 | 18:59:16 | 385 | 11.25 | 50 | -4,790 | 4,950 | 7,510 | -0.68 | 2,470 | -140 |
| 22/01/2010 | 18:59:26 | 387 | 11.13 | 51 | -4,220 | 3,800 | 7,410 | -0.68 | 2,460 | -120 |
| 22/01/2010 | 18:59:36 | 385 | 20.89 | 50 | -4,840 | 4,790 | 13,810 | -0.51 | 2,440 | -100 |
| 22/01/2010 | 18:59:46 | 383 | 31.30 | 50 | -7,020 | 11,250 | 20,760 | -0.38 | 2,420 | -50 |
| 22/01/2010 | 18:59:56 | 383 | 33.09 | 50 | -7,850 | 18,070 | 21,900 | -0.37 | 2,400 | 0 |
| 22/01/2010 | 19:00:06 | 383 | 31.62 | 50 | -7,860 | 17,900 | 20,940 | -0.38 | 2,370 | 50 |
| 22/01/2010 | 19:00:16 | 383 | 31.92 | 50 | -7,850 | 18,100 | 21,080 | -0.39 | 2,350 | 100 |
| 22/01/2010 | 19:00:26 | 387 | 33.93 | 50 | -7,850 | 17,200 | 22,550 | -0.36 | 2,330 | 150 |
| 22/01/2010 | 19:00:36 | 384 | 31.45 | 50 | -7,770 | 18,050 | 20,890 | -0.38 | 2,310 | 200 |
| 22/01/2010 | 19:00:46 | 385 | 31.66 | 50 | -7,810 | 18,010 | 21,080 | -0.38 | 2,290 | 260 |
| 22/01/2010 | 19:00:56 | 385 | 30.99 | 50 | -7,790 | 18,150 | 20,610 | -0.39 | 2,260 | 310 |
| 22/01/2010 | 19:01:06 | 384 | 31.48 | 50 | -7,720 | 18,000 | 20,960 | -0.38 | 2,240 | 360 |
| 22/01/2010 | 19:01:16 | 384 | 33.62 | 50 | -7,740 | 17,380 | 22,300 | -0.38 | 2,220 | 410 |
| 22/01/2010 | 19:01:26 | 385 | 31.56 | 50 | -7,850 | 17,850 | 20,950 | -0.38 | 2,200 | 460 |
| 22/01/2010 | 19:01:36 | 384 | 31.05 | 50 | -7,890 | 18,030 | 20,620 | -0.39 | 2,180 | 510 |
| 22/01/2010 | 19:01:46 | 385 | 31.38 | 50 | -7,840 | 17,990 | 20,870 | -0.39 | 2,150 | 570 |
| 22/01/2010 | 19:01:56 | 384 | 31.97 | 50 | -7,850 | 17,710 | 21,200 | -0.39 | 2,130 | 620 |
| 22/01/2010 | 19:02:06 | 387 | 30.68 | 50 | -4,740 | 4,570 | 20,350 | -0.39 | 2,110 | 640 |
| 22/01/2010 | 19:02:16 | 385 | 10.76 | 50 | -4,880 | 4,770 | 7,170 | -0.70 | 2,100 | 660 |
| 22/01/2010 | 19:02:26 | 386 | 10.71 | 50 | -4,850 | 4,760 | 7,130 | -0.70 | 2,090 | 670 |
| 22/01/2010 | 19:02:36 | 385 | 10.80 | 50 | -4,730 | 4,620 | 7,210 | -0.70 | 2,070 | 680 |
| 22/01/2010 | 19:02:46 | 385 | 20.44 | 50 | -4,740 | 4,680 | 13,500 | -0.53 | 2,060 | 700 |
| 22/01/2010 | 19:02:56 | 383 | 21.10 | 50 | -7,170 | 11,100 | 13,970 | -0.52 | 2,040 | 730 |
| 22/01/2010 | 19:03:06 | 385 | 31.63 | 50 | -7,550 | 13,220 | 20,990 | -0.38 | 2,020 | 780 |
| 22/01/2010 | 19:03:16 | 386 | 30.98 | 50 | -7,180 | 11,710 | 20,540 | -0.39 | 1,990 | 830 |
| 22/01/2010 | 19:03:26 | 386 | 20.92 | 50 | -4,670 | 4,620 | 13,830 | -0.52 | 1,980 | 840 |
| 22/01/2010 | 19:03:36 | 388 | 11.32 | 51 | -4,540 | 4,230 | 7,610 | -0.68 | 1,970 | 860 |
| 22/01/2010 | 19:03:46 | 385 | 10.91 | 50 | -4,770 | 4,750 | 7,250 | -0.69 | 1,950 | 870 |
| 22/01/2010 | 19:03:56 | 385 | 10.77 | 50 | -4,660 | 4,660 | 7,150 | -0.70 | 1,940 | 890 |
| 22/01/2010 | 19:04:06 | 385 | 11.09 | 50 | -4,420 | 4,180 | 7,360 | -0.70 | 1,930 | 900 |
| 22/01/2010 | 19:04:16 | 384 | 11.01 | 50 | -4,630 | 4,550 | 7,320 | -0.69 | 1,910 | 910 |
| 22/01/2010 | 19:04:26 | 385 | 11.04 | 50 | -4,620 | 4,600 | 7,350 | -0.69 | 1,900 | 930 |
| 22/01/2010 | 19:04:36 | 385 | 10.60 | 50 | -4,640 | 4,550 | 7,040 | -0.70 | 1,890 | 940 |

FIG. 11 - 7

| Date | Time | Volts | Amps | Freq. | W | VAR | VA | PF | Active | Reactive |
|---|---|---|---|---|---|---|---|---|---|---|
| 22/01/2010 | 19:04:46 | 385 | 11.04 | 50 | -4,600 | 4,430 | 7,340 | -0.70 | 1,870 | 950 |
| 22/01/2010 | 19:04:56 | 385 | 10.61 | 50 | -4,690 | 4,660 | 7,050 | -0.71 | 1,860 | 970 |
| 22/01/2010 | 19:05:06 | 385 | 11.39 | 50 | -4,750 | 4,590 | 7,550 | -0.70 | 1,840 | 980 |
| 22/01/2010 | 19:05:16 | 385 | 10.84 | 50 | -4,560 | 4,450 | 7,200 | -0.70 | 1,830 | 990 |
| 22/01/2010 | 19:05:26 | 385 | 11.08 | 50 | -4,610 | 4,520 | 7,360 | -0.71 | 1,820 | 1,010 |
| 22/01/2010 | 19:05:36 | 385 | 10.74 | 50 | -4,690 | 4,510 | 7,170 | -0.70 | 1,800 | 1,020 |
| 22/01/2010 | 19:05:46 | 384 | 10.59 | 50 | -4,570 | 4,400 | 7,040 | -0.70 | 1,790 | 1,030 |
| 22/01/2010 | 19:05:56 | 386 | 10.66 | 50 | -4,690 | 4,510 | 7,120 | -0.70 | 1,780 | 1,050 |
| 22/01/2010 | 19:06:06 | 385 | 11.07 | 50 | -4,630 | 4,470 | 7,370 | -0.69 | 1,760 | 1,060 |
| 22/01/2010 | 19:06:16 | 387 | 13.03 | 51 | -4,670 | 4,440 | 8,540 | -0.68 | 1,750 | 1,070 |
| 22/01/2010 | 19:06:26 | 385 | 11.18 | 50 | -4,770 | 4,650 | 7,430 | -0.70 | 1,740 | 1,090 |
| 22/01/2010 | 19:06:36 | 385 | 11.06 | 50 | -4,620 | 4,370 | 7,380 | -0.69 | 1,720 | 1,100 |
| 22/01/2010 | 19:06:46 | 385 | 10.73 | 50 | -4,640 | 4,490 | 7,140 | -0.70 | 1,710 | 1,110 |
| 22/01/2010 | 19:06:56 | 385 | 10.64 | 50 | -4,750 | 4,560 | 7,070 | -0.70 | 1,700 | 1,130 |
| 22/01/2010 | 19:07:06 | 386 | 11.04 | 50 | -4,650 | 4,420 | 7,380 | -0.70 | 1,680 | 1,140 |
| 22/01/2010 | 19:07:16 | 385 | 10.87 | 50 | -4,640 | 4,450 | 7,250 | -0.70 | 1,670 | 1,150 |
| 22/01/2010 | 19:07:26 | 385 | 10.84 | 50 | -4,720 | 4,650 | 7,230 | -0.69 | 1,650 | 1,170 |
| 22/01/2010 | 19:07:36 | 385 | 11.09 | 50 | -4,660 | 4,550 | 7,360 | -0.69 | 1,640 | 1,180 |
| 22/01/2010 | 19:07:46 | 386 | 11.00 | 50 | -4,580 | 4,520 | 7,330 | -0.69 | 1,630 | 1,190 |
| 22/01/2010 | 19:07:56 | 386 | 10.93 | 50 | -4,620 | 4,440 | 7,280 | -0.69 | 1,610 | 1,210 |
| 22/01/2010 | 19:08:06 | 385 | 10.79 | 50 | -4,660 | 4,570 | 7,210 | -0.69 | 1,600 | 1,220 |
| 22/01/2010 | 19:08:16 | 385 | 10.97 | 50 | -4,670 | 4,750 | 7,300 | -0.68 | 1,590 | 1,230 |
| 22/01/2010 | 19:08:26 | 385 | 10.98 | 50 | -4,770 | 4,750 | 7,310 | -0.69 | 1,570 | 1,250 |
| 22/01/2010 | 19:08:36 | 385 | 10.91 | 50 | -4,610 | 4,400 | 7,280 | -0.70 | 1,560 | 1,260 |
| 22/01/2010 | 19:08:46 | 385 | 10.56 | 50 | -4,660 | 4,610 | 7,020 | -0.70 | 1,550 | 1,270 |
| 22/01/2010 | 19:08:56 | 385 | 10.72 | 50 | -4,740 | 4,680 | 7,130 | -0.70 | 1,530 | 1,290 |
| 22/01/2010 | 19:09:06 | 385 | 11.53 | 50 | -4,630 | 4,460 | 7,690 | -0.69 | 1,520 | 1,300 |
| 22/01/2010 | 19:09:16 | 385 | 10.96 | 50 | -4,640 | 4,550 | 7,290 | -0.69 | 1,510 | 1,310 |
| 22/01/2010 | 19:09:26 | 386 | 11.00 | 50 | -4,690 | 4,600 | 7,350 | -0.69 | 1,490 | 1,330 |
| 22/01/2010 | 19:09:36 | 384 | 11.25 | 50 | -4,680 | 4,560 | 7,490 | -0.70 | 1,480 | 1,340 |
| 22/01/2010 | 19:09:46 | 386 | 10.82 | 50 | -4,620 | 4,470 | 7,220 | -0.70 | 1,470 | 1,360 |
| 22/01/2010 | 19:09:56 | 387 | 11.85 | 50 | -4,660 | 4,420 | 7,960 | -0.68 | 1,450 | 1,370 |
| 22/01/2010 | 19:10:06 | 385 | 10.99 | 50 | -4,780 | 4,670 | 7,320 | -0.70 | 1,440 | 1,380 |
| 22/01/2010 | 19:10:16 | 385 | 11.10 | 50 | -4,820 | 4,700 | 7,380 | -0.70 | 1,430 | 1,400 |
| 22/01/2010 | 19:10:26 | 385 | 10.80 | 50 | -4,760 | 4,660 | 7,170 | -0.70 | 1,410 | 1,410 |
| 22/01/2010 | 19:10:36 | 386 | 10.93 | 50 | -4,750 | 4,570 | 7,270 | -0.70 | 1,400 | 1,420 |
| 22/01/2010 | 19:10:46 | 385 | 10.80 | 50 | -4,700 | 4,560 | 7,180 | -0.70 | 1,380 | 1,440 |
| 22/01/2010 | 19:10:56 | 386 | 10.94 | 50 | -4,580 | 4,500 | 7,280 | -0.70 | 1,370 | 1,450 |

FIG. 11 - 8

| Date | Time | Volts | Amps | Freq. | W | VAR | VA | PF | Active | Reactive |
|---|---|---|---|---|---|---|---|---|---|---|
| 22/01/2010 | 19:11:06 | 386 | 10.81 | 50 | -4,630 | 4,510 | 7,210 | -0.69 | 1,360 | 1,460 |
| 22/01/2010 | 19:11:16 | 385 | 10.44 | 50 | -4,780 | 4,710 | 6,950 | -0.71 | 1,340 | 1,480 |
| 22/01/2010 | 19:11:26 | 385 | 10.70 | 50 | -4,780 | 4,680 | 7,140 | -0.70 | 1,330 | 1,490 |
| 22/01/2010 | 19:11:36 | 386 | 11.27 | 50 | -4,810 | 4,740 | 7,520 | -0.69 | 1,320 | 1,500 |
| 22/01/2010 | 19:11:46 | 385 | 11.36 | 50 | -4,760 | 4,600 | 7,570 | -0.69 | 1,300 | 1,520 |
| 22/01/2010 | 19:11:56 | 385 | 10.64 | 50 | -4,700 | 4,530 | 7,070 | -0.71 | 1,290 | 1,530 |
| 22/01/2010 | 19:12:06 | 387 | 10.93 | 50 | -4,700 | 4,520 | 7,270 | -0.70 | 1,280 | 1,540 |
| 22/01/2010 | 19:12:16 | 386 | 10.73 | 50 | -4,740 | 4,580 | 7,150 | -0.70 | 1,260 | 1,560 |
| 22/01/2010 | 19:12:26 | 386 | 11.45 | 51 | 5,100 | 3,250 | 7,550 | 0.73 | 1,250 | 1,570 |
| 22/01/2010 | 19:12:36 | 385 | 10.92 | 50 | -4,580 | 4,550 | 7,230 | -0.69 | 1,240 | 1,580 |
| 22/01/2010 | 19:12:46 | 384 | 10.86 | 50 | -4,730 | 4,620 | 7,230 | -0.69 | 1,220 | 1,600 |
| 22/01/2010 | 19:12:56 | 385 | 10.91 | 50 | -4,590 | 4,370 | 7,280 | -0.69 | 1,210 | 1,610 |
| 22/01/2010 | 19:13:06 | 384 | 11.04 | 50 | -4,630 | 4,520 | 7,350 | -0.69 | 1,200 | 1,630 |
| 22/01/2010 | 19:13:16 | 384 | 10.77 | 50 | -4,690 | 4,600 | 7,150 | -0.70 | 1,180 | 1,640 |
| 22/01/2010 | 19:13:26 | 384 | 10.75 | 50 | -4,670 | 4,590 | 7,130 | -0.69 | 1,170 | 1,650 |
| 22/01/2010 | 19:13:36 | 384 | 10.73 | 50 | -4,750 | 4,740 | 7,170 | -0.69 | 1,160 | 1,670 |
| 22/01/2010 | 19:13:46 | 384 | 10.73 | 50 | -4,710 | 4,730 | 7,140 | -0.69 | 1,140 | 1,680 |
| 22/01/2010 | 19:13:56 | 386 | 11.40 | 50 | -4,650 | 4,510 | 7,580 | -0.69 | 1,130 | 1,690 |
| 22/01/2010 | 19:14:06 | 386 | 11.37 | 50 | -4,720 | 4,540 | 7,570 | -0.69 | 1,110 | 1,710 |
| 22/01/2010 | 19:14:16 | 386 | 11.08 | 50 | -4,660 | 4,560 | 7,400 | -0.69 | 1,100 | 1,720 |
| 22/01/2010 | 19:14:26 | 385 | 11.10 | 50 | -4,730 | 4,600 | 7,380 | -0.69 | 1,090 | 1,730 |
| 22/01/2010 | 19:14:36 | 384 | 11.24 | 50 | -4,750 | 4,790 | 7,480 | -0.68 | 1,070 | 1,750 |
| 22/01/2010 | 19:14:46 | 385 | 10.94 | 50 | -4,770 | 4,710 | 7,270 | -0.69 | 1,060 | 1,760 |
| 22/01/2010 | 19:14:56 | 385 | 11.19 | 50 | -4,760 | 4,700 | 7,440 | -0.69 | 1,050 | 1,780 |
| 22/01/2010 | 19:15:06 | 385 | 30.20 | 50 | -4,720 | 4,820 | 20,120 | -0.39 | 1,030 | 1,810 |
| 22/01/2010 | 19:15:16 | 386 | 31.20 | 50 | -7,790 | 17,860 | 20,760 | -0.39 | 1,000 | 1,860 |
| 22/01/2010 | 19:15:26 | 385 | 31.20 | 50 | -7,920 | 17,230 | 20,750 | -0.40 | 980 | 1,920 |
| 22/01/2010 | 19:15:36 | 386 | 32.00 | 50 | -7,790 | 17,420 | 21,320 | -0.40 | 960 | 1,970 |
| 22/01/2010 | 19:15:46 | 385 | 32.10 | 50 | 7,950 | 17,600 | 21,370 | 0.39 | 940 | 2,020 |
| 22/01/2010 | 19:15:56 | 386 | 32.30 | 50 | 8,340 | 16,640 | 21,420 | 0.41 | 920 | 2,070 |
| 22/01/2010 | 19:16:06 | 385 | 30.73 | 50 | 7,290 | 18,080 | 20,520 | 0.36 | 920 | 2,120 |
| 22/01/2010 | 19:16:16 | 385 | 31.10 | 50 | 7,480 | 18,490 | 20,660 | 0.37 | 900 | 2,170 |
| 22/01/2010 | 19:16:26 | 385 | 30.60 | 50 | -4,720 | 4,930 | 20,340 | -0.36 | 890 | 2,200 |
| 22/01/2010 | 19:16:36 | 387 | 10.99 | 50 | -4,540 | 4,600 | 7,330 | -0.68 | 870 | 2,220 |
| 22/01/2010 | 19:16:46 | 386 | 11.34 | 50 | 3,790 | 3,190 | 7,570 | 0.77 | 860 | 2,230 |
| 22/01/2010 | 19:16:56 | 386 | 10.83 | 50 | -4,490 | 4,510 | 7,210 | -0.69 | 850 | 2,250 |
| 22/01/2010 | 19:17:06 | 388 | 11.20 | 50 | -4,550 | 4,310 | 7,410 | -0.69 | 830 | 2,260 |
| 22/01/2010 | 19:17:16 | 385 | 10.55 | 50 | -4,710 | 4,540 | 7,010 | -0.70 | 820 | 2,270 |

FIG. 11 - 9

| Date | Time | Volts | Amps | Freq. | W | VAR | VA | PF | Active | Reactive |
|---|---|---|---|---|---|---|---|---|---|---|
| 22/01/2010 | 19:17:26 | 384 | 10.55 | 50 | -4,740 | 4,710 | 7,010 | -0.70 | 810 | 2,290 |
| 22/01/2010 | 19:17:36 | 384 | 10.81 | 50 | -4,620 | 4,510 | 7,180 | -0.69 | 790 | 2,300 |
| 22/01/2010 | 19:17:46 | 385 | 10.80 | 50 | -4,680 | 4,620 | 7,170 | -0.70 | 780 | 2,310 |
| 22/01/2010 | 19:17:56 | 386 | 10.75 | 51 | 4,940 | 4,190 | 7,140 | 0.72 | 770 | 2,330 |
| 22/01/2010 | 19:18:06 | 386 | 10.66 | 50 | -4,660 | 4,580 | 7,080 | -0.69 | 750 | 2,340 |
| 22/01/2010 | 19:18:16 | 385 | 10.71 | 50 | -4,270 | 4,110 | 7,130 | -0.69 | 740 | 2,350 |
| 22/01/2010 | 19:18:26 | 385 | 10.75 | 50 | -4,720 | 4,660 | 7,170 | -0.70 | 730 | 2,370 |
| 22/01/2010 | 19:18:36 | 386 | 10.83 | 50 | -4,680 | 4,600 | 7,240 | -0.69 | 710 | 2,380 |
| 22/01/2010 | 19:18:46 | 388 | 10.38 | 51 | 4,090 | 2,900 | 6,890 | 0.77 | 710 | 2,390 |
| 22/01/2010 | 19:18:56 | 386 | 7.72 | 51 | 3,890 | 3,140 | 5,130 | 0.77 | 710 | 2,400 |
| 22/01/2010 | 19:19:06 | 385 | 7.82 | 50 | 3,890 | 3,160 | 5,200 | 0.76 | 700 | 2,410 |
| 22/01/2010 | 19:19:16 | 385 | 7.95 | 50 | 3,730 | 2,770 | 5,270 | 0.79 | 700 | 2,420 |
| 22/01/2010 | 19:19:26 | 386 | 7.93 | 50 | 3,940 | 2,880 | 5,270 | 0.78 | 690 | 2,430 |
| 22/01/2010 | 19:19:36 | 386 | 7.71 | 50 | 3,910 | 3,060 | 5,120 | 0.77 | 690 | 2,440 |
| 22/01/2010 | 19:19:46 | 385 | 7.68 | 50 | 3,850 | 3,040 | 5,100 | 0.77 | 680 | 2,450 |
| 22/01/2010 | 19:19:56 | 389 | 25.77 | 50 | -3,720 | 3,070 | 17,030 | -0.44 | 670 | 2,460 |
| 22/01/2010 | 19:20:06 | 385 | 9.46 | 50 | -4,150 | 3,820 | 6,320 | -0.71 | 660 | 2,470 |
| 22/01/2010 | 19:20:16 | 386 | 10.51 | 50 | -4,320 | 3,980 | 6,960 | -0.70 | 650 | 2,480 |
| 22/01/2010 | 19:20:26 | 383 | 10.46 | 50 | -4,670 | 4,580 | 6,910 | -0.70 | 630 | 2,500 |
| 22/01/2010 | 19:20:36 | 387 | 10.30 | 50 | 3,870 | 3,020 | 6,810 | 0.78 | 630 | 2,510 |
| 22/01/2010 | 19:20:46 | 385 | 7.98 | 50 | 3,800 | 2,920 | 5,310 | 0.78 | 620 | 2,520 |
| 22/01/2010 | 19:20:56 | 385 | 7.69 | 50 | -3,680 | 3,030 | 5,120 | -0.76 | 610 | 2,520 |
| 22/01/2010 | 19:21:06 | 385 | 7.84 | 50 | 3,680 | 2,890 | 5,200 | 0.78 | 600 | 2,530 |
| 22/01/2010 | 19:21:16 | 386 | 7.76 | 50 | -3,720 | 3,070 | 5,160 | -0.76 | 590 | 2,540 |
| 22/01/2010 | 19:21:26 | 386 | 7.80 | 50 | 3,710 | 3,030 | 5,160 | 0.77 | 580 | 2,550 |
| 22/01/2010 | 19:21:36 | 387 | 7.96 | 50 | 3,760 | 3,010 | 5,280 | 0.78 | 570 | 2,560 |
| 22/01/2010 | 19:21:46 | 386 | 7.73 | 51 | 3,840 | 3,000 | 5,140 | 0.77 | 570 | 2,570 |
| 22/01/2010 | 19:21:56 | 385 | 7.79 | 50 | 3,760 | 3,030 | 5,180 | 0.78 | 560 | 2,580 |
| 22/01/2010 | 19:22:06 | 389 | 26.66 | 50 | -4,070 | 3,600 | 17,640 | -0.43 | 540 | 2,590 |
| 22/01/2010 | 19:22:16 | 387 | 10.67 | 50 | -3,980 | 3,430 | 7,050 | -0.70 | 530 | 2,610 |
| 22/01/2010 | 19:22:26 | 384 | 10.72 | 50 | -4,610 | 4,430 | 7,090 | -0.70 | 520 | 2,620 |
| 22/01/2010 | 19:22:36 | 384 | 10.88 | 50 | -4,510 | 4,450 | 7,190 | -0.69 | 500 | 2,630 |
| 22/01/2010 | 19:22:46 | 384 | 10.93 | 50 | -4,710 | 4,610 | 7,250 | -0.69 | 490 | 2,650 |
| 22/01/2010 | 19:22:56 | 384 | 10.89 | 50 | -4,720 | 4,730 | 7,200 | -0.69 | 480 | 2,660 |
| 22/01/2010 | 19:23:06 | 384 | 11.59 | 51 | 5,190 | 3,080 | 7,710 | 0.78 | 470 | 2,670 |
| 22/01/2010 | 19:23:16 | 383 | 10.86 | 50 | -4,330 | 4,080 | 7,180 | -0.69 | 450 | 2,690 |
| 22/01/2010 | 19:23:26 | 384 | 11.17 | 50 | -4,560 | 4,490 | 7,430 | -0.68 | 440 | 2,700 |
| 22/01/2010 | 19:23:36 | 383 | 10.78 | 50 | -4,700 | 4,620 | 7,120 | -0.70 | 430 | 2,710 |

FIG. 11 - 10

| Date | Time | Volts | Amps | Freq. | W | VAR | VA | PF | Active | Reactive |
|---|---|---|---|---|---|---|---|---|---|---|
| 22/01/2010 | 19:23:46 | 384 | 10.76 | 50 | -4,710 | 4,660 | 7,150 | -0.69 | 410 | 2,730 |
| 22/01/2010 | 19:23:56 | 383 | 11.27 | 50 | -4,480 | 4,190 | 7,480 | -0.69 | 400 | 2,740 |
| 22/01/2010 | 19:24:06 | 384 | 11.20 | 50 | -4,300 | 4,650 | 7,450 | -0.69 | 390 | 2,760 |
| 22/01/2010 | 19:24:16 | 383 | 10.96 | 50 | -4,760 | 4,720 | 7,250 | -0.69 | 370 | 2,770 |
| 22/01/2010 | 19:24:26 | 387 | 11.03 | 50 | -3,910 | 3,270 | 7,310 | -0.69 | 360 | 2,780 |
| 22/01/2010 | 19:24:36 | 387 | 8.05 | 50 | -3,460 | 2,580 | 5,350 | -0.76 | 350 | 2,790 |
| 22/01/2010 | 19:24:46 | 386 | 10.01 | 51 | 3,300 | 2,640 | 6,700 | 0.78 | 340 | 2,800 |
| 22/01/2010 | 19:24:56 | 384 | 7.62 | 61 | 0 | 0 | 5,060 | 0.00 | 330 | 2,800 |
| 22/01/2010 | 19:25:06 | 0 | 0.08 | 0 | 0 | 0 | 0 | 0.00 | 330 | 2,800 |
| 22/01/2010 | 19:25:16 | 0 | 1.42 | 0 | 0 | 0 | 0 | 0.00 | 330 | 2,800 |
| 22/01/2010 | 19:25:26 | 0 | 1.47 | 0 | 0 | 0 | 0 | 0.00 | 330 | 2,800 |
| 22/01/2010 | 19:25:36 | 0 | 7.40 | 0 | 0 | 0 | 0 | 0.00 | 330 | 2,800 |
| 22/01/2010 | 19:25:46 | 0 | 7.39 | 0 | 0 | 0 | 0 | 0.00 | 330 | 2,800 |
| 22/01/2010 | 19:25:56 | 385 | 7.49 | 50 | 3,870 | 0 | 4,990 | 0.79 | 340 | 2,810 |
| 22/01/2010 | 19:26:06 | 387 | 8.56 | 50 | 4,240 | 2,190 | 5,740 | 0.82 | 330 | 2,810 |
| 22/01/2010 | 19:26:16 | 392 | 27.52 | 50 | 3,780 | 3,170 | 18,180 | 0.74 | 320 | 2,830 |
| 22/01/2010 | 19:26:26 | 388 | 12.02 | 50 | 4,410 | 3,320 | 8,010 | 0.75 | 310 | 2,840 |
| 22/01/2010 | 19:26:36 | 384 | 12.43 | 51 | -4,250 | 3,970 | 8,270 | -0.66 | 290 | 2,860 |
| 22/01/2010 | 19:26:46 | 383 | 21.77 | 50 | -4,670 | 4,660 | 14,380 | -0.50 | 270 | 2,890 |
| 22/01/2010 | 19:26:56 | 383 | 31.06 | 50 | -7,090 | 11,220 | 20,630 | -0.38 | 250 | 2,940 |
| 22/01/2010 | 19:27:06 | 386 | 31.02 | 50 | -4,860 | 4,830 | 20,640 | -0.38 | 230 | 2,970 |
| 22/01/2010 | 19:27:16 | 389 | 11.14 | 50 | -3,720 | 3,160 | 7,420 | -0.69 | 220 | 2,980 |
| 22/01/2010 | 19:27:26 | 386 | 7.91 | 50 | 3,810 | 3,160 | 5,250 | 0.76 | 210 | 2,990 |
| 22/01/2010 | 19:27:36 | 384 | 7.82 | 50 | 3,810 | 3,180 | 5,190 | 0.76 | 200 | 3,000 |
| 22/01/2010 | 19:27:46 | 391 | 26.94 | 50 | -3,700 | 3,040 | 17,870 | -0.42 | 190 | 3,020 |
| 22/01/2010 | 19:27:56 | 385 | 9.61 | 50 | -4,230 | 3,890 | 6,400 | -0.72 | 180 | 3,030 |
| 22/01/2010 | 19:28:06 | 384 | 10.97 | 50 | -4,370 | 4,140 | 7,240 | -0.68 | 160 | 3,040 |
| 22/01/2010 | 19:28:16 | 383 | 10.86 | 50 | -4,630 | 4,690 | 7,180 | -0.69 | 150 | 3,060 |
| 22/01/2010 | 19:28:26 | 383 | 15.27 | 50 | -4,710 | 4,660 | 10,050 | -0.60 | 140 | 3,070 |
| 22/01/2010 | 19:28:36 | 385 | 15.44 | 50 | -4,720 | 4,690 | 10,200 | -0.60 | 120 | 3,090 |
| 22/01/2010 | 19:28:46 | 384 | 11.09 | 50 | -4,670 | 4,640 | 7,360 | -0.69 | 110 | 3,100 |
| 22/01/2010 | 19:28:56 | 387 | 11.12 | 50 | -3,870 | 3,360 | 7,390 | -0.69 | 100 | 3,110 |
| 22/01/2010 | 19:29:06 | 385 | 8.09 | 50 | -3,750 | 3,140 | 5,390 | -0.75 | 90 | 3,120 |
| 22/01/2010 | 19:29:16 | 385 | 8.01 | 50 | -3,760 | 3,140 | 5,320 | -0.75 | 70 | 3,130 |
| 22/01/2010 | 19:29:26 | 385 | 7.97 | 50 | -3,730 | 3,080 | 5,320 | -0.75 | 60 | 3,140 |
| 22/01/2010 | 19:29:36 | 385 | 7.98 | 50 | -3,720 | 3,070 | 5,310 | -0.75 | 50 | 3,150 |
| 22/01/2010 | 19:29:46 | 385 | 7.96 | 50 | -3,630 | 2,920 | 5,320 | -0.76 | 40 | 3,160 |
| 22/01/2010 | 19:29:56 | 385 | 8.36 | 50 | -3,710 | 3,060 | 5,560 | -0.76 | 30 | 3,170 |

FIG. 11 - 11

| Date | Time | Volts | Amps | Freq. | W | VAR | VA | PF | Active | Reactive |
|---|---|---|---|---|---|---|---|---|---|---|
| 22/01/2010 | 19:30:06 | 391 | 26.40 | 50 | -3,910 | 3,260 | 17,540 | -0.44 | 20 | 3,180 |
| 22/01/2010 | 19:30:16 | 387 | 10.58 | 50 | 3,560 | 2,820 | 7,090 | 0.78 | 10 | 3,200 |
| 22/01/2010 | 19:30:26 | 384 | 10.67 | 50 | -4,540 | 4,490 | 7,100 | -0.69 | -10 | 3,210 |
| 22/01/2010 | 19:30:36 | 383 | 20.67 | 50 | -4,790 | 4,950 | 13,670 | -0.51 | -30 | 3,240 |
| 22/01/2010 | 19:30:46 | 382 | 20.37 | 50 | -6,850 | 11,160 | 13,470 | -0.51 | -50 | 3,270 |
| 22/01/2010 | 19:30:56 | 383 | 30.45 | 50 | -6,850 | 11,210 | 20,220 | -0.39 | -70 | 3,310 |
| 22/01/2010 | 19:31:06 | 386 | 30.58 | 50 | -7,610 | 15,080 | 20,230 | -0.39 | -90 | 3,360 |
| 22/01/2010 | 19:31:16 | 387 | 28.88 | 50 | 0 | -10 | 19,160 | 0.00 | -100 | 3,390 |
| 22/01/2010 | 19:31:26 | 386 | 16.03 | 51 | -250 | -9,510 | 10,720 | -0.45 | -110 | 3,370 |
| 22/01/2010 | 19:31:36 | 387 | 16.11 | 51 | -4,770 | -9,570 | 10,800 | -0.46 | -130 | 3,340 |
| 22/01/2010 | 19:31:46 | 387 | 16.08 | 51 | -4,740 | -9,540 | 10,760 | -0.46 | -140 | 3,320 |
| 22/01/2010 | 19:31:56 | 387 | 36.86 | 51 | 13,560 | -20,690 | 24,250 | 0.59 | -140 | 3,280 |
| 22/01/2010 | 19:32:06 | 386 | 33.26 | 50 | 17,490 | -14,350 | 22,040 | 0.79 | -140 | 3,250 |
| 22/01/2010 | 19:32:16 | 385 | 22.47 | 50 | 4,040 | -14,370 | 14,930 | 0.27 | -140 | 3,210 |
| 22/01/2010 | 19:32:26 | 387 | 22.33 | 50 | 8,100 | -14,480 | 14,860 | 0.81 | -120 | 3,190 |
| 22/01/2010 | 19:32:36 | 388 | 14.15 | 51 | 7,390 | -5,840 | 9,310 | 0.80 | -110 | 3,190 |
| 22/01/2010 | 19:32:46 | 385 | 1.00 | 50 | 0 | -649 | 669 | 0.00 | -110 | 3,180 |
| 22/01/2010 | 19:32:56 | 386 | 1.00 | 50 | 0 | -651 | 671 | 0.00 | -110 | 3,180 |
| 22/01/2010 | 19:33:06 | 387 | 1.01 | 51 | 0 | -657 | 679 | 0.00 | -110 | 3,180 |
| 22/01/2010 | 19:33:16 | 387 | 1.04 | 51 | 0 | -671 | 697 | 0.00 | -110 | 3,180 |
| 22/01/2010 | 19:33:26 | 386 | 1.02 | 50 | 0 | -659 | 683 | 0.00 | -110 | 3,180 |
| 22/01/2010 | 19:33:36 | 386 | 1.03 | 51 | 0 | -666 | 689 | 0.00 | -110 | 3,170 |
| 22/01/2010 | 19:33:46 | 390 | 32.07 | 50 | 17,800 | -12,600 | 21,220 | 0.97 | -110 | 3,170 |
| 22/01/2010 | 19:33:56 | 386 | 4.29 | 50 | 1,653 | -2,426 | 2,867 | 0.63 | -100 | 3,160 |
| 22/01/2010 | 19:34:06 | 384 | 15.22 | 50 | 8,210 | -5,880 | 10,100 | 0.82 | -80 | 3,150 |
| 22/01/2010 | 19:34:16 | 386 | 22.23 | 51 | 8,070 | -14,340 | 14,680 | 0.83 | -70 | 3,120 |
| 22/01/2010 | 19:34:26 | 384 | 21.98 | 50 | 3,550 | -14,290 | 14,570 | 0.24 | -60 | 3,080 |
| 22/01/2010 | 19:34:36 | 388 | 22.01 | 51 | 8,780 | -14,300 | 14,550 | 0.85 | -50 | 3,060 |
| 22/01/2010 | 19:34:46 | 388 | 14.97 | 50 | 8,080 | -5,840 | 9,970 | 0.88 | -40 | 3,050 |
| 22/01/2010 | 19:34:56 | 385 | 1.00 | 50 | 0 | -649 | 669 | 0.00 | -40 | 3,050 |
| 22/01/2010 | 19:35:06 | 385 | 1.02 | 50 | 0 | -659 | 683 | 0.00 | -40 | 3,050 |
| 22/01/2010 | 19:35:16 | 387 | 1.03 | 51 | 0 | -668 | 693 | 0.00 | -40 | 3,050 |
| 22/01/2010 | 19:35:26 | 386 | 1.00 | 50 | 0 | -650 | 671 | 0.00 | -40 | 3,040 |
| 22/01/2010 | 19:35:36 | 385 | 1.03 | 51 | 0 | -665 | 688 | 0.00 | -40 | 3,040 |
| 22/01/2010 | 19:35:46 | 386 | 1.02 | 50 | 0 | -663 | 685 | 0.00 | -40 | 3,040 |
| 22/01/2010 | 19:35:56 | 385 | 1.03 | 51 | 0 | -660 | 685 | 0.00 | -40 | 3,040 |
| 22/01/2010 | 19:36:06 | 383 | 0.99 | 50 | 0 | -638 | 657 | 0.00 | -40 | 3,040 |
| 22/01/2010 | 19:36:16 | 383 | 1.00 | 50 | 0 | -646 | 666 | 0.00 | -40 | 3,030 |

FIG. 11 - 12

| Date | Time | Volts | Amps | Freq. | W | VAR | VA | PF | Active | Reactiv |
|---|---|---|---|---|---|---|---|---|---|---|
| 22/01/2010 | 19:36:26 | 383 | 0.99 | 50 | 0 | -639 | 658 | 0.00 | -40 | 3,030 |
| 22/01/2010 | 19:36:36 | 383 | 0.99 | 50 | 0 | -636 | 656 | 0.00 | -50 | 3,030 |
| 22/01/2010 | 19:36:46 | 389 | 31.99 | 50 | 17,690 | -12,260 | 20,980 | 0.88 | -40 | 3,020 |
| 22/01/2010 | 19:36:56 | 388 | 4.10 | 50 | 1,557 | -2,291 | 2,756 | 0.61 | -30 | 3,020 |
| 22/01/2010 | 19:37:06 | 388 | 13.17 | 50 | 6,850 | -5,470 | 8,760 | 0.78 | -20 | 3,010 |
| 22/01/2010 | 19:37:16 | 384 | 13.14 | 50 | 6,800 | -5,490 | 8,740 | 0.78 | 0 | 2,990 |
| 22/01/2010 | 19:37:26 | 384 | 13.11 | 50 | 6,780 | -5,470 | 8,710 | 0.78 | 20 | 2,980 |
| 22/01/2010 | 19:37:36 | 384 | 15.83 | 50 | 6,800 | -9,590 | 10,530 | 0.78 | 30 | 2,960 |
| 22/01/2010 | 19:37:46 | 388 | 16.58 | 50 | 4,630 | -10,100 | 11,110 | 0.42 | 50 | 2,930 |
| 22/01/2010 | 19:37:56 | 388 | 16.48 | 50 | 4,690 | -10,020 | 11,060 | 0.42 | 60 | 2,910 |
| 22/01/2010 | 19:38:06 | 389 | 16.30 | 50 | 4,760 | -9,910 | 10,970 | 0.43 | 70 | 2,880 |
| 22/01/2010 | 19:38:16 | 389 | 16.31 | 50 | 4,640 | -9,950 | 10,970 | 0.42 | 90 | 2,850 |
| 22/01/2010 | 19:38:26 | 389 | 21.94 | 50 | 4,640 | -14,640 | 14,790 | 0.42 | 100 | 2,820 |
| 22/01/2010 | 19:38:36 | 389 | 22.10 | 50 | 2,140 | -14,750 | 14,880 | 0.14 | 100 | 2,780 |
| 22/01/2010 | 19:38:46 | 389 | 22.11 | 50 | 2,030 | -14,750 | 14,890 | 0.14 | 110 | 2,740 |
| 22/01/2010 | 19:38:56 | 392 | 22.02 | 50 | 7,350 | -14,700 | 14,830 | 0.78 | 120 | 2,710 |
| 22/01/2010 | 19:39:06 | 392 | 13.60 | 50 | 7,050 | -5,780 | 9,120 | 0.77 | 130 | 2,710 |
| 22/01/2010 | 19:39:16 | 386 | 1.00 | 50 | 0 | -647 | 668 | 0.00 | 130 | 2,710 |

Time: 6:36:16 PM

| | |
|---|---|
| Active Power Minimum | 7.23 |
| Active Power Maximum | 7.53 |
| Active Power Average | 7.42 |
| Reactive Power Minimum | -5.25 |
| Reactive Power Maximum | -5.10 |
| Reactive Power Average | -5.17 |
| Apparent Power Minimum | 8.92 |
| Apparent Power Maximum | 9.16 |
| Apparent Power Average | 9.05 |
| PF Minimum | 0.808 |
| PF Maximum | 0.822 |
| PF Average | 0.819 |

Fig. 12

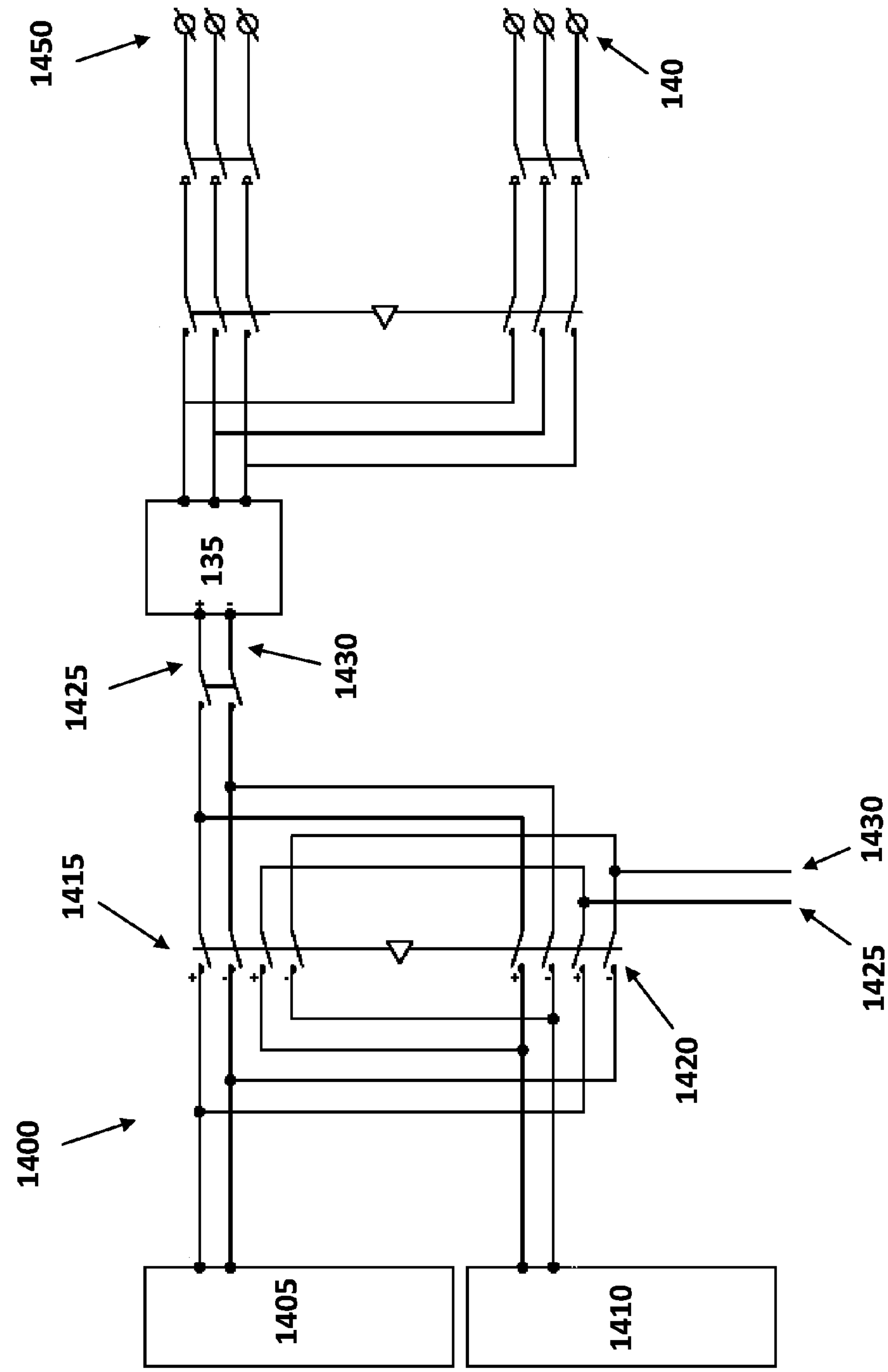
Fig. 14-A

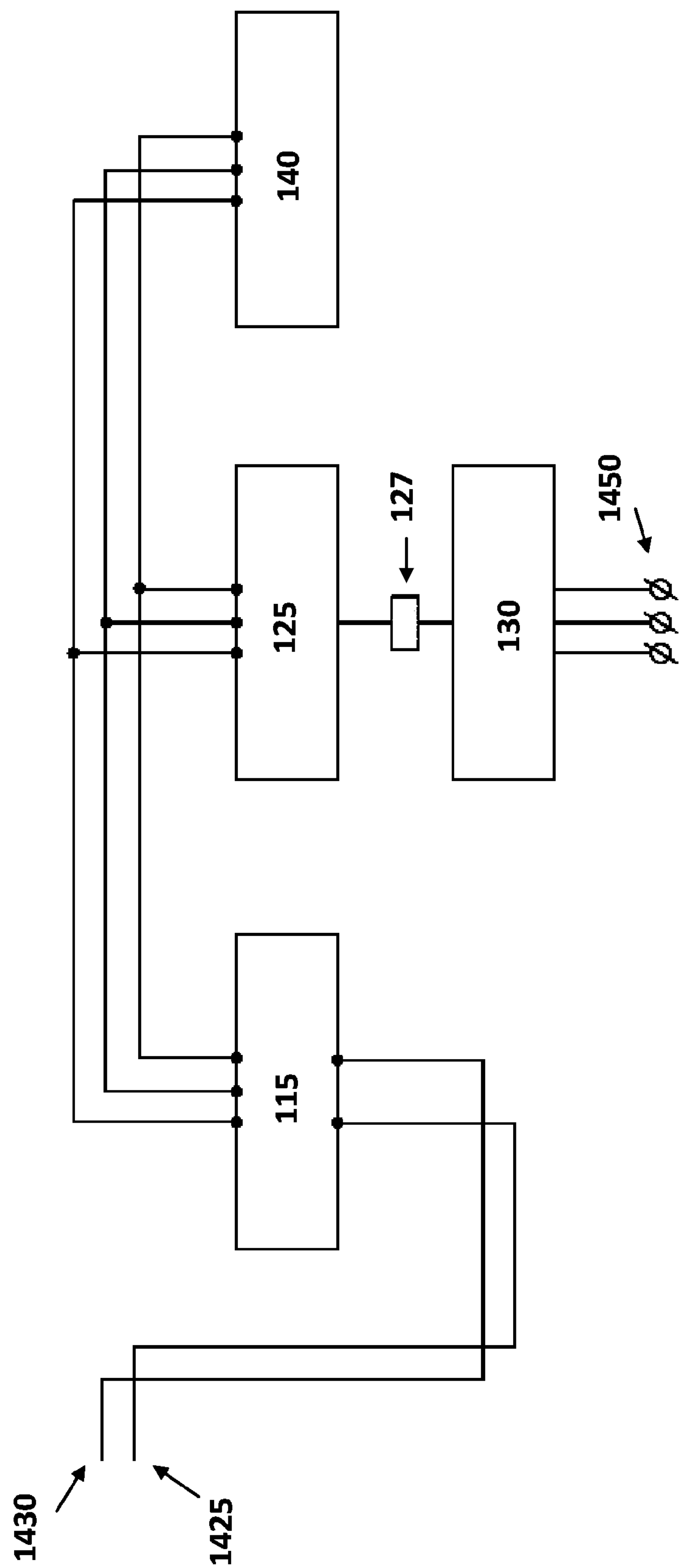
Fig. 14-B

ELECTRIC POWER STATION

PRIORITY

The present application is a continuation of U.S. application Ser. No. 17/328,853, filed on May 24, 2021, which is a continuation of U.S. application Ser. No. 16/686,829, filed on Nov. 18, 2019, now U.S. Pat. No. 11,050,283, which is a continuation of U.S. application Ser. No. 15/627,647, filed on Jun. 20, 2017, now U.S. Pat. No. 10,523,028, which is a continuation of U.S. application Ser. No. 14/224,405, filed on Mar. 25, 2014, now U.S. Pat. No. 9,768,632. The entire contents of each of the above documents is hereby incorporated herein by reference.

BACKGROUND

The present invention relates generally to an electric power station (hereinafter, EPS). Particularly to a regenerative hybrid energy storage and conversion apparatus and method to produce and distribute electrical energy. More particularly, to an apparatus and method that utilizes available stored energy to supply an electric demand and senses where the demand is greatest to preferentially supply that demand. More particularly, the present invention relates to a hybrid power storage and electrical generation apparatus where potential energy is produced and stored by one or more methods to be subsequently converted to mechanical energy to rotate an electric generator. More particularly, the present invention comprises an apparatus that regenerates and stores electrical energy as chemical potential energy in a battery to be transferred into mechanical energy on demand for the purpose of rotating an electrical generator to service a load and use a portion of that generated electricity to recharge the battery, and a method of production and distribution of the energy produced there from.

The present invention relates to the generation of electrical power by means of mechanical and electrical principles, to provide electrical energy to power a diverse range of devices.

With the increasing demand for electrical power in industrial, commercial and residential applications, the present electrical power services have become over taxed due to the growing demands. The present invention will assist in relieving those generation systems and give the industrial, commercial and residential sectors, and the individual, a viable energy source alternative.

DESCRIPTION OF RELATED ART

U.S. Pat. No. 4,031,702, to Burnett, issued Jun. 28, 1977, discloses and claims a Means for Activating Hydraulic Motors, where at least one device for generating power from sunlight, wind and/or water movement supplies power to a hydraulic pump which uses the power to pump hydraulic fluid to a tank under pressure. The pressurized hydraulic fluid may be used to turn a hydraulic motor coupled to an electric generator.

U.S. Pat. No. 4,055,950, to Grossman, issued Nov. 1, 1977, discloses and claims an energy transfer or conversion system for recovering the energy from atmospheric wind wherein a windmill operates a compressor for compressing air which is stored in one or more tanks. The compressed air is used to drive a prime mover (piston) coupled by gears to an electrical generator or other work-producing apparatus. The prime mover is operated by hydraulic fluid pressurized by the compressed air. Alternately, the prime mover can be operated by conventional water pressure during periods of little or no wind. Note that this reference discloses using compressed air to pressurize hydraulic fluid to drive a piston connected to an electric generator. The energy source used to pressurize the fluid in the SHEPS is a battery powered hydraulic pump, whereas in this reference it uses the energy output from an atmospheric air-engaging windmill to compress air to pressurize the hydraulic fluid.

U.S. Pat. No. 4,206,608, to Bell, issued Jun. 10, 1980, discloses and claims a Natural Energy Conversion, Storage and Electricity Generation System, wherein the natural energy is utilized to pressurize hydraulic fluid to generate electricity. This a large industrial size system. The hydraulic fluid is temporarily stored within high pressure storage tanks underground to be utilized in the production of electricity. This generated electricity is supplied as needed and excess generated electricity is utilized to pressurize additional hydraulic fluid. The additional hydraulic fluid is then supplied to the high pressure storage tanks to be used at a later time for the production of more electricity. In this way, excess electricity that is produced from the pressurized hydraulic fluid is reconverted into pressurized hydraulic fluid which may be stored in the high pressure storage tanks until needed. The high pressure hydraulic storage tanks may be initially charged with energy converted from wind, solar or wave action by conventional means. A piston may be provided within each storage tank in order to separate the pressurized hydraulic fluid from the compressible fluid. Note that this reference discloses a pressurized hydraulic fluid circuit where energy is stored in an accumulator(s) and released to drive a prime mover, a hydraulic motor, connected to an electric generator. The energy source used to pressurize the fluid in the SHEPS is a battery (electric) powered hydraulic pump, which is one of the means in this reference. In addition, this reference discloses use of any type of natural power source to initially compress and thereby energize the hydraulic fluid. However, this design utilizes a piston to separate the pressurized hydraulic fluid which is not part of the EPS concept.

U.S. Pat. No. 6,748,737, to Lafferty, filed Nov. 19, 2001, discloses and claims a Regenerative Energy Storage and Conversion System wherein wind energy is converted to pressurize hydraulic fluid in accumulators, then the pressurized fluid is used to drive a hydraulic motor attached to a flywheel, which is attached to a hydraulic pump, which is attached to an electric generator. The accumulators may be charged by electricity or hydraulic power taken directly from the wind turbine. Thus the invention is an energy storage device which can provide electricity when the wind is unavailable or when demanded. Note that although the initial energy source is wind energy used to mechanically pressurize the hydraulic accumulator, the reference also states in column 5, lines 24-32, that electricity from the wind generator may be used to drive a hydraulic pump as an alternative. The EPS design does not use wind generated electricity, but does use solar generated electricity to charge the batteries that power the hydraulic pump to pressurize the hydraulic accumulator.

U.S. Pat. No. 6,815,840, to Aldendeshe, filed Nov. 17, 2000, discloses and claims a Hybrid Electric Power Generator and Method for Generating Electric Power wherein energy in compressed air is used to power a pneumatic pump which drives a hydraulic motor connected to an electric generator. An outside electric source is initially used to compress the air into an accumulator. Once electricity is produced the outside source is removed and part of the generated power is used to operate the air compressor and maintain the cycle. Thus the accumulator in this invention is a compressed air tank similar to the SHEPS design.

U.S. Pat. No. 7,566,991, to Blackman, filed May 15, 2007, discloses and claims a Retrofittable Power Distribution System for a Household wherein energy from batteries is utilized to rotate a generator supplying a high load circuit and a separate generator supplying a low load circuit in conjunction with an air conditioner.

SUMMARY OF THE INVENTION

The apparatus and method of the present invention comprises a highly efficient regenerative hybrid power storage, generation and management system utilizing stored chemical potential energy to drive one or more electric generators. The system may be scaled for industrial, commercial or residential use. The basic core concept is converting stored chemical energy to electrical energy, along with providing a method for storing, regenerating and distributing this energy more efficiently. Preferably, the initial, or priming, energy is stored electrical energy in chemical batteries used to energize an electric motor. This stored potential energy may be accessed on demand to drive an electric generator. The electricity generated by the system of the present invention may be utilized to directly service a load, be transferred to the grid, and/or used to recharge the battery storage as needed.

With computer control, this hybrid energy production and management system both stores potential energy in batteries, and generates electricity based upon demand, the demand evaluated and distributed in real time by the system computer and controls. This energy producing system provides an energy source that may be utilized even when no electricity is available to recharge the batteries. For example, a solar cell array may be utilized as one source to charge the batteries, but solar cells only produce electrical energy when there is sufficient sunlight. Thus, the energy generated by the system of the present invention may be engaged when sunlight is deficient or not available. Note that electricity from the grid, a solar array, a fuel fired generator, or other conventional means may be employed as a backup system to maintain the charge of the batteries. However, in a stand-alone or solitary configuration of the present invention, the backup could be limited to a solar array as one source providing independence from the electrical distribution grid. As a byproduct, use of a solar array increases the environmental aesthetics of the system.

The apparatus of EPS is comprised of a motor, an alternator, an inverter, a charger, preferably a plurality of batteries in one or more banks (hereinafter, the power preservation unit, or PPU), a control assembly preferably comprising a plurality of circuit breakers, contactors and sensors, an external load ("L-ext"), and various program logic controllers (hereinafter, PLC) where preferably each PLC has a display, and a variety of other components.

EPS controls and manages the battery power by controlling the charging and discharging of the battery reservoir via a series of electrical and mechanical innovations controlled by electronic instruction using a series of devices to analyze, optimize and perform power production and charging functions in sequence to achieve its purpose.

In operation, preferably the hybrid power generation and management system of the present invention produces electrical current (AC or DC) by releasing energy from an accumulated amount of electrical energy in the PPU to energize the electric motor. That motor in turn is connected to an electrical generator to produce electrical power for direct use, transfer to the grid, or for storage in the PPU. The system of the present invention is a closed loop system that obtains, stores and transfers motive energy. Preferably, the majority of the electricity generated by the method of the present invention is utilized to service a load or supplied to the grid. And preferably, a portion of the electric power produced by the generator will be used to recharge the batteries for subsequent use of the electric motor.

It is an object of the present invention to provide generation of electrical power by means of mechanical and electrical principals, to power a diverse range of devices that require electrical energy.

It is a further object of the present invention to provide a regenerative energy storage and conversion apparatus and method to produce, store and distribute electrical energy.

It is a further object of the present invention to generate electricity through mechanical motive force.

It is a further object of the present invention to provide an apparatus that utilizes available stored energy to supply an electric demand and senses where the demand is greatest to preferentially supply that demand.

It is a further object of the present invention to provide a hybrid power storage and electrical generation apparatus where potential energy is produced and stored to be subsequently converted to mechanical to rotate an electric generator.

It is a further object of the present invention to provide an apparatus that generates and stores electrical energy as chemical potential energy in a plurality of batteries, to be transferred into mechanical energy on demand for the purpose of rotating an electricity generator to service a load and recharge the battery, and a method of production and distribution of the energy produced there from.

It is a further object of the present invention to provide electrical generation in a stand-alone apparatus.

It is a further object of the present invention to provide electrical generation by utilizing energy stored in one or more batteries to drive an electric motor coupled to rotate a generator, and (a) with battery banks to supply energy to service a load, with excess available to sell to the grid, and to recharge the batteries, (b) computerized or programmable controller that knows when to shut down generators, feed back to the grid, etc.

It is a further object of the present invention to provide this electrical generation by mechanical and photovoltaic means.

It is a further object of the present invention to provide this electrical generation by mechanical and photovoltaic means comprising solar panels, battery banks, an electric motor, a generator, and battery banks to service the load.

It is a further object of the present invention to utilize programmed computer control to monitor battery charge and direct energy flow for load servicing and distribution.

It is a further object of the present invention to provide electrical generation by utilizing one single generator.

It is a further object of the present invention to provide electrical generation by an environmentally friendly energy management system.

It is a further object of the present invention to provide electrical generation by a hybrid system that both stores and generates energy based on demand utilizing mechanical energy storage and chemical energy storage.

It is a further object of the present invention to provide this electrical generation by an electrochemical power unit in synergy with a mechanical power unit.

It is a further object of the present invention to provide electrical generation by a regenerative system that senses or analyzes the need for energy to supply a load.

BRIEF DESCRIPTION OF THE DRAWINGS

FIGS. 2A-D comprises CAD drawings of an embodiment of the interior and exterior of prototype of EPS control components.

FIGS. 6-1 through 6-116 is a data set in table form of an embodiment of the present invention.

FIGS. 7-1 through 7-47 is a data set in table form of an embodiment of the present invention.

FIGS. 8A-G comprises a table of test parameters and a series of graphs of data recorded using an embodiment of the present invention.

FIGS. 9A-G comprises a table of test parameters and a series of graphs of data recorded using an embodiment of the present invention.

FIGS. 10-1 through 10-18 is a data set in table form of an embodiment of the present invention.

FIGS. 11-1 through 11-13 is a data set in table form of an embodiment of the present invention.

FIG. 12 is a data recording in table form of an embodiment of the present invention.

FIG. 13 is an electrical flow diagram of an embodiment of the present invention.

FIGS. 14A-B comprises electrical flow diagrams of an embodiment of the present invention.

FIG. 15 is an electrical flow diagram of an embodiment of the present invention.

DESCRIPTION OF EMBODIMENT

The present invention provides an environmentally sensitive electrical power station that may be scaled to service a plurality of loads, including but not limited to industrial, commercial or residential electrical demand with the ability to grow with increased electrical demands of the business or residence with minimal or no outside power source. The EPS power system of the present invention produces electrical current (AC or DC) to power an electric motor that in turn engages an electrical generator to produce electrical power distributed to a plurality of batteries to service a load and use a portion of that generated electricity to recharge the battery, and a method of production and distribution of the energy produced there from.

The invention preferably comprises an electrical power generation apparatus 100 converting stored chemical energy in a battery 105 into mechanical motive energy to cause rotation of an electric generator 120 to produce electricity.

Figure 1:
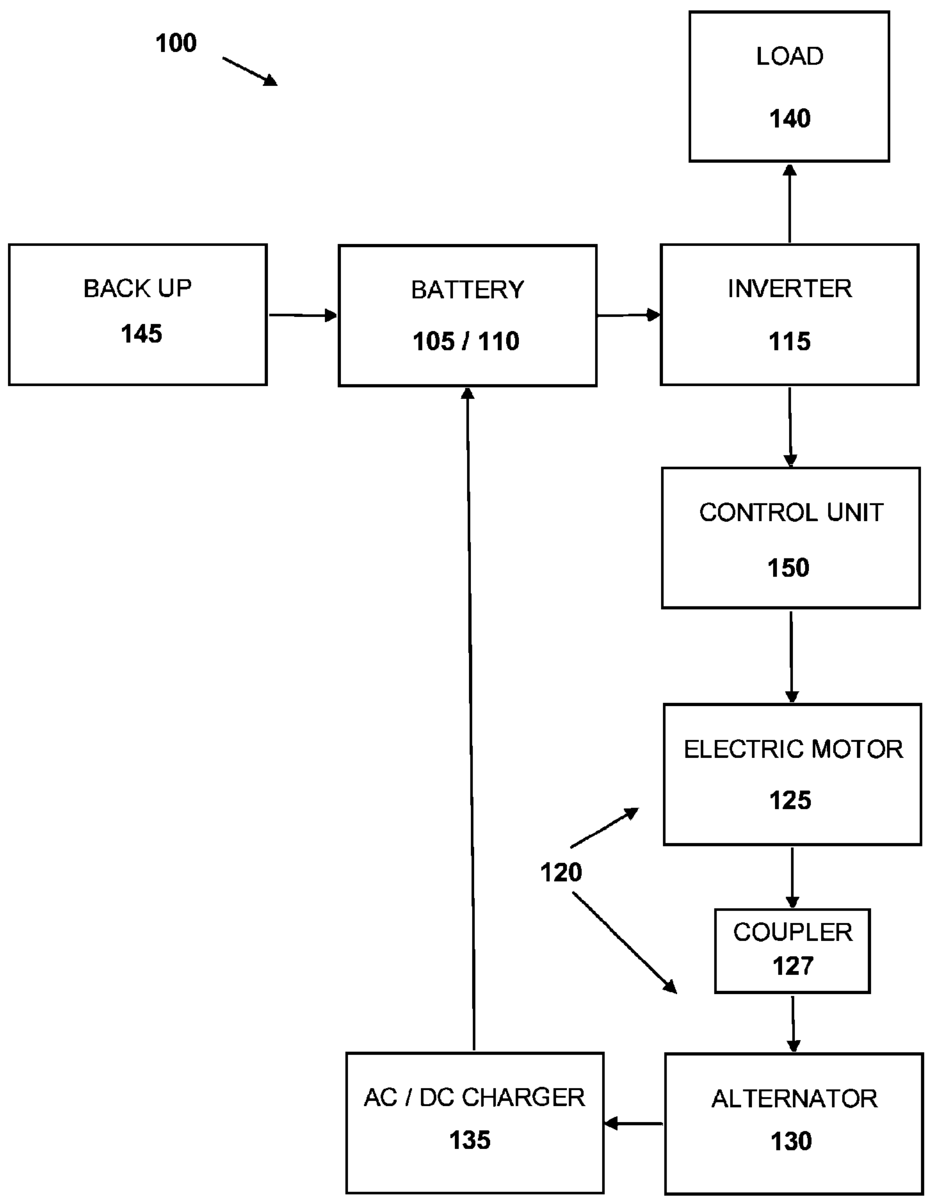
FIG. 1 is an electrical flow diagram of an embodiment of the present invention.
Figure 3A:
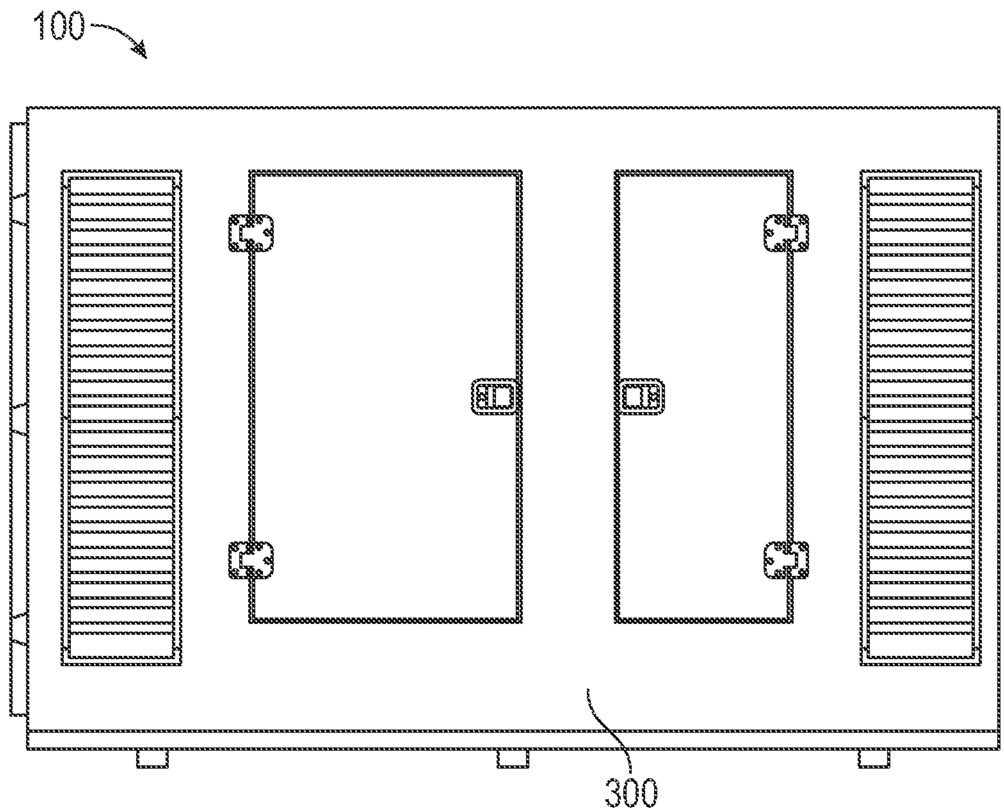
FIGS. 3A-VVV comprises photographs of an embodiment of the present invention.
Figure 3B:
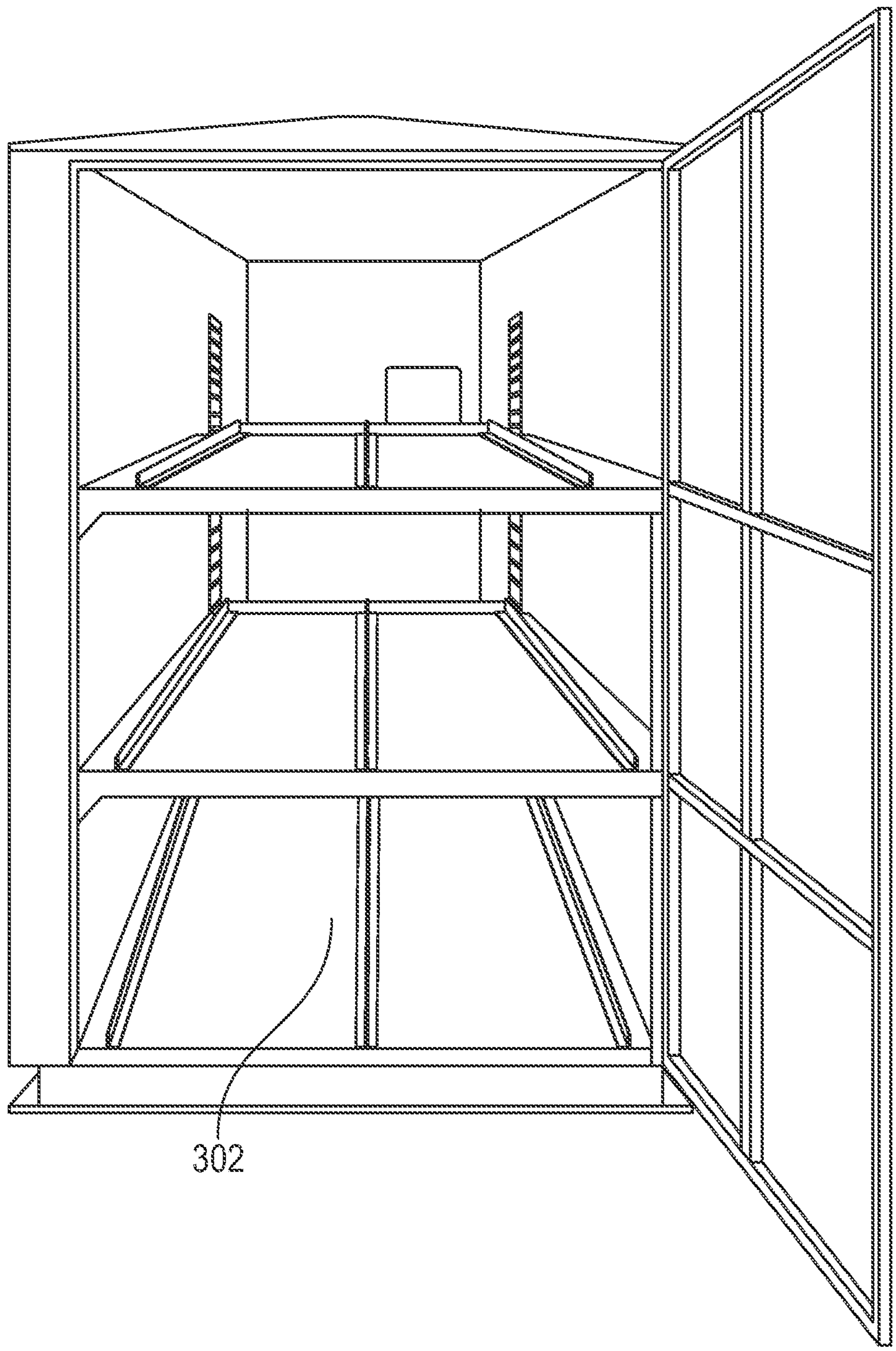
Figure 3C:
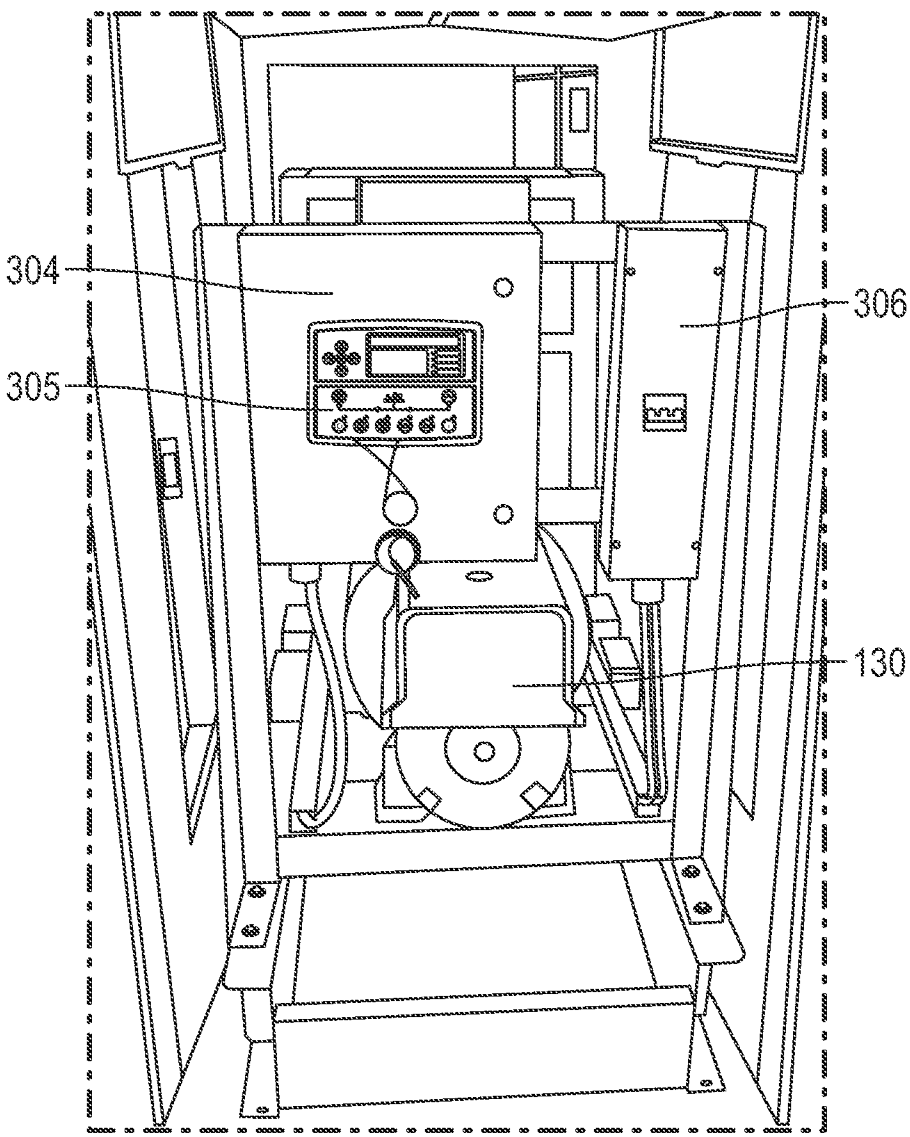
Figure 3D:
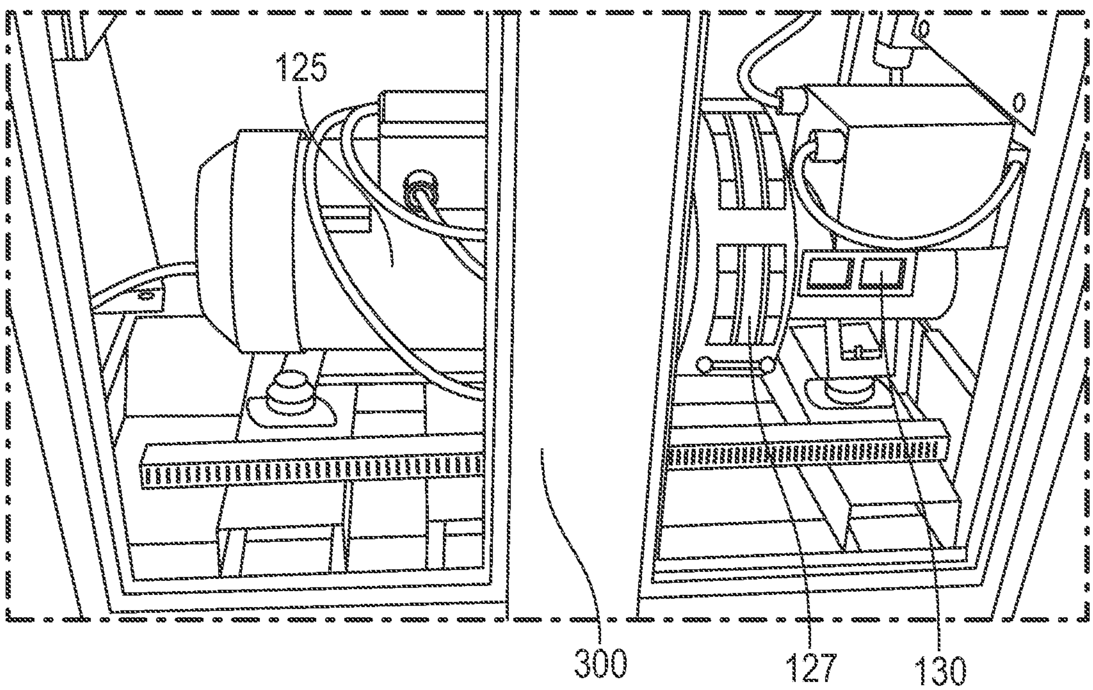
Figure 3E:
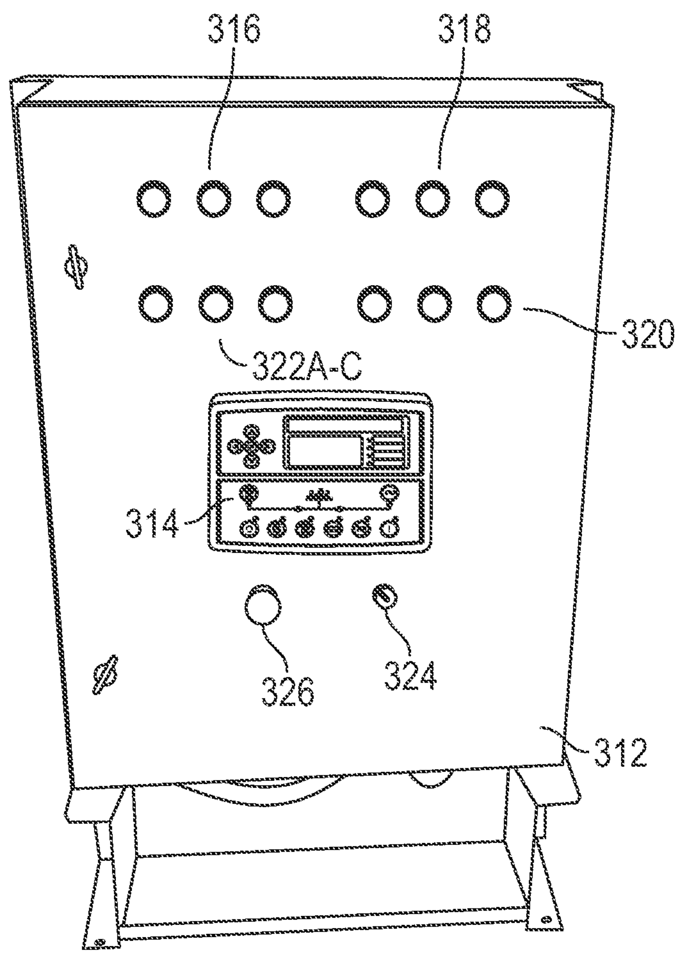
Figure 3F:
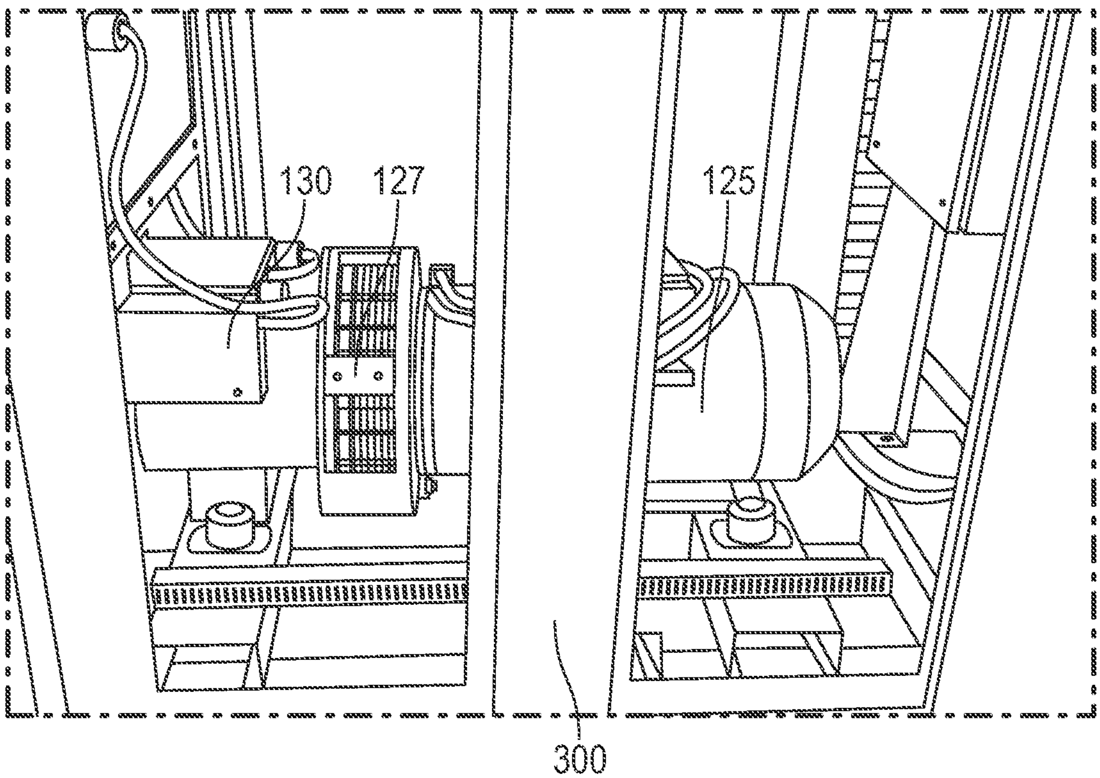
Figure 3G:
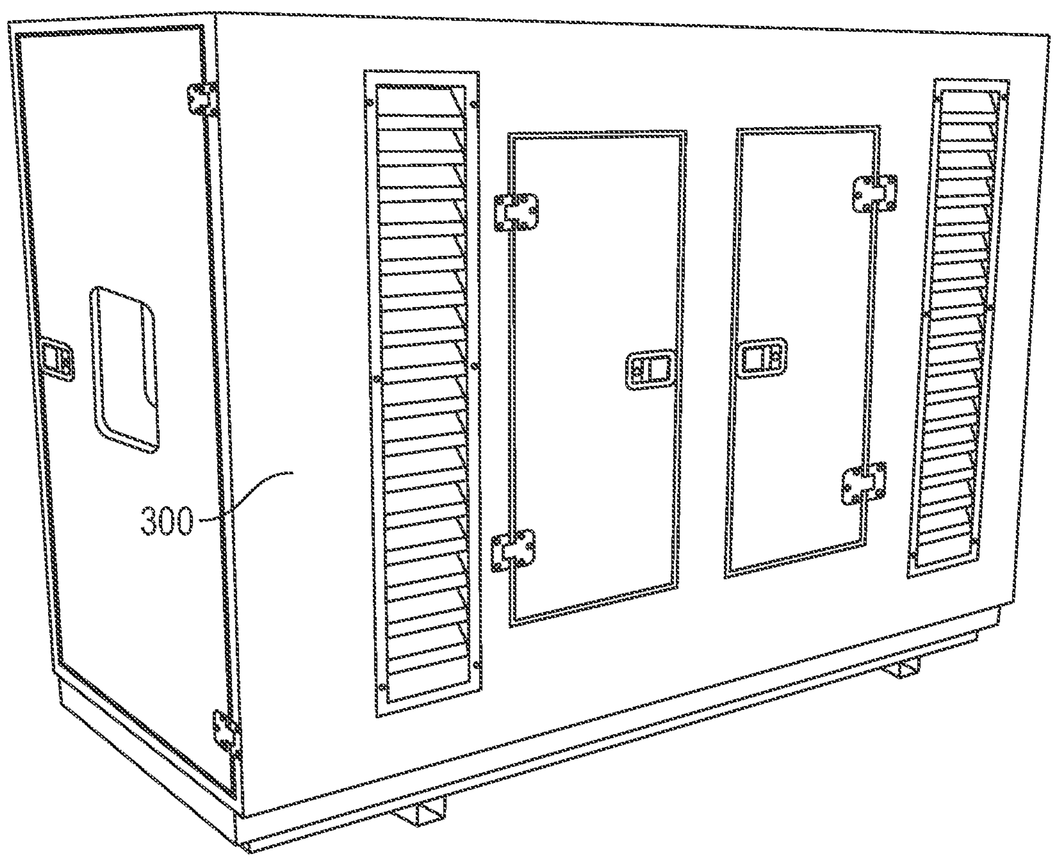
Figure 3H:
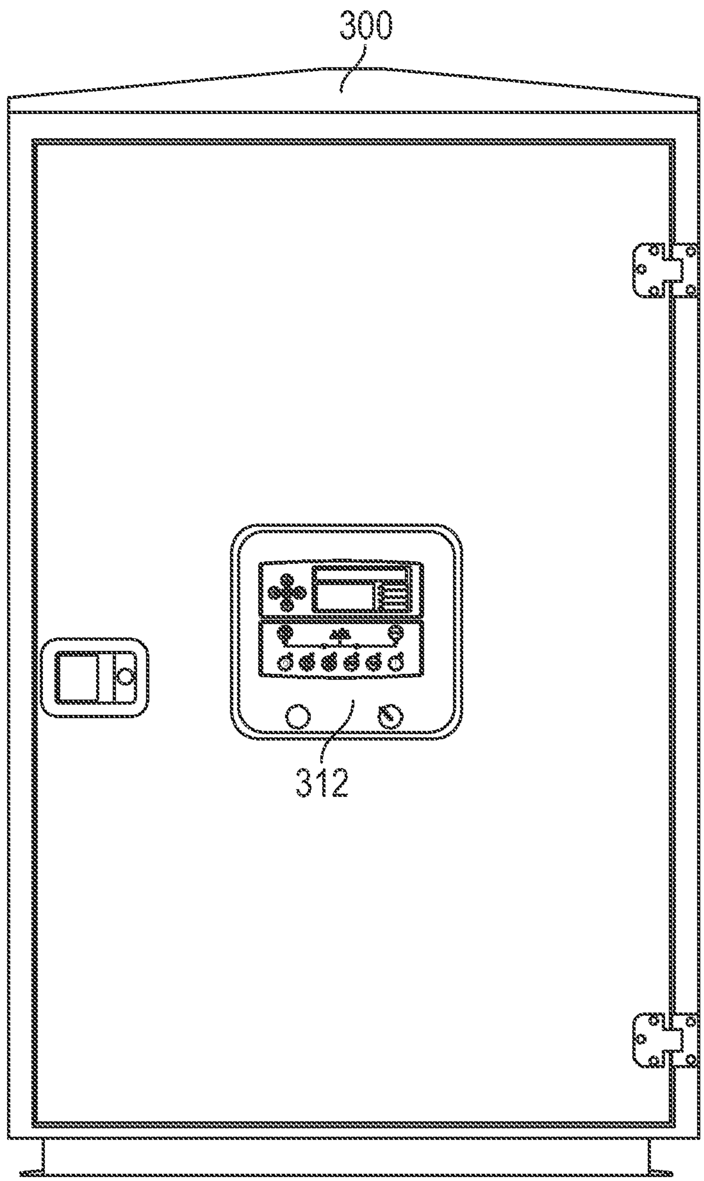
Figure 3I:
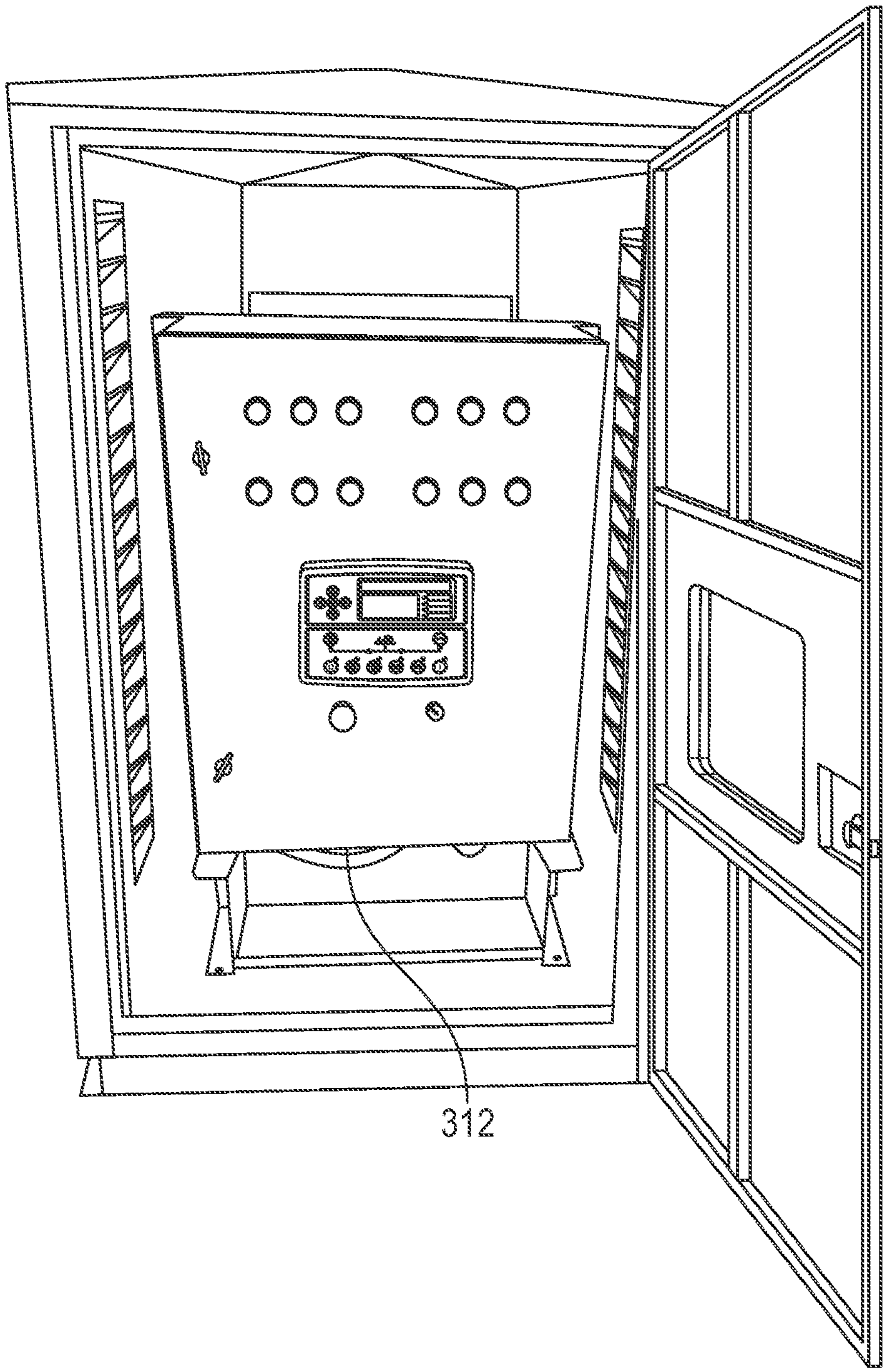
Figure 3J:
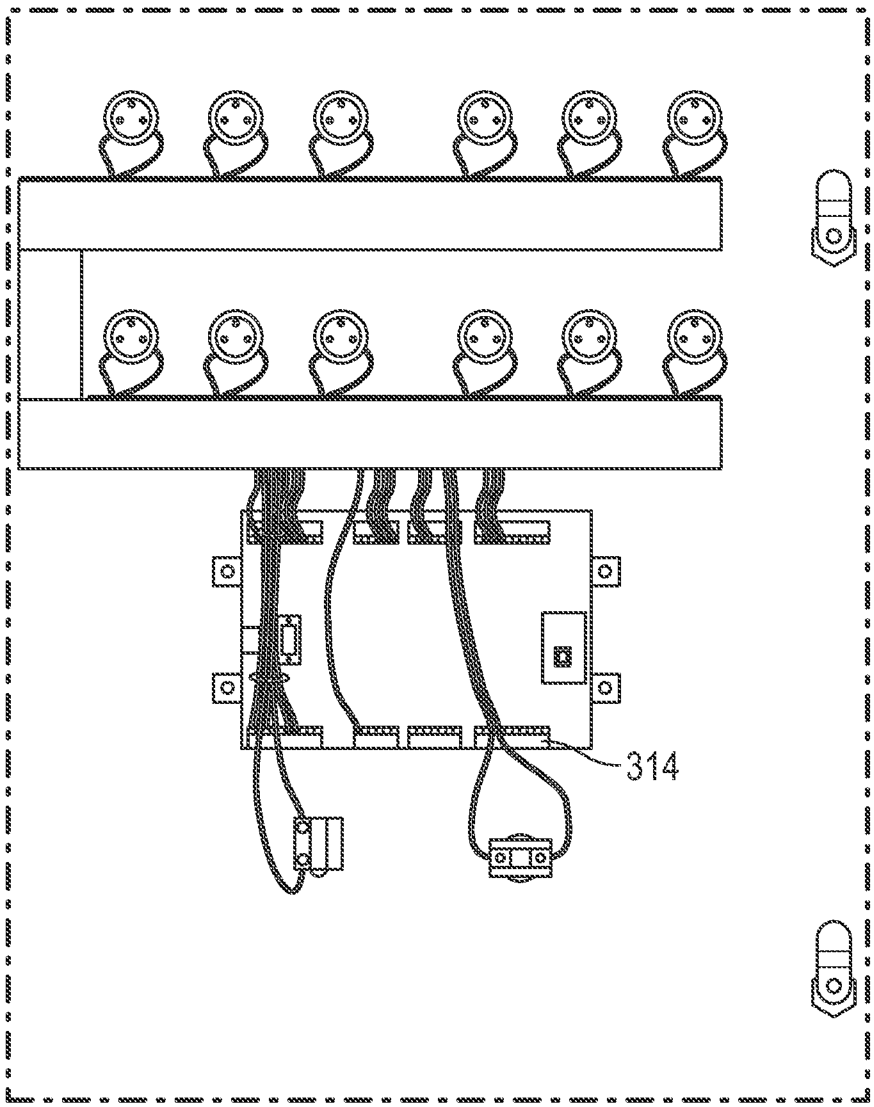
Figure 3K:
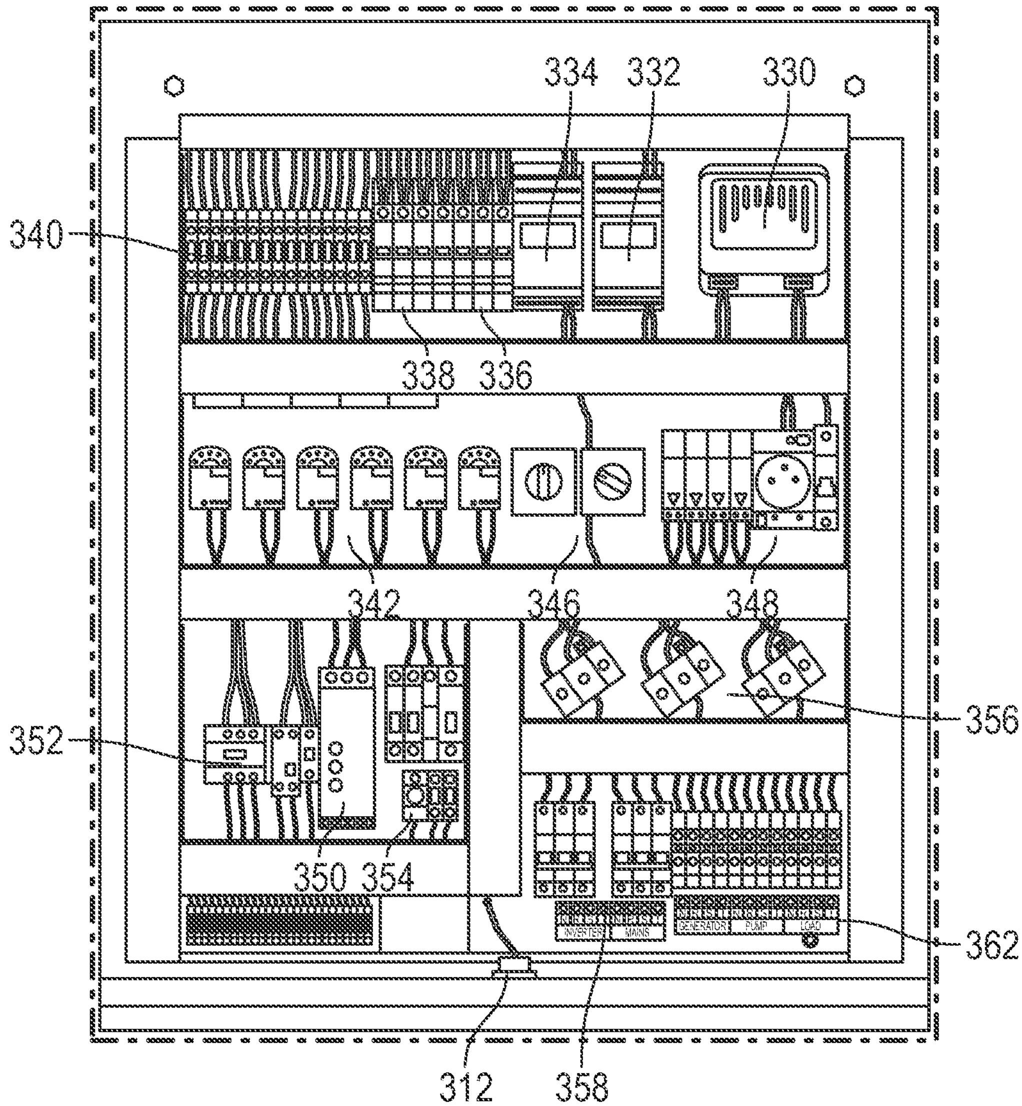
Figure 3L:
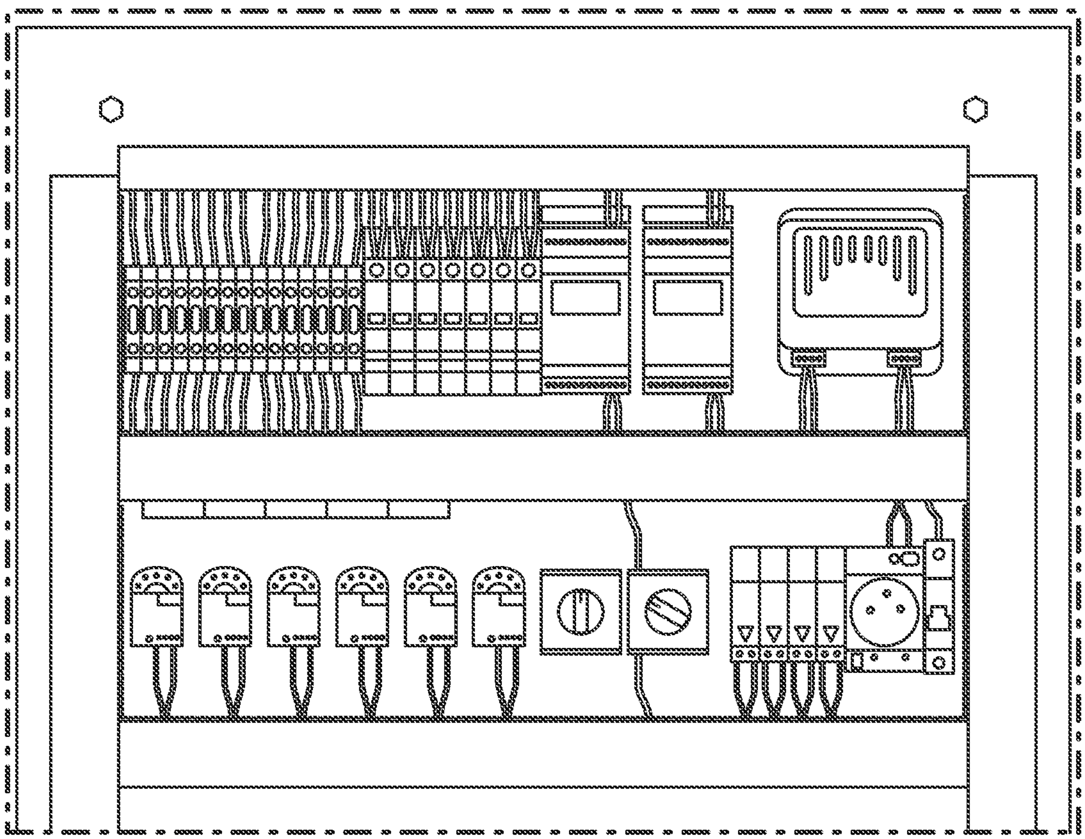
Figure 3M:
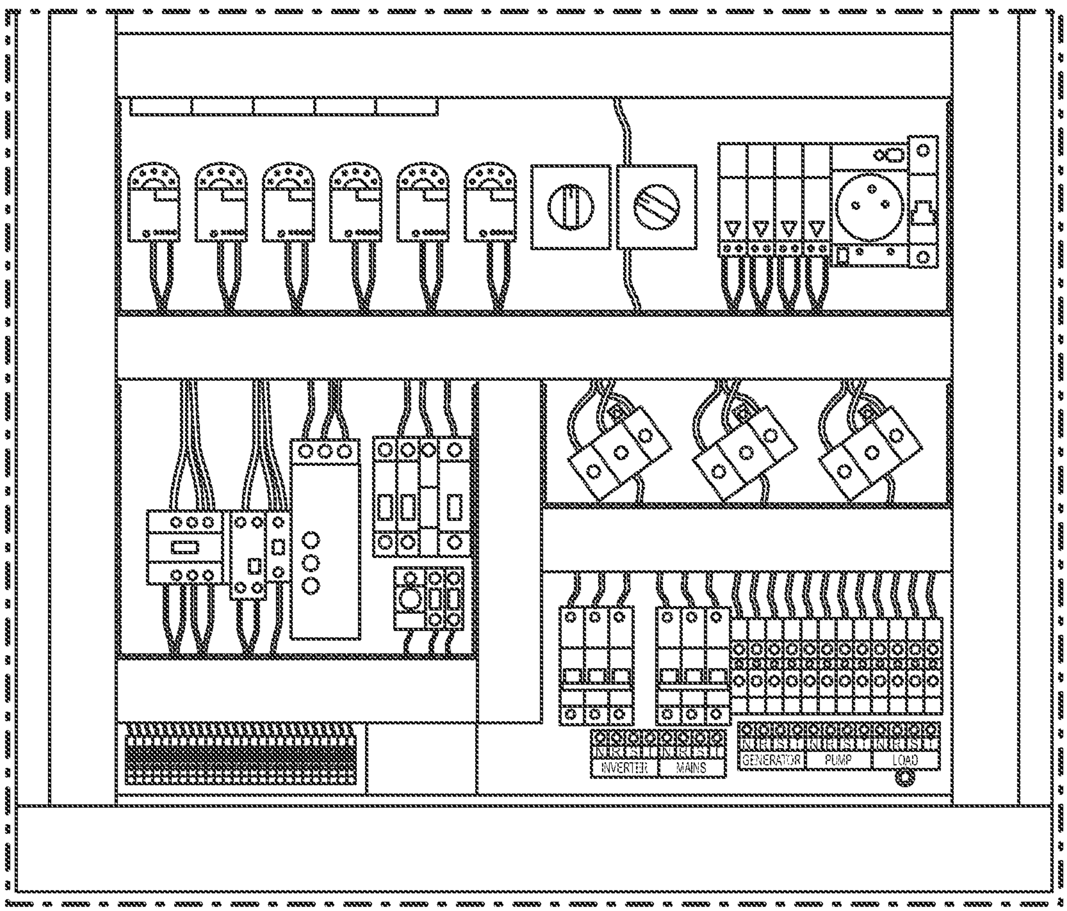
Figure 3N:
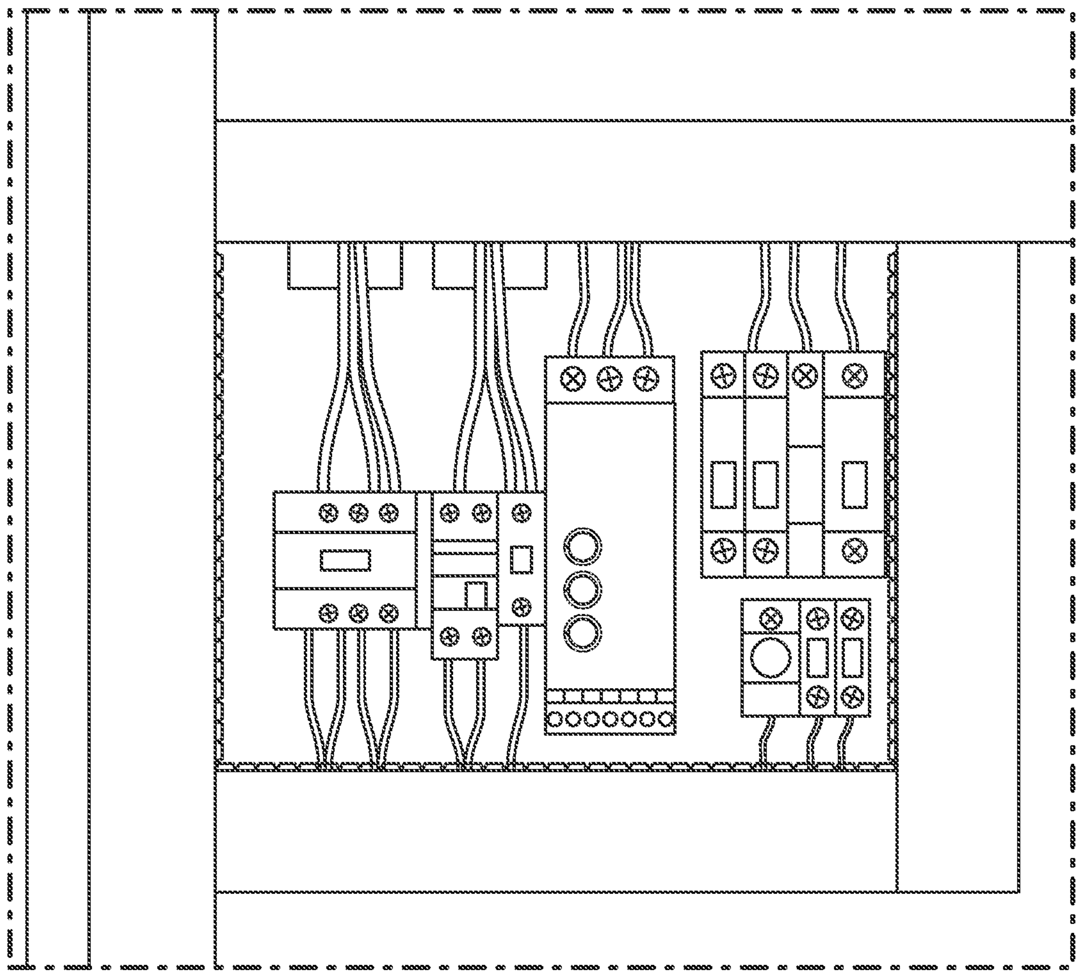
Figure 3O:
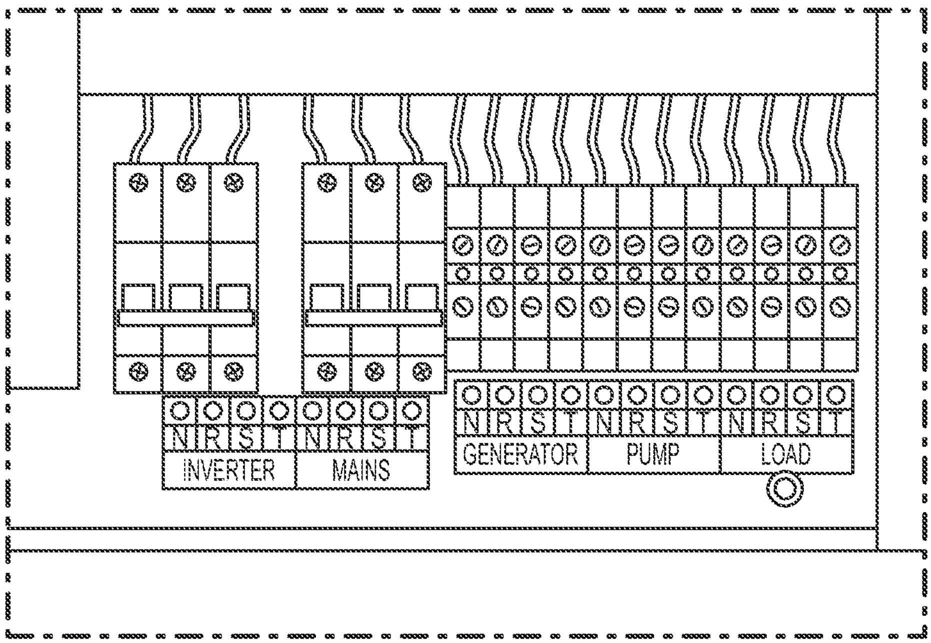
Figure 3P:
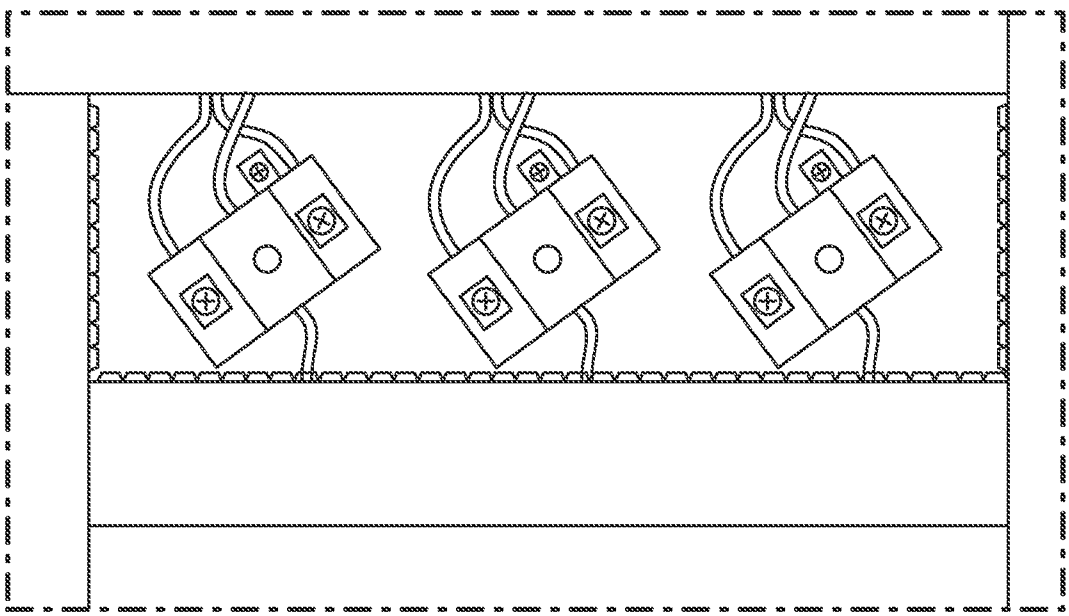
Figure 3Q:
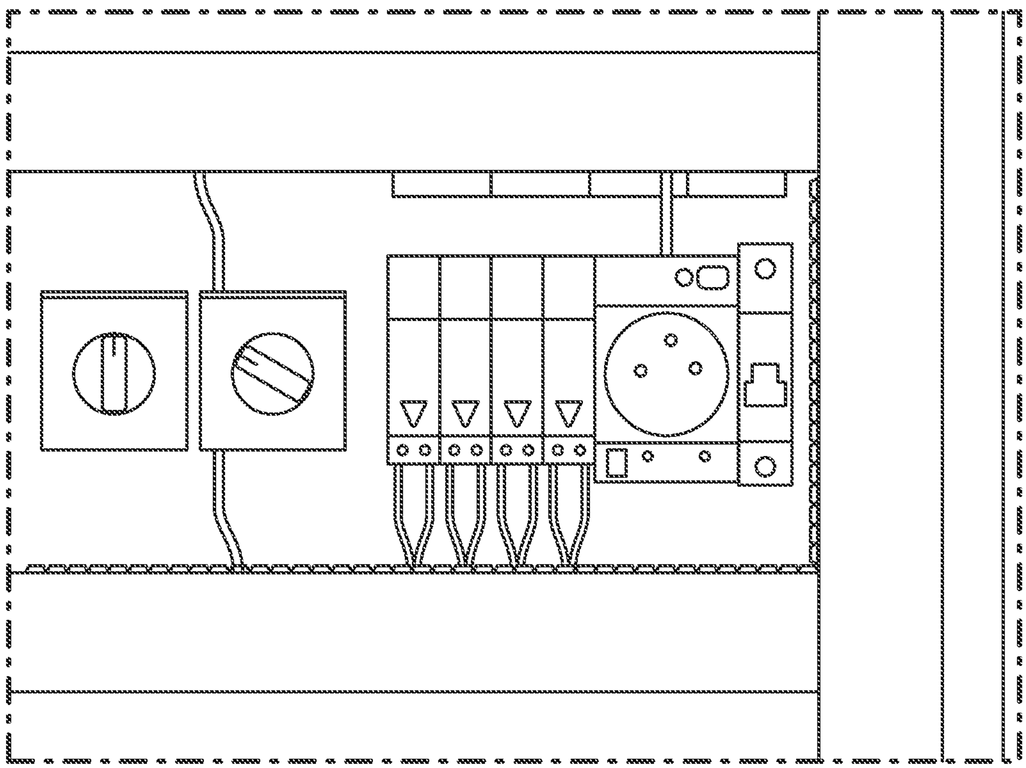
Figure 3R:
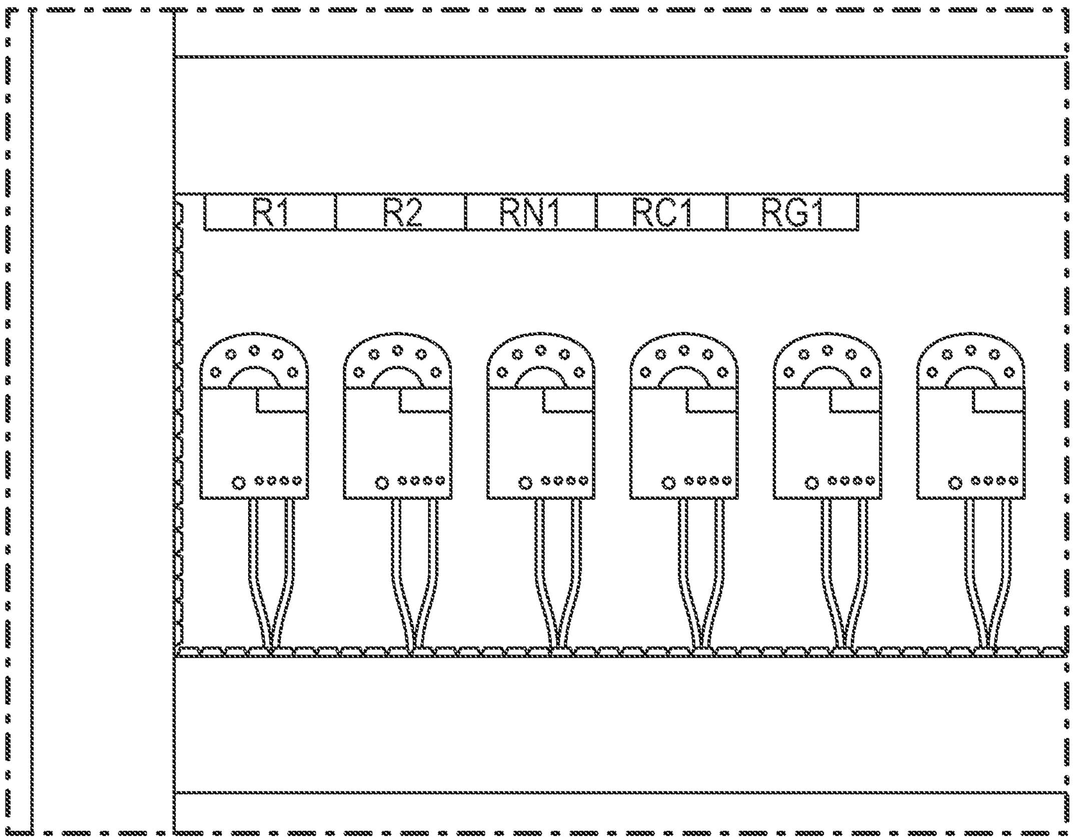
Figure 3S:
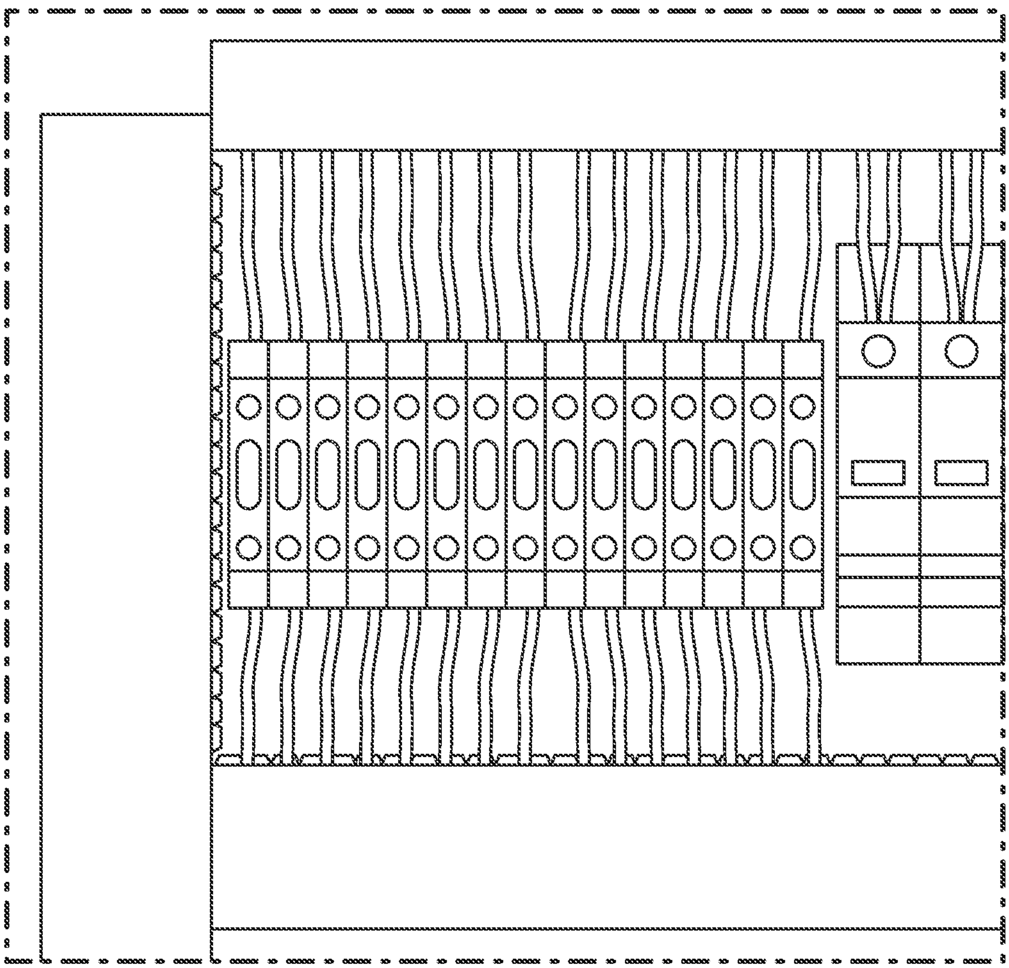
Figure 3T:
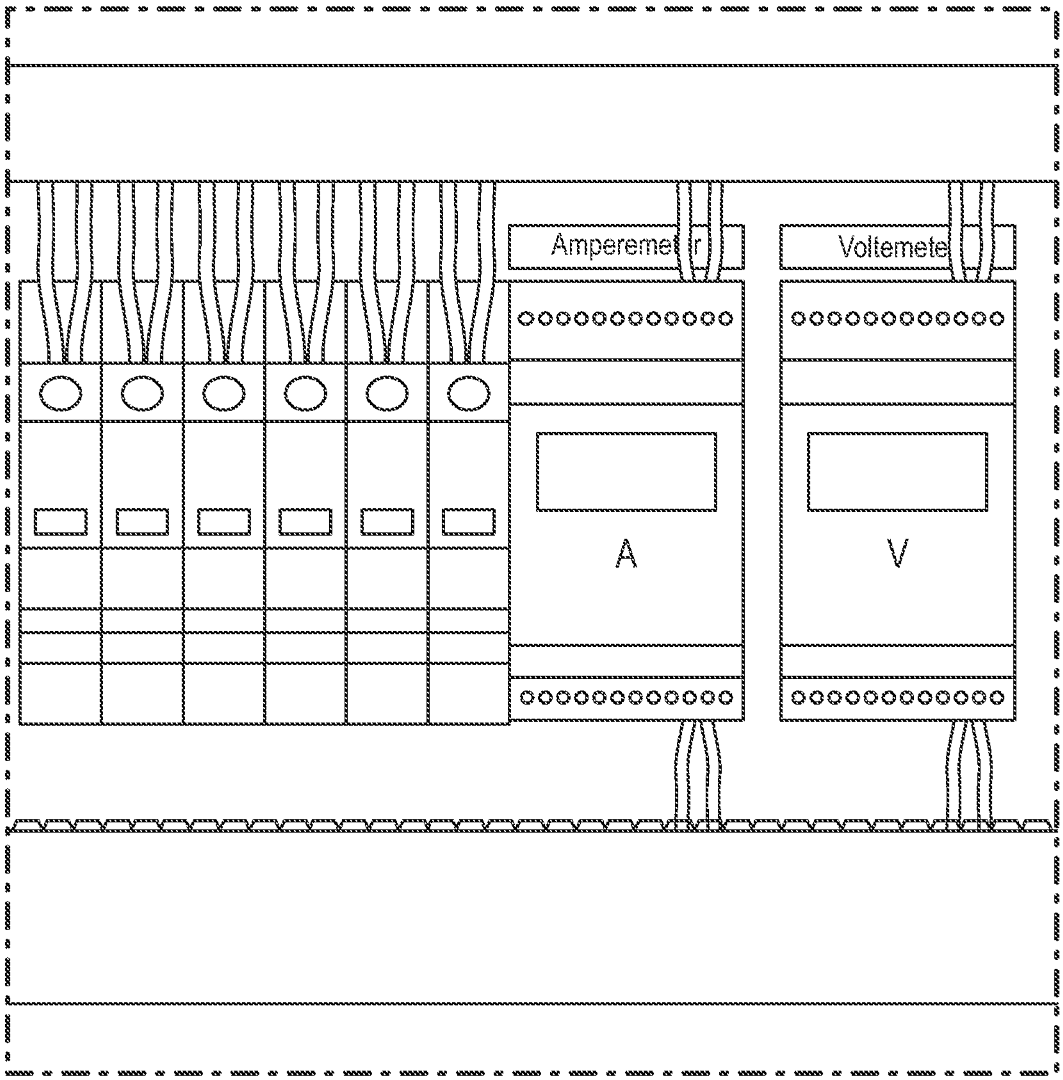
Figure 3U:
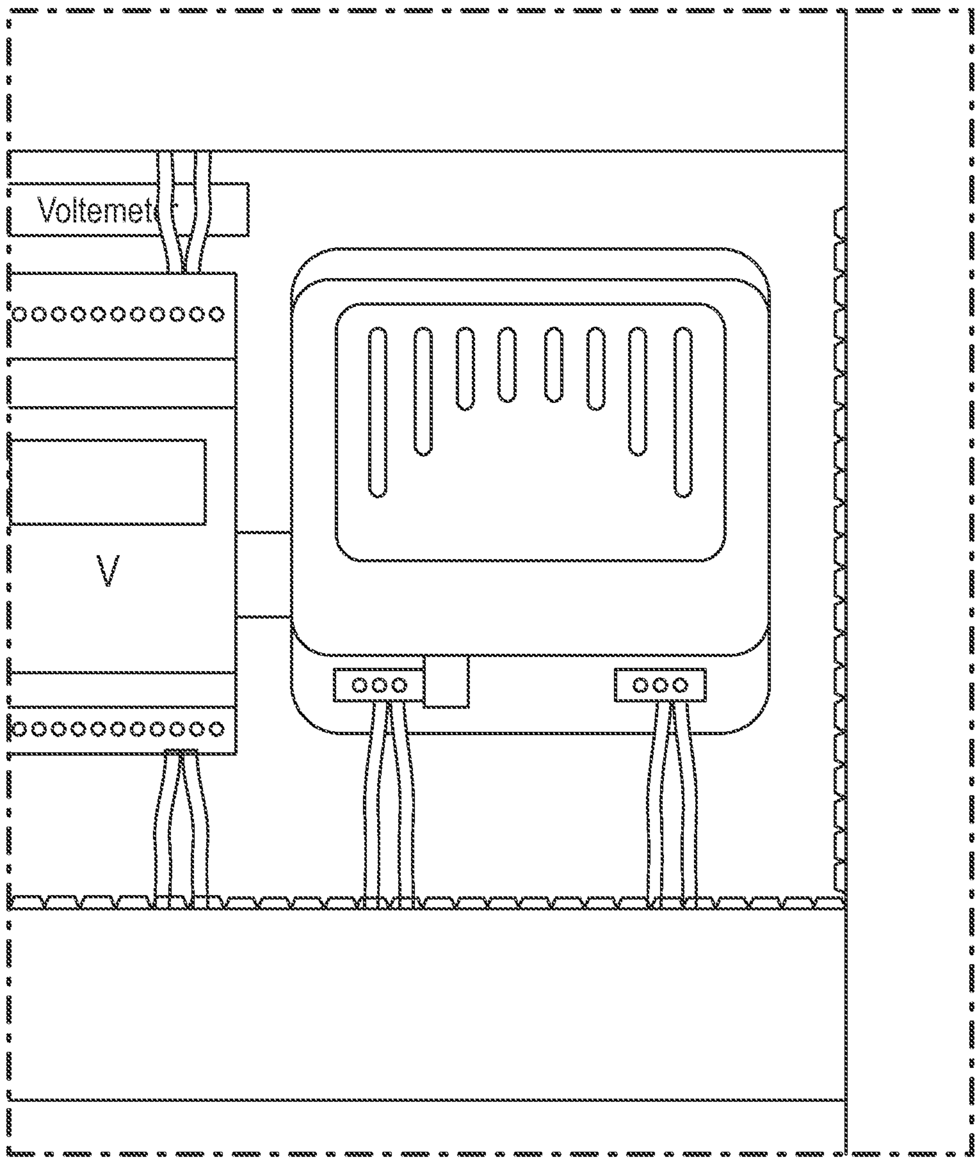
Figure 3V:
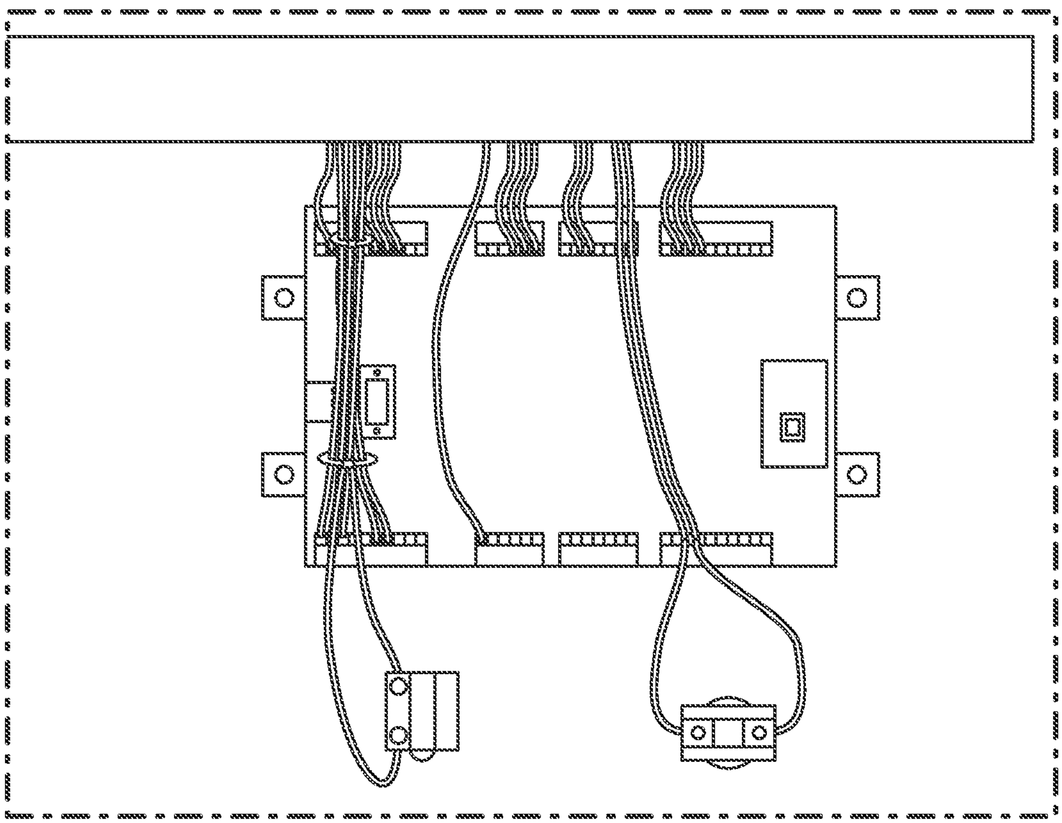
Figure 3W:
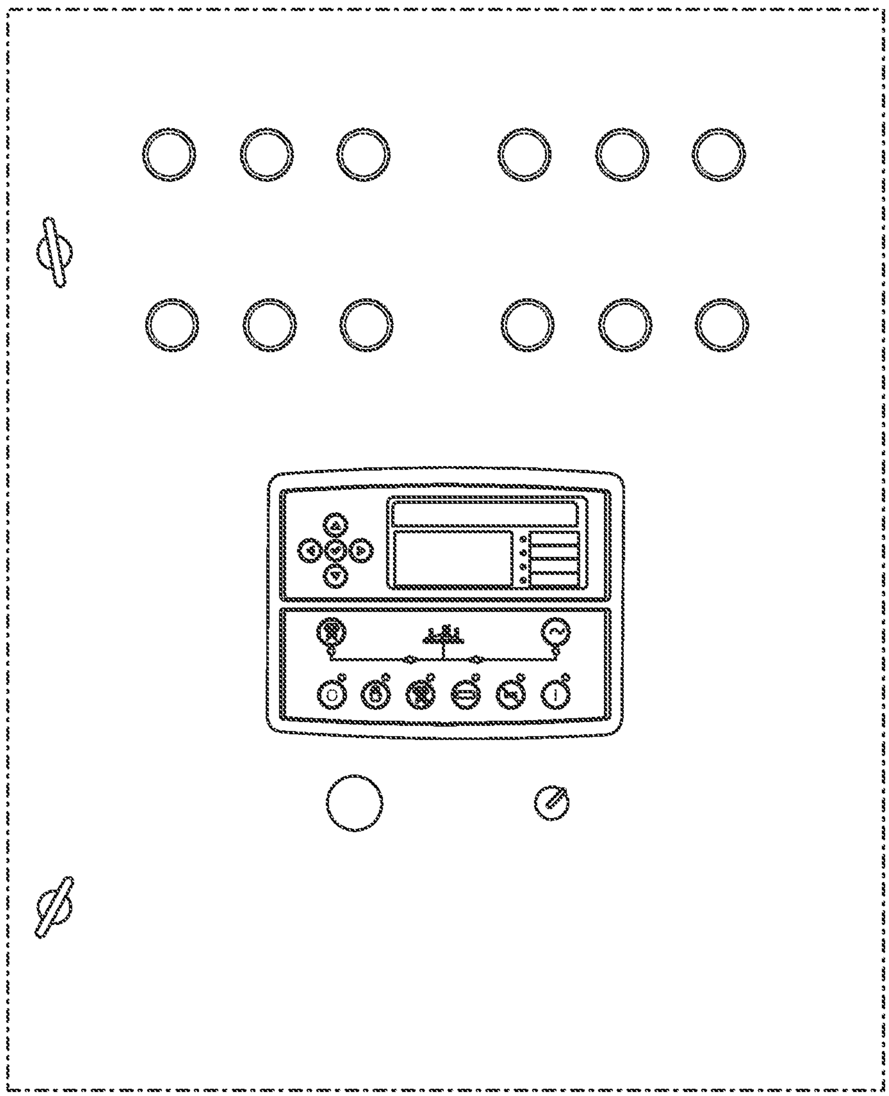
Figure 3X:
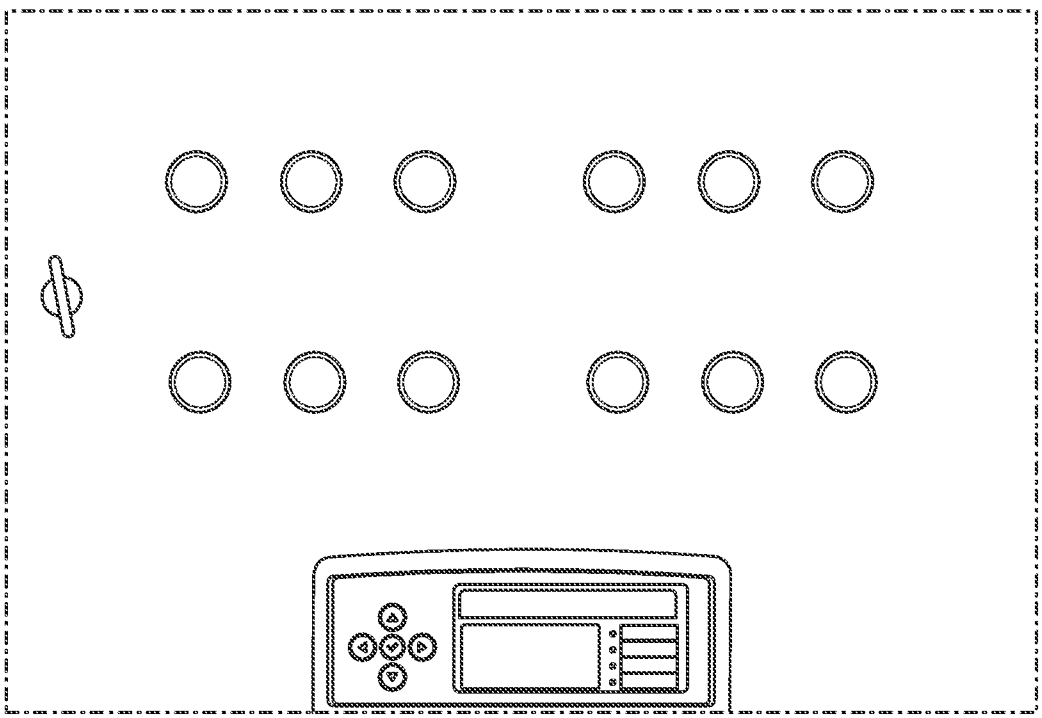
Figure 3Y:
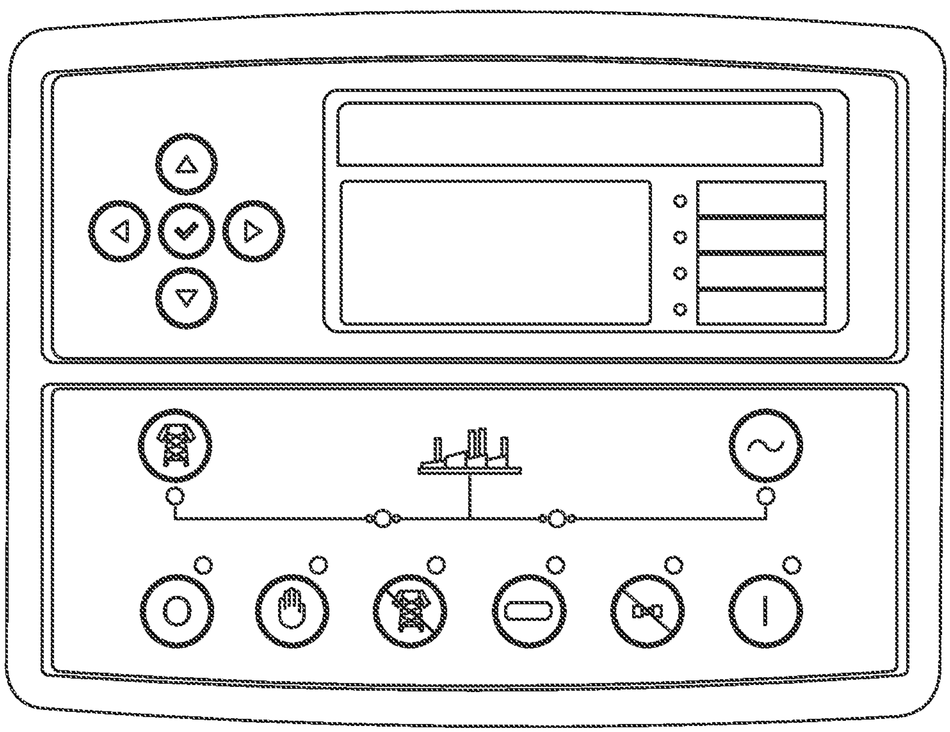
Figure 3Z:
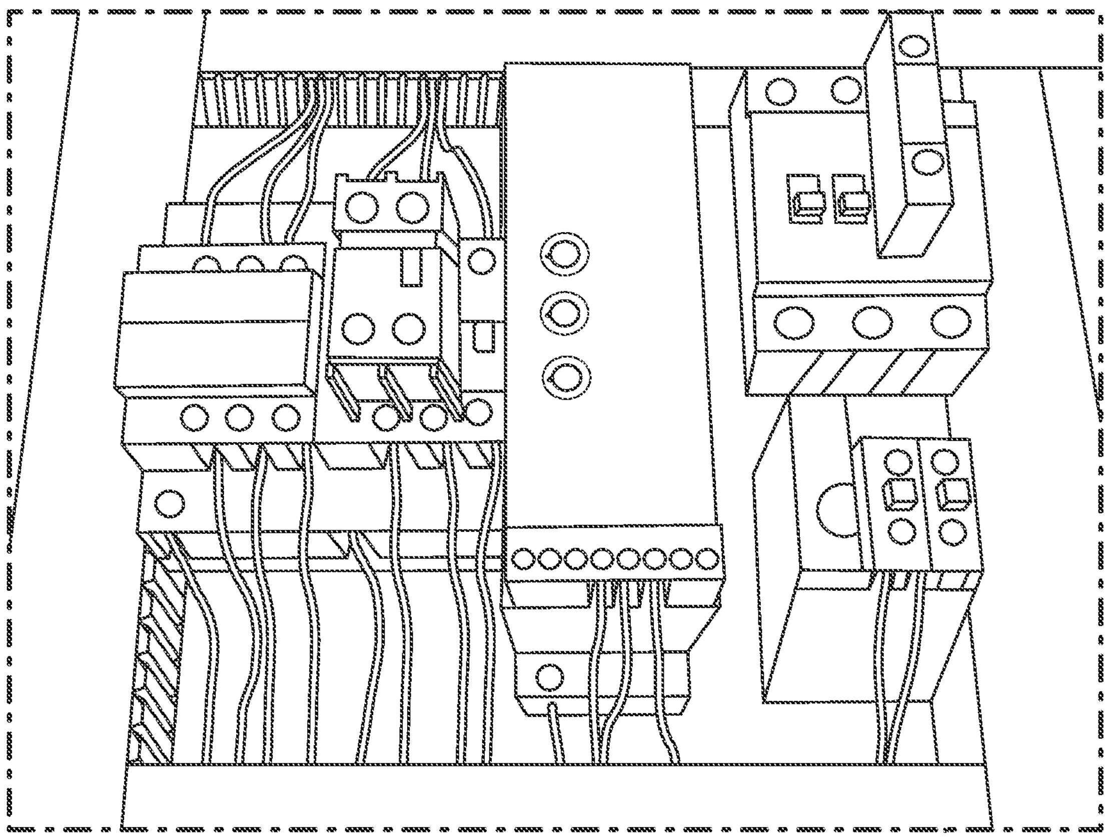
Figure 3A:
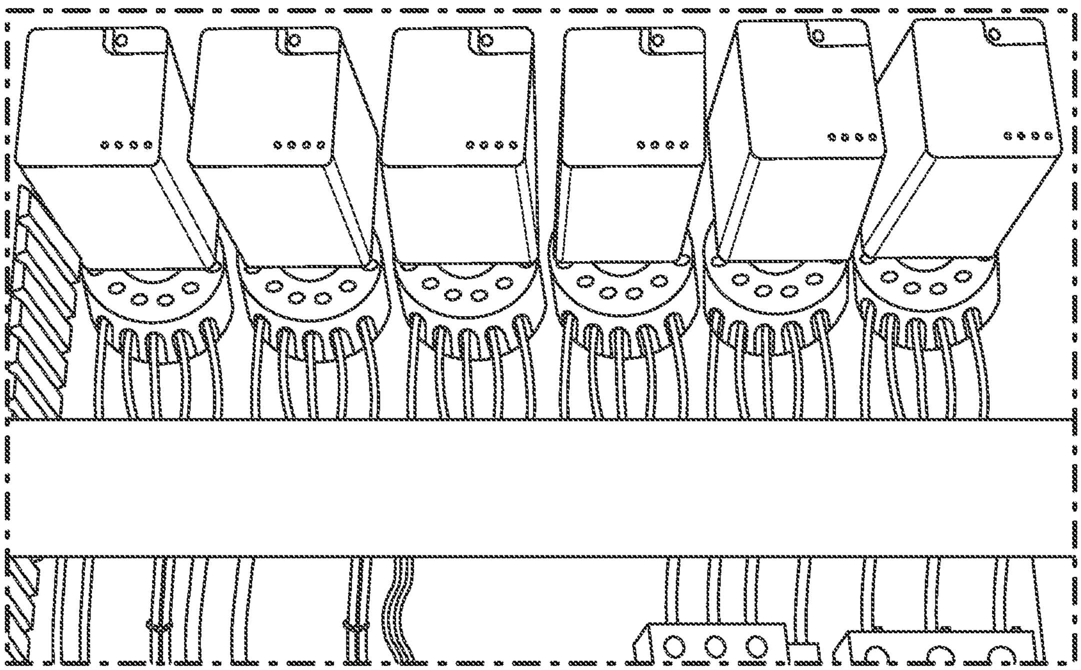
Figure 3B:
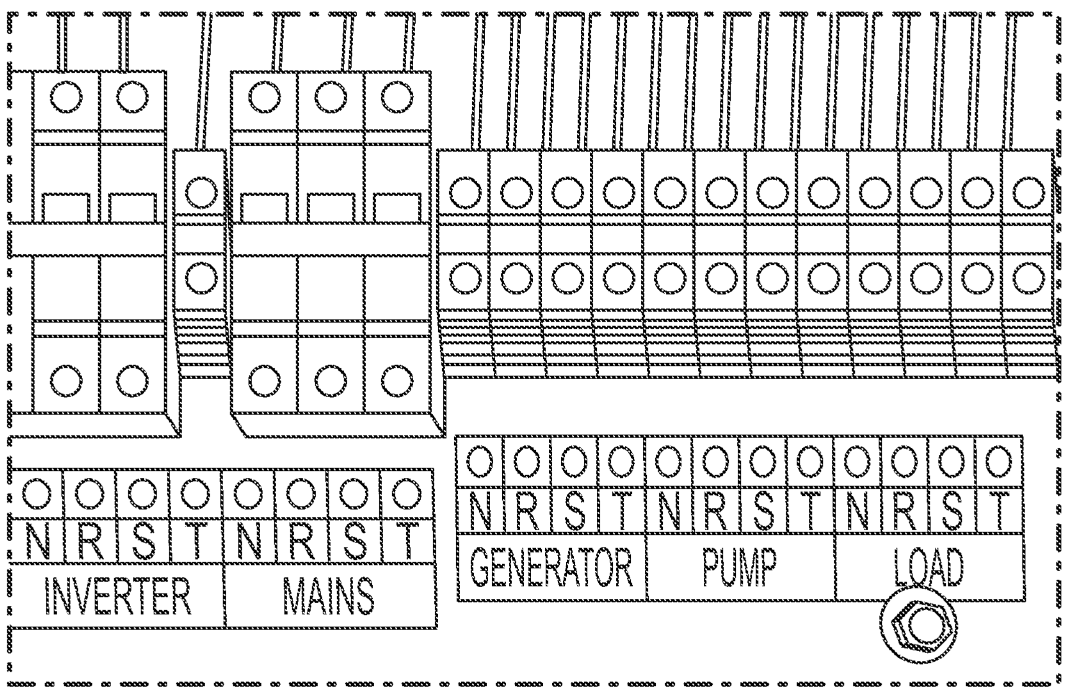
Figure 3C:
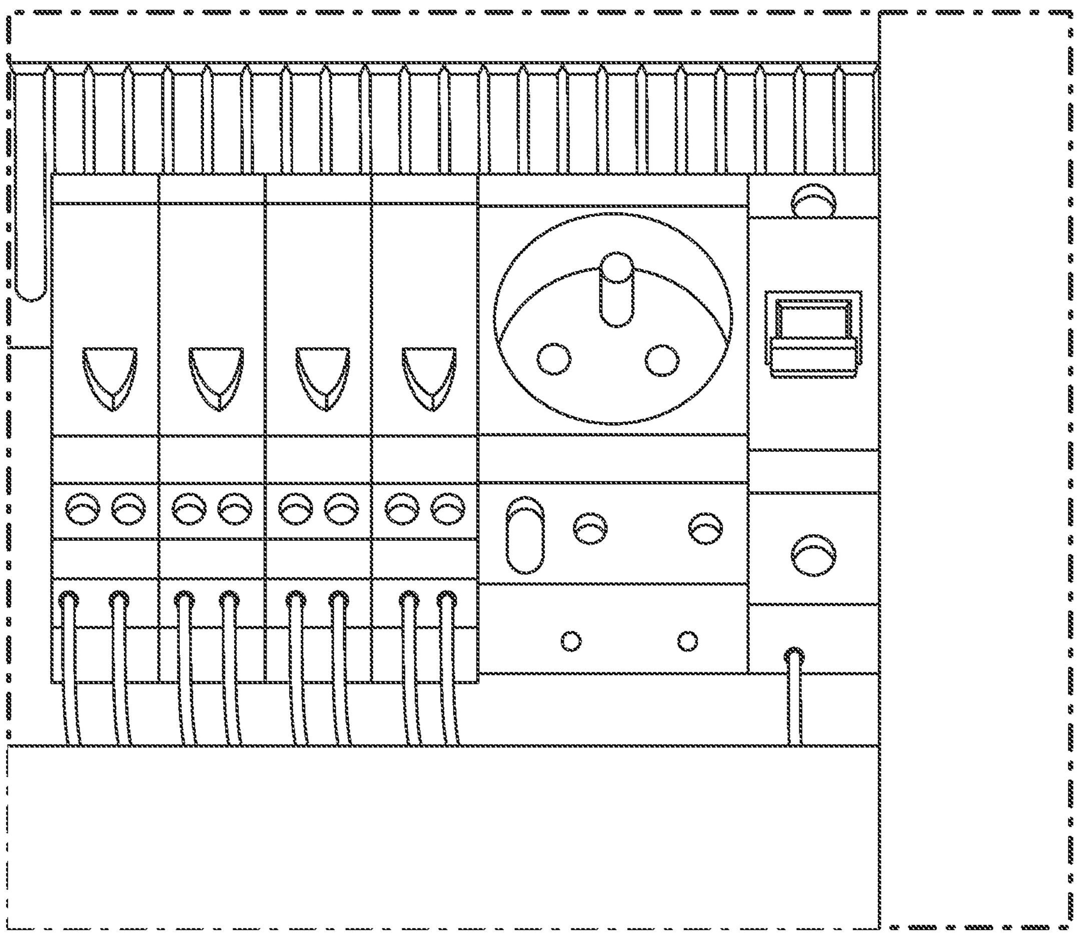
Figure 3D:
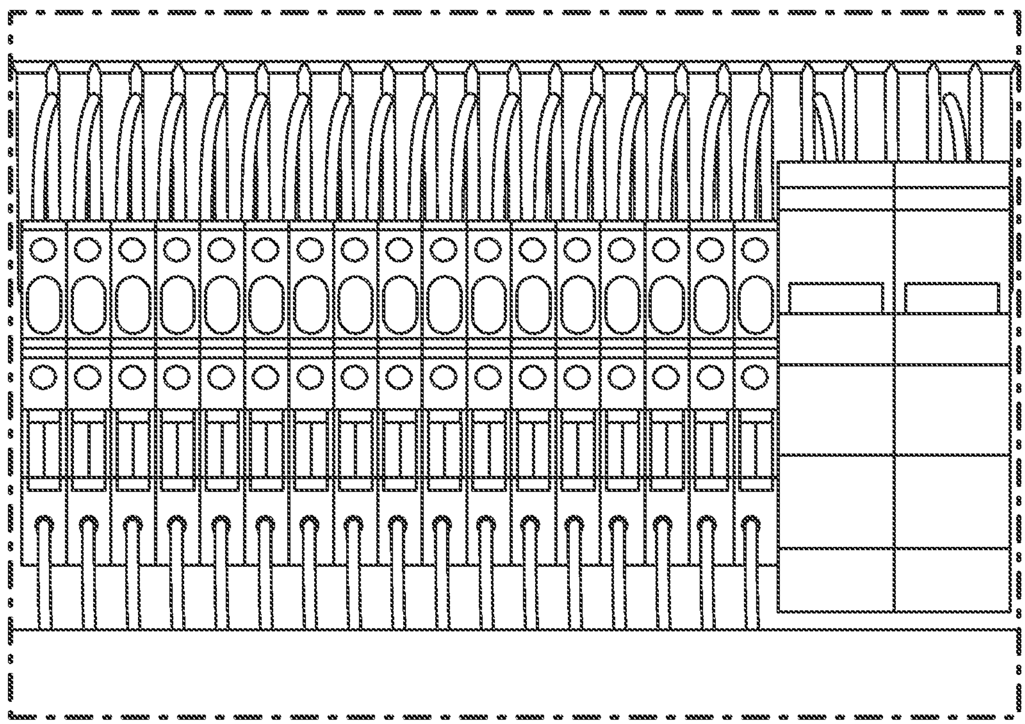
Figure 3E:
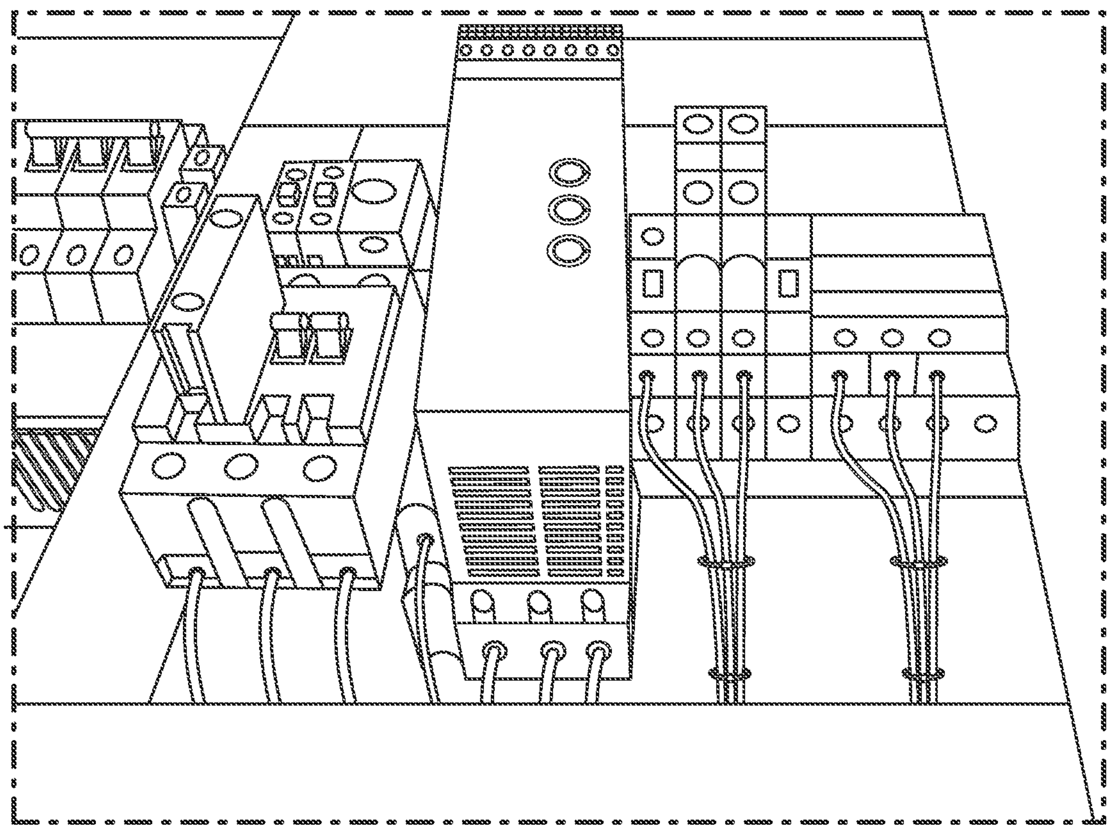
Figure 3F:
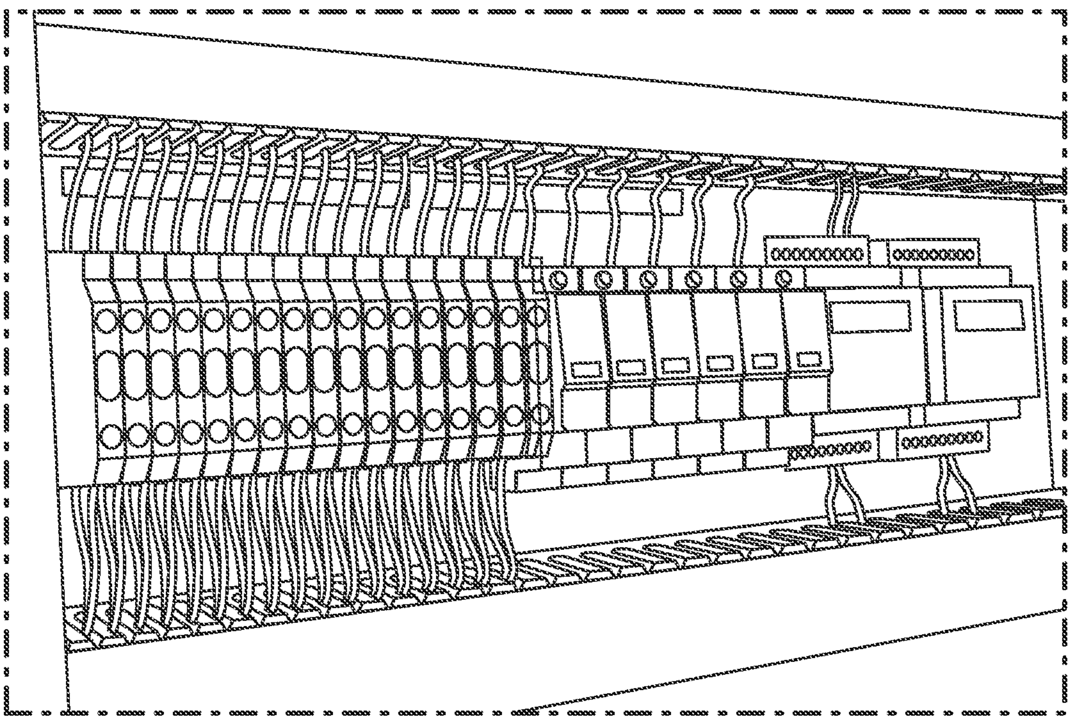
Figure 3G:
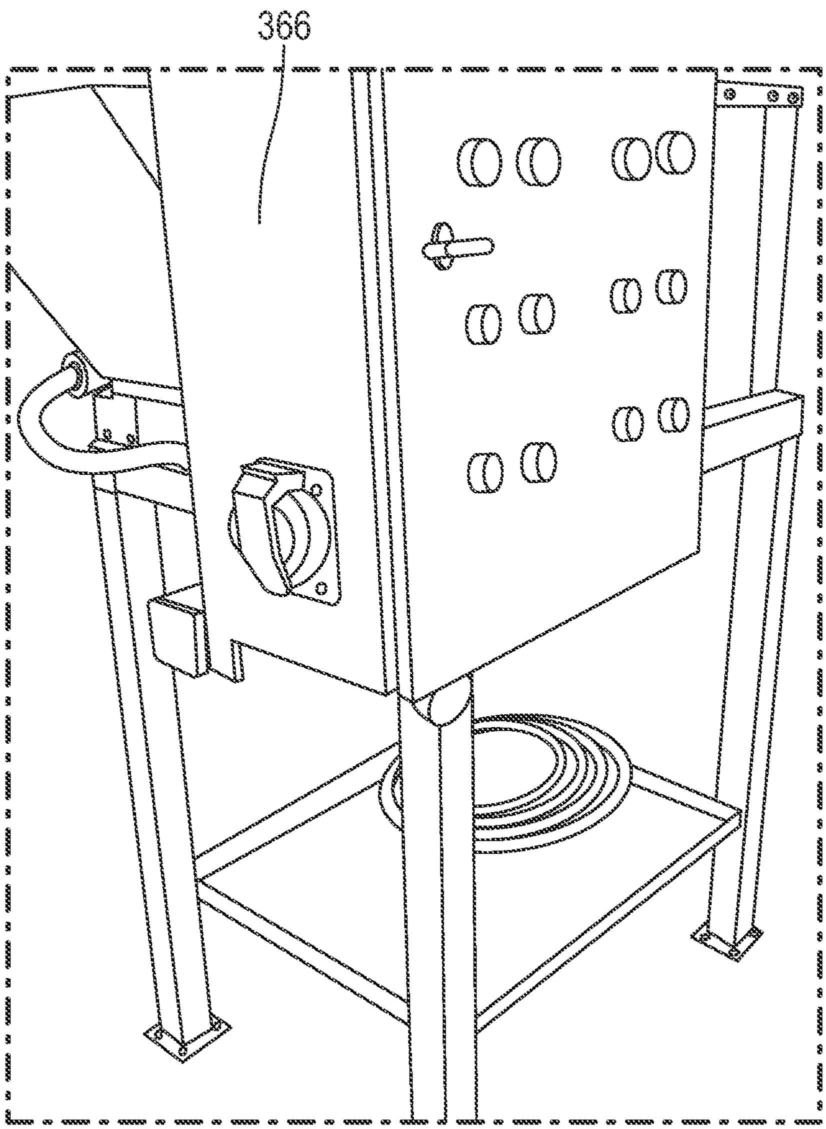
Figure 3H:
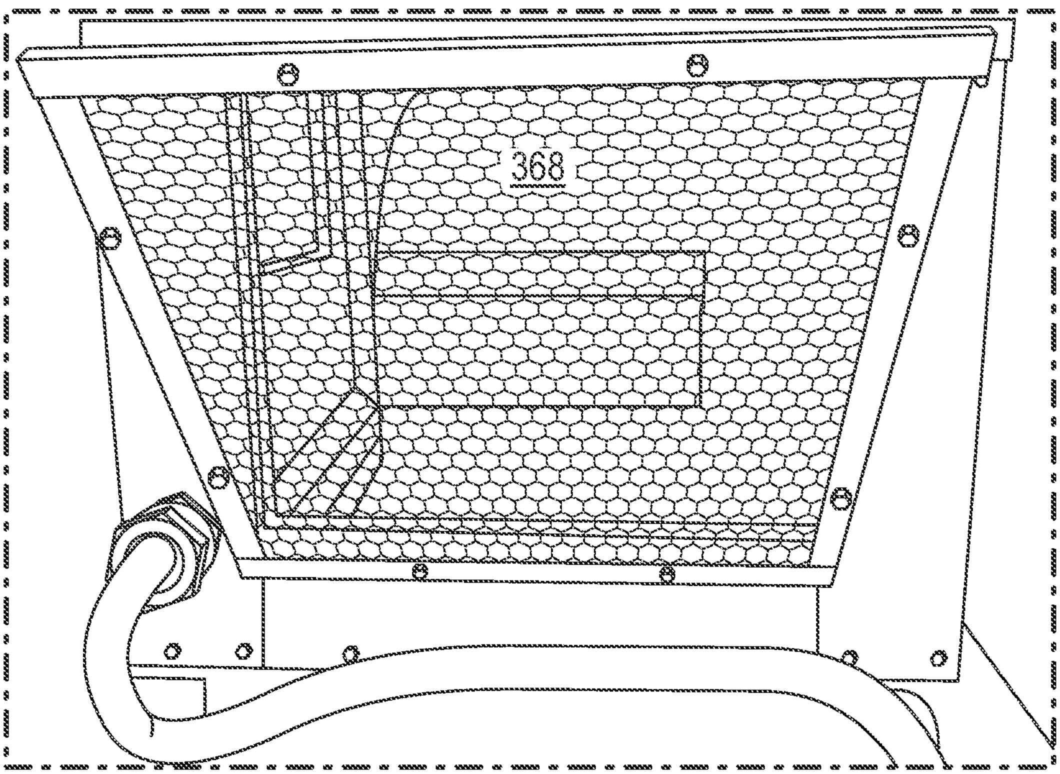
Figure 3I:
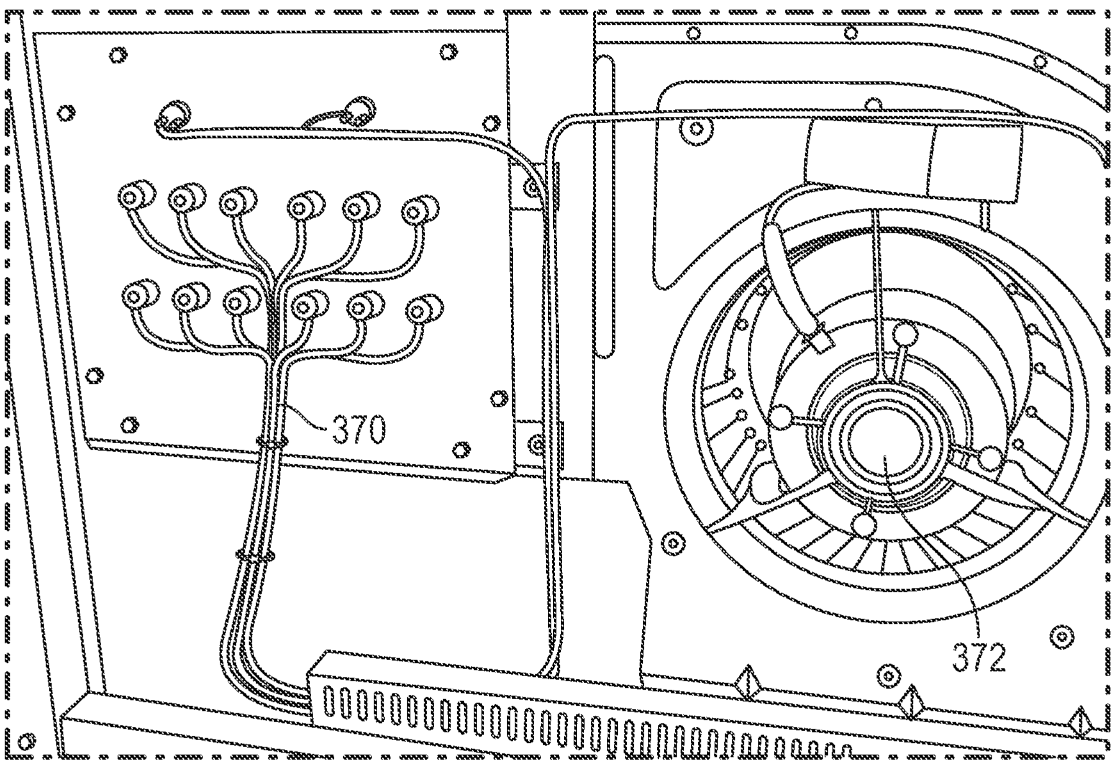
Figure 3J:
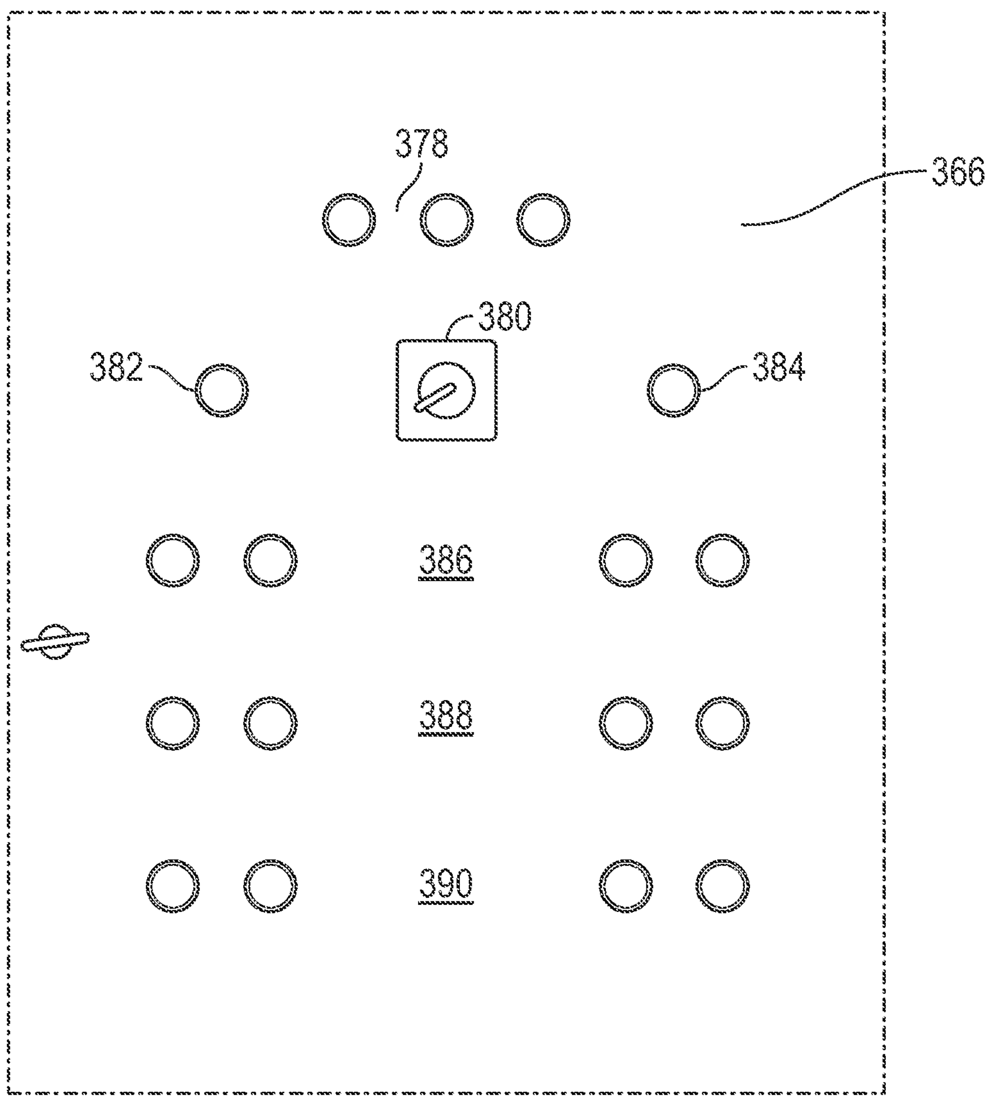
Figure 3K:
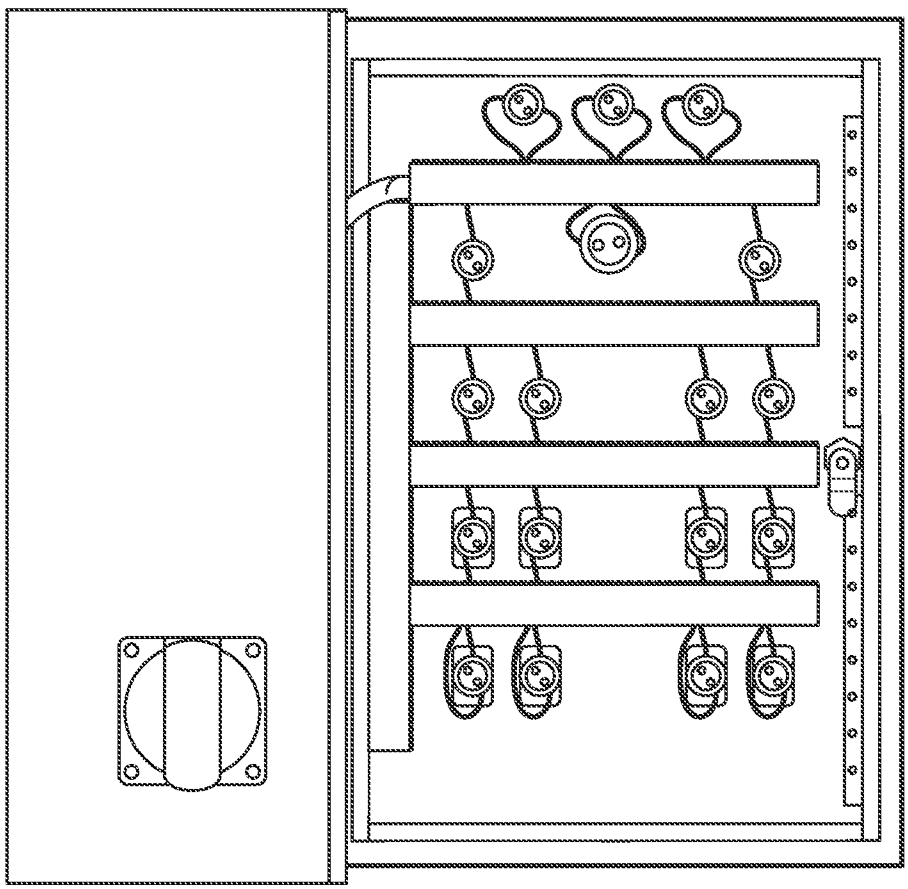
Figure 3L:
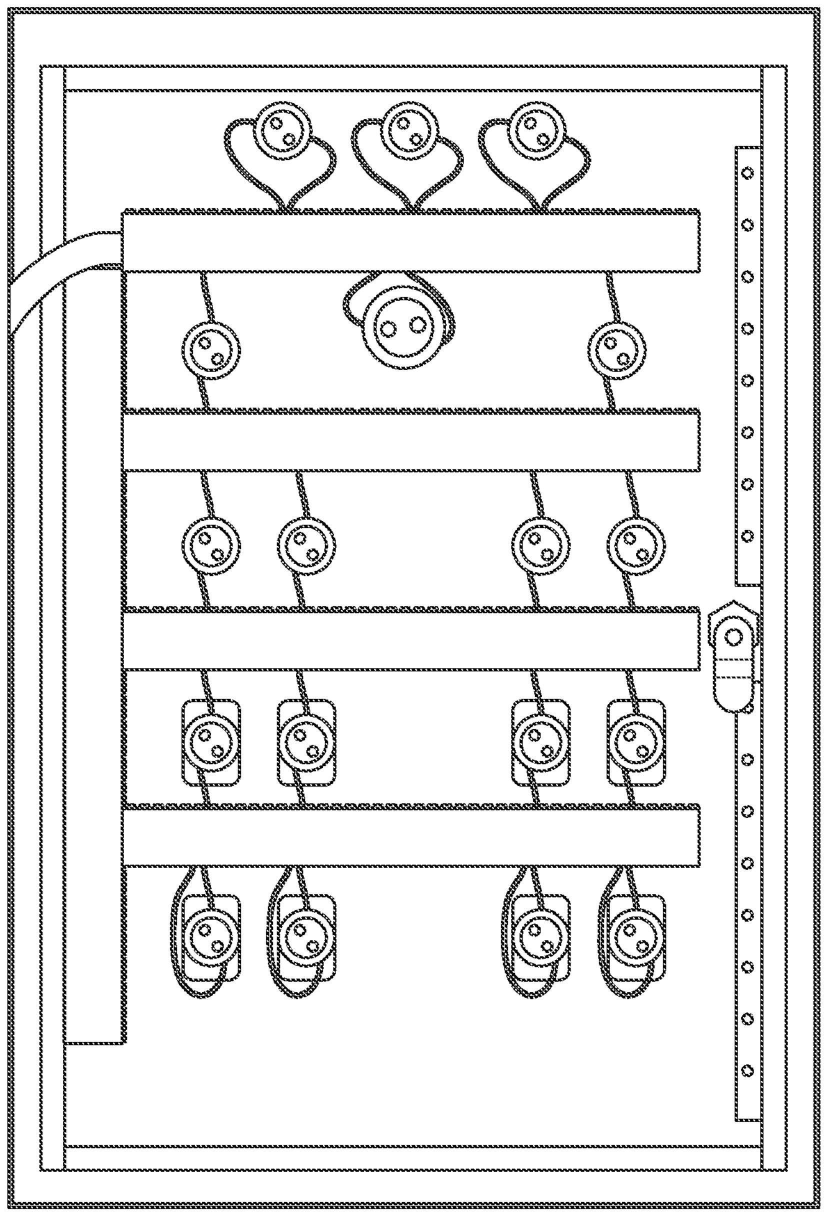
Figure 3M:
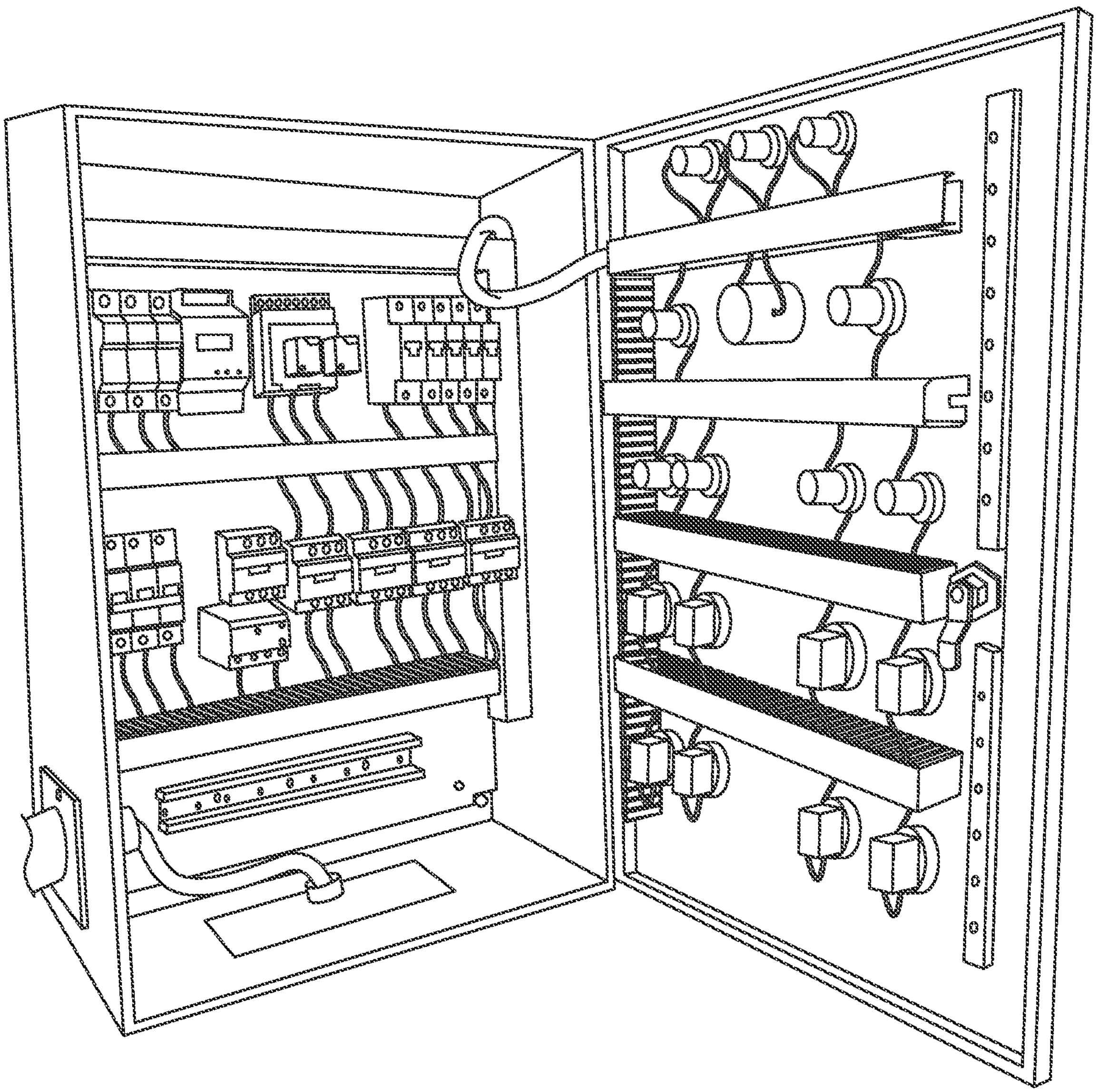
Figure 3N:
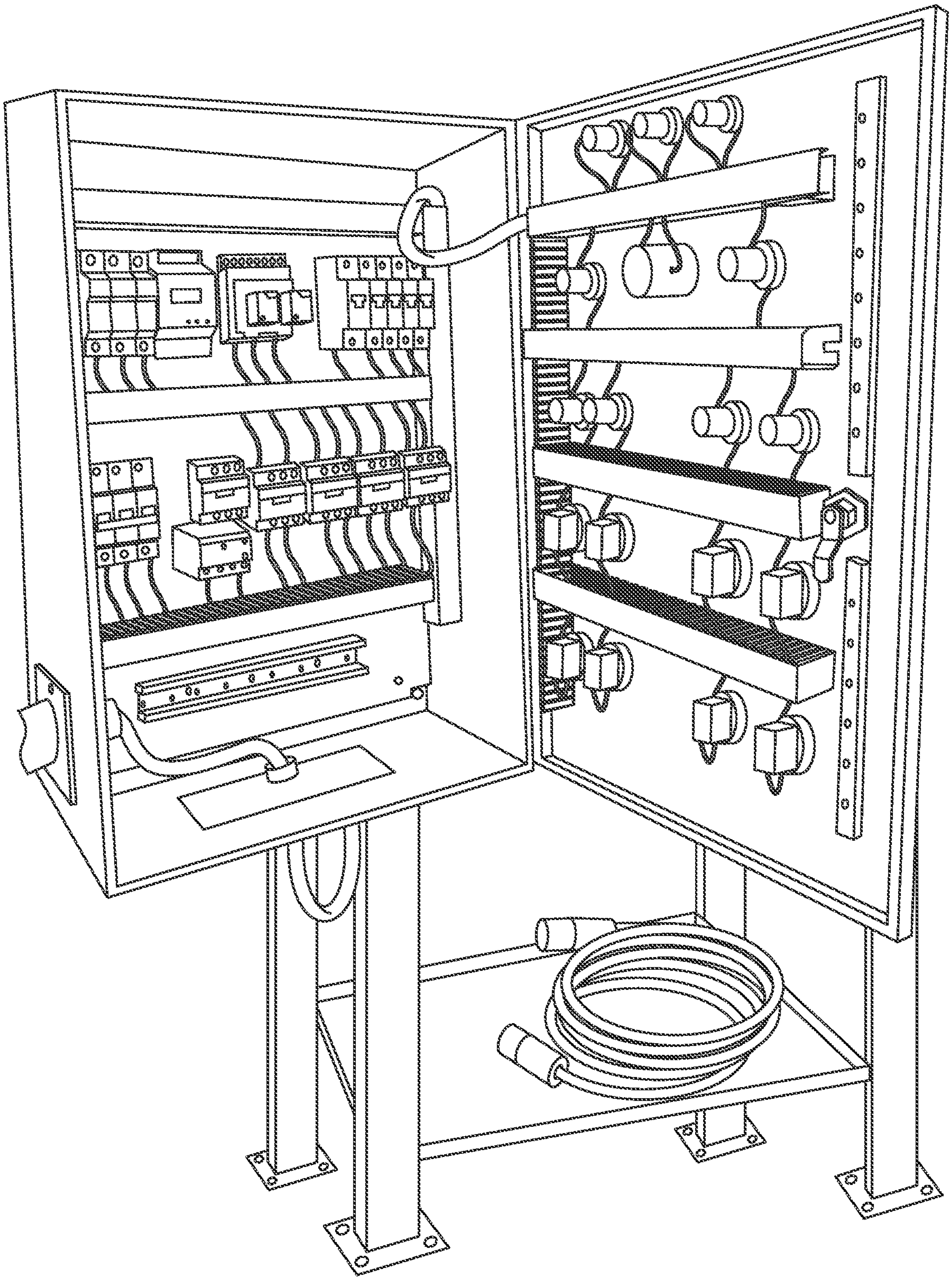
Figure 30O:
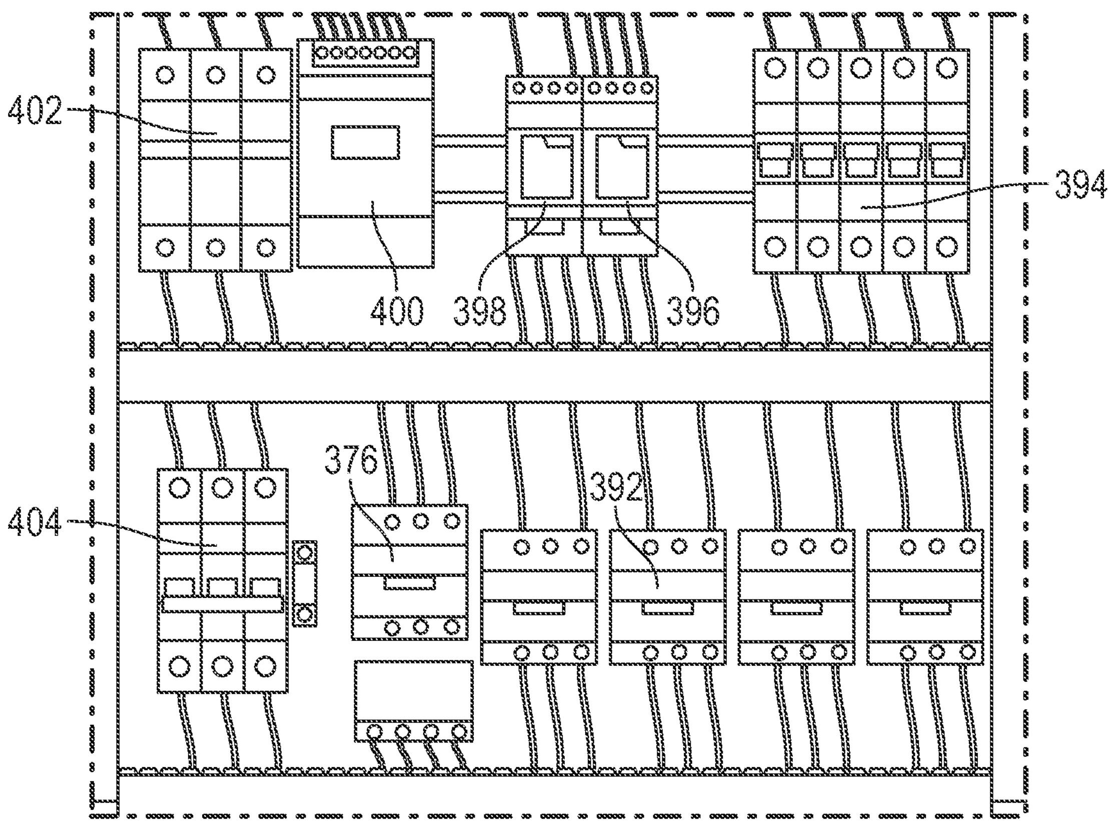
Figure 3P:
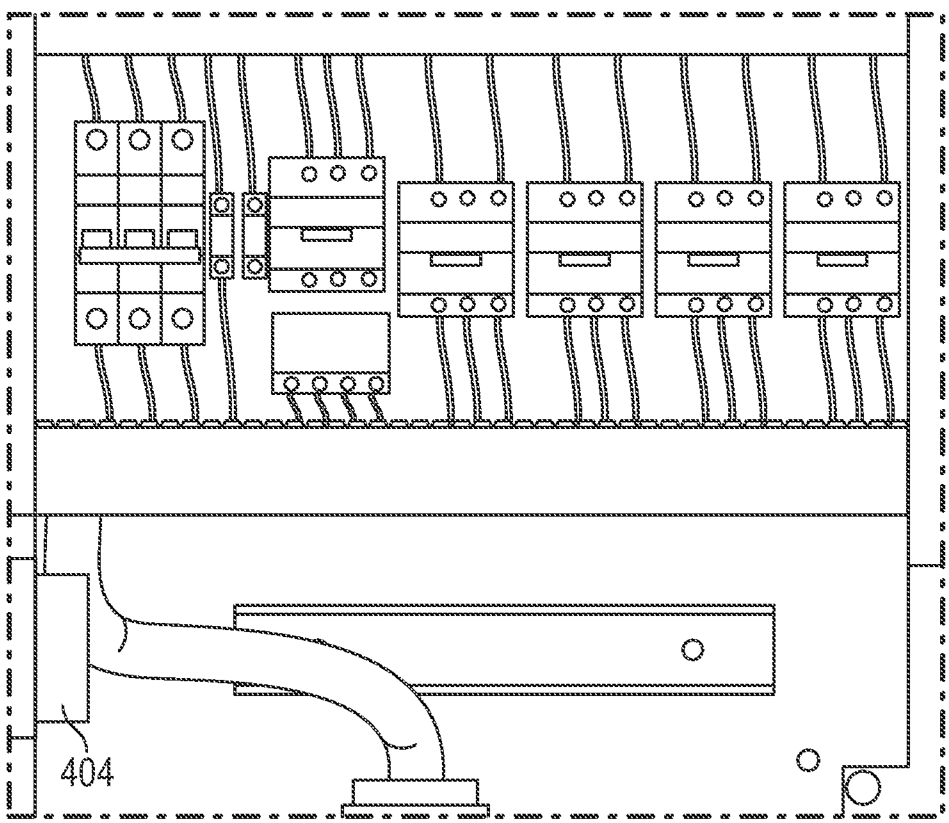
Figure 3Q:
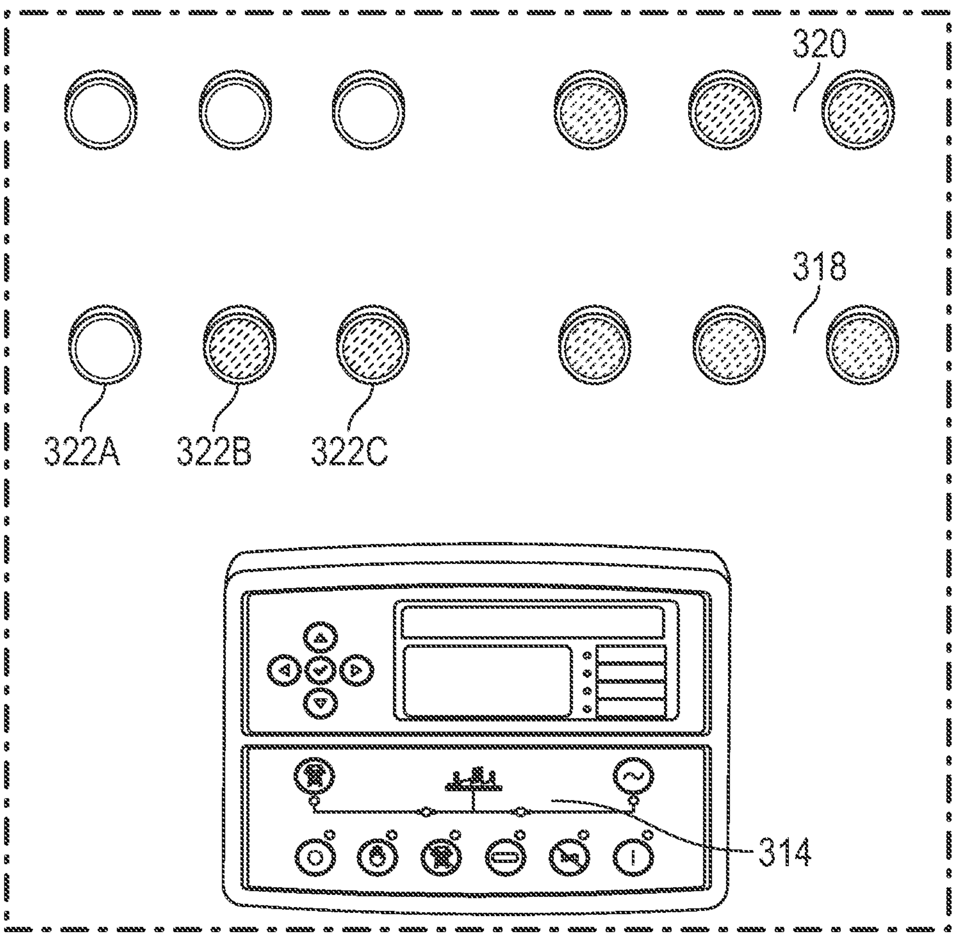
Figure 3R:
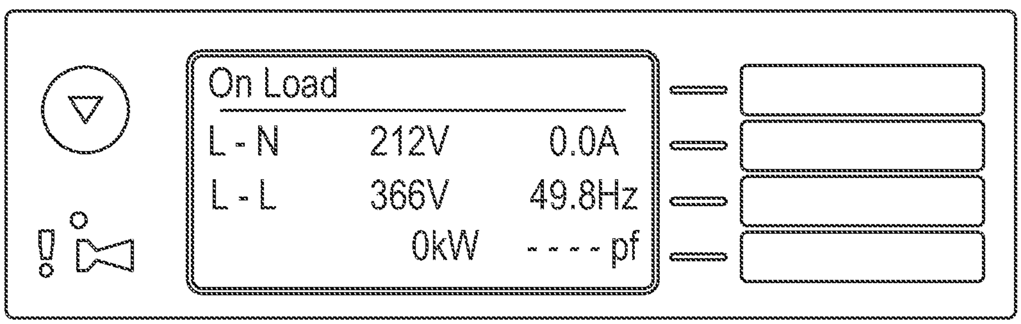
Figure 3S:
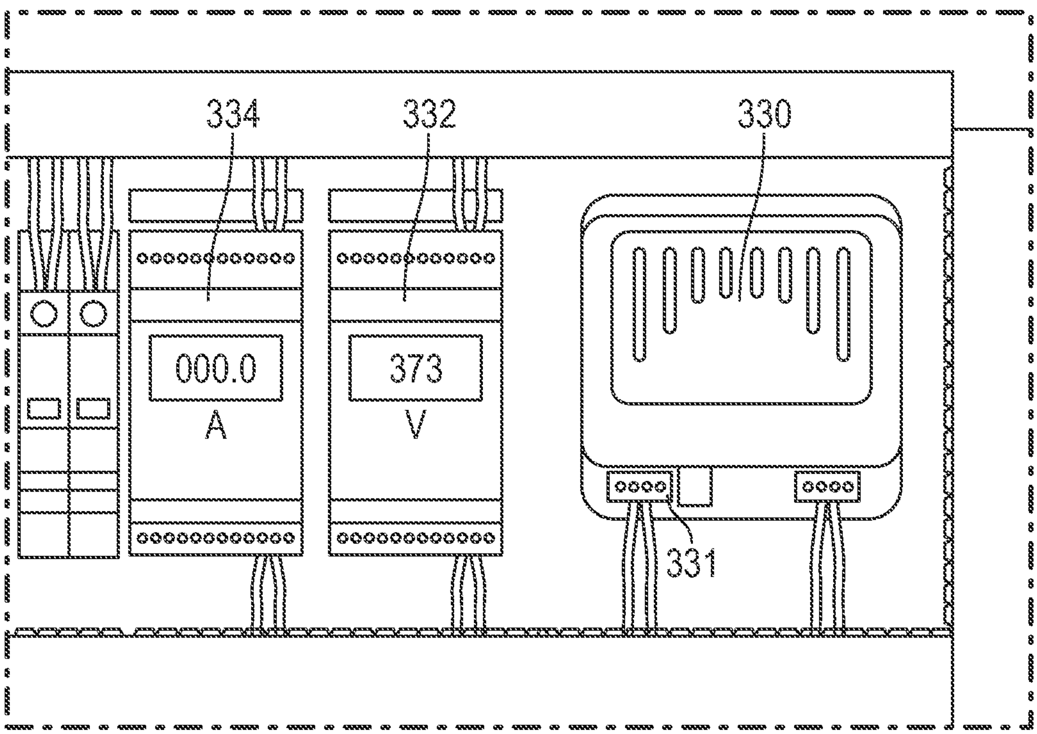
Figure 3T:
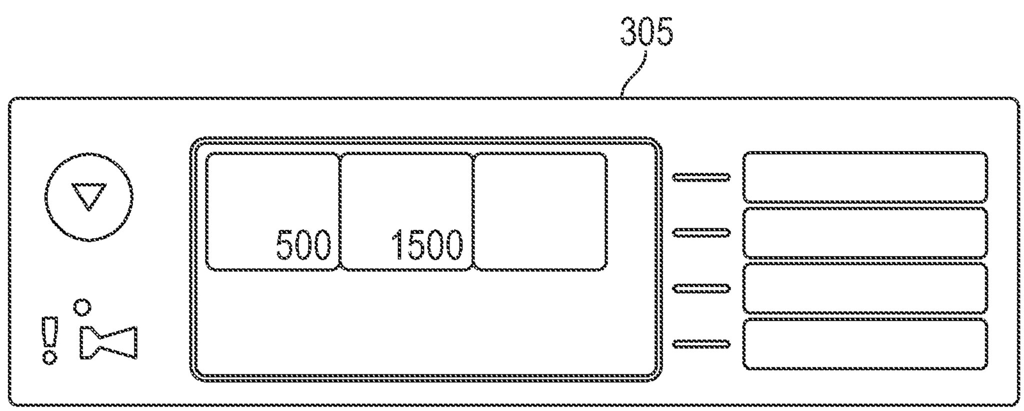
Figure 3U:
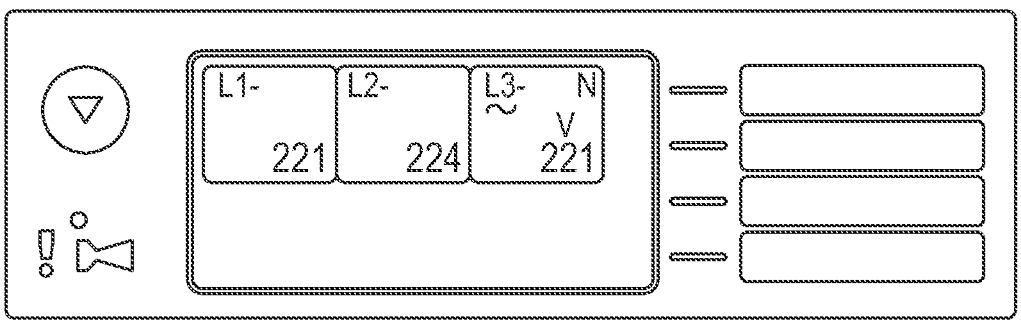
Figure 3V:
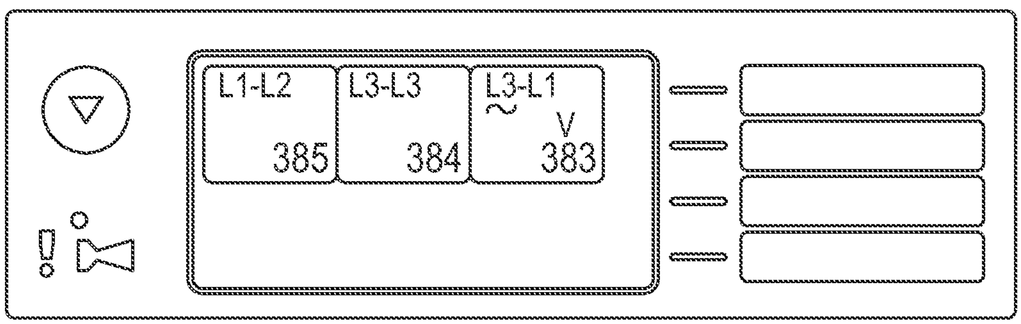
Figure 3W:
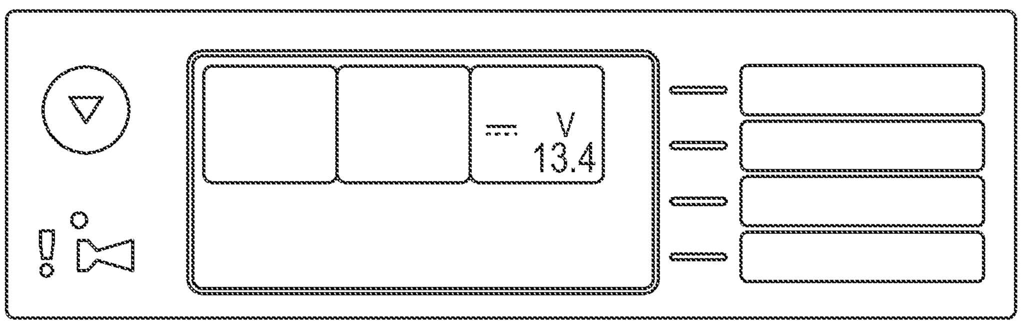
Figure 3X:
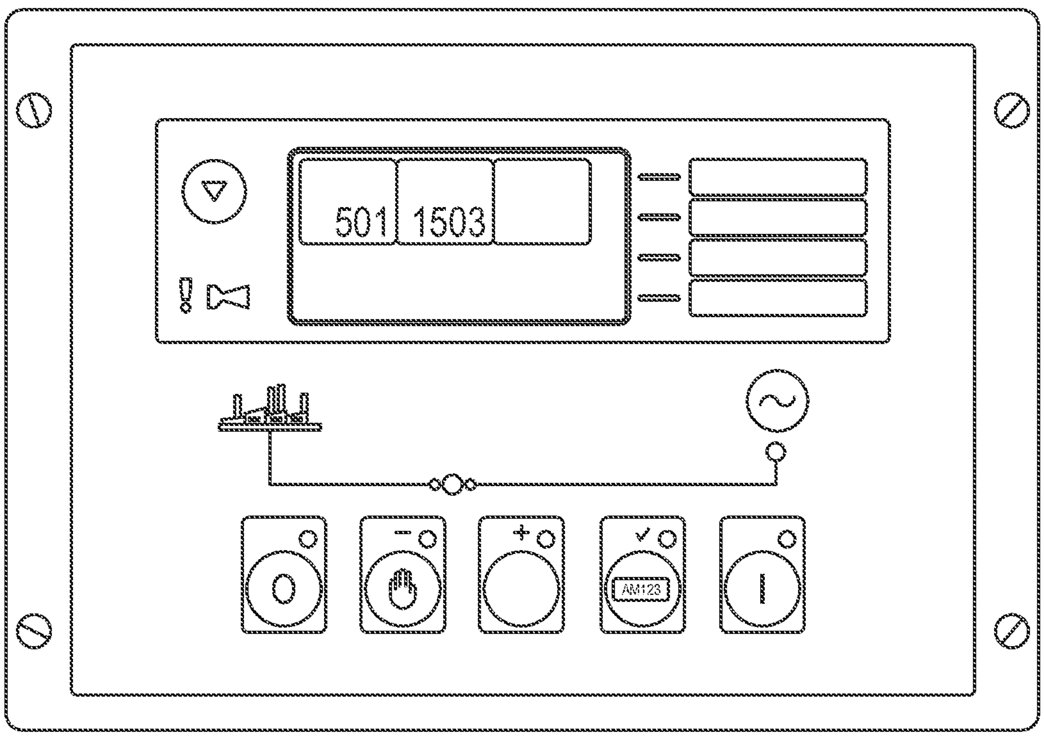
Figure 3Y:
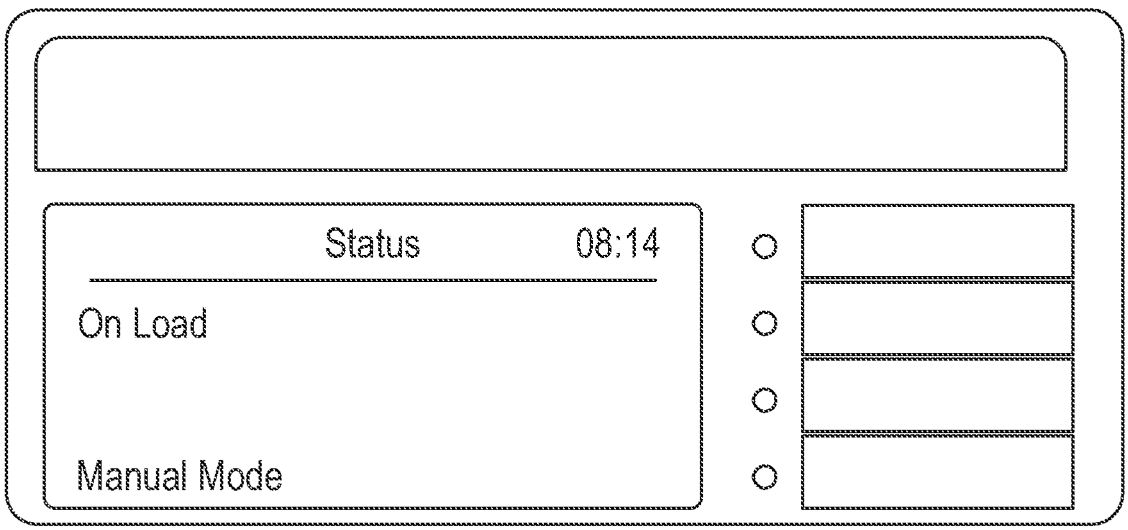
Figure 3Z:
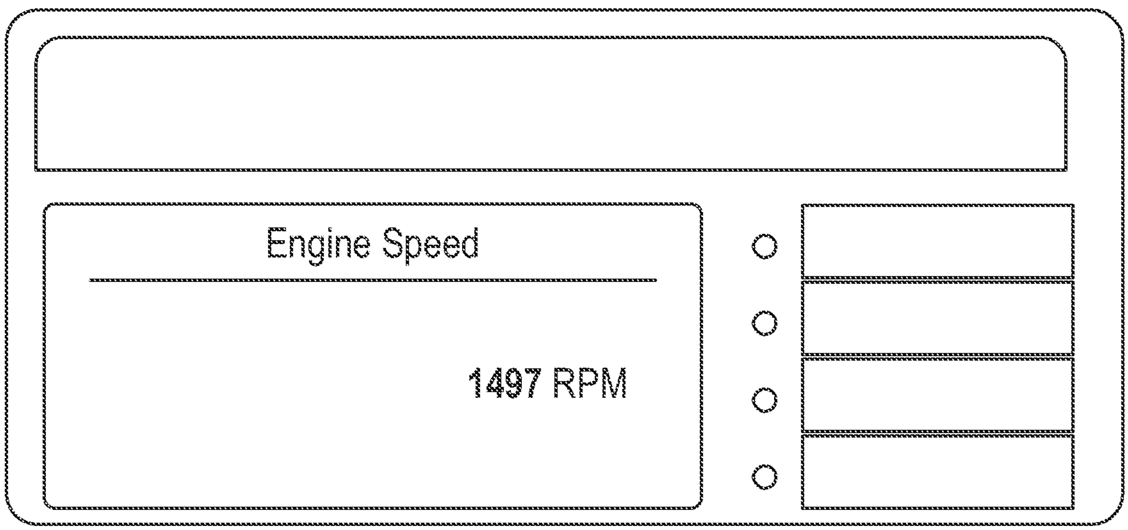
Figure 30O:
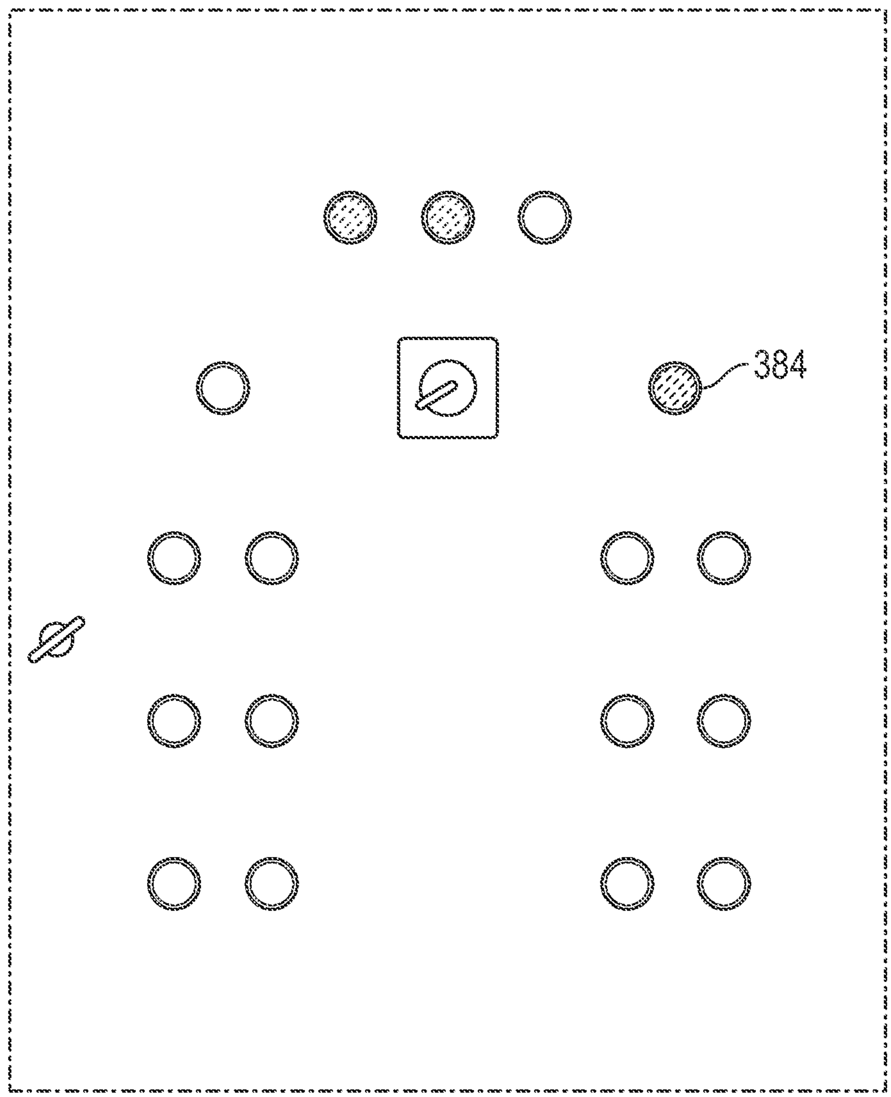

In FIG. 1 a preferred embodiment of the present invention 100, battery 105 comprises one or more apparatus for the storage of a quantity of electrical energy. Preferably a plurality of batteries 105 are electrically connected in a group, or 'bank' 110, to increase electrical energy storage capacity by chemical energy storage, thereby enabling any unused electrical energy as potential energy in reserve. The battery 105 is electrically connected to an electrical conversion apparatus 115 that converts DC current from the battery 105 to AC current. The electrical conversion apparatus 115 is electrically connected to an electrical generator 120 and/or to a load 140. The electrical generator 120 comprises an electric motor 125 that engages and rotates an alternating current (AC) generating apparatus, or alternator 130, which is electrically connected to an electrical charger 135. The electrical energy produced by rotation of the internal alternator 130 apparatus is directed to the electrical charger 135. During operation, the electric motor 125 withdraws power from the battery 105 which causes the electric motor 125 output shaft to rotate. The energy now resident in the electric motor 125 is transferred via coupling 127 to the input shaft of the coupled electrical energy generator 130 to cause its internal mechanism to rotate and generate a specific output of electrical energy. Thus the mechanical energy from the electric motor 125 is transferred to the electrical energy generator 130 to produce electrical energy for distribution and use. The electrical energy may be distributed to a load 140 for immediate use, including but not limited to a home or business. When energy to turn the electric motor 130 is required, the battery 105 releases stored electrical energy (potential energy) to the electric motor 130. The electrical energy thus energizes the electric motor 130 shaft to rotate thereby converting electrical energy into mechanical energy. Thus the potential energy stored in the battery 105 is converted to mechanical energy in the motor 125 which is transferred to the connected alternator 130. This motor mechanical energy is then converted back to electrical energy by the generator 130 thereby defining an energy transfer and conversion circuit for the invention.

Since some portion of the stored electrical energy in the battery 105 will be lost in system operation due to mechanical friction, heat or other known factors, a backup source of electrical energy 145 production is required to maintain sufficient energy storage in the battery 105 to optimize functioning of the electricity production circuit. The backup or secondary source of electrical energy 145 is preferably provided from an apparatus that converts sunlight to electrical energy, such as one or more solar cells 150. In use, the electricity generated from the solar cells 1540 maintains sufficient electrical charge in the battery to energize the electric energy transfer and electricity production circuit to produce electricity for distribution. If the solar cells 1540 do not generate sufficient electricity due to weather conditions, or if electricity production is reduced or otherwise off-line, another means of generating sufficient electricity to maintain the charge in the battery 105 at required levels to energize the electric motor 125, such as a gas or liquid fueled electricity generator 145, or electrical energy from the grid, may be utilized to maintain the electric system energy input at required levels.

Preferably, control of the operation of the EPS apparatus 100 components will reside in one or more control units 150, with a plurality of inputs and outputs electrically connected to the components, comprising programmed instruction with computerized control by known methods, including but not limited to a programmed logic controller (PLC), a personal computer, or commands transmitted through a network interface. The control unit(s) 150 will monitor the system parameters such as voltage 516, current 518, temperature 522, generator rotational speed, battery charge 524, demand by the serviced electrical load 526, backup generator output, etc., by receiving data from a plurality of sensors 1530 including but not limited to temperature sensors, current sensors, electricity demand sensors, and electrical charge-discharge sensors, the controller 150 interpreting or analyzing the data according to programmed instruction and outputting commands The received data input will be processed in a control unit 150 according to the programming, and instructions will be electronically output to a plurality of electrical switches and electrical valves to maintain system electricity generation and energy storage as required.

An advantage of the design of the present invention is that the power transfer and generation apparatus of the EPS 100 may be scaled to fit large or small load demands. For larger load demands, preferably a plurality of motors 125, electricity generators 130, batteries 105, controls 150, etc., could be designed into the power generation station 100.

In an embodiment of the present invention designed to service a significant load such as a large home, preferably a plurality of electrical generating circuits of the present invention are utilized. Potential energy is stored as electrical energy in a plurality of batteries 105 in banks 110 electrically connected to the electrical and electronics circuit controller(s) 150. In use, the stored electrical energy is sequestered in the battery bank 110 and controllably released into the electrical circuit producing a mechanical energy to rotate an electric motor 125, and then a coupled electrical generator 130, to produce electrical energy for use as stated above. When the controls 150 signal release of electrical energy, the electrical energy flows through an electrical supply line to a PLC/PC logic controller 150 according to system electric demand. The electrical controller 150 directs current flow through one or more of a plurality of electrically connected electrical control lines, which are in turn electrically connected to respective electric rotary motors 125. Electrical energy passing through an electric rotary motor 125 will cause it to rotate its output shaft which is in turn connected to a coupling 127 which is in turn connected to the input shaft of a specific generator 130 designed to output a specific amount of electrical current. The generators 130 are also electrically connected to specific battery storage units 110. Current outflow from the electric alternator 130 is directed into respective return electrical lines electrically connected to the battery bank 110 to complete the electrical circuit and return the electrical current back to the battery bank 110 for reuse.

In a preferred embodiment the battery bank 110 comprises a plurality of batteries 105, the number of individual batteries 105 in each bank 110 is dependent upon the load the system this designed to service. Preferably each battery 105 is charged to capacity in unison until all the units 105 are optimally charged. Battery unit 105 output will be designated to specific load requirements per the design and use specifications. The controller 150 may designate one battery unit 105 as a backup electricity source 145 for a second battery unit 105. Preferably a battery unit 105 is designed to provide optimal electricity for specific load requirements, such as the requirements of the electrical generator 120.

In FIG. 1, one or more the control unit 150 will monitor one or more battery units 105 and generator units 120 respectively. Thus the logic controller 150 will be electrically connected to the battery units 105 and each generator 120 respectively to control energy storage and electricity production. This control feature permits disengagement of a generator 120, or diversion of a generator output, to assist in charging another battery unit 105.

The coupling 127 between the alternator 130 and the motor 125 is a mechanical coupling 127 which converts the mechanical energy from the motor output into electrical energy output from the alternator 130. In the present invention the preferred coupling is capable of producing a mechanical to electrical energy transfer ratio of 1 to 1, hence there is lower energy loss as compared to other systems not using the preferred coupling. Therefore, the apparatus 100 of the present invention allows a high rate of electrical charge to the system. Normally, a coupling between a motor 125 and an alternator 130 introduces another power loss in the system due to the weight and torque needed to initiate turning and maintaining a proper speed based upon energy demand. Generally, industry standard couplings used between the motor and alternator are made from heavy dense material such as carbon steel to withstand cycling over the lifetime of the unit. As a result, additional energy is required to turn the coupling in addition to the motor and the alternator. Thus the coupling, motor and alternator, can cause energy loss. Another advantage of the preferred coupling 127 is its ability to cool the system while operating. The preferred coupling 127 of the present invention minimizes energy loss by using a high strength and light weight alloy. If a conventional steel coupling was employed it would require more energy from the system. In addition, a high efficiency output motor 125 that minimizes energy loss to power input was incorporated in the design as one of several components that reduce energy loss.

There are generally two types of inverters—high output low frequency (HOLF) and low output high frequency (LOHF). Both types are capable of operating at 50 and 60 Hz frequencies. HOLF inverters are generally utilized to operate large induction motors. The LOHF inverter known in the art is the preferred inverter 115 of the present invention and it is capable of producing an almost one to one conversion ratio of AC to DC, e.g., from 360 DC and generates a three-phase 380 AC.

The present invention preferably incorporates a charger 135 which is capable of generating a rate of charge to one battery bank faster than the rate of discharge of the other battery bank. (See FIG. 13)

A Programmable Logic Controller 150 is a control device known in the art normally used in industrial control applications that employs the hardware architecture of a computer and a relay ladder diagram language. It is a programmable microprocessor-based device that is generally used in manufacturing to control assembly lines and machinery as well as many other types of mechanical, electrical and electronic equipment. Typically programmed in an IEC 61131 programming language known in the art. The PLCs 150 used in this invention have been programmed by methods known in the art to enable individual control of each of the components in the system during testing and normal operation.

FIG. 2 are CAD drawings showing an embodiment of the interior and exterior of prototype of EPS 100 control components. Control enclosure 200 (FIG. 3-E) comprises exterior panel 205 and interior view 210 (FIG. 3-K); control enclosure 230 (FIG. 3-NN) comprises exterior panel 235 and interior view 240 (FIG. 3-GG). View 240 represents the internal view behind the panel below showing controls for the four different stages of quantifiable (resistive, inductive, capacitor—active and reactive power) loads for the system for testing (FIG. 3-OO). The design in the lower right corner represents the front of the panel of the load apparatus (FIG. 3-JJ).

FIG. 3 comprises photos A-VVV of an embodiment of the EPS 100, wherein—

- A is the enclosure 300 for the power production unit preferably comprising an electrical generator and controls;

B—enclosure 302 is the power preservation unit preferably comprising one or more batteries, chargers, and inverters electrically connected to the power production unit 300 and other necessary components;

C—a view inside the left end of 300 showing the alternator 130 below two boxed enclosures 304 and 306; the larger boxed enclosure 304 is for the battery 105 and inverter 115 controls preferably including a programmable logic controller, in this embodiment a Deep Sea Electronics Model 710 PLC 305 mounted therein, and the smaller enclosure 306 to the right one is for the alternator 130 and electrical generating apparatus 120 controls;

D—the alternator 130 to the right and motor 125 to the left, and the coupling 127 with turbine fan located between;

E—shows control box 312 located on the left end of 300 which also preferably contains a programmable logic controller that controls functions of the EPS 100; in this embodiment the PLC 314 is Model 7320 by Deep Sea Electronics; the PLC 314 accepts computer programmed instructions to control the operation of the respective system 100 components; there are twelve different lights located above the PLC 314; the set to the top far left indicates the status of the mains 316 (1>r-red, yellow, blue) such as when they are available; the set to the right indicates when the inverter is on load 318 (1>r-red, yellow, blue); the set below indicates when generator is on load 320 (1>r-red, yellow, blue); and the fourth set are a series of three green lights that when individually illuminated indicate that the main is on load 322A, the inverter is on load 322B, and/or the generator is on load 322C producing three phase power; the PLC 314 controls these functions of the apparatus 100; the switch 324 at the lower right is configured to provide selections of manual or automatic operation; and the switch 326 at the lower left is configured to provide emergency shut off of the system;

F—photo of the interior of 300 from the opposite side of the enclosure showing the same components as C-D above;

G—a perspective view from the left of the exterior of the power production unit 300;

H—is an exterior view of the panel door covering control box 312 as shown in C-E; the PLC 314 is visible through the door when in the closed position;

I—shows the interior of the cabinet 300 with a PLC 314 Model 7320 by Deep Sea Electronics; more complex in design and in operation so a different PLC was required to control the general functions of the EPS, mechanically and electronically;

J—shows the back side of the front panel of 312 showing all the placement of the lights 316-322 and PLC 314 with connections;

K—shows the inside of the control box 312: the First Row: the DC Charger 330 feeding the PLC, the current meter 332 and voltage meter 334 for the Alternator, six Indicators lights, three reds for MAINS 336 (if present) and three green for Alternator 338; a plurality of low voltage control fuses 340; Second Row: a bank of four control logic relays and two timers 342, two switch selectors (for voltage reading and amperage reading), and manual control of EPS for PLC override 348; Third Row: Variable Frequency Drive "VFD" Controller 350, Motor control contactors 352 and thermal overload 354, far right—three Current Transformer "CT" 356 with a ratio 5:50 transmitting signals to the PLC for amperage reading, the first Mains' power breaker 358, Inverter's power breaker, and several line connectors 362 from and to various devices within the systems;

L-V are enlargements of the various elements, showing the logic and complexity of the system 100;

W-X—are enlarged photos of FIG. 3-I;

Y—is a close up of the 7320 PLC 314; it can be hooked up to the main generator 120 permitting automatic or manual control, and allows unit 100 to be controlled remotely from anywhere in the world as long as it has an IP number;

Z—close up of the VTC (variable torque control) 364; similar to FIG. 3-N;

AA—shows the relays 342;

BB—shows the connections to generator, inverter, mains and other various components 362;

CC—shows the manual controls 348;

DD—is a close up of the fuses for the system protection 340;

EE—a similar photo as FIG. 3-Z;

FF—first row of controls in FIG. 3-K and other prior photos;

GG—external picture of the dummy load apparatus 366;

HH—is a picture of the exterior of the dummy load housing showing the blower fan 368 for the resistive loads 370;

II—shows the wiring to the resistors that serve as the resistive load 370; the motor 372 to the right is an inductive load; and also have capacitors (not shown) within the system so we can run dummy loads; thus there are a maximum in this dummy load apparatus of four stages of resistive loads 370 comprising three resistive elements each; then the motor 372 is the fifth load which corresponds to FIG. 3-PP showing control contactor 374 for the four stages on right and the center unit 376 controlling load to the motor; it is the fan 368 that cools the resistors 370 and pulls inductive and capacitive loads 140;

JJ—shows the front of the panel of the dummy load apparatus 366 on the outside (see FIG. 2-C); at the top is a row of indicator lights 378, then a switch connector selecting automatic or manual 380, then the left red button is for any phase sequencing error 382, to the right is an indicator for any fault within the system 384, the four green sets indicate what stage of the dummy load is operational 386, and the first row below are green on buttons 388 and below that a row of red off buttons 390 for the four stages of the dummy loads;

KK-NN—shows the inside of the front panel 367 and the rear of the indicator lights for the dummy load activity and control;

OO—is a photo of the DLA 366 controls behind panel 367 and shows the controls for the four different stages of quantifiable dummy loads for the system for testing; at the bottom right hand side are four contactors 392 and they are for each load staged; the ones on top are breakers 394 for controls, then a relay 396, a timer 398, the device to the left with the green bar is a phase sequencer 400, then to the left are three phase controller with fuses 402 for the system, then below is a breaker for the whole system 404;

PP—shows where connects the dummy load to the unit via a quick connect receptacle 406;

QQ—the exterior of the large panel of FIG. 3-I discussed above now in operation: the PLC 314 is active, the generator 120 is on load 320 (all lights illuminated), the inverter 115 is on load 318 (all lights illuminated), the two green lights show there is no input from the mains 316, the first illuminated green light is the generator on load 322C, then the inverter on load 322B and the third green light is the generator output 322A; shows running independent of main power supply; to charge battery 105 and provide power to dummy load 140; system showing independent of main power supply power from inverter 115 from battery 105 and generates enough electricity to run motor 125 and enough to charge battery 105 and run dummy load 140;

RR—the data values shown on the PLC 314 indicate that the generator 120 is on load 140 but not pulling any Kw so dummy load 366 is not engaged;

SS—another picture of inside of the control box 312 showing a small red light 331 on the rear of the DC charger 330 indicating charging of the PLC battery (not shown); the alternator voltage meter 334 is reading zero thus there is no load on the system; the alternator current meter 332 shows voltage generation at 373, thus the apparatus 100 is generating electricity and charging the PLC 314;

TT—shows PLC 305 (FIG. 3-C) on control box 304 that is controlling the alternator apparatus 130 and indicates it is generating an output of 50 Hz at 1500 rpm, so for every thirty revolutions the alternator 130 is producing 1 Hz;

UU—shows PLC 305 with data from each line output from the alternator 130 producing an average of 220 volts, thus it can be hooked up to the mains;

VV—in three phase systems the square root of 3 is 1.73, times 220V is 380; in square root of 3 will equate to the third level of reading;

WW—PLC 305 showing voltage at 12 higher; the battery (not shown) feeding the PLCs should be charged at a rate of approximately 13.4 to 13.9 volts DC; thus this value is normal for 12 Volt VRLA Batteries—Valve Regulated Lead Acid Batteries;

XX—shows an external view of the PLC 305 with excellent voltage from the system 100 running normally at 1500 RPM, 50 Hz;

YY—PLC 305 showing 'Manual Mode' operation and system 'On Load' indicator;

ZZ—PLC 305 showing motor 125 speed at about the industry norm of 1500 RPM, 50 Hz;

AAA—PLC 305 showing line to neutral showing generator 120 voltage produced by the alternator 130 and feeding to the static charger 135;

BBB—PLC 305 showing line to line, all lines together showing generator 120 output, this would be in sync with FIG. 3-VV (B050);

CCC—PLC 305 showing generator 120 frequency, or the frequency produced by the alternator 130 at 1500 RPM, 50 Hz;

DDD—PLC 305 showing the generator current with no loading; no load was placed on the system at the time of this reading thus showing what the PLC 305 is capable of displaying that data;

EEE—PLC 305 showing the generator 120 power factor reading for three-phase mode not under load; when the system 100 is place under load (resistive, inductive and/or capacitive) these readings will corresponding to the percentage of the power factor, i.e. pf=0.80, 0.82, 0.85 etc.;

FFF—PLC 305 showing an average of the readings on FIG. 3-EEE;

GGG—PLC 305 showing when the system is placed under a reactive load; there will be indicated here certain readings corresponding to the type of load, and in this photo the PLC 305 is currently reading reactive loading on the system;

HHH—display of DSE PLC7320 314 showing no external power (MAINS), in preferable self sustaining mode, and green light 408 generator running output; the main control panel on this DSE PLC7320 shows that the MAINS are not present and the EPS 100 is fully supplying power to the loads and to itself; green lights are an indication of that; the system is running in a MANUAL mode at this time and functioning properly as all lights are green;

III—phase sequencer 400 in normal mode and operation of the EPS 100 and without any faults present;

JJJ—shows the front of the control panel 367 for the dummy load apparatus 366 (see FIG. 3-JJ); the dummy load apparatus 366 is not an integral part of the system 100 but was constructed to provide quantifiable load capacities to test the unit 100 for data collection; no red lights 382 or 384 indicates no faults detected; the first stage is operational, there is no fault, the motor is on, a load is on the system 378, and the first stage of the dummy resistive load 386A is active;

KKK—two stages of the dummy resistive load 386A and 386B are operational;

LLL—the first two stages are off but the third one 386C is operational;

MMM—shows third 386C and fourth 386D stages operational;

NNN—when a fault is manually engaged on the system 100, all the green lights 386A-D go off because the system 100 protects itself through the programming in the respective PLC; this photo shows the safety factor that the system 100 will shut down and not producing electricity if there is a fault 382;

OOO—another simulated fault 384 showing all green lights 386A-D are off which means NO LOAD could be accepted by the system 100 as the system 100 has a built-in protection programmed into the operation of the respective PLC;

PPP—similar to prior discussion showing system 100 in operation in FIG. 3-I and FIG. 3-W above;

QQQ—same as FIG. 3-ZZ;

RRR—shows PLC readout from the engine run time test, a critical test as the unit 100 was turned on and off 90 times in less than 2 hours to stress the system to see if it any component would fail or the operation of the system would fail; this test put a lot of stress on system turning it on and off with load, but the system performed without failure;

SSS—shows PLC readout of generator 120 voltages produced by the alternator 130 between each phase and neutral, this is what you would expect to read when producing three phase electricity and are able to use three independent single phase loads separately;

TTT—shows PLC readout of the voltages produced by the alternator 130 between each phase and neutral, this is what you would expect to read when producing three phase electricity and are able to use three phase load collectively;

UUU—shows PLC readout of a solid frequency of 50 Hz coming out of the alternator 130;

VVV—shows the front panel 367 of the dummy load apparatus 366 with all four loads 370 from dummy unit 366 showing no faults 386A-D; the EPS system 100 is completely under load 378 and is operating without any faults. No RED light 382 or 384 is illuminated.

In FIG. 3-KK, preferably, the VFD (variable frequency drive) 350 controls the frequency, voltage and power from the inverter 115 and into the electric motor 125 to drive the alternator 130. In FIG. 3-KK, the first device to the left is a control contactor 352 that gives command to the VFD 350, which controls the speed and torque of the motor 125. By using the VFD 350 and a VTC (variable torque control) 364 in the present invention, the voltage, amperage, frequency, speed and torque are operated by a predetermined set of programmed instructions from one or more PLCs 314. This preferred embodiment minimizes the current demand from battery banks 110, especially when the system is switching on and off. The device to the right it is a thermal overload controller 354 for the motor 125. If the motor 125 were to overheat, the thermal overload controller 354 will send a signal to a PLC 314 to initiate a shut down sequence in order to protect the EPS 100. The VFD 350 runs the motor 125 and controls the speed and torque to allow the motor 125 to reach the required 1500 RPM from stationary within a predetermined time, preferably within 12 seconds or less, while maintaining low current consumption from the battery banks 110. Using this control method, the motor can operate efficiently with a low amount of current consumption and thus does not discharge the battery 110 at a higher rate greater than the rate of output the alternator 130 is generating, thus charging one battery bank 110 faster than the rate of discharging the battery 110 being used to service the load. In addition the EPS system 100 allows the motor 125 to efficiently operate using a very small amount of current from the battery 110. These components are part of many factors in the EPS 100 combined together to achieve the system efficiency of the invention.

An additional advantage of the EPS 100 is its capacity to provide power in either DC or AC depending on the requirements of the external load 140. This is accomplished through the specialized inverter 115 using a custom winding ratio in the transformer 356 and thyristor 450 banks. The three phase AC current output from the alternator 130 goes into a capacitor 455 bank to smooth the alternating current sine wave signal to an approximant pure straight line DC current. Using the thyristor 450 and rectification process the bottom sine wave is flipped to the top, goes through the bank of capacitors 455 to smooth the signal to almost a straight line. Conversely, it can produce AC from DC current using three thyristor banks 450. The design of the present invention provides DC current from the batteries 110 through the inverter 115 to produce three phase current rectified to run the motor 125. Then the output AC from the alternator 130 must partially be converted back to DC and rectified to charge the batteries 110. Excess AC is used to run a load 140 such as AC devices or sent to the grid. The ratio of the winding in the transformer is optimized for the low frequency and allows the system to operate at least up to a 20 hp motor.

Figure 4A:
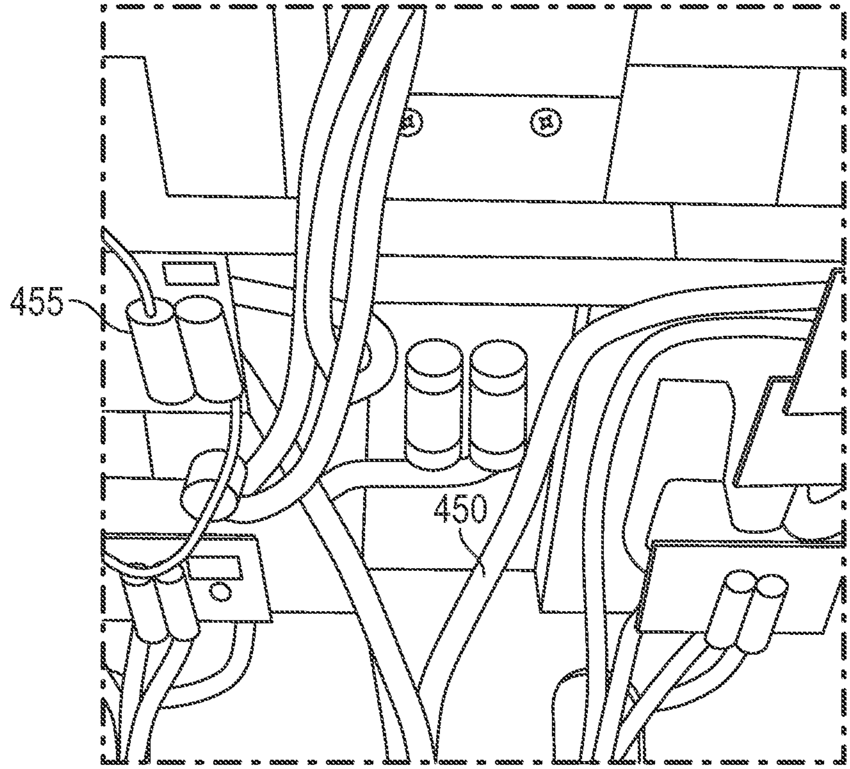
FIGS. 4A-B comprises photographs of components of an embodiment of the present invention.
Figure 4B:
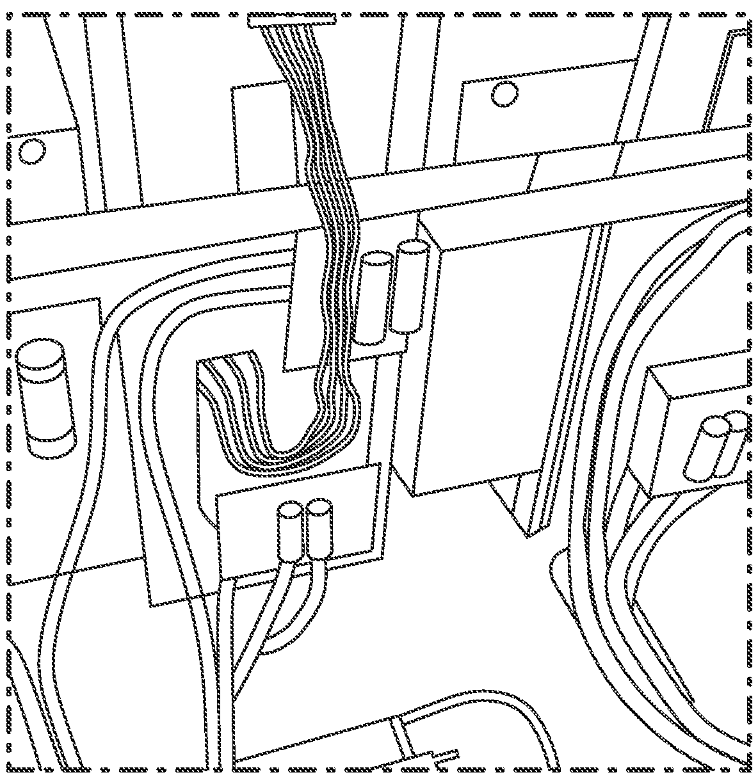
Figure 5A:
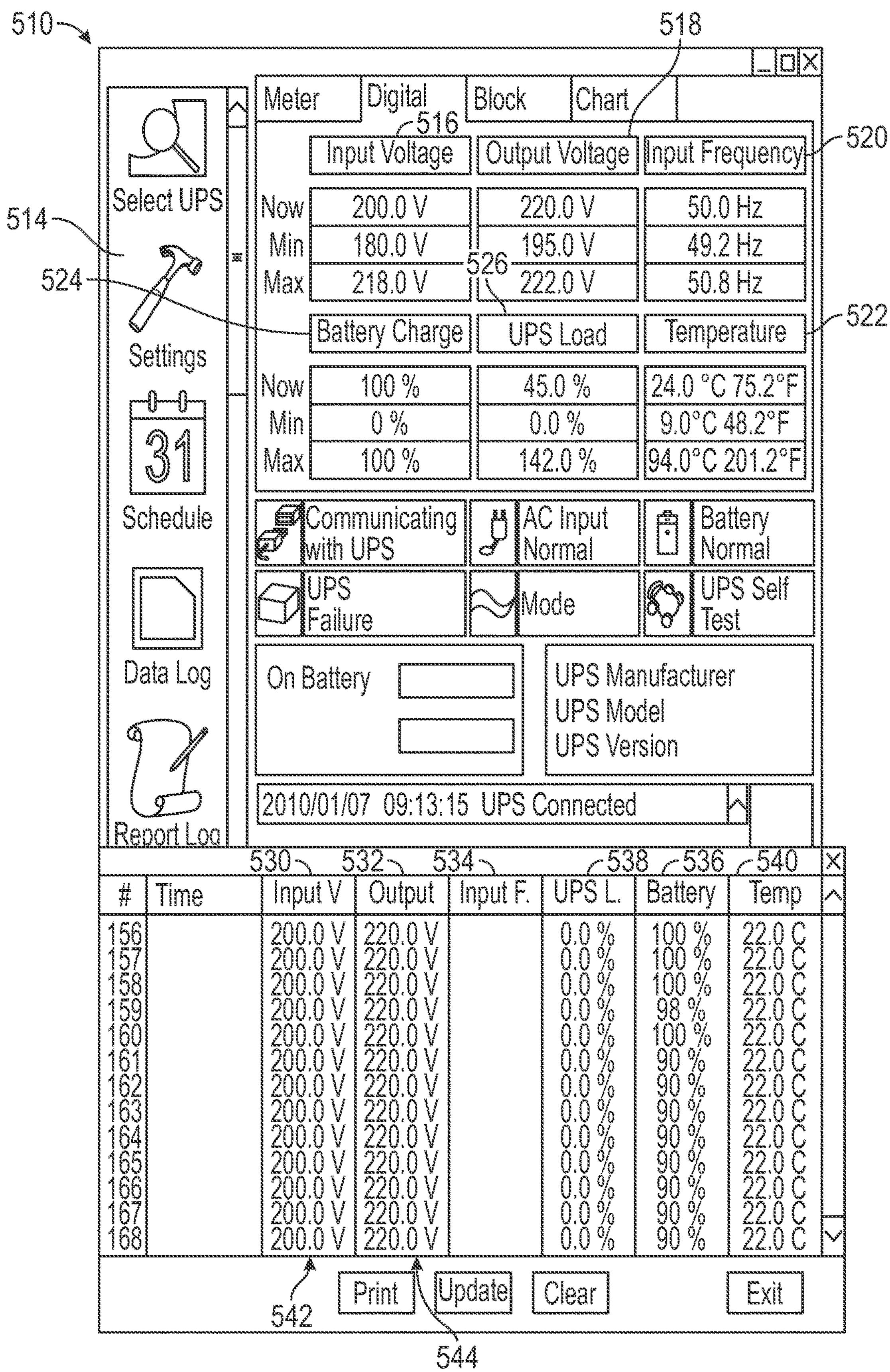
FIGS. 5A-U are photographs of embodiments of a software control panel and computer screen software operational date values of the present invention.
Figure 5B:
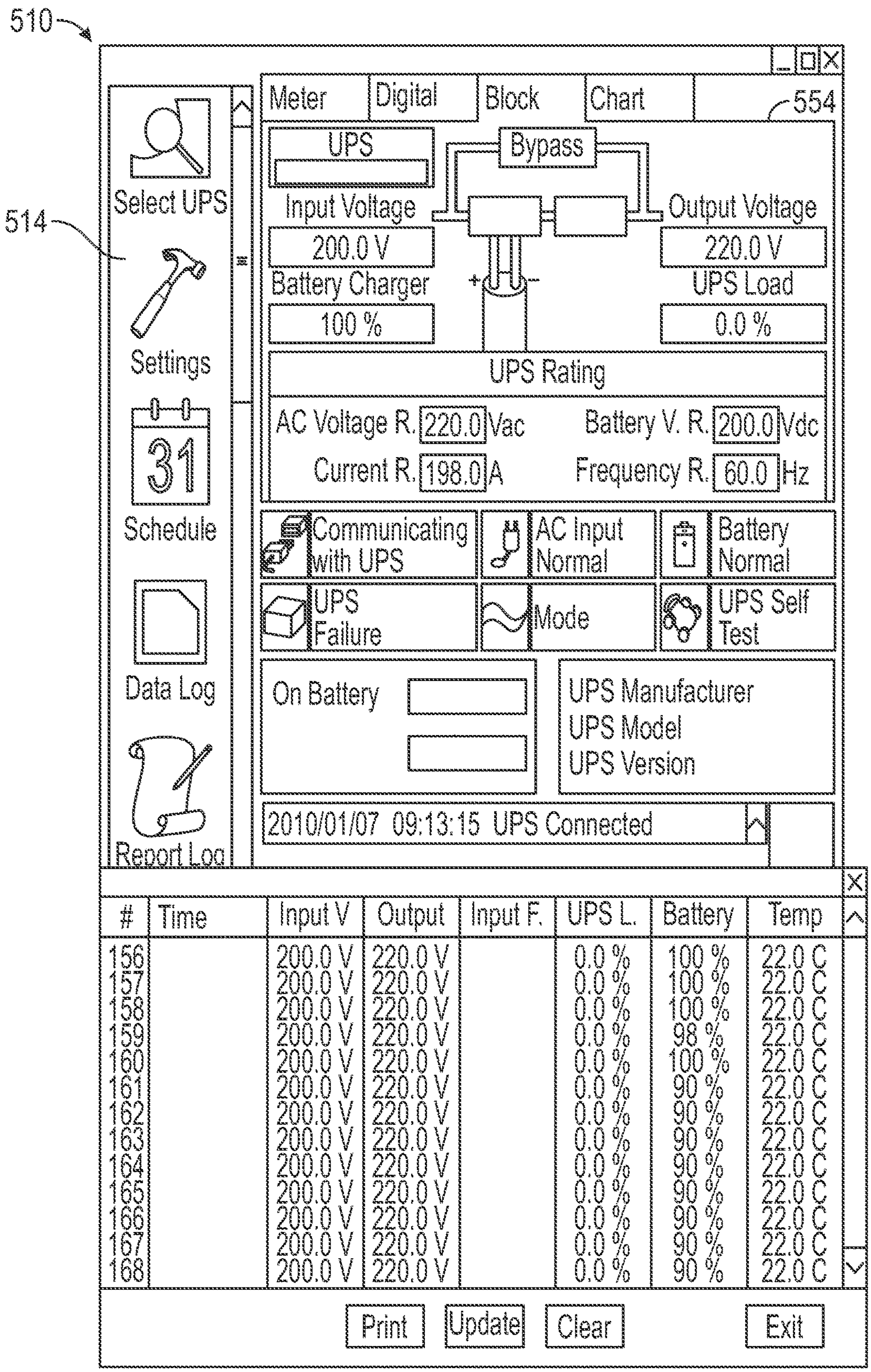
Figure 5C:
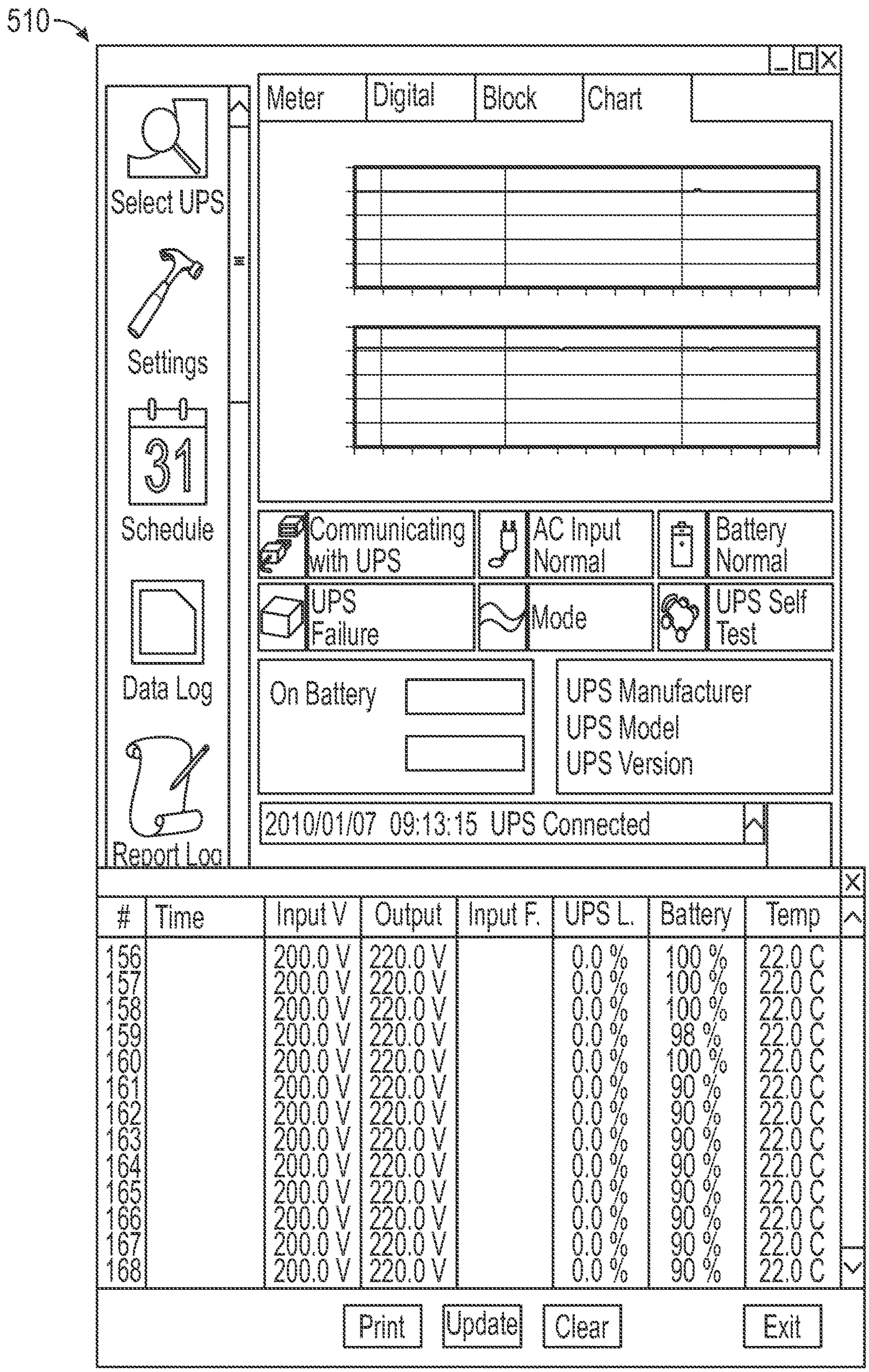
Figure 5D:
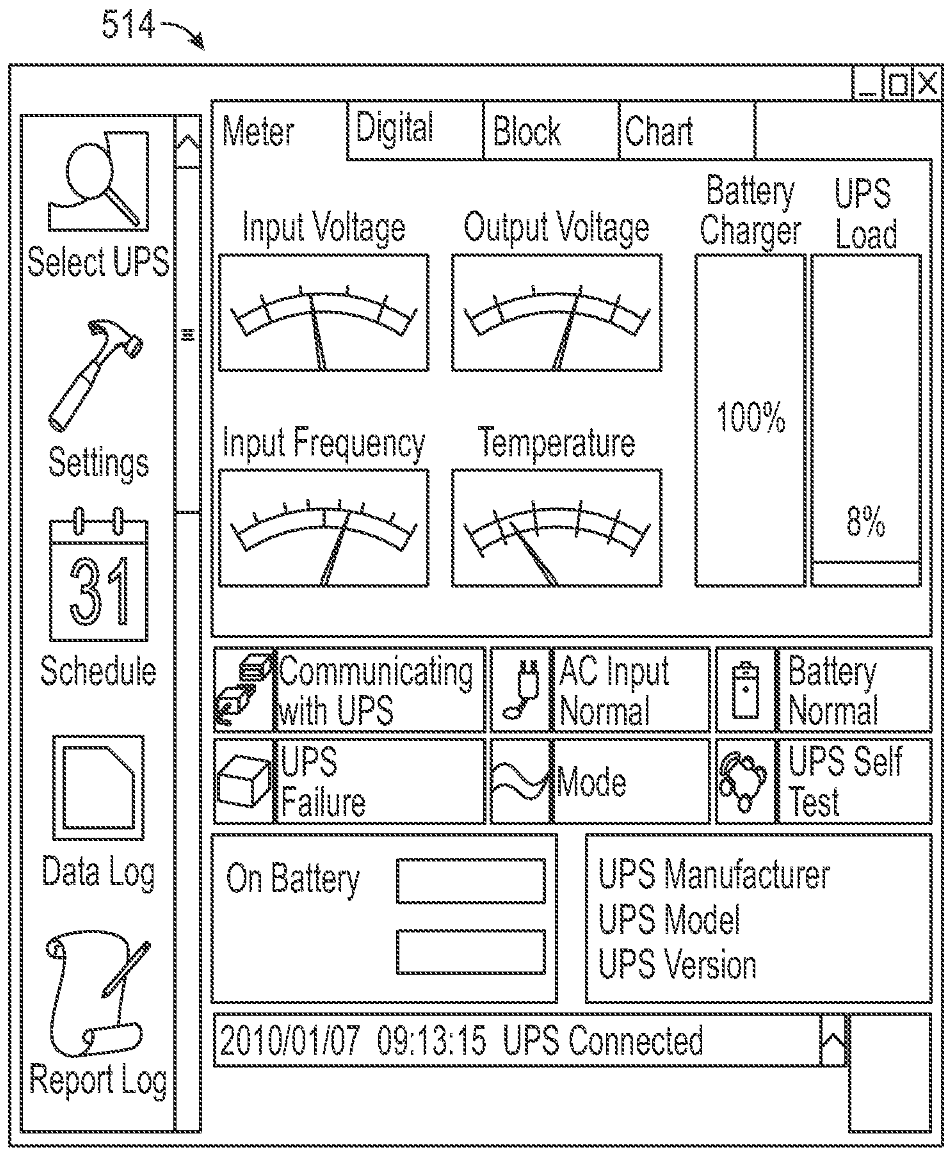
Figure 5E:
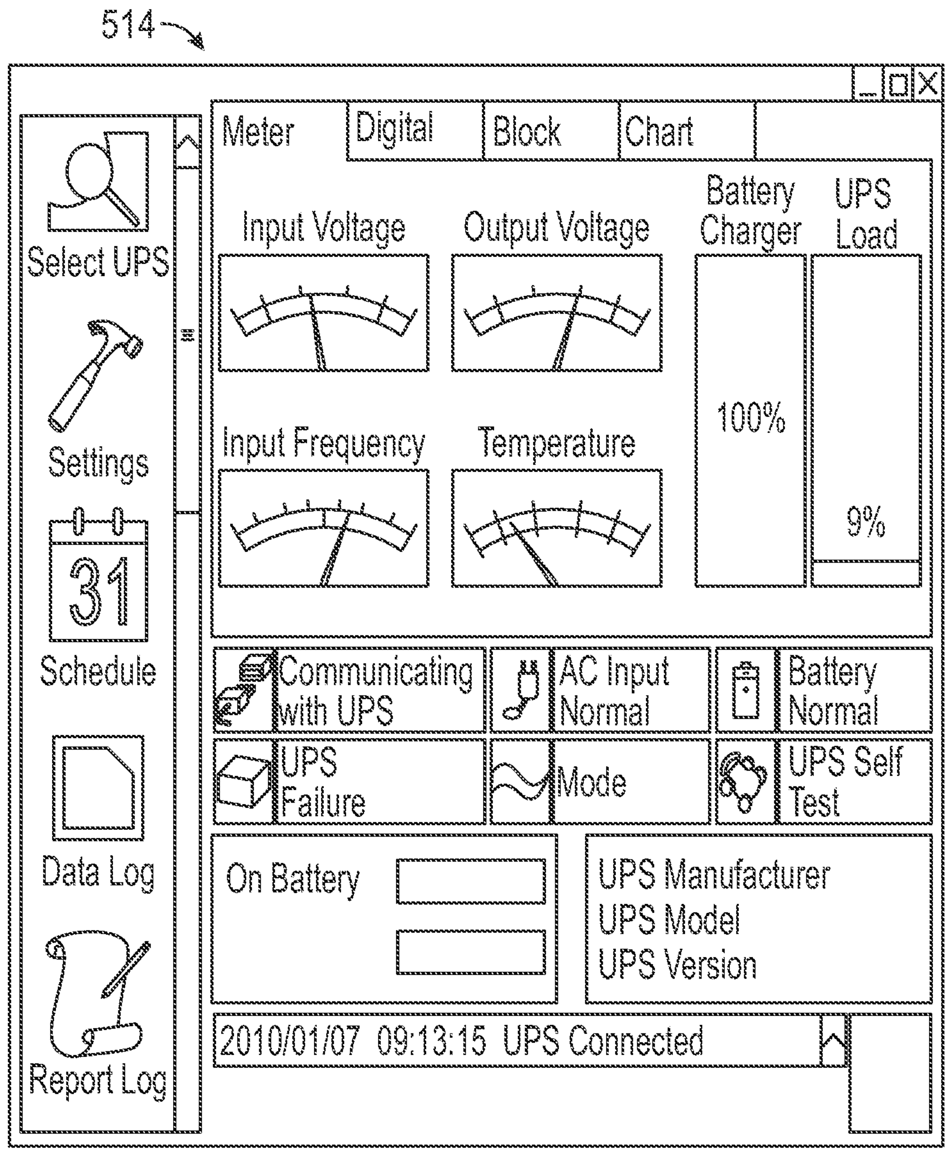
Figure 5F:
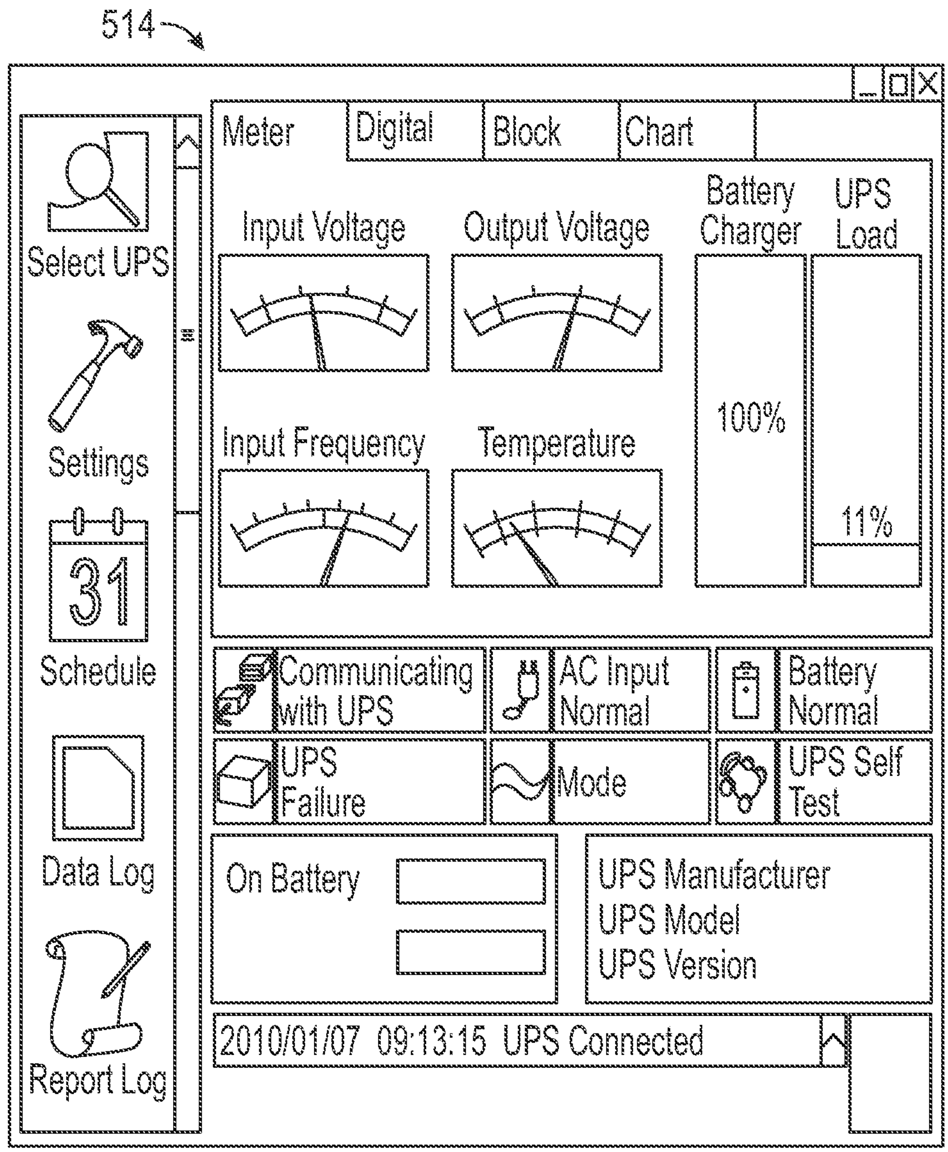
Figure 5G:
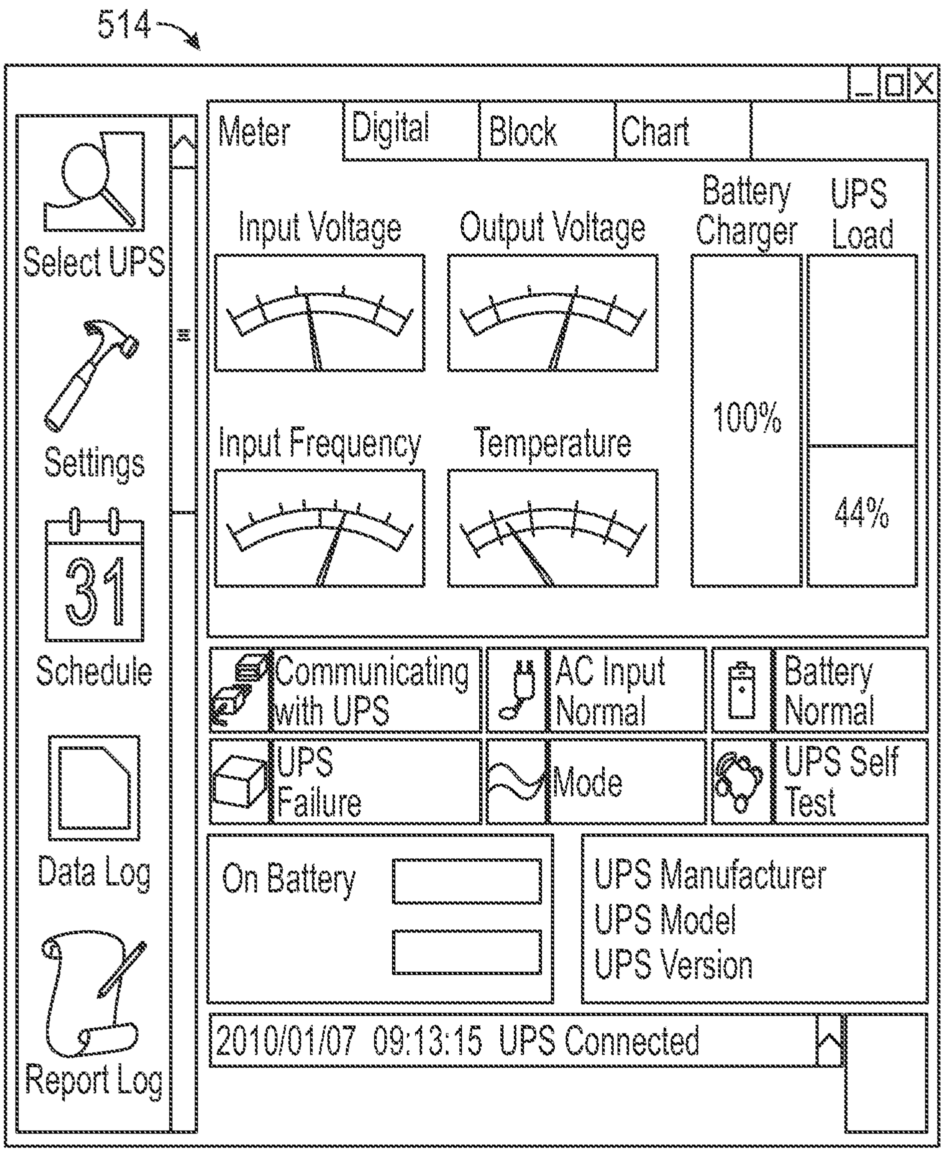
Figure 5H:
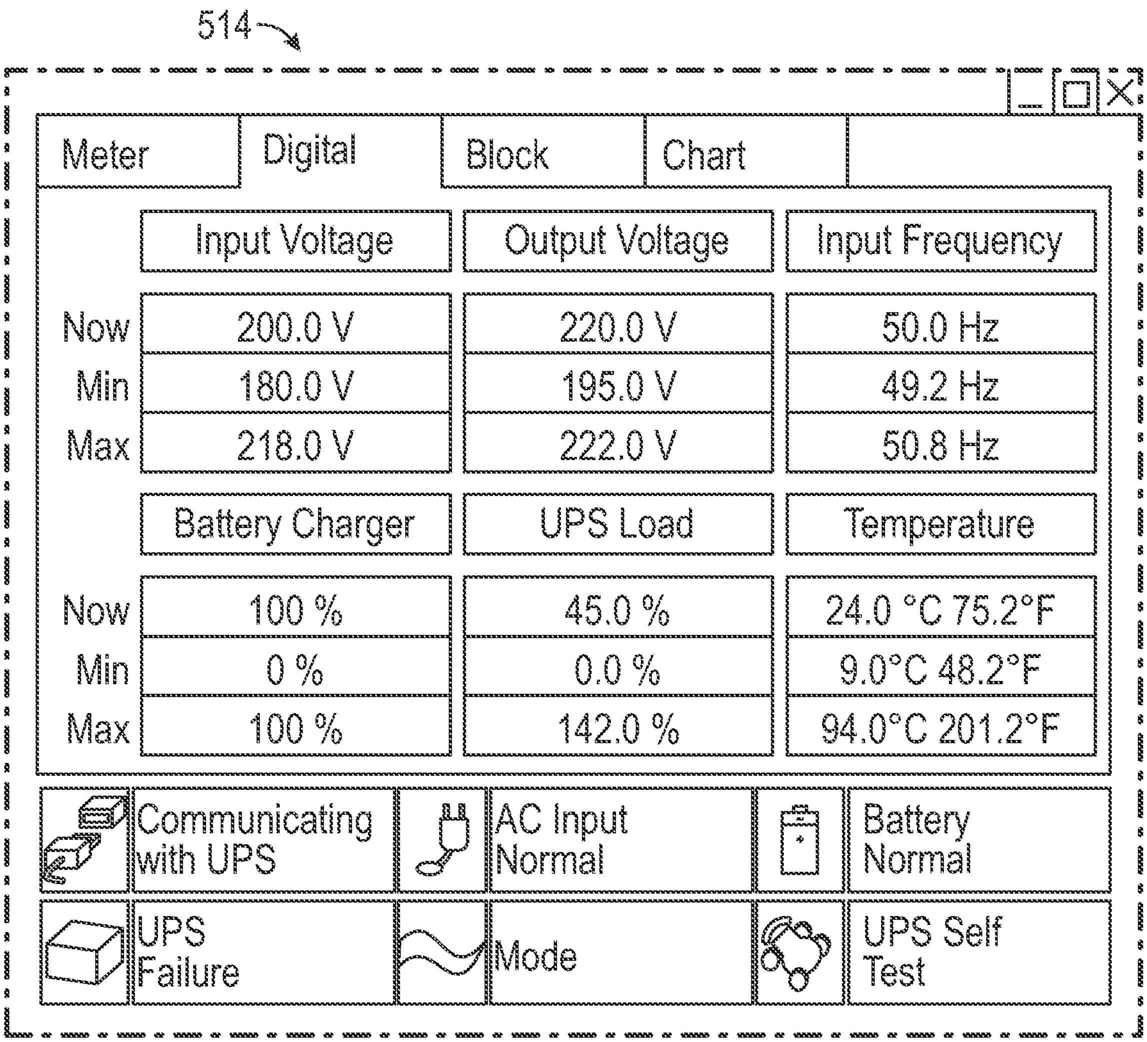
Figure 5I:
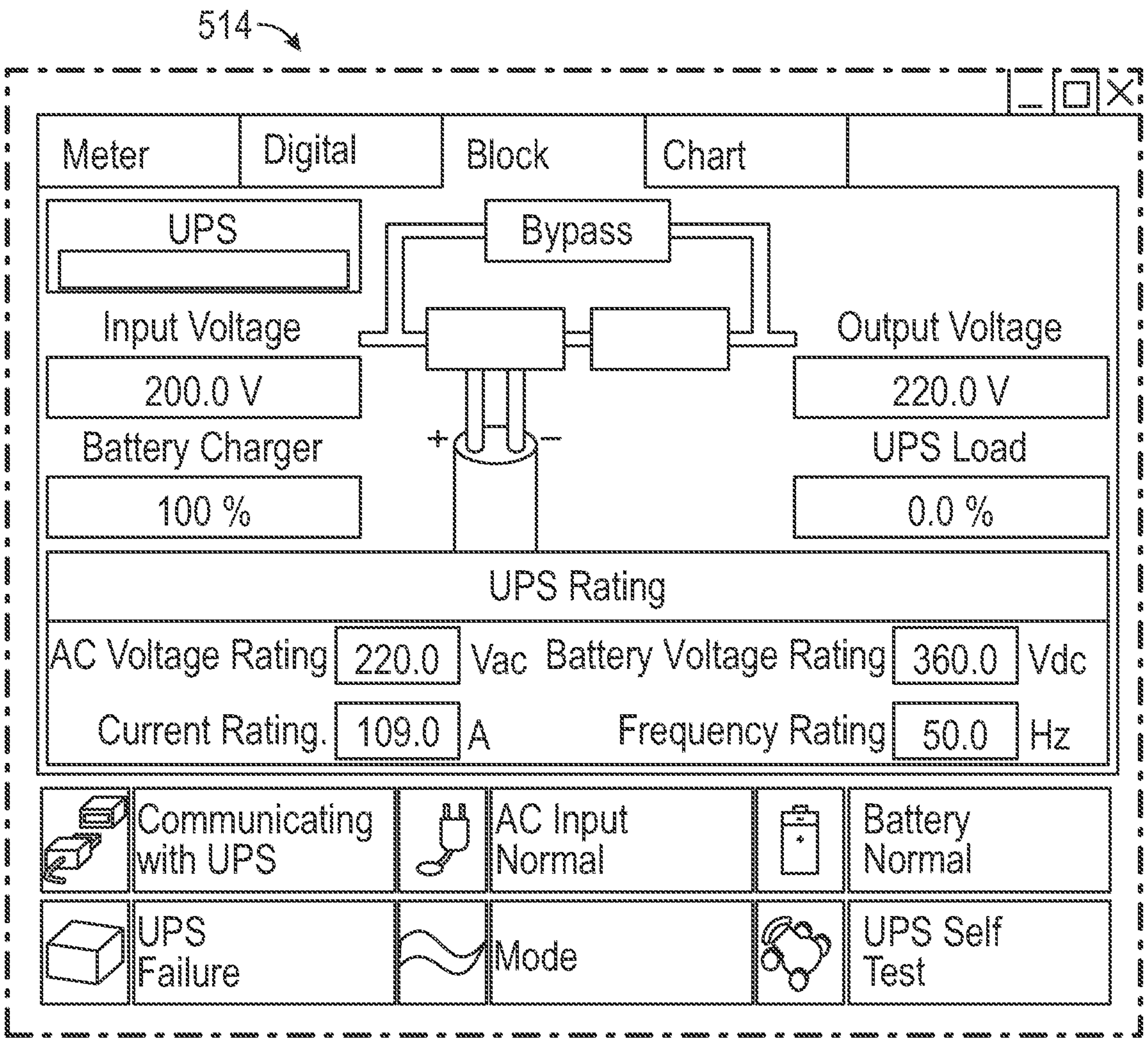
Figure 5J:
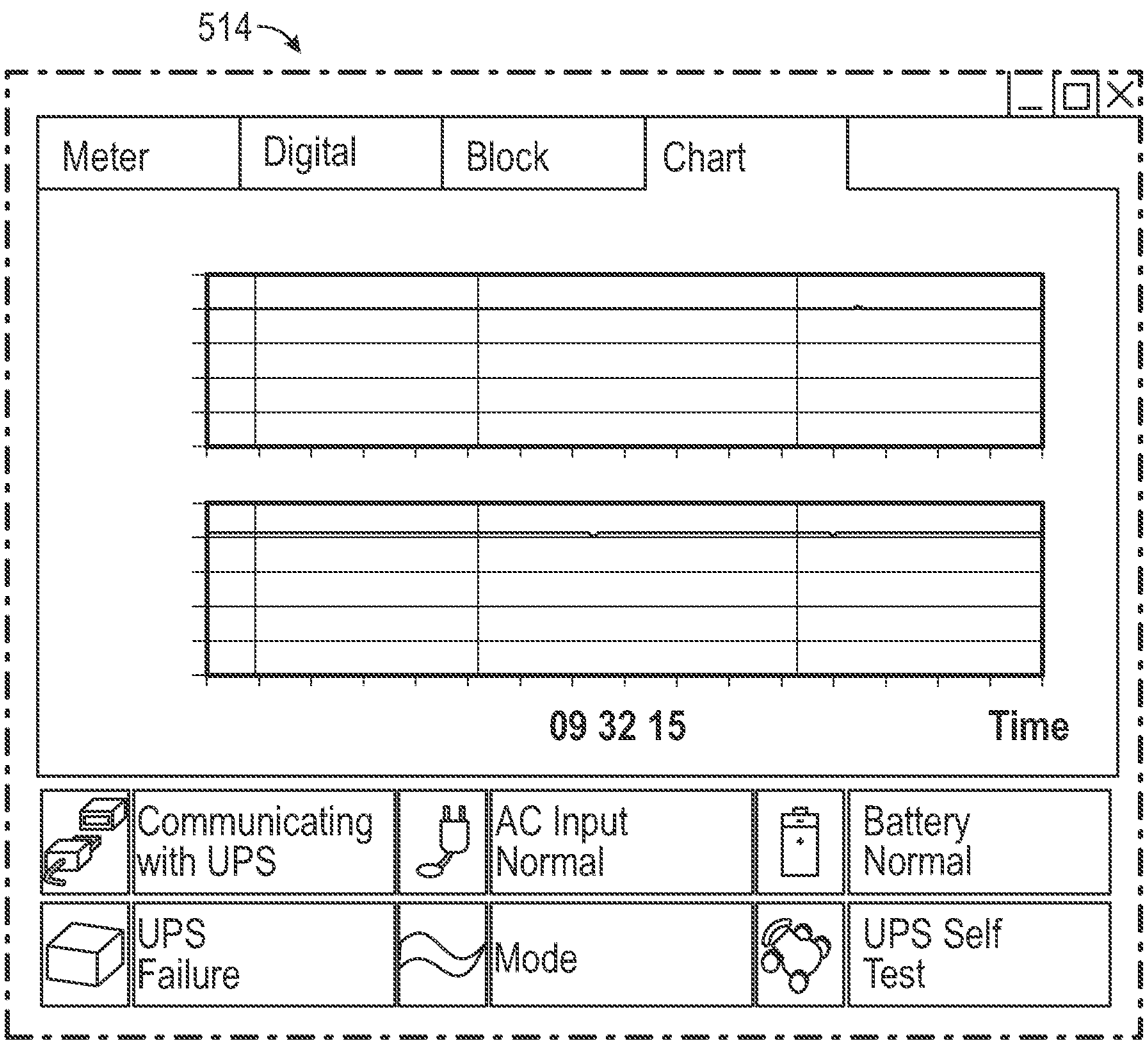
Figure 5K:
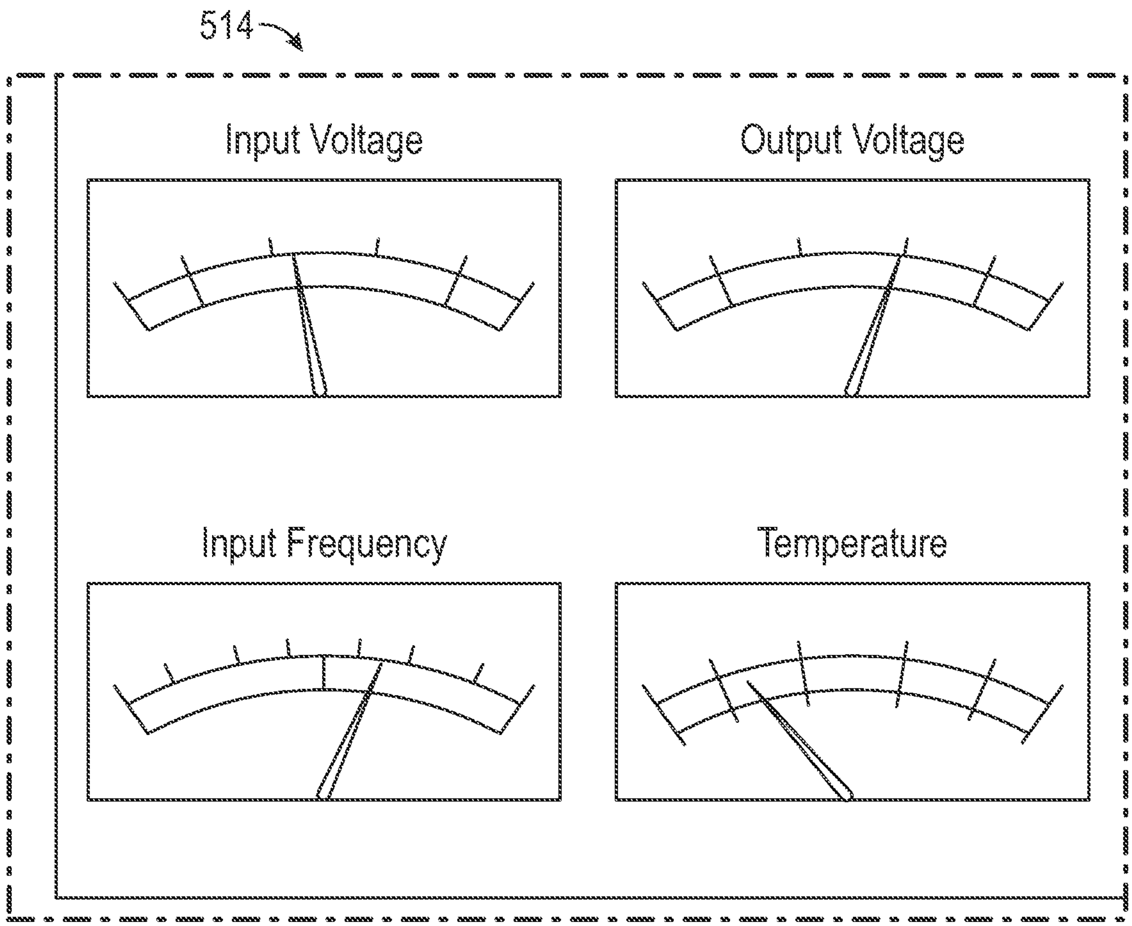
Figure 5L:
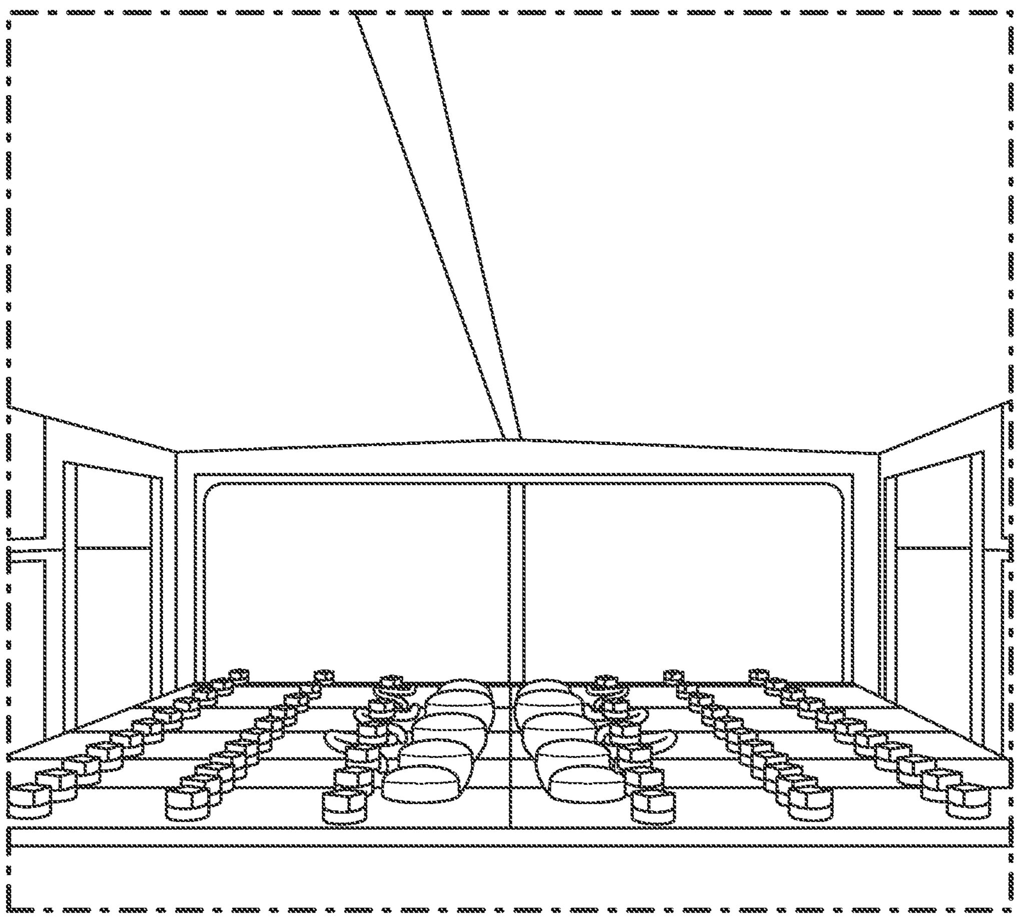
Figure 5M:
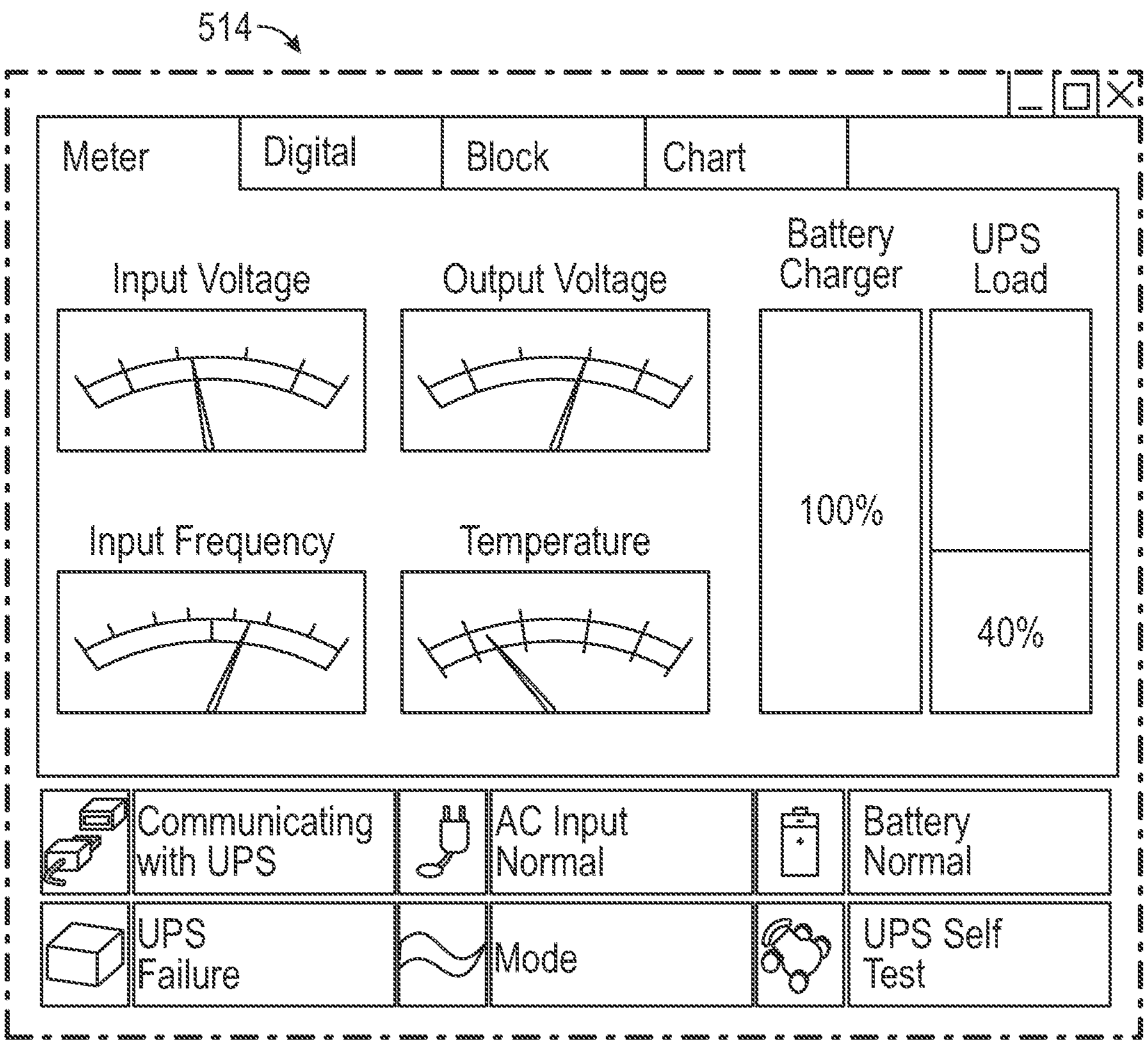
Figure 5N:
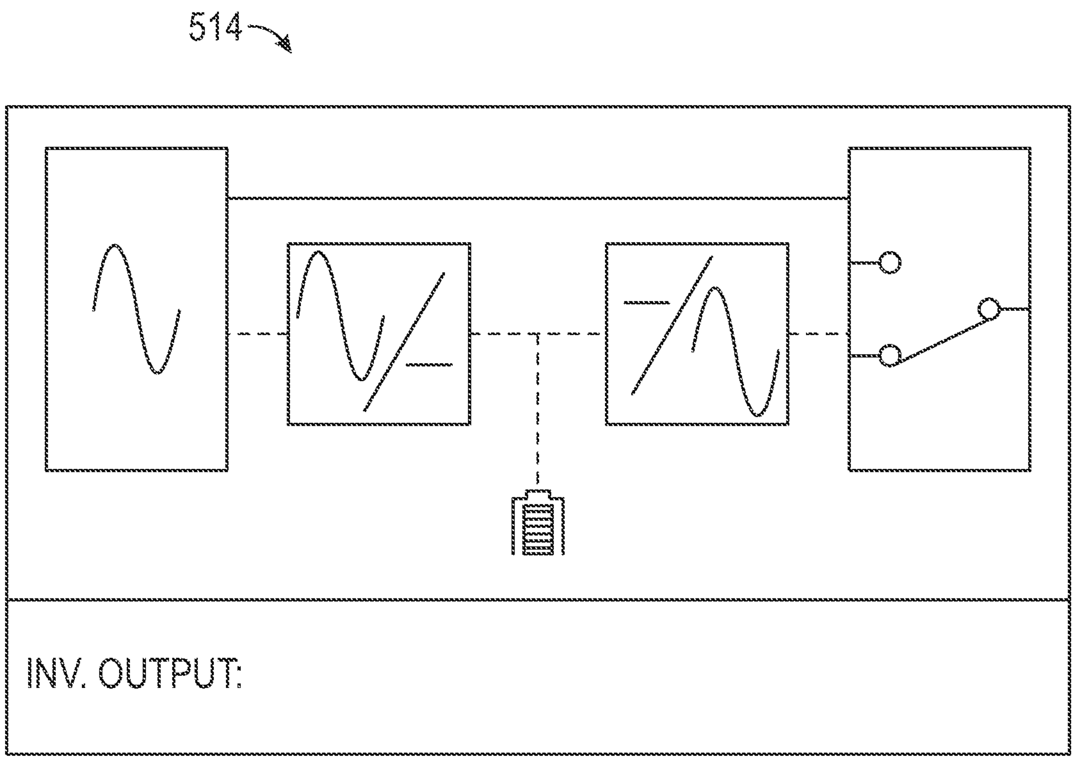
Figure 5O:
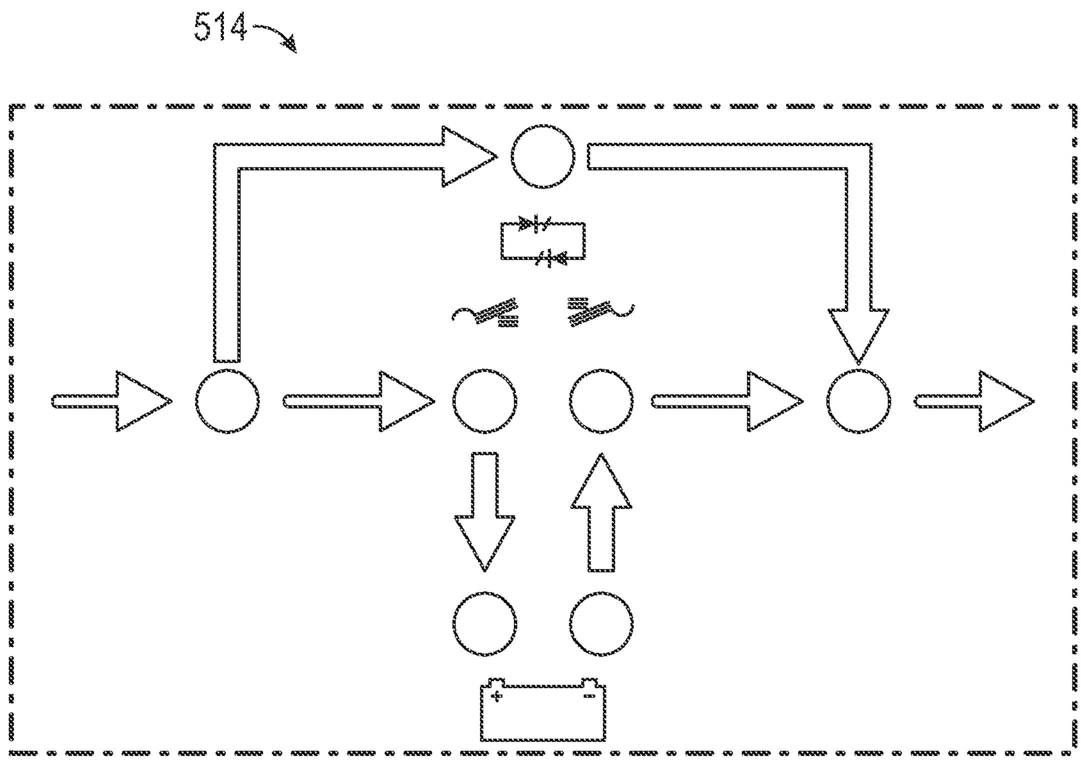
Figure 5P:
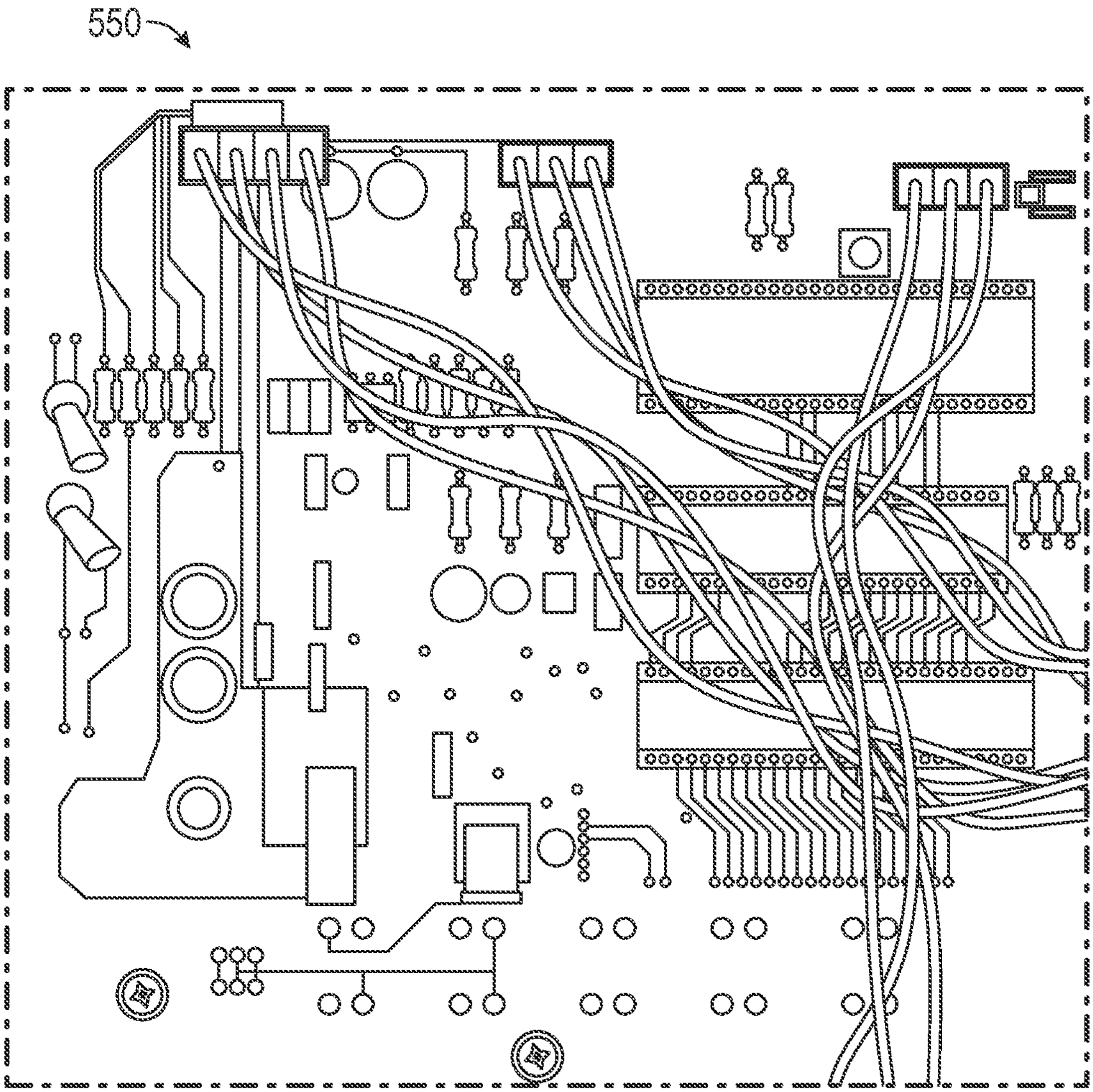
Figure 5Q:
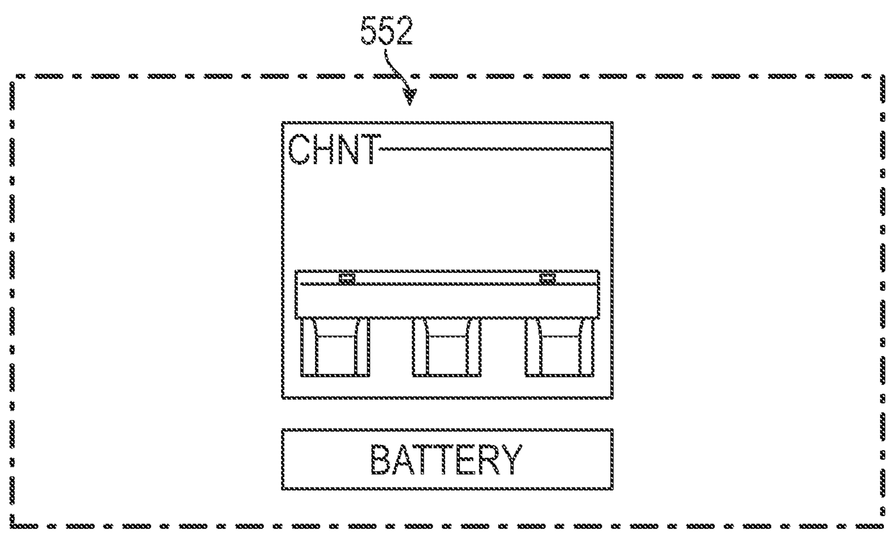
Figure 5R:
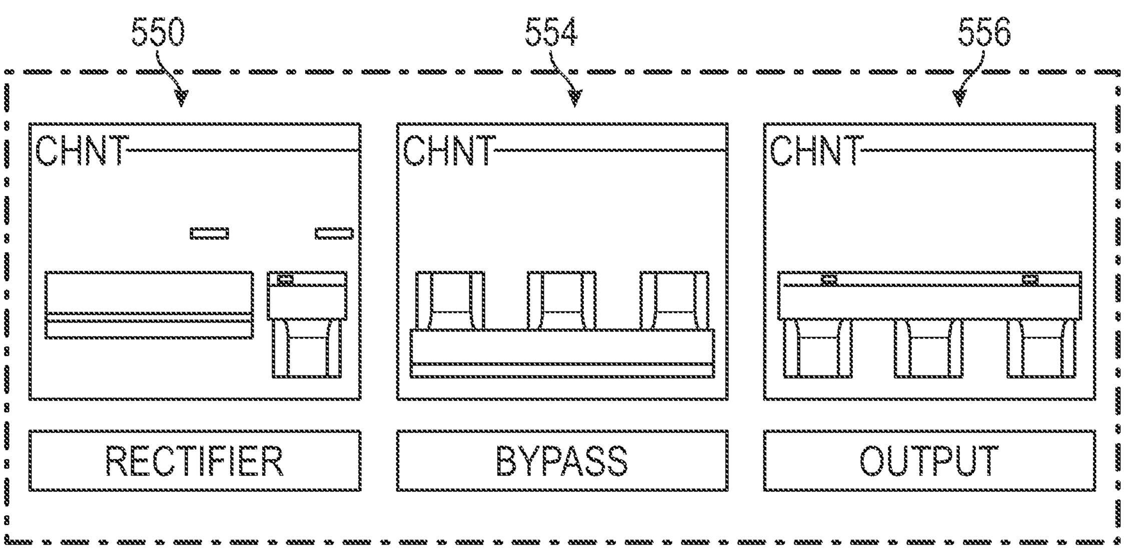
Figure 5S:
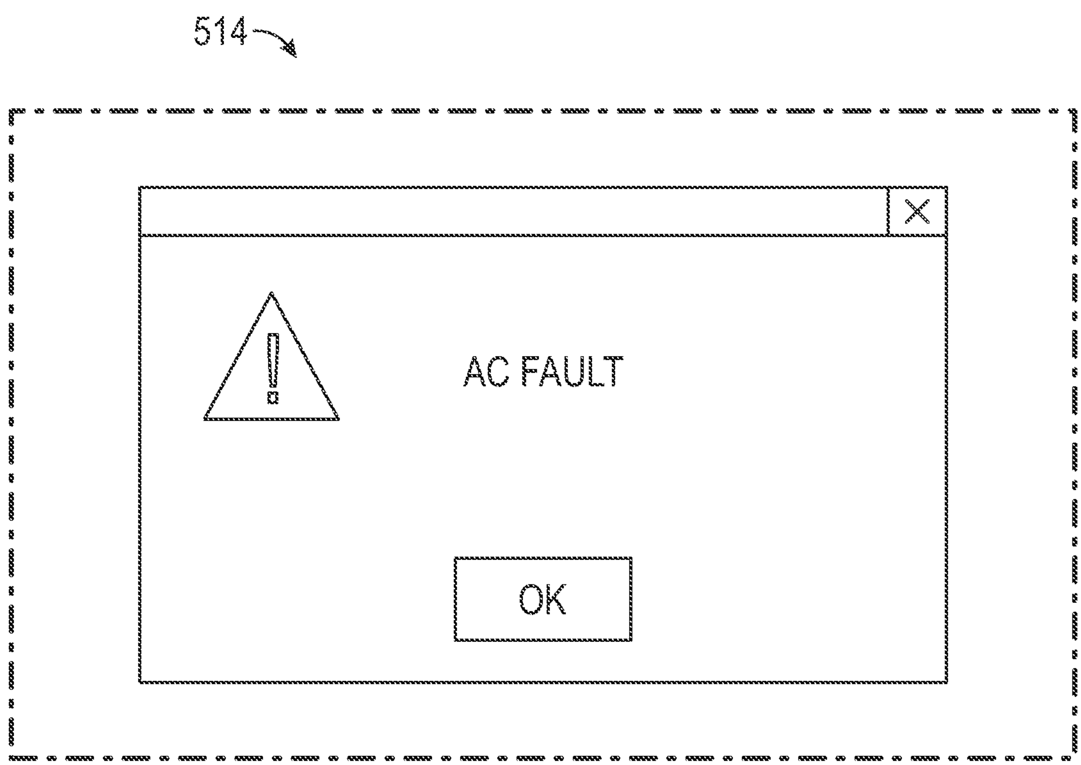
Figure 5T:
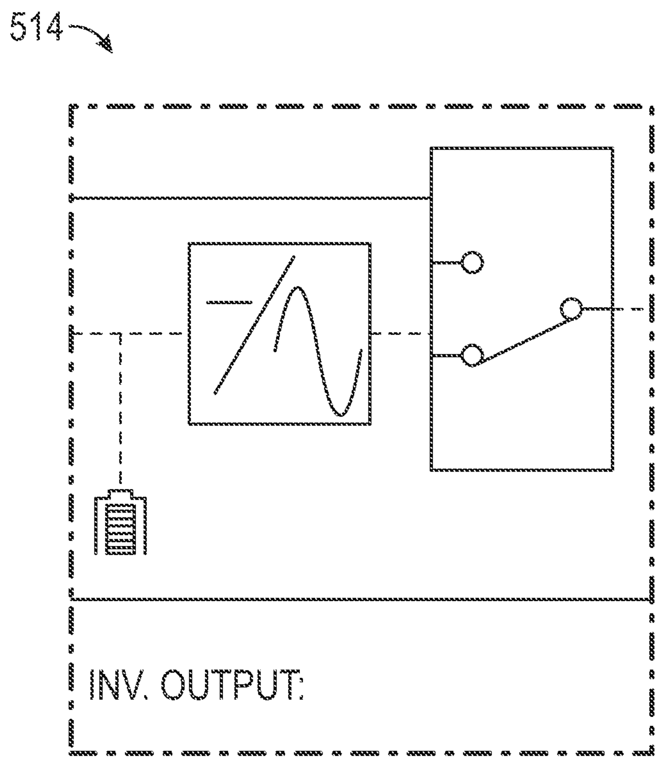
Figure 5U:
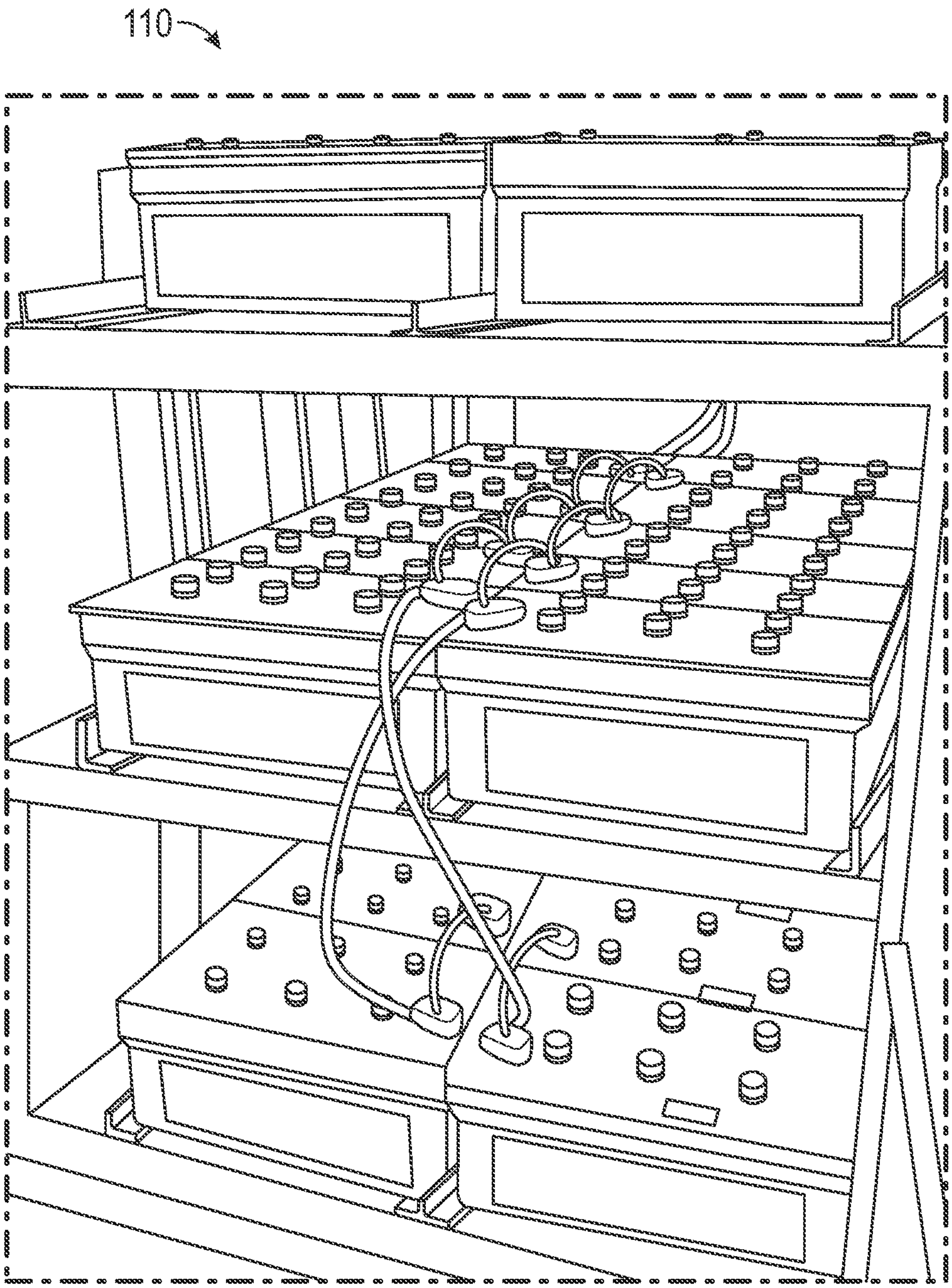

FIG. 4 comprises photos A and B showing thyristors 450A-X and capacitors 455A-X electrically connected to the EPS 100.

FIG. 5 comprises photos of a computer screen with software application 510 known in the art adapted to show data values from operation of the EPS 100, wherein—

A-C—a computer screen 510 showing process control where electricity is being produced from the alternator 130, then to the inverters 115, then to batteries 105, then back to the inverter 115, therefore there is output from the rectifiers 512;

D—a computer screen 510 showing the charge, the voltage input and output of the system, and in this sample the output is pure and the input has minor variation;

E-G—these computer screen shots 510 show a digital dashboard 514 of the software application with data visually displayed in graphic or meter format, providing to the input voltage 516, output voltage 518, frequency 520, temperature of the system 522, capacity and battery charge 524, and any load 526; FIG. 5-E shows testing the inverter 115 at 100% without load; FIG. 5-F shows the load 526 at 11% with battery capacity 524 at 100%; FIG. 5-G shows load 526 at 44% and battery charge 524 still at 100%;

H-I—computer screen 510 of digital readout of system showing input 530, output 532, frequency 534, battery charge 536, ups load 538; and temperature 540; this was during a test loading the unit at 142% capacity to see if it would fail but it did not;

J-K—computer screen 510 of the ups inverter 115 input voltage coming in 516, output voltage produced by the system 518, 220 v at 50 hz 520 it is a very solid output, the current reading is 109 amps, but the battery charge is still at 100% charge; 542 is a graphical representation of the inverter voltage; 544 is a graphical representation of the output voltage;

L—photo of the inside of the unit 302 with batteries installed, (FIG. 3-B) connected, and electrically connected to the electrical generator apparatus; set up as the PPU (power preservation unit);

M—computer screen of dashboard 510 showing a load 526 of 40% on the system 100 with the batteries 524 still at 100%; the test was run several times but the system did not fail;

N—readout on PLC of inverter 115;

O—indicator lights on the PLC showing input from alternator 130, charging the battery 105, and the system 100 is feeding itself showing output with no bypass;

P—shows internal construction of the inverter 115;

Q-R—shows rectifier 550, battery 552, bypass 554 and output 556 controls;

S—shows PLC readout of AC fault test showing no connection to the outside grid, no mains connected to system, thus no AC coming into system;

T—show PLC readout of only inverter output, dotted lines from battery going into the rectifier to the load; note, no input from the mains into the system;

U—photo of battery bank 110 inside 302;

FIGS. 6-1 through 6-116 is a collection of data in a continuous table format during testing by the apparatus and method of the present invention comprising loading capacity of the battery and respective system temperature:

a) the sequences from number 1 to 273 shows solid output voltage and frequency, battery capacity stays at 100% and the temp stays at 30 C, no change;

b) at 274 the input system was cut off and system instructed not to recharge to load the batteries and run the system to deplete the battery bank; result was that the input voltage dropped to zero but the output maintained at 117-120 volts; as the input was dropped it went to 82% and it continued to 82% until sequence 99;

c) the temperature the system is capable of cooling itself under load as it decreased from 30 to 27 almost instantly, the data collection was in 2 second increments;

d) four high output fans cool system under load, they are variable speed so produce more CFMs when under load;

e) at sequence 332 battery capacity coming down to 77 on page 110 and temp 27 degrees, then see page 111 down to 58% on the battery and load was 87%, thus pulling a lot of load out of batteries, but temperature is stable at 25 C due to variable speed fans instead of at the expected 40 C;

f) loading on page 113 at 86-87% and the temp remains the same, the batteries stay at 58% for the next 5-6 pages until page 118 then on page 119 sequence 578 capacity was 58% batteries system temp was 25 C; when given instruction to recharge, the charging capacity started to rise in about 10 seconds, it increased to 68%, then 75%, then 78%; discharge time about 37 minutes and then recharge with load at 70-80% but still charging; at sequence 701 page 123 the system went down to 57% and my loading was 87% until page 130;

g) at sequence 993 I started to get 80% charging still with load of about 40%;

h) at sequence 994 to 1171 were charging and discharging to see how the system would behave; temperature stable at about 28 C, and battery bank at 75-78% regardless of the load;

i) at sequence 1182 the load is 85%, then at sequence 1207 on page 141 the battery capacity stayed at 78% with no loading or charging, running the system by itself and it did not deplete any of the batteries but stayed at 78%;

j) demonstrates very high efficiency when the system is running; the only time the battery goes down without charging is when load on it, load performed in four stages;

k) remainder of date showing repetitive on and off charging—non-charging, and high loading; sequence 1191 page 140 shows a high load of 73-75% but not the norm to load a generator near 100% for more than 20-30 minutes because will burn it up; or if a diesel generator you would get burned if touch the engine; while the method and apparatus of the present invention herein demonstrates stable temperature at 28 C at 85%;

FIGS. 7-1 through 7-47 is a collection of data in a continuous table format during testing by the apparatus and method of the present invention comprising data recording in increments of two seconds to monitor the 'heartbeat' of the system (e.g. a cardiogram of everything) to properly collect vital data set for further analysis. The output voltages as shown are extremely solid and stable. External Load is at 30-40 percent of system capacity, and battery charged capacity was between 78-80%, while the system was not charging the battery. The PLC, as tested in this scenario, instructed the system not to recharge the battery but rather to discharge the battery by allowing the external load to discharge up to 40% of the system capacity. This method was utilized to compare the RATE of CHARGE and RATE of DISCHARGE in the EPS 100. The data from Sequence 1 to Sequence 758 indicates a discharge time of 26 minutes without charge. The data from Sequence 759 to Sequence 849 indicates a charging time of 3 minutes while the same external load is still applying load on the system. This set of data shows how fast the system charges the battery while an external load is exerted on the system. While the same external load is exerted on the system, the EPS was put through a series of testing cycles wherein the system capacity was maintained at 100% while an external load was continuously pulling the same load of 40% of its capacity. The data in FIG. 7 shows that there is a one degree Celsius change, from 29 C to 30 C, thus virtually no temperature change from Sequence 1 to Sequence 1377 while the system is under significant load. While the voltage was solid and stable at approximately 220V as expected, the frequency remains at a solid 50 Hz throughout the testing period.

FIG. 8 shows data recording in graphical format using Fluke 345, a power recording device known in the art. It records and analyzes data continuously while connected to the EPS 100. The data recording parameters are shown in FIG. 8-A and data were recorded in increments of ten seconds, and the number of RMS recording were 474 between one of the three-phase (L1) and neutral N. FIG. 8-B shows the voltage of L1 on the lines from 18:22 pm to 19:37 pm, and at 19:25 pm the system was turned off and the spike down is indicated where the system did not have any voltage, but otherwise all others at 380 volts. FIG. 8-C is a variation of loading and amperage. In FIG. 8-D the frequency goes to zero also when no voltage. FIG. 8-E is a reading at the same time for three parameters: KW, KVAR (kilovolt amp reactive) and KVA (kilovolt amp) showing that the system is doing very well. Shows the active and reactive power going opposite of each other which is extremely important reading and demonstrates that the system is behaving properly. The last graph, FIG. 8-G, is the voltage averages of about 380 volts throughout the whole reading.

FIG. 9 shows data recording using Fluke 345 in intervals of 10 seconds was stable. The data recording parameters are shown in FIG. 9-A and data in FIGS. 9-B to 9-G were recorded in increments of ten seconds, and the number of RMS recording were 155 between one of the three-phase (L1) and neutral N. FIGS. 9-B and 9-C shows the voltage of L1 on the lines from 16:53 pm to 17:20 pm, at 380 volts. The graph shows an average, minimum and maximum voltages of approximately 380 volts. The graphs shown below are variations of loading and amperage. The frequency is maintained at about 50 Hz as expected. In FIGS. 9-E and 9-F are readings at the same time for three parameters: KW, KVAR (kilovolt amp reactive) and KVA (kilovolt amp) showing that the system is doing very well. Shows the active and reactive power going opposite of each other which is extremely important reading and demonstrates that the system is behaving properly. FIG. 9-G is the voltage averages of about 380 volts throughout the whole reading.

FIGS. 10-1 through 10-18 show the same data recording in FIG. 9 in a continuous table format.

FIGS. 11-1 through 11-13 show the same data recording in FIG. 8 in a continuous table format.

FIG. 12 is a table of data recording of the following readings as superimposed on a time period between 18:22 pm and 19:37 pm: active power minimum, active power maximum, active power average, re-active power minimum, re-active power maximum, re-active power average, apparent power minimum, apparent power maximum, apparent power average, and power factor minimum, power factor maximum and power factor average.

Figure 13:
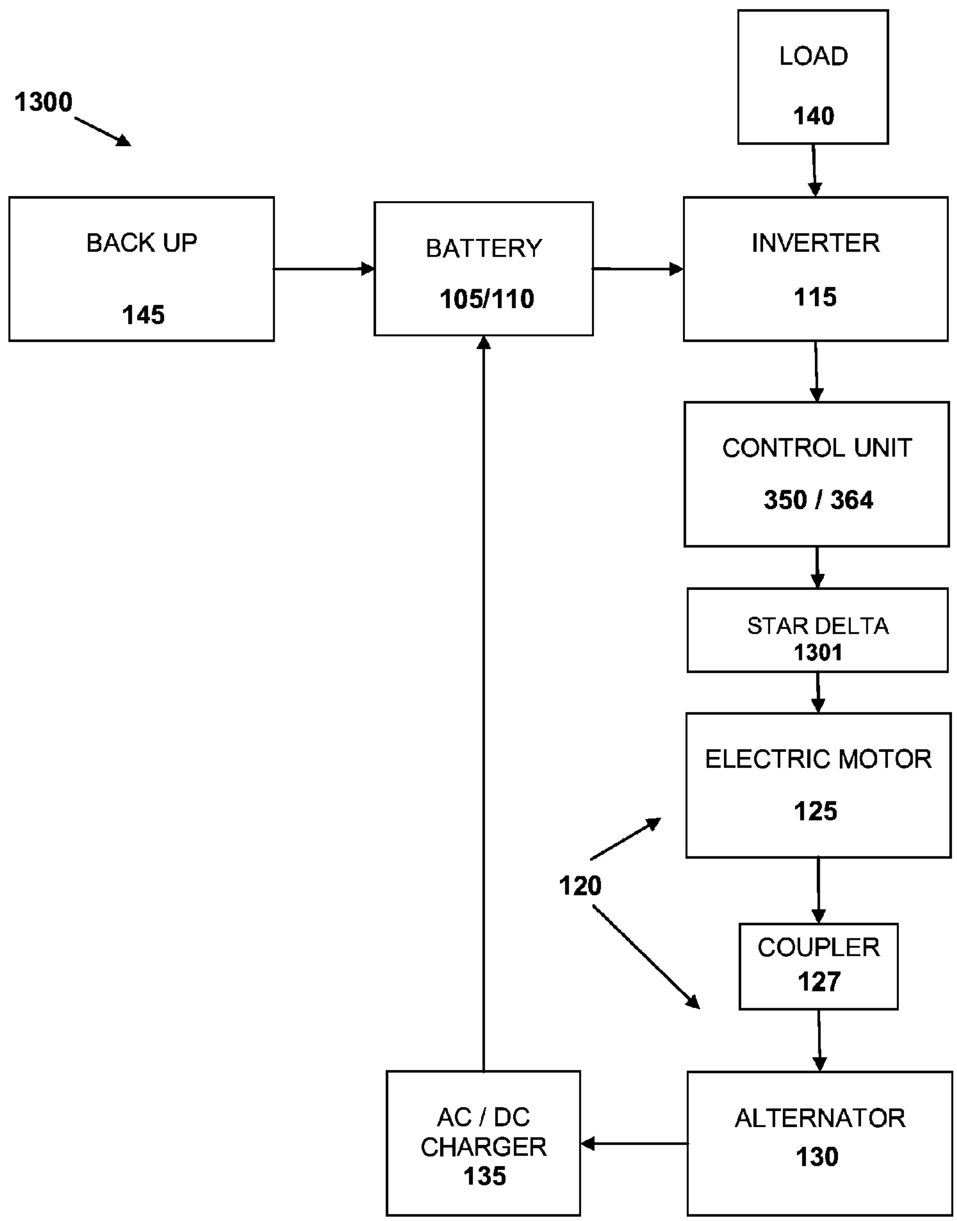

FIG. 13 is an embodiment of the present invention as an electrical flow diagram incorporating Star-Delta control with the logic, battery charger 125, battery banks 110, inverter 115, alternator 130 and load 140. This design employs and incorporates an electrical engineering method referred to as Star Delta 1300 ("S-D"). When the motor 125 is started in S-D mode, it runs at a lower rate of current consumption thus placing a lower load on the battery bank 110. After a few seconds, when the motor 125 is running at approximately full speed then the PLC 314 initiates a sequence of switching to S-D mode which allows the motor 125 to produce the required torque and speed while maintaining a low current consumption. At the same time utilizing the VFD 350 and VTC 364 a 10 hp motor 125 that runs at 12 amps, at start may take 60 amps to operate for 12-13 seconds every time you start the system. If you ran the system 90 times in 2 hours it would drain the batteries 110 before they even had any charge in them. Utilizing the S-D 1300 method for the first 8 or 10 seconds, along with the VFD 350, further reduces the strain and discharge on the batteries 110 by running at the startup amperage, and then after 10 seconds it goes into the delta winding 1301 in the design, and it gives the correct amount of torque and rpms but at reduced current consumption. The system will be at full capacity but will only consume about 4-5 amps. In comparison, if a motor consumption of 60 amps takes even 20 seconds to decrease to 5 amps, a very high demand has been placed on the batteries 110 which would then be depleted faster than the rate of charging. Thus, an advantage of the present invention is incorporation of the S-D 1300 start up method to increase the efficiency of the motor 125 to high efficiency. Thus, S-D control 1301 is preferably used in conjunction with VFD 350 and VTC 364 motor controls to increase the efficiency of the system by reducing power consumption, a refinement in the control system of the EPS 100.

Battery power is discharged as DC to the low frequency inverter 115, then rectified to 3 phase sine wave output to run the motor 125, and then to the S-D control 1301 to start the motor 125. The Star Delta method 1300, and VFD 350 and VTC 364 together are not generally utilized in the industry as in the present invention. However, the combination of the three allowed the system to minimize the amount of amps that need to be provided from the battery 110. In operation the system 100 can draw 4.2 amps from the battery to start and then provide 15-30 amps to the load 140 or the grid. One of the many component efficiencies in the system of the present invention.

FIG. 14 is an embodiment 1400 of the present invention, when battery unit B1 1405 is being discharged, battery unit B2 1410 is being charged by a series of mechanical and electrical interlocking devices at contactor C3 1415 and contactor C4 1420. When C4 1420 is engaged, B2 1410 is being charged, and via a static battery charger 135 battery bank B1 1405 is discharged. When C3 1415 is engaged, B1 1405 is getting charged and via a static charger 135 battery bank B2 1410 is discharged via contactor C3 1415. Power from B2 1410 is discharged via C3 1415 in the form of DC current (positive red (P-red1) and negative green (N-green1) to the following devices: 1410 B2 DC power ("DCpo1") first passes through a static low frequency inverter 115 ("INV1"), then DC power ("DCpo 1") is rectified into a three-phase pure sine wave AC power output ("ACpo1") to L1*a*, L2*a* and L3*a*. Thus the DCpo1 provides, for example, 10 amperes per hour DC current to a static low frequency inverter INV1 115.

Since modern thyristors can switch power on the scale of megawatts, thyristor valves have become the heart of the low voltage direct current (LVDC) and high voltage direct current (HVDC) conversion either to or from alternating current. Thyristor is a preferred rectifier because it is scalable to a much larger capacity. Also, thyristor provides a consistent output and efficient rectification in low and high DC applications without significant power loss. Preferably, each battery bank, B1 1405 and B2 1410, is connected to one or more thyristors 450, preferably a bank of 3 thyristors, one for each phase.

A further description of the embodiment in FIG. 4-A shows circuitry for two of the three phases for rectification of ACpo1 (L1*a*, L2*a* and L3*a*): RED L1*a* is to the LEFT and GREEN L2*a* is the green panel to the right.

A further description of the embodiment in FIG. 4-B shows L3 green panel to the right with BLUE-purple cable. INV1 rectified X Amp DC ("XADC1") power into a three-phase AC with X Amp AC ("XAAC1") per phase for a total of XAAC1 in the ACpo1. A first portion of said ACpo1 is used to energize/run an electric Motor M1. M1 is mechanically coupled to a three-phase high efficiency alternator ALT1. ALT1 generates electricity to supply another three-phase pure sine wave AC Power Output ("ACpo2"): L1*b*, L2*b*, and L3*b*. For example, X Amp AC ("XAAC2") per phase is going to Motor M1 and ALT1 wherein ALT1 generates a three-phase pure sine wave ACpo2 at X Amps AC ("XAAC2") per phase for a total of XAAC2 from ACpo2.

Since ACpo2 is connected to a Circuit Breaker D1 and Contactor Cl to provide a three-phase pure sine wave power ACpo2 to a Static Battery Charger ("SBC1") wherein three-phase pure sine wave power ACpo2 is converted into a DCpo2: Positive Red (P-red2) and Negative Green (N-green2). Here XAAC2 ACpo2 is rectified into a XADC2 DCpo2. DCpo2 is connected to a Circuit Breaker D3 and Contactor C3 to charge battery bank B1. Battery bank B1 is receiving XADC2 from DCpo2 while battery bank B2 is discharging at a lower XADC1 rate.

An advantage of the method and apparatus of the present invention, EPS 100 is the rate of charge to B1 is at a much faster rate than the rate of discharge of B2. A second portion of said ACpo1 is used to provide power to an external three-phase Load L-EXT. A PLC1 manages the battery power reservoir by monitoring the discharging of battery bank B2 and the charging of battery bank B1 by sensing the voltage level of the battery banks B1 and B2. A voltage measuring device measures the voltage across the positive and negative poles of battery bank B2 and compares it to the predetermined voltage level to activate a battery bank switch between said battery banks B1 and B2.

Thus ACpo1 charges battery bank B1 faster. Not more power but the rate of charge of B1 is faster than the discharge rate of ACpo2 from battery bank B2 to L-EXT, the power consumed by Inverter INV1, Motor M1, Alternator ALT1, Static Battery Charger SBC1, the PLCs, electrical components and electronic systems within the EPS 100.

An advantage of the ability to charge the battery bank B1 at a much faster rate than the rate of discharge by battery bank B2 allows B1 to have adequate time to fully float the charge in B1 by allowing B1 to rest at full charge before a load is placed on B1. This method of recharging is known in the art as "floating the charge" to fully optimize the life expectancy of the battery banks. Thus when battery bank B1 is fully charged, the apparatus and method of the present invention allows B1 to float the charge while battery bank B2 is being discharged. If B2 is discharged to a predetermined low level, another PLC will switch the power supply by disconnecting C3 and engaging connector C4 to pull power from battery bank B1, and then charge B2. Thus the cycle may be continued.

Figure 15:
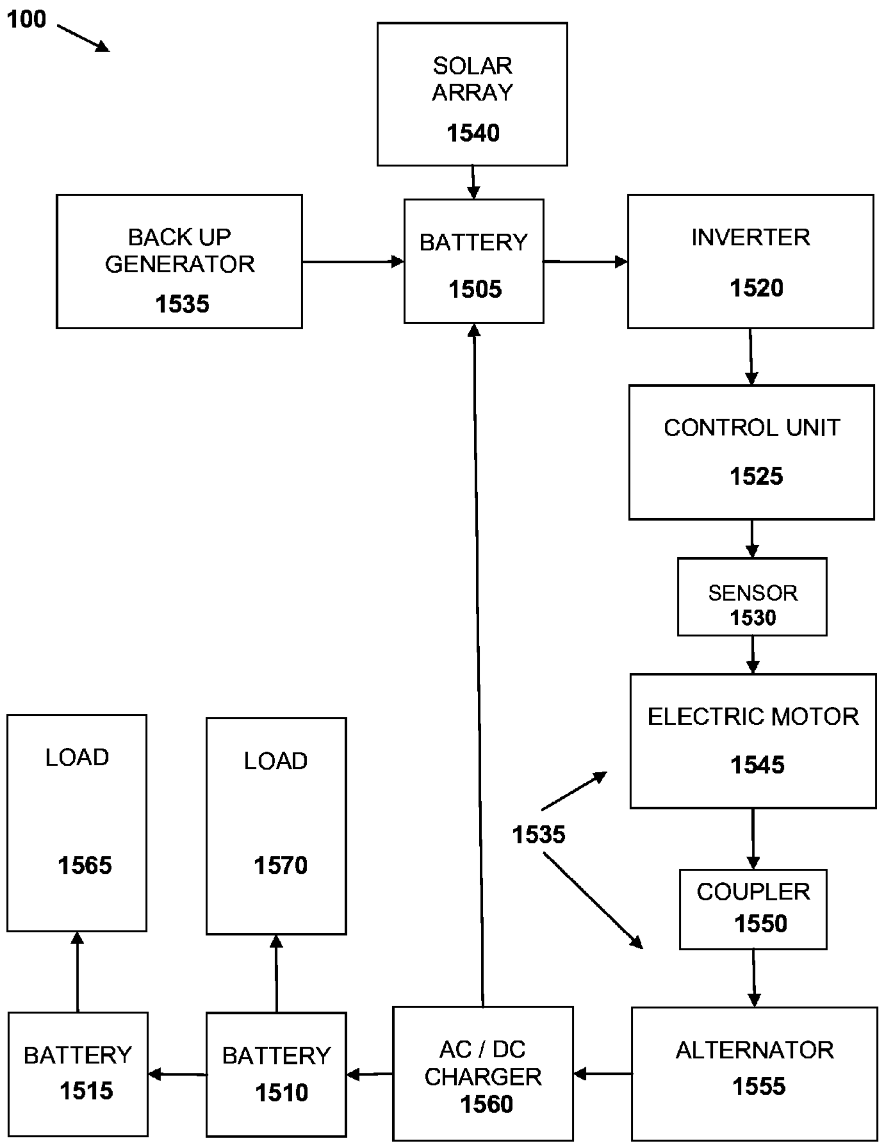

In an additional embodiment of the present invention as shown in FIG. 15, a first battery bank 1510 is connected to service approximately one-half the load 1570 requirement of a home, such as wall receptacles, lights, etc., with a second battery bank 1515 available as a backup. The second battery bank 1515 is connected to the home to service the other half of the load 1565 requirement, including large appliances, furnace, air conditioning, etc., with the first battery bank 1510 then available as a backup. The remaining battery unit 1505 services the electric motor 1545, with the backup generator 1535 in reserve. If there is a major demand beyond the capability of the EPS 100 to provide at that time, a backup solar panel array 1540 is preferably engaged to maintain optimum charge on the battery units 1505, 1510 and/or 1515. Sensors 1530 that monitor each electric motor 1545 will be electrically connected throughout the apparatus 100. Sensors 1530 divert energy to another battery unit if the unit is at full capacity. If all battery units are full with little or no load, sensors 1530 preferably disengage the electric motors 1545 and reduce the charging current to minimal maintenance or stop. When the load begins again the electric motor 1545 will engage. At optimal energy production engagement of the backup generator 1535 will preferably be for minimal time.

But if there is a demand spike preferably the backup generator 1535 will start to provide the extra energy required by the demand. Since the average kilowatt usage per month for a home is 1400-1600 kilowatts, preferably the output capability of the EPS sized for a home installation will be in the range of 2800/3200-3700/4800 kilowatts.

Preferably, control of the operation of the 100 components in FIG. 15 will reside in one or more control units (not shown) comprising programmed instruction with computerized control by the methods disclosed above, such as using a programmed logic controller (PLC) with a plurality of inputs and outputs, or a personal computer, or commands through a network interface. The control unit(s) will monitor the system parameters such as pressure, flow, battery charge, demand by the serviced electrical load, accumulator pressure, solar array output, etc., by receiving data from a plurality of sensors (not shown) such as pressure sensors, flow sensors, electricity demand, and electrical charge—discharge sensors, interpreting the data according to programmed instruction, and outputting commands The received data input will be processed in a control unit according to the programming, and instructions will be electronically output to a plurality of switches and valves to maintain system electricity generation and energy storage as required.

An additional embodiment of the present invention 100 comprises providing energy to a load wherein said load is motive power for a mode of transportation. Modes of transportation generally include vehicles with a plurality of wheels, such as motorcycles, Segway scooters, motorized three wheel vehicles, automobiles, trucks and the like. Specifically, the apparatus and method of the present invention may be adapted to provide the electrical energy motive power along with the electrical energy storage and control methods as disclosed above for an electrically powered automobile.

The multiple interconnected components described in the embodiment of the EPS system 100 provide the efficiency necessary for the system to provide the unexpected and novel result of being able to charge the battery at a greater rate than discharge by the motor-alternator thereby providing excess electrical energy to operate additional loads or be distributed to the grid while maintaining optimal battery charge.

Although several of the embodiments of the present invention 100 have been described above, it will be readily apparent to those skilled in the art that many other modifications are possible without materially departing from the teachings of this invention. Accordingly, all such modifications are intended to fall within the scope of this invention.

What is claimed is:

1. A power storage and production system, comprising, an electric motor;

an electrical energy generator coupled to the electric motor, wherein the electrical energy generator is configured to provide output power to one or more external loads;

a plurality of battery banks coupled to the electric motor, wherein each of the plurality of battery banks comprises a plurality of batteries;

a control system configured to adjust an input power provided to the motor to regulate an output power produced by the generator;

a battery charger coupled to the generator and the plurality of battery banks, wherein the battery charger is configured to provide input of electrical energy to the plurality of battery banks with at least some of the output power from the generator; and a backup source of electrical energy coupled to the plurality of battery banks, wherein the backup source of electrical energy comprises a solar array assembly.

2. The system of claim 1, further comprising a plurality of sensors coupled to the control system.

3. The system of claim 1, wherein the control system comprises a variable frequency drive (VFD) controller;

a variable torque control (VTC); and a programmable logic controller (PLC).

4. The system of claim 1, wherein the control system is configured to vary an input voltage to the motor to regulate the desired output of the generator.

5. The system of claim 1, wherein the control system is configured for reducing current to the motor while maintaining a desired output power provided by the generator.

6. The system of claim 1, wherein the battery charger is configured for charging one of the plurality of banks while discharging another one of the plurality of battery banks.

7. The system of claim 1, wherein the battery charger is configured for charging one of the plurality of banks at a greater rate than a discharge rate while discharging another one of the plurality of battery banks.

8. The system of claim 1, wherein the battery charger is configured to perform the charging step after a predetermined batter charge threshold is met on the portion of the plurality of battery banks.

9. The system of claim 1, wherein the control system comprises a programmable logic controller configured to regulate voltage to the motor.

10. The system of claim 1, wherein the control system is configured to operate the motor in a first mode and a second mode, wherein the second mode requires less amperage input than the first mode, wherein the motor is configured to produce the same output in the first and second modes.

11. The system of claim 10, wherein the first mode is a startup mode and the second mode is an operating mode.

* * * * *